US012787196B2

(12) United States Patent
Cole et al.

(10) Patent No.: US 12,787,196 B2
(45) Date of Patent: Nov. 3, 2026

(54) COMMUNICATION SYSTEMS HAVING PLUGGABLE OPTICAL MODULES

(71) Applicant: Ciena Corporation, Hanover, MD (US)

(72) Inventors: Christopher Robert Cole, Redwood City, CA (US); Peter Johannes Winzer, Aberdeen, NJ (US)

(73) Assignee: Ciena Corporation, Fulton, MD (US)

( * ) Notice: Subject to any disclaimer, the term of this patent is extended or adjusted under 35 U.S.C. 154(b) by 243 days.

(21) Appl. No.: 18/891,918

(22) Filed: Sep. 20, 2024

(65) Prior Publication Data

US 2025/0098095 A1 Mar. 20, 2025

Related U.S. Application Data

(63) Continuation of application No. 18/311,009, filed on May 2, 2023, now Pat. No. 12,101,904.

(Continued)

(51) Int. Cl.
*H05K 7/20* (2006.01)
*H05K 7/10* (2006.01)

(52) U.S. Cl.
CPC .......... *H05K 7/10* (2013.01); *H05K 7/20154* (2013.01); *H05K 7/20409* (2013.01)

(58) Field of Classification Search
CPC .... G02B 6/4261; G02B 6/428; G02B 6/4278; G02B 6/3817; G02B 6/424; G02B 6/3897;

(Continued)

(56) References Cited

U.S. PATENT DOCUMENTS 5,136,410 A 8/1992 Heiling et al.
5,229,925 A 7/1993 Spencer et al.

(Continued)

FOREIGN PATENT DOCUMENTS

CA 3055376 A1 9/2018
CN 103402337 B 3/2016

(Continued)

OTHER PUBLICATIONS

[No Author Listed] [online], "The Promise of Co-Packaged Optics: Paving the Way for Improved Power Efficiency, Size, and Cost," The Institute for Energy Efficiency, Oct. 2, 2020, retrieved on Jan. 11, 2023, <https://www.youtube.com/watch?v=OzNGZJHKiE8>, 19 pages [Video Submission].

(Continued)

*Primary Examiner* — Michael A Matey
(74) *Attorney, Agent, or Firm* — Baratta Law PLLC; Lawrence A. Baratta, Jr.

(57) ABSTRACT

An apparatus includes a housing capable of being mounted in a rack, and a vertically oriented switch card. The vertically oriented switch card includes one or more vertically oriented application-specific integrated circuits (ASIC) mounted on the vertically oriented switch card. The switch card includes a two-dimensional arrangement of plug ports; each plug port is configured to receive a pluggable optical module. The switch card also includes a two-dimensional arrangement of channel intakes, each channel intake is positioned adjacent to at least one of the plug ports of the two dimensional arrangements of plug ports, each channel intake receives air and directs the received air towards an interior of the housing capable of being mounted in a rack.

21 Claims, 232 Drawing Sheets

Related U.S. Application Data

(60) Provisional application No. 63/431,610, filed on Dec. 9, 2022, provisional application No. 63/416,902, filed on Oct. 17, 2022, provisional application No. 63/407,581, filed on Sep. 16, 2022, provisional application No. 63/337,582, filed on May 2, 2022.

(58) Field of Classification Search
CPC ......... G02B 6/4268; G06F 1/20; G06F 1/185; G06F 1/1684; G06F 1/183; G06F 1/187; H05K 2201/10045; H05K 7/00; H05K 7/14; H05K 7/10; H05K 7/20154; H05K 7/20409; H04B 10/40; H04B 1/08; H04Q 11/0005; H04Q 1/025; H04Q 1/035
See application file for complete search history.

(56) References Cited

U.S. PATENT DOCUMENTS 6,305,848 B1 10/2001 Gregory
6,396,990 B1 5/2002 Ehn et al.
6,411,520 B1 6/2002 Hauke et al.
6,563,696 B1 5/2003 Harris et al.
6,675,976 B2 1/2004 Steinman et al.
6,769,812 B1 8/2004 Handforth
6,822,874 B1 11/2004 Marler
6,924,986 B1 8/2005 Sardella et al.
7,042,737 B1 5/2006 Woolsey et al.
7,170,749 B2 1/2007 Hoshino et al.
7,180,751 B1 2/2007 Geschke et al.
7,239,523 B1 7/2007 Collins et al.
7,643,292 B1 1/2010 Chen
7,787,772 B2 8/2010 Ota
7,813,143 B2 10/2010 Dorenkamp et al.
8,047,856 B2 11/2011 Mccolloch
8,090,230 B1 1/2012 Hasharoni et al.
8,116,095 B2 2/2012 Dorenkamp et al.
8,208,253 B1 6/2012 Goergen et al.
8,482,917 B2 7/2013 Rose
8,488,921 B2 7/2013 Doany et al.
8,780,551 B2 7/2014 Farnholtz
8,992,099 B2 3/2015 Blackwell et al.
9,250,649 B2 2/2016 Shabbir et al.
9,301,025 B2 3/2016 Kioski et al.
9,366,832 B2 6/2016 Arao et al.
9,461,768 B2 10/2016 Kipp
9,557,478 B2 1/2017 Doerr et al.
9,603,289 B1 3/2017 Shearman et al.
9,622,388 B1 4/2017 Gaal
9,645,316 B1 5/2017 Hasharoni et al.
9,722,381 B1 8/2017 Moen et al.
9,768,881 B2 9/2017 Georgas et al.
9,781,546 B2 10/2017 Barrett et al.
9,786,641 B2 10/2017 Budd et al.
9,794,195 B1 10/2017 Wilson et al.
9,874,688 B2 1/2018 Doerr et al.
9,927,575 B2 3/2018 Goodwill et al.
10,012,811 B2 7/2018 Rivaud et al.
10,018,787 B1 7/2018 Wang
10,025,043 B2 7/2018 Vallance et al.
10,054,749 B1 8/2018 Wang et al.
10,082,633 B2 9/2018 Schaevitz et al.
10,135,218 B2 11/2018 Popovic et al.
10,135,539 B2 11/2018 Moss et al.
10,209,464 B2 2/2019 Pfnuer et al.
10,215,944 B2 2/2019 Sedor et al.
10,234,646 B2 3/2019 Mack et al.
10,271,461 B2 4/2019 Schmidtke
10,330,875 B2 6/2019 Fini et al.
10,365,436 B2 7/2019 Byrd et al.
10,514,509 B2 12/2019 Popovic et al.
10,568,238 B1 * 2/2020 Leung ..................... G06F 1/181
10,582,639 B1 3/2020 Chopra
10,615,903 B2 4/2020 Welch
10,725,245 B2 7/2020 Leigh et al.
10,750,250 B1 8/2020 Parker et al.
10,866,376 B1 12/2020 Ghiasi
10,905,025 B1 1/2021 Thomas et al.
11,005,572 B1 5/2021 Chiang et al.
11,051,422 B2 6/2021 Norton et al.
11,058,034 B2 7/2021 Leung
11,079,559 B2 8/2021 Leclair et al.
11,107,770 B1 8/2021 Ramalingam et al.
11,121,776 B2 9/2021 Aboagye
11,153,670 B1 10/2021 Winzer
11,165,509 B1 11/2021 Nagarajan et al.
11,190,172 B1 11/2021 Raj et al.
11,194,109 B2 12/2021 Winzer
11,276,955 B2 3/2022 Rivaud et al.
11,287,585 B2 3/2022 Winzer
11,381,891 B2 7/2022 Leigh
11,385,426 B2 7/2022 Bechtolsheim et al.
11,411,643 B1 * 8/2022 Chaouch ................ H04B 10/07
11,483,943 B2 10/2022 Leigh et al.
11,509,399 B2 11/2022 Paraiso et al.
11,510,329 B2 11/2022 Leigh
11,521,543 B2 12/2022 Morris et al.
11,525,967 B1 12/2022 Bismuto et al.
11,543,671 B2 1/2023 Xu et al.
11,551,636 B1 1/2023 Buckley et al.
11,557,875 B2 1/2023 Kovsh
11,573,387 B2 2/2023 Sawyer et al.
11,580,662 B2 2/2023 Kimura
11,585,977 B2 2/2023 Lambert
11,592,629 B2 2/2023 Kawamura et al.
11,596,073 B2 2/2023 Zhang et al.
11,602,086 B2 3/2023 Crisp et al.
11,604,347 B2 3/2023 Axelrod et al.
11,609,873 B2 3/2023 Cannata et al.
11,612,079 B2 3/2023 Nagarajan et al.
11,615,044 B2 3/2023 Cannata et al.
11,620,805 B2 4/2023 Carminati et al.
11,627,682 B2 4/2023 Murakami
11,630,261 B2 4/2023 Xie
11,630,799 B2 4/2023 Nagarajan et al.
11,632,175 B2 4/2023 Di Mola et al.
11,639,846 B2 5/2023 Xian et al.
11,644,628 B1 5/2023 Brisebois et al.
11,650,384 B2 5/2023 Edwards et al.
11,650,631 B2 5/2023 Watamura et al.
11,652,129 B1 5/2023 Vincentsen et al.
11,657,684 B2 5/2023 Gupta et al.
11,662,081 B2 5/2023 Tamma et al.
11,665,862 B2 5/2023 Crisp et al.
11,665,863 B2 5/2023 Crisp et al.
11,668,590 B2 6/2023 Xie
11,675,114 B2 6/2023 Teissier et al.
11,677,478 B2 6/2023 Nagarajan et al.
11,681,019 B2 6/2023 O'Connor et al.
11,681,209 B1 6/2023 Sullivan et al.
11,681,443 B1 6/2023 Venugopal et al.
11,687,480 B2 6/2023 Heyd et al.
11,688,088 B2 6/2023 Kimura
11,699,243 B2 7/2023 Von Cramon
11,710,914 B2 7/2023 Azuma et al.
11,716,278 B1 8/2023 Grandhye et al.
11,720,514 B2 8/2023 Shah et al.
11,727,858 B2 8/2023 Peng et al.
11,735,560 B2 8/2023 Nishihara
11,736,195 B2 8/2023 Leclair et al.
11,754,767 B1 9/2023 Soskind et al.
11,757,705 B2 9/2023 Vobbilisetty et al.
11,764,339 B2 9/2023 Biebersdorf et al.
11,764,878 B2 9/2023 Pezeshki et al.
11,778,354 B2 10/2023 Chaouch et al.
11,817,903 B2 11/2023 Pleros et al.
11,828,954 B2 11/2023 Huang et al.
11,836,019 B2 12/2023 Dube et al.
11,844,186 B2 12/2023 Mcparland et al.
11,853,587 B2 12/2023 Tang et al.
11,868,279 B2 1/2024 Long et al.
11,895,798 B2 2/2024 Winzer et al.
11,906,800 B2 2/2024 Hemp et al.
11,988,874 B2 5/2024 Winzer et al.

(56) References Cited

U.S. PATENT DOCUMENTS

| | | | |
|---|---|---|---|
| 11,997,819 | B2 | 5/2024 | Winzer et al. |
| 12,004,318 | B2 | 6/2024 | Winzer et al. |
| 12,019,289 | B2 | 6/2024 | Winzer et al. |
| 12,029,004 | B2 | 7/2024 | Winzer et al. |
| 12,055,766 | B2 | 8/2024 | Pupalaikis et al. |
| 12,066,653 | B2 | 8/2024 | Winzer et al. |
| 12,101,904 | B2 | 9/2024 | Cole et al. |
| 2002/0003232 | A1 | 1/2002 | Ahn et al. |
| 2002/0142634 | A1 | 10/2002 | Poplawski et al. |
| 2003/0030977 | A1 | 2/2003 | Garnett et al. |
| 2003/0081287 | A1 | 5/2003 | Jannson et al. |
| 2003/0211759 | A1 | 11/2003 | Olzak et al. |
| 2004/0027462 | A1 | 2/2004 | Hing |
| 2004/0033016 | A1 | 2/2004 | Kropp |
| 2004/0257766 | A1 | 12/2004 | Rasmussen et al. |
| 2004/0264838 | A1 | 12/2004 | Uchida et al. |
| 2005/0025409 | A1 | 2/2005 | Welch et al. |
| 2005/0083653 | A1 | 4/2005 | Chen |
| 2005/0111810 | A1 | 5/2005 | Giraud et al. |
| 2005/0124224 | A1 | 6/2005 | Schunk |
| 2005/0147117 | A1 | 7/2005 | Pettey et al. |
| 2005/0207134 | A1 | 9/2005 | Belady et al. |
| 2005/0224946 | A1 | 10/2005 | Dutta |
| 2006/0005038 | A1 | 1/2006 | Kitahara et al. |
| 2006/0062526 | A1 | 3/2006 | Ikeuchi |
| 2006/0128091 | A1 | 6/2006 | Chidambarrao et al. |
| 2006/0239605 | A1 | 10/2006 | Palen et al. |
| 2007/0223865 | A1 | 9/2007 | Lu et al. |
| 2007/0258683 | A1 | 11/2007 | Rolston et al. |
| 2008/0055847 | A1 | 3/2008 | Belady et al. |
| 2008/0181608 | A1 | 7/2008 | Parker et al. |
| 2008/0259566 | A1 | 10/2008 | Fried |
| 2009/0093073 | A1 | 4/2009 | Chan et al. |
| 2009/0113698 | A1 | 5/2009 | Love et al. |
| 2009/0154932 | A1 | 6/2009 | Hinderthuer et al. |
| 2010/0008038 | A1* | 1/2010 | Coglitore ................ G06F 1/187 361/679.48 |
| 2010/0054681 | A1 | 3/2010 | Biribuze |
| 2010/0097752 | A1 | 4/2010 | Doll et al. |
| 2010/0262285 | A1 | 10/2010 | Teranaka |
| 2010/0265658 | A1 | 10/2010 | Sawai et al. |
| 2010/0284698 | A1 | 11/2010 | Mccolloch |
| 2010/0288420 | A1 | 11/2010 | Kimura et al. |
| 2010/0302754 | A1 | 12/2010 | Nordin et al. |
| 2011/0150486 | A1 | 6/2011 | Davidson et al. |
| 2011/0188054 | A1 | 8/2011 | Petronius et al. |
| 2011/0188815 | A1* | 8/2011 | Blackwell, Jr. .......... H05K 7/00 361/748 |
| 2011/0261427 | A1 | 10/2011 | Hart et al. |
| 2012/0014639 | A1 | 1/2012 | Doany et al. |
| 2012/0120596 | A1 | 5/2012 | Bechtolsheim et al. |
| 2012/0201542 | A1 | 8/2012 | Dahlfort |
| 2012/0257355 | A1* | 10/2012 | Yi ........................ G02B 6/4269 361/704 |
| 2013/0089293 | A1 | 4/2013 | Howard et al. |
| 2013/0094827 | A1 | 4/2013 | Haataja |
| 2013/0102237 | A1 | 4/2013 | Zhou et al. |
| 2013/0107454 | A1 | 5/2013 | Wilke et al. |
| 2013/0193304 | A1 | 8/2013 | Yu et al. |
| 2013/0279916 | A1 | 10/2013 | Cho et al. |
| 2013/0315586 | A1 | 11/2013 | Kipp |
| 2013/0342993 | A1 | 12/2013 | Singleton |
| 2014/0002988 | A1 | 1/2014 | Roesner et al. |
| 2014/0049931 | A1* | 2/2014 | Wellbrock ............. H04Q 1/155 361/788 |
| 2014/0064659 | A1 | 3/2014 | Doerr et al. |
| 2014/0098492 | A1 | 4/2014 | Lam |
| 2014/0106582 | A1 | 4/2014 | Wig et al. |
| 2014/0133101 | A1 | 5/2014 | Sunaga et al. |
| 2014/0306131 | A1 | 10/2014 | Mack et al. |
| 2014/0321803 | A1 | 10/2014 | Thacker et al. |
| 2014/0321804 | A1 | 10/2014 | Thacker |
| 2014/0327902 | A1 | 11/2014 | Giger et al. |
| 2015/0037044 | A1 | 2/2015 | Peterson et al. |
| 2015/0094896 | A1 | 4/2015 | Cuddihy et al. |
| 2015/0107101 | A1 | 4/2015 | DeCusatis et al. |
| 2015/0125110 | A1 | 5/2015 | Anderson et al. |
| 2015/0139223 | A1 | 5/2015 | Mayenburg |
| 2015/0261269 | A1 | 9/2015 | Bruscoe |
| 2015/0293305 | A1 | 10/2015 | Nakagawa et al. |
| 2016/0011390 | A1 | 1/2016 | Montalvo Urbano et al. |
| 2016/0062068 | A1 | 3/2016 | Giraud et al. |
| 2016/0073544 | A1 | 3/2016 | Heyd et al. |
| 2016/0116693 | A1 | 4/2016 | Oki et al. |
| 2016/0125706 | A1 | 5/2016 | Butterbaugh et al. |
| 2016/0156999 | A1 | 6/2016 | Liboiron-Ladouceur et al. |
| 2016/0209610 | A1 | 7/2016 | Kurtz et al. |
| 2016/0291273 | A1 | 10/2016 | Nguyen |
| 2016/0337727 | A1 | 11/2016 | Graves et al. |
| 2016/0377821 | A1 | 12/2016 | Vallance et al. |
| 2017/0005446 | A1 | 1/2017 | Regnier |
| 2017/0077643 | A1 | 3/2017 | Zbinden et al. |
| 2017/0123164 | A1 | 5/2017 | Suematsu et al. |
| 2017/0131469 | A1 | 5/2017 | Kobrinsky et al. |
| 2017/0139145 | A1 | 5/2017 | Heanue et al. |
| 2017/0168253 | A1 | 6/2017 | Wilcox et al. |
| 2017/0181314 | A1 | 6/2017 | Leigh et al. |
| 2017/0308725 | A1 | 10/2017 | Sardaryan et al. |
| 2017/0332519 | A1* | 11/2017 | Schmidtke .............. G06F 1/181 |
| 2017/0363826 | A1 | 12/2017 | Zer et al. |
| 2017/0364295 | A1* | 12/2017 | Sardinha ............... G06F 3/0625 |
| 2018/0131056 | A1 | 5/2018 | Sato |
| 2018/0159651 | A1 | 6/2018 | Li et al. |
| 2018/0188459 | A1 | 7/2018 | Mekis et al. |
| 2018/0196196 | A1 | 7/2018 | Byrd et al. |
| 2018/0223582 | A1 | 8/2018 | Shin et al. |
| 2018/0231727 | A1 | 8/2018 | Kurtz et al. |
| 2018/0278332 | A1 | 9/2018 | Leigh et al. |
| 2018/0295737 | A1 | 10/2018 | Balasubramania et al. |
| 2018/0303004 | A1 | 10/2018 | Zhai et al. |
| 2018/0306990 | A1 | 10/2018 | Badihi |
| 2018/0329159 | A1 | 11/2018 | Mathai et al. |
| 2018/0335558 | A1 | 11/2018 | Fini et al. |
| 2018/0335595 | A1 | 11/2018 | Takeuchi et al. |
| 2019/0027898 | A1 | 1/2019 | Bovington et al. |
| 2019/0027899 | A1 | 1/2019 | Krishnamoorth et al. |
| 2019/0027901 | A1 | 1/2019 | Zheng et al. |
| 2019/0028207 | A1 | 1/2019 | Saeedi et al. |
| 2019/0033528 | A1 | 1/2019 | Ootorii |
| 2019/0086618 | A1 | 3/2019 | Shastri et al. |
| 2019/0098788 | A1 | 3/2019 | Leigh et al. |
| 2019/0116689 | A1* | 4/2019 | Chen .................. H05K 7/20154 |
| 2019/0207342 | A1 | 7/2019 | Aden et al. |
| 2019/0208290 | A1 | 7/2019 | Olson |
| 2019/0258175 | A1 | 8/2019 | Dietrich et al. |
| 2019/0293971 | A1 | 9/2019 | Yu et al. |
| 2019/0307014 | A1 | 10/2019 | Adiletta |
| 2019/0312642 | A1 | 10/2019 | Neilson et al. |
| 2019/0317287 | A1 | 10/2019 | Raghunathan et al. |
| 2019/0357389 | A1* | 11/2019 | Saito .................. H05K 7/20154 |
| 2020/0015386 | A1 | 1/2020 | Gupta |
| 2020/0033544 | A1 | 1/2020 | Costello |
| 2020/0073061 | A1 | 3/2020 | Leigh et al. |
| 2020/0077544 | A1* | 3/2020 | Leung ..................... G06F 1/181 |
| 2020/0158964 | A1 | 5/2020 | Winzer et al. |
| 2020/0158967 | A1 | 5/2020 | Winzer et al. |
| 2020/0161243 | A1 | 5/2020 | Lee et al. |
| 2020/0163242 | A1 | 5/2020 | Leigh et al. |
| 2020/0219865 | A1 | 7/2020 | Nelson et al. |
| 2020/0292769 | A1 | 9/2020 | Zbinden |
| 2021/0044356 | A1 | 2/2021 | Aboagye |
| 2021/0072473 | A1 | 3/2021 | Wall, Jr. |
| 2021/0084749 | A1* | 3/2021 | Devalla .................. H05K 1/144 |
| 2021/0112683 | A1 | 4/2021 | Mohajer et al. |
| 2021/0210894 | A1 | 7/2021 | Rivaud et al. |
| 2021/0211785 | A1 | 7/2021 | Rose et al. |
| 2021/0239927 | A1 | 8/2021 | Rivaud et al. |
| 2021/0247580 | A1 | 8/2021 | Reagan |
| 2021/0263247 | A1* | 8/2021 | Bechtolsheim ...... G02B 6/4284 |
| 2021/0281323 | A1 | 9/2021 | Williams et al. |
| 2021/0281932 | A1 | 9/2021 | Chaouch et al. |
| 2021/0286140 | A1 | 9/2021 | Winzer |
| 2021/0294052 | A1 | 9/2021 | Winzer |
| 2021/0305127 | A1 | 9/2021 | Refai-Ahmed et al. |

(56) References Cited

U.S. PATENT DOCUMENTS

| | | | |
|---|---|---|---|
| 2021/0345024 A1 | 11/2021 | Leigh | |
| 2021/0345025 A1 | 11/2021 | Winzer et al. | |
| 2021/0345511 A1 | 11/2021 | Leigh et al. | |
| 2021/0367674 A1 | 11/2021 | Leclair et al. | |
| 2021/0376950 A1 | 12/2021 | Winzer | |
| 2021/0385000 A1 | 12/2021 | Nagarajan et al. | |
| 2021/0389536 A1 | 12/2021 | Dietrich et al. | |
| 2022/0003946 A1 | 1/2022 | Edwards, Jr. et al. | |
| 2022/0029379 A1* | 1/2022 | Kovsh | H01S 5/50 |
| 2022/0029380 A1 | 1/2022 | Kovsh | |
| 2022/0102583 A1 | 3/2022 | Baumheinrich et al. | |
| 2022/0109501 A1* | 4/2022 | Latchman | H04B 10/25073 |
| 2022/0114125 A1 | 4/2022 | Thakur et al. | |
| 2022/0141949 A1 | 5/2022 | Devalla et al. | |
| 2022/0141990 A1 | 5/2022 | Gupta | |
| 2022/0159860 A1 | 5/2022 | Winzer | |
| 2022/0159878 A1* | 5/2022 | Dillman | H05K 7/20509 |
| 2022/0187559 A1 | 6/2022 | Lin et al. | |
| 2022/0244465 A1 | 8/2022 | Winzer | |
| 2022/0263586 A1 | 8/2022 | Winzer | |
| 2022/0264759 A1 | 8/2022 | Sawyer et al. | |
| 2022/0279256 A1 | 9/2022 | Chaouch et al. | |
| 2022/0329020 A1 | 10/2022 | Narayanan et al. | |
| 2023/0003958 A1 | 1/2023 | Shimazu et al. | |
| 2023/0018654 A1 | 1/2023 | Winzer | |
| 2023/0039781 A1 | 2/2023 | Mohajer et al. | |
| 2023/0043794 A1 | 2/2023 | Winzer | |
| 2023/0064740 A1 | 3/2023 | Rathinasamy | |
| 2023/0077979 A1 | 3/2023 | Winzer | |
| 2023/0161109 A1 | 5/2023 | Pupalaikis et al. | |
| 2023/0176304 A1 | 6/2023 | Winzer | |
| 2023/0209761 A1 | 6/2023 | Winzer | |
| 2023/0258873 A1 | 8/2023 | Pupalaikis et al. | |
| 2023/0305247 A1 | 9/2023 | Hemp et al. | |
| 2023/0305249 A1 | 9/2023 | Hemp et al. | |
| 2023/0354541 A1 | 11/2023 | Cole et al. | |
| 2023/0358979 A1 | 11/2023 | Winzer et al. | |
| 2023/0375793 A1 | 11/2023 | Winzer et al. | |
| 2023/0380095 A1 | 11/2023 | Winzer et al. | |
| 2024/0036254 A1 | 2/2024 | Winzer | |
| 2024/0049434 A1 | 2/2024 | Mohajer et al. | |
| 2024/0064922 A1 | 2/2024 | Winzer | |
| 2024/0118484 A1 | 4/2024 | Winzer et al. | |
| 2024/0142731 A1 | 5/2024 | Hemp et al. | |
| 2024/0159979 A1 | 5/2024 | Winzer et al. | |
| 2024/0302612 A1 | 9/2024 | Winzer et al. | |

FOREIGN PATENT DOCUMENTS

| | | |
|---|---|---|
| CN | 106954102 B | 5/2021 |
| DE | 2833302 A1 | 2/1980 |
| JP | 2010-176010 A | 8/2010 |
| JP | 2013-051448 A | 3/2013 |
| WO | WO 2006/113094 A2 | 10/2006 |
| WO | WO 2009/107671 A1 | 9/2009 |
| WO | WO 2018/165335 A1 | 9/2018 |
| WO | WO 2020/083845 A1 | 4/2020 |
| WO | WO 2021/183792 A1 | 9/2021 |
| WO | WO 2021/188648 A1 | 9/2021 |
| WO | WO 2021/211725 A1 | 10/2021 |
| WO | WO 2021/247521 A1 | 12/2021 |
| WO | WO 2022/061160 A1 | 3/2022 |
| WO | WO 2022/076539 A1 | 4/2022 |
| WO | WO 2022/109349 A1 | 5/2022 |
| WO | WO 2023/183703 A1 | 9/2023 |

OTHER PUBLICATIONS

[No Author Listed], "2020 Optical Fiber Communication Conference and Exhibition: Conference Schedule," OFC 2020 tutorial M1H.4, Mar. 8-12, 2020, 152 pages.

[No Author Listed], "Hands-on with Intel Co-Packaged Optics and Silicon Photonics Switch," Serve the Home, Mar. 18, 2020, retrieved on Feb. 15, 2022, <https://www.youtube.com/watch?v=Esgyj26vdxs>, 31 pages.

[No Author Listed], "IEEE P802.3 Electrical I/O Specifications," LAN/MAN Standards Committee of the IEEE Computer Society, May 13, 2022, 235 pages.

[No Author Listed], "MTP/MPO Breakout Cable Datasheet," FS Technical Documents, Apr. 26, 2020, 9 pages.

[No Author Listed], "MTP/MPO Fiber Cables, Quick Start Guide V1.0," FS Technical Documents, Mar. 24, 2020, 5 pages.

[No Author Listed], "Paradigm Change: Reinventing HPC Architectures with In-Package Optical I/O," Ayar Labs, Solution Brief, Jul. 2, 2020, 9 pages.

[No Author Listed], "QSFP-DD MSA QSFP-DD/QSFP-DD800/QSFP112 Hardware Specification for QSFP Double Density 8X and QSFP 4X Pluggable Transceivers," Revision 6.2, Mar. 11, 2022, 169 pages.

[No Author Listed], "Rockley Photonics Silicon Photonics Platform for Next Generation Transceivers," Rockley Photonics, Mar. 2020, 1 page.

[No Author Listed], "Support Tomorrow's Speeds Inside Today's Footprint; Molex Solutions for 112 Gbps Architecture," Molex, 2019, 7 pages.

[No Author Listed], "Technical Brief: Optical I/O Chiplets Eliminate Bottlenecks to Unleash Innovation," Ayar Labs, Technical Brief, Dec. 6, 2021, 9 pages.

[No Author Listed], [online], "Intel's Plan to 1000x Performance with Raja Koduri," Nov. 2021, retrieved on Sep. 22, 2022, URL<https://www.youtube.com/watch?v=7CpDQ5WZiSU&t=7s>, 18 pages [Video Submission].

[No Author Listed], "QSFP-DD MSA QSFP-DD/QSFP-DD800/QSFP112 Hardware Specification for QSFP Double Density 8X and QSFP 4X Pluggable Transceivers," QSFP-DD, Revision 6.01, May 28, 2021, 167 pages.

[No Author Listed], "Specification for OSFP Octal Small Form Factor Pluggable Module," OSFP MSA, Rev 4.0, May 28, 2021, 109 pages.

Akhter et al., "WaveLight: A Monolithic Low Latency Silicon-Photonics Communication Platform for the Next-Generation Disaggregated Cloud Data Centers," 2017 IEEE 25th Annual Symposium on High-Performance Interconnects, Aug. 28-30, 2017, pp. 25-28.

Alexoudi et al., "Optics in Computing: From Photonic Network-on-Chip to Chip-to-Chip Interconnects and Disintegrated Architectures," Journal of Lightwave Technology, Jan. 15, 2019, 37(2):363-379.

Amazon.com [online], "IBM Midplane BOARD-8852Refurbished, 25R5780Refurbished)," Jun. 30, 2014, retrieved on Nov. 22, 2022, retrieved from URL< https://www.amazon.com/IBM-MIDPLANE-BOARD-8852-Refurbished-25R5780/dp/B00LEQ2URK>, 4 pages.

Analui et al., "A Fully Integrated 20-GB/s Optoelectronic Transceiver Implemented in a Standard 0.13-um CMOS SOI Technology," IEEE Journal of Solid-State Circuits, Dec. 2006, 41(12):2945-2955.

Blum, "Integrated silicon photonics for high volume data center applications," Proc. SPIE 11286, Optical Interconnects, Feb. 28, 2020, 10 pages.

Bower et al., "Heterogeneous Integration of Microscale Semiconductor Devices by Micro-Transfer-Printing," Electronic Components & Technology Conference, 2015, 963-967.

Bower et al., "Heterogeneous Integration of Microscale Semiconductor Devices by Micro-Transfer-Printing," IEEE 65th ECTC, San Diego, CA, USA, May 26-29, 2015, 30 pages.

Brusberg et al., "On-board Optical Fiber and Embedded Waveguide Interconnects," 2018 7th Electronic System-Integration Technology Conference (ESTC), Nov. 29, 2018, pp. 1-9.

Chen et al., "A 25Gb/s Hybrid Integrated Silicon Photonic Transceiver in 28nm CMOS and SOI," ISSSCC 2015, Session 22, High-Speed Optical Links, 22.2, 2:00PM, Feb. 25, 2015, 402-404.

Chopra, "Looking Beyond 400G: A System Vendor Perspective, Beyond 400 GB/s Ethernet Study Group," Cisco Fellow, Feb. 8, 2020, 23 pages.

Chuang et al., "Theoretical and empirical qualification of a mechanical-optical interface for parallel optics links," Optical Interconnects XV, Apr. 2015, 9368:11 pages.

(56) References Cited

OTHER PUBLICATIONS

Cook et al., "36-Channel Parallel Optical Interconnect Module Based on Optoelectronics-on-VLSI Technology," IEEE Journal of Selected Topics in Quantum Electronics, Mar./Apr. 2003, 9(2):387-391.

CoPackagedOptics.com [online], "3.2 Tb/s Copackaged Optics Optical Module Product Requirements Document," Feb. 2021, retrieved in Jan. 2022, retrieved from <http://www.copackagedoptics.com/wp-content/uploads/2021/02/JDF-3.2-Tb_s-Copackaged-Optics-Module-PRD-1.0.pdf>, 28 pages.

CoPackagedOptics.com [online], "Co-Packaged Optic Assembly Guidance Document," upon information and belief, available no later than Sep. 18, 2020, retrieved on Jan. 26, 2021, retrieved from URL <http://www.copackagedoptics.com/wp-content/uploads/2020/05/CPO-Assembly-Guidance-Doc-V1.0-FINAL.pdf>, 22 pages.

CoPackagedOptics.com [online], "Co-Packaged Optical Module Discussion Document," upon information and belief, available no later than Sep. 18, 2020, retrieved on Jan. 26, 2021, retrieved from URL <http://www.copackagedoptics.com/wp-content/uploads/2019/11/CPO-Module-Discussion-Doc-V1.0Final.pdf>, 18 pages.

CoPackagedOptics.com [online], "Co-Packaged Optics Collaboration FAQ," upon information and belief, available no later than Sep. 18, 2020, retrieved on Jan. 26, 2021, retrieved from URL <http://www.copackagedoptics.com/wpcontent/uploads/2019/11/CoPackagedOpticsCollaboration-FAQ-Final-051319.pdf>, 3 pages.

CoPackagedOptics.com [online], "Co-packaged Optics External Laser Source Guidance Document," upon information and belief, available no later than Sep. 18, 2020, retrieved on Jan. 26, 2021, retrieved from URL <http://www.copackagedoptics.com/wp-content/uploads/2020/01/ELS-Guidance-Doc-v1.0-FINAL.pdf>, 23 pages.

De Heyn et al., "Ultra-Dense 16x56Gb/s NRZ GeSi EAM-PD Arrays Coupled to Multicore Fiber for Short-Reach 896Gb/s Optical Links," In Optical Fiber Communication Conference, Mar. 2017, 3 pages.

Doany et al., "Multichannel High-Bandwidth Coupling of Ultradense Silicon Photonic Waveguide Array to Standard-Pitch Fiber Array," Journal of Lightwave Technology, Feb. 15, 2021, 29: 475-482.

Doany et al., "Terabit/Sec VCSEL-Based 48-Channel Optical Module Based on Holey CMOS Transceiver IC," Journal of Lightwave Technology, Feb. 15, 2013, 31:672-680.

Dobbelaere, "Advanced Silicon Photonics Technology Platform Leveraging a Semiconductor Supply Chain," 2017 IEEE International Electron Devices Meeting, Dec. 2-6, 2017, 4 pages.

Dobbelaere, "Silicon Photonics Technology Platform for Integration of Optical IOs with ASICs," 2013 IEEE Hot Chips 25 Symposium (HCS)—Silicon Photonics Technology Platform for integration of optical IOS with ASICs, Aug. 25-Aug. 27, 2013, 18 pages.

Dogruoz et al., "Optimizing QSFP-DD Systems to Achieve at Least 25 Watt Thermal Port Performance," QSFP-DD, Jan. 2021, 30 pages.

Extended European Search Report in European Appln. No. 21870320.5, mailed on Aug. 30, 2024, 14 pages.

Extended European Search Report in European Appln. No. 21878442.9, mailed on Aug. 30, 2024, 12 pages.

Extended European Search Report in European Appln. No. 22195981, dated Feb. 14, 2023, 9 pages.

Fathololoumi et al., "1.6Tbps Silicon Photonics Integrated Circuit and 800 Gbps Photonic Engine for Switch Co-Packaging Demonstration," Journal of Lightwave Technology, Feb. 15, 2021, 39:1155-1161.

Fathololoumi et al., "1.6Tbps Silicon Photonics Integrated Circuit for Co-Packaged Optical-IO Switch Applications," 2020 Optical Fiber Communications Conference and Exhibition (OFC), Mar. 8-12, 2020, 3 pages.

Fuse.wikichip.org [online], "Ayar Labs Realizes Co-Packaged Silicon Photonics," Jan. 19, 2020, retrieved on Feb. 15, 2022, retrieved from URL <https://fuse.wikichip.org/news/3233/ayar-labs-realizes-co-packaged-silicon-photonics/2/, 7 pages.

Fuse.wikichip.org [online], "Ayar Labs Realizes Co-Packaged Silicon Photonics," Jan. 19, 2020, retrieved on Mar. 23, 2022, retrieved from URL <https://fuse.wikichip.org/news/3233/ayar-labs-realizes-co-packaged-silicon-photonics/>, 6 pages.

Fuse.wikichip.org [online], "Ranovus Odin: Co-Packaging Next-Gen DC Switches and Accelerators With Silicon Photonics," Apr. 11, 2020, retrieved on or before Mar. 23, 2022, retrieved from URL <https://fuse.wikichip.org/news/3420/ranovus-odin-co-packaging-next-gen-dc-switches-and-accelerators-with-silicon-photonics/>, 8 pages.

Gazettabyte.com [online], "Ayar Labs prepares for the era of co-packaged optics," Feb. 21, 2019, retrieved on or before Mar. 23, 2022, retrieved from URL<http://www.gazettabyte.com/home/2019/2/21/ayar-labs-prepares-for-the-era-of-co-packaged-optics.html>, 7 pages.

Gazettabyte.com [online], "Inphi unveils first 800-gigabit PAM-4 signal processing chip," Apr. 8, 2020, retrieved on Feb. 15, 2022, retrieved from URL <http://www.gazettabyte.com/home/2020/4/8/inphi-unveils-first-800-gigabit-pam-4-signal-processing-chip.html>, 5 pages.

Gazettabyte.com [online], "Intel combines optics to its Tofino 2 switch chip," Mar. 19, 2020, retrieved on Jan. 26, 2022, retrieved from URL <http://www.gazettabyte.com/home/2020/3/19/intel-combines-optics-to-its-tofino-2-switch-chip.html>, 10 pages.

Gazettabyte.com [online], "Ranovus outlines its co-packaged optics plans," Apr. 20, 2020, retrieved on Feb. 15, 2022, retrieved from URL <http://www.gazettabyte.com/home/2020/4/30/ranovus-outlines-its-co-packaged-optics-plans.html>, 10 pages.

Grani et al., "Design and Evaluation of AWGR-based Photonic NoC Architectures for 2.5D Integrated High Performance Computing Systems," 2017 IEEE International Symposium on High Performance Computer Architecture (HPCA), May 8, 2017, pp. 289-295.

Gunn, "CMOS Photonics for High-Speed Interconnects," IEEE Micro, Mar.-Apr. 2006, 26:58-66.

Hayashi et al., "End-to-End Multi-Core Fiber Transmission Link Enabled by Silicon Photonics Transceiver with Grating Coupler Array," 2017 European Conference on Optical Communication (ECOC), Sep. 17-21, 2017, 3 pages.

Hosseini et al., "8 Tbps Co-Packaged FPGA and Silicon Photonics Optical IO," 2021 Optical Fiber Communications Conference and Exhibition (OFC), Jun. 1, 2021, 3 pages.

Hughes et al., "A Single-Mode Expanded Beam Separable Fiber Optic Interconnect for Silicon Photonics," Optical Fiber Communications Conference and Exhibition, Mar. 2019, 3 pages.

IBM, "Silicon Photonics Co-Packaging Webcast," COBO, Sep. 16, 2020, 31 pages.

Ieee802.org [online], "Broadened Consensus for a 200GEL Copper Cable Objective," Aug. 26, 2021, retrieved Oct. 17, 2022, retrieved from URL<https://www.ieee802.org/3/B400G/public/21_08/kocsis_b400g_01a_210826.pdf>, 17 pages.

Ieeee802.org [online], "Multi-200Gbps/lane Package Model Considerations," Jul. 12, 2022, retrieved Oct. 17, 2022, retrieved from URL<https://www.ieee802.org/3/df/public/22_07/benartsi_3df_01a_2207.pdf>, 13 pages.

International Preliminary Report on Patentability Chapter II in International Appln. No. PCT/US2021/053745, mailed Jun. 14, 2023, 14 pages.

International Preliminary Report on Patentability in International Appln. No. PCT/US2021/050945, mailed Mar. 30, 2023, 12 pages.

International Preliminary Report on Patentability in International Appln. No. PCT/US2021/060215, mailed Jun. 1, 2023, 41 pages.

International Preliminary Report on Patentability in International Appln. No. PCT/US2022/033870, mailed on Dec. 28, 2023, 13 pages.

International Preliminary Report on Patentability in International Appln. No. PCT/US2022/071857, mailed on Nov. 2, 2023, 23 pages.

International Preliminary Report on Patentability in International Appln. No. PCT/US2023/020730, mailed on Nov. 14, 2024, 9 pages.

International Search Report and Written Opinion in International Appln. No. PCT/US2021/050945, dated Dec. 27, 2021, 15 pages.

International Search Report and Written Opinion in International Appln. No. PCT/US2021/053745, dated Feb. 3, 2022, 15 pages.

(56) References Cited

OTHER PUBLICATIONS

International Search Report and Written Opinion in International Appln. No. PCT/US2021/060215, dated Mar. 22, 2022, 46 pages.
International Search Report and Written Opinion in International Appln. No. PCT/US2022/033870, mailed Sep. 28, 2022, 15 pages.
International Search Report and Written Opinion in International Appln. No. PCT/US2022/071857, mailed Jun. 29, 2022, 25 pages.
International Search Report and Written Opinion in International Appln. No. PCT/US2023/020730, mailed Jul. 31, 2023, 10 pages.
International Search Report and Written Opinion in International Appln. No. PCT/US2024/015979, mailed on Jul. 17, 2024, 17 pages.
Invitation to Pay Additional Fees in International Appln. No. PCT/US2021/060215, dated Jan. 26, 2022, 3 pages.
Invitation to Pay Additional Fees in International Appln. No. PCT/US2021/53745, dated Dec. 8, 2021, 2 pages.
Invitation to Pay Additional Fees in International Appln. No. PCT/US2024/015979, mailed May 13, 2024, 2 pages.
Itpeernetwork.com [online], "Industry-First Co-Packaged Optics Ethernet Switch Solution with Intel Silicon Photonics," Hou, IT Peer Network, Mar. 9, 2020, retrieved on or before Mar. 23, 2022, retrieved from URL <https://itpeernetwork.intel.com/optics-ethernet-solution/]>, 5 pages.
Janta-Polczynski et al., "Towards co-packaging of photonics and microelectronics in existing manufacturing facilities," Proc. SPIE 10538, Optical Interconnects XVIII, 105380B, Feb. 22, 2018, 11 pages.
Keeler et al., "Heterogeneous Integration of III-V Photonics and Silicon Electronics for Advanced Optical Microsystems," Sandia National Laboratories, Mar. 1, 2016, 23 pages.
Kocsis et al., "OSFP MDI Proposal," Amphenol, High Speed Interconnects, Mar. 6, 2016, 13 pages.
Krishnamoorthy et al., "From Chip to Cloud: Optical Interconnects in Engineered Systems," Journal of Light Wave Technology, Aug. 1, 2017, 35(15):3101-3111.
Kuchta "Co-Packaging on Organic Laminates: MOTION Phase 2 ARPA-E Enlitened Kickoff Meeting," IBM Research, Jan. 13, 2021, 16 pages.
Kuchta et al., "Multi-wavelength Optical Transceivers Integrated On Node (Motion)," ARPA, IBM, Apr. 22, 2019, 28 pages.
Kuchta et al., "Multi-wavelength Optical Transceivers Integrated On Node (Motion)," ARPA, IBM, Apr. 22, 2019, 40 pages.
LaserFocusWorld.com [online], "Integrated optics permeate datacenter networks," Laser Focus World Online Magazine, Oct. 1, 2018, retrieved on or before Mar. 23, 2022, retrieved from www.laserfocusworld.com, 4 pages.
LaserFocusWorld.com [online], "Photonics for Datacenters: Integrated optics permeate datacenter networks," Oct. 2018, retrieved on Jan. 26, 2022, retrieved from URL <https://www.laserfocusworld.com/optics/article/16555340/photonics-for-datacenters-integrated-optics-permeate-datacenter-networks>, 16 pages.
Lee et al., "End-to-End Multicore Multimode Fiber Optic Link Operating up to 120 Gb/s," Journal of Lightwave Technology, Mar. 15, 2012, 30:886-892.
Lee et al., "OnRamps: Optical Networks Using Rapid Amplified Multi-wavelength Photonic Switches," PowerPoint, ARPA, IBM Research, Apr. 22, 2019, 27 pages.
Lee, "OnRamps: Optical Networks Using Rapid Amplified Multi-wavelength Photonic Switches," PowerPoint, ARPA, IBM Research, Apr. 22, 2019, 17 pages.
Li et al., "A 112 Gb/s PAM4 Linear TIA with 0.96 pJ/bit Energy Efficiency in 28 nm CMOS," ESSCIRC 2018—IEEE 44th European Solid State Circuits Conference (ESSCIRC), Sep. 2-6, 2018, pp. 238-241.
Liang et al., "Fully-Integrated Heterogeneous DML Transmitters for High-Performance Computing," Journal of Lightwave Technology, Jul. 1, 2020, 38:3322-3337.
Liang et al., "Integrated energy efficient WDM photonic solution for Data Centers and Supercomputers," ARPA-E Enlightened Review Meeting, Seattle, WA, Oct. 23-24, 2018, 24 pages.
Liang, "Integrated DWDM Photonics 2.0 for Green Exascale Supercomputing in HPE," ARPA-Enlightened Annual Review Meeting, Coronado, CA, USA, Oct. 30-Nov. 1, 2019, 19 pages.
Logan et al., "800Gb/s Silicon Photonic Transmitter for Co-Packaged Optics," 2020 IEEE Photonics Conference (IPC), Sep. 28-Oct. 2020, 2 pages.
Lusted et al. "Motions and Straw Polls," IEEE P802.3df Task Force, Intel, Sep. 2022, 6 pages.
Mahajan et al., "Co-Packaged Photonics for High Performance Computing: Status, Challenges and Opportunities," Journal of Lightwave Technology, Jan. 15, 2022, 40:379-398.
Mangal et al., "Through-substrate coupling elements for silicon-photonics based short-reach optical interconnects," Proceedings of the SPIE, Optical Interconnects XIX, Mar. 2019, 10924: 14 pages.
Marchetti et al., "Coupling strategies for silicon photonics integrated chips," Photonics Research, Feb. 2019, 7(2):201-239.
Marvell Technology, [online], "Post Moore Data Center Networks for 800GbE/1.6TbE with Radha Nagarajan | Marvell Technology," https://www.marvell.com, Sep. 14, 2021, retrieved on Nov. 30, 2021, <https://www.youtube.com/watch?v=ruo_WNqEBP8>, 13 pages [Video Submission].
Meade et al., "TeraPHY: A High-density Electronic-Photonic Chiplet for Optical I/O from a Multi-Chip Module," 2019 Optical Fiber Communications Conference and Exhibition (OFC), Mar. 3-7, 2019, 3 pages.
Michelogiannakis et al., "Efficient Intra-Rack Resource Disaggregation for HPC Using Co-Packaged DWDM Photonics," CoRR, submitted Jul. 17, 2023, arXiv:2301.03592v3, 15 pages.
Minkenberg et al., "Reimagining Datacenter Topologies With Integrated Silicon Photonics," Journal of Optical Communications and Networking, Jul. 2018, 10(7):B126-B139.
Missinne et al., "Alignment-tolerant interfacing of a photonic integrated circuit using back side etched silicon microlenses," Proceedings of the SPIE, Oct. 2019, 10923: 8 pages.
Moazeni et al., "A 40-Gb/s PAM-4 Transmitter Based on a Ring-Resonator Optical DAC in 45-nm SOI CMOS," IEEE Journal of Solid-State Circuits, Dec. 2017, 52:3503-3516.
Nagarajan, "2.5D Heterogeneous Silicon Photonics Light Engine with Integrated DFB Lasers and Electronics," Poster, Presented at OCP Future Technologies Symposium, Inphi Corp, 2020 OCP Global Summit, Mar. 4-5, 2020, 1 page.
Nagarajan, "2.5D Heterogeneous Silicon Photonics Light Engine with Integrated DFB Lasers and Electronics," Presentation, Presented at OCP Future Technologies Symposium, Inphi Corp, 2020 OCP Global Summit, Mar. 4-5, 2020, 13 pages.
Nambiar et al., "Grating-Assisted Fiber to Chip Coupling for SOI Photonic Circuits," Applied Sciences. Jul. 2018, 8(7): 22 pages.
Notaros et al., "Ultra-Efficient CMOS Fiber-to-Chip Grating Couplers," Optical Fiber Communication Conference, Mar. 20-22, 2016, 3 pages.
Nowell et al., "Progress in 100G Lambda MSA Based on 100G PAM4 Technology," 2020 Optical Fiber Communications Conference and Exhibition (OFC), Mar. 8-12, 2020, 3 pages.
Patterson et al., "The future of packaging with silicon photonics," Chip Scale Review, Jan. & Feb. 2017, 10 pages.
Raj et al., "50Gb/s Hybrid Integrated Si-Photonic Optical Link in 16nm FinFET," 2020 European Conference on Optical Communications (ECOC), Dec. 6-10, 2020, 4 pages.
Raj et al., "Design of a 50-GB/s Hybrid Integrated Si-Photonic Optical Link in 16-nm FinFET," IEEE Journal of Solid-State Circuits, Apr. 2020, 55: 1086-1095.
Rakowski, "Silicon photonics platform for 50G optical interconnects," Cadence Photonics Summit and Workshop, San Jose, CA, Sep. 6-7, 2017, 45 pages.
Roberts et al., "High Speed Optics—The road to 44G and Beyond," CiscoLive!, Jan. 28-Feb. 1, 2019, 102 pages.
Rockleyphotonics.com [online], "25.6T Switch Co-Packages with LightDriver and Copper Cable Attached 400G Modules," Rockley Photonics, 2020, retrieved on Mar. 24, 2022, retrieved from <https://rockleyphotonics.com/?s=25.6+T+switch+co-package>, 1 page.
Rockleyphotonics.com [online], "Rockley Photonics collaborates with Accton, TE and Molex to demonstrate a 25.6Tbps OptoASIC Switch system," Rockley Photonics, Mar. 10, 2020, retrieved on or

(56) References Cited

OTHER PUBLICATIONS before Mar. 23, 2022, retrieved from <https://rockleyphotonics.com/rockley-photonics-collaborates-with-accton-te-and-molex-to-demonstrate-a-25-6tbps-optoasic-switch-system/>, 6 pages.
Rockleyphotonics.com [online], "Sailing Through the Data Deluge with Pervasive Optical Connectivity," Rockley Photonics, Feb. 2019, retrieved on or before Mar. 23, 2022, retrieved from <https://rockleyphotonics.com/wp-content/uploads/2019/02/Rockley-Photonics-Sailing-through-the-Data-Deluge.pdf>, 9 pages.
Romagnoli et al., "High Bandwidth density optically interconnected Terabit/s Boards," SPIE OPTO, Jan. 30, 2018, 15 pages.
Rostan et al., "EtherCAT enabled Advanced Control Architecture," 2010 IEEE/SEMI Advanced Semiconductor Manufacturing Conference (ASMC), 2010, pp. 39-41.
Saeedi et al., "A 25 GB/s 3D-Integrated CMOS/Silicon-Photonic Receiver for Low-Power High-Sensitivity Optical Communication," Journal of Lightwave Technology, Jun. 15, 2016, 34(12):2924-2933.
Sakib et al., "A high-speed micro-ring modulator for next generation energy-efficient optical networks beyond 100 Gbaud," CLEO: Science and Innovations 2021, San Jose, California United States, May 9-14, 2021, 3 pages.
Samtec.com [online], "FLYOVER® QSFP Cable Systems, Cages, and Heat Sinks," 2022, retrieved on Dec. 22, 2022, retrieved from URL<https://www.samtec.com/cables/high-speed/assemblies/qsfp-flyover>, 12 pages.
Samtec.com [online], "NOVARAY® I/O 112 Gbps PAM4 Panel Mount Cable System," May 18, 2022, retrieved on Mar. 29, 2023, retrieved from URL<https://www.samtec.com/cables/high-speed/io-assemblies/novaray-io>, 12 pages.
Scarcella et al., "Pluggable Single-Mode Fiber-Array-to-PIC Coupling Using Micro-Lenses," IEEE Photonics Technology Letters, Oct. 2017, 29(22):1943-1946.
Schröder et al., "Demonstration of glass based photonic interposer for mid-board-optical engines and electrical-optical circuit board (EOCB) integration strategy," Proc. SPIE, Optical Interconnects XVIII, Feb. 22, 2018, 10538:57-69.
Semianalysis.com [online], "Intel's Trojan Horse into the Foundry Business | Co-packaged Silicon Photonics is Intel's Path Forward for IDM 2.0," Jun. 11, 2021, retrieved on Aug. 15, 2022, retrieved from URL<https://semianalysis.com/intels-trojan-horse-into-the-foundry-business-co-packaged-silicon-photonics-is-intels-path-forward-for-idm-2-0/>, 22 pages.
Servethehome.com [online], "Hands-on with the Intel Co-Packaged Optics and Silicon Photonics Switch," Mar. 18, 2020, retrieved on Mar. 24, 2022, retrieved from <https://www.servethehome.com/hands-on-with-the-intel-co-packaged-optics-and-silicon-photonics-switch/>, 25 pages.
Servethehome.com [online], "Important Silicon Photonics Future at Intel Vision 2022," May 16, 2022, retrieved on Aug. 15, 2022, retrieved from URL<https://www.servethehome.com/important-silicon-photonics-future-at-intel-vision-2022-lightbender-light-bender/>, 6 pages.
Shang et al., "High-temperature reliable quantum-dot lasers on Si with misfit and threading dislocation filters," Optics, May 2021, 8:749-754.
Shen et al., "Silicon photonic integrated circuits and its application in data center," Proc. SPIE 11763, Seventh Symposium on Novel Photoelectronic Detection Technology and Applications, Mar. 12, 2021, 15 pages.
Shen et al., "Silicon Photonics for Extreme Scale Systems," Journal of Lightwave Technology, Jan. 15, 2019, vol. 37:245-258.
Stojanovic et al., "Monolithic silicon-photonic platforms in state-of-the-art CMOS SOI processes [Invited]," Optics Express, May 7, 2018, 26: 1-16.
Sun et al., "A 45 nm CMOS-SOI Monolithic Photonics Platform With Bit-Statistics-Based Resonant Microring Thermal Tuning," IEEE Journal of Solid-State Circuits, Apr. 2016, 51:893-907.
Sun et al., "A Monolithically-Integrated Chip-to-Chip Optical Link in Bulk CMOS," 2014 Symposium on VLSI Circuits Digest of Technical Papers, Apr. 2015, 2 pages.
Sun et al., "Single-chip microprocessor that communicates directly using light," Nature, Dec. 2015, 528; 534-544.
Sun et al., "TeraPHY: An O-band WDM Electro-optic Platform for Low Power, Terabit/s Optical I/O," 2020 IEEE Symposium on VLSI Technology, Dec. 2, 2020, 2 pages.
Timurdogan et al., "400G Silicon Photonics Integrated Circuit Transceiver Chipsets for CPO, OBO, and Pluggable Modules," 2020 Optical Fiber Communications Conference and Exhibition (OFC), Mar. 12-8, 2020, 3 pages.
Timurdogan et al., "An Ultra Low Power 3D Integrated Intra-Chip Silicon Electronic-Photonic Link," 2015 Optical Fiber Communications Conference and Exhibition (OFC), Mar. 22-26, 2015, 3 pages.
Tracy, "Supporting Data to Demonstrate 100Gbps Capability of Proposed MDIs," TW Connectivity, Sep. 13, 2018, 9 pages.
Wade et al., "75% Efficient Wide Bandwidth Grating Couplers in a 45 nm Microelectronics CMOS Process," 2015 IEEE Optical Interconnects Conference (OI), Apr. 20-22, 2015, 46-47.
Wade et al., "A Bandwidth-Dense, Low Power Electronic-Photonic Platform and Architecture for Multi-Tbps Optical I/O," 2018 European Conference on Optical Communication (ECOC), Sep. 23-27, 2018, 3 pages.
Wade et al., "An Error-free 1 Tbps WDM Optical I/O Chiplet and Multi-wavelength Multi-port Laser," 2021 Optical Fiber Communications Conference and Exhibition (OFC), Jun. 6-10, 2021, 3 pages.
Wade et al., "TeraPHY: A Chiplet Technology for Low-Power, High-Bandwidth In-Package Optical I/O," IEEE Computer Society, Mar. & Apr. 2020, 9 pages.
Wade et al., "TeraPHY: A Chiplet Technology for Low-Power, High-Bandwidth In- Package Optical I/O," Presentation Ayar Labs and Intel, Hot Chips 2019, Aug. 20, 2019, 48 pages.
Wang et al., "4×112 Gbps/Fiber CWDM VCSEL Arrays for Co-Packaged Interconnects," Journal of Lightwave Technology, Jul. 1, 2020, 38:3439-3444.
Wang et al., "Bidirectional Tuning of Microring-Based Silicon Photonic Transceivers for Optimal Energy Efficiency," Proceedings of the 24th Asia and South Pacific Design Automation Conference, Jan. 21, 2019, pp. 370-375.
Wang et al., "Energy-Efficient Channel Alignment of DWDM Silicon Photonic Transceivers," 2018 Design, Automation & Test in Europe Conference & Exhibition, Mar. 19-23, 2018, 4 pages.
Yoshida et al. "56-Gb/s PAM4 × 8-Channel VCSEL-Based Optical Transceiver for Co-Packaged Optics," 2022 IEEE CPMT Symposium Japan (ICSJ), 2022, 4 pages.
Young et al., "Optical I/O Technology for Tera-Scale Computing, " IEEE Journal of Solid-State Circuits, Jan. 2010, 45(1):235-242.
Yu et al., "400Gbps Fully Integrated DR4 Silicon Photonics Transmitter for Data Center Applications," 2020 Optical Fiber Communications Conference and Exhibition (OFC), Mar. 8-12, 2020, 3 pages.
Zhang et al., "3D and 2.5D Heterogeneous Integration Platforms with Interconnect Stitching and Microfluidic Cooling," Georgia Institute of Technology, Doctor of Philosophy in the School of Electrical and Computer Engineering Aug. 2017, 151 pages.
Zhao et al., "Ultra-dense Silicon Photonics Coupling Solution for Optical Chip Scale Package Transceiver," In Asia Communications and Photonics Conference, Nov. 2016, 3 pages.
Zheng et al., Ultra-efficient 10 Gb/s hybrid integrated silicon photonic transmitter and receiver, Optics Express, Mar. 2011, 19(6):5172-5186.
Zilkie et al., "Multi-micron silicon photonics platform for highly manufactural and versatile photonic integrated circuits," IEEE Journal of Selected Topics in Quantum Electronics, Apr. 15, 2019, 15 pages.
Mar. 26, 2026, Extended European Search Report issued for European Patent Application No. EP 23 79 9941.

* cited by examiner

1990

| | |
|---|---|
| Switch capacity | 51.2 Tbps |
| CPO module capacity | 1.6 Tbps |
| CPO modules | 32 |
| RLS fibers/module | 2-4 |
| RLS fibers total | 64 – 128 |
| RLS power per 100 Gbps | 14 – 18 dBm |
| RLS power per CPO module | 400mW – 1 W |
| Available power per laser | up to 500 mW |
| Wallplugefficiency | 10 – 20% |
| Electrical power per laser | 2.5 – 5W |
| Remote lasers per CPO module | 1 – 2 |
| Remote lasers per box | 32 – 64 |
| RLS packaging | e.g., QSFP, OSFP |

2000

| | |
|---|---|
| Switch capacity | 51.2 Tbps |
| CPO module capacity | 1.6 Tbps |
| CPO modules | 32 |
| RLS fibers/module | 2 – 4 |
| RLS fibers total | 64 – 128 |
| RLS power per 100 Gbps | 14 – 18 dBm |
| RLS power per CPO module | 400 mW – 1 W |
| Available power per laser | up to 500 mW |
| Wallplug efficiency | 10 – 20% |
| Electrical power per laser | 2.5 – 5 W |
| Remote lasers per CPO module | 1 – 2 |
| Remote lasers per box | 32 – 64 |
| RLS packaging | e.g., QSFP, OSFP |

Rack system with vertically mounted blades

*OSFP module pinout*

Example having electronics on the PIC at North/South/East/West

COMMUNICATION SYSTEMS HAVING PLUGGABLE OPTICAL MODULES

CROSS-REFERENCE TO RELATED APPLICATIONS

This application is a continuation of U.S. patent application Ser. No. 18/311,009, filed on May 2, 2023, which claims priority to U.S. provisional patent application 63/337,582, filed on May 2, 2022, U.S. provisional patent application 63/407,581 filed on Sep. 16, 2022, U.S. provisional patent application 63/416,902 filed on Oct. 17, 2022, and U.S. provisional patent application 63/431,610 filed on Dec. 9, 2022. The entire disclosures of the above applications are hereby incorporated by reference.

TECHNICAL FIELD

This document describes communication systems having pluggable optical modules.

BACKGROUND

This section introduces aspects that can help facilitate a better understanding of the disclosure. Accordingly, the statements of this section are to be read in this light and are not to be understood as admissions about what is in the prior art or what is not in the prior art.

For example, a data center can include switches installed in a rack, each switch includes one or more data processors mounted on a circuit board disposed in an enclosure. Each switch includes one or more optical communication modules for converting input optical signals received from optical fiber cables into input electrical signals that are provided to the one or more data processors, and converting output electrical signals from the one or more data processors to output optical signals that are output to the optical fiber cables.

SUMMARY OF THE INVENTION

In a general aspect, an apparatus includes a housing capable of being mounted in a rack, and a vertically oriented switch card. The vertically oriented switch card includes one or more vertically oriented application-specific integrated circuits (ASIC) mounted on the vertically oriented switch card. The switch card also includes a two-dimensional arrangement of plug ports. Each plug port is configured to receive a pluggable optical module. The switch card also includes a two-dimensional arrangement of channel intakes. Each channel intake is positioned adjacent to at least one of the plug ports of the two dimensional arrangements of plug ports. Each channel intake receives air and directs the received air towards an interior of the housing capable of being mounted in a rack.

Implementations can include one or more of the following features. Each channel intake may connect to a channel that extends into the interior of the housing capable of being mounted in a rack. At least one channel can extend through a cut out of the vertically oriented switch card. The at least one channel may include one or more structures for heat regulation in the housing. The one or more structures may extend the entire length of the channel. The one or more structures may extend a portion of the length of the channel. Each channel may include one or more structures for heat regulation of the apparatus. Each of the one or more structures may comprises a fin geometry. Two ASICs may be mounted within the housing. Each plug port may be configured to receive a small form factor pluggable. Each plug port may be configured to receive at least one of (i) a small form factor pluggable, (ii) an octal small form factor pluggable, or (iii) an extra-dense small form factor pluggable (OSFP extra dense).

In some examples, each channel includes one or more structures for heat regulation of the apparatus. The apparatus may further include a structural support that provides mechanical rigidity to assist with insertion and extraction of the pluggable optical module at the respective plug port. A structure in the one or more structures for heat regulation of the apparatus may include a first end of the structure at a first width, and a second end of the structure at a second width, the second width is smaller than the first width.

In a general aspect, an apparatus includes a housing capable of being mounted in a rack and a vertically oriented switch card. The vertically oriented switch card includes one or more vertically oriented application-specific integrated circuits (ASIC) mounted on the vertically oriented switch card, a two-dimensional arrangement of plug ports, each plug port is configured to receive a pluggable optical module. The vertically oriented switch card includes a two-dimensional arrangement of channel intakes. Each channel intake is positioned adjacent to at least one of the plug ports of the two dimensional arrangements of plug ports, each channel intake receives air and directs the received air towards an interior of the housing capable of being mounted in a rack. The vertically oriented switch card includes a first heatsink air intake positioned above the one or more vertically oriented application-specific integrated circuits, and a second heatsink air intake positioned below the one or more vertically oriented application-specific integrated circuits.

Implementations can include one or more of the following features. The apparatus can include at least one (i) a first heatsink air dam, proximate to the first heatsink air intake, configured to receive and direct air towards the first heatsink air intake; or (ii) a second heatsink air dam, proximate to the second heatsink air intake, configured to receive and direct air towards the second heatsink air intake. The first heatsink air intake is configured to direct air to a first set of heatsink fins, and the first set of heatsink fins extend from the first heatsink air intake. The second heatsink air intake is configured to direct air to a second set of heatsink fins, and the second set heatsink fins extend from the second heatsink air intake. The vertically oriented switch card includes a pair of connectors, each connector of the pair of connectors is configured to connect the vertically oriented switch card to a horizontal back line card. The vertically oriented switch card includes an input/output module coupled with one or both connectors of the pair of connectors. In some examples, at least one channel intake in the two-dimensional arrangement of channel intakes has a first end of the at least one channel intake at a first width, and a second end of the at least one channel intake at a second width. The first end is located adjacent to the at least one of the plug ports and the second end is located at the interior of the housing, the second width being larger than the first width.

Particular embodiments of the subject matter described in this specification can be implemented to realize one or more of the following advantages. The data processing system has a high power efficiency, a low construction cost, a low operation cost, and high flexibility in reconfiguring optical network connections.

The details of one or more embodiments of the subject matter described in this specification are set forth in the accompanying drawings and the description below. Other features, aspects, and advantages of the invention will become apparent from the description, the drawings, and the claims.

Unless otherwise defined, all technical and scientific terms used herein have the same meaning as commonly understood by one of ordinary skill in the art to which this invention belongs. In case of conflict with patent applications or patent application publications incorporated herein by reference, the present specification, including definitions, will control.

BRIEF DESCRIPTION OF THE DRAWINGS

The disclosure is best understood from the following detailed description when read in conjunction with the accompanying drawings. It is emphasized that, according to common practice, the various features of the drawings are not to-scale. The dimensions of the various features can be arbitrarily expanded or reduced for clarity.

FIG. 128 is a diagram of an example of a fiber guide that includes one or more photon supplies.

FIG. 129 is a diagram of an example of a rackmount server that includes guide rails/cage to assist the insertion of fiber guides.

FIG. 130 is a side view of an example of a rackmount server that has a hinge-mounted front panel.

FIG. 131 is a top view of an example of a rackmount server that has a hinge-mounted front panel.

FIG. 132 is a diagram of an example of an optical cable.

FIG. 133 shows a top view diagram and a side view diagram of a rackmount server that has a hinged front panel.

FIG. 134 shows a top view, a vertical application specific integrated circuit (VASIC)-plane front view, and a front-panel front view of an example of a rackmount server.

FIG. 135 shows a top view, a VASIC-plane front view, and a front-panel front view of an example of another rackmount server.

FIG. 136A is a diagram of an example of a data processing system.

Figure 136A:
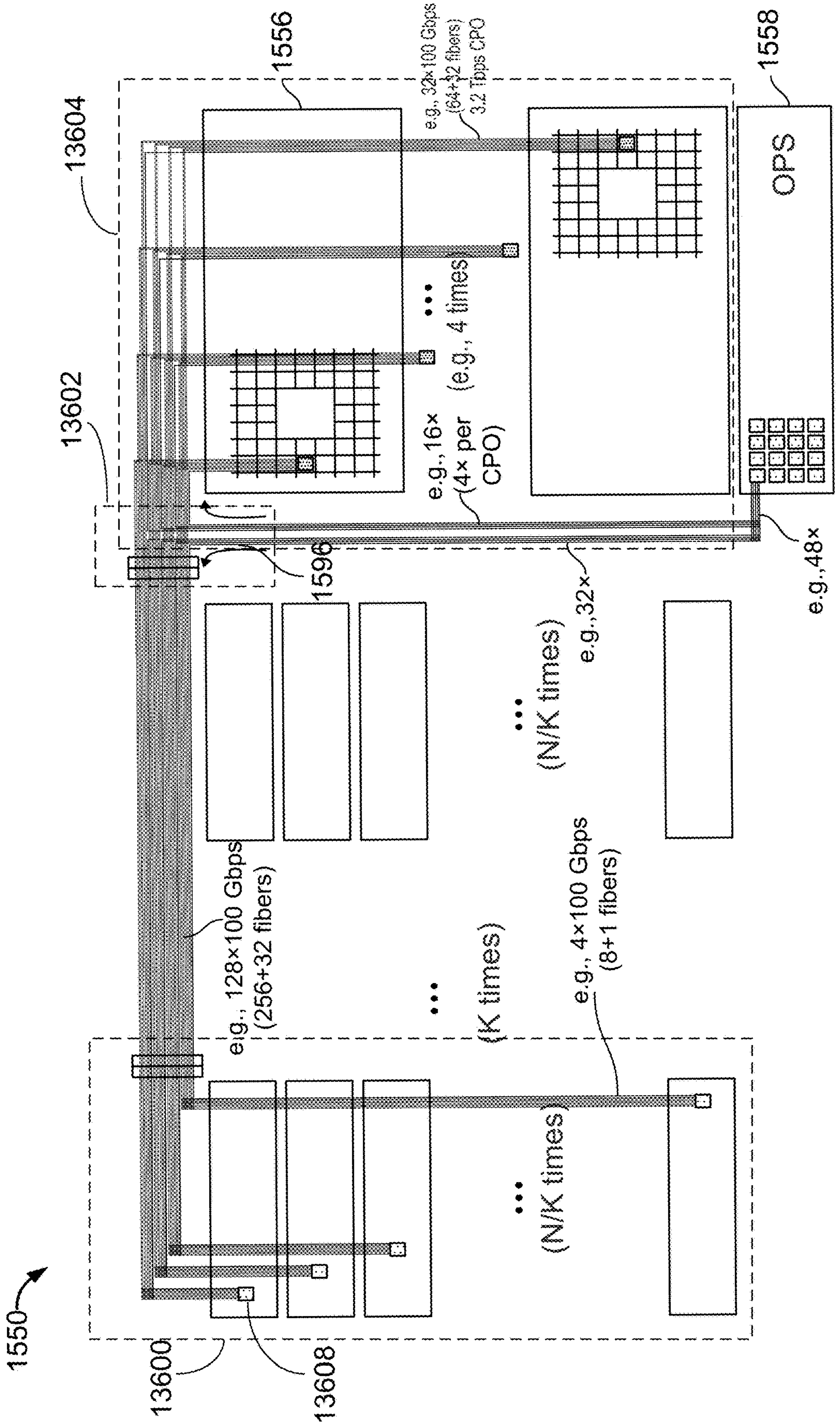

FIGS. 136B, 136C, 136D, 136E, 136F, 136G, and 136H are diagrams of portions of the data processing system of FIG. 136A.

Figure 137:
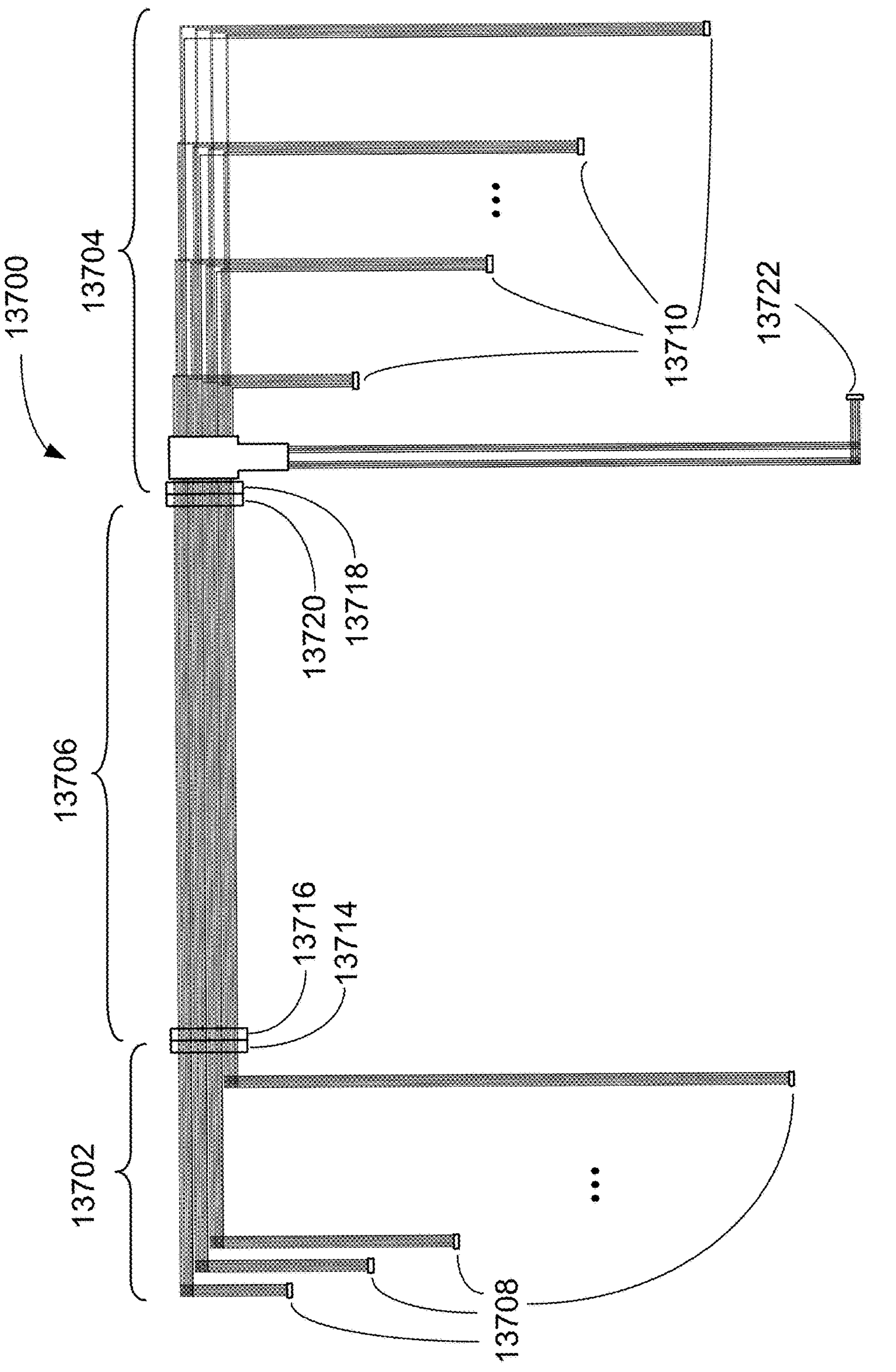

FIG. 137 is a diagram of optical fiber connectors.

Figure 138:
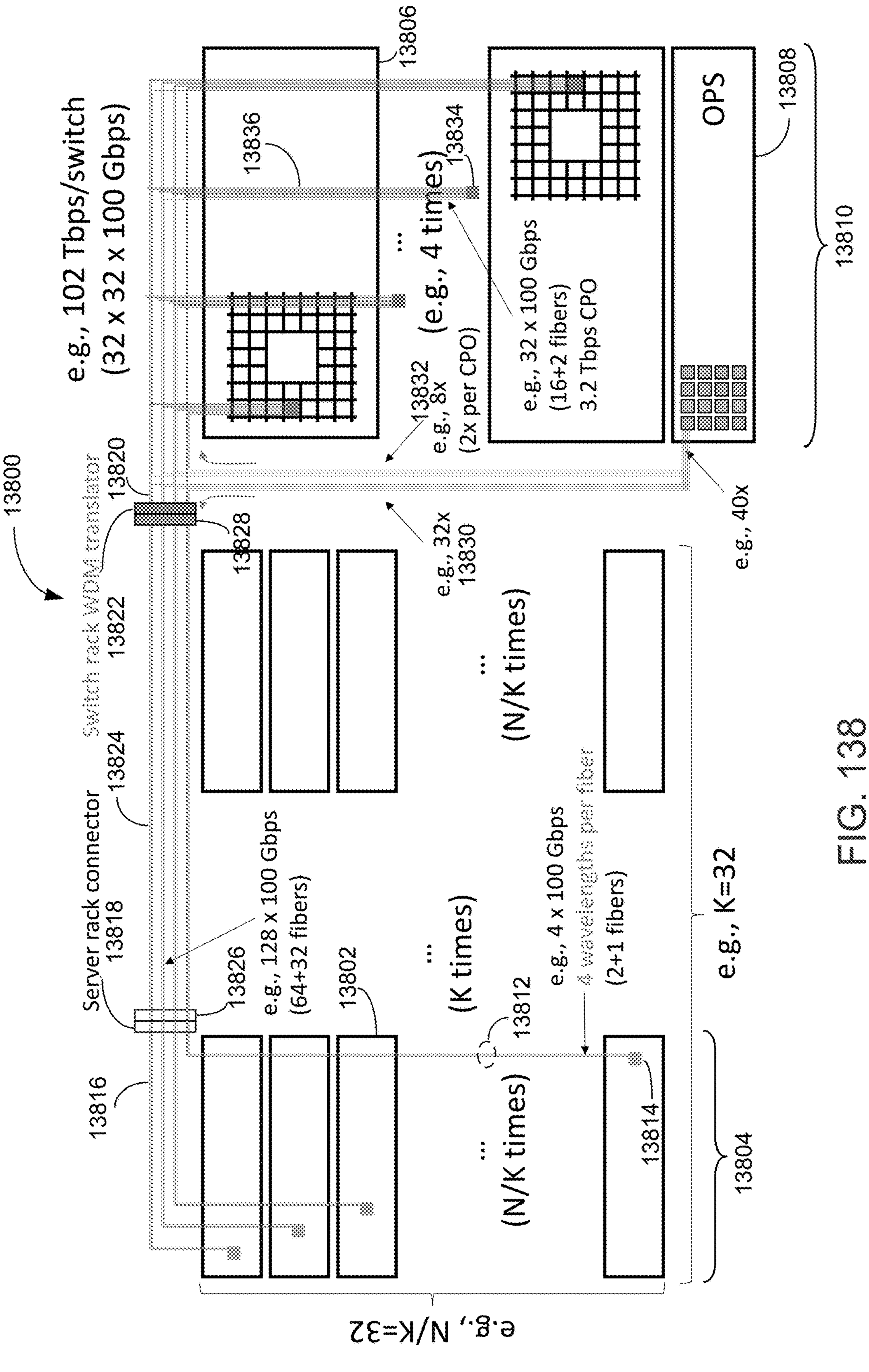

FIG. 138 is a diagram of an example of a wavelength division multiplexing (WDM) data processing system.

Figure 139A:
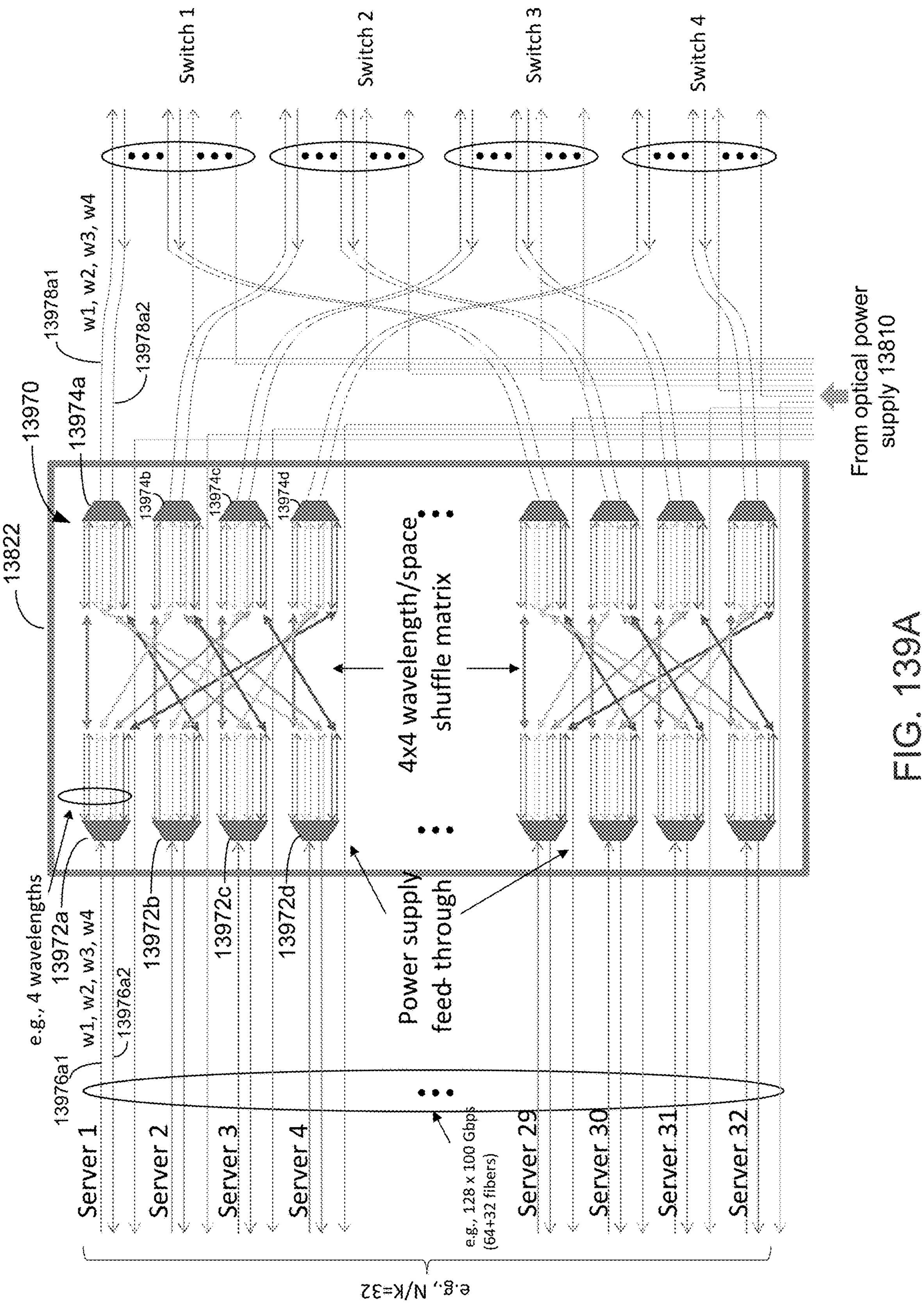

FIG. 139A is a diagram of an example of a switch rack WDM translator.

Figure 139B:
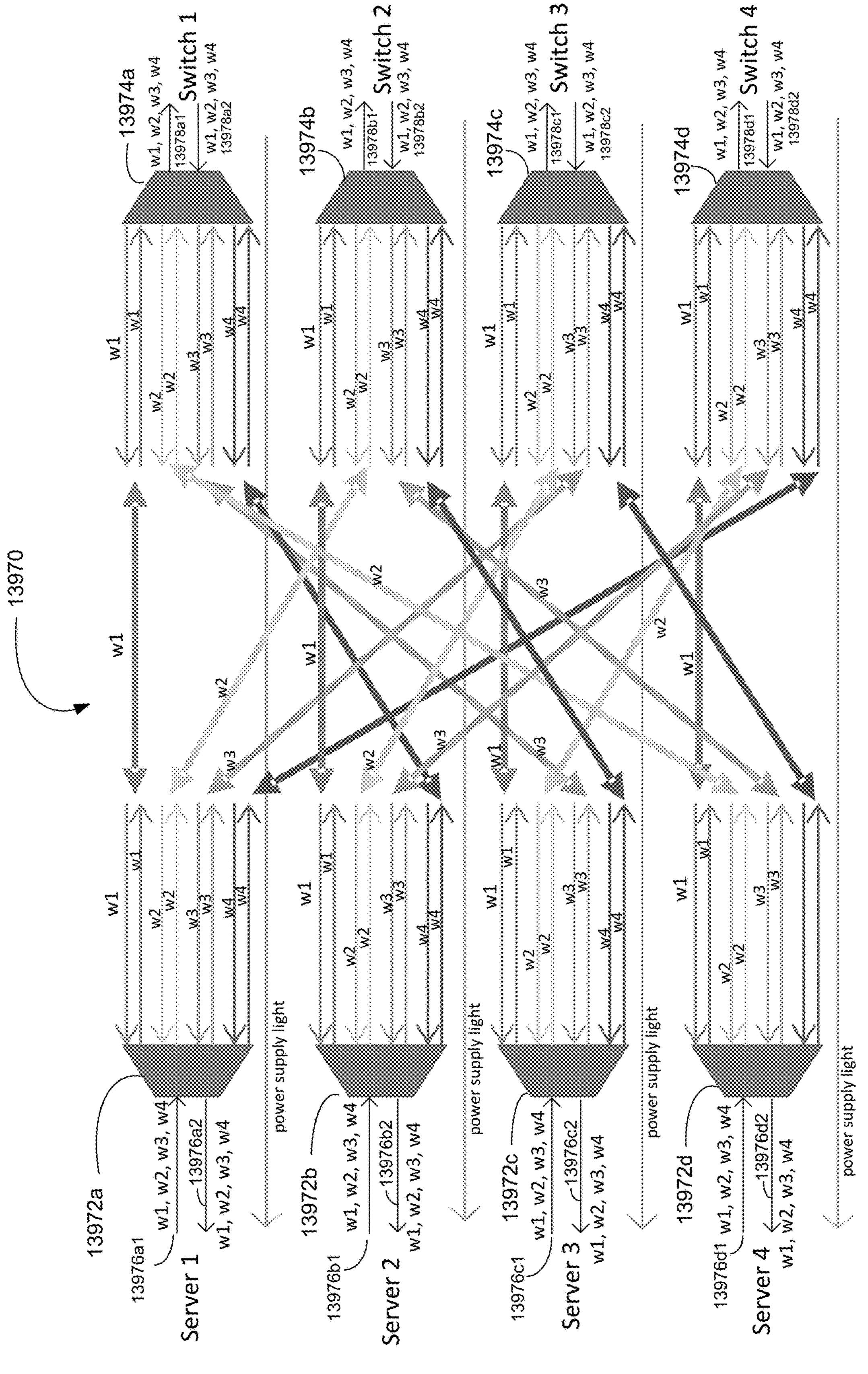

FIG. 139B is a diagram of an example of a 4×4 wavelength/space shuffle matrix.

Figure 140A:
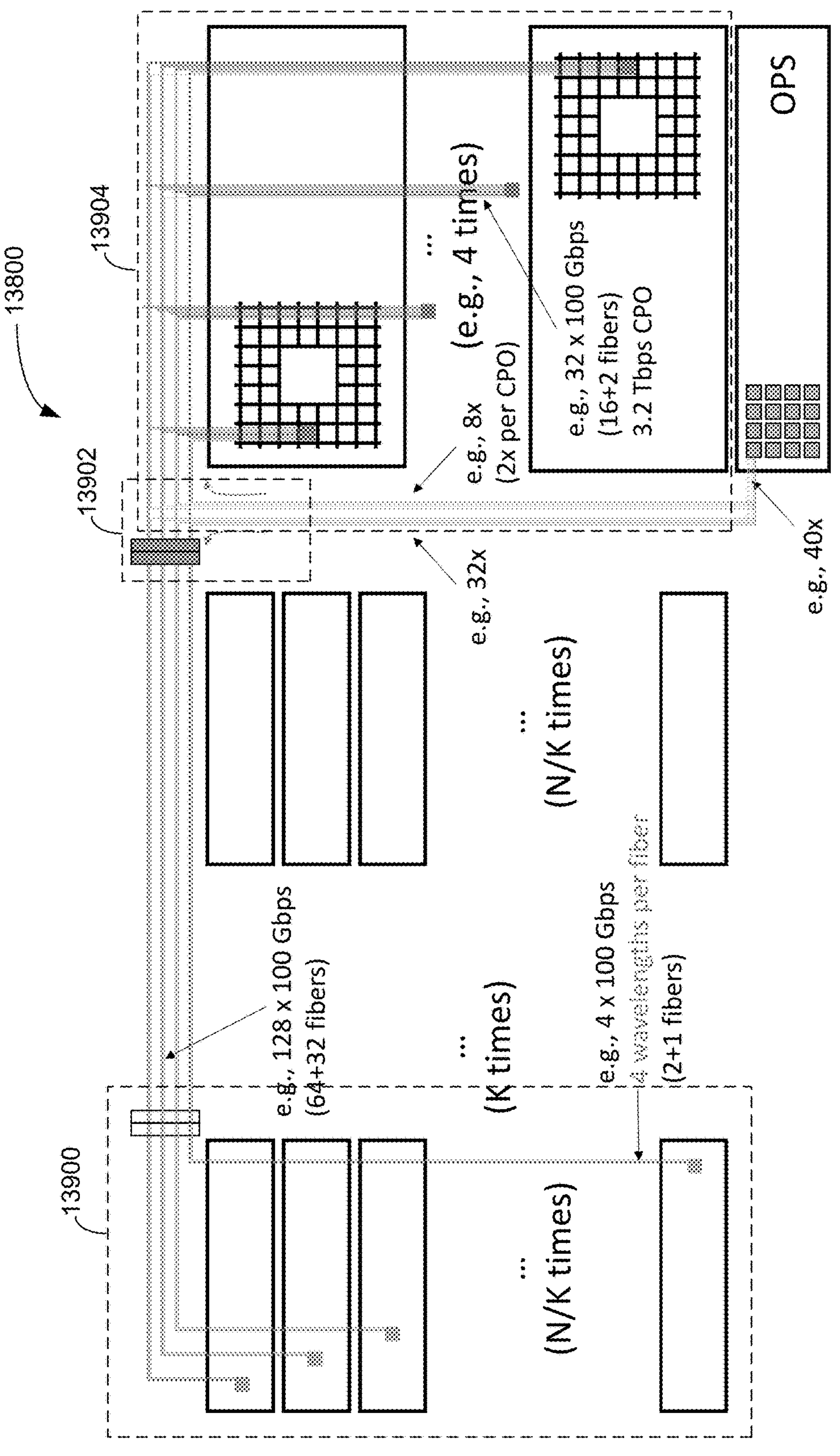

FIG. 140A is a diagram of an example of a wavelength division multiplexing data processing system.

FIGS. 140B, 140C, 140D, 140E, 140F, 140G, and 140H are diagrams of portions of the WDM data processing system of FIG. 140A.

Figure 141:
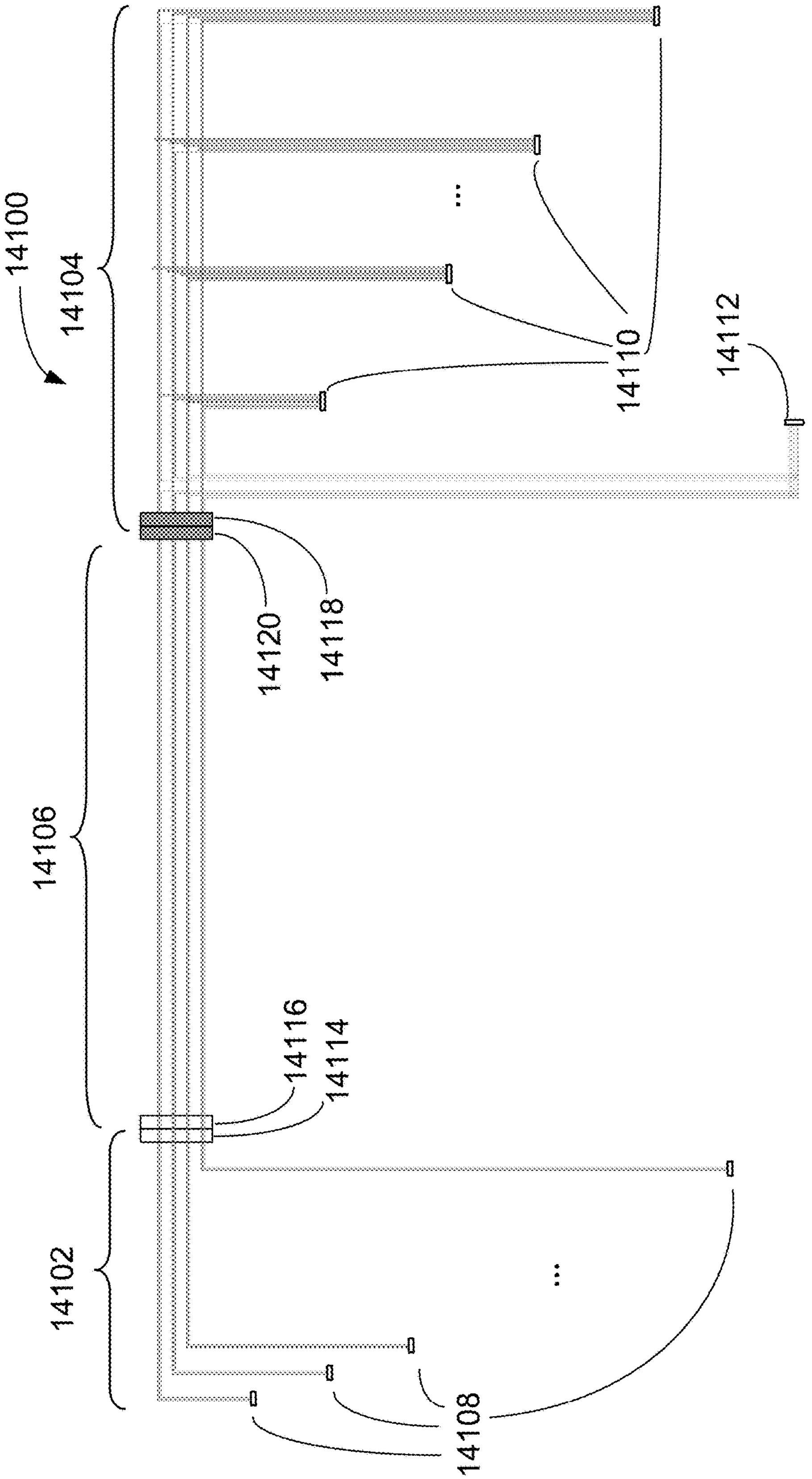

FIG. 141 is a diagram of optical fiber connectors.

Figure 89:
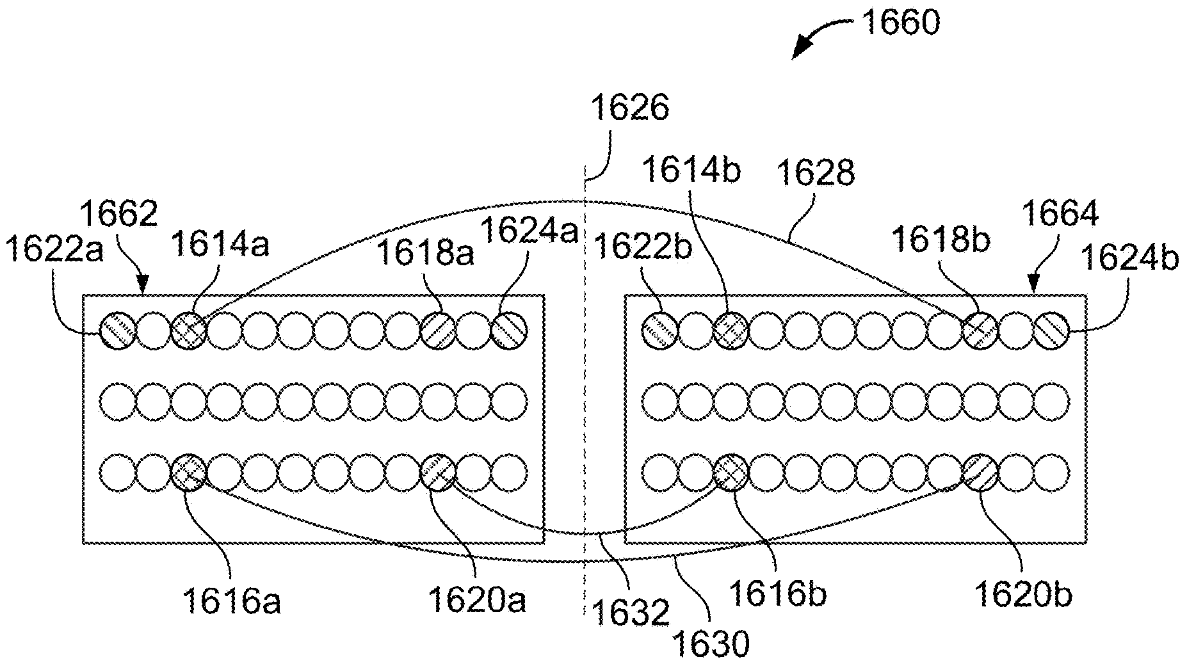
FIGS. 89 and 90 are diagrams of examples of fiber port mapping for optical fiber interconnection cables.
Figure 142:
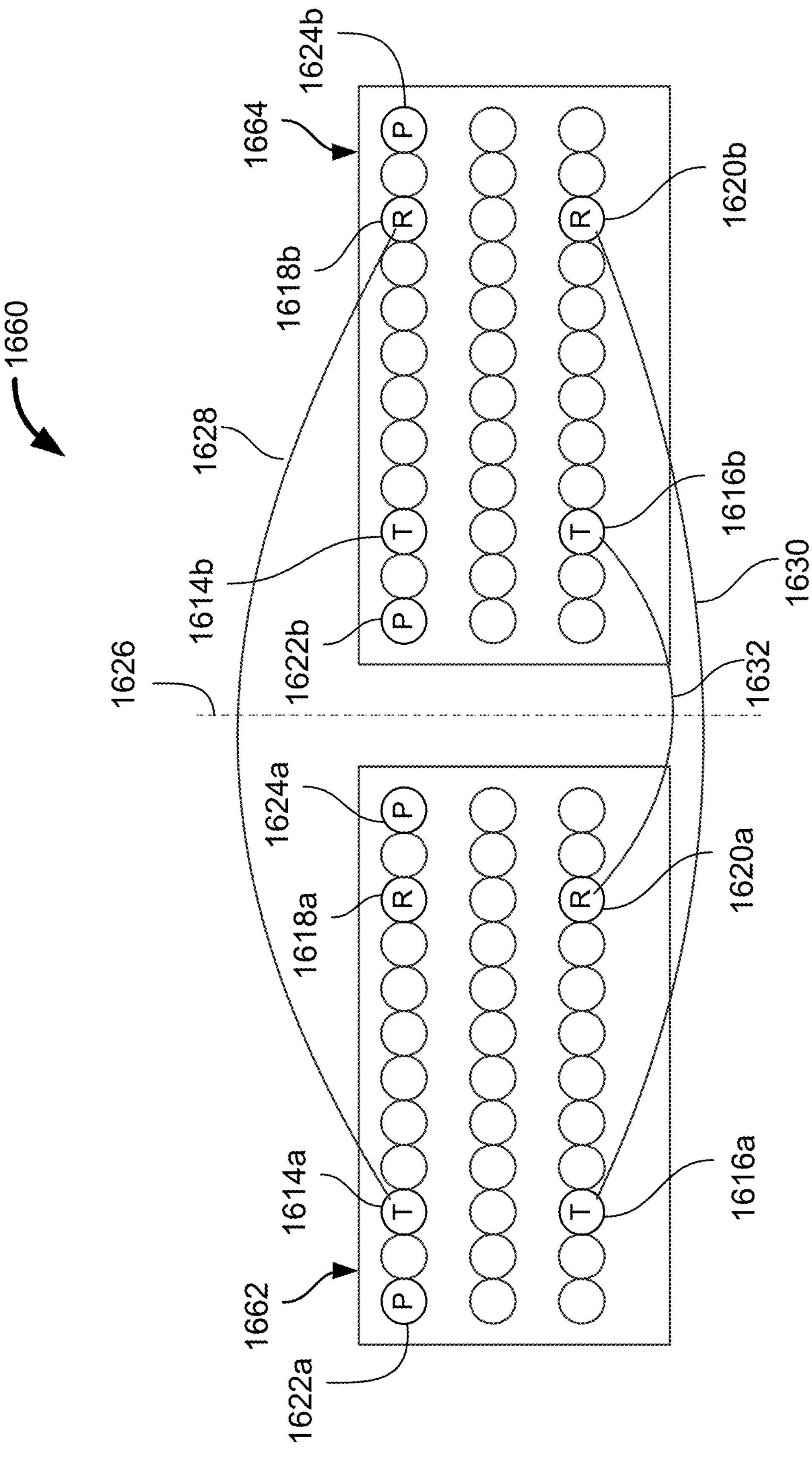

FIG. 142 is an enlarged view of the diagram of FIG. 89.

Figure 90:
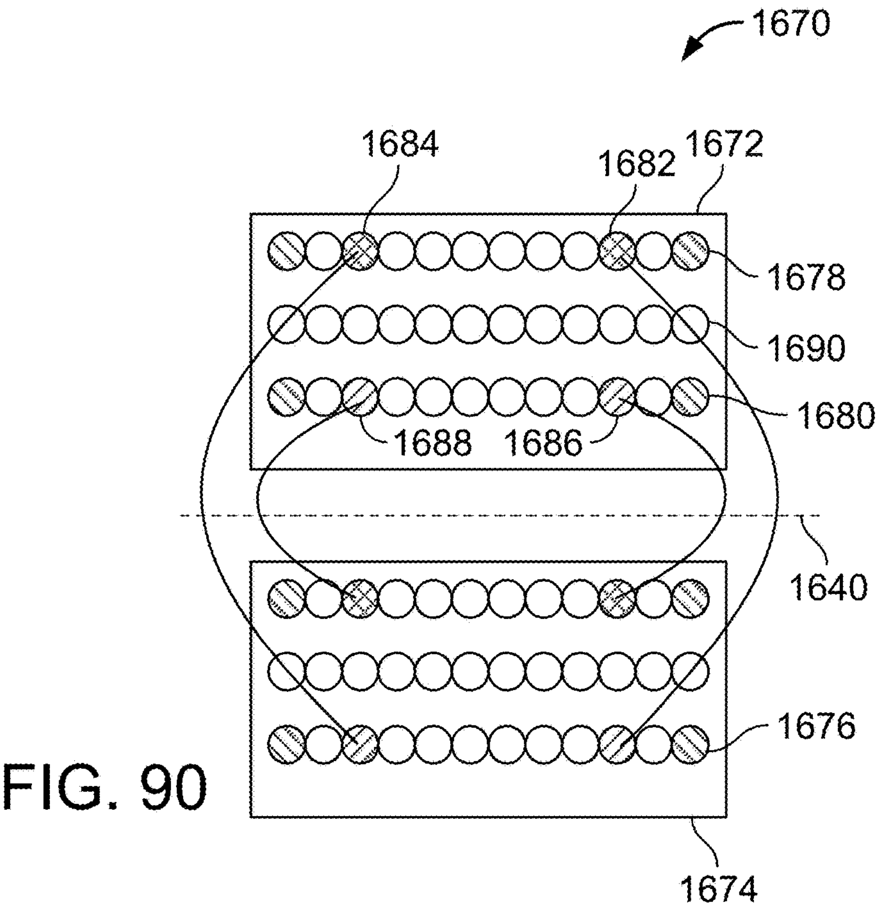
Figure 143:
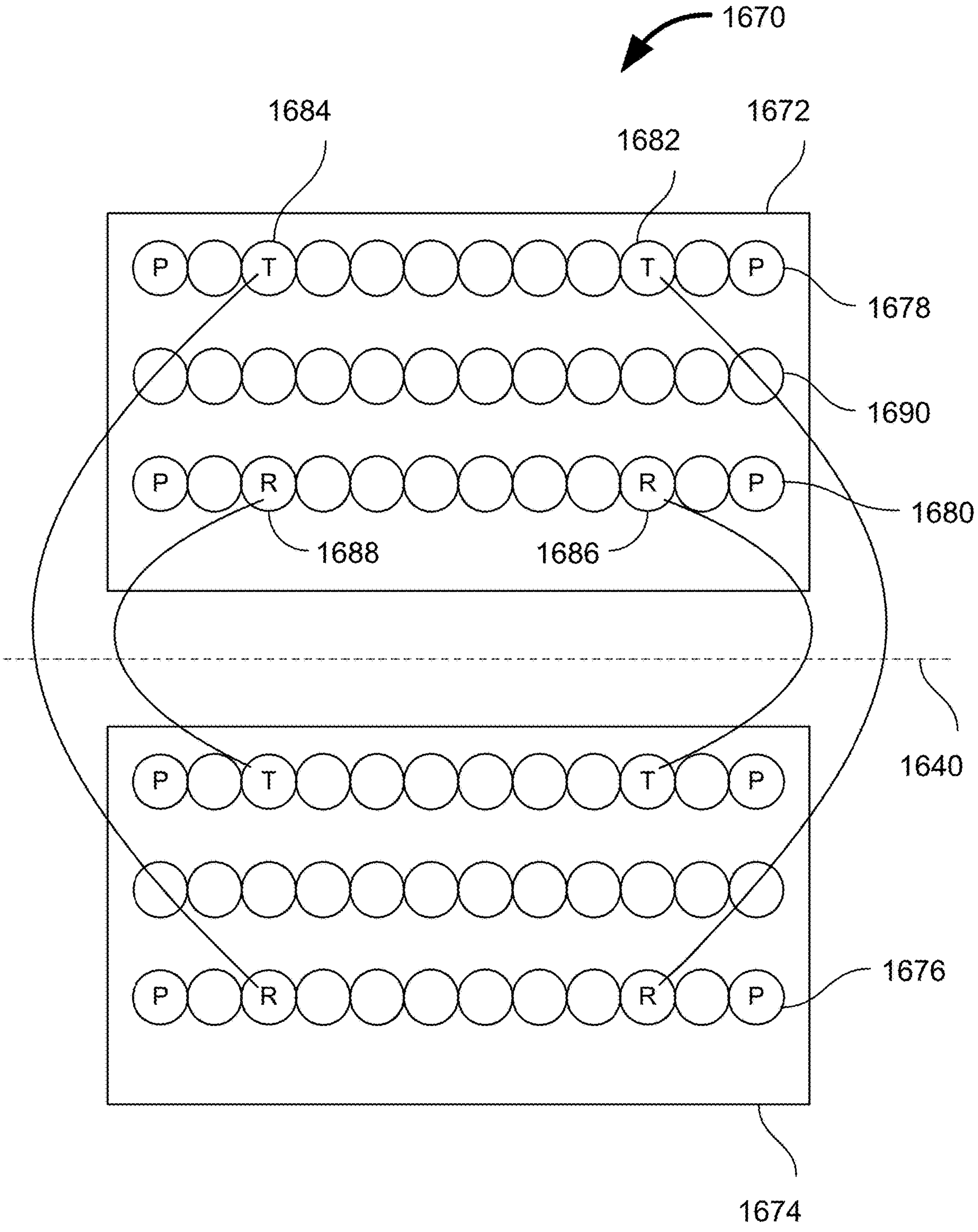

FIG. 143 is an enlarged view of the diagram of FIG. 90.

Figure 91:
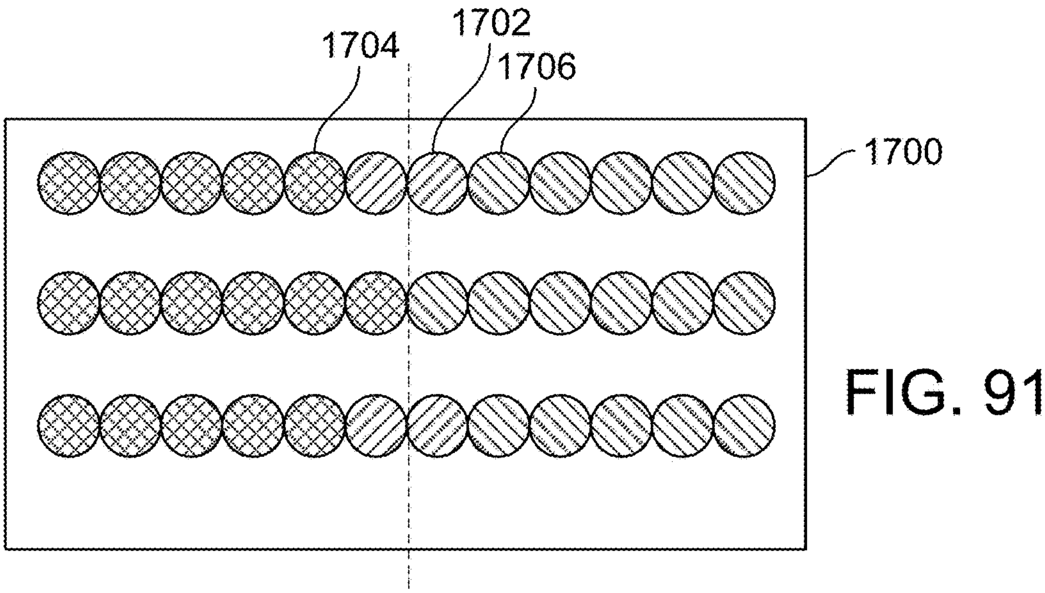
FIGS. 91 and 92 are diagrams of examples of viable port mapping for optical fiber connectors of universal optical fiber interconnection cables.
Figure 144:
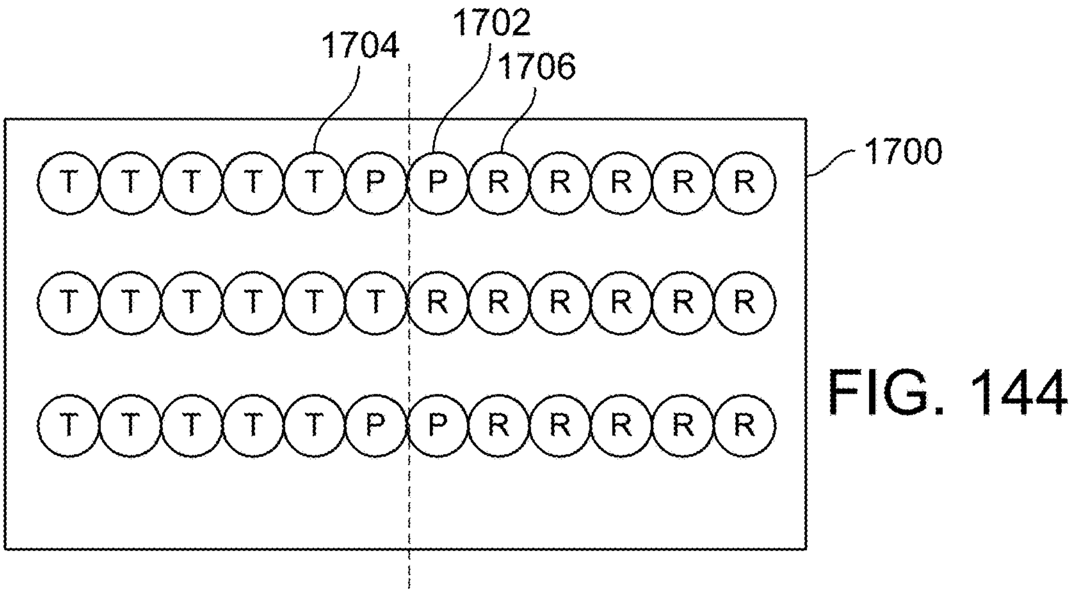

FIG. 144 shows the diagram of FIG. 91.

Figure 92:
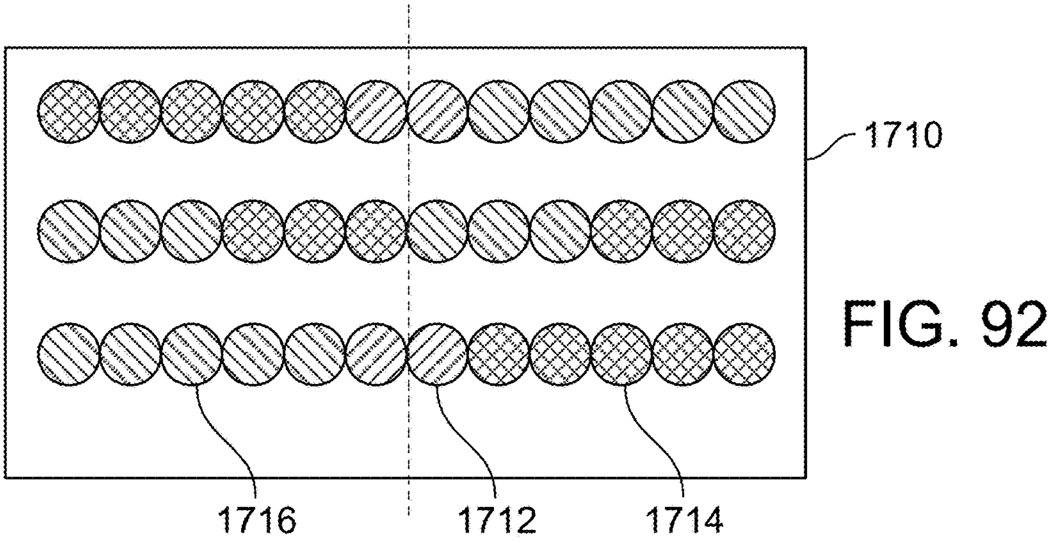
Figure 145:
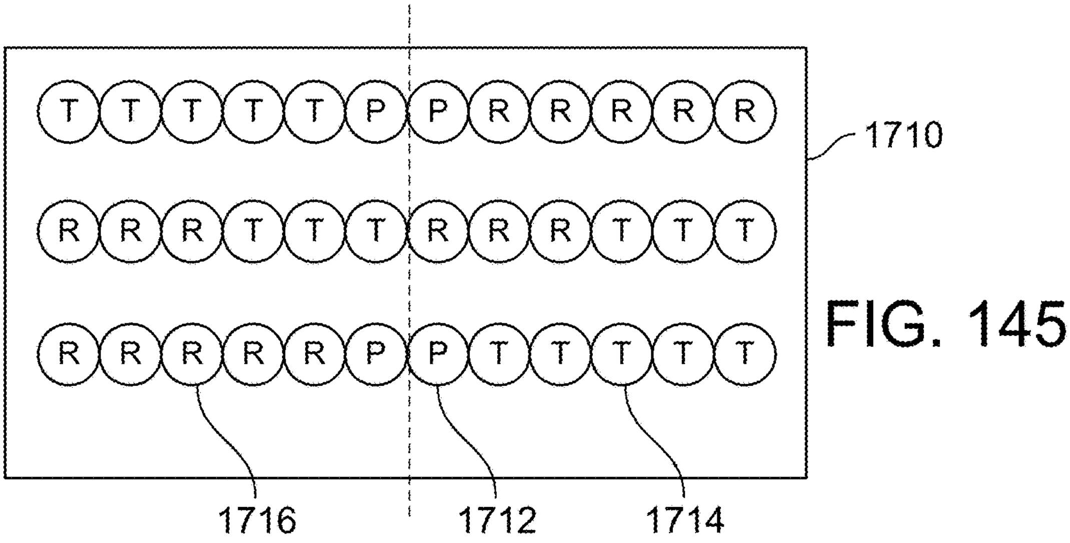

FIG. 145 shows the diagram of FIG. 92.

Figure 93:
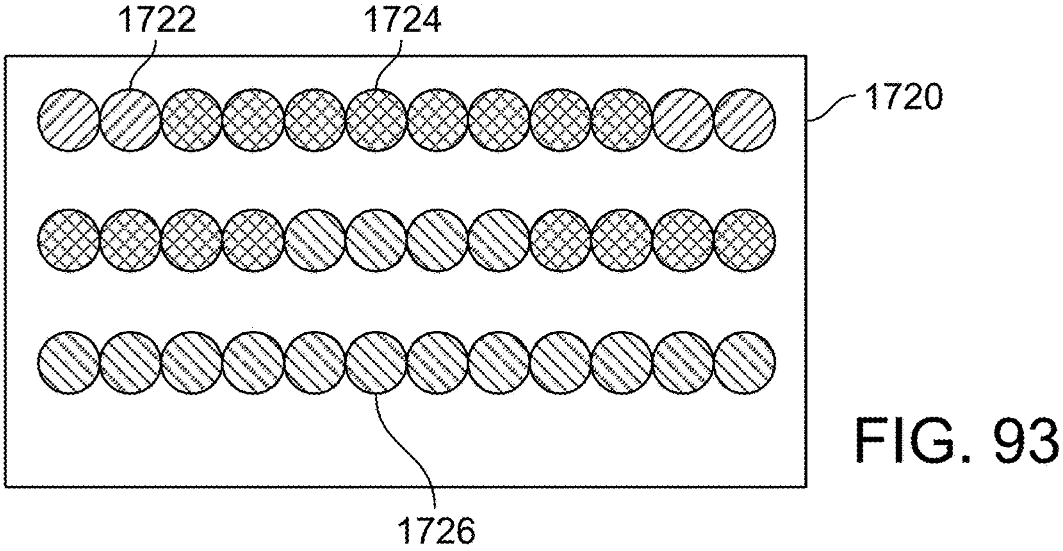
FIG. 93 is a diagram of an example of a port mapping for an optical fiber connector that is not appropriate for a universal optical fiber interconnection cable.
Figure 146:
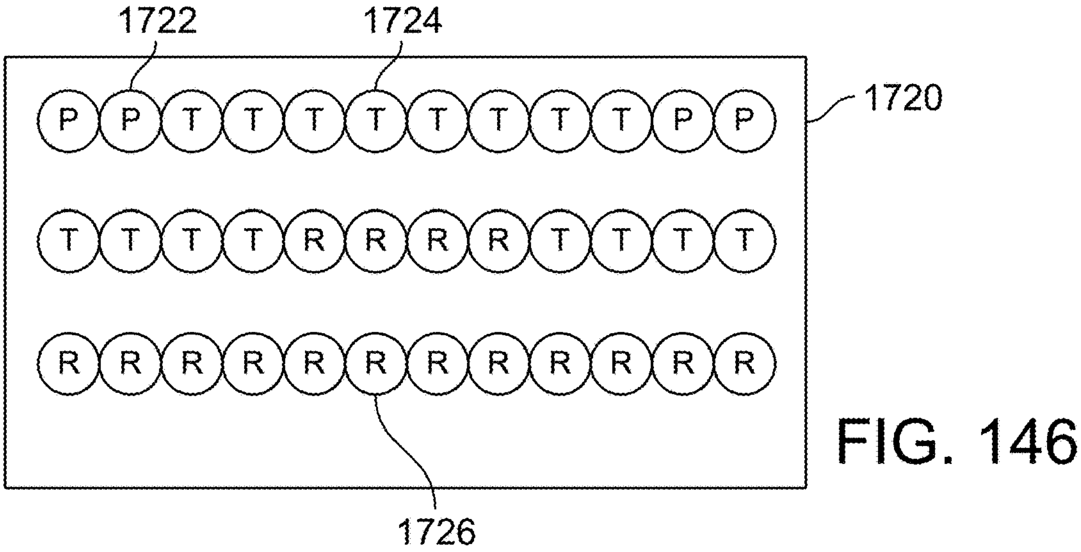

FIG. 146 shows the diagram of FIG. 93.

FIGS. 147, 148, 149, 150, and 151 are diagrams of examples of a system that can provide a large memory bank or memory pool.

Figure 152A:
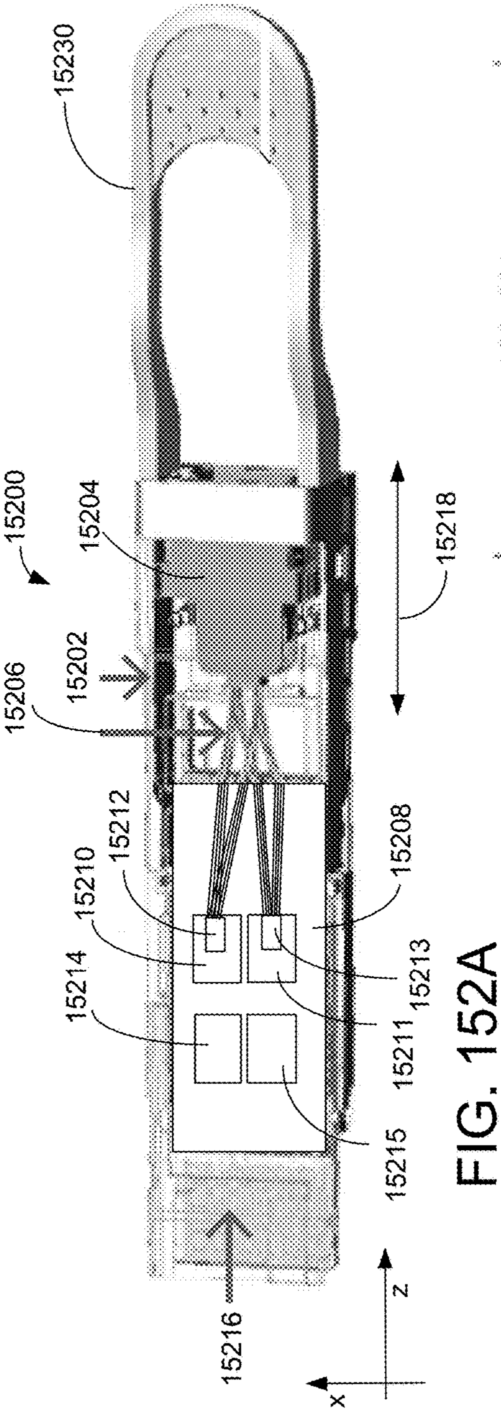

FIG. 152A is a diagram of an example pluggable optical module.

Figure 152B:
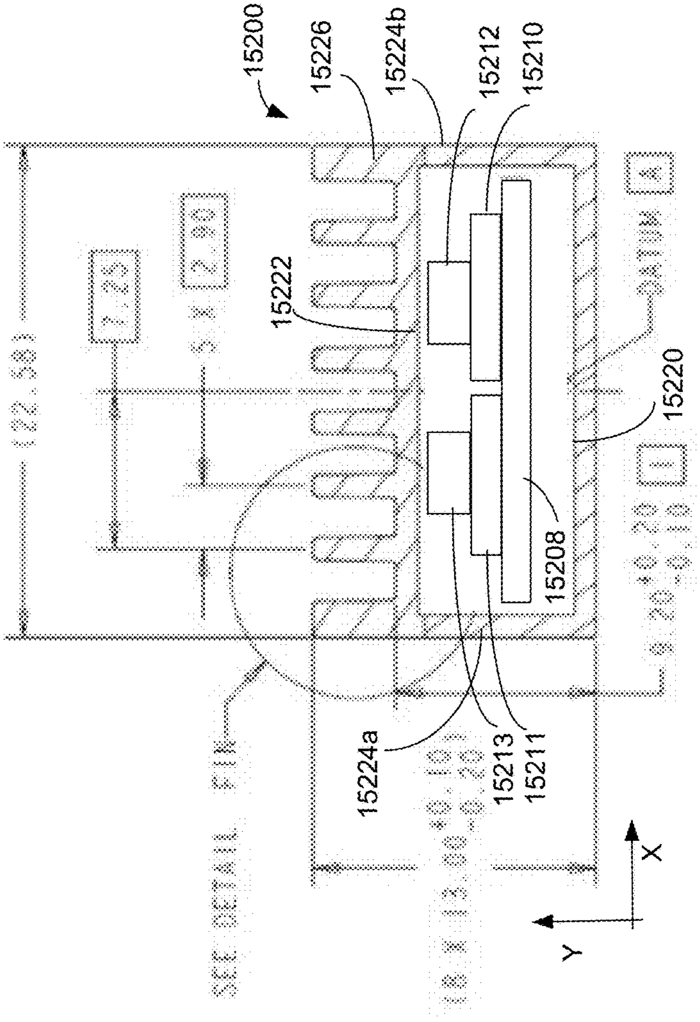

FIG. 152B is a cross-sectional diagram of the pluggable optical module.

Figure 153A:
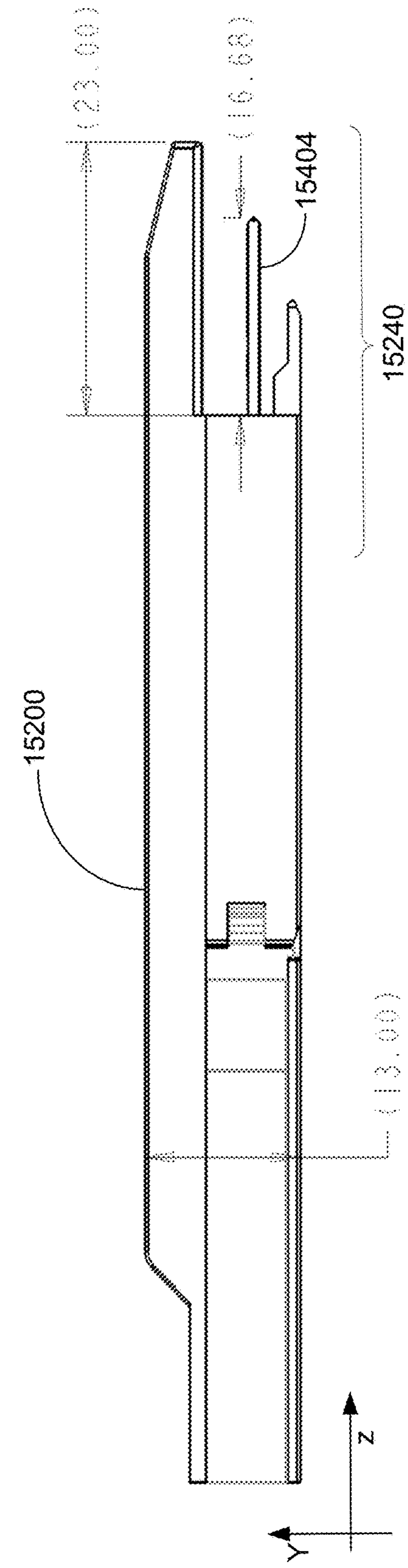

FIG. 153A is a side view of an example pluggable optical module.

Figure 153B:
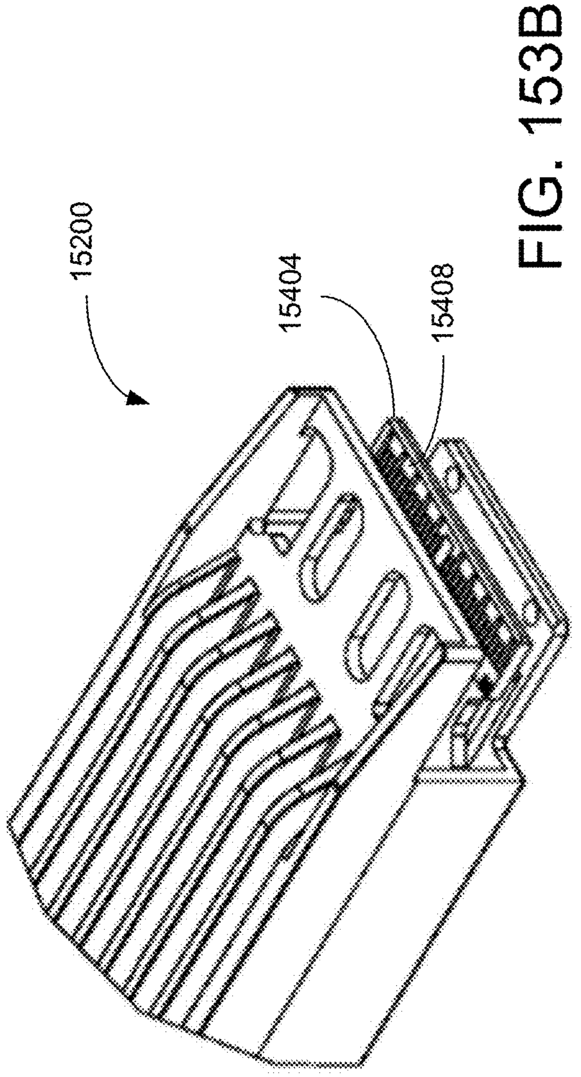

FIG. 153B is a perspective view of a rear portion of the pluggable optical module.

Figure 153C:
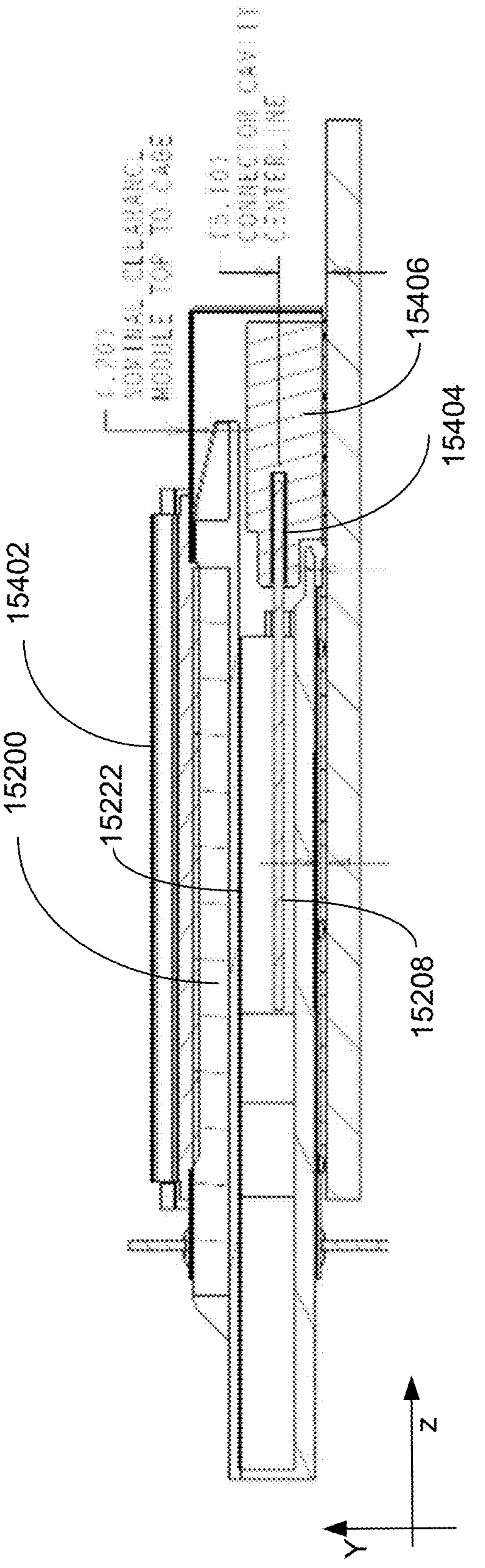

FIG. 153C is a side view cross-sectional diagram of the pluggable optical module plugged into a cage.

Figure 154A:
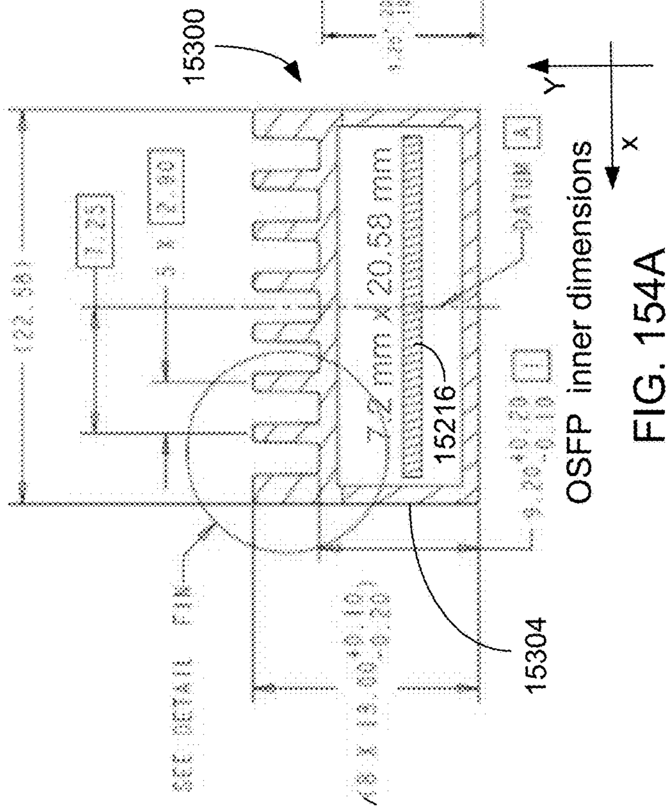

FIG. 154A is a rear view of an example OSFP optical transceiver module.

Figure 154B:
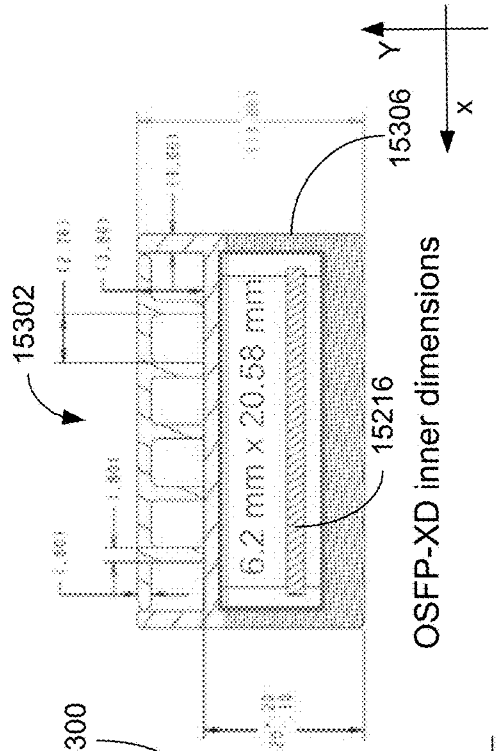

FIG. 154B is a rear view of an example OSFP-XD optical transceiver module.

Figure 154C:
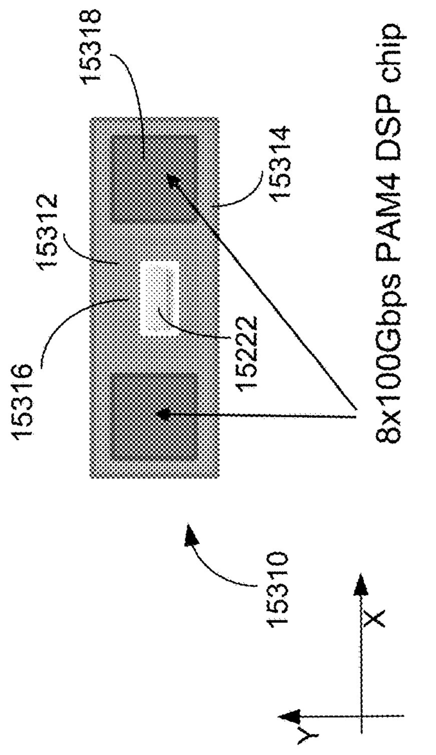

FIG. 154C is a diagram of an example co-packaged optical module that can fit inside the housing of the OSFP module with a vertically oriented substrate or circuit board.

Figure 154D:
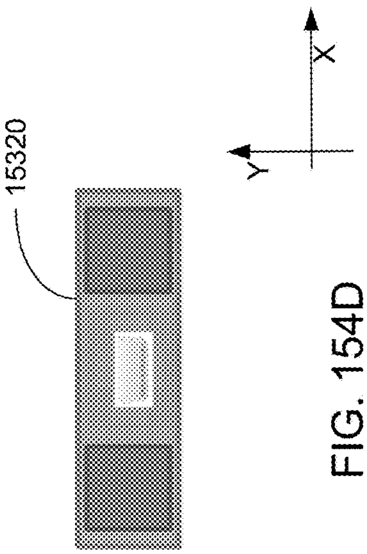

FIG. 154D is a diagram of an example co-packaged optical module that can fit inside the housing of the OSFP-XD module with a vertically oriented substrate or circuit board.

Figure 154F:
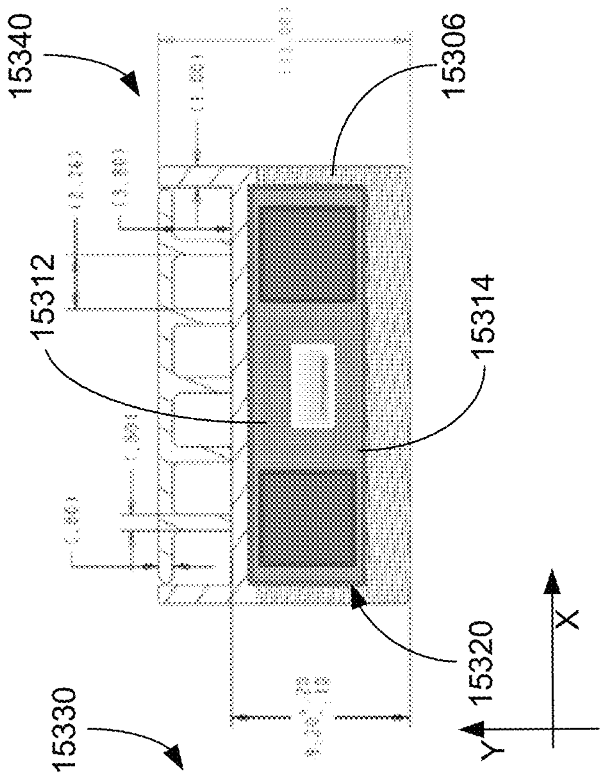
Figure 154E:
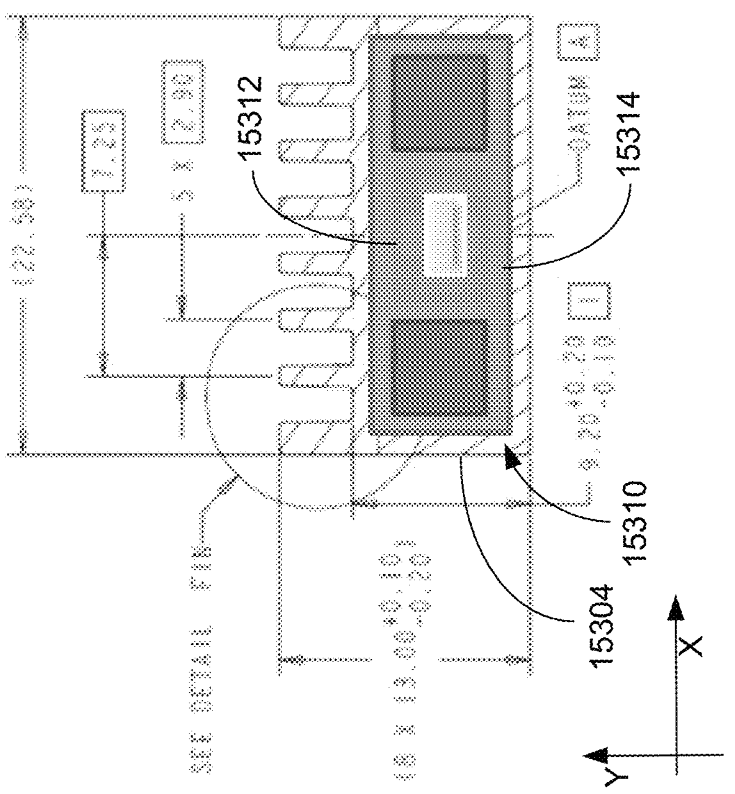

FIG. 154E is a cross-sectional diagram of an example OSFP pluggable optical module.

FIG. 154F is a cross-sectional diagram of an example OSFP-XD pluggable optical module.

Figures 155A, 155B, 155C, 155D:
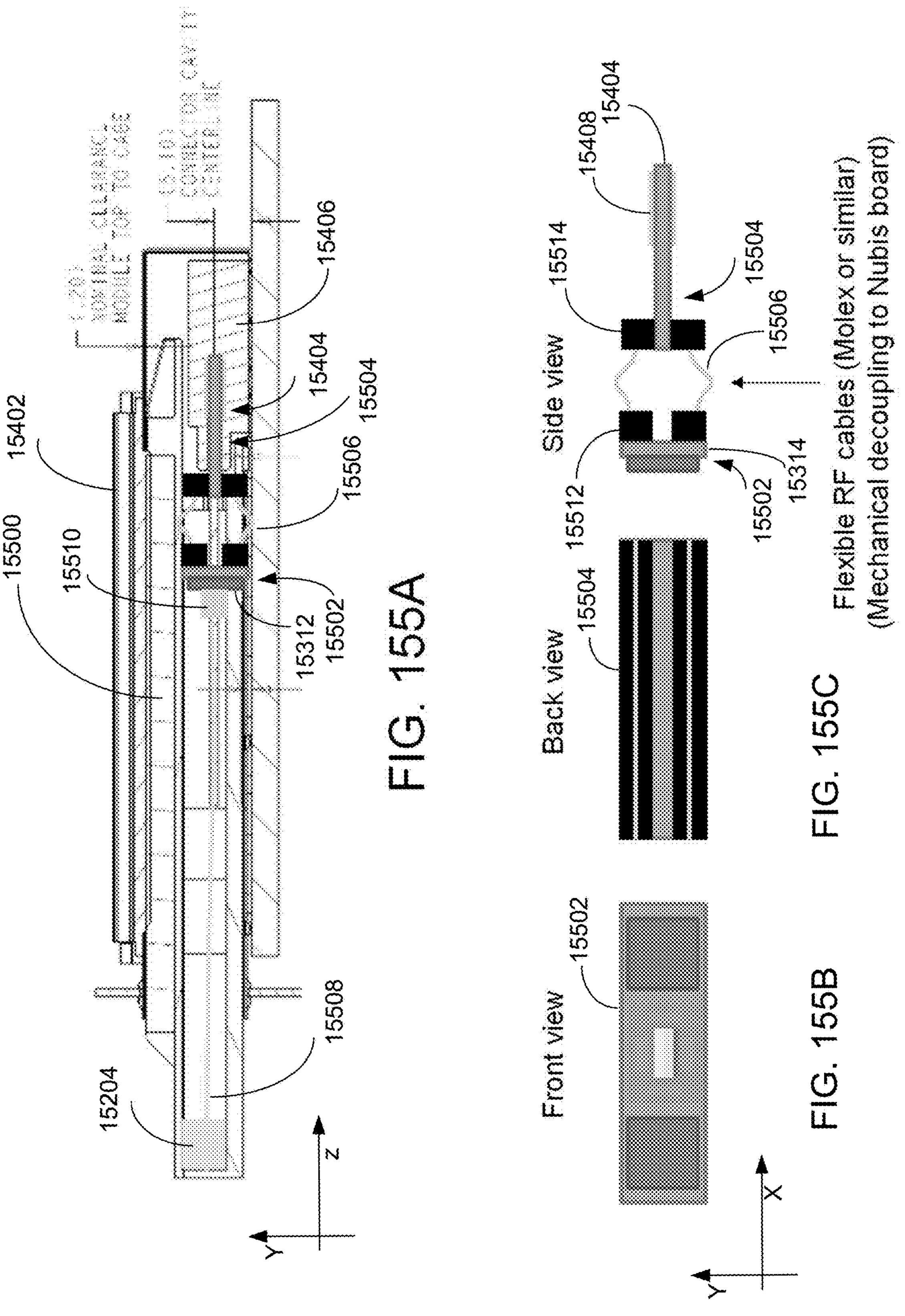

FIG. 155A is a side view cross-sectional diagram of an example pluggable optical module plugged into a cage.

FIG. 155B is a front view of an example co-packaged optical module.

FIG. 155C is a rear view of an example connector module.

FIG. 155D is a side view of an example co-packaged optical module, flexible RF cables, and a connector module.

Figure 155E:
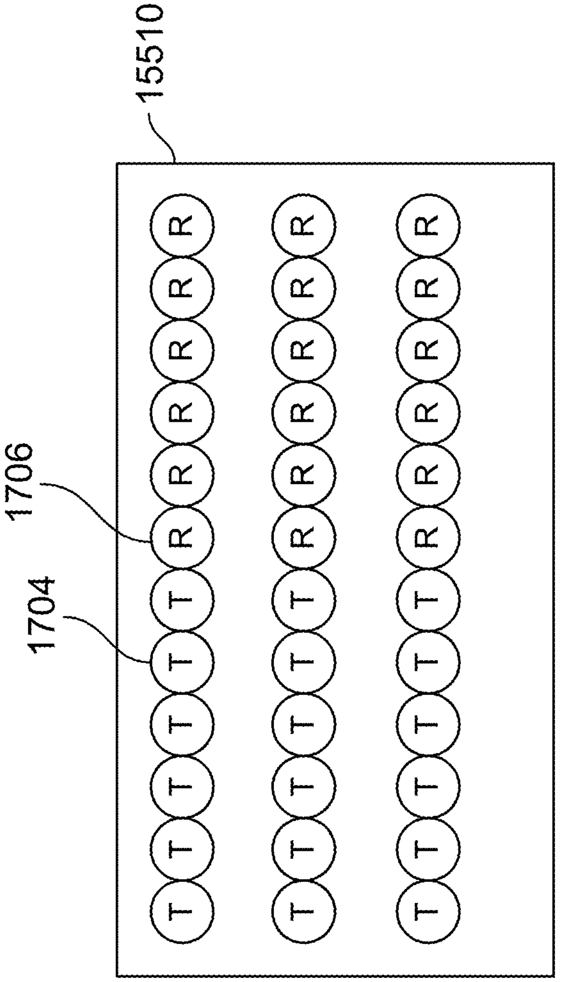

FIG. 155E is a diagram of an example of the fiber port mapping for the optical fiber connector.

Figure 156A:
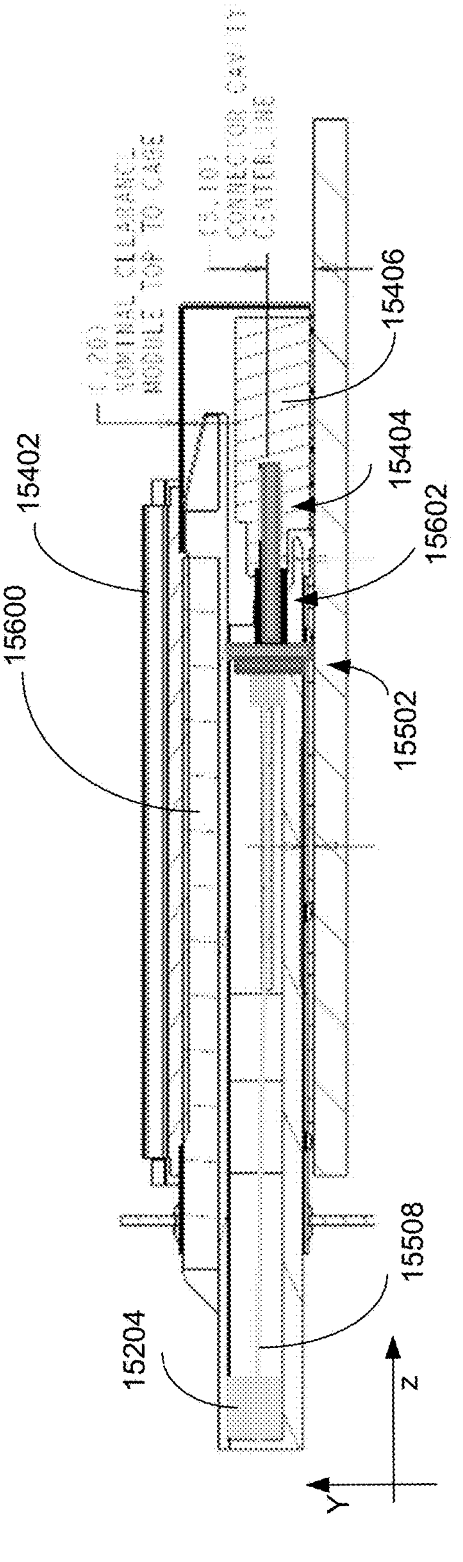

FIG. 156A is a side view cross-sectional diagram of an example pluggable optical module plugged into a cage.

Figure 156B:
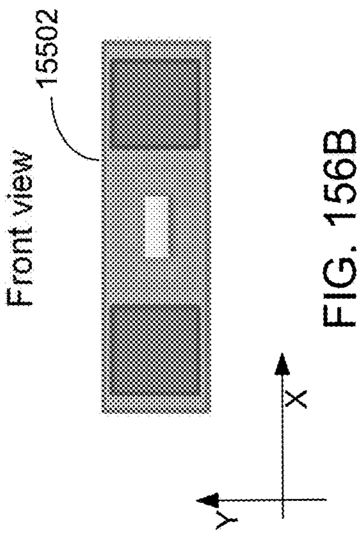

FIG. 156B is a front view of an example co-packaged optical module.

Figure 156C:
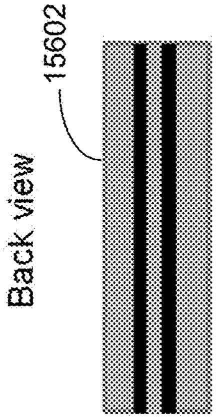

FIG. 156C is a rear view of an example connector module.

Figure 156D:
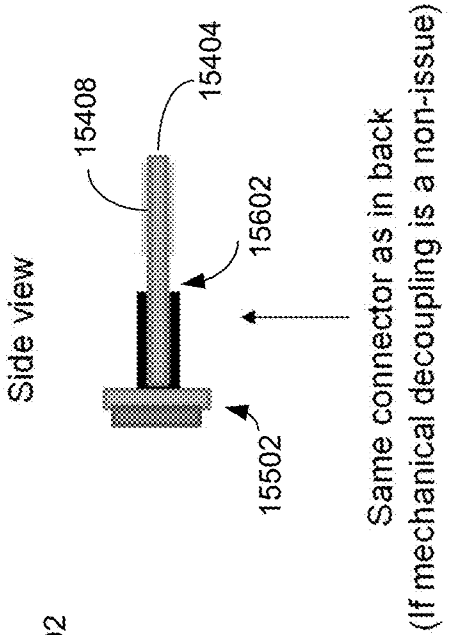

FIG. 156D is a side view of the co-packaged optical module and the connector module.

Figures 157A, 157B, 157C:
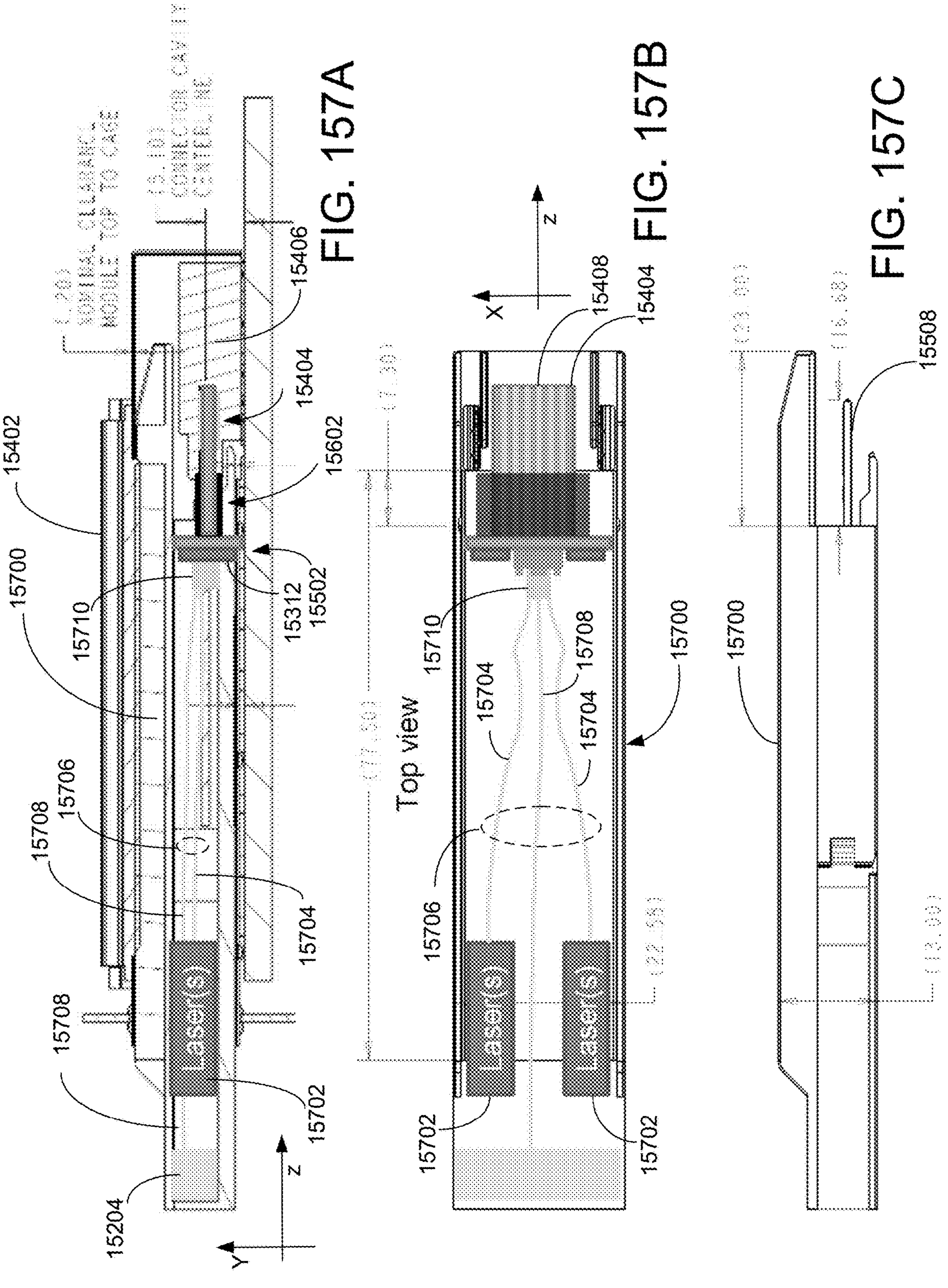

FIG. 157A is a side view cross-sectional diagram of an example pluggable optical module plugged into a cage.

FIG. 157B is a top view cross-sectional diagram of the pluggable optical module.

FIG. 157C is a side view of the pluggable optical module.

Figure 157D:
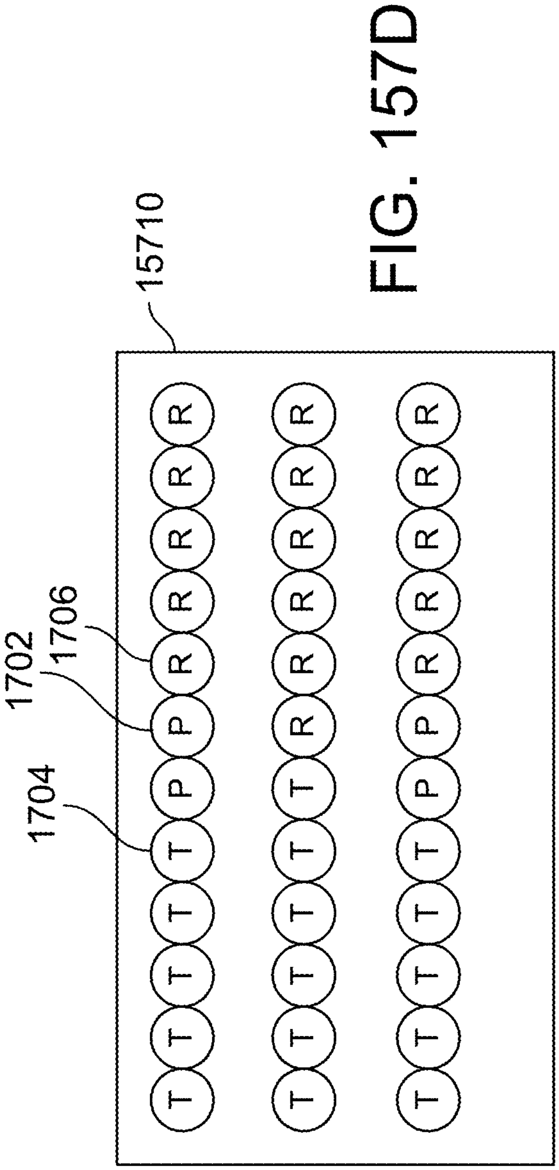

FIG. 157D is a diagram of an example fiber port mapping for an optical fiber connector.

Figure 158:
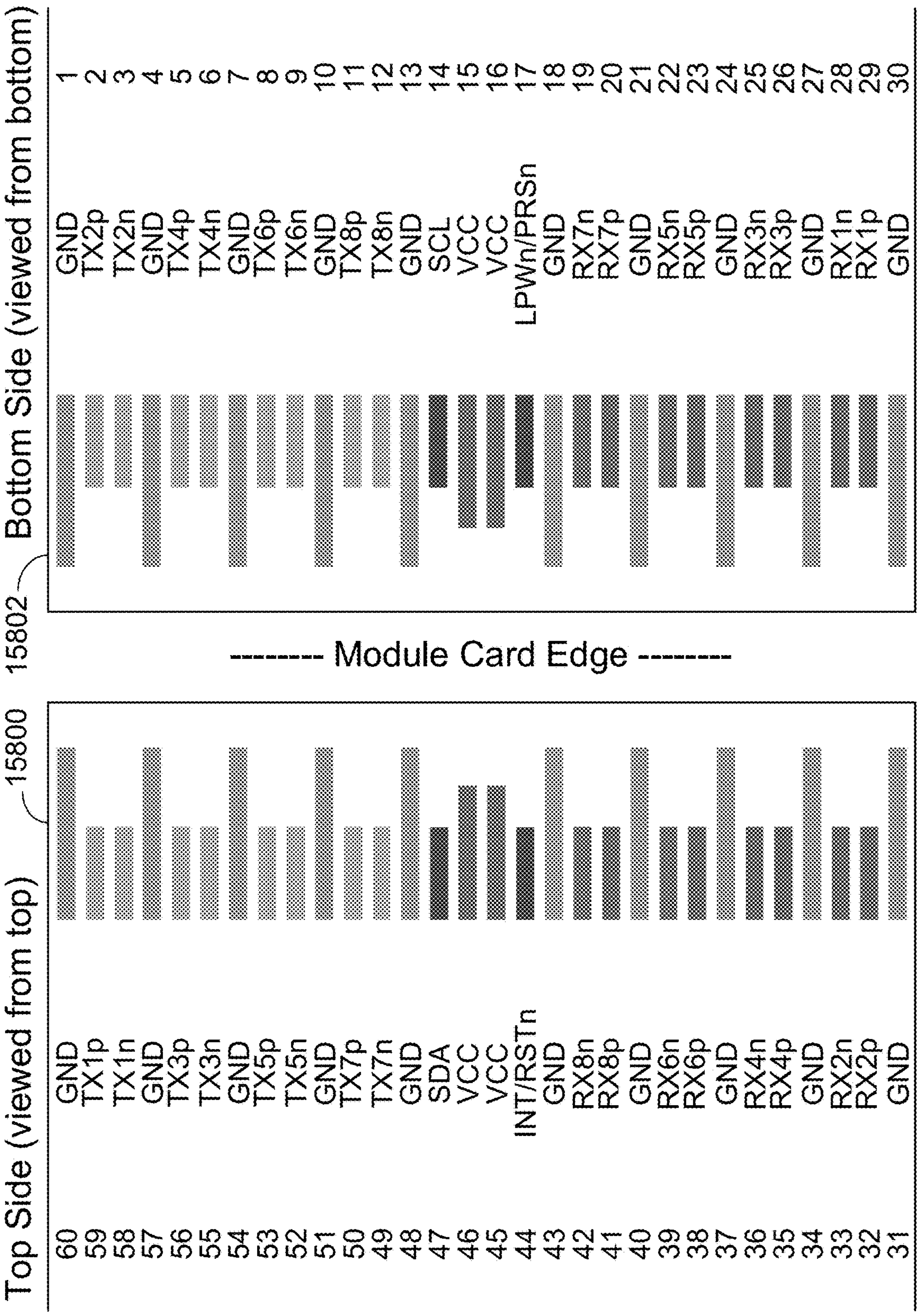

FIG. 158 shows an example of the OSFP module pinout configuration.

Figure 159A:
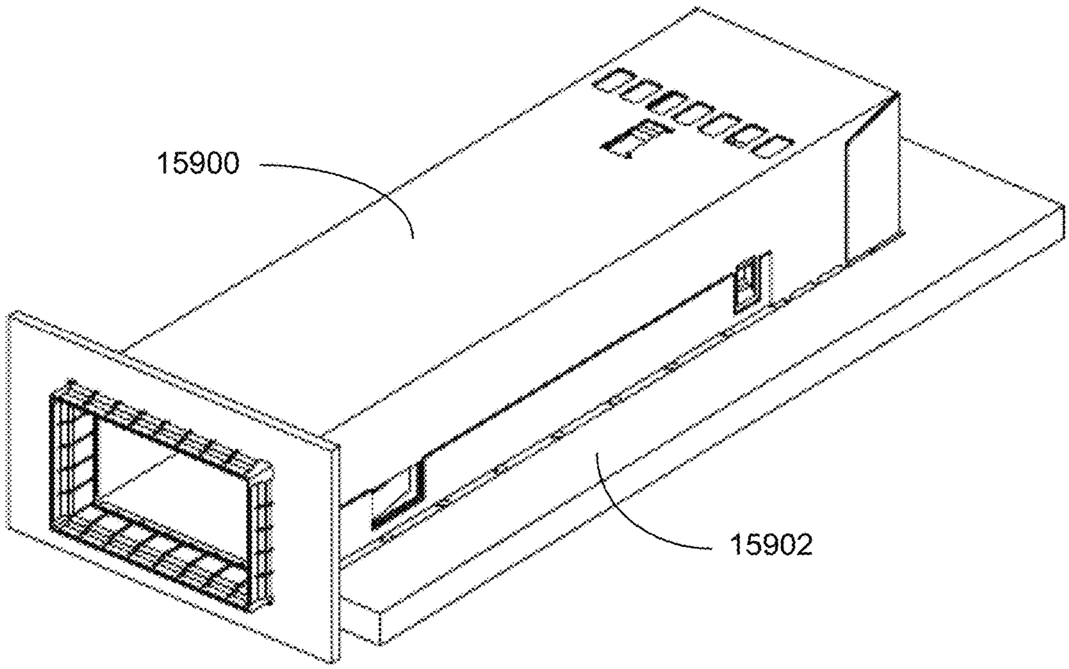

FIG. 159A is a perspective view of an example 1×1 cage mounted on a circuit board.

Figure 159B:
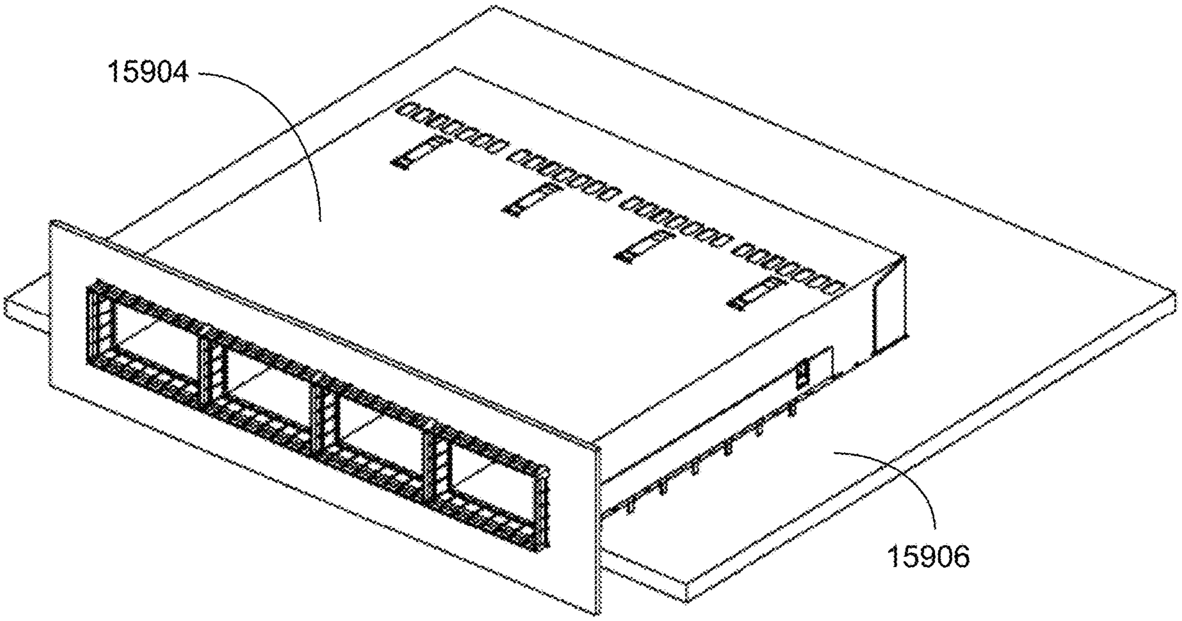

FIG. 159B is a perspective view of an example 1×4 cage mounted on a circuit board.

Figure 159C:
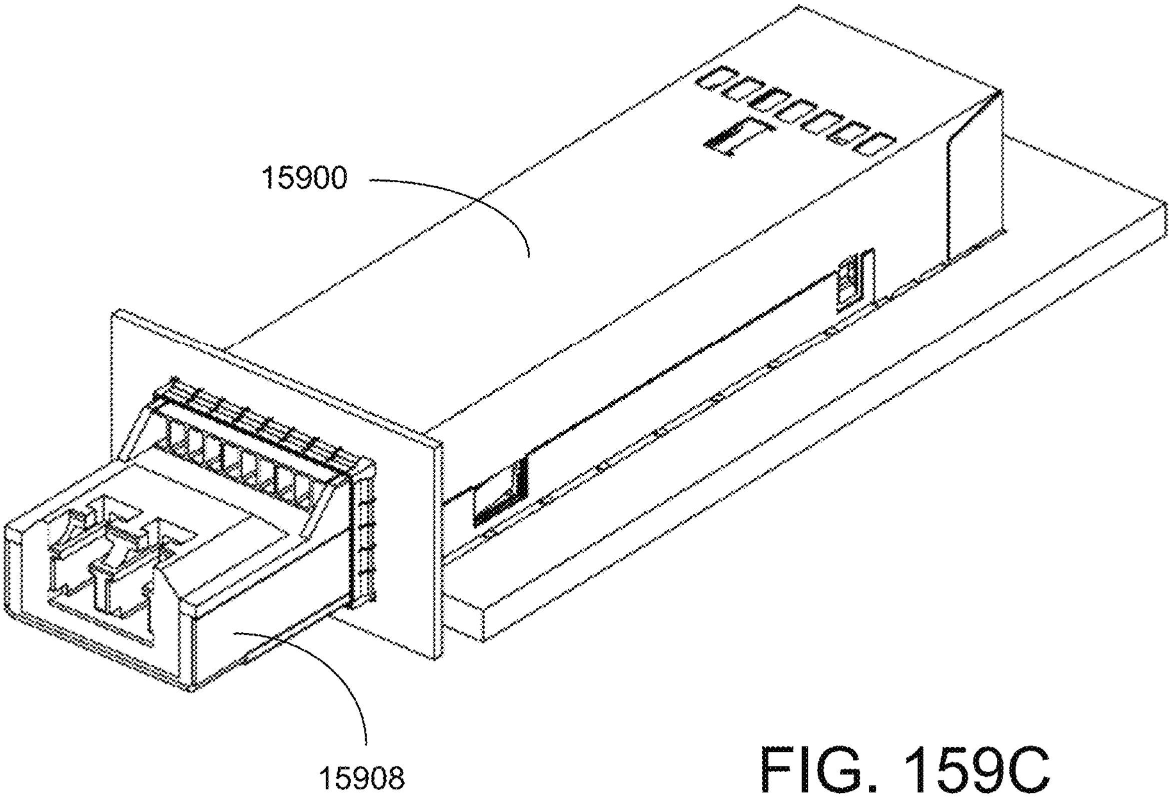

FIG. 159C is a perspective view of an example OSFP module inserted into the 1×1 cage.

Figure 160:
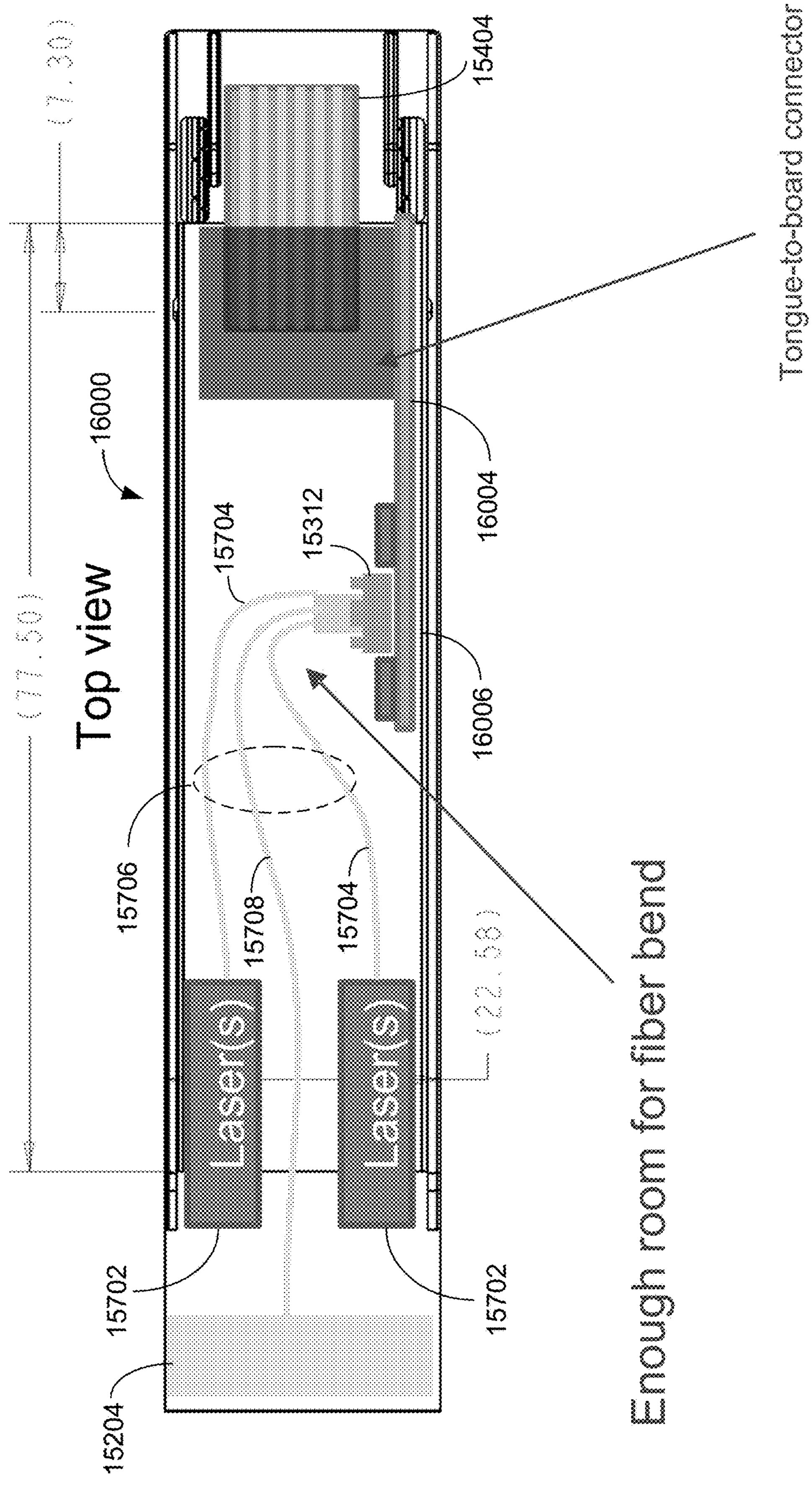

FIG. 160 is a top view cross-sectional diagram of an example pluggable optical module.

Figure 161:
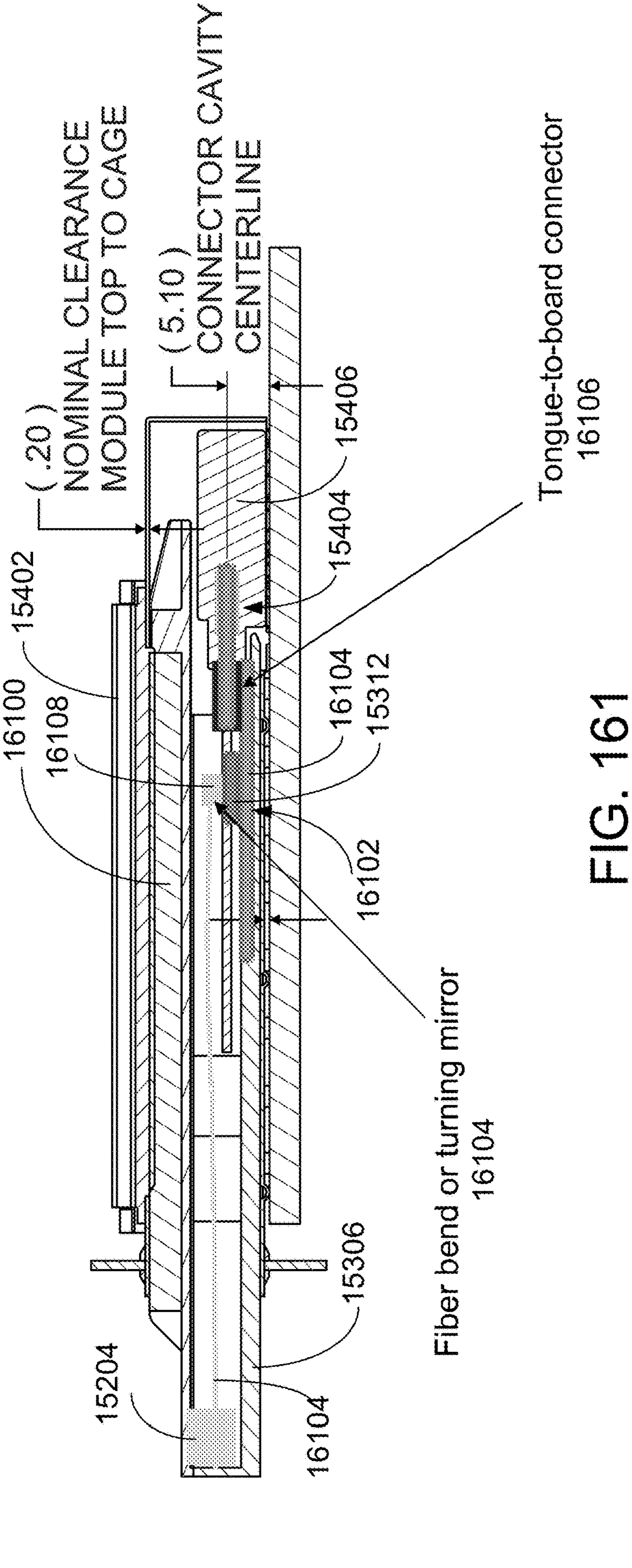

FIG. 161 is a side view cross-sectional diagram of an example pluggable optical module.

Figure 162:
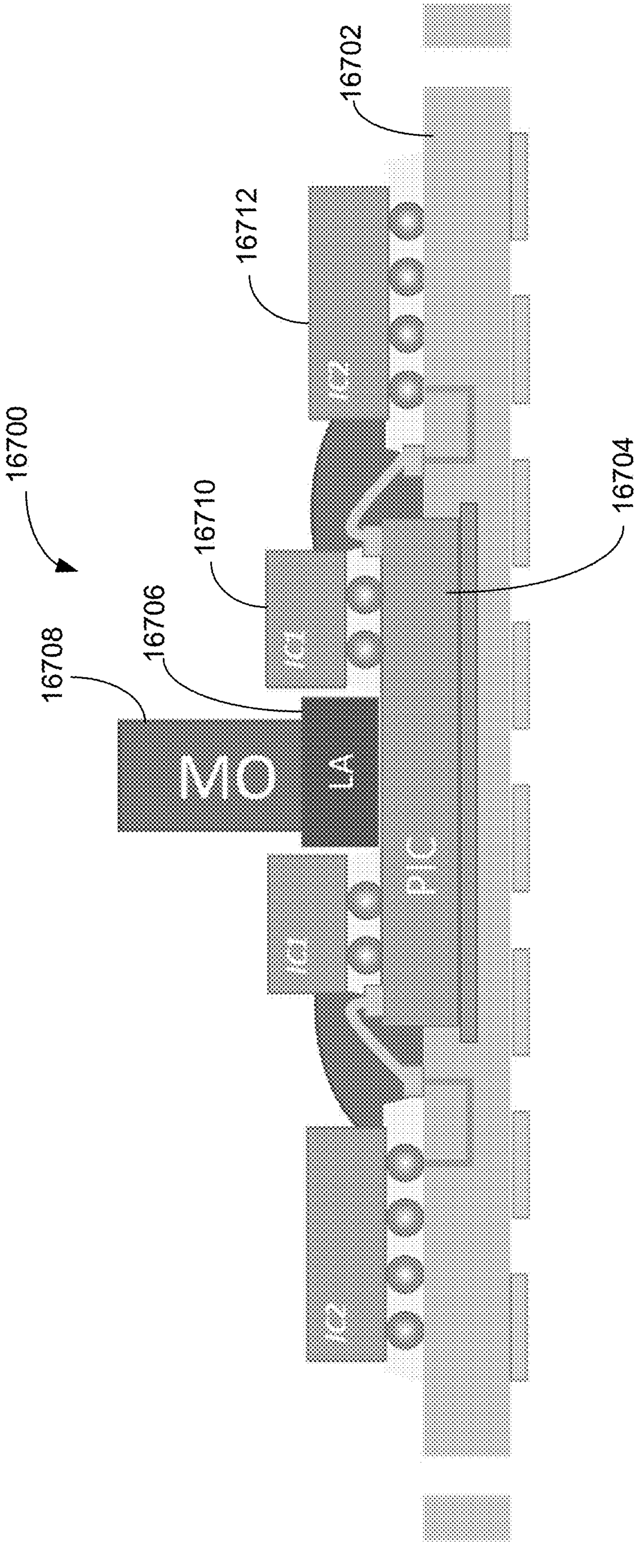

FIG. 162 is a diagram of an example co-packaged optical module.

FIGS. 163A, 163B, 164A, and 164B are perspective views of an example co-packaged optical module.

Figure 165:
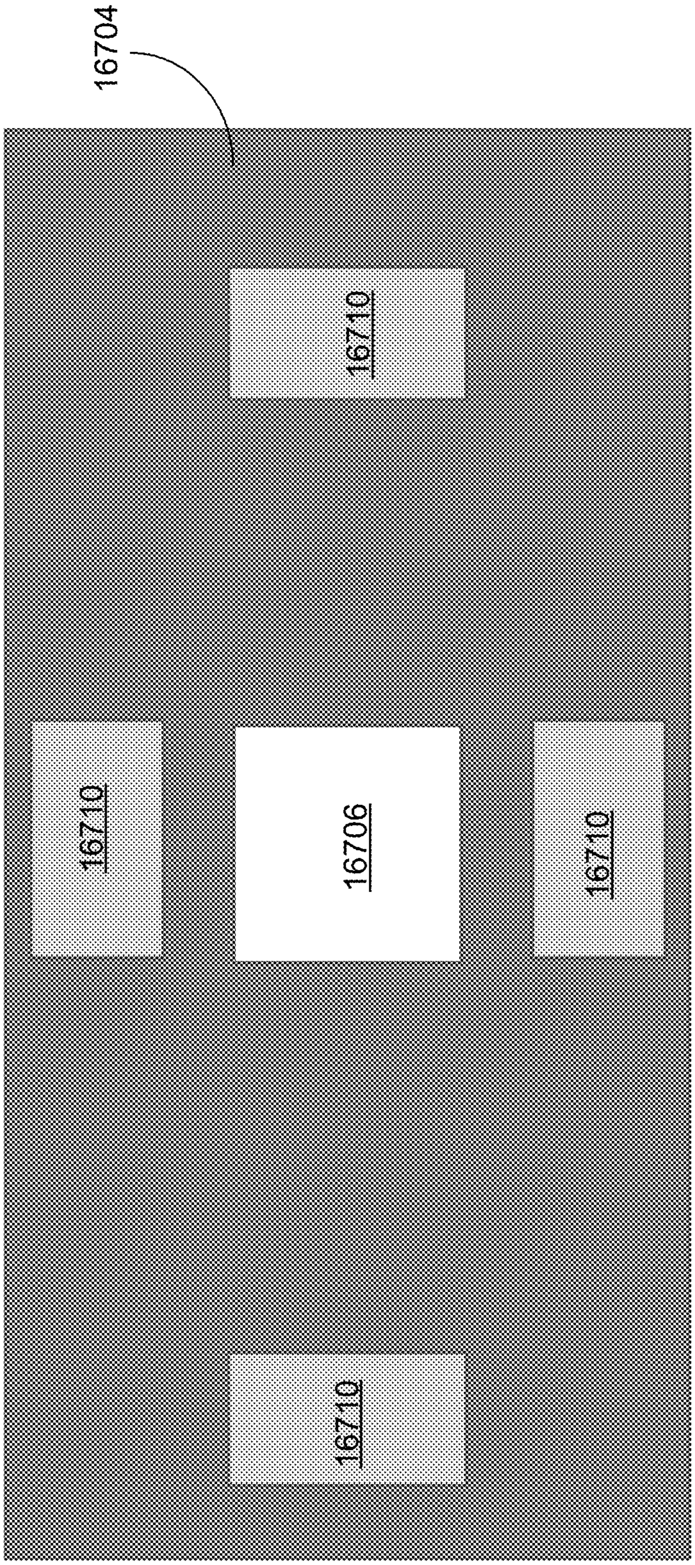

FIG. 165 is a top view of an example placement of electrical integrated circuits on a photonic integrated circuit.

FIGS. 166A, 166B, 166C, and 166D are diagrams of examples of a photonic integrated circuit and a fiber connection.

Figure 167:
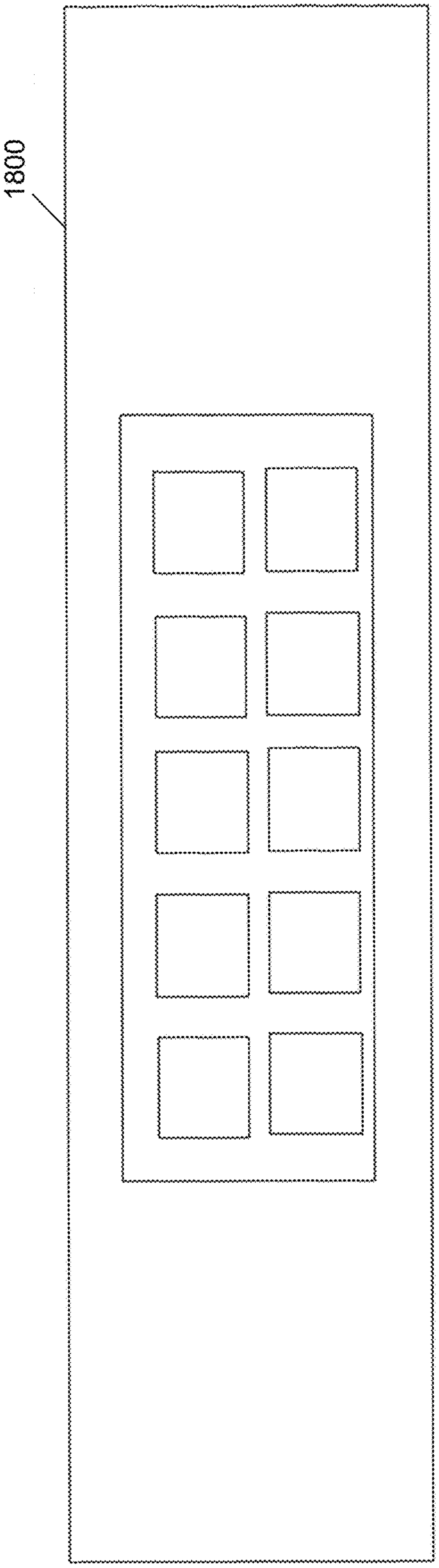

FIG. 167 is a view of a front panel of a housing for a rackmount switch.

Figure 168:
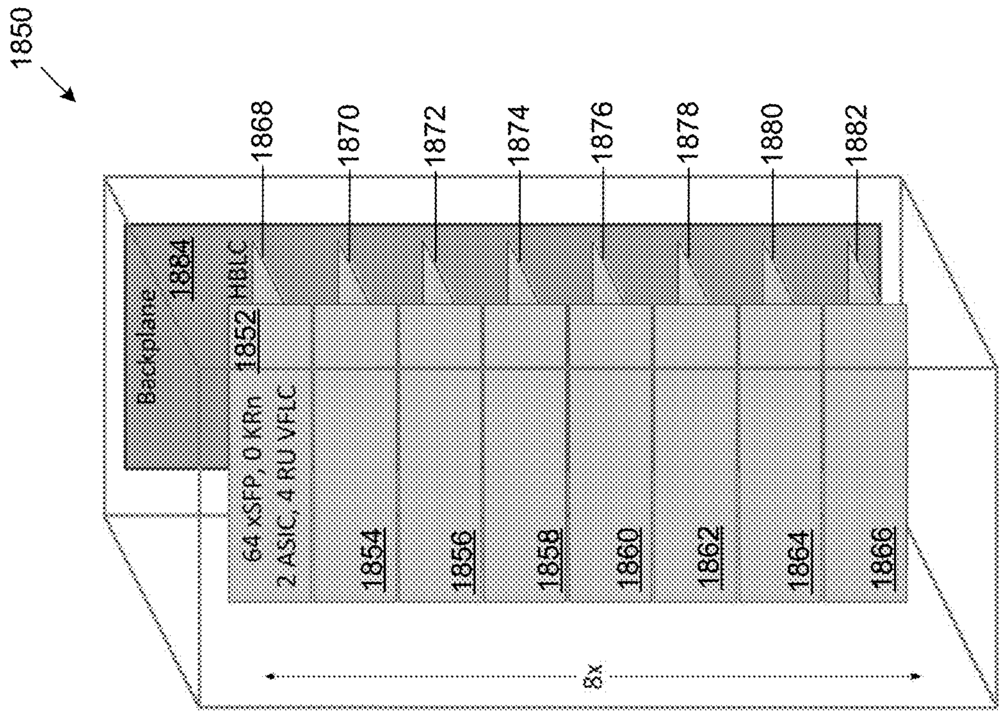

FIG. 168 is a diagram of an arrangement of vertical front line cards.

Figure 169:
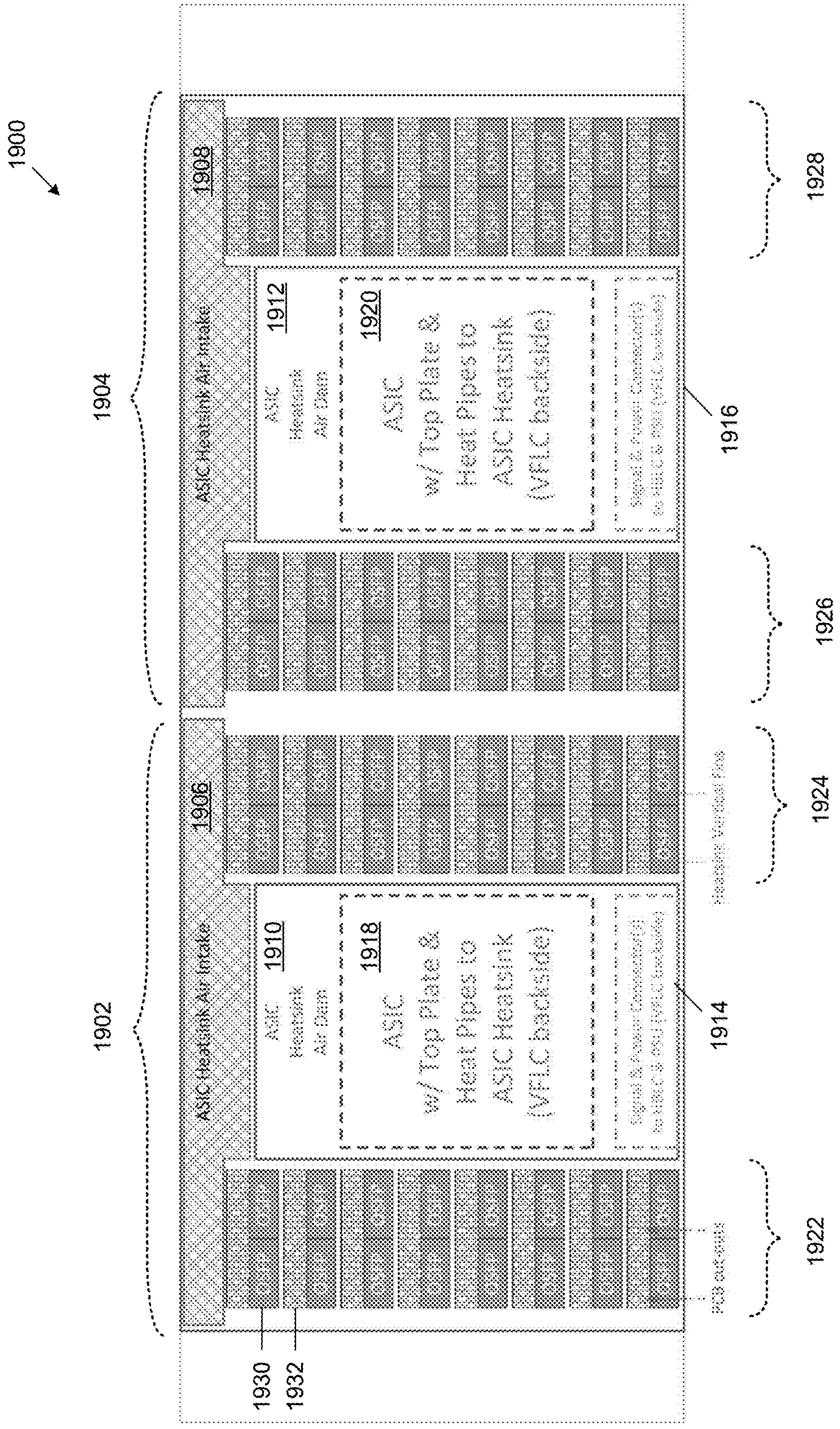

FIG. 169 is a view of the front of a vertical front line card with plug ports and channel intakes.

Figure 169A:
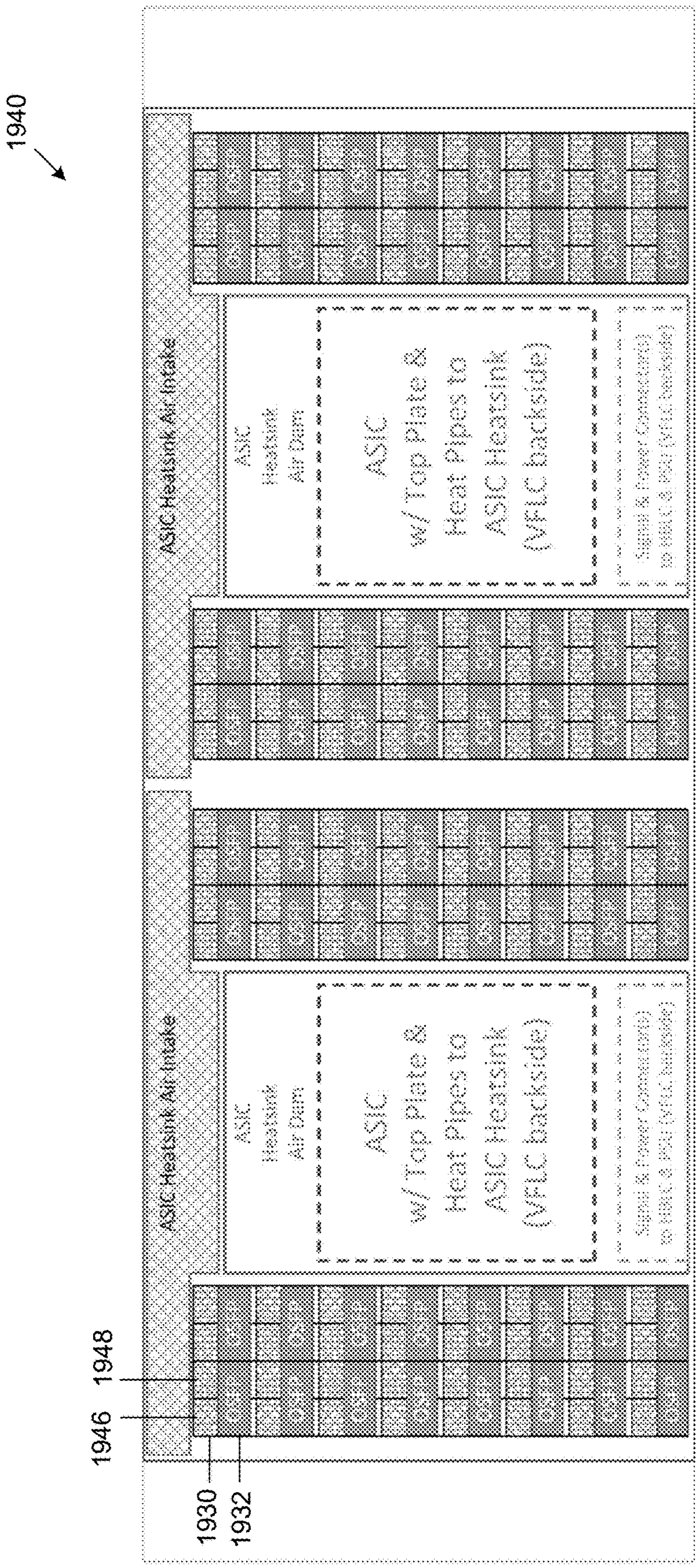

FIG. 169A is a view of the front of an example vertical front line card with plug ports and channel intakes.

Figure 170:
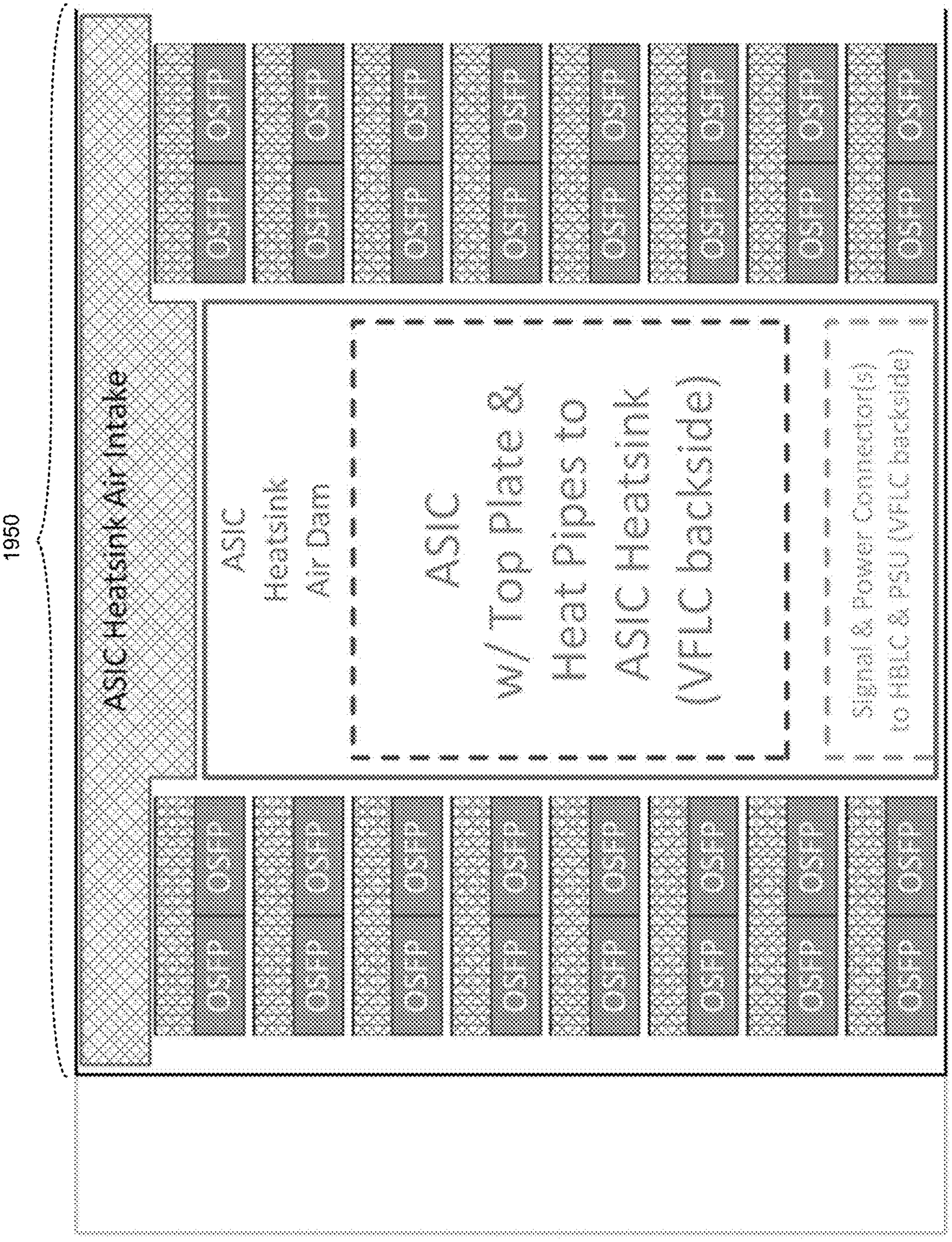

FIG. 170 is a left half of a front view of a vertical front line card, with plug ports and channel intakes.

FIGS. 171, 172, 173, 174, and 175 are partial views cut through a vertical front line card that includes design features of FIG. 169.

Figure 176:
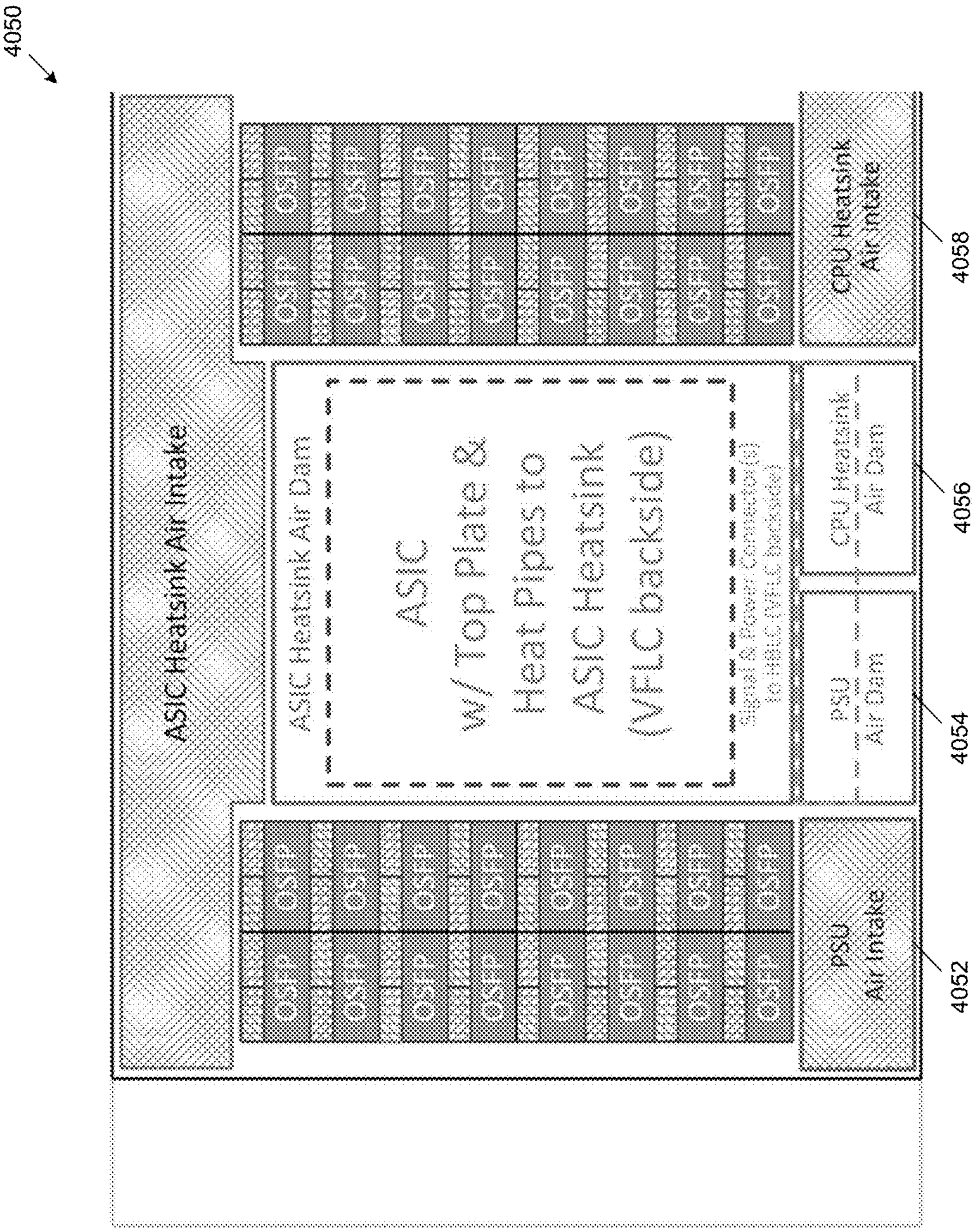

FIG. 176 is a left half of a front view of a vertical dual ASIC front line card with plug ports and channel intakes.

Figure 177:
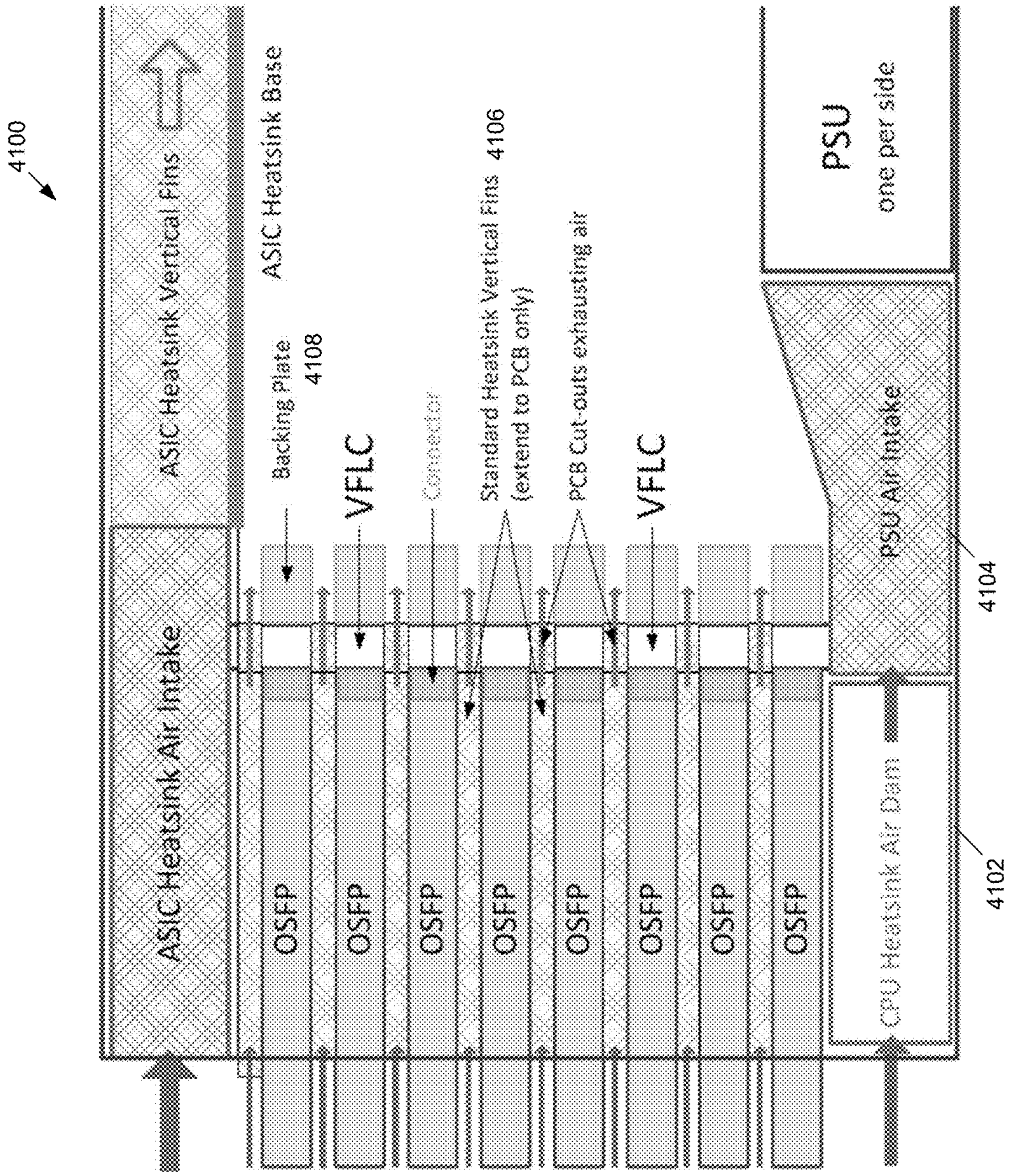

FIG. 177 is a partial views cut through a vertical front line card housing that includes design features of FIG. 176.

Figure 177A:
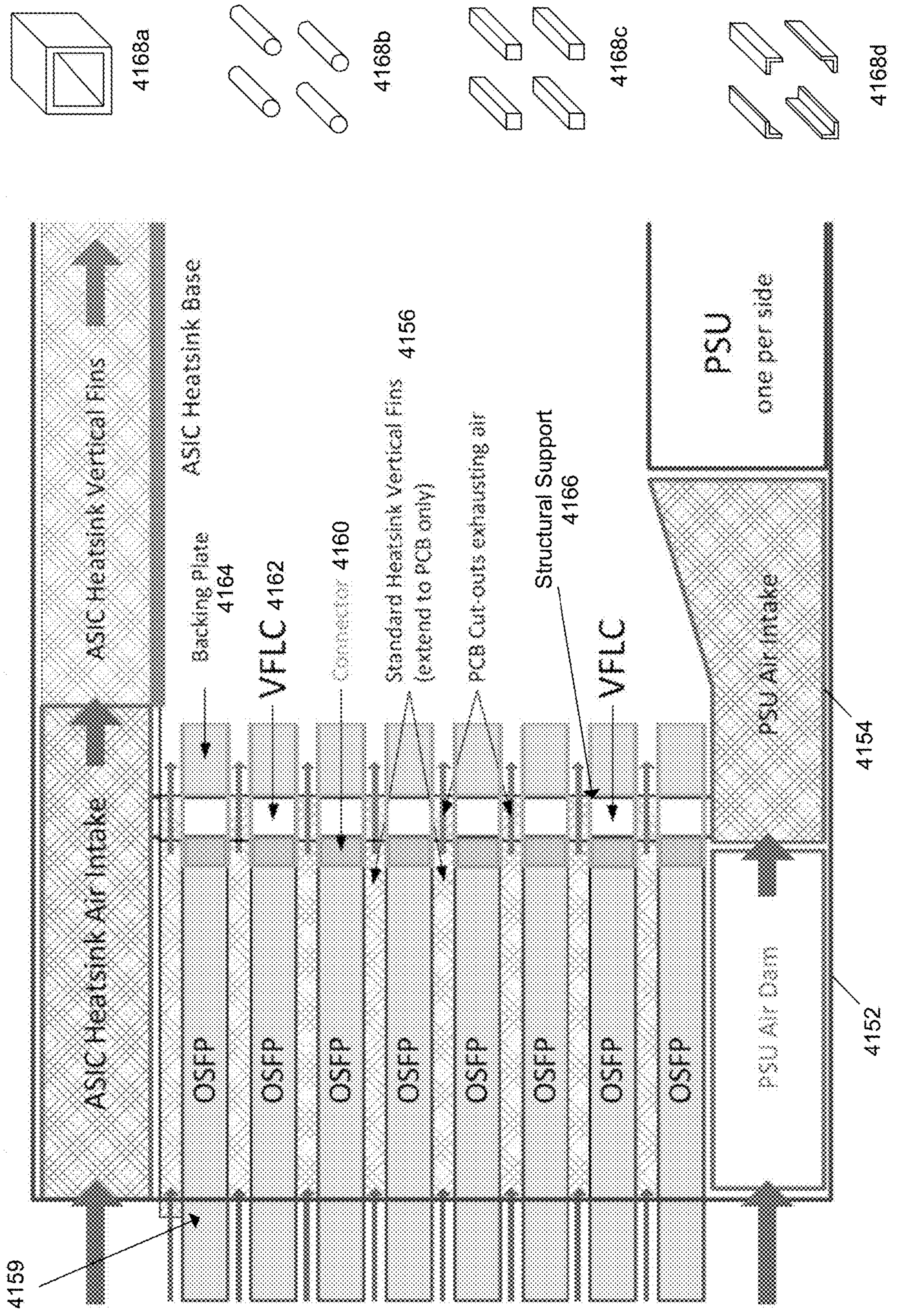

FIG. 177A is a partial views cut through a vertical front line card housing that includes design features of FIG. 176, with an additional support structure.

Figure 178:
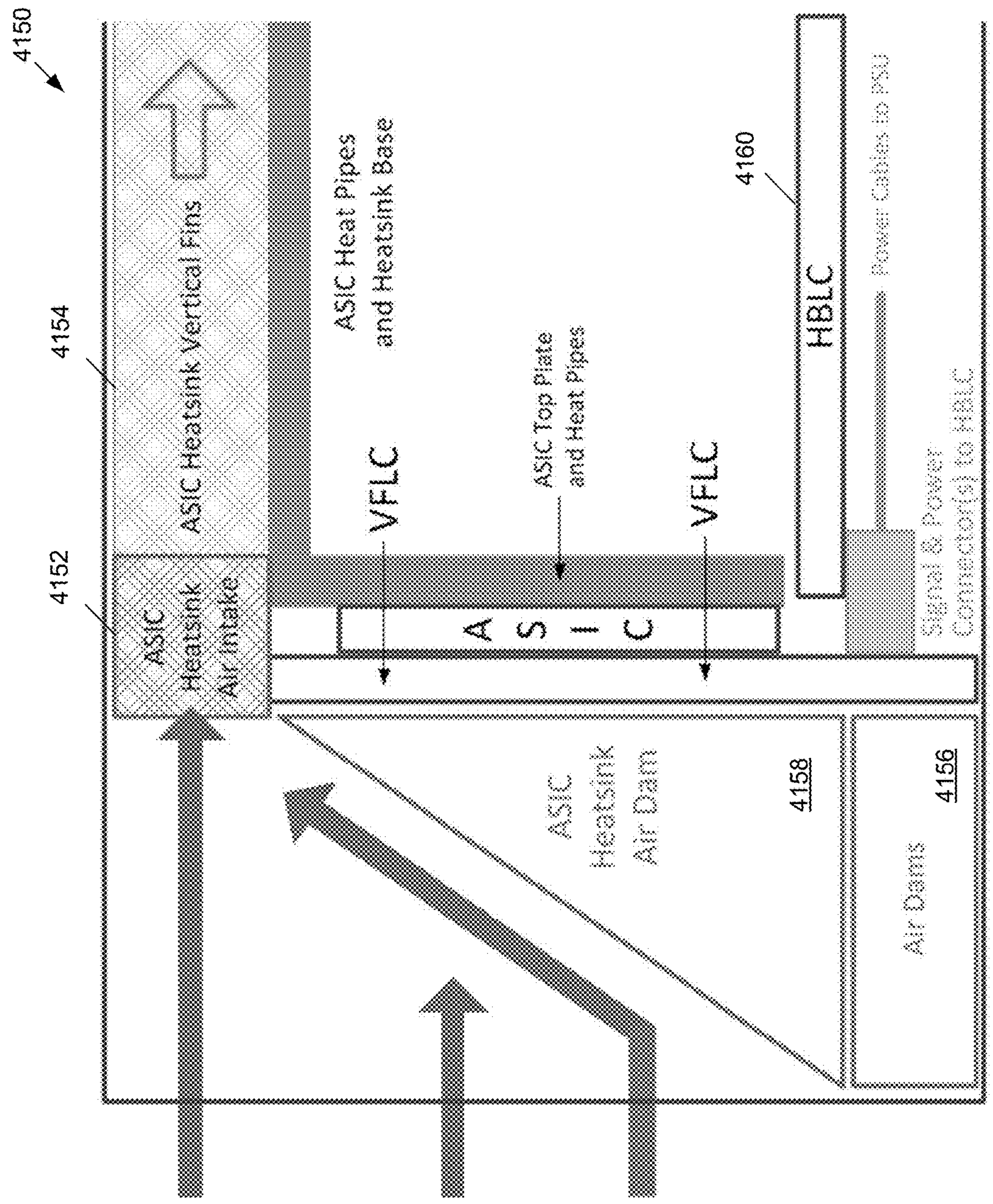

FIG. 178 is a partial view cut through a vertical front line card housing that includes design features of FIG. 176.

Figure 179:
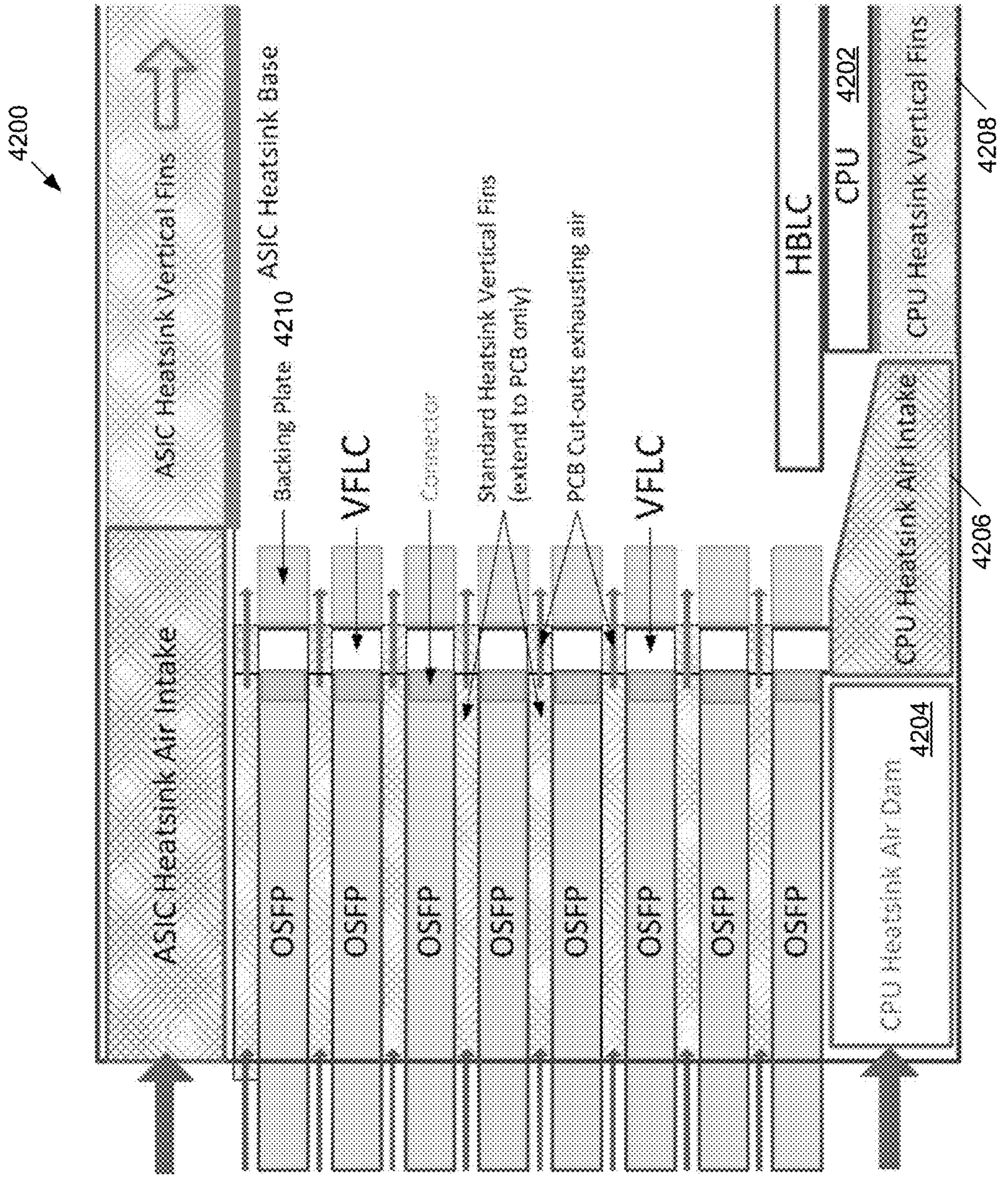
Figure 179A:
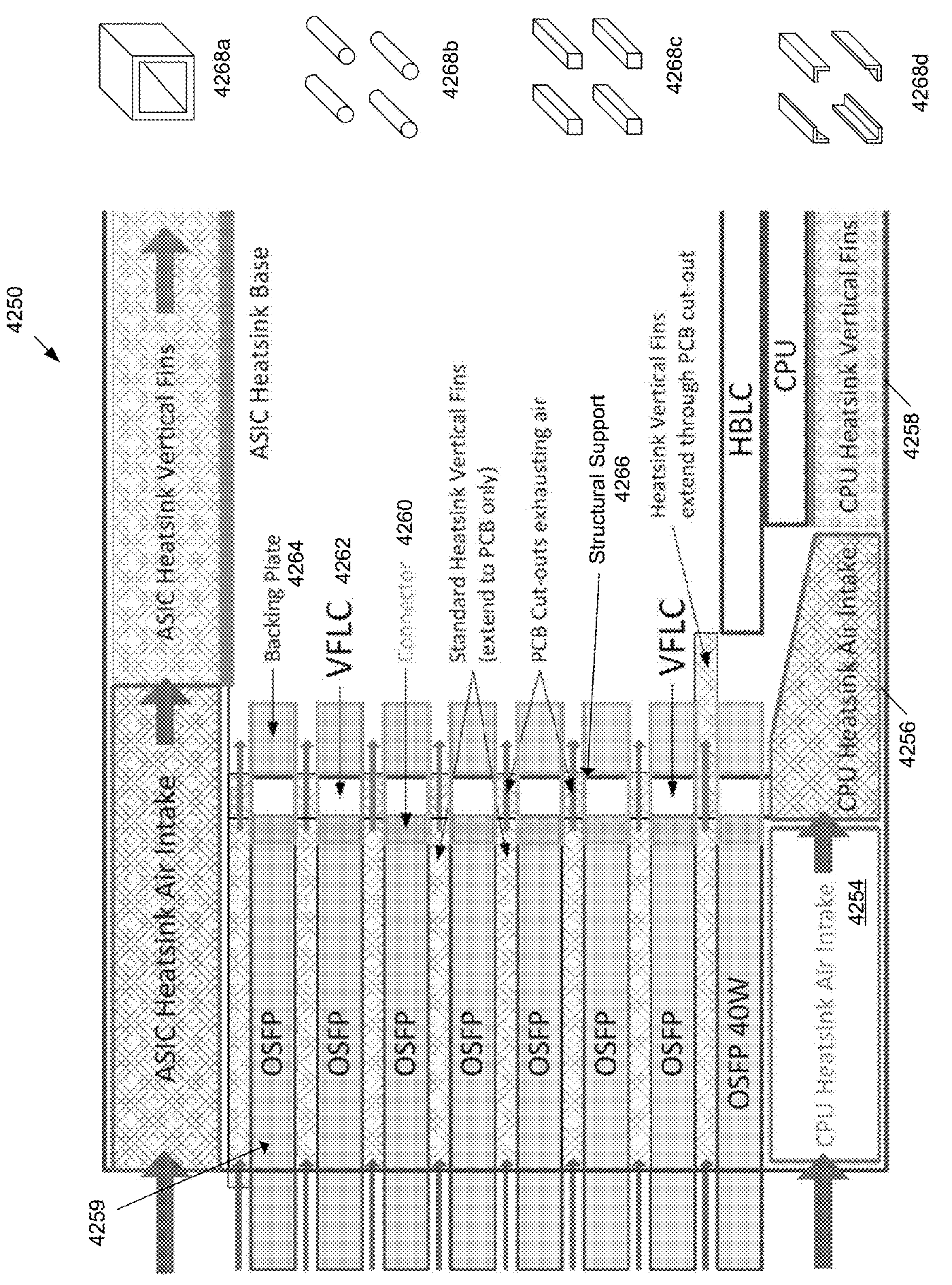

FIGS. 179 and 179A are partial views cut through a vertical front line card housing that includes design features of FIG. 176.

Figure 180:
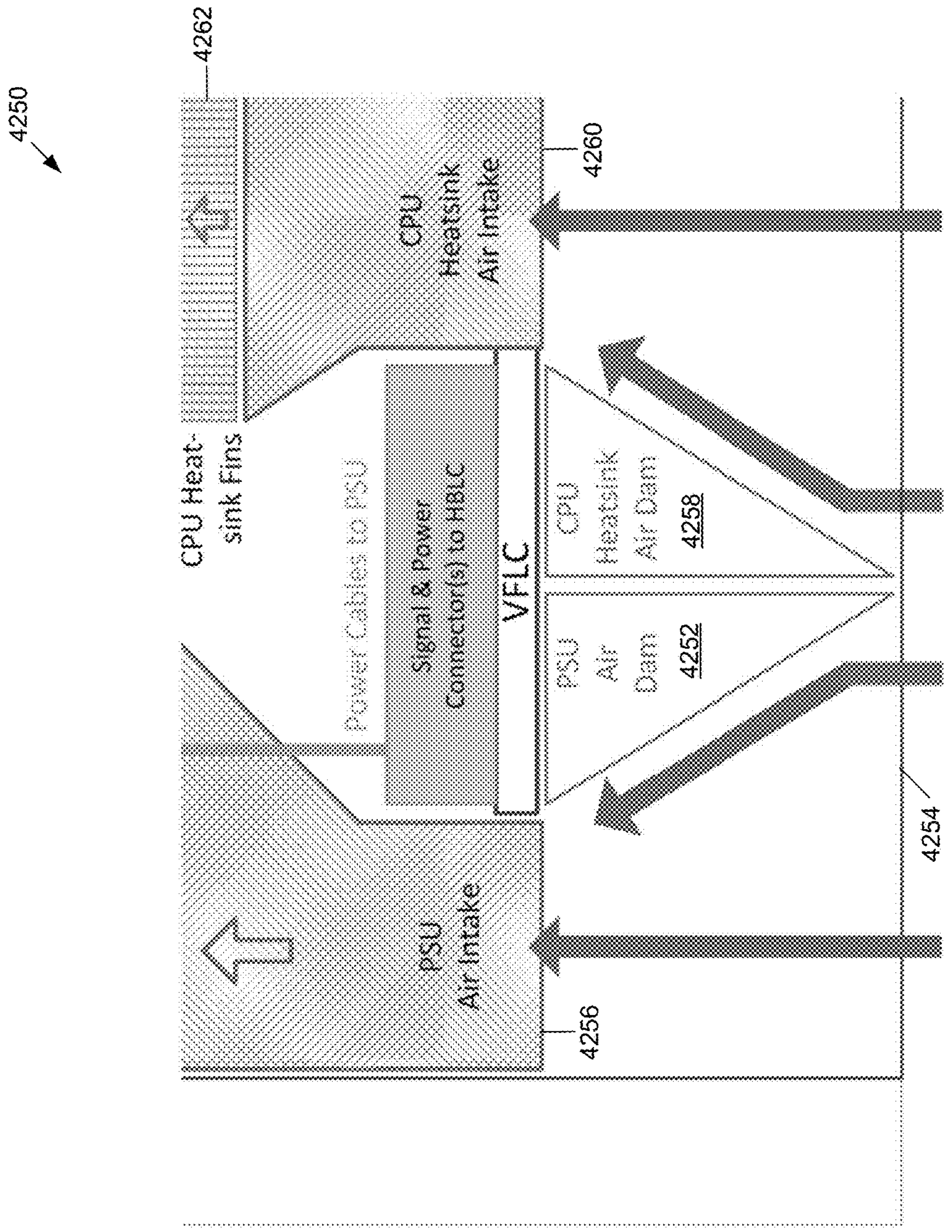
Figure 181:
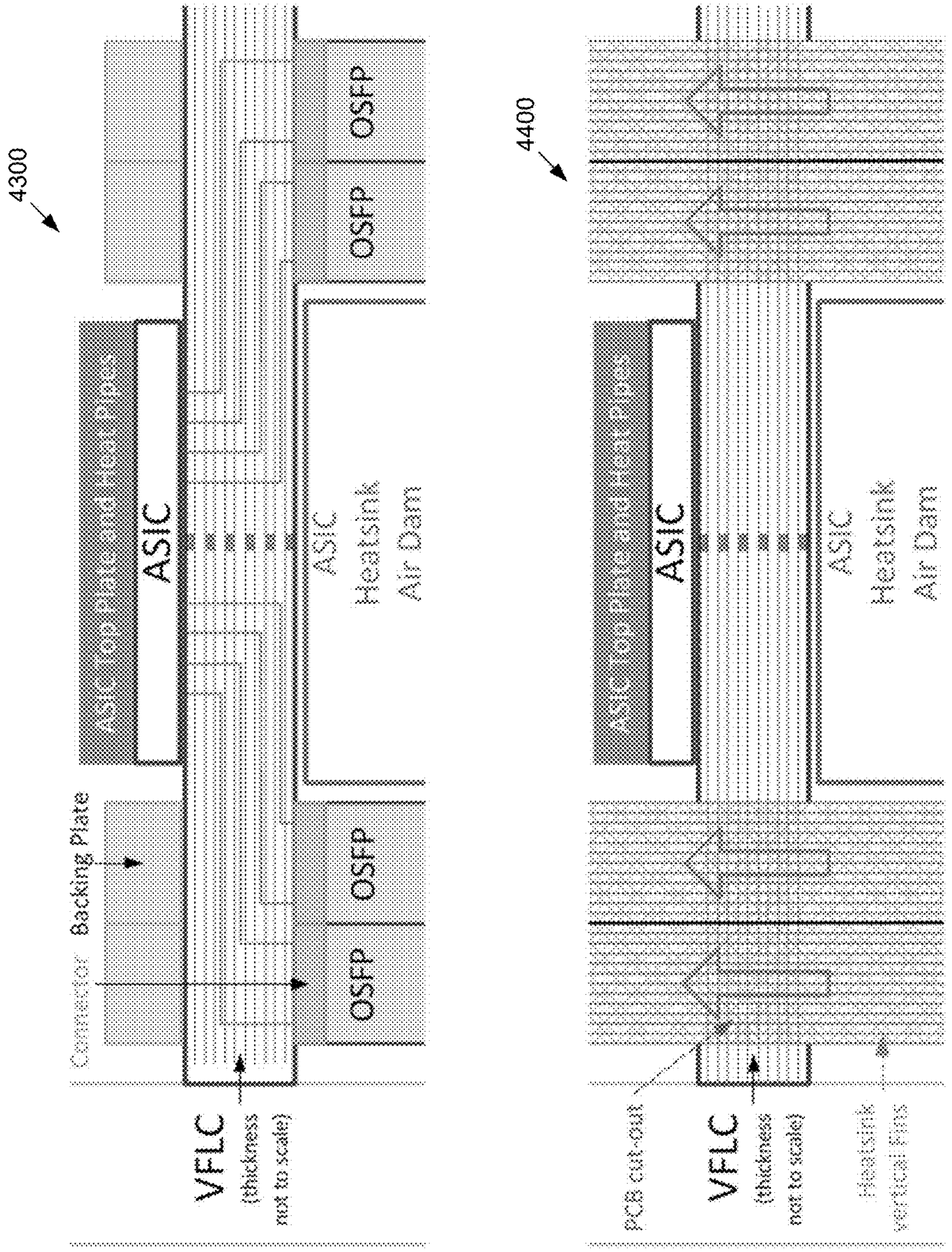

FIGS. 180 and 181 are partial views cut through a vertical front line card housing that includes design features of FIG. 176.

Figure 182:
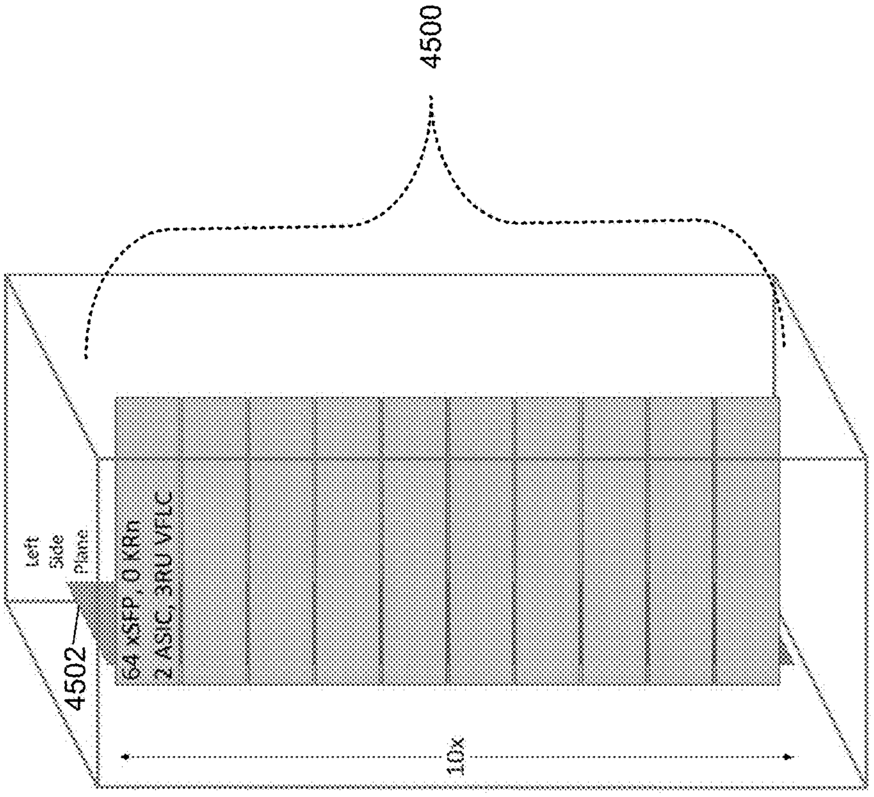

FIG. 182 is a diagram of an arrangement of vertical front line cards.

Figure 183:
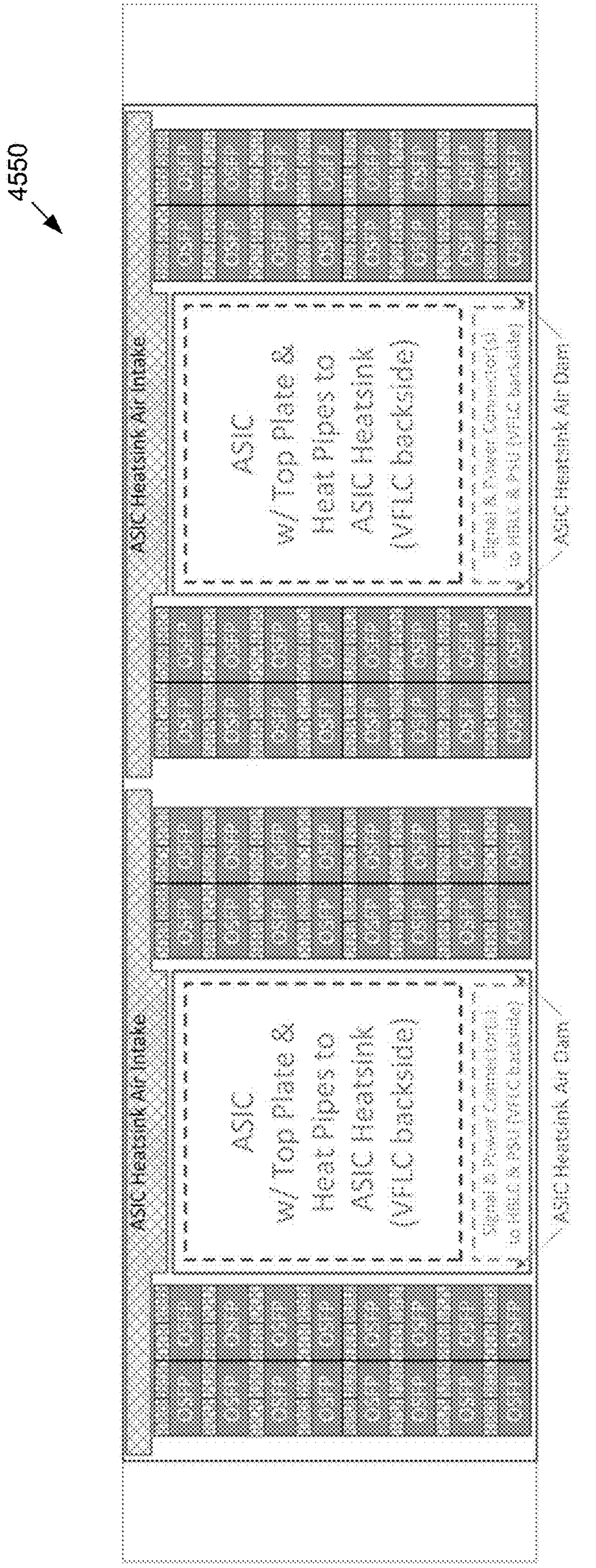

FIG. 183 is a full view of the front of a vertical front line card, with plug ports and channel intakes for a dual ASIC design.

Figure 184:
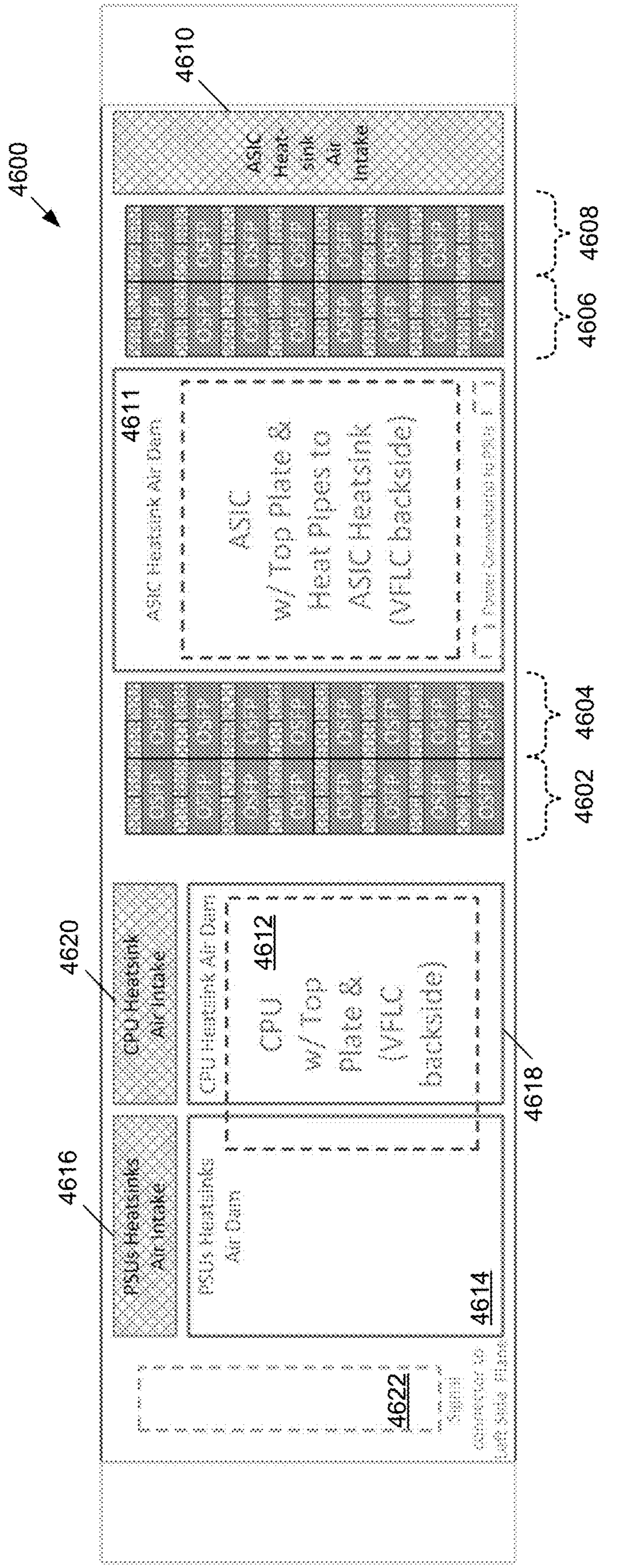

FIG. 184 is a full view of the front of a vertical front line card, with plug ports and channel intakes for a single ASIC design.

FIGS. 184A, 184B, 184C, and 184D is are full views of the front of a vertical front line card, with alternate arrangements of plug ports and channel intakes.

Figure 185:
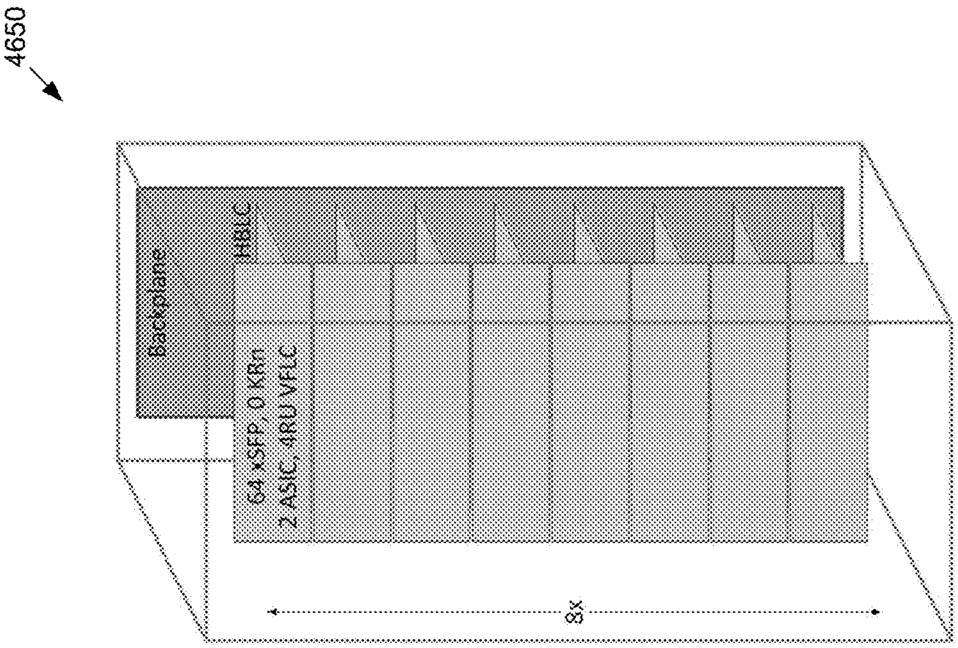

FIG. 185 is a diagram of an arrangement of vertical front line cards.

Figure 186:
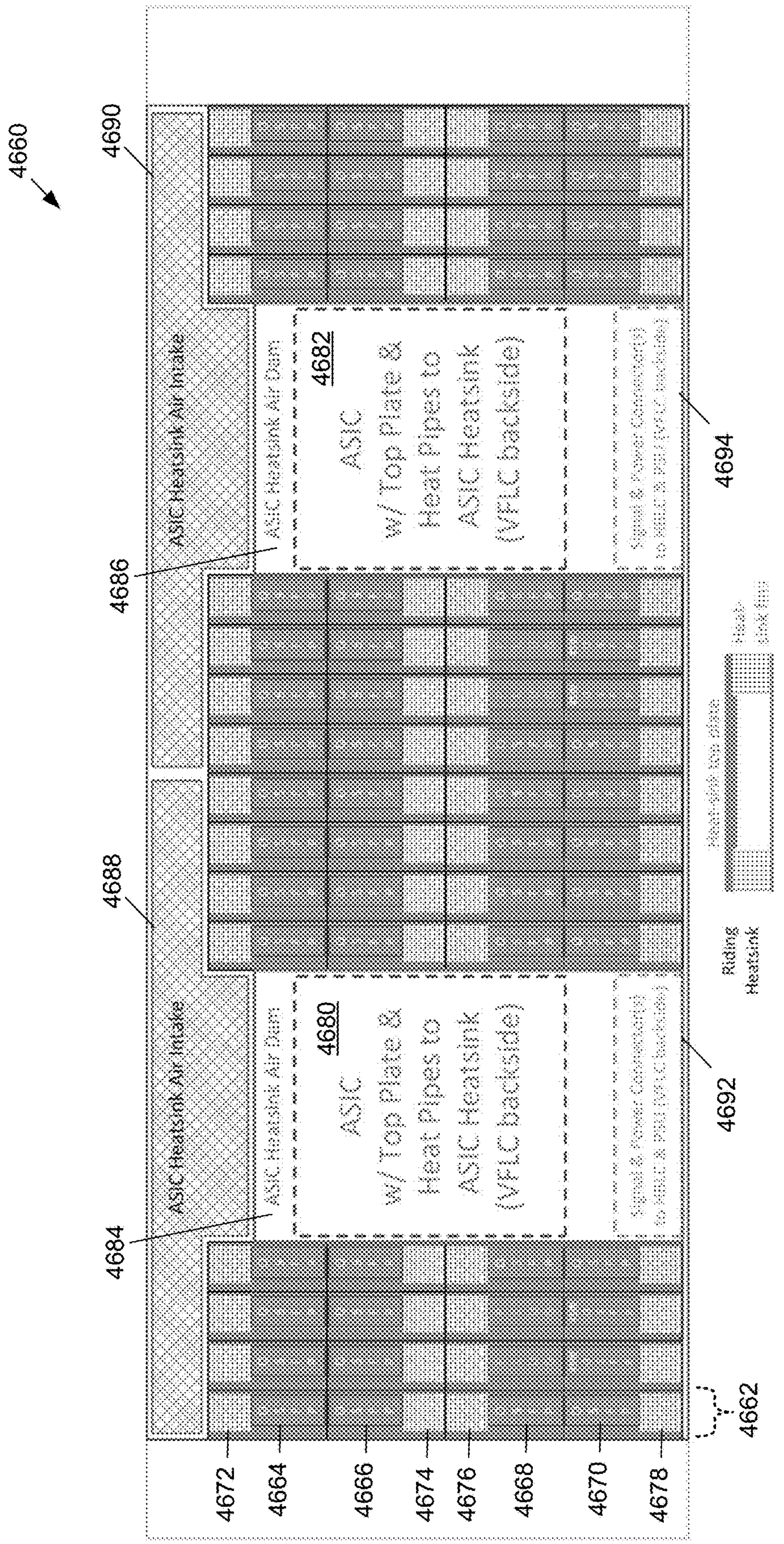

FIG. 186 is a full view of the front of a vertical front line card, with an alternate orientation of plug ports and channel intakes for a dual ASIC design.

Figure 187:
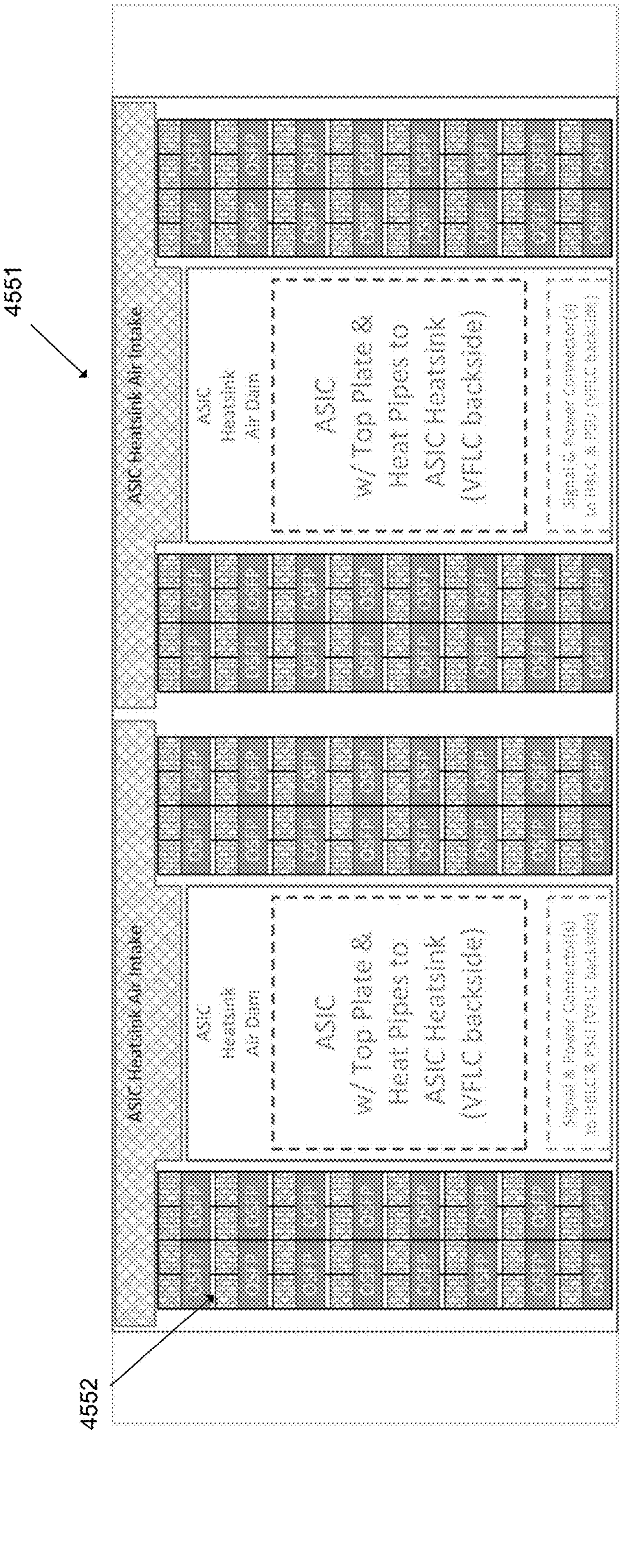

FIG. 187 is a full view of the front of a vertical front line card, with an alternate orientation of plug ports and channel intakes for a dual ASIC design.

Figure 188:
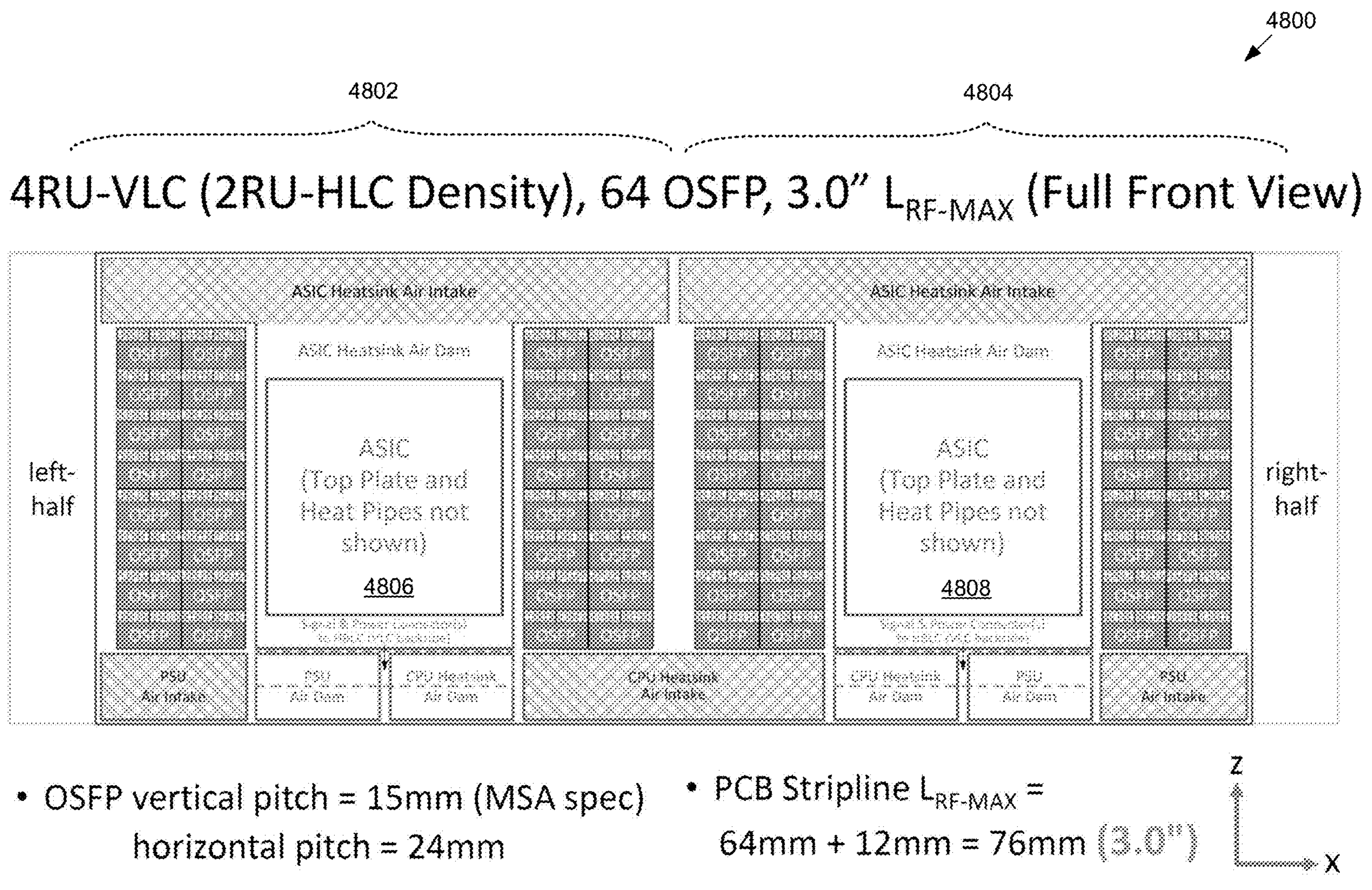

FIG. 188 is a front view of a design with front-mounted ASIC's.

Figure 189:
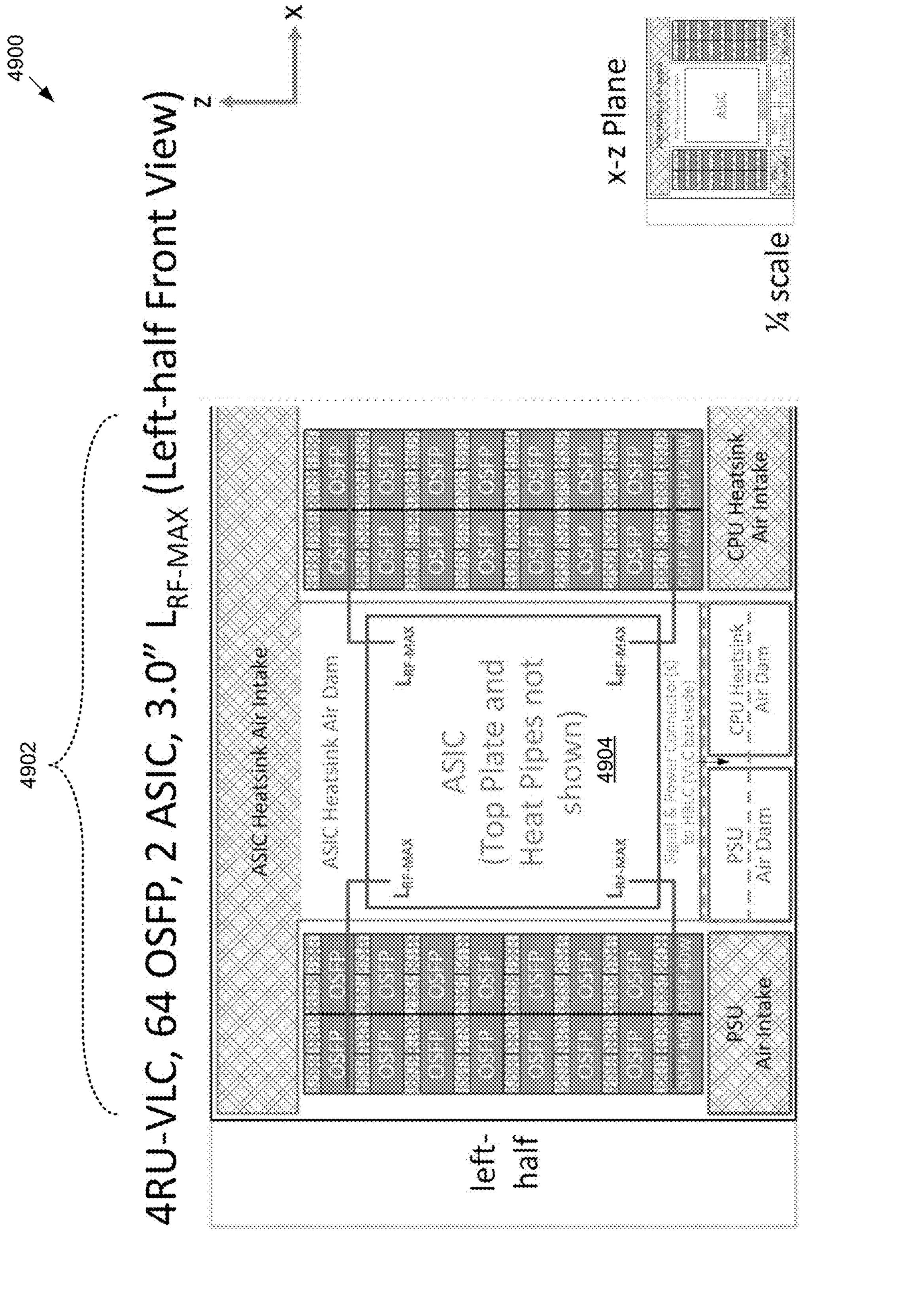

FIG. 189 is the left side of the front view shown in FIG. 188.

Figure 190:
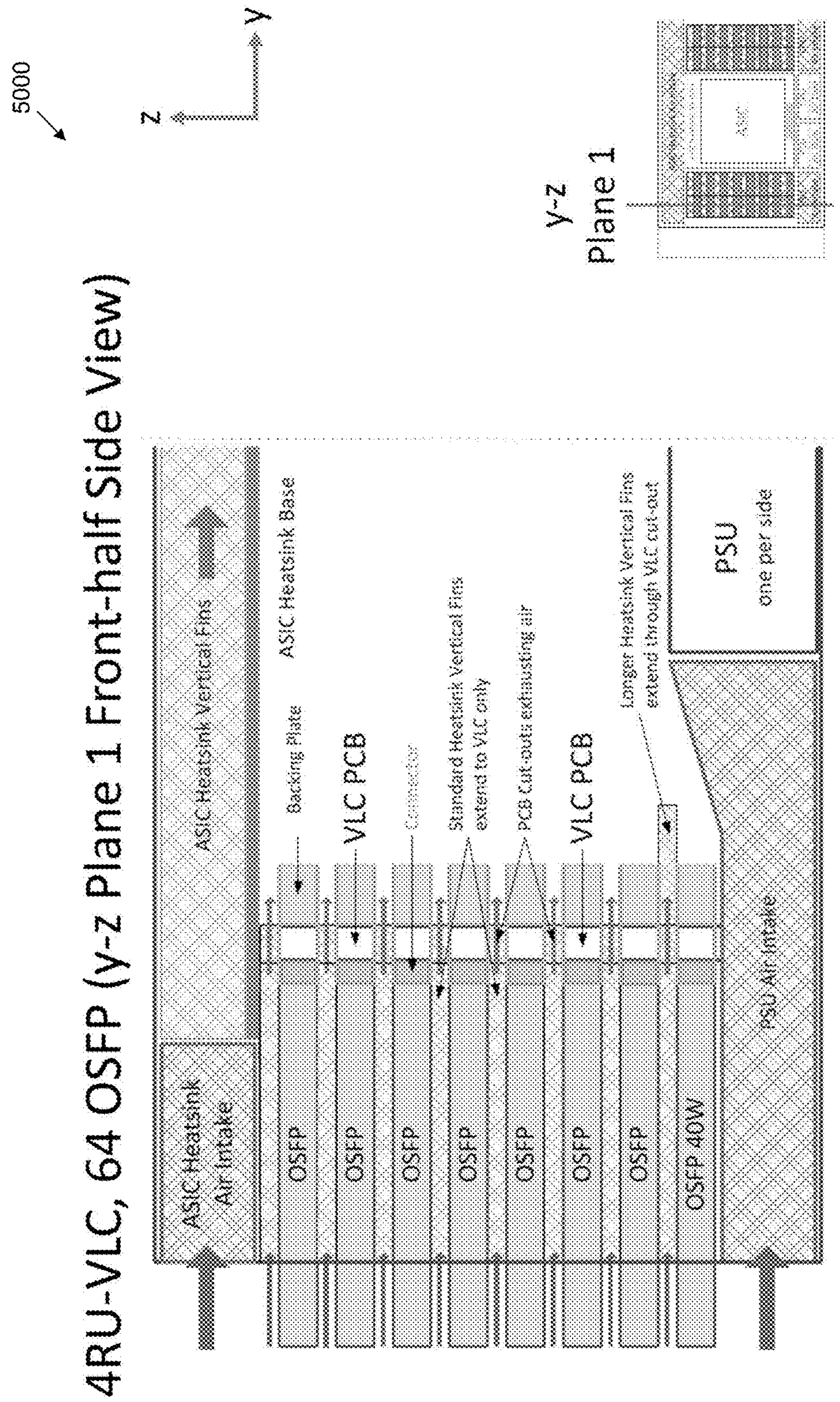

FIG. 190 is a side view of a slice through the left side of the design shown in FIG. 189.

Figure 191:
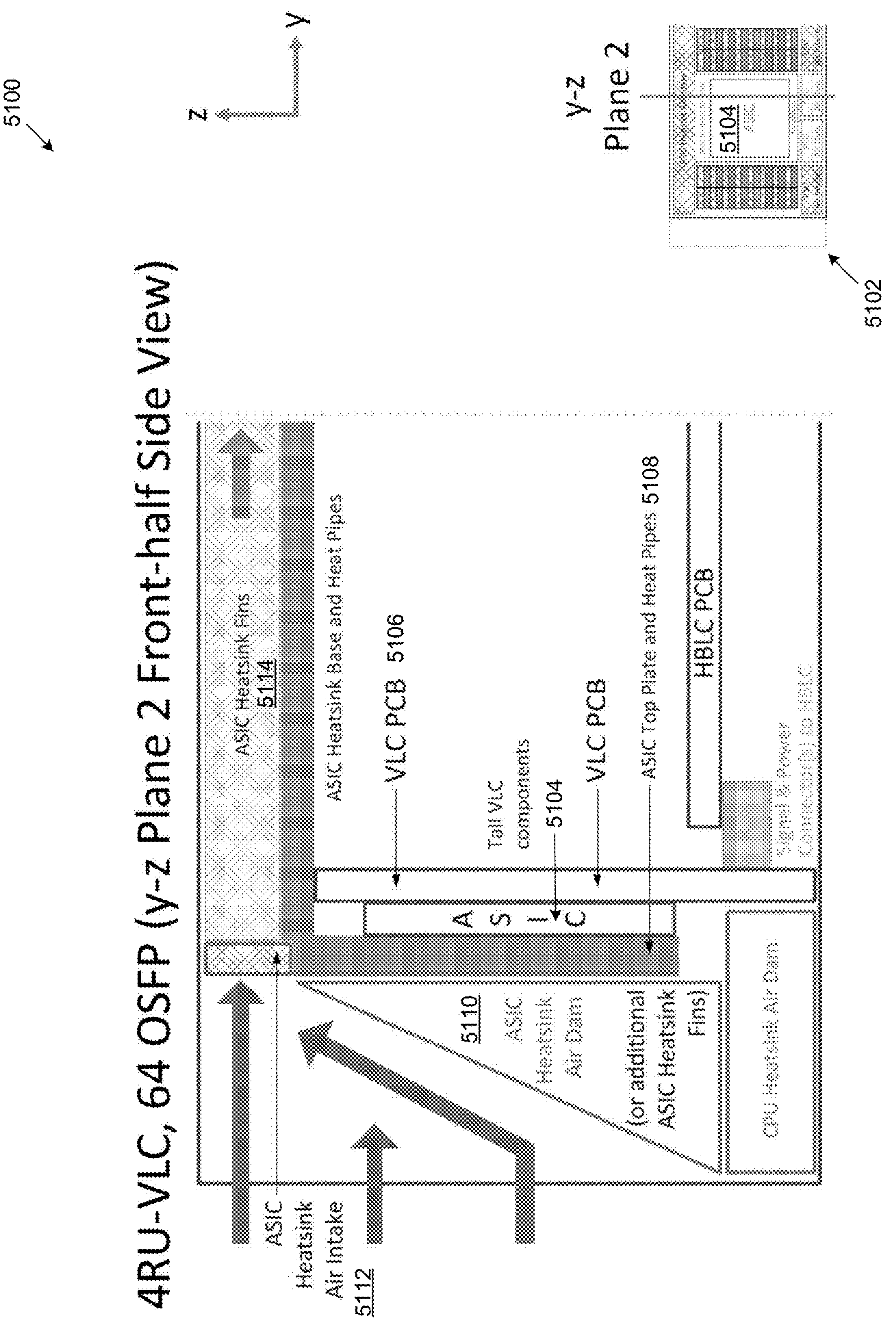

FIG. 191 is a side view of a slice through a central portion of the left side view shown in FIG. 189.

Figure 192:
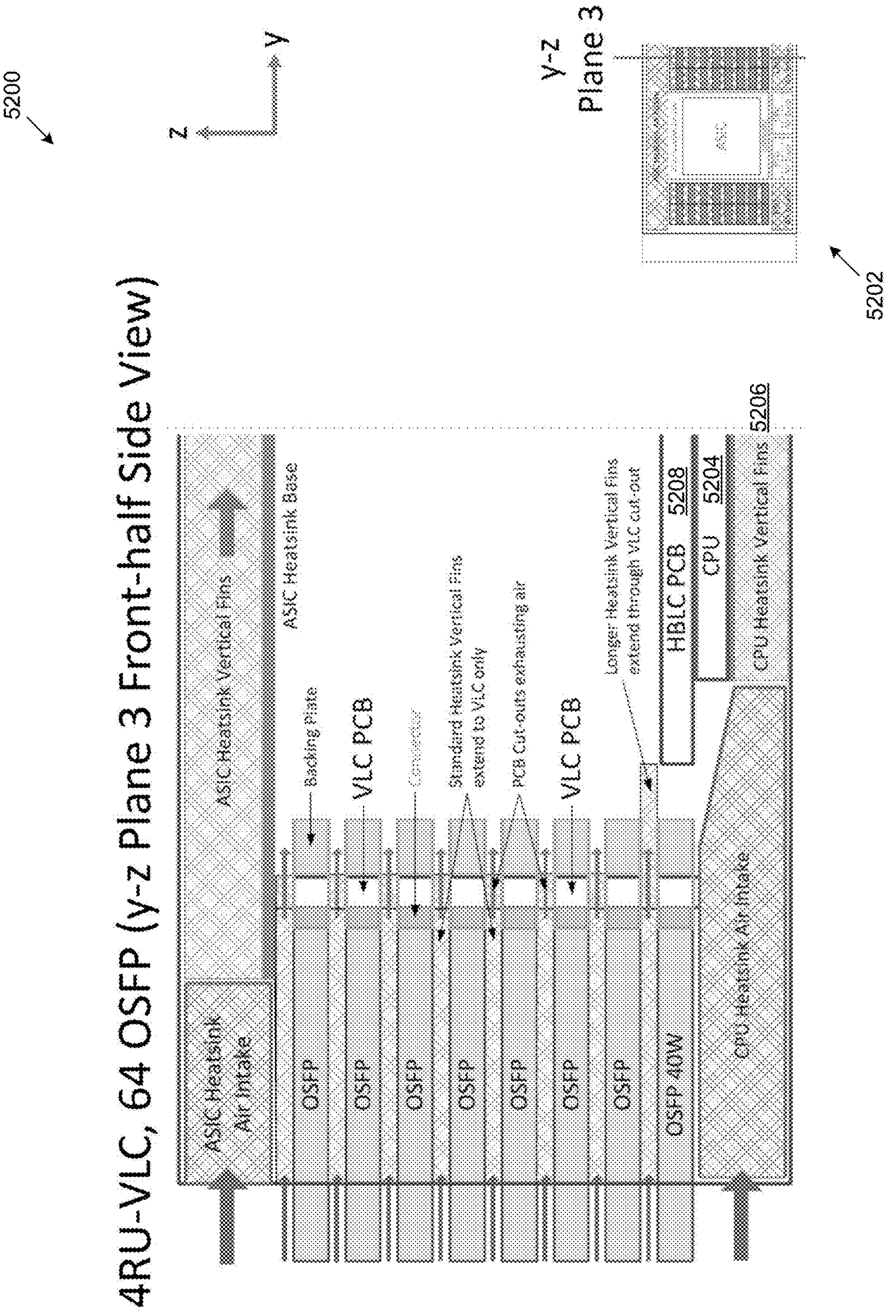

FIG. 192 is a side view a slice through the right side of the design shown in FIG. 189.

Figure 193:
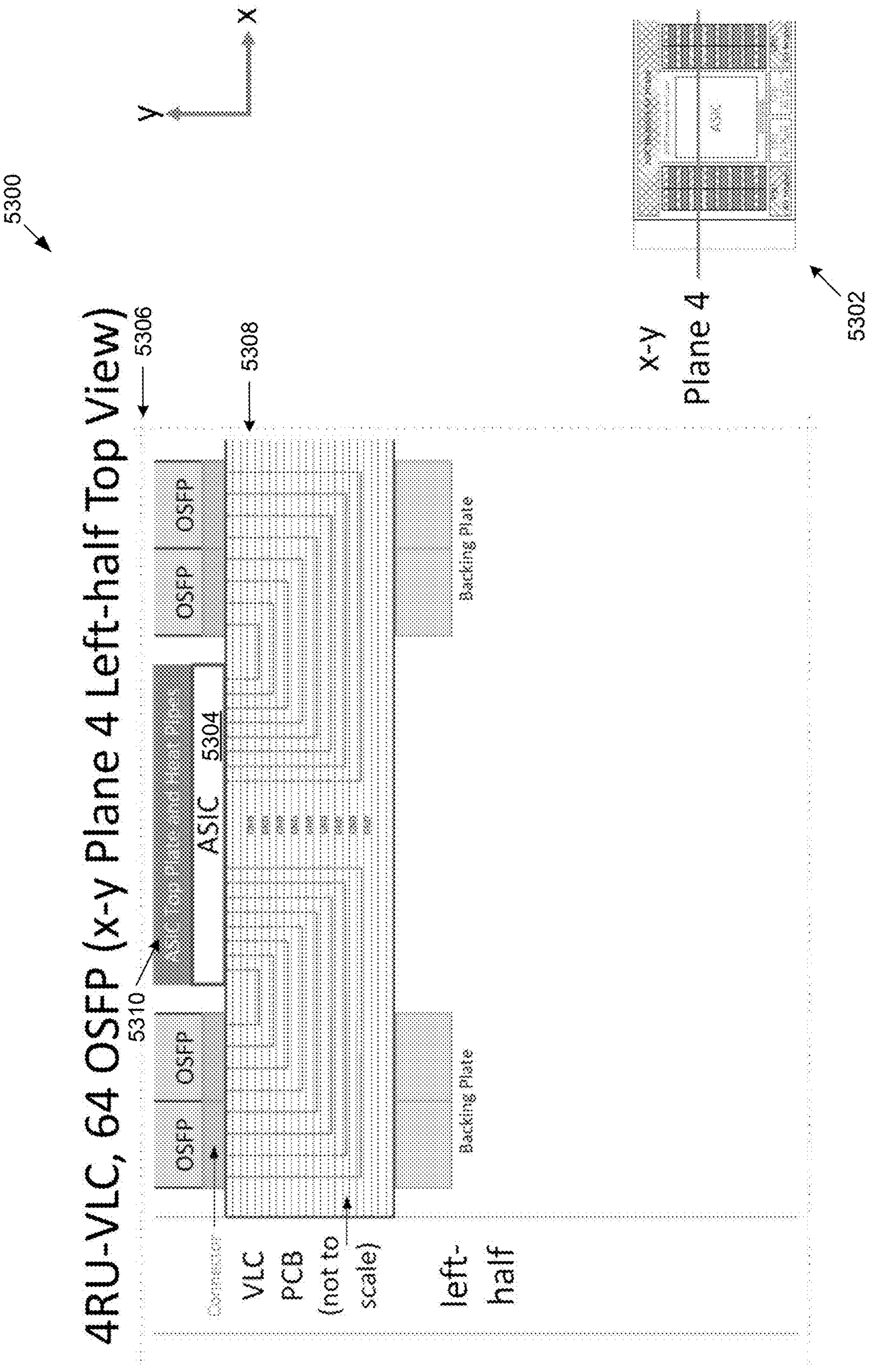

FIG. 193 is a top view of a slice through the design shown in FIG. 189.

Figure 194:
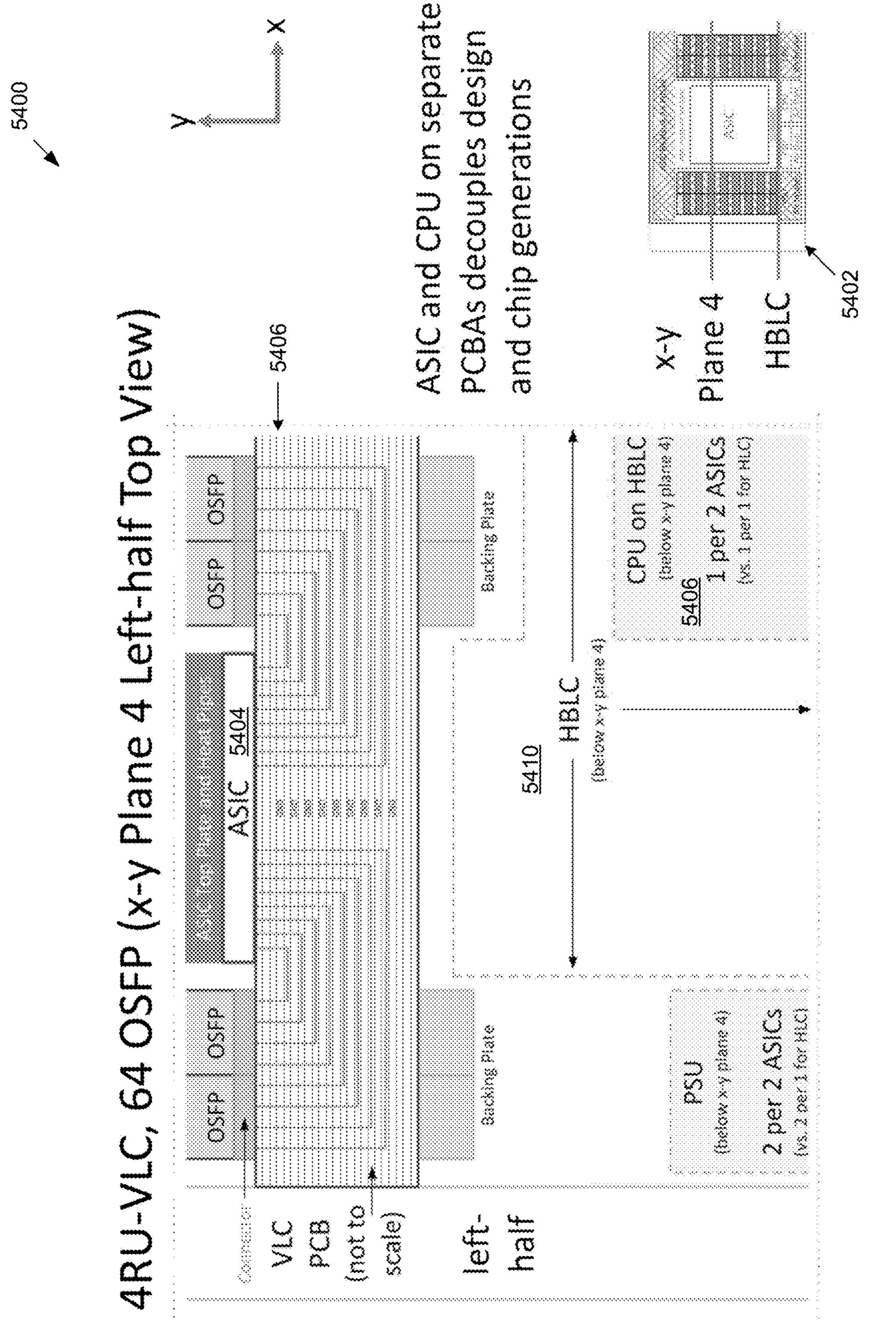

FIG. 194 is another top view of a slice through another vertical position of the design shown in FIG. 189.

Figure 195:
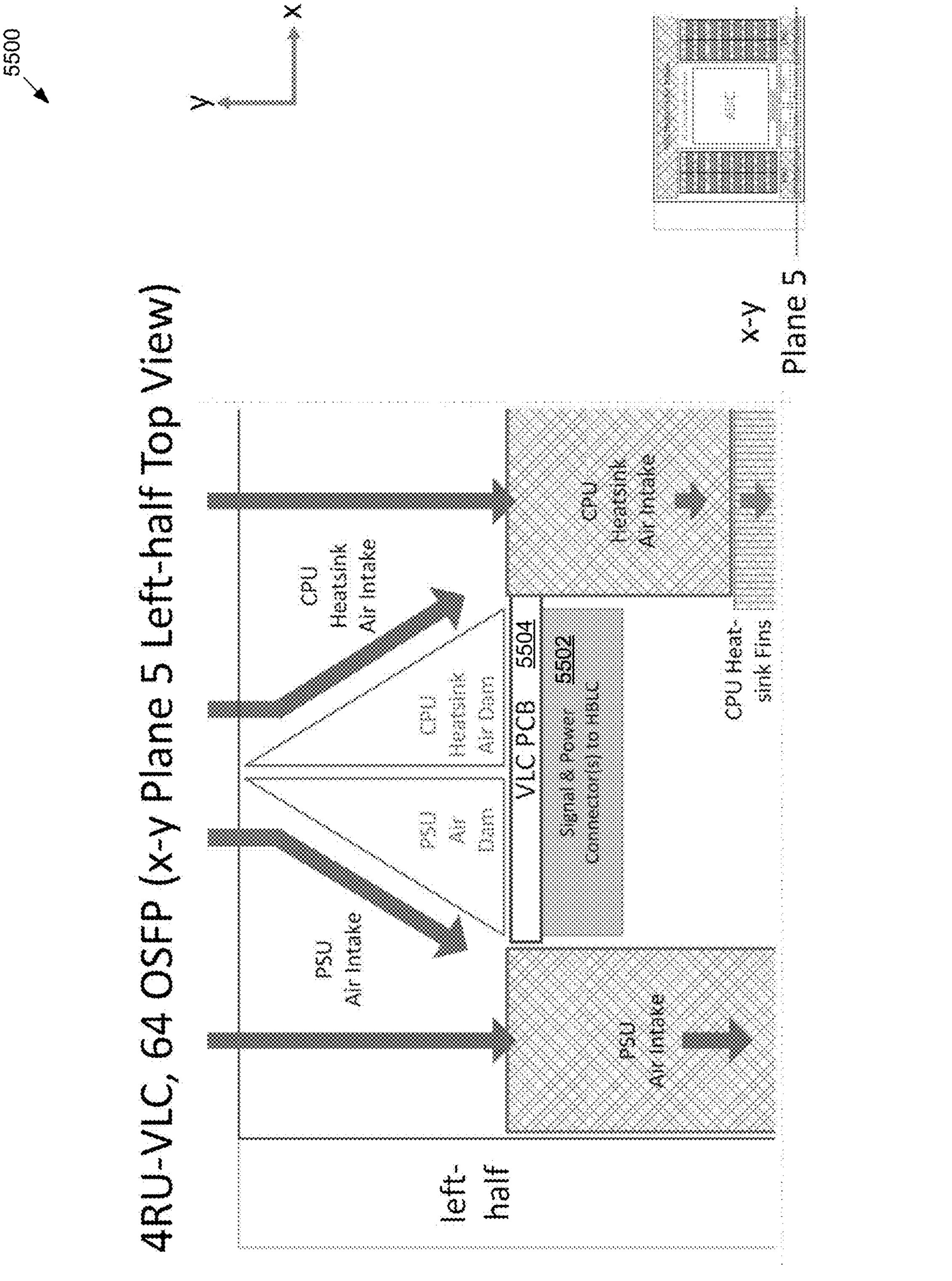

FIG. 195 is another top view of a slice through still another vertical position of the design shown in FIG. 189.

Figure 196:
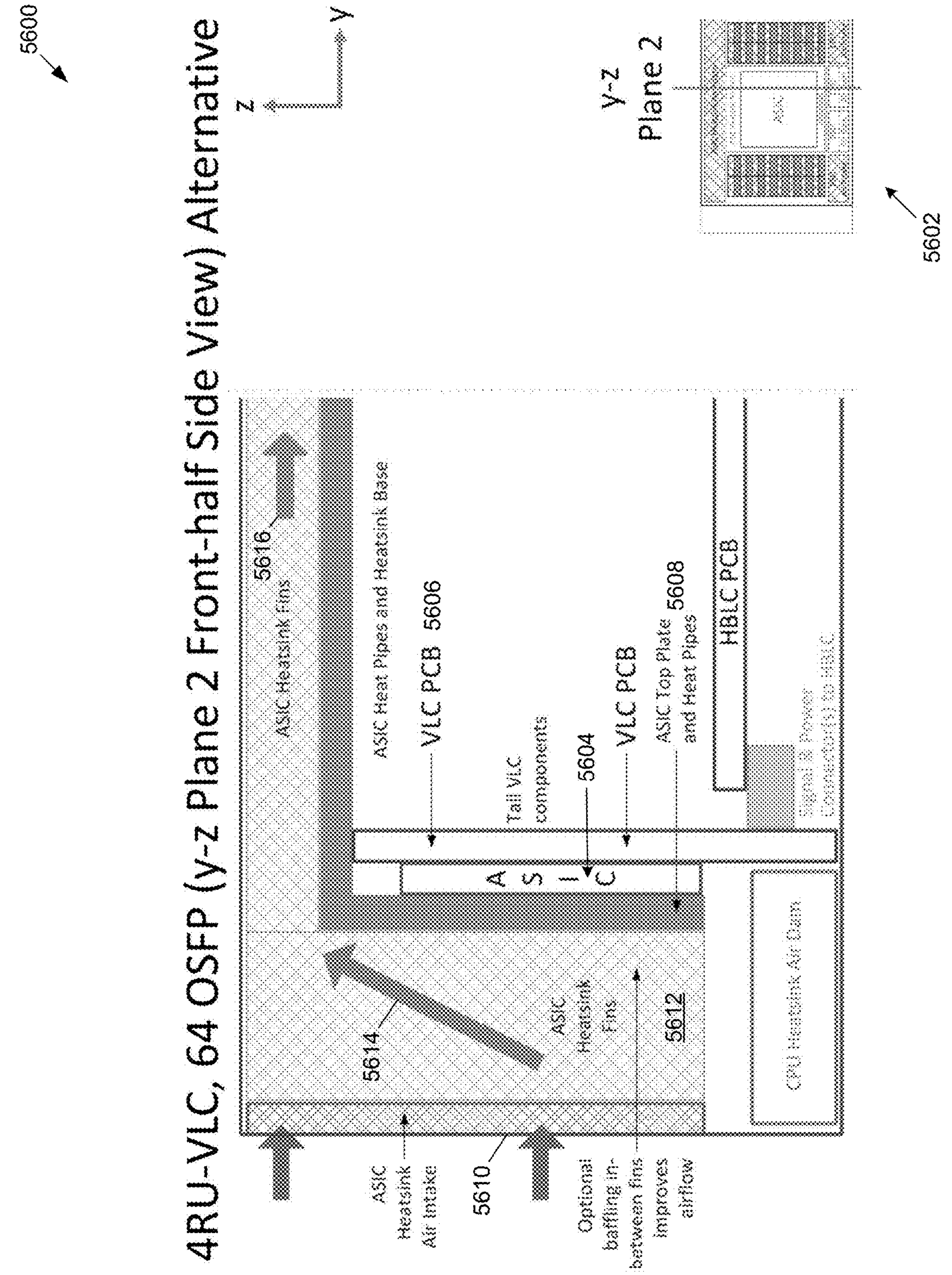

FIG. 196 is a side view of a slice through a central portion of the left side view shown in FIG. 189 and having an alternative design.

Figure 197:
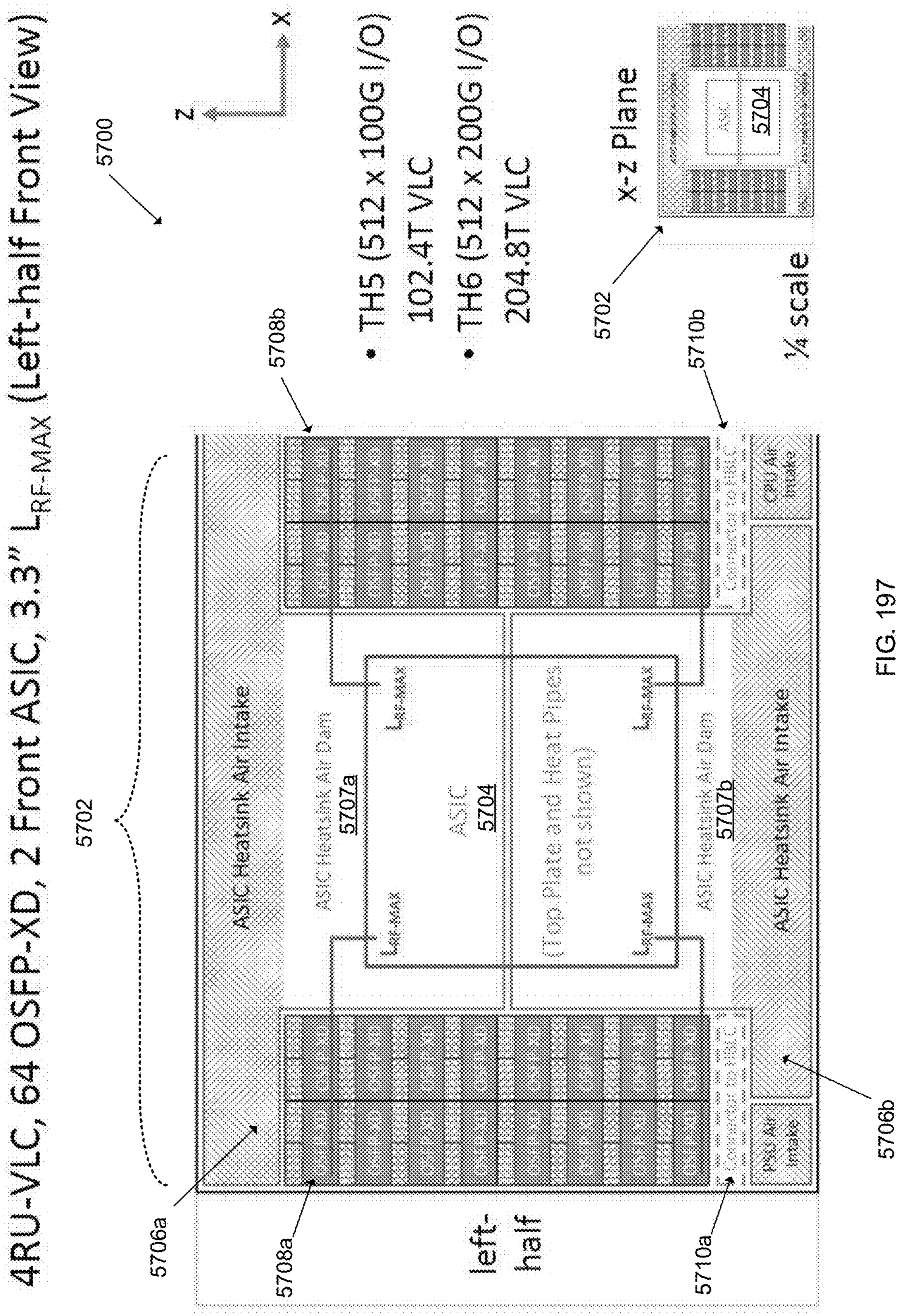

FIG. 197 is a front view of a design with front-mounted ASICs with dual air intake.

Figure 198:
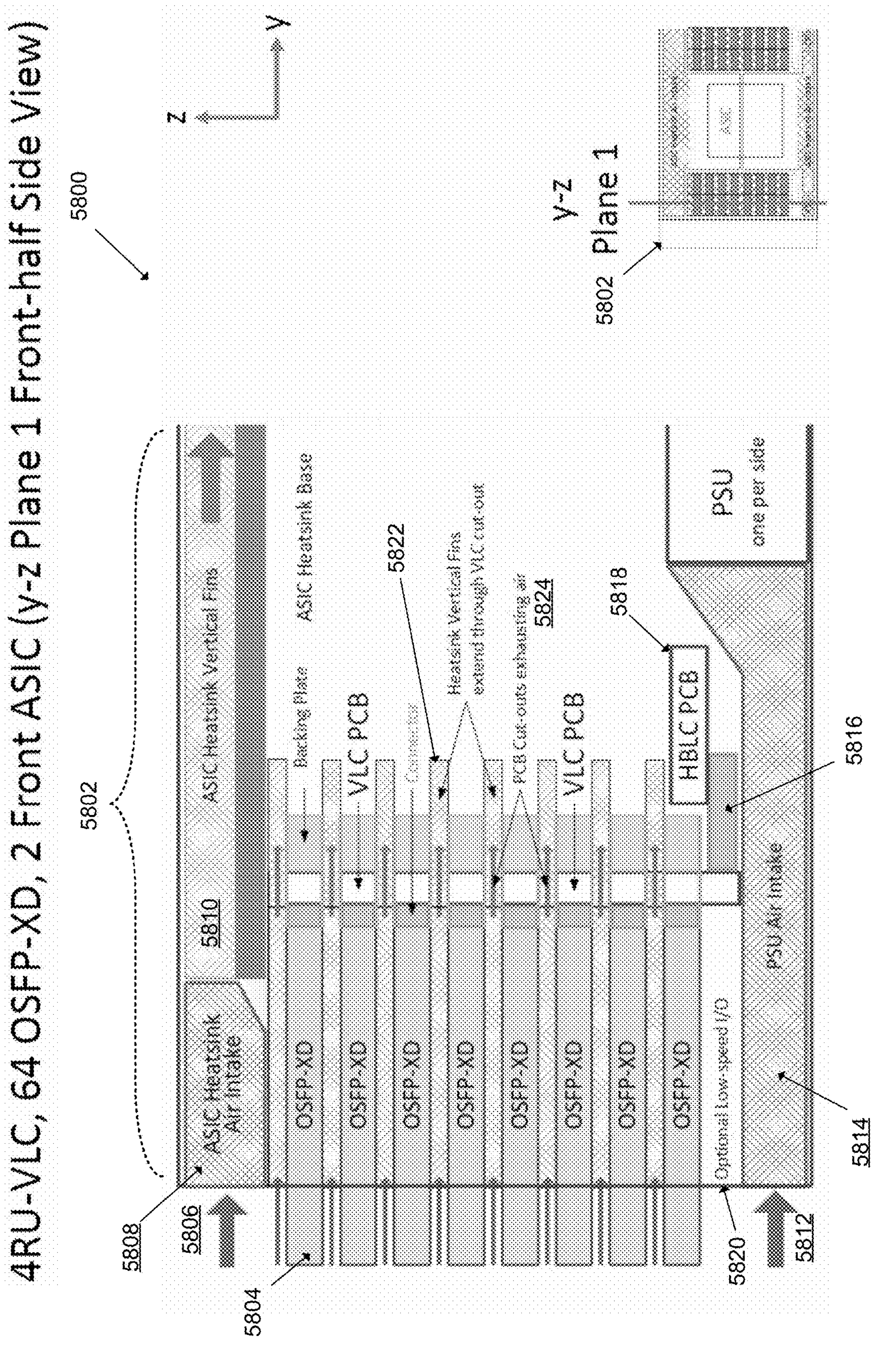

FIG. 198 is a side view of a slice through the left side of the design shown in FIG. 197.

Figure 199:
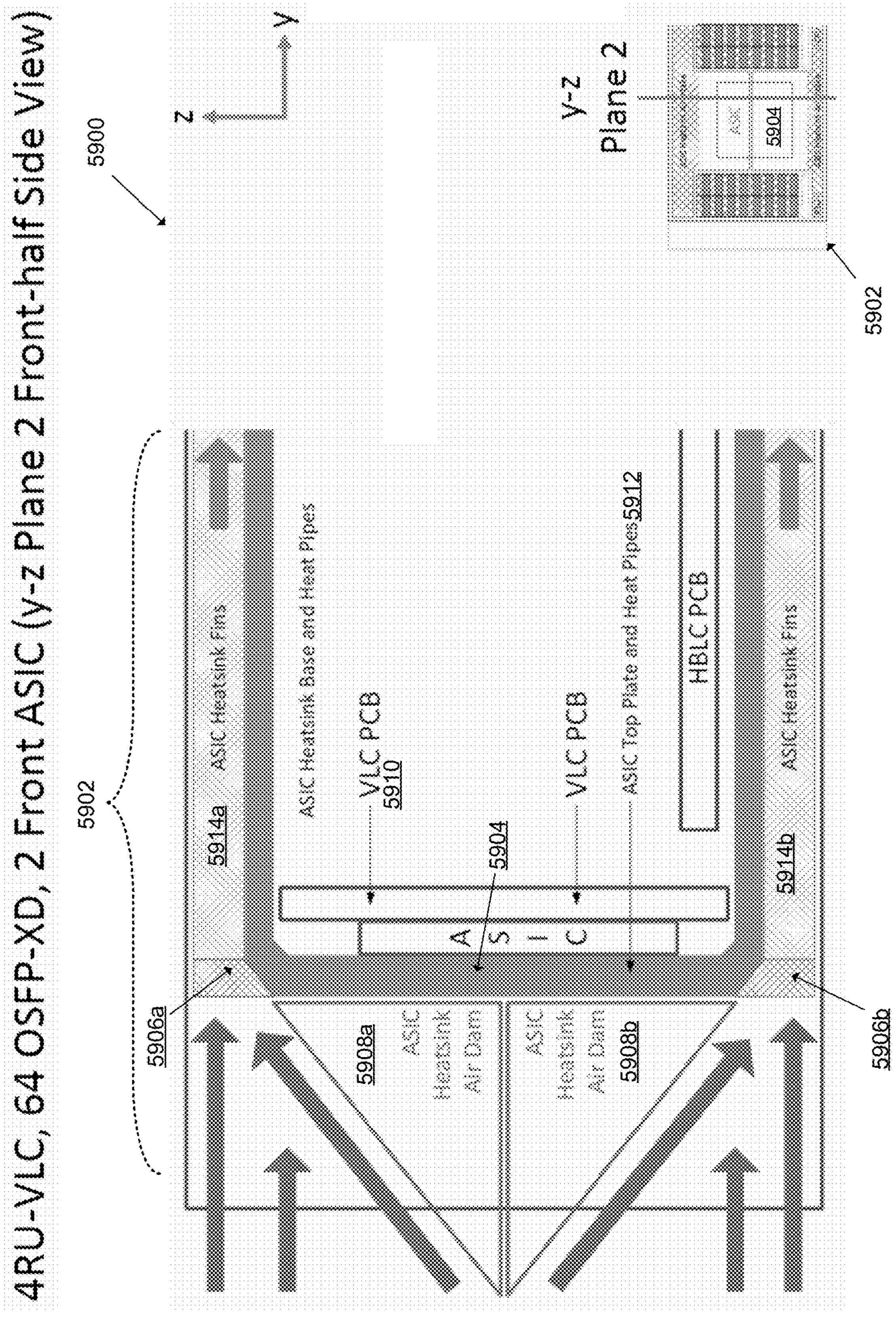

FIG. 199 is another side view of a slice through the right side of the design shown in FIG. 197.

Figure 200:
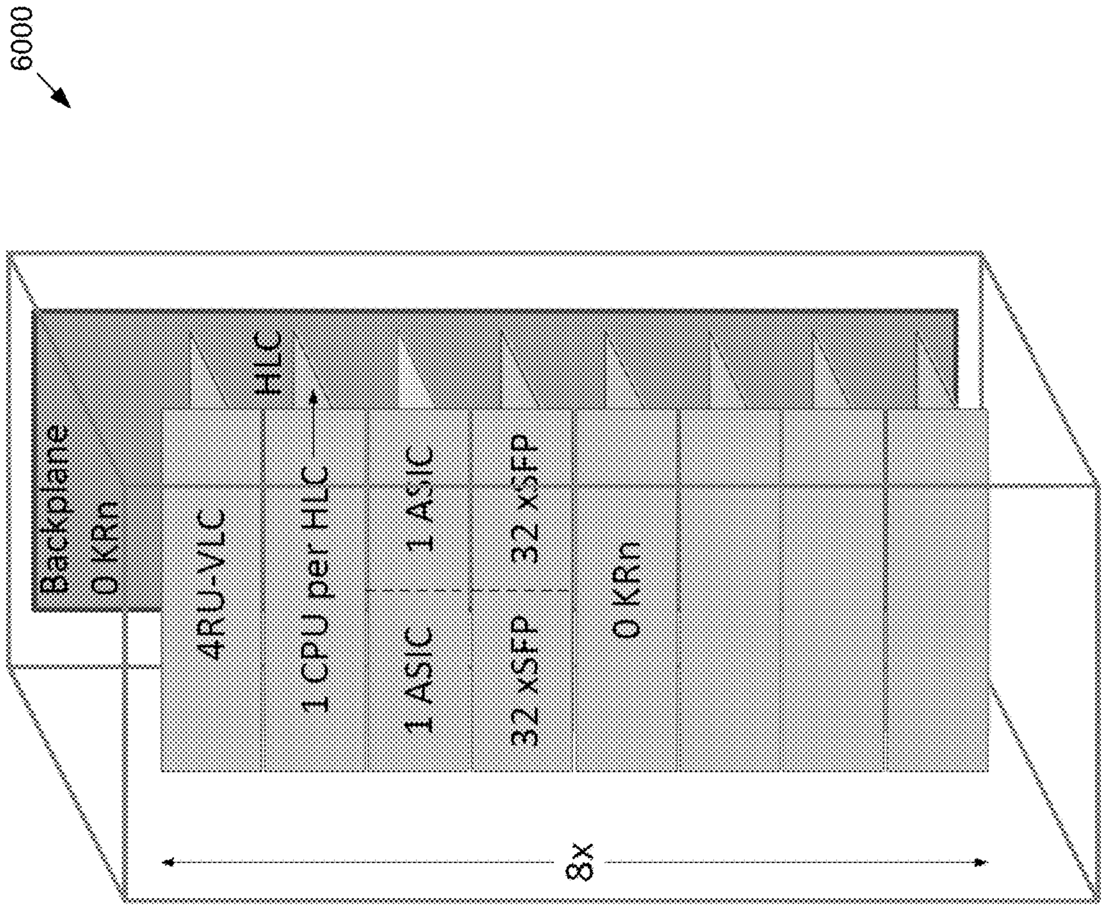

FIG. 200 is a diagram of an arrangement of vertical front line cards.

Figure 201:
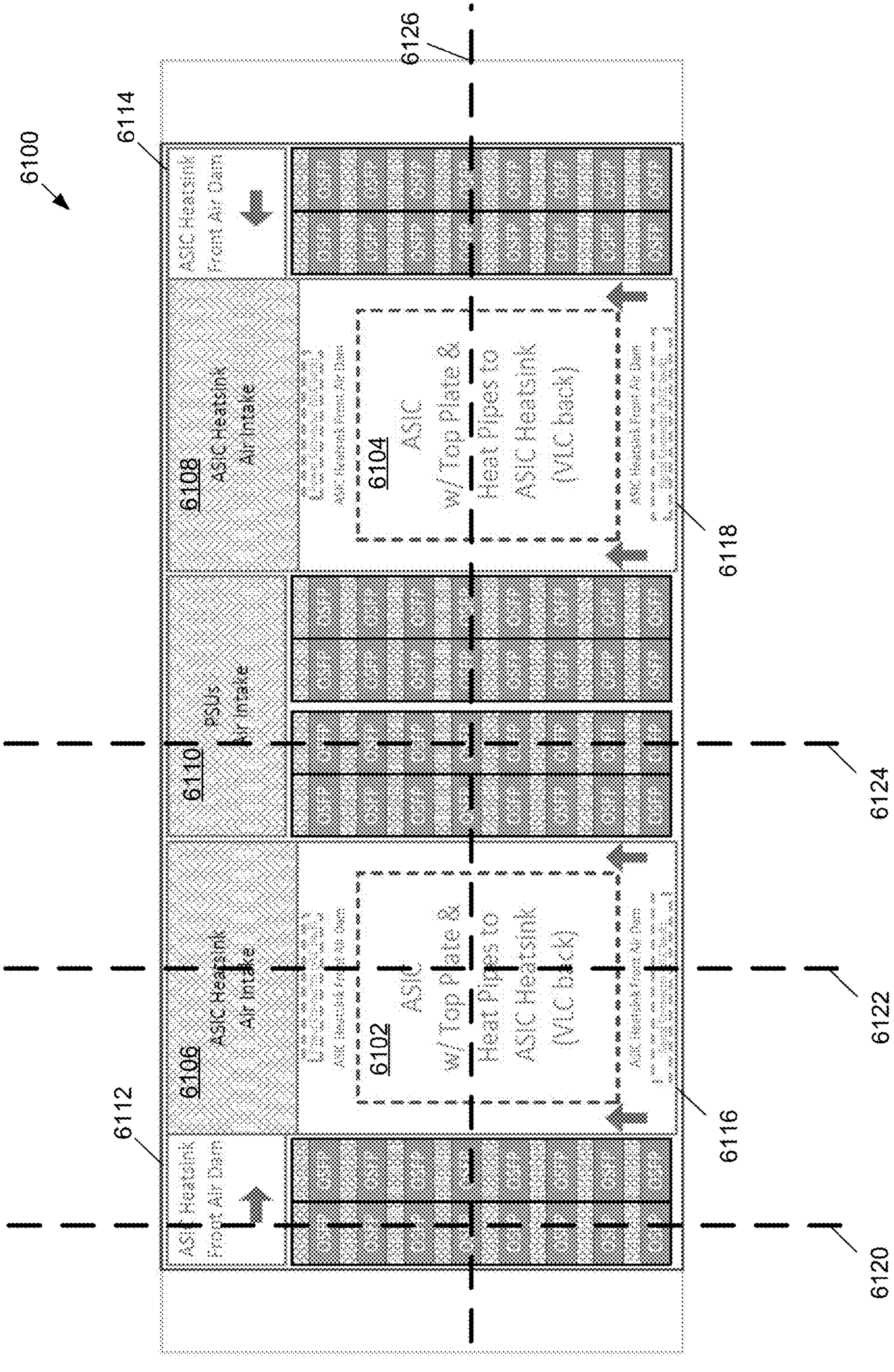

FIG. 201 is a full view of the front of a vertical front line card, with an alternate orientation of plug ports and channel intakes for a dual ASIC design.

Figure 202:
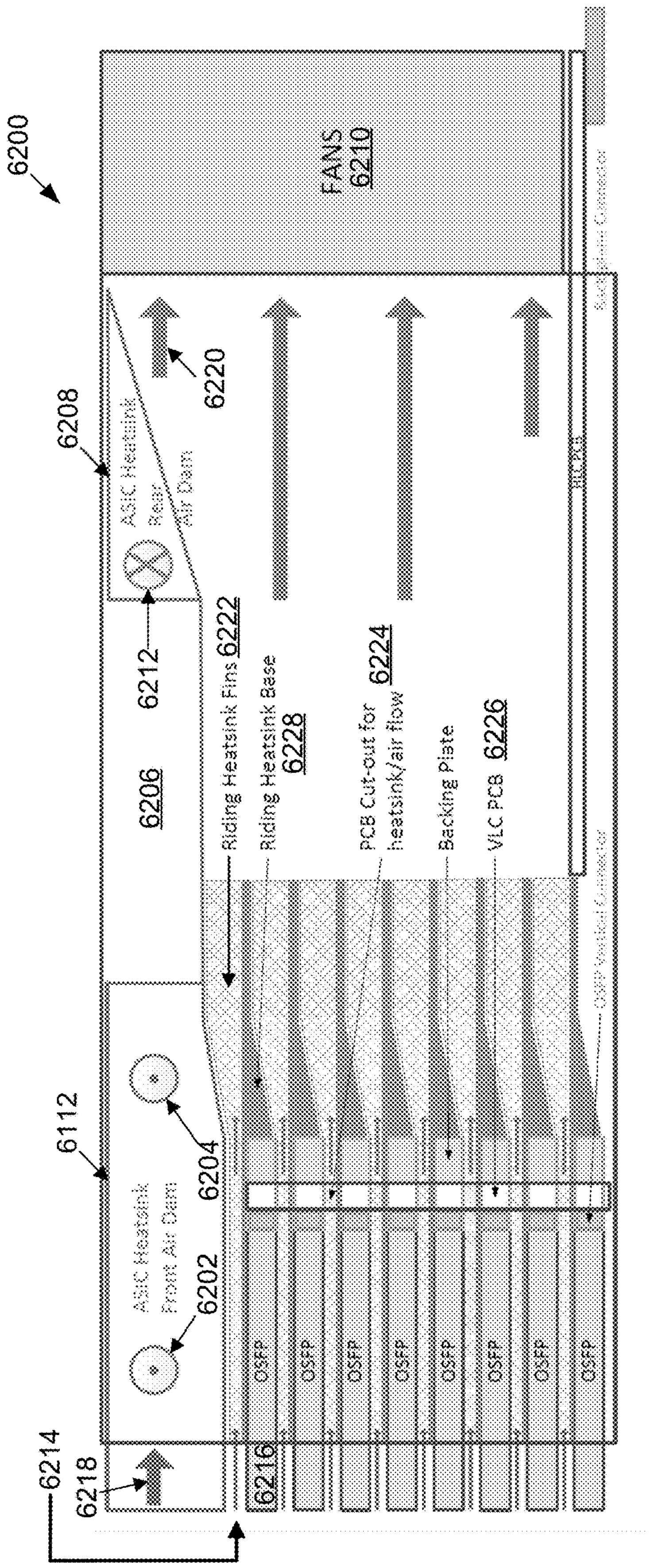

FIG. 202 is a side view a slice through the left side of the design shown in FIG. 201.

Figure 203:
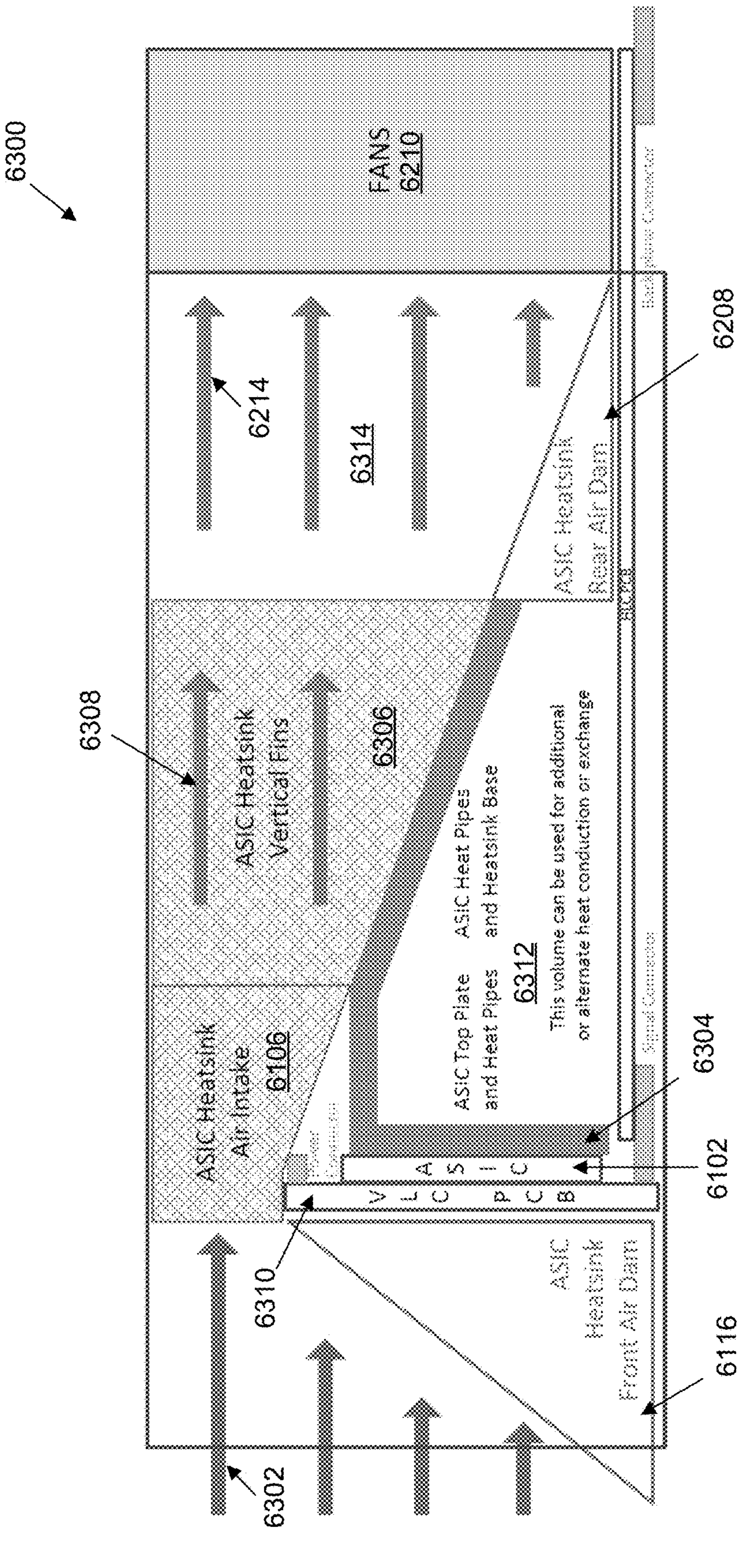

FIG. 203 is a side view of a slice through a central portion of the left side view shown in FIG. 201.

Figure 204:
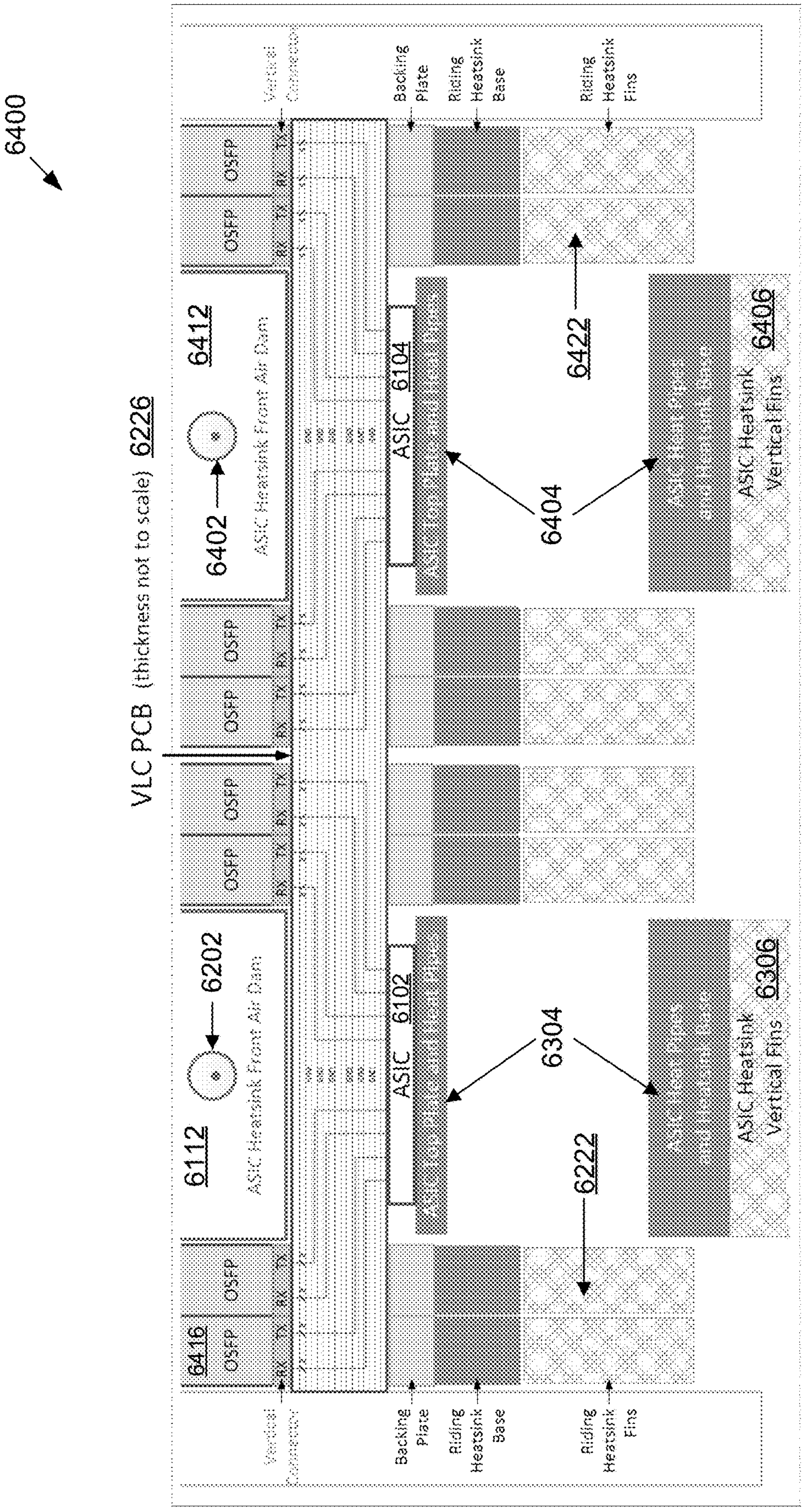

FIG. 204 is a top view of a slice through a vertical position of the design shown in FIG. 201.

Figure 205:
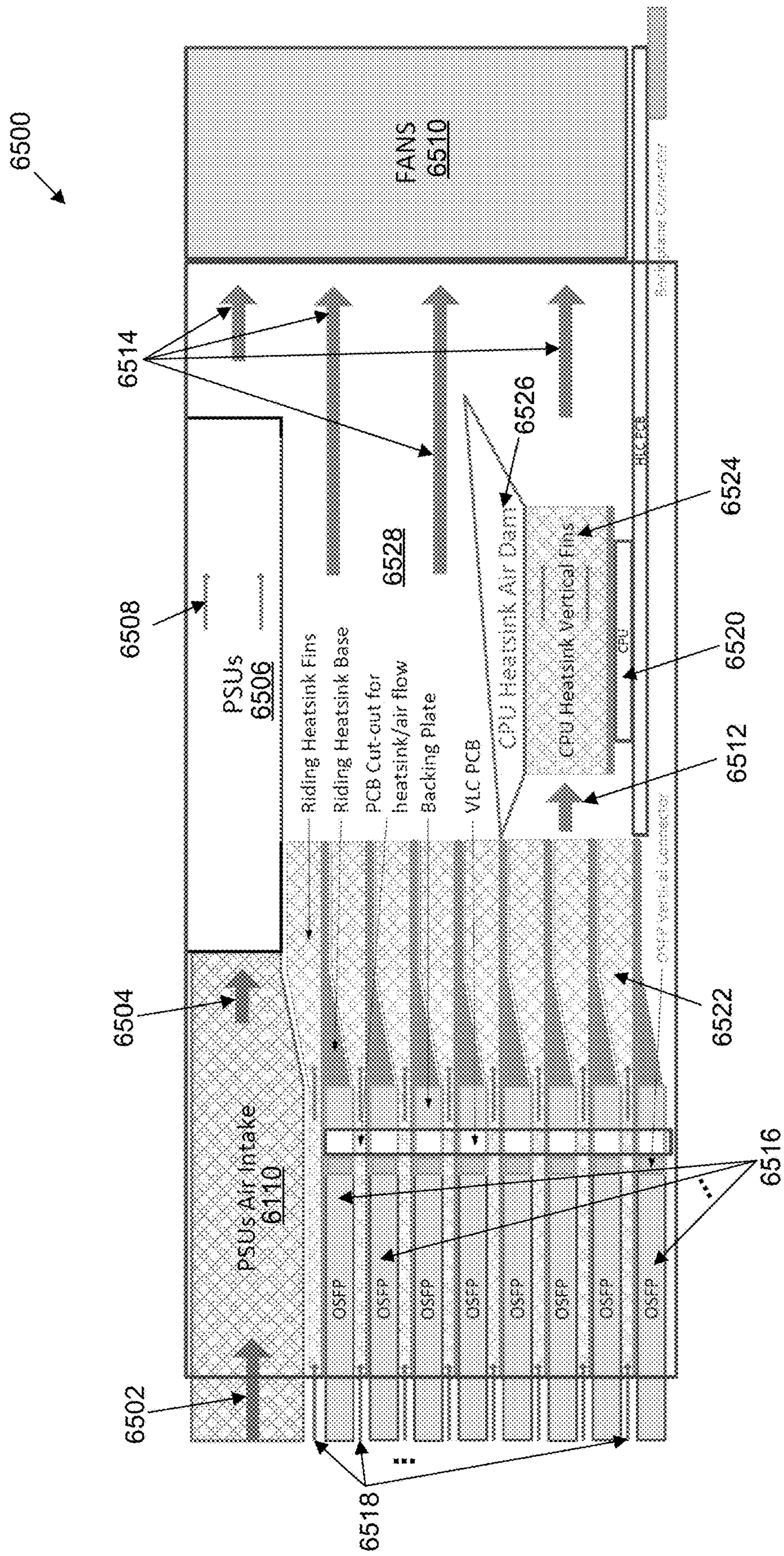

FIG. 205 is a side view a slice through the central portion of the design shown in FIG. 201.

Like reference symbols in the various drawings indicate like elements.

DETAILED DESCRIPTION

This document describes a novel system for high bandwidth data processing, including novel input/output interface modules for coupling bundles of optical fibers to data processing integrated circuits (e.g., network switches, central processing units, graphics processor units, tensor processing units, digital signal processors, and/or other application specific integrated circuits (ASICs)) that process the data transmitted through the optical fibers. In some implementations, the data processing integrated circuit is mounted on a circuit board (or substrate or a combination of circuit board(s) and substrate(s)) positioned near the input/output interface module through a relatively short electrical signal path on the circuit board (or substrate or a combination of circuit board(s) and substrate(s)). The input/output interface module includes a first connector that allows a user to conveniently connect or disconnect the input/output interface module to or from the circuit board (or substrate or a combination of circuit board(s) and substrate(s)). The input/output interface module can also include a second connector that allows the user to conveniently connect or disconnect the bundle of optical fibers to or from the input/output interface module. In some implementations, a rack mount system having a front panel is provided in which the circuit board (which supports the input/output interface modules and the data processing integrated circuits) (or substrate or a combination of circuit board(s) and substrate(s)) is vertically mounted in an orientation substantially parallel to, and positioned near, the front panel. In some examples, the circuit board (or substrate or a combination of circuit board(s) and substrate(s)) functions as the front panel or part of the front panel. The second connectors of the input/output interface modules face the front side of the rack mount system to allow the user to conveniently connect or disconnect bundles of optical fibers to or from the system.

In some implementations, a feature of the high bandwidth data processing system is that, by vertically mounting the circuit board that supports the input/output interface modules and the data processing integrated circuits to be near the front panel, or configuring the circuit board as the front panel or part of the front panel, the optical signals can be routed from the optical fibers through the input/output interface modules to the data processing integrated circuits through relatively short electrical signal paths. This allows the signals transmitted to the data processing integrated circuits to have a high bit rate (e.g., over 50 Gbps) while maintaining low crosstalk, distortion, and noise, hence reducing power consumption and footprint of the data processing system.

In some implementations, a feature of the high bandwidth data processing system is that the cost of maintenance and repair can be lower compared to traditional systems. For example, the input/output interface modules and the fiber optic cables are configured to be detachable, a defective input/output interface module can be replaced without taking apart the data processing system and without having to re-route any optical fiber. Another feature of the high bandwidth data processing system is that, because the user can easily connect or disconnect the bundles of the optical fibers to or from the input/output interface modules through the front panel of the rack mount system, the configurations for routing of high bit rate signals through the optical fibers to the various data processing integrated circuits is flexible and can easily be modified. For example, connecting a bundle of hundreds of strands of optical fibers to the optical connector of the rack mount system can be almost as simple as plugging a universal serial bus (USB) cable into a USB port. A further feature of the high bandwidth data processing system is that the input/output interface module can be made using relatively standard, low cost, and energy efficient components so that the initial hardware costs and subsequent operational costs of the input/output interface modules can be relatively low, compared to conventional systems.

In some implementations, optical interconnects can co-package and/or co-integrate optical transponders with electronic processing chips. It is useful to have transponder solutions that consume relatively low power and that are sufficiently robust against significant temperature variations as may be found within an electronic processing chip package. In some implementations, high speed and/or high bandwidth data processing systems can include massively spatially parallel optical interconnect solutions that multiplex information onto relatively few wavelengths and use a relatively large number of parallel spatial paths for chip-to-chip interconnection. For example, the relatively large number of parallel spatial paths can be arranged in two-dimensional arrays using connector structures such as those disclosed in U.S. patent application Ser. No. 16/816,171, filed on Mar. 11, 2020, published as US 2021/0286140, and incorporated herein by reference in its entirety.

Figure 1:
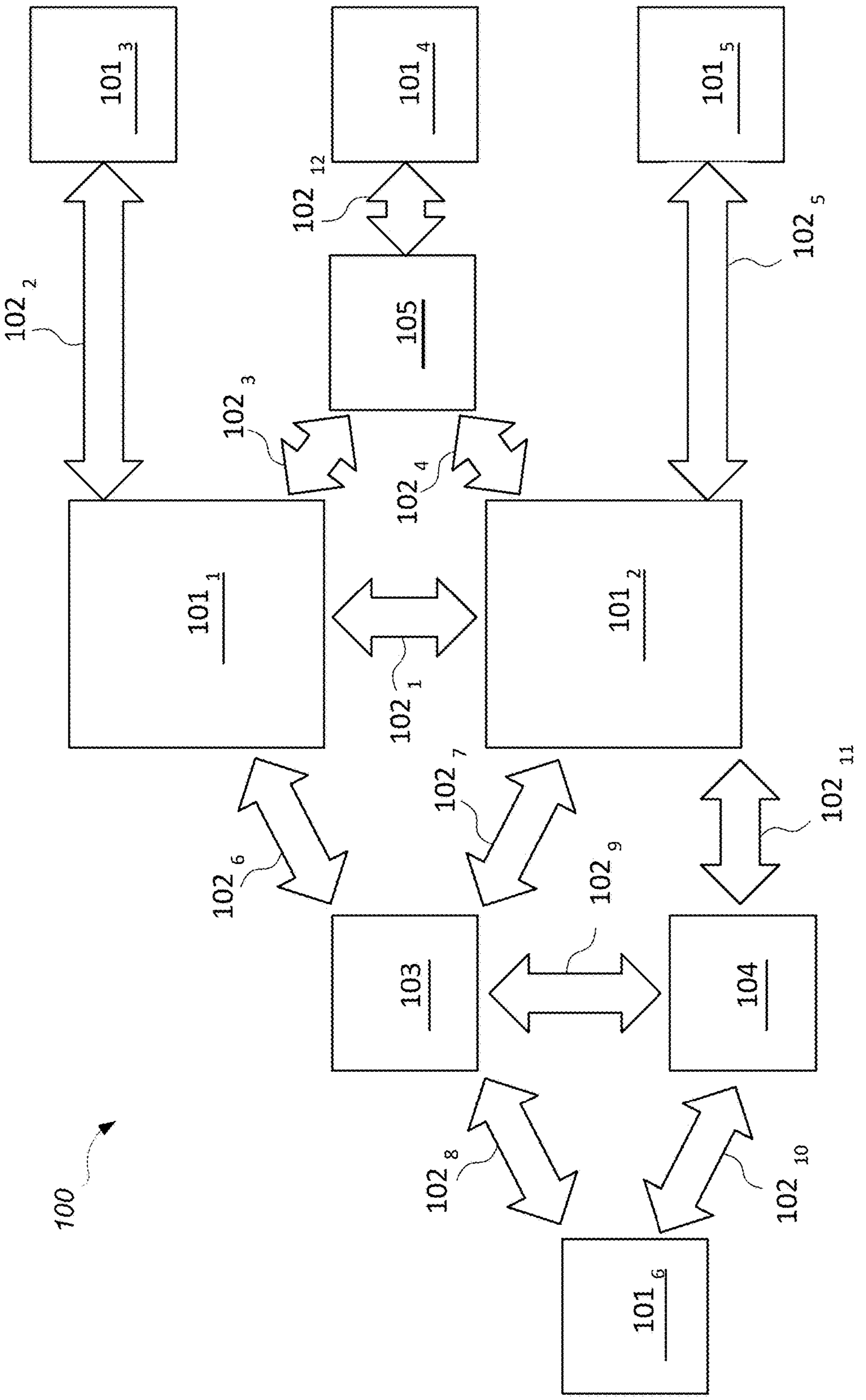
FIG. 1 is a block diagram of an example optical communication system.

FIG. 1 shows a block diagram of a communication system 100 that incorporates one or more novel features described in this document. In some implementations, the system 100 includes nodes 101_1 to 101_6 (collectively referenced as 101), which in some embodiments can each include one or more of: optical communication devices, electronic and/or optical switching devices, electronic and/or optical routing devices, network control devices, traffic control devices, synchronization devices, computing devices, and data storage devices. The nodes 101_1 to 101_6 can be suitably interconnected by optical fiber links 102_1 to 102_12 (collectively referenced as 102) establishing communication paths between the communication devices within the nodes. The optical fiber links 102 can include the fiber-optic cables described in U.S. Pat. No. 11,194,109, issued on Dec. 7, 2021, titled "Optical Fiber Cable and Raceway Therefor," and incorporated herein by reference in its entirety. The system 100 can also include one or more optical power supply modules 103 producing one or more light outputs, each light output comprising one or more continuous-wave (CW) optical fields and/or one or more trains of optical pulses for use in one or more of the optical communication devices of the nodes 101_1 to 101_6. For illustration purposes, only one such optical power supply module 103 is shown in FIG. 1. A person of ordinary skill in the art will understand that some embodiments can have more than one optical power supply module 103 appropriately distributed over the system 100 and that such multiple power supply modules can be synchronized, e.g., using some of the techniques disclosed in U.S. Pat. No. 11,153,670, issued on Oct. 19, 2021, titled "Communication System Employing Optical Frame Templates," incorporated herein by reference in its entirety.

Some end-to-end communication paths can pass through an optical power supply module 103 (e.g., see the communication path between the nodes 101_2 and 101_6). For example, the communication path between the nodes 101_2 and 101_6 can be jointly established by the optical fiber links 102_7 and 102_8, whereby light from the optical power supply module 103 is multiplexed onto the optical fiber links 102_7 and 102_8.

Some end-to-end communication paths can pass through one or more optical multiplexing units 104 (e.g., see the communication path between the nodes 101_2 and 101_6). For example, the communication path between the nodes 101_2 and 101_6 can be jointly established by the optical fiber links 102_10 and 102_11. Multiplexing unit 104 is also connected, through the link 102_9, to receive light from the optical power supply module 103 and, as such, can be operated to multiplex said received light onto the optical fiber links 102_10 and 102_11.

Some end-to-end communication paths can pass through one or more optical switching units 105 (e.g., see the communication path between the nodes 101_1 and 101_4). For example, the communication path between the nodes 101_1 and 101_4 can be jointly established by the optical fiber links 102_3 and 102_12, whereby light from the optical fiber links 102_3 and 102_4 is either statically or dynamically directed to the optical fiber link 102_12.

As used herein, the term "network element" refers to any element that generates, modulates, processes, or receives light within the system 100 for the purpose of communication. Example network elements include the node 101, the optical power supply module 103, the optical multiplexing unit 104, and the optical switching unit 105.

Some light distribution paths can pass through one or more network elements. For example, optical power supply module 103 can supply light to the node 101_4 through the optical fiber links 102_7, 102_4, and 102_12, letting the light pass through the network elements 101_2 and 105.

Various elements of the communication system 100 can benefit from the use of optical interconnects, which can use photonic integrated circuits comprising optoelectronic devices, co-packaged and/or co-integrated with electronic chips comprising integrated circuits.

As used herein, the term "photonic integrated circuit" (or PIC) should be construed to cover planar lightwave circuits (PLCs), integrated optoelectronic devices, wafer-scale products on substrates, individual photonic chips and dies, and hybrid devices. A substrate can be made of, e.g., one or more ceramic materials, or organic "high density build-up" (HDBU). Example material systems that can be used for manufacturing various photonic integrated circuits can include but are not limited to III-V semiconductor materials, silicon photonics, silica-on-silicon products, silica-glass-based planar lightwave circuits, polymer integration platforms, lithium niobate and derivatives, nonlinear optical materials, etc. Both packaged devices (e.g., wired-up and/or encapsulated chips) and unpackaged devices (e.g., dies) can be referred to as planar lightwave circuits.

Photonic integrated circuits are used for various applications in telecommunications, instrumentation, and signal-processing fields. In some implementations, a photonic integrated circuit uses optical waveguides to implement and/or interconnect various circuit components, such as for example, optical switches, couplers, routers, splitters, multiplexers/demultiplexers, filters, modulators, phase shifters, lasers, amplifiers, wavelength converters, optical-to-electrical (O/E) and electrical-to-optical (E/O) signal converters, etc. For example, a waveguide in a photonic integrated circuit can be an on-chip solid light conductor that guides light due to an index-of-refraction contrast between the waveguide's core and cladding. A photonic integrated circuit can include a planar substrate onto which optoelectronic devices are grown by an additive manufacturing process and/or into which optoelectronic devices are etched by a subtractive manufacturing processes, e.g., using a multi-step sequence of photolithographic and chemical processing steps.

In some implementations, an "optoelectronic device" can operate on both light and electrical currents (or voltages) and can include one or more of: (i) an electrically driven light source, such as a laser diode; (ii) an optical amplifier; (iii) an optical-to-electrical converter, such as a photodiode; and (iv)

an optoelectronic component that can control the propagation and/or certain properties (e.g., amplitude, phase, polarization) of light, such as an optical modulator or a switch. The corresponding optoelectronic circuit can additionally include one or more optical elements and/or one or more electronic components that enable the use of the circuit's optoelectronic devices in a manner consistent with the circuit's intended function. Some optoelectronic devices can be implemented using one or more photonic integrated circuits.

As used herein, the term "integrated circuit" (IC) should be construed to encompass both a non-packaged die and a packaged die. In a typical integrated circuit-fabrication process, dies (chips) are produced in relatively large batches using wafers of silicon or other suitable material(s). Electrical and optical circuits can be gradually created on a wafer using a multi-step sequence of photolithographic and chemical processing steps. Each wafer is then cut ("diced") into many pieces (chips, dies), each containing a respective copy of the circuit that is being fabricated. Each individual die can be appropriately packaged prior to being incorporated into a larger circuit or be left non-packaged.

The term "hybrid circuit" can refer to a multi-component circuit constructed of multiple monolithic integrated circuits, and possibly some discrete circuit components, all attached to each other to be mountable on and electrically connectable to a common base, carrier, or substrate. A representative hybrid circuit can include (i) one or more packaged or non-packaged dies, with some or all of the dies including optical, optoelectronic, and/or semiconductor devices, and (ii) one or more optional discrete components, such as connectors, resistors, capacitors, and inductors. Electrical connections between the integrated circuits, dies, and discrete components can be formed, e.g., using patterned conducting (such as metal) layers, ball-grid arrays, solder bumps, wire bonds, etc. Electrical connections can also be removable, e.g., by using land-grid arrays and/or compression interposers. The individual integrated circuits can include any combination of one or more respective substrates, one or more redistribution layers (RDLs), one or more interposers, one or more laminate plates, etc.

In some embodiments, individual chips can be stacked. As used herein, the term "stack" refers to an orderly arrangement of packaged or non-packaged dies in which the main planes of the stacked dies are substantially parallel to each other. A stack can typically be mounted on a carrier in an orientation in which the main planes of the stacked dies are parallel to each other and/or to the main plane of the carrier.

A "main plane" of an object, such as a die, a photonic integrated circuit, a substrate, or an integrated circuit, is a plane parallel to a substantially planar surface thereof that has the largest sizes, e.g., length and width, among all exterior surfaces of the object. This substantially planar surface can be referred to as a main surface. The exterior surfaces of the object that have one relatively large size, e.g., length, and one relatively small size, e.g., height, are typically referred to as the edges of the object.

Figure 2:
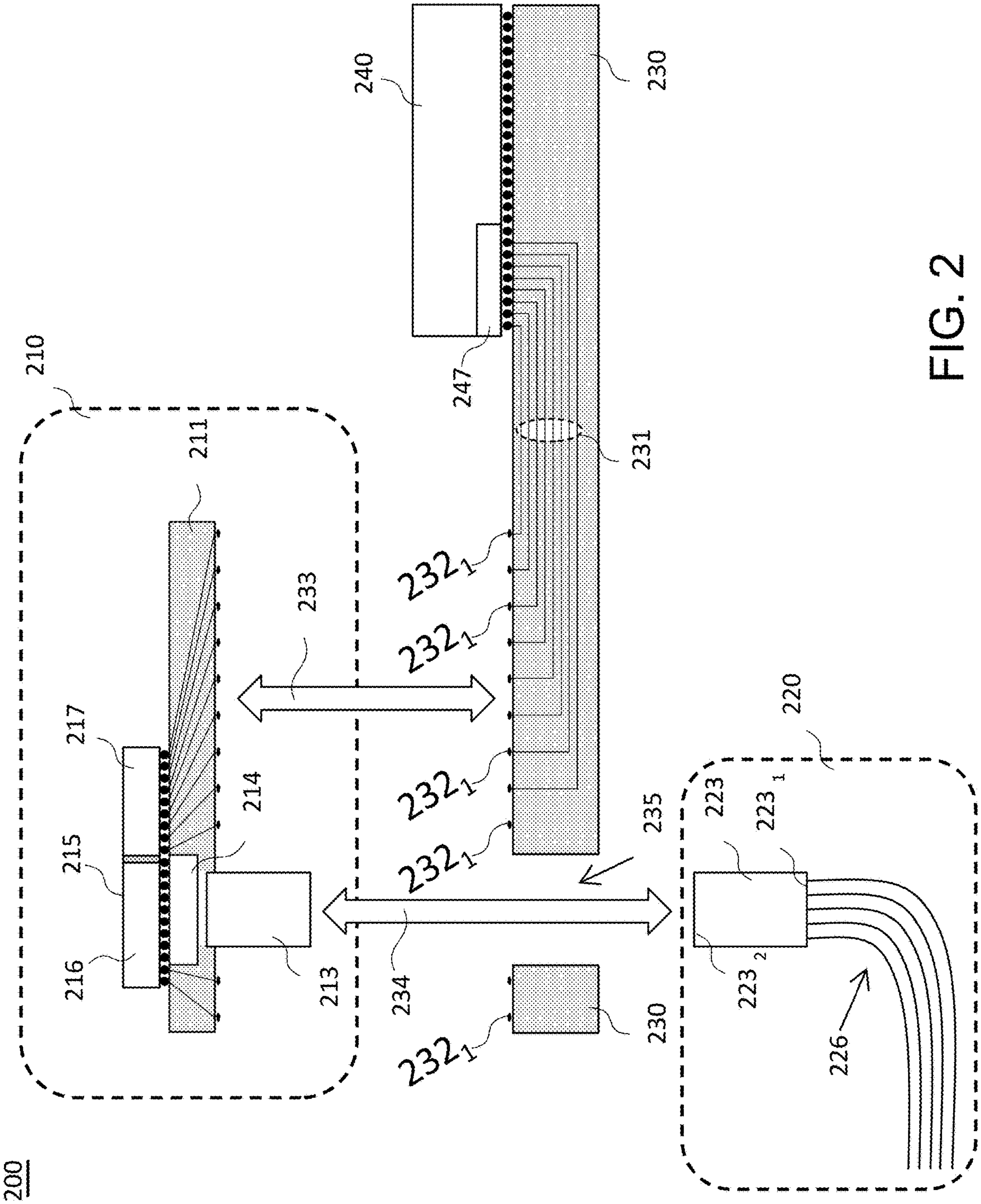
FIG. 2 is a schematic side view of an example data processing system.
Figure 3:
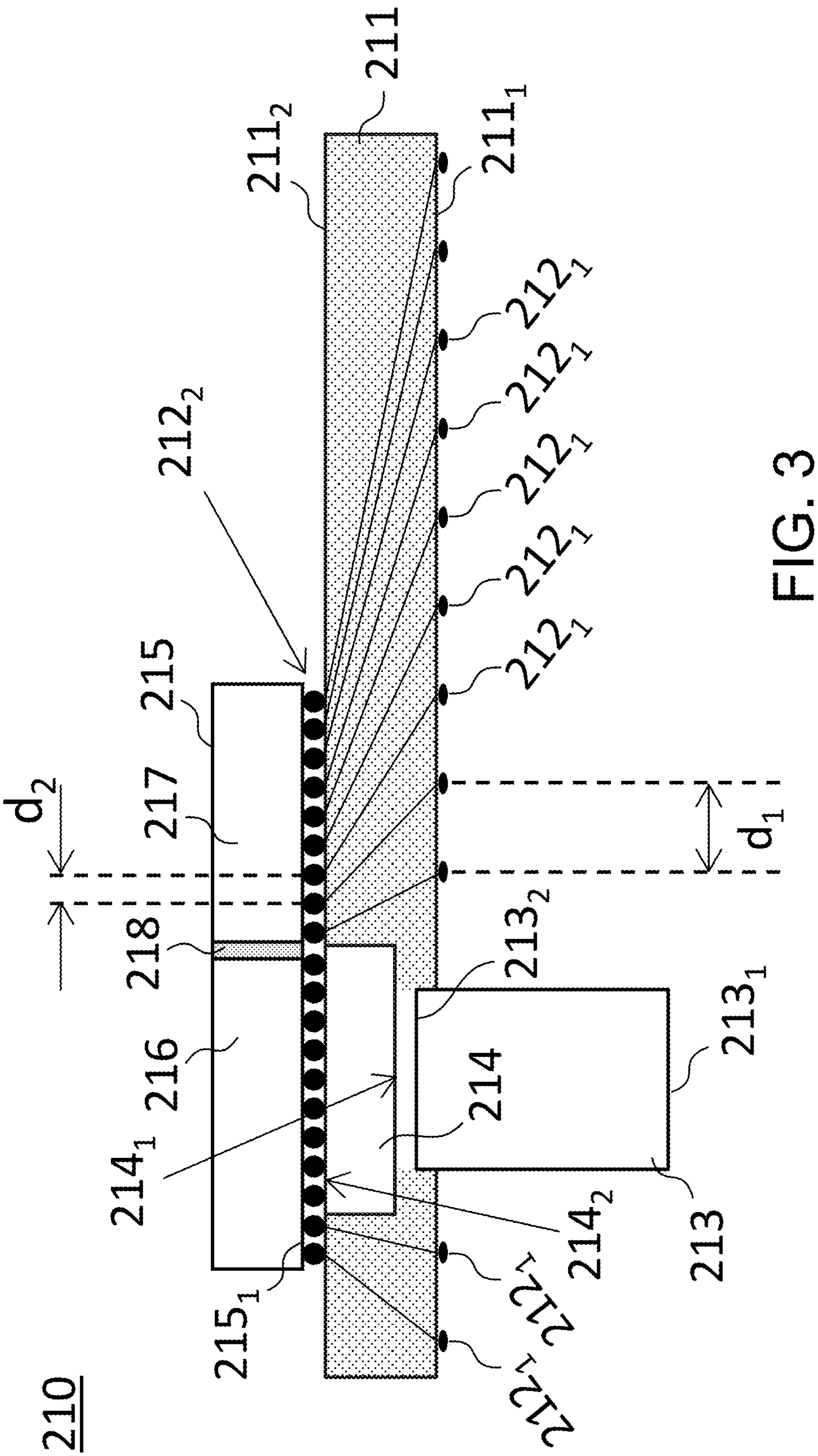
FIG. 3 is a schematic side view of an example integrated optical device.

FIG. 2 is a schematic cross-sectional diagram of a data processing system 200 that includes an integrated optical communication device 210 (also referred to as an optical interconnect module), a fiber-optic connector assembly 220, a package substrate 230, and an electronic processor integrated circuit 240. The data processing system 200 can be used to implement, e.g., one or more of devices 101_1 to 101_6 of FIG. 1. FIG. 3 shows an enlarged cross-sectional diagram of the integrated optical communication device 210.

Referring to FIGS. 2 and 3, the integrated optical communication device 210 includes a substrate 211 having a first main surface 211_1 and a second main surface 211_2. The main surfaces 211_1 and 211_2, respectively, include arrays of electrical contacts 212_1 and 212_2. In some embodiments, the minimum spacing $d_1$ between any two contacts within the array of contacts 212_1 is larger than the minimum spacing $d_2$ between any two contacts within the array of contacts 212_2. In some embodiments the minimum spacing between any two contacts within the array of contacts 212_2 is between 40 and 200 micrometers. In some embodiments, the minimum spacing between any two contacts within the array of contacts 212_1 is between 200 micrometers and 1 millimeter. At least some of the contacts 212_1 are electrically connected through the substrate 211 with at least some of the contacts 212_2. In some embodiments, the contacts 212_1 can be permanently attached to a corresponding array of electrical contacts 232_1 on the package substrate 230. In some embodiments, the contacts 212_1 can include mechanisms to allow the device 210 to be removably connected to the package substrate 230, as indicated by a double arrow 233. For example, the system can include mechanical mechanisms (e.g., one or more snap-on or screw-on mechanisms) to hold the various modules in place. In some embodiments, the contacts 212_1, 212_2, and/or 232_1 can include one or more of solder balls, metal pillars, and/or metal pads, etc. In some embodiments, the contacts 212_1, and/or 232_1 can include one or more of spring-loaded elements, compression interposers, and/or land-grid arrays.

In some embodiments, the integrated optical communication device 210 can be connected to the electronic processor integrated circuit 240 using traces 231 embedded in one or more layers of the package substrate 230. In some embodiments, the processor integrated circuit 240 can include monolithically embedded therein an array of serializers/deserializers (SerDes) 247 electrically coupled to the traces 231. In some embodiments, the processor integrated circuit 240 can include electronic switching circuitry, electronic routing circuitry, network control circuitry, traffic control circuitry, computing circuitry, synchronization circuitry, time stamping circuitry, and data storage circuitry. In some implementations, the processor integrated circuit 240 can be a network switch, a central processing unit, a graphics processor unit, a tensor processing unit, a digital signal processor, or an application specific integrated circuit (ASIC).

Because the electronic processor integrated circuit 240 and the integrated communication device 210 are both mounted on the package substrate 230, the electrical connectors or traces 231 can be made shorter, as compared to mounting the electronic processor integrated circuit 240 and the integrated communication device 210 on separate circuit boards. Shorter electrical connectors or traces 231 can transmit signals that have a higher data rate with lower noise, lower distortion, and/or lower crosstalk.

In some implementations, the electrical connectors or traces can be configured as differential pairs of transmission lines, e.g., in a ground-signal-ground-signal-ground configuration. In some examples, the speed of such signal links can be 10 Gbps or more; 56 Gbps or more; 112 Gbps or more; or 224 Gbps or more.

In some implementations, the integrated optical communication device 210 further includes a first optical connector part 213 having a first surface 213_1 and a second surface 213_2. The connector part 213 is configured to receive a second optical connector part 223 of the fiber-optic connector assembly 220, optically coupled to the connector part 213 through the surfaces 213_1 and 223_2. In some embodiments the connector part 213 can be removably attached to the connector part 223, as indicated by a double-arrow 234, e.g., through a hole 235 in the package substrate 230. In some embodiments the connector part 213 can be permanently attached to the connector part 223. In some embodiments, the connector parts 213 and 223 can be implemented as a single connector element combining the functions of both the connector parts 213 and 223.

In some implementations, the optical connector part 223 is attached to an array of optical fibers 226. In some embodiments, the array of optical fibers 226 can include one or more of: single-mode optical fiber, multi-mode optical fiber, multi-core optical fiber, polarization-maintaining optical fiber, dispersion-compensating optical fiber, hollow-core optical fiber, or photonic crystal fiber. In some embodiments, the array of optical fibers 226 can be a linear (1D) array. In some other embodiments, the array of optical fibers 226 can be a two-dimensional (2D) array. For example, the array of optical fibers 226 can include 2 or more optical fibers, 4 or more optical fibers, 10 or more optical fibers, 100 or more optical fibers, 500 or more optical fibers, or 1000 or more optical fibers. Each optical fiber can include, e.g., 2 or more cores, or 10 or more cores, in which each core provides a distinct light path. Each light path can include a multiplex of, e.g., 2 or more, 4 or more, 8 or more, or 16 or more serial optical signals, e.g., by use of wavelength division multiplexing channels, polarization-multiplexed channels, coherent quadrature-multiplexed channels. The connector parts 213 and 223 are configured to establish light paths through the first main surface 211_1 of the substrate 211. For example, the array of optical fibers 226 can includes n1 optical fibers, each optical fiber can include n2 cores, and the connector parts 213 and 223 can establish n1×n2 light paths through the first main surface 211_1 of the substrate 211. Each light path can include a multiplex of n3 serial optical signals, resulting in a total of n1×n2×n3 serial optical signals passing through the connector parts 213 and 223. In some embodiments, the connector parts 213 and 223 can be implemented, e.g., as disclosed in U.S. patent application Ser. No. 16/816,171.

In some implementations, the integrated optical communication device 210 further includes a photonic integrated circuit 214 having a first main surface 214_1 and a second main surface 214_2. The photonic integrated circuit 214 is optically coupled to the connector part 213 through its first main surface 214_1, e.g., as disclosed in in U.S. patent application Ser. No. 16/816,171. For example, the connector part 213 can be configured to optically couple light to the photonic integrated circuit 214 using optical coupling interfaces, e.g., vertical grating couplers or turning mirrors. In the example above, a total of n1×n2×n3 serial optical signals can be coupled through the connector parts 213 and 223 to the photonic integrated circuit 214. Each serial optical signal is converted to a serial electrical signal by the photonic integrated circuit 214, and each serial electrical signal is transmitted from the photonic integrated circuit 214 to a deserializer unit, or a serializer/deserializer unit, described below.

In some embodiments, the connector part 213 can be mechanically connected (e.g., glued) to the photonic integrated circuit 214. The photonic integrated circuit 214 can contain active and/or passive optical and/or opto-electronic components including optical modulators, optical detectors, optical phase shifters, optical power splitters, optical wavelength splitters, optical polarization splitters, optical filters, optical waveguides, or lasers. In some embodiments, the photonic integrated circuit 214 can further include monolithically integrated active or passive electronic elements such as resistors, capacitors, inductors, heaters, or transistors.

Figure 40A:
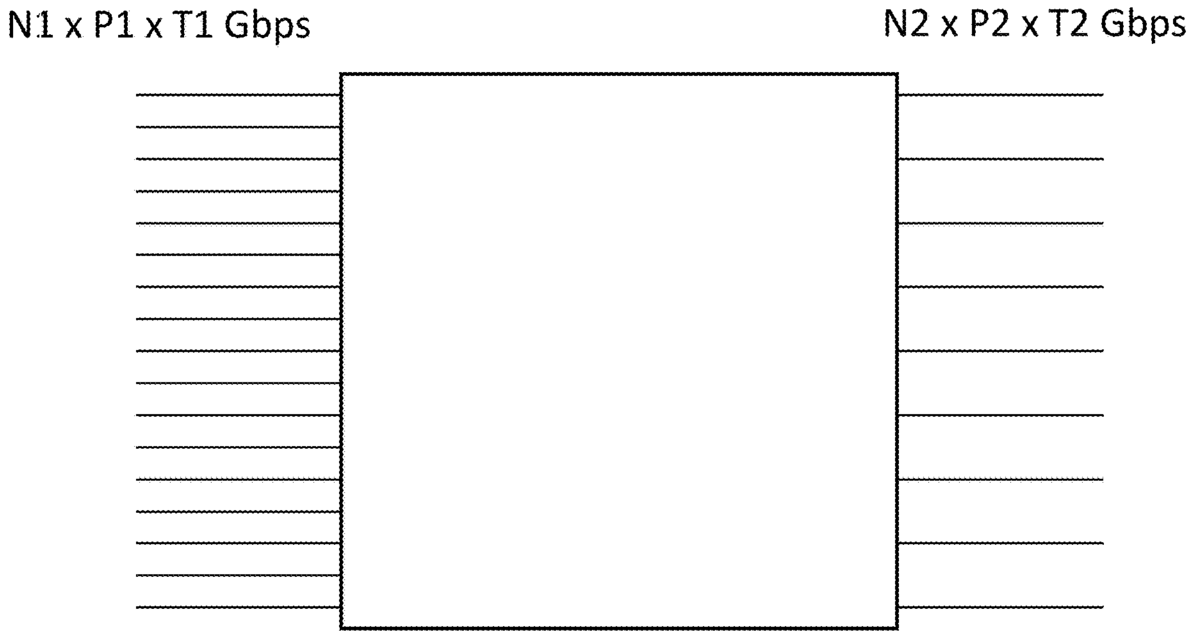
FIGS. 40A, 40B, 41A, 41B, and 42 are diagrams of examples of bus processing units.

In some implementations, the integrated optical communication device 210 further includes an electronic communication integrated circuit 215 configured to facilitate communication between the array of optical fibers 226 and the electronic processor integrated circuit 240. A first main surface 215_1 of the electronic communication integrated circuit 215 is electrically coupled to the second main surface 214_2 of the photonic integrated circuit 214, e.g., through solder bumps, copper pillars, etc. The first main surface 215_1 of the electronic communication integrated circuit 215 is further electrically connected to the second main surface 211_2 of the substrate 211 through the array of electrical contacts 212_2. In some embodiments, the electronic communication integrated circuit 215 can include electrical pre-amplifiers and/or electrical driver amplifiers electrically coupled, respectively, to photodetectors and modulators within the photonic integrated circuit 214 (see also FIG. 14). In some embodiments, the electronic communication integrated circuit 215 can include a first array of serializers/deserializers (SerDes) 216 (also referred to as a serializers/deserializers module) whose serial inputs/outputs are electrically connected to the photodetectors and the modulators of the photonic integrated circuit 214 and a second array of serializers/deserializers 217, whose serial inputs/outputs are electrically coupled to the contacts 212_1 through the substrate 211. Parallel inputs of the array of serializers/deserializers 216 can be connected to parallel outputs of the array of serializers/deserializers 217 and vice versa through a bus processing unit 218, which can be, e.g., a parallel bus of electrical lanes, a cross-connect device, or a re-mapping device (gearbox). For example, the bus processing unit 218 can be configured to enable switching of the signals, allowing the routing of signals to be re-mapped. For example, N×50 Gbps electrical lanes can be remapped into N/2×100 Gbps electrical lanes, N being a positive even integer. An example of a bus processing unit 218 is shown in FIG. 40A.

For example, the electronic communication integrated circuit 215 includes a first serializers/deserializers module that includes multiple serializer units and multiple deserializer units, and a second serializers/deserializers module that includes multiple serializer units and multiple deserializer units. The first serializers/deserializers module includes the first array of serializers/deserializers 216. The second serializers/deserializers module includes the second array of serializers/deserializers 217.

In some implementations, the first and second serializers/deserializers modules have hardwired functional units so that which units function as serializers and which units function as deserializers are fixed. In some implementations, the functional units can be configurable. For example, the first serializers/deserializers module is capable of operating as serializer units upon receipt of a first control signal, and operating as deserializer units upon receipt of a second control signal. Likewise, the second serializers/deserializers module is capable of operating as serializer units upon receipt of a first control signal, and operating as deserializer units upon receipt of a second control signal.

Signals can be transmitted between the optical fibers 226 and the electronic processor integrated circuit 240. For example, signals can be transmitted from the optical fibers 226 to the photonic integrated circuit 214, to the first array of serializers/deserializers 216, to the second array of serializers/deserializers 217, and to the electronic processor integrated circuit 240. Similarly, signals can be transmitted from the electronic processor integrated circuit 240 to the second array of serializers/deserializers 217, to the first array of serializers/deserializers 216, to the photonic integrated circuit 214, and to the optical fibers 226.

In some implementations, the electronic communication integrated circuit 215 is implemented as a first integrated circuit and a second integrated circuit that are electrically coupled each other. For example, the first integrated circuit includes the array of serializers/deserializers 216, and the second integrated circuit includes the array of serializers/deserializers 217.

In some implementations, the integrated optical communication device 210 is configured to receive optical signals from the array of optical fibers 226, generate electrical signals based on the optical signals, and transmit the electrical signals to the electronic processor integrated circuit 240 for processing. In some examples, the signals can also flow from the electronic processor integrated circuit 240 to the integrated optical communication device 210. For example, the electronic processor integrated circuit 240 can transmit electronic signals to the integrated optical communication device 210, which generates optical signals based on the received electronic signals, and transmits the optical signals to the array of optical fibers 226.

In some implementations, the photodetectors of the photonic integrated circuit 214 convert the optical signals transmitted in the optical fibers 226 to electrical signals. In some examples, the photonic integrated circuit 214 can include transimpedance amplifiers for amplifying the currents generated by the photodetectors, and drivers for driving output circuits (e.g., driving optical modulators). In some examples, the transimpedance amplifiers and drivers are integrated with the electronic communication integrated circuit 215. For example, the optical signal in each optical fiber 226 can be converted to one or more serial electrical signals. For example, one optical fiber can carry multiple signals by use of wavelength division multiplexing. The optical signals (and the serial electrical signals) can have a high data rate, such as 50 Gbps, 100 Gbps, or more. The first serializers/deserializers module 216 converts the serial electrical signals to sets of parallel electrical signals. For example, each serial electrical signal can be converted to a set of N parallel electrical signals, in which N can be, e.g., 2, 4, 8, 16, or more. The first serializers/deserializers module 216 conditions the serial electrical signals upon conversion into sets of parallel electrical signals, in which the signal conditioning can include, e.g., one or more of clock and data recovery, and signal equalization. The first serializers/deserializers module 216 sends the sets of parallel electrical signals to the second serializers/deserializers module 217 through the bus processing unit 218. The second serializers/deserializers module 217 converts the sets of parallel electrical signals to high speed serial electrical signals that are output to the electrical contacts 212_2 and 212_1.

Figure 40B:
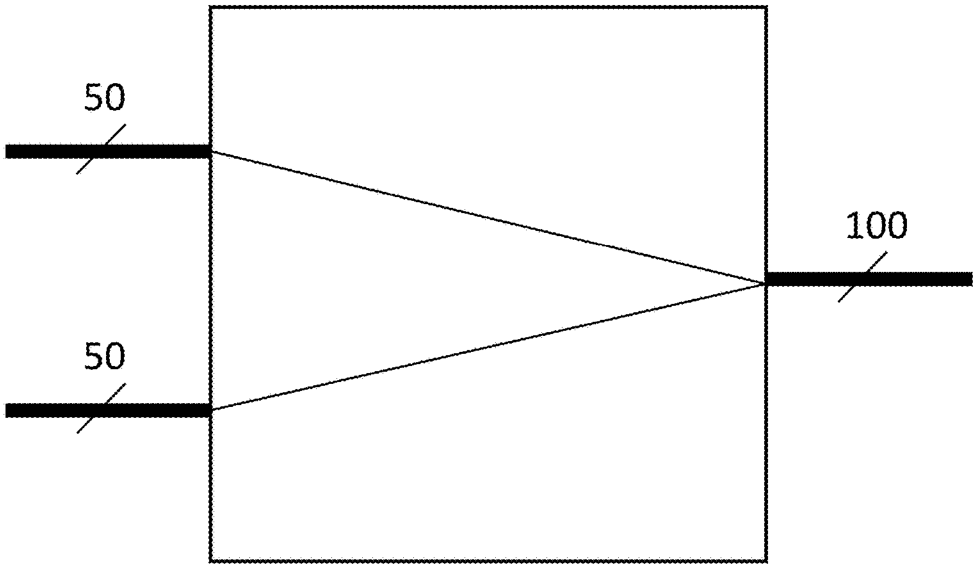

The serializers/deserializers module (e.g., 216, 217) can perform functions such as fixed or adaptive signal pre-distortion on the serialized signal. Also, the parallel-to-serial mapping can use a serialization factor M different from N, e.g., 50 Gbps at the input to the first serializers/deserializers module 216 can become 50×1 Gbps on a parallel bus, and two such parallel buses from two serializers/deserializers modules 216 having a total of 100×1 Gbps can then be mapped to a single 100 Gbps serial signal by the serializers/deserializers module 217. An example of the bus processing unit 218 for performing such mapping is shown in FIG. 40B. Also, the high-speed modulation on the serial side can be different, e.g., the serializers/deserializers module 216 can use 50 Gbps Non-Return-to-Zero (NRZ) modulation whereas the serializers/deserializers module 217 can use 100 Gbps Pulse-Amplitude Modulation 4-Level (PAM4) modulation. In some implementations, coding (line coding or error-correction coding) can be performed at the bus processing unit 218. The first and second serializers/deserializers modules 216 and 217 can be commercially available high quality, low power serializers/deserializers that can be purchased in bulk at a low cost.

In some implementations, the package substrate 230 can include connectors on the bottom side that connects the package substrate 230 to another circuit board, such as a motherboard. The connection can use, e.g., fixed (e.g., by use of solder connection) or removable (e.g., by use of one or more snap-on or screw-on mechanisms). In some examples, another substrate can be provided between the electronic processor integrated circuit 240 and the package substrate 230.

Figure 4:
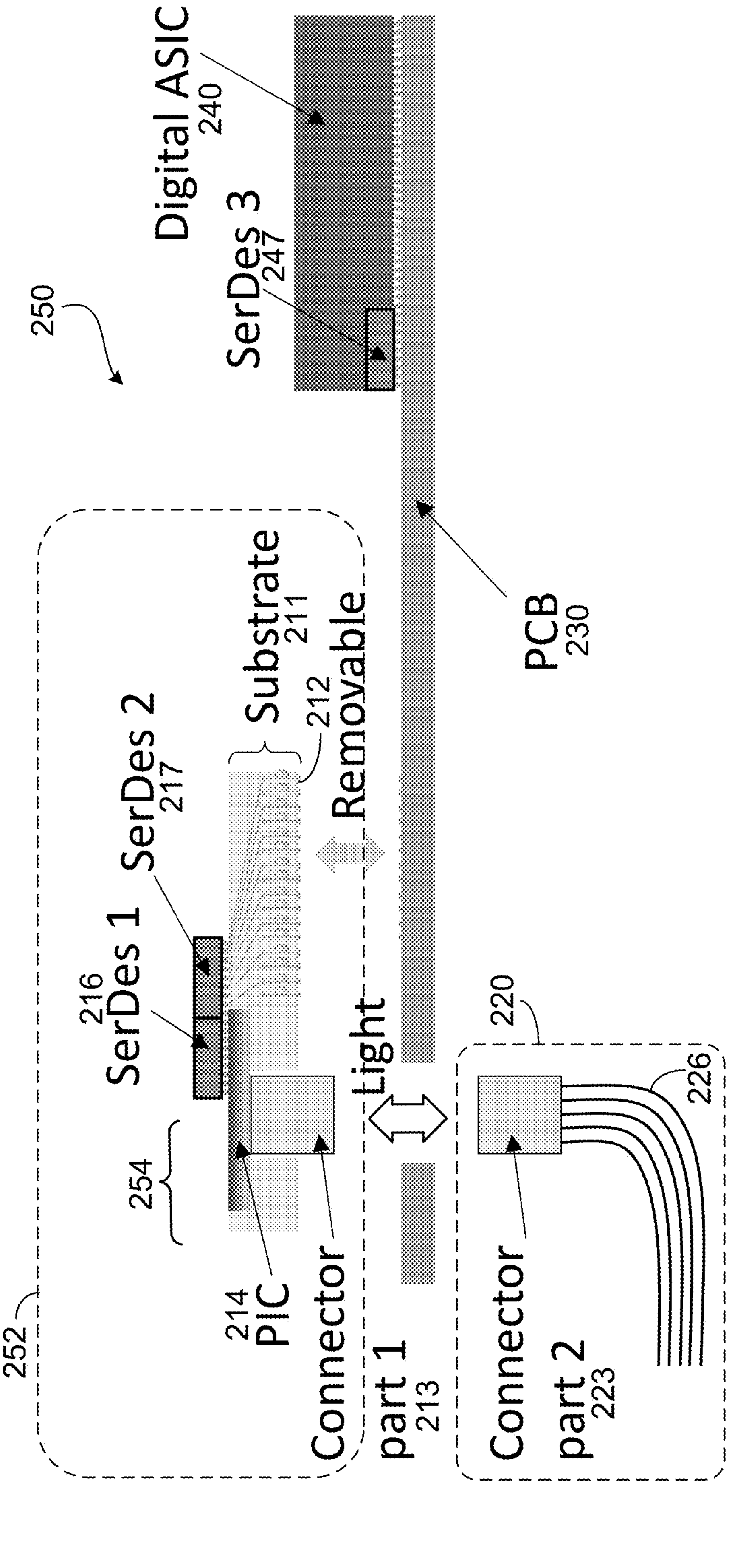
FIG. 4 is a schematic side view of an example data processing system.

Referring to FIG. 4, in some implementations, a data processing system 250 includes an integrated optical communication device 252 (also referred to as an optical interconnect module), a fiber-optic connector assembly 220, a package substrate 230, and an electronic processor integrated circuit 240. The data processing system 250 can be used, e.g., to implement one or more of devices 101_1 to 101_6 of FIG. 1. The integrated optical communication device 252 is configured to receive optical signals, generate electrical signals based on the optical signals, and transmit the electrical signals to the electronic processor integrated circuit 240 for processing. In some examples, the signals can also flow from the electronic processor integrated circuit 240 to the integrated optical communication device 252. For example, the electronic processor integrated circuit 240 can transmit electronic signals to the integrated optical communication device 252, which generates optical signals based on the received electronic signals, and transmits the optical signals to the array of optical fibers 226.

Figure 6:
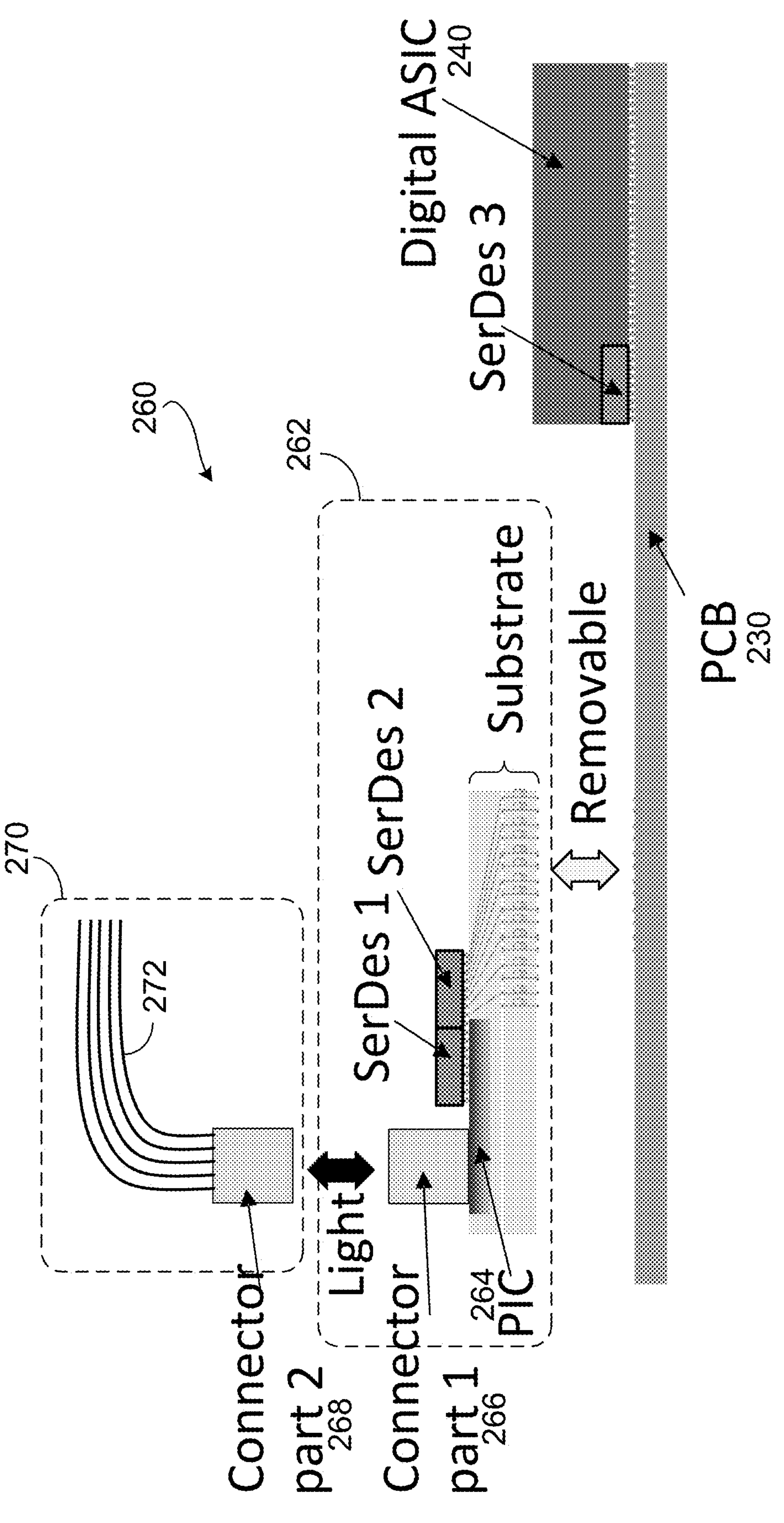
FIGS. 6 and 7 are schematic side views of examples of data processing systems.

The system 250 is similar to the data processing system 200 of FIG. 2 except that in the system 250, in the direction of the cross section of the figure, a portion 254 of the top surface of the photonic integrated circuit 214 is not covered by the first serializers/deserializers module 216 and the second serializers/deserializers module 217. For example, the portion 254 can be used to couple to other electronic components, optical components, or electro-optical components, either from the bottom (as shown in FIG. 4) or from the top (as shown in FIG. 6). In some examples, the first serializers/deserializers module 216 can have a high temperature during operation. The portion 254 is not covered by the first serializers/deserializers module 216 and can be less thermally coupled to the first serializers/deserializers module 216. In some examples, the photonic integrated circuit 214 can include modulators that modulate the phases of optical signals by modifying the temperature of waveguides and thereby modifying the refractive indices of the waveguides. In such devices, using the design shown in the example of FIG. 4 can allow the modulators to operate in a more thermally stable environment.

Figure 5:
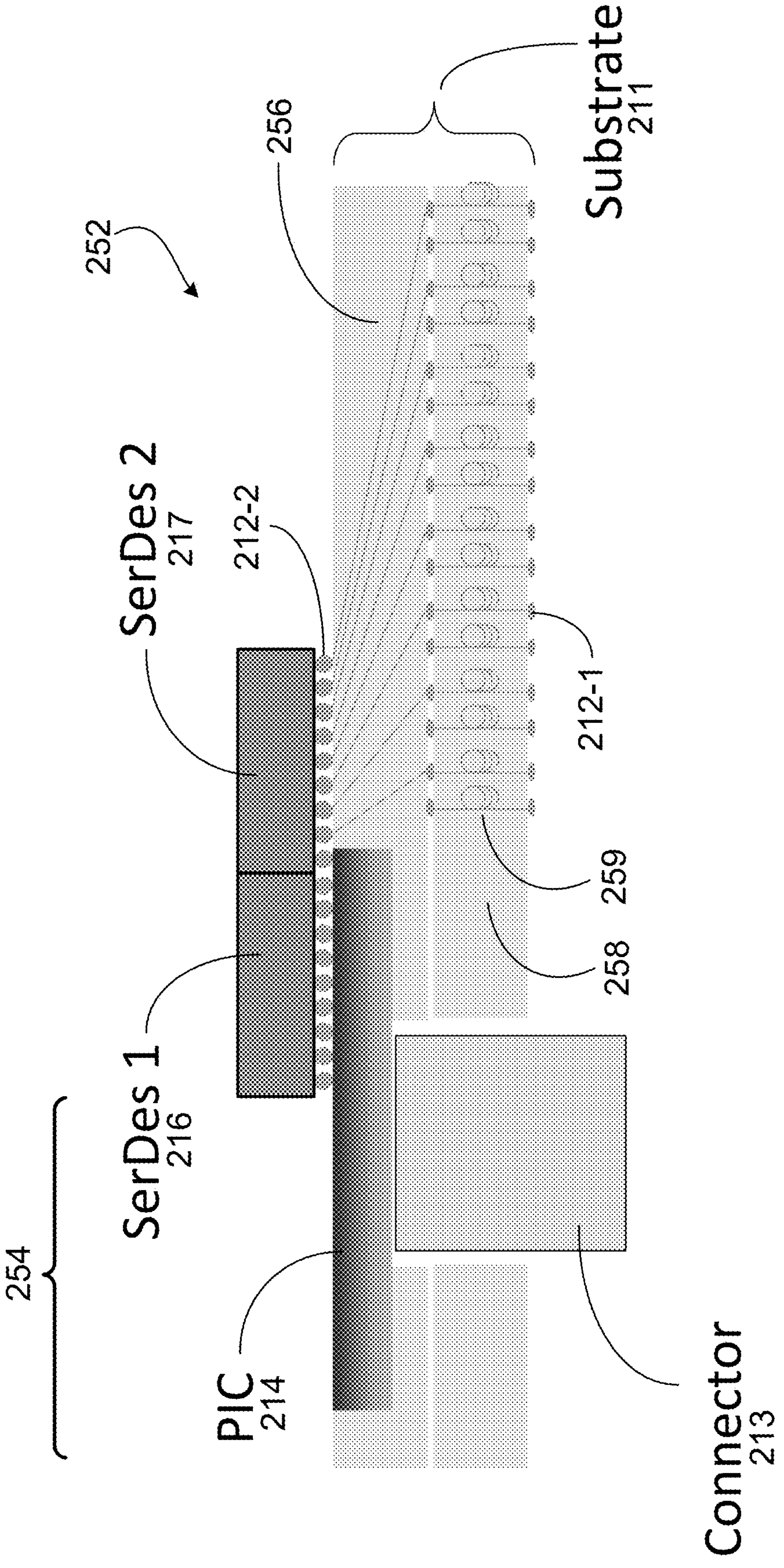
FIG. 5 is a schematic side view of an example integrated optical device.

FIG. 5 shows an enlarged cross-sectional diagram of the integrated optical communication device 252. In some implementations, the substrate 211 includes a first slab 256 and a second slab 258. The first slab 256 provides electrical connectors to fan out the electrical contacts, and the second slab 258 provides a removable connection to the package substrate 230. The first slab 256 includes a first set of contacts arranged on the top surface and a second set of contacts arranged on the bottom surface, in which the first set of contacts has a fine pitch and the second set of contacts has a coarse pitch. The minimum distance between contacts in the second set of contacts is greater than the minimum distance between contacts in the first set of contacts. The second slab 258 can include, e.g., spring-loaded contacts 259.

Referring to FIG. 6, in some implementations, a data processing system 260 includes an integrated optical communication device 262 (also referred to as an optical interconnect module), a fiber-optic connector assembly 270, a package substrate 230, and an electronic processor integrated circuit 240. The data processing system 260 can be used, e.g., to implement one or more of devices 101_1 to 101_6 of FIG. 1. The integrated optical communication device 262 includes a photonic integrated circuit 264. The photonic integrated circuit 264 can include components that perform functions similar to those of the photonic integrated circuit 214 of FIGS. 2-5. The integrated optical communication device 262 further includes a first optical connector part 266 that is configured to receive a second optical connector part 268 of the fiber-optic connector assembly 270. For example, snap-on or screw-on mechanisms can be used to hold the first and second optical connector parts 266 and 268 together.

The connector parts 266 and 268 can be similar to the connector parts 213 and 223, respectively, of FIG. 4. In some examples, the optical connector part 268 is attached to an array of optical fibers 272, which can be similar to the fibers 226 of FIG. 4.

The photonic integrated circuit 264 has a top main surface and bottom main surface. The terms “top” and “bottom” refer to the orientations shown in the figure. It is understood that the devices described in this document can be positioned in any orientation, so for example the “top surface” of a device can be oriented facing downwards or sideways, and the “bottom surface” of the device can be oriented facing upwards or sideways. A difference between the photonic integrated circuit 264 and the photonic integrated circuit 214 (FIG. 4) is that the photonic integrated circuit 264 is optically coupled to the connector part 268 through the top main surface, whereas the photonic integrated circuit 214 is optically coupled to the connector part 213 through the bottom main surface. For example, the connector part 266 can be configured to optically couple light to the photonic integrated circuit 214 using optical coupling interfaces, e.g., vertical grating couplers or turning mirrors, similar to the way that the connector part 213 optically couples light to the photonic integrated circuit 214.

The integrated optical communication devices 252 (FIG. 4) and 262 (FIG. 6) provide flexibility in the design of the data processing systems, allowing the fiber-optic connector assembly 220 or 270 to be positioned on either side of the package substrate 230.

Figure 7:
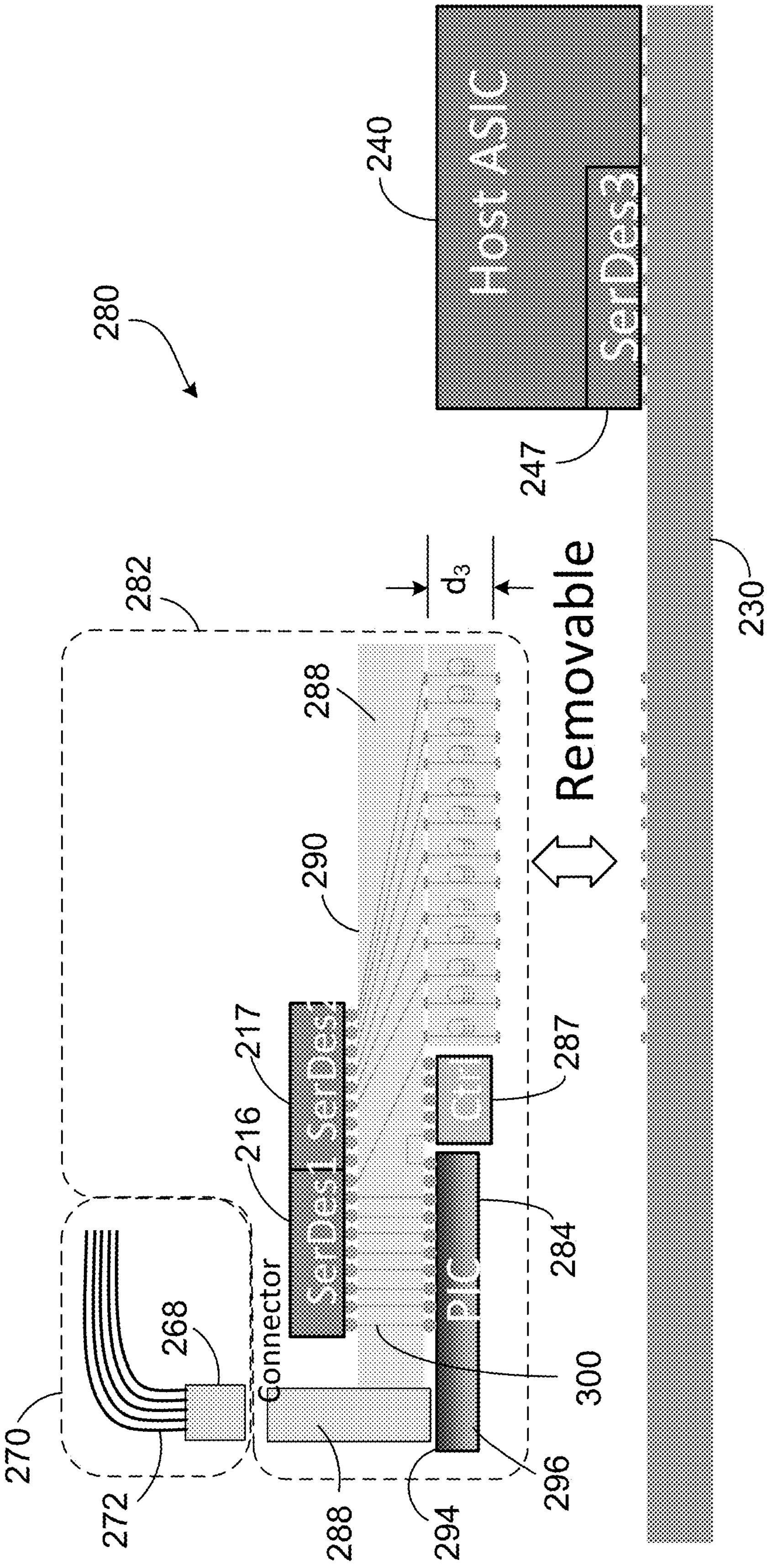

Referring to FIG. 7, in some implementations, a data processing system 280 includes an integrated optical communication device 282 (also referred to as an optical interconnect module), a fiber-optic connector assembly 270, a package substrate 230, and an electronic processor integrated circuit 240. The data processing system 280 can be used, e.g., to implement one or more of devices 101_1 to 101_6 of FIG. 1.

The integrated optical communication device 282 includes a photonic integrated circuit 284, a circuit board 286, a first serializers/deserializers module 216, a second serializers/deserializers module 217, and a control circuit 287. The photonic integrated circuit 284 can include components that perform functions similar to those of the photonic integrated circuit 214 (FIGS. 2-5) and 264 (FIG. 6). The control circuit 287 controls the operation of the photonic integrated circuit 284. For example, the control circuit 287 can control one or more photodetector and/or modulator bias voltages, heater voltages, etc., either statically or adaptively based on one or more sensor voltages that the control circuit 287 can receive from the photonic integrated circuit 284. The integrated optical communication device 282 further includes a first optical connector part 288 that is configured to receive a second optical connector part 268 of the fiber-optic connector assembly 270. The optical connector part 268 is attached to an array of optical fibers 272.

The circuit board 286 has a top main surface 290 and a bottom main surface 292. The photonic integrated circuit 284 has a top main surface 294 and bottom main surface 296. The first and second serializers/deserializers modules 216, 217 are mounted on the top main surface 290 of the circuit board 286. The top main surface 294 of the photonic integrated circuit 284 has electrical terminals that are electrically coupled to corresponding electrical terminals on the bottom main surface 292 of the circuit board 286. In this example, the photonic integrated circuit 284 is mounted on a side of the circuit board 286 that is opposite to the side of the circuit board 286 on which the first and second serializers/deserializers modules 216, 217 are mounted. The photonic integrated circuit 284 is electrically coupled to the first serializers/deserializers 216 by electrical connectors 300 that pass through the circuit board 286 in the thickness direction. In some embodiments, the electrical connectors 300 can be implemented as vias.

The connector part 288 has dimensions that are configured such that the fiber-optic connector assembly 270 can be coupled to the connector part 288 without bumping into other components of the integrated optical communication device 282. The connector part 288 can be configured to optically couple light to the photonic integrated circuit 284 using optical coupling interfaces, e.g., vertical grating couplers or turning mirrors, similar to the way that the connector part 213 or 266 optically couples light to the photonic integrated circuit 214 or 264, respectively.

When the integrated optical communication device 282 is coupled to the package substrate 230, the photonic integrated circuit 284 and the control circuit 287 are positioned between the circuit board 286 and the package substrate 230. The integrated optical communication device 282 includes an array of contacts 298 arranged on the bottom main surface 292 of the circuit board 286. The array of contacts 298 is configured such that after the circuit board 286 is coupled to the package substrate 230, the array of contacts 298 maintains a thickness d3 between the circuit board 286 and the package substrate 230, in which the thickness d3 is slightly larger than the thicknesses of the photonic integrated circuit 284 and the control circuit 287.

Figure 8:
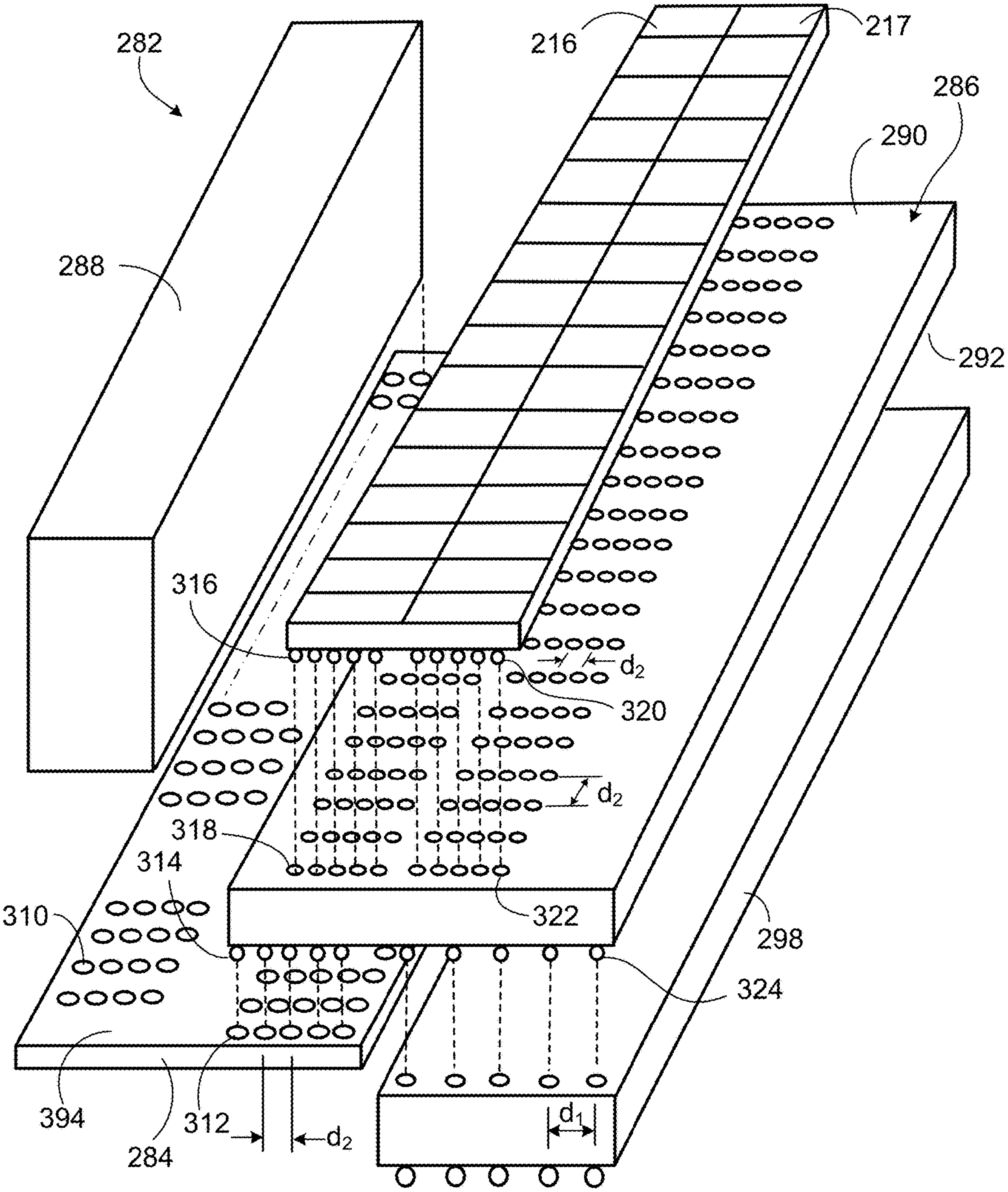
FIG. 8 is an exploded perspective view of an integrated optical communication device.

FIG. 8 is an exploded perspective view of the integrated optical communication device 282 of FIG. 7. The photonic integrated circuit 284 includes an array of optical coupling components 310, e.g., vertical grating couplers or turning mirrors, as disclosed in U.S. patent application Ser. No. 16/816,171, that are configured to optically couple light from the optical connector part 288 to the photonic integrated circuit 214. The optical coupling components 310 are densely packed and have a fine pitch so that optical signals from many optical fibers can be coupled to the photonic integrated circuit 284. For example, the minimum distance between adjacent optical coupling components 310 can be as small as, e.g., 5 μm, 10 μm, 50 μm, or 100 μm.

An array of electrical terminals 312 arranged on the top main surface 294 of the photonic integrated circuit 284 are electrically coupled to an array of electrical terminals 314 arranged on the bottom main surface 292 of the circuit board 286. The array of electrical terminals 312 and the array of electrical terminals 314 have a fine pitch, in which the minimum distance between two adjacent electrical terminals can be as small as, e.g., 10 μm, 40 μm, or 100 μm. An array of electrical terminals 316 arranged on the bottom main surface of the first serializers/deserializers 216 are electrically coupled to an array of electrical terminals 318 arranged on the top main surface 290 of the circuit board 286. An array of electrical terminals 320 arranged on the bottom main surface of the second serializers/deserializers module 217 are electrically coupled an array of electrical terminals 322 arranged on the top main surface 290 of the circuit board 286.

For example, the arrays of electrical terminals 312, 314, 316, 318, 320, and 322 have a fine pitch (or fine pitches). For simplicity of description, in the example of FIG. 8, for each of the arrays of electrical terminals 312, 314, 316, 318, 320, and 322, the minimum distance between adjacent terminals is d2, which can be in the range of, e.g., 10 μm to 200 μm. In some examples, the minimum distance between adjacent terminals for different arrays of electrical terminals can be different. For example, the minimum distance between adjacent terminals for the arrays of electrical terminals 314 (which are arranged on the bottom surface of the circuit board 286) can be different from the minimum distance between adjacent terminals for the arrays of electrical terminals 318 arranged on the top surface of the circuit board 286. The minimum distance between adjacent terminals for the arrays of electrical terminals 316 of the first serializers/deserializers 216 can be different from the minimum distance between adjacent terminals for the arrays of electrical terminals 320 of the second serializers/deserializers module 217.

An array of electrical terminals 324 arranged on the bottom main surface of the circuit board 286 are electrically coupled to the array of contacts 298. The array of electrical terminals 324 can have a coarse pitch. For example, the minimum distance between adjacent electrical terminals is d1, which can be in the range of, e.g., 200 μm to 1 mm. The array of contacts 298 can be configured as a module that maintains a distance that is slightly larger than the thicknesses of the photonic integrated circuit 284 and the control circuit 287 (which is not shown in FIG. 8) between the integrated optical communication device 282 and the package substrate 230 after the integrated optical communication device 282 is coupled to the package substrate 230. The array of contacts 298 can include, e.g., a substrate that has embedded spring loaded connectors.

Figure 9:
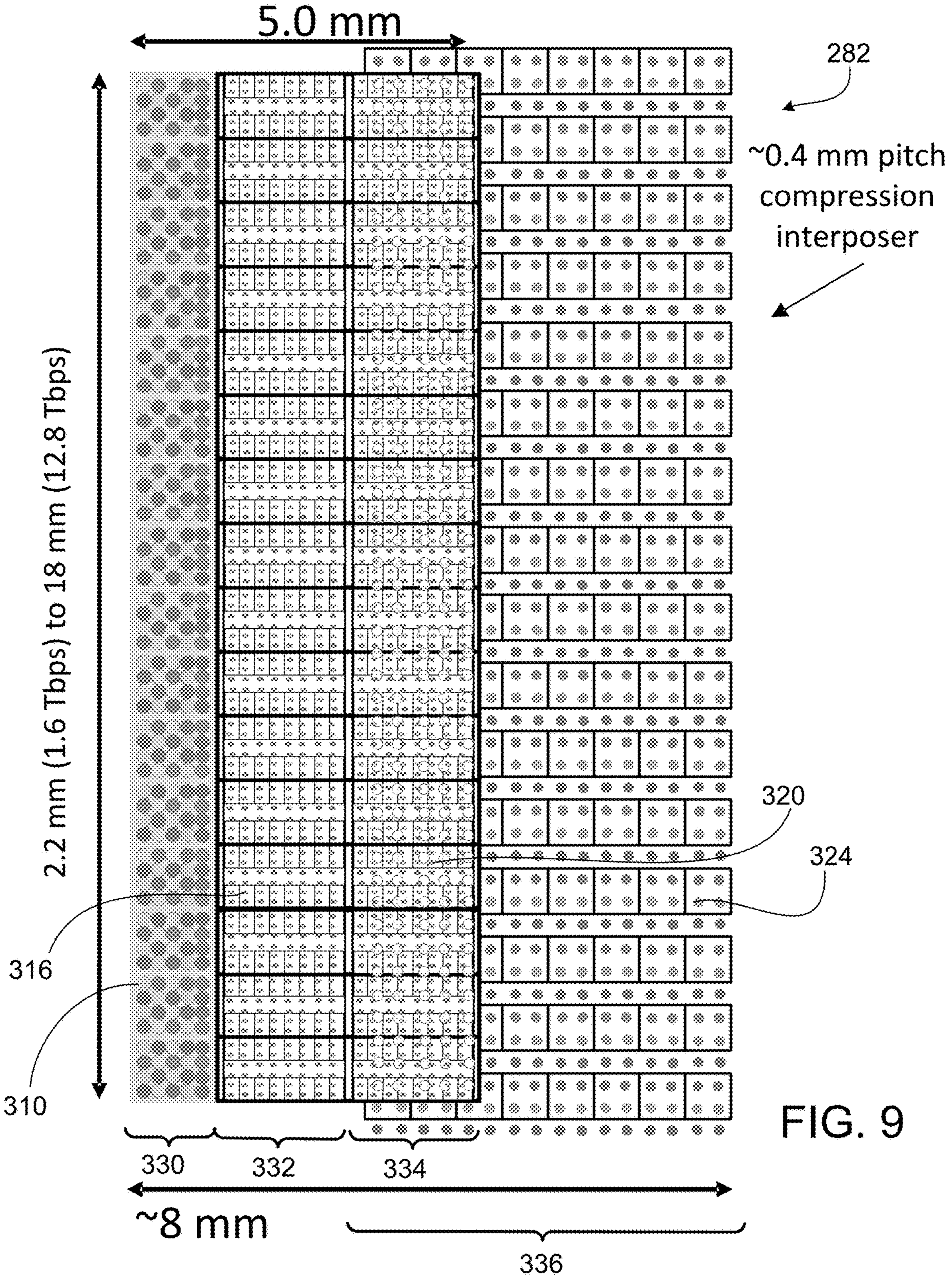
FIGS. 9 and 10 are diagrams of example layout patterns of optical and electrical terminals of integrated optical devices.

FIG. 9 is a diagram of an example layout design for optical and electrical terminals of the integrated optical communication device 282 of FIGS. 7 and 8. FIG. 9 shows the layout of the optical and electrical terminals when viewed from the top or bottom side of the device 282. In this example, the photonic integrated circuit 284 has a width of about 5 mm and a length of about 2.2 mm to 18 mm. For the example in which the length of the photonic integrated circuit 284 is about 2.2 mm, the optical signals provided to the photonic integrated circuit 284 can have a total bandwidth of about 1.6 Tbps. For the example in which the length of the photonic integrated circuit is about 18 mm, the optical signals provided to the photonic integrated circuit can have a total bandwidth of about 12.8 Tbps. The width of the integrated optical communication device 282 can be about 8 mm.

An array 330 of optical coupling components 310 is provided to allow optical signals to be provided to the photonic integrated circuit 284 in parallel. The first serializers/deserializers 216 include an array 332 of electrical terminals 316 arranged on the bottom surface of the first serializers/deserializers 216. The second serializers/deserializers module 217 include an array 334 of electrical terminals 320 arranged on the bottom surface of the second serializers/deserializers module 217. The arrays 332 and 334 of electrical terminals 316, 320 have a fine pitch, and the minimum distance between adjacent terminals can be in the range of, e.g., 40 μm to 200 μm. An array 336 of electrical terminals 324 is arranged on the bottom main surface of the circuit board 286. The array 336 of electrical terminals 324 has a coarse pitch, and the minimum distance between adjacent terminals can be in the range of, e.g., 200 μm to 1 mm. For example, the array 336 of electrical terminals 324 can be part of a compression interposer that has a pitch of about 400 μm between terminals.

Figure 10:
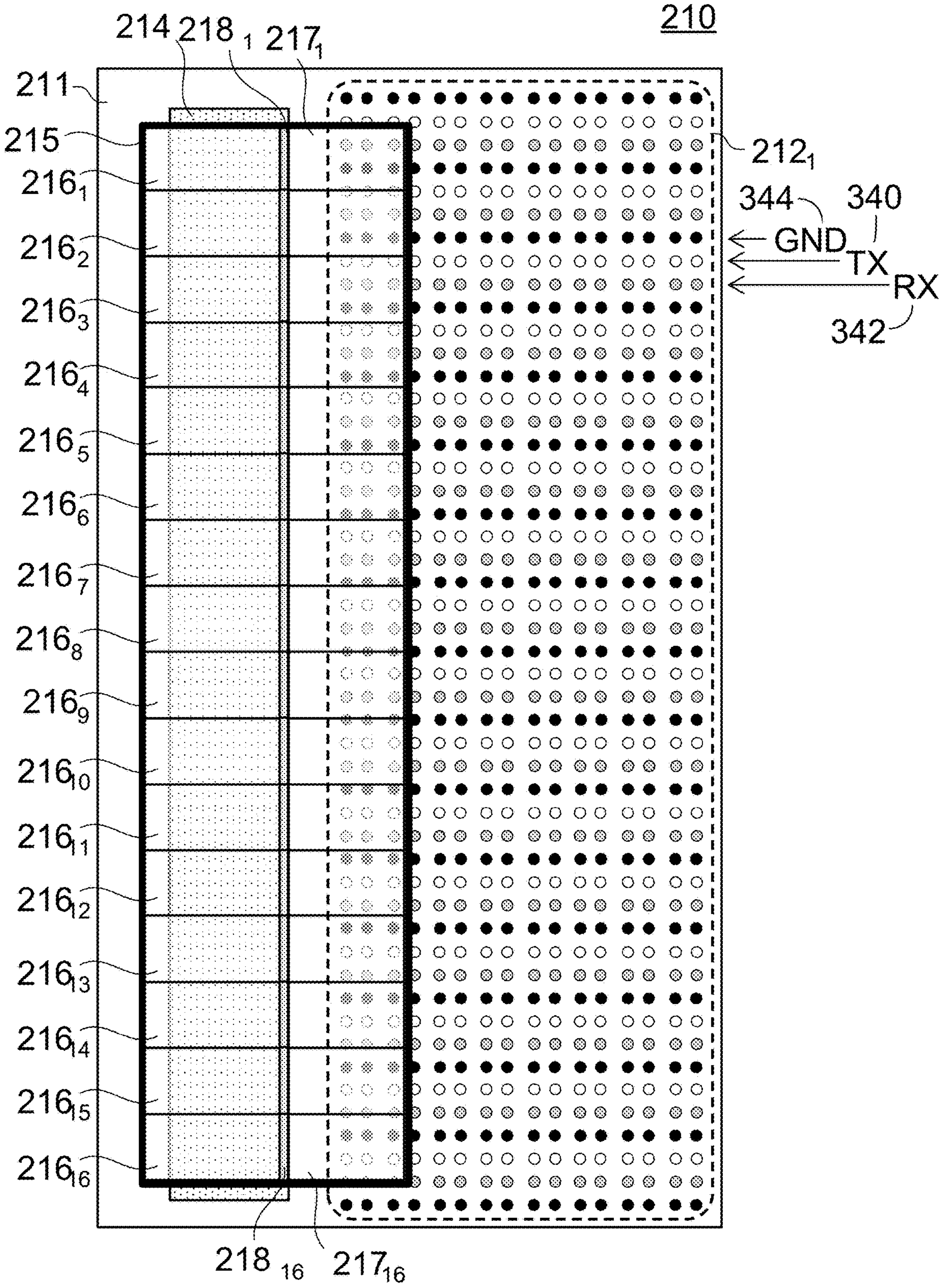

FIG. 10 is a diagram of an example layout design for optical and electrical terminals of the integrated optical communication device 210 of FIG. 2. FIG. 10 shows the layout of the optical and electrical terminals when viewed from the top or bottom side of the device 210. In this embodiment, the photonic integrated circuit 214 is implemented as a single chip. In some embodiments, the photonic integrated circuit 214 can be tiled across multiple chips. Likewise, the electronic communication integrated circuit 215 is implemented as a single chip in this embodiment. In some embodiments, the electronic communication integrated circuit 215 can be tiled cross multiple chips. In this embodiment, the electronic communication integrated circuit 215 is implemented using 16 serializers/deserializers blocks 216_1 to 216_16 that are electrically connected to the photonic integrated circuit 214 and 16 serializers/deserializers blocks 217_1 to 217_16, which are electrically connected to an array of contacts 212_1 by electrical connectors that pass through the substrate 211 in the thickness direction. The 16 serializers/deserializers blocks 216_1 to 216_16 are electrically coupled to the 16 serializers/deserializers blocks 217_1 to 217_16 by bus processing units 218_1 to 218_16, respectively. In this embodiment, each serializers/deserializers block (216 or 217) is implemented using 8 serial differential transmitters (TX) and 8 serial differential receivers (RX). In order to transfer the electrical signals from the serializers/deserializers blocks 217 to ASIC 240, a total of 8×16×2=256 electrical differential signal contacts 212_1 in addition to 8×17×2=272 ground (GND) contacts 212_1 can be used. Other contact arrangements that beneficially reduce crosstalk, e.g., placing a ground contact between every pair of TX and RX contacts, can also be used as will be appreciated by a person skilled in the art. The transmitter contacts are collectively referenced as 340, the receiver contacts are collectively referenced as 342, and the ground contacts are collectively referenced as 344.

The electrical contacts of the serializers/deserializers blocks 216_1 to 216_12 and 217_1 to 217_12 have a fine pitch, and the minimum distance between adjacent terminals can be in the range of, e.g., 40 μm to 200 μm. The electrical contacts 212_1 have a coarse pitch, and the minimum distance between adjacent terminals can be in the range of, e.g., 200 μm to 1 mm.

Figure 11:
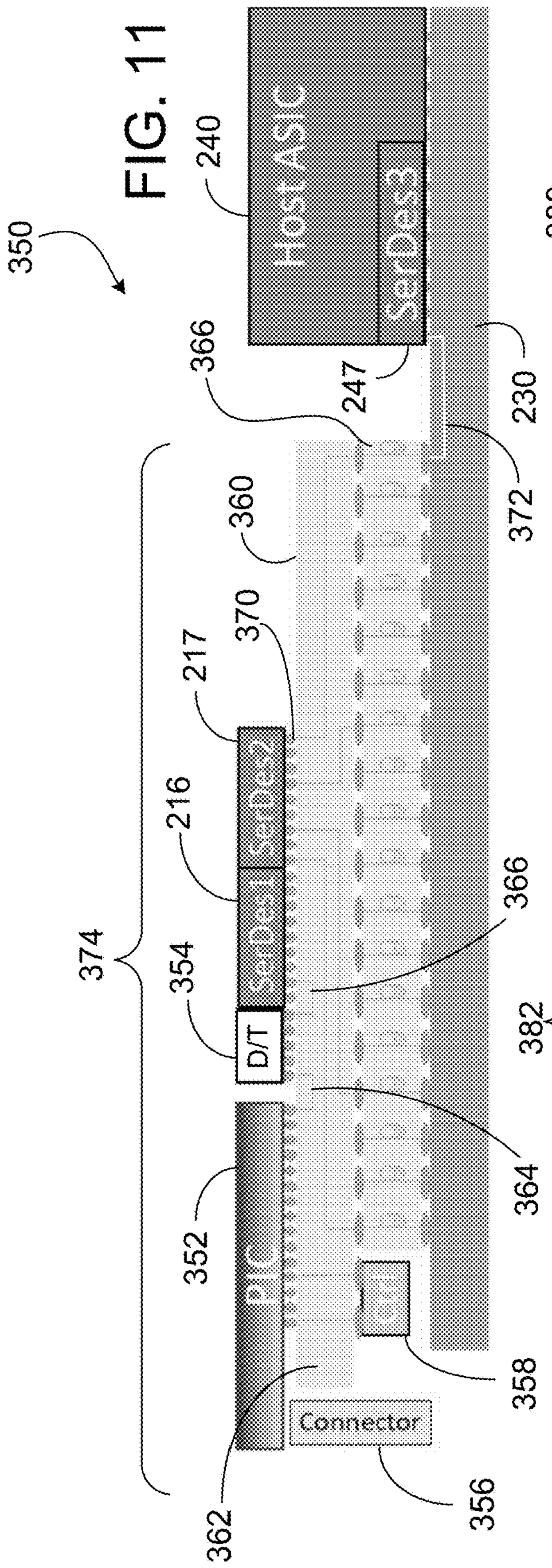
FIGS. 11, 12, 13, and 14 are schematic side views of examples of data processing systems.

FIG. 11 is a schematic side view of an example data processing system 350, which includes an integrated optical communication device 374, a package substrate 230, and a host application specific integrated circuit 240. The integrated optical communication device 374 and the host application specific integrated circuit 240 are mounted on the top side of the package substrate 230. The integrated optical communication device 374 includes a first optical connector 356 that allows optical signals transmitted in optical fibers to be coupled to the integrated optical communication device 374, in which a portion of the optical fibers connected to the first optical connector 356 are positioned at a region facing the bottom side of the package substrate 230.

The integrated optical communication device 374 includes a photonic integrated circuit 352, a combination of drivers and transimpedance amplifiers (D/T) 354, a first serializers/deserializers module 216, a second serializers/deserializers module 217, the first optical connector 356, a control module 358, and a substrate 360. The host application specific integrated circuit 240 includes an embedded third serializers/deserializers module 247.

In this example, the photonic integrated circuit 352, the drivers and transimpedance amplifiers 354, the first serializers/deserializers module 216, and the second serializers/deserializers module 217 are mounted on the top side of the substrate 360. In some embodiments, the drivers and transimpedance amplifiers 354, the first serializers/deserializers module 216, and the second serializers/deserializers module 217 can be monolithically integrated into a single electrical chip. The first optical connector 356 is optically coupled to the bottom side of the photonic integrated circuit 352. The control module 358 is electrically coupled to electrical terminals arranged on the bottom side of the substrate 360, whereas the photonic integrated circuit 352 is connected to electrical terminals arranged on the top side of the substrate 360. The control module 358 is electrically coupled to the photonic integrated circuit 352 through electrical connectors 362 that pass through the substrate 360 in the thickness direction. In some embodiments, the substrate 360 can be removably connected to the package substrate 230, e.g., using a compression interposer or a land grid array.

The photonic integrated circuit 352 is electrically coupled to the drivers and transimpedance amplifiers 354 through electrical connectors 364 on or in the substrate 360. The drivers and transimpedance amplifiers 354 are electrically coupled to the first serializers/deserializers module 216 by electrical connectors 366 on or in the substrate 360. The second serializers/deserializers module 216 has electrical terminals 370 on the bottom side that are electrically coupled to electrical terminals 366 arranged on the bottom side of the substrate 360 through electrical connectors 368 that pass through the substrate 360 in the thickness direction. The electrical terminals 370 have a fine pitch, whereas the electrical terminals 366 have a coarse pitch. The electrical terminals 366 are electrically coupled to the third serializers/deserializers module 247 through electrical connectors or traces 372 on or in the package substrate 230.

In some implementations, optical signals are converted by the photonic integrated circuit 352 to electrical signals, which are conditioned by the first serializers/deserializers module 216 (or the second serializers/deserializers module 217), and processed by the host application specific integrated circuit 240. The host application specific integrated circuit 240 generates electrical signals that are converted by the photonic integrated circuit 352 into optical signals.

Figure 12:
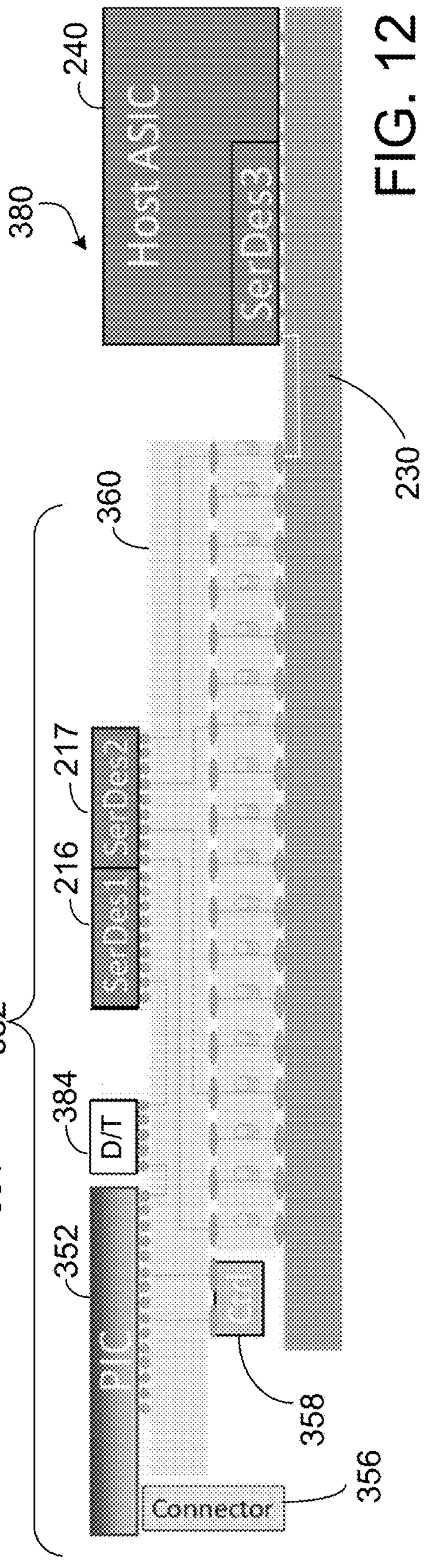

FIG. 12 is a schematic side view of an example data processing system 380, which includes an integrated optical communication device 382, a package substrate 230, and a host application specific integrated circuit 240. The integrated optical communication device 382 is similar to the integrated optical communication device 374 (FIG. 11), except that the transimpedance amplifiers and drivers are implemented in a separate chip 384 from the chip housing the serializers/deserializers modules 216 and 217.

Figure 13:
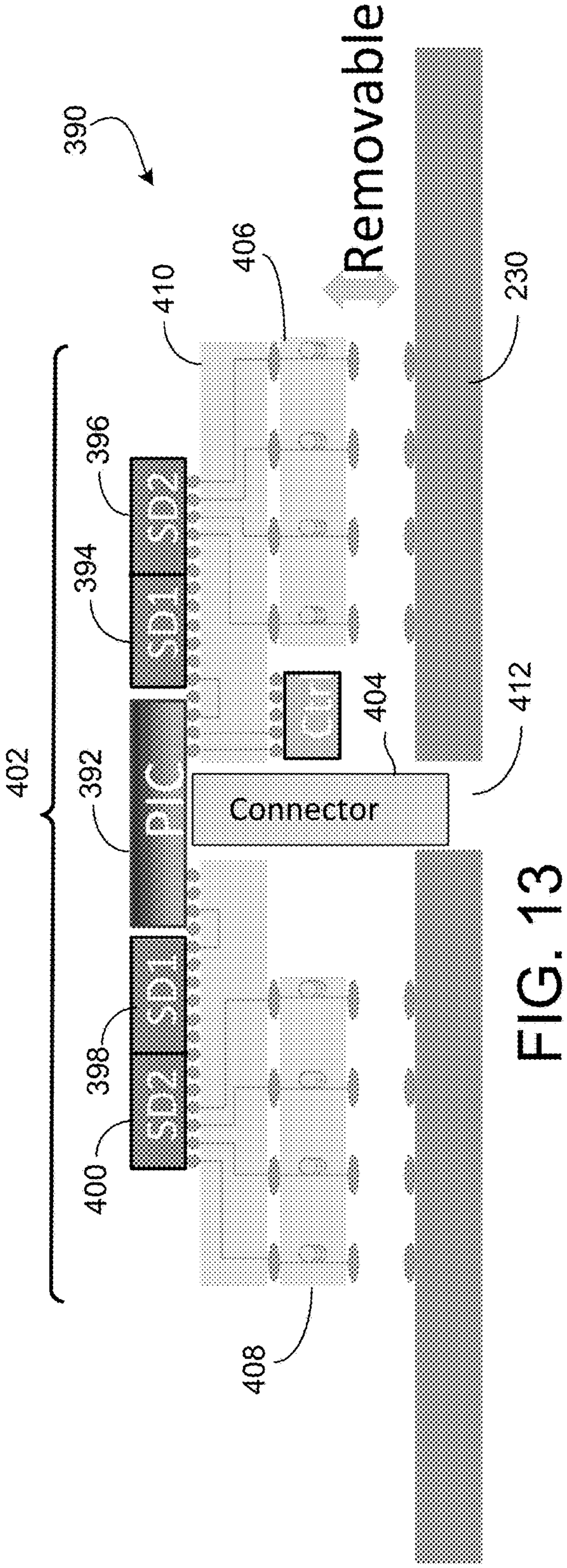

FIG. 13 is a schematic side view of an example data processing system 390 that includes an integrated optical communication device 402, a package substrate 230, and a host application specific integrated circuit (not shown in the figure). The integrated optical communication device 402 includes photonic integrated circuit 392, a first serializers/deserializers module 394, a second serializers/deserializers module 396, a third serializers/deserializers module 398, and a fourth serializers/deserializers module 400 that are mounted on a substrate 410. The photonic integrated circuit 392 can include transimpedance amplifiers and drivers, or such amplifiers and/or drivers can be included in the serializers/deserializers modules 394 and 398. The first serializers/deserializers module 394 and the second serializers/deserializers module 396 are positioned on the right side of the photonic integrated circuit 392. The third serializers/deserializers module 398 and the fourth serializers/deserializers module 400 are positioned on the left side of the photonic integrated circuit 392. Here, the term "left" and "right" refer to the relative positions shown in the figure. It is understood that the system 390 can be positioned in any orientation so that the first serializers/deserializers module 394 and the second serializers/deserializers module 396 are not necessarily at the right side of the photonic integrated circuit 392, and the third serializers/deserializers module 398 and the fourth serializers/deserializers module 400 are not necessarily at the left side of the photonic integrated circuit 392.

The photonic integrated circuit 392 receives optical signals from a first optical connector 404, generates serial electrical signals based on the optical signals, sends the serial electrical signals to the first and second serializers/deserializers modules 394 and 398. The first and second serializers/deserializers modules 394 and 398 generate parallel electrical signals based on the received serial electrical signals, and send the parallel electrical signals to the third and fourth serializers/deserializers modules 396 and 400, respectively. The third and fourth serializers/deserializers modules 396 and 400 generate serial electrical signals based on the received parallel electrical signals, and send the serial electrical signals to electrical terminals 406 and 408, respectively, arranged on the bottom side of the substrate 410.

The first optical connector 404 is optically coupled to the bottom side of the photonic integrated circuit 392. In some embodiments, the optical connector 404 can also be placed on the top of the photonic integrated circuit 392 and couple light to the top side of the photonic integrated circuit 392 (not shown in the figure). The first optical connector 404 is optically coupled to a second optical connector, which in turn is optically coupled to a plurality of optical fibers. In the configuration shown in FIG. 13, the first optical connector 404, the second optical connector, and/or the optical fibers pass through an opening 412 in the package substrate 230. The electrical terminals 406 are arranged on the right side of the first optical connector 404, and the electrical terminals 408 are arranged on the left side of the first optical connector 404. The electrical terminals 406 and 408 are configured such that the substrate 410 can be removably coupled to the package substrate 230.

Figure 14:
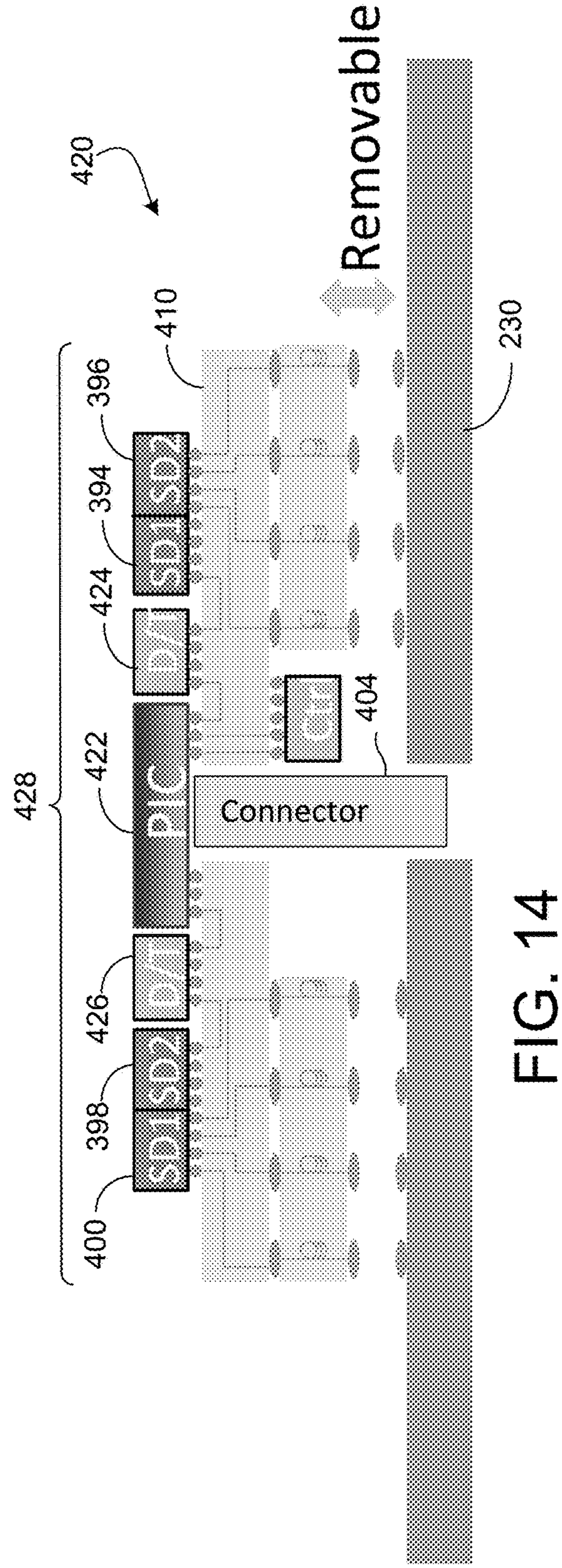

FIG. 14 is a schematic side view of an example data processing system 420 that includes an integrated optical communication device 428, a package substrate 230, and a host application specific integrated circuit (not shown in the figure). The integrated optical communication device 428 includes a photonic integrated circuit 422 (which does not include a transimpedance amplifier and driver), a first serializers/deserializers module 394, a second serializers/deserializers module 396, a third serializers/deserializers module 398, and a fourth serializers/deserializers module 400 that are mounted on a substrate 410. The integrated optical communication device 428 includes a first set of transimpedance amplifiers and driver circuits 424 positioned at the right of the photonic integrated circuit 422, and a second set of transimpedance amplifiers and driver circuits 426 positioned at the left of the photonic integrated circuit 422. The first set of transimpedance amplifiers and driver circuits 424 is positioned between the photonic integrated circuit 422 and a first serializers/deserializers module 394. The second set of transimpedance amplifiers and driver circuits 424 is positioned between the photonic integrated circuit 422 and a third serializers/deserializers module 398.

In some implementations, the integrated optical communication device 402 (or 408) can be modified such that the first optical connector 404 couples optical signals to the top side of the photonic integrated circuit 392 (or 422).

Figure 32:
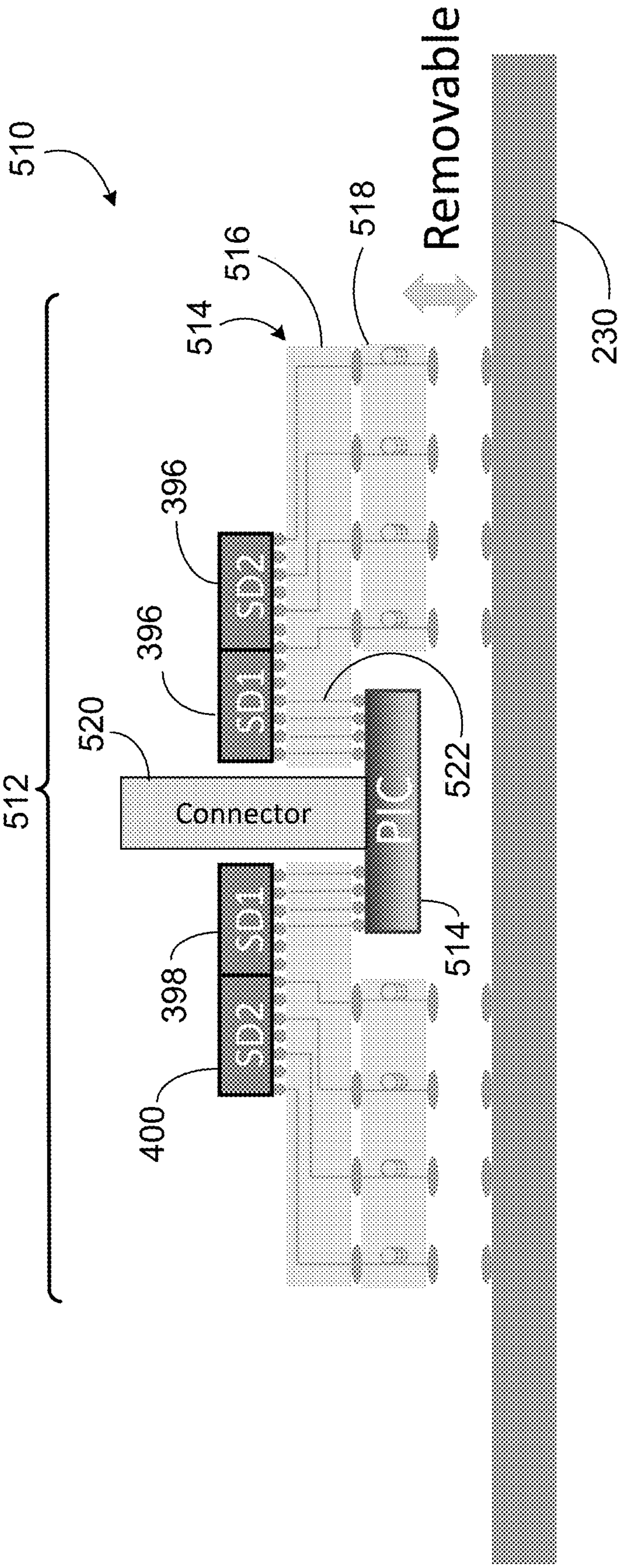
FIG. 32 is a schematic side view of an example data processing system.

FIG. 32 is a schematic side view of an example data processing system 510 that includes an integrated optical communication device 512, a package substrate 230, and a host application specific integrated circuit (not shown in the figure). The integrated optical communication device 512 includes a substrate 514 that includes a first slab 516 and a second slab 518. The first slab 516 provides electrical connectors to fan out the electrical contacts. The first slab 516 includes a first set of contacts arranged on the top surface and a second set of contacts arranged on the bottom surface, in which the first set of contacts has a fine pitch and the second set of contacts has a coarse pitch. The second slab 518 provides a removable connection to the package substrate 230. A photonic integrated circuit 524 is mounted on the bottom side of the first slab 516. A first optical connector 520 passes through an opening in the substrate 514 and couples optical signals to the top side of the photonic integrated circuit 524.

A first serializers/deserializers module 394, a second serializers/deserializers module 396, a third serializers/deserializers module 398, and a fourth serializers/deserializers module 400 are mounted on the top side of the first slab 516. The photonic integrated circuit 524 is electrically coupled to the first and third serializers/deserializers modules 394 and 398 by electrical connectors 522 that pass through the substrate 514 in the thickness direction. For example, the electrical connectors 522 can be implemented as vias. In some examples, drivers and transimpedance amplifiers can be integrated in the photonic integrated circuit 524, or integrated in the serializers/deserializers modules 394 and 398. In some examples, the drivers and transimpedance amplifiers can be implemented in a separate chip (not shown in the figure) positioned between the photonic integrated circuit 524 and the serializers/deserializers modules 394 and 398, similar to the example in FIG. 14. A control chip (not shown in the figure) can be provided to control the operation of the photonic integrated circuit 512.

Figure 15:
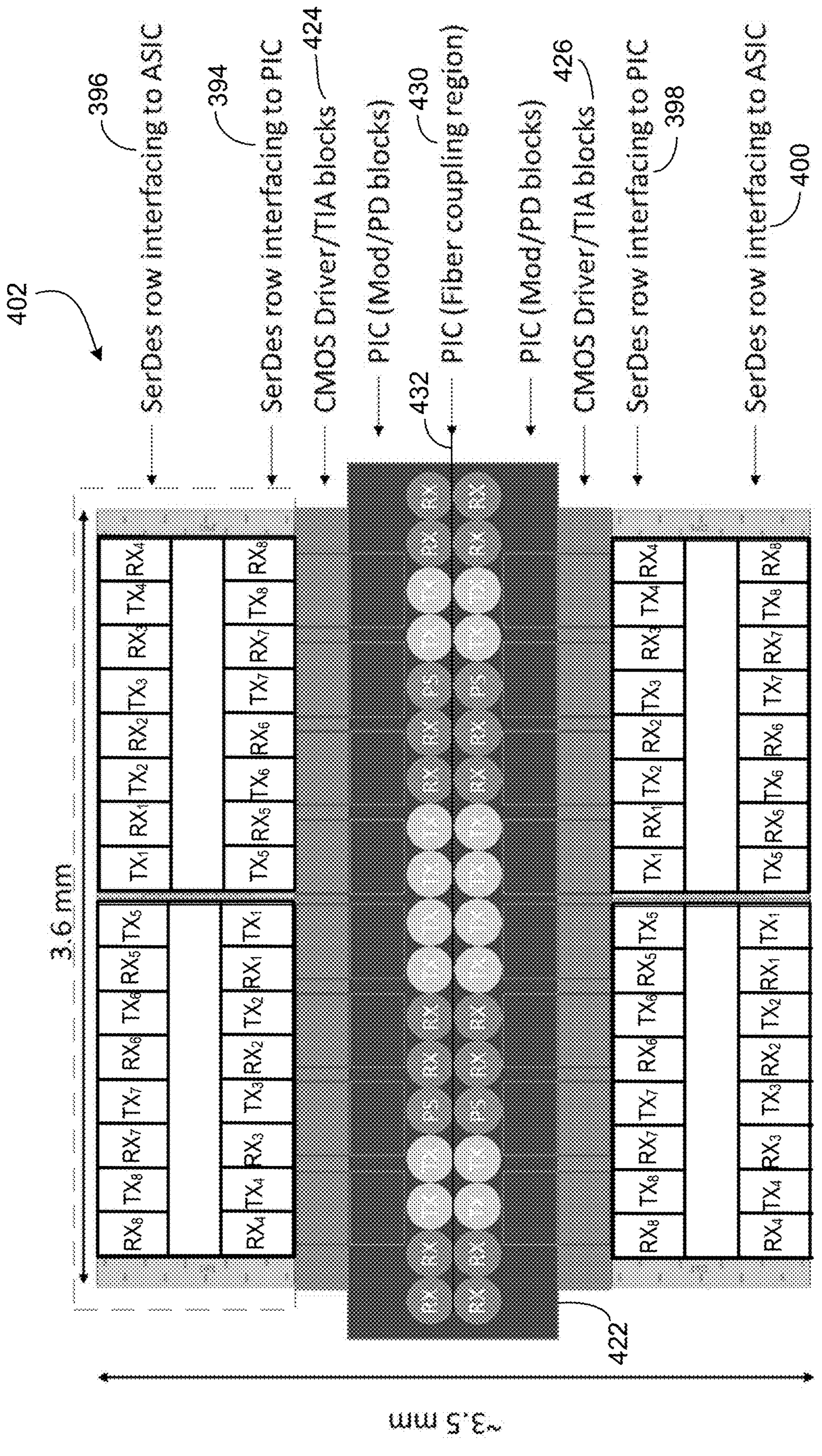
FIGS. 15 and 16 are bottom views of examples of integrated optical devices.

FIG. 15 is a bottom view of an example of the integrated optical communication device 428 of FIG. 14. The photonic integrated circuit 422 includes modulator and photodetector blocks on both sides of a center line 432 in the longitudinal direction. The photonic integrated circuit 422 includes a fiber coupling region 430 arranged either at the bottom side of the photonic integrated circuit 392 or at the top side of the photonic integrated circuit (see FIG. 32), in which the fiber coupling region 430 includes multiple optical coupling elements 310, e.g., receiver optical coupling elements (RX), transmitter optical coupling elements (TX), and remote optical power supply (e.g., 103 in FIG. 1) optical coupling elements (PS).

Complementary metal oxide semiconductor (CMOS) transimpedance amplifier and driver blocks 424 are arranged on the right side of the photonic integrated circuit 424, and CMOS transimpedance amplifier and driver blocks 426 are arranged on the left side of the photonic integrated circuit 424. A first serializers/deserializers module 394 and a second serializers/deserializers module 396 are arranged on the right side of the CMOS transimpedance amplifier and driver blocks 424. A third serializers/deserializers module 398 and a fourth serializers/deserializers module 400 are arranged on the left side of the CMOS transimpedance amplifier and driver blocks 426.

In this example, each of the first, second, third, and fourth serializers/deserializers module 394, 396, 398, 400 includes 8 serial differential transmitter blocks and 8 serial differential receiver blocks. The integrated optical communication device 428 has a width of about 3.5 mm and a length of slightly more than about 3.6 mm.

Figure 16:
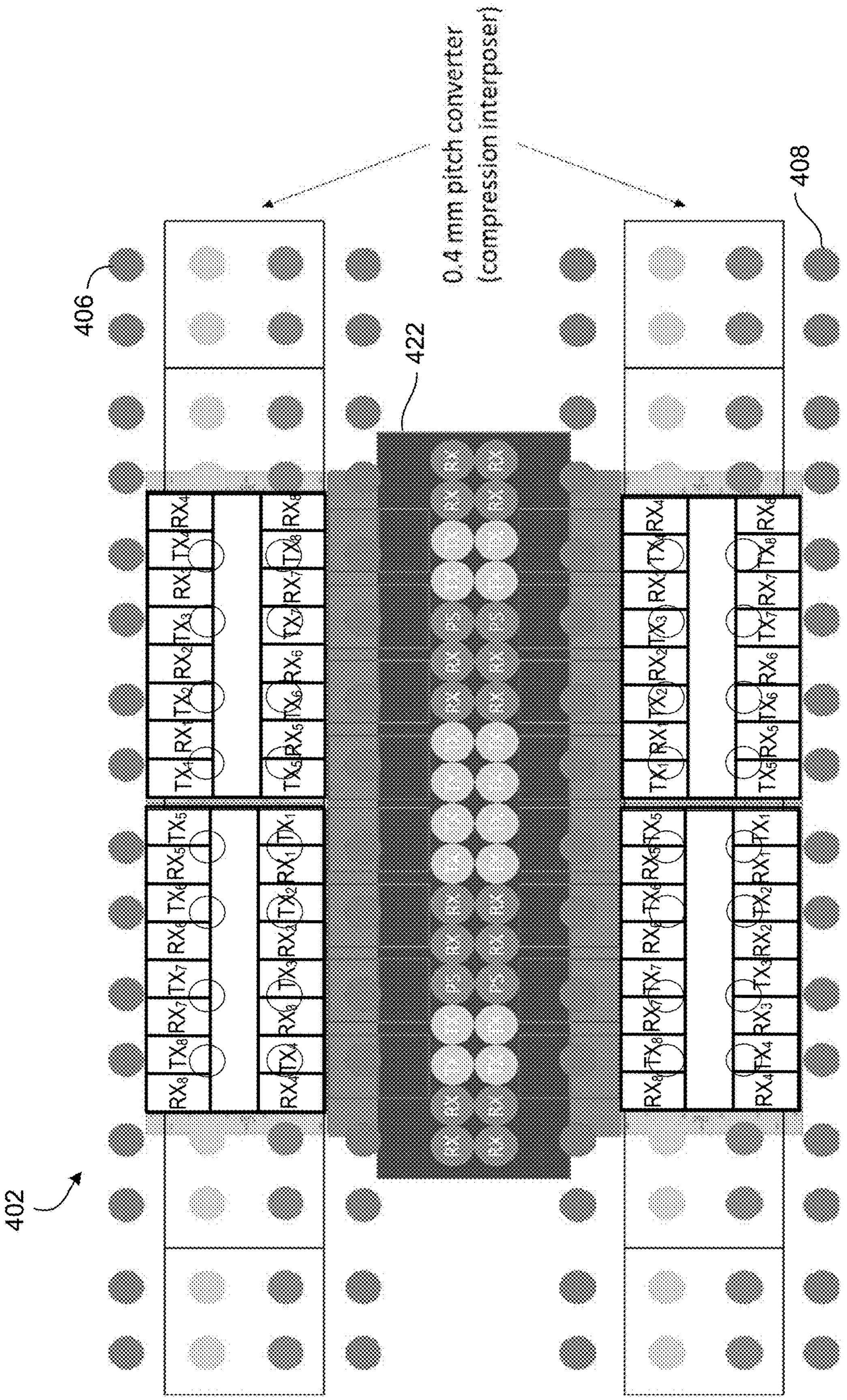

FIG. 16 is a bottom view of an example of the integrated optical communication device 428 of FIG. 14, in which the electrical terminals 406 and 408 are also shown. As shown in the figure, the electrical terminals 406 and 408 have a coarse pitch, the minimum distance between terminals in the array of electrical terminals 406 or 408 is much larger than the minimum distance between terminals in the array of electrical terminals of the first, second, third, and fourth serializers/deserializers modules 394, 396, 398, and 400. For example, the array of electrical terminals 406 and 408 can be part of a compression interposer that has a pitch of about 400 μm between terminals.

Figure 66:
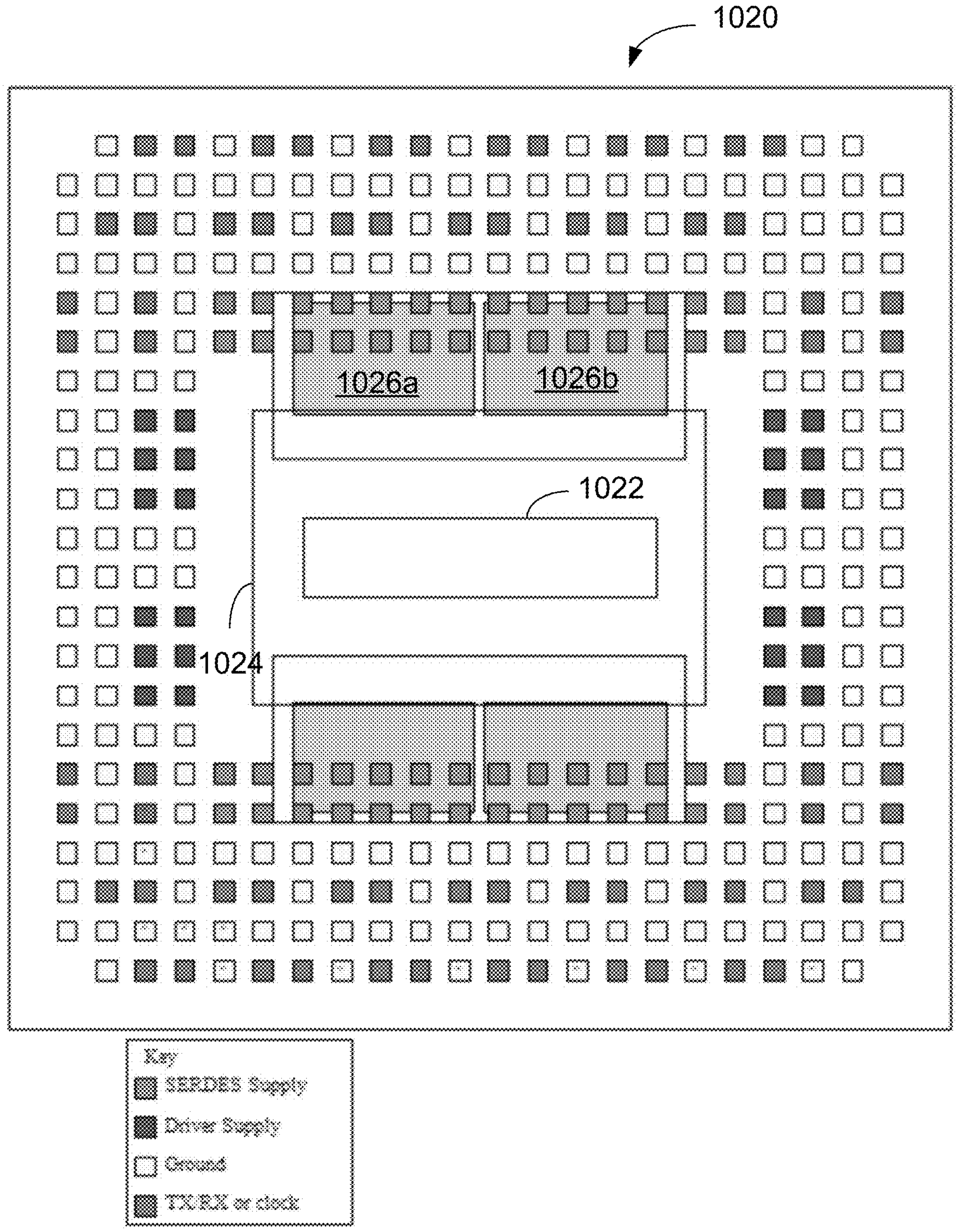
FIG. 66 is a map of electrical contact pads.

In some implementations, the electrical terminals (e.g., 406 and 408) can be arranged in a configuration as shown in FIG. 66. FIG. 66 shows a pad map 1020 that shows the locations of various contact pads as viewed from the bottom of the package. The contact pads occupy an area that is about 9.8 mm×9.8 mm, in which 400 μm pitch pads are used.

The middle rectangle 1022 is a cutout that connects the photonic integrated circuit to the optics that leave from the top of the module. The bigger rectangle 1024 represents the photonic integrated circuit. The two gray rectangles **1026*a*, 1026*b* represent circuitry in a serializers/deserializers chip 1028*a*. The two gray rectangles 1026*c*, 1026*d* represent circuitry in another serializers/deserializers chip 1028*b*. The serializers/deserializers chips are positioned on the top of the package, and the photonic integrated circuit is positioned on the bottom of the package. The overlap between the photonic integrated circuit and the serializers/deserializers chips 1028*a*, 1028*b* is designed so that vias (not shown in the figure) can directly connect these integrated circuits through the package. In some implementations, the serializers/deserializers chips 1028*a*, 1028*b* and/or other electronic integrated circuits can be placed around three or four sides of the optical connector (represented by the rectangle 1022**).

In the examples of the data processing systems shown in FIGS. 2-8, 11-14, and 32, the integrated optical communication device (e.g., 210, 252, 262, 282, 374, 382, 402, 428, 512, which includes the photonic integrated circuit and the serializers/deserializers modules) is mounted on the package substrate 230 on the same side (top side in the examples shown in the figures) as the electronic processor integrated circuit (or host application specific integrated circuit) 240. The data processing systems can also be modified such that the integrated optical communication device is mounted on the package substrate 230 on the opposite side as the electronic processor integrated circuit (or host application specific integrated circuit) 240. For example, the electronic processor integrated circuit 240 can be mounted on the top side of the package substrate 230 and one or more integrated optical communication devices of the form disclosed in FIGS. 2-8, 11-14, and 32 can be mounted on the bottom side of the package substrate 230.

Figure 17:
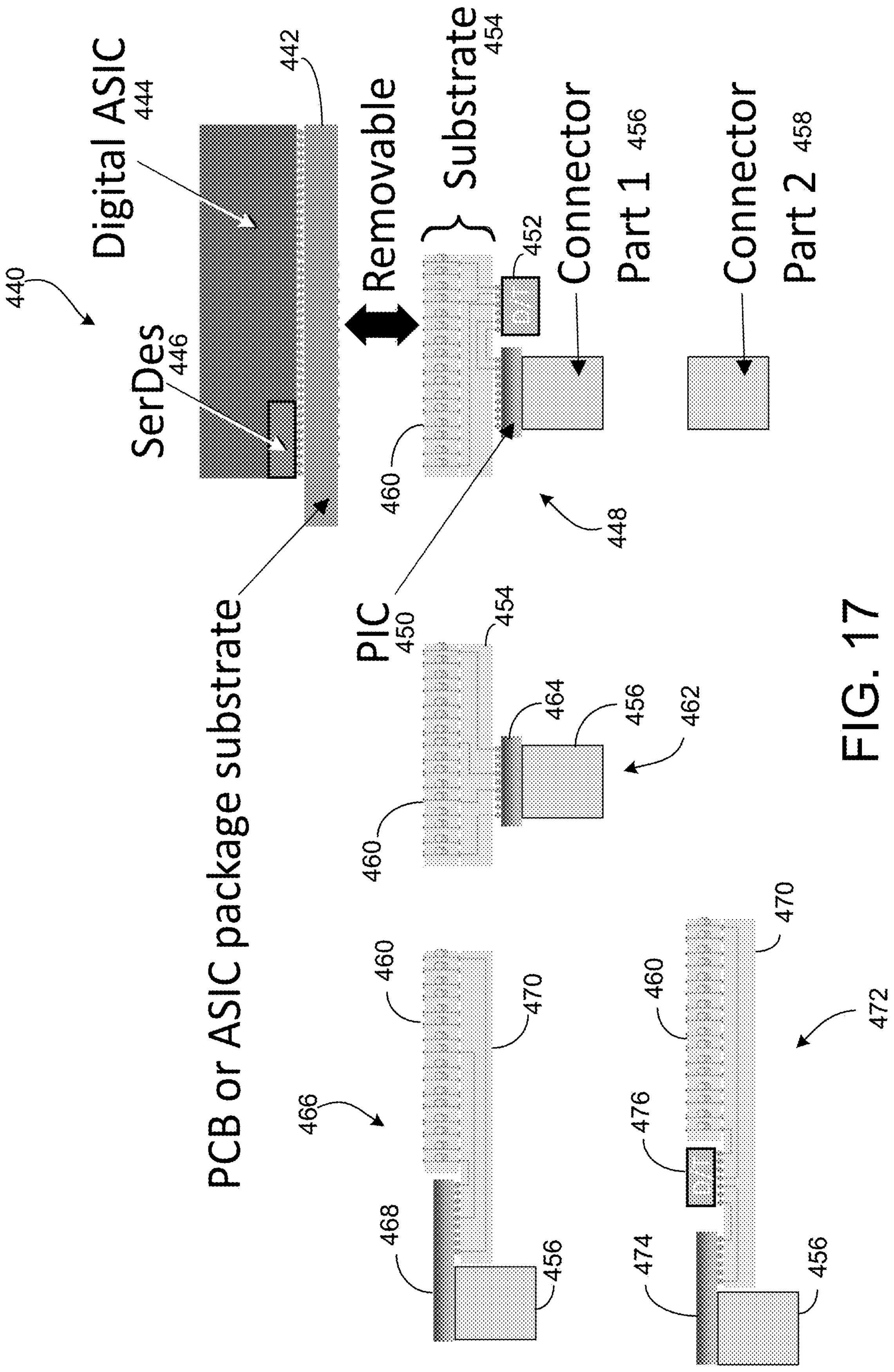
FIG. 17 is a diagram showing various types of integrated optical communication devices that can be used in a data processing system.

FIG. 17 is a diagram showing four types of integrated optical communication devices that can be used in a data processing system 440. In these examples, the integrated optical communication device does not include serializers/deserializers modules. At least some of the signal conditioning is performed by the serializers/deserializers module(s) in the digital application specific integrated circuit. The integrated optical communication device is mounted on the side of the printed circuit board that is opposite to the side on which the digital application specific integrated circuit is mounted, allowing the connectors to be short.

In a first example, the data processing system includes a digital application specific integrated circuit 444 mounted on the top side of a substrate 442, and an integrated optical communication device 448 mounted on the bottom side of the first circuit board. In some implementations, the integrated optical communication device 448 includes a photonic integrated circuit 450 and a set of transimpedance amplifiers and drivers 452 that are mounted on the bottom side of a substrate 454 (e.g., a second circuit board). The top side of the photonic integrated circuit 450 is electrically coupled to the bottom side of the substrate 454. A first optical connector part 456 is optically coupled to the bottom side of the photonic integrated circuit 450. The first optical connector part 456 is configured to be optically coupled to a second optical connector part 458 that is optically coupled to a plurality of optical fibers (not shown in the figure). An array of electrical terminals 460 is arranged on the top side of the substrate 454 and configured to enable the integrated optical communication device 448 to be removably coupled to the substrate 442.

The optical signals from the optical fibers are processed by the photonic integrated circuit 450, which generates serial electrical signals based on the optical signals. The serial electrical signals are amplified by the set of transimpedance amplifiers and drivers 452, which drives the output signals that are transmitted to a serializers/deserializers module 446 embedded in the digital application specific integrated circuit 444.

In a second example, an integrated optical communication device 462 can be mounted on the bottom side of the substrate 442 to provide an optical/electrical communications interface between the optical fibers and the digital application specific integrated circuit 444. The integrated optical communication device 462 includes a photonic integrated circuit 464 that is mounted on the bottom side of a substrate 454 (e.g., a second circuit board). The top side of the photonic integrated circuit 464 is electrically coupled to the bottom side of the substrate 454. A first optical connector part 456 is optically coupled to the bottom side of the photonic integrated circuit 450. An array of electrical terminals 460 is arranged on the top side of the substrate 454 and configured to enable the integrated optical communication device 462 to be removably coupled to the substrate 442. The integrated optical communication device 462 is similar to the integrated optical communication device 448, except that either the photonic integrated circuit 464 or the serializers/deserializers module 446 includes the set of transimpedance amplifiers and driver circuitry. In some examples, the serializers/deserializers module 446 is configured to directly accept electrical signals emerging from photonic integrated circuit 464, e.g., by having a high enough receiver input impedance that converts the photocurrent generated within the photonic integrated circuit 464 to a voltage swing suitable for further electrical processing. For example, the serializers/deserializers module 446 is configured to have a low transmitter output impedance, and provide an output voltage swing that allows direct driving of optical modulators embedded within the photonic integrated circuit 464.

In a third example, an integrated optical communication device 466 can be mounted on the bottom side of the substrate 442 to provide an optical/electrical communications interface between the optical fibers and the digital application specific integrated circuit 444. The integrated optical communication device 466 includes a photonic integrated circuit 468 that is mounted on the top side of a substrate 470 (e.g., a second circuit board). The bottom side of the photonic integrated circuit 468 is electrically coupled to the top side of the substrate 470. A first optical connector part 456 is optically coupled to the bottom side of the photonic integrated circuit 468. An array of electrical terminals 460 is arranged on the top side of the substrate 470 and configured to enable the integrated optical communication device 466 to be removably coupled to the substrate 442. In some examples, either the photonic integrated circuit 468 or the serializers/deserializers module 446 includes the set of transimpedance amplifiers and driver circuitry. In some examples, the serializers/deserializers module 446 is configured to directly accept electrical signals emerging from the photonic integrated circuit 464.

In a fourth example, an integrated optical communication device 472 can be mounted on the bottom side of the substrate 442 to provide an optical/electrical communications interface between the optical fibers and the digital application specific integrated circuit 444. The integrated optical communication device 472 includes a photonic integrated circuit 474 and a set of transimpedance amplifiers and drivers 476 that are mounted on the top side of a substrate 470 (e.g., a second circuit board). The bottom side of the photonic integrated circuit 474 is electrically coupled to the top side of the substrate 470. A first optical connector part 456 is optically coupled to the bottom side of the photonic integrated circuit 468. An array of electrical terminals 460 is arranged on the top side of the substrate 470 and configured to enable the integrated optical communication device 466 to be removably coupled to the substrate 442. The integrated optical communication device 472 is similar to the integrated optical communication device 466, except that neither the photonic integrated circuit 464 nor the serializers/deserializers module 446 include a set of transimpedance amplifiers and driver circuitry, and the set of transimpedance amplifiers and drivers 476 is implemented as a separate integrated circuit.

Figure 18:
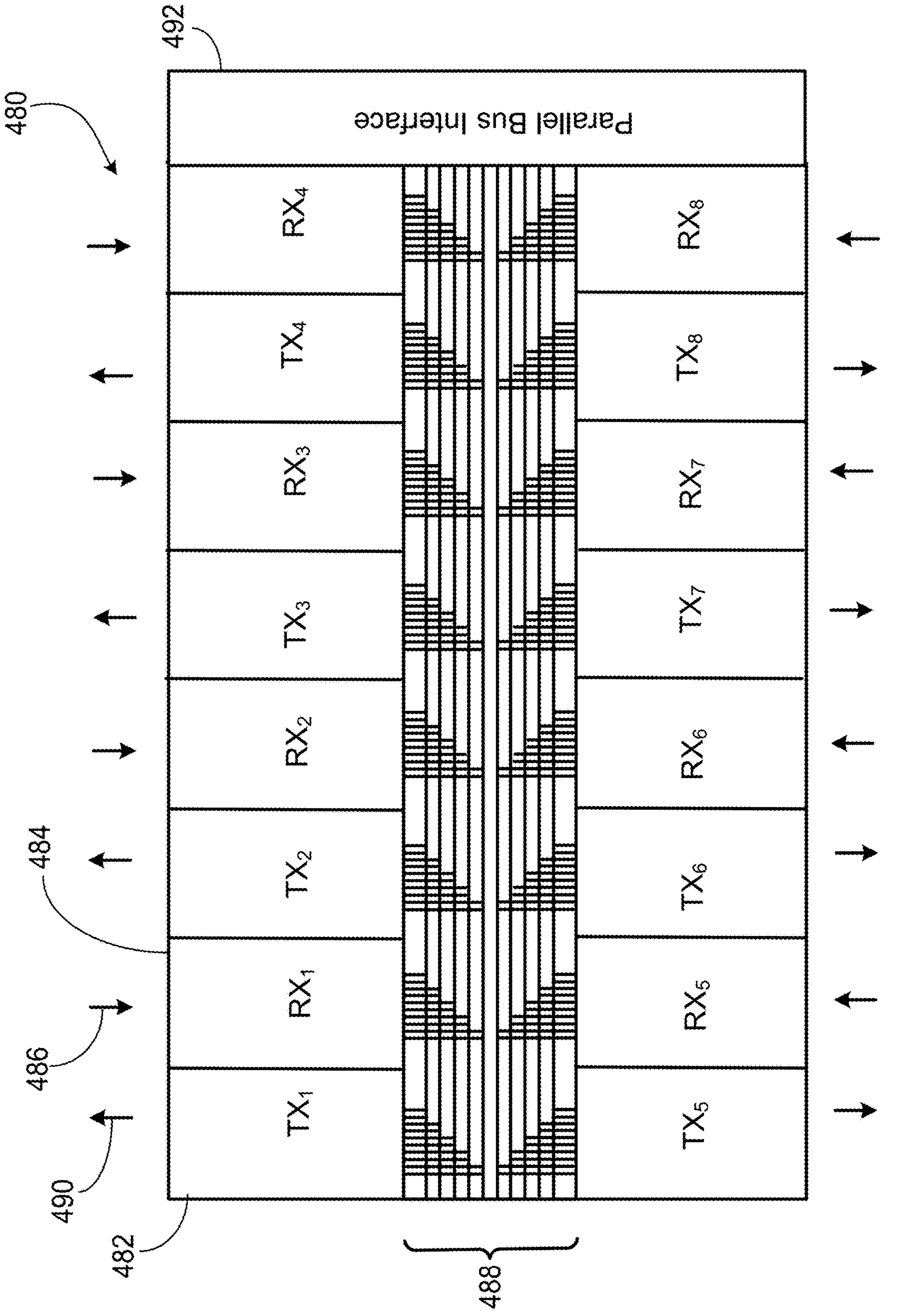
FIG. 18 is a diagram of an example octal serializers/deserializers block.

FIG. 18 is a diagram of an example octal serializers/deserializers block 480 that includes 8 serial differential transmitters (TX) 482 and 8 serial differential receivers (RX) 484. Each serial differential receiver 484 receives a serial differential signal, generates parallel signals based on the serial differential signal, and provides the parallel signals on the parallel bus 488. Each serial differential transmitter 482 receives parallel signals from the parallel bus 488, generates a serial differential signal based on the parallel signals, and provides the serial differential signal on an output electrical terminal 490. The serializers/deserializers block 480 outputs and/or receives parallel signals through a parallel bus interface 492.

In the examples described above, such as those shown in FIGS. 2-14, the integrated optical communication device (e.g., 210, 252, 262, 282, 374, 382, 402, 428) includes a first serializers/deserializers module (e.g., 216, 394, 398) and a second serializers/deserializers module (e.g., 217, 396, 400). The first serializers/deserializers module serially interfaces with the photonic integrated circuit, and the second serializers/deserializers module serially interfaces with the electronic processor integrated circuit or host application specific integrated circuit (e.g., 240). In some implementations, the electronic communication integrated circuit 215 includes an array of serializers/deserializers that can be logically partitioned into a first sub-array of serializers/deserializers and a second sub-array of serializers/deserializers. The first sub-array of serializers/deserializers corresponds to the serializers/deserializers module (e.g., 216, 394, 398), and the second sub-array of serializers/deserializers corresponds to the second serializers/deserializers module (e.g., 217, 396, 400).

Figure 38:
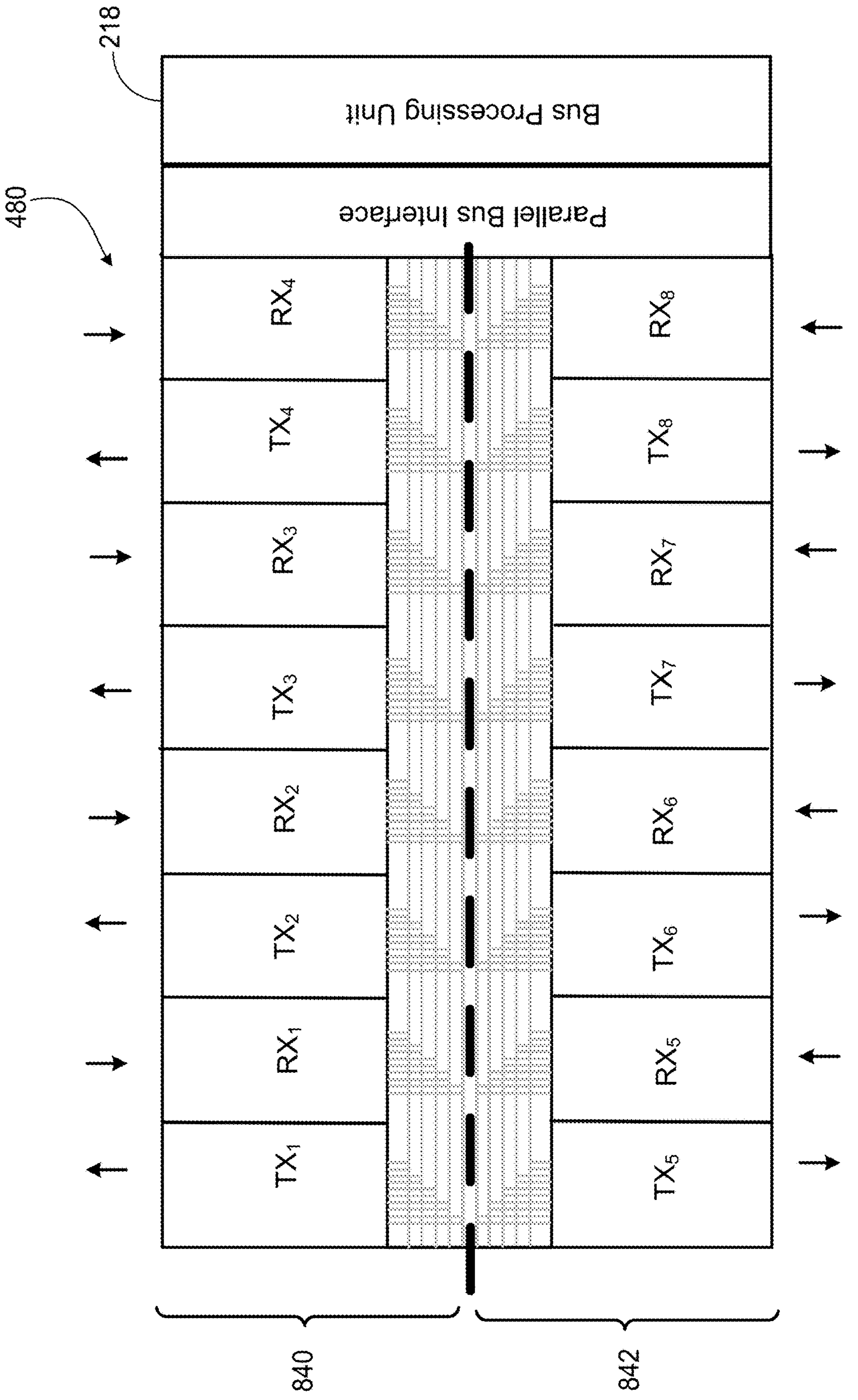
FIGS. 38 and 39 are diagrams of examples of serializers/deserializers blocks.

FIG. 38 is a diagram of an example octal serializers/deserializers block 480 coupled to a bus processing unit 218. The octal serializers/deserializers block 480 includes 8 serial differential transmitters (TX1 to TX8) 482 and 8 serial differential receivers (RX1 to RX4) 484. In some implementations, the transmitters and receivers are partitioned such that the transmitters TX1, TX2, TX3, TX4 and receivers RX1, RX2, RX3, RX4 form a first serializers/deserializers module 840, and the transmitters TX5, TX6, TX7, TX8 and receivers RX5, RX6, RX7, RX8 form a second serializers/deserializers module 842. Serial electrical signals received at the receivers RX1, RX2, RX3, RX4 are converted to parallel electrical signals and routed by the bus processing unit 218 to the transmitters TX5, TX6, TX7, TX8, which convert the parallel electrical signals to serial electrical signals. For example, the photonic integrated circuit can send serial electrical signals to the receivers RX1, RX2, RX3, RX4, and the transmitters TX5, TX6, TX7, TX8 can transmit serial electrical signals to the electronic processor integrated circuit or host application specific integrated circuit.

For example, the bus processing unit 218 can re-map the lanes of signals and perform coding on the signals, such that the bit rate and/or modulation format of the serial signals output from the transmitters TX5, TX6, TX7, TX8 can be different from the bit rate and/or modulation format of the serial signals received at the receivers RX1, RX2, RX3, RX4. For example, 4 lanes of T Gbps NRZ serial signals received at the receivers RX1, RX2, RX3, RX4 can be re-encoded and routed to transmitters TX5, TX6 to output 2 lanes of 2×T Gbps PAM4 serial signals.

Similarly, serial electrical signals received at the receivers RX5, RX6, RX7, RX8 are converted to parallel electrical signals and routed by the bus processing unit 218 to the transmitters TX1, TX2, TX3, TX4, which convert the parallel electrical signals to serial electrical signals. For example, the electronic processor integrated circuit or host application specific integrated circuit can send serial electrical signals to the receivers RX5, RX6, RX7, RX8, and the transmitters TX1, TX2, TX3, TX4 can transmit serial electrical signals to the photonic integrated circuit.

For example, the bus processing unit 218 can re-map the lanes of signals and perform coding on the signals, such that the bit rate and/or modulation format of the serial signals output from the transmitters TX1, TX2, TX3, TX4 can be different from the bit rate and/or modulation format of the serial signals received at the receivers RX5, RX6, RX7, RX8. For example, 2 lanes of 2×T Gbps PAM4 serial signals received at receivers RX5, RX6 can be re-encoded and routed to the transmitters TX5, TX6, TX7, TX8 to output 4 lanes of T Gbps NRZ serial signals.

Figure 39:
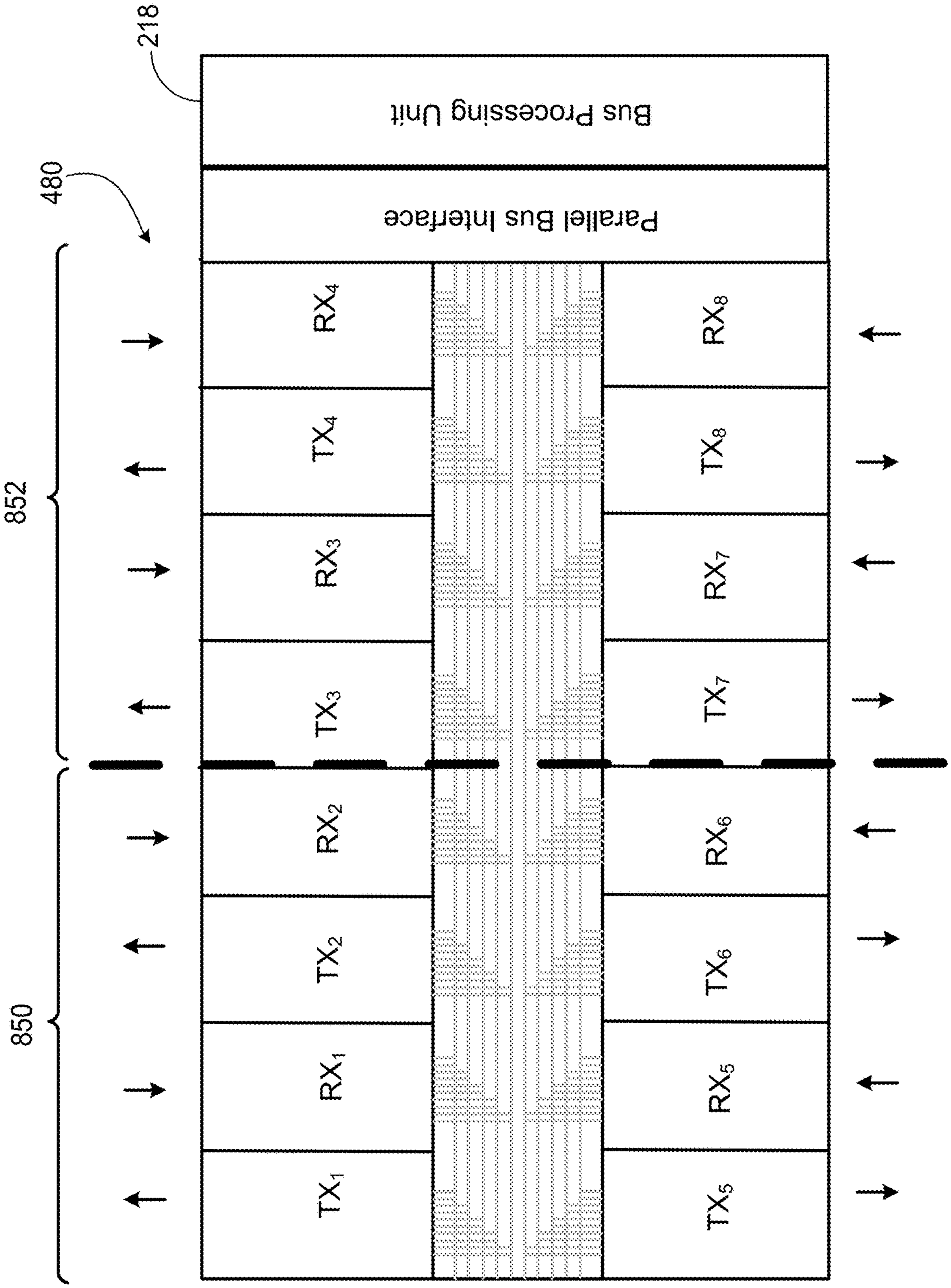

FIG. 39 is a diagram of another example octal serializers/deserializers block 480 coupled to a bus processing unit 218, in which the transmitters and receivers are partitioned such that the transmitters TX1, TX2, TX5, TX6 and receivers RX1, RX2, RX5, RX6 form a first serializers/deserializers module 850, and the transmitters TX3, TX4, TX7, TX8 and receivers RX3, RX4, RX7, RX8 form a second serializers/deserializers module 852. Serial electrical signals received at the receivers RX1, RX2, RX5, RX6 are converted to parallel electrical signals and routed by the bus processing unit 218 to the transmitters TX3, TX4, TX7, TX8, which convert the parallel electrical signals to serial electrical signals. For example, the photonic integrated circuit can send serial electrical signals to the receivers RX1, RX2, RX5, RX6, and the transmitters TX3, TX4, TX7, TX8 can transmit serial electrical signals to the electronic processor integrated circuit or host application specific integrated circuit.

Similarly, serial electrical signals received at the receivers RX3, RX4, RX7, RX8 are converted to parallel electrical signals and routed by the bus processing unit 218 to the transmitters TX1, TX2, TX5, TX6, which convert the parallel electrical signals to serial electrical signals. For example, the electronic processor integrated circuit or host application specific integrated circuit can send serial electrical signals to the receivers RX3, RX4, RX7, RX8, and the transmitters TX1, TX2, TX5, TX6 can transmit serial electrical signals to the photonic integrated circuit.

In some implementations, the bus processing unit 218 can re-map the lanes of signals and perform coding on the signals, such that the bit rate and/or modulation format of the serial signals output from the transmitters TX3, TX4, TX7, TX8 can be different from the bit rate and/or modulation format of the serial signals received at the receivers RX1, RX2, RX5, RX6. Similarly, the bus processing unit 218 can re-map the lanes of signals and perform coding on the signals such that the bit rate and/or modulation format of the serial signals output from the transmitters TX1, TX2, TX5, TX6 can be different from the bit rate and/or modulation format of the serial signals received at the receivers RX4, RX4, RX7, RX8.

FIGS. 38 and 39 show two examples of how the receivers and transmitters can be partitioned to form the first serializers/deserializers module and the second serializers/deserializers module. The partitioning can be arbitrarily determined based on application, and is not limited to the examples shown in FIGS. 38 and 39. The partitioning can be programmable and dynamically changed by the system.

Figure 19:
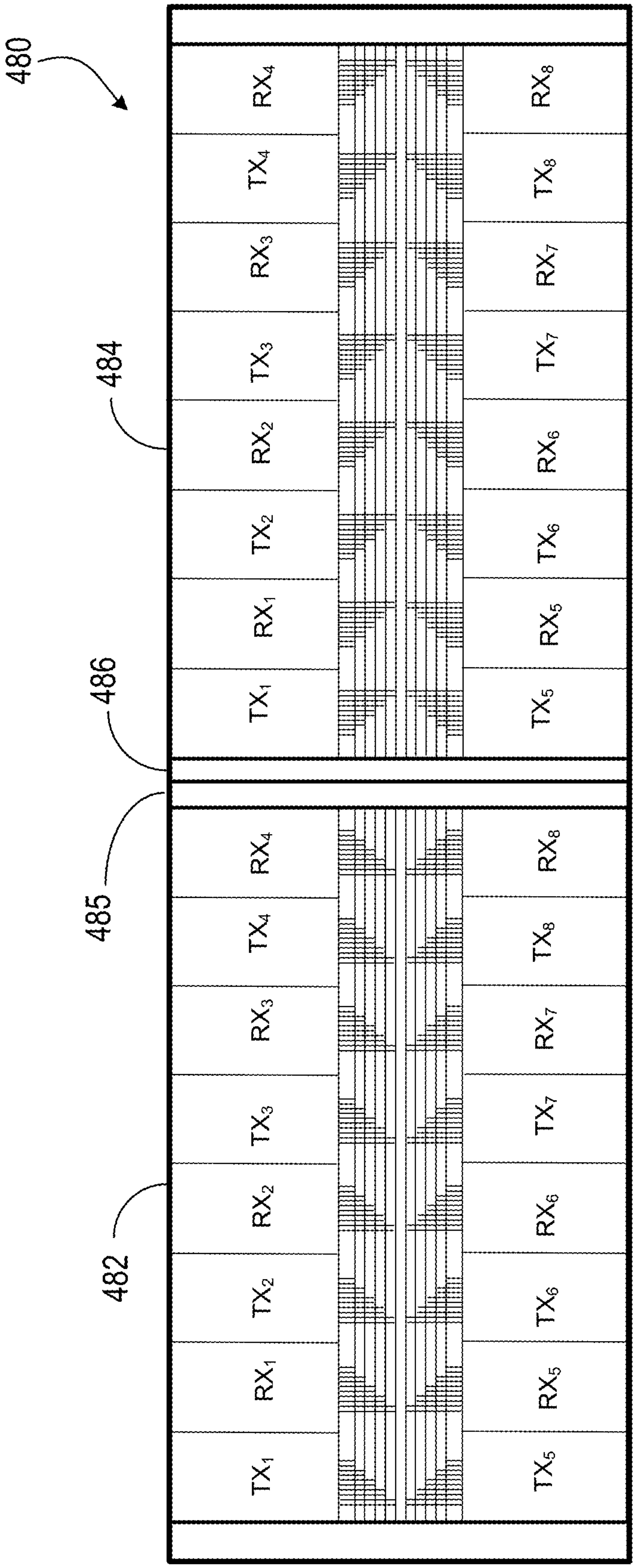
FIG. 19 is a diagram of an example electronic communication integrated circuit.

FIG. 19 is a diagram of an example electronic communication integrated circuit 480 that includes a first octal serializers/deserializers block 482 electrically coupled to a second octal serializers/deserializers block 484. For example, the electronic communication integrated circuit 480 can be used as the electronic communication integrated circuit 215 of FIGS. 2 and 3. The first octal serializers/deserializers block 482 can be used as the first serializers/deserializers module 216, and the second octal serializers/deserializers block 484 can be used as the second serializers/deserializers module 217. For example, the first octal serializers/deserializers block 482 can receive 8 serial differential signals, e.g., through electrical terminals arranged at the bottom side of the block, and generate 8 sets of parallel signals based on the 8 serial differential signals, in which each set of parallel signals is generated based on the corresponding serial differential signal. The first octal serializers/deserializers block 482 can condition serial electrical signals upon conversion into the 8 sets of parallel signals, such as performing clock and data recovery, and/or signal equalization. The first octal serializers/deserializers block 482 transmits the 8 sets of parallel signals to the second octal serializers/deserializers block 484 through a parallel bus 485 and a parallel bus 486. The second octal serializers/deserializers block 484 can generate 8 serial differential signals based on the 8 sets of parallel signals, in which each serial differential signal is generated based on the corresponding set of parallel signals. The second octal serializers/deserializers block 484 can output the 8 serial differential signals through, e.g., electrical terminals arranged at the bottom side of the block.

Figure 33:
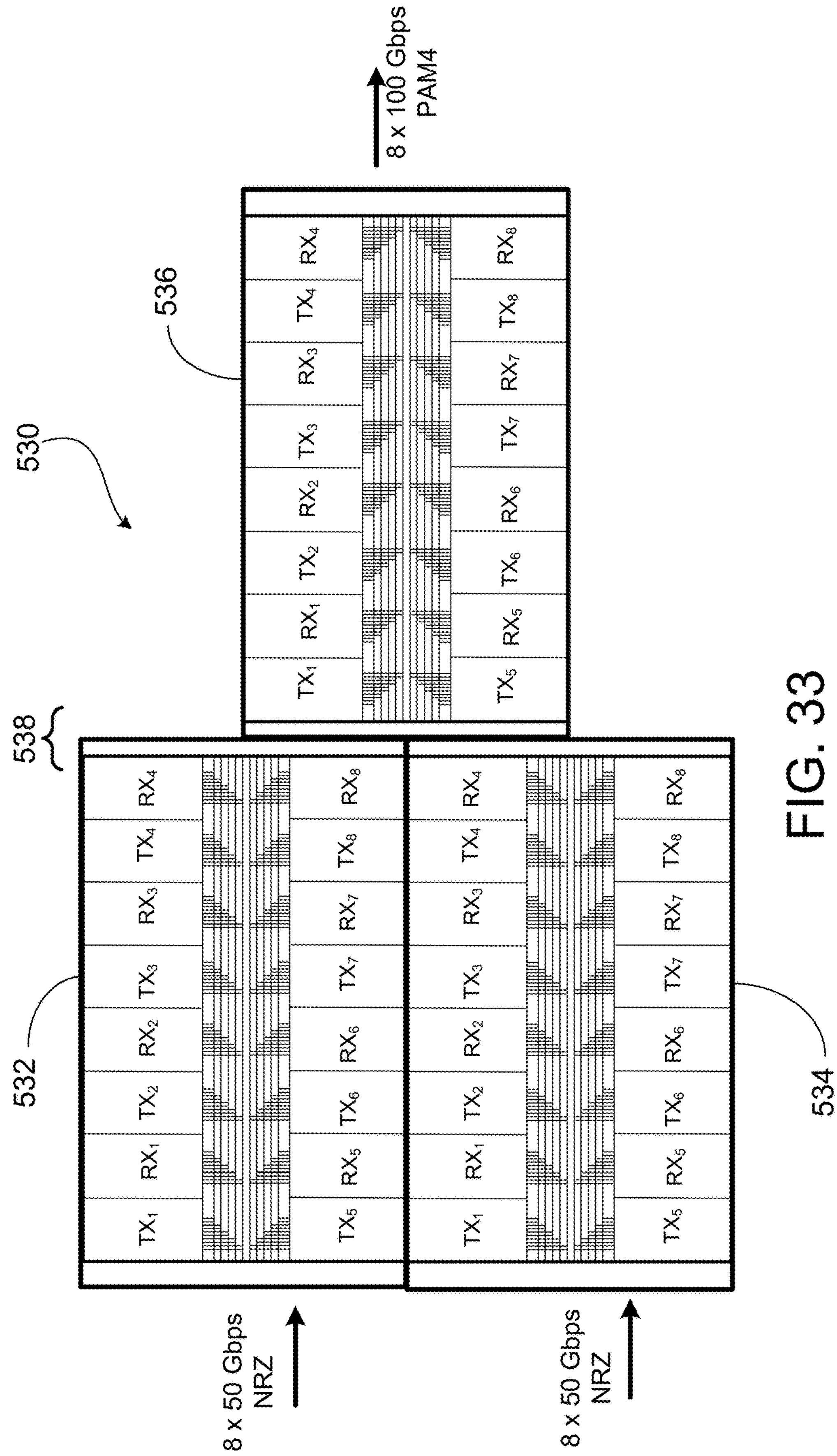
FIG. 33 is a diagram of an example electronic communication integrated circuit that includes octal serializers/deserializers blocks.
Figure 41A:
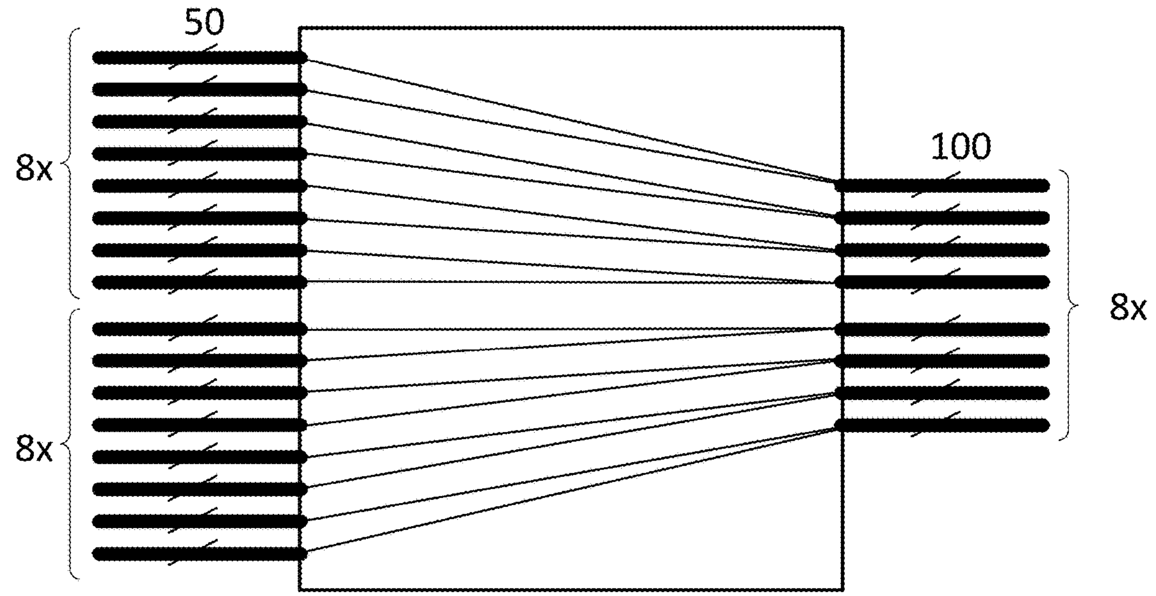

Multiple serializers/deserializers blocks can be electrically coupled to multiple serializers/deserializers blocks through a bus processing unit that can be, e.g., a parallel bus of electrical lanes, a static or a dynamically reconfigurable cross-connect device, or a re-mapping device (gearbox). FIG. 33 is a diagram of an example electronic communication integrated circuit 530 that includes a first octal serializers/deserializers block 532 and a second octal serializers/deserializers block 534 electrically coupled to a third octal serializers/deserializers block 536 through a bus processing unit 538. In this example, the bus processing unit 538 is configured to enable switching of the signals, allowing the routing of signals to be re-mapped, in which 8×50 Gbps serial electrical signals using NRZ modulation that are serially interfaced to the first and second octal serializers/deserializers blocks 532 and 534 are re-routed or combined into 8×100 Gbps serial electrical signals using PAM4 modulation that are serially interfaced to the third octal serializers/deserializers block 536. An example of the bus processing unit 538 is shown in FIG. 41A. In some examples, the bus processing unit 538 enables N lanes of T Gbps serial electrical signals to be remapped into N/M lanes of M×T Gbps serial electrical signals, N and M being positive integers, T being a real value, in which the N serially interfacing electrical signals can be modulated using a first modulation format and the M serially interfacing electrical signals can be modulated using a second modulation format.

Figure 41B:
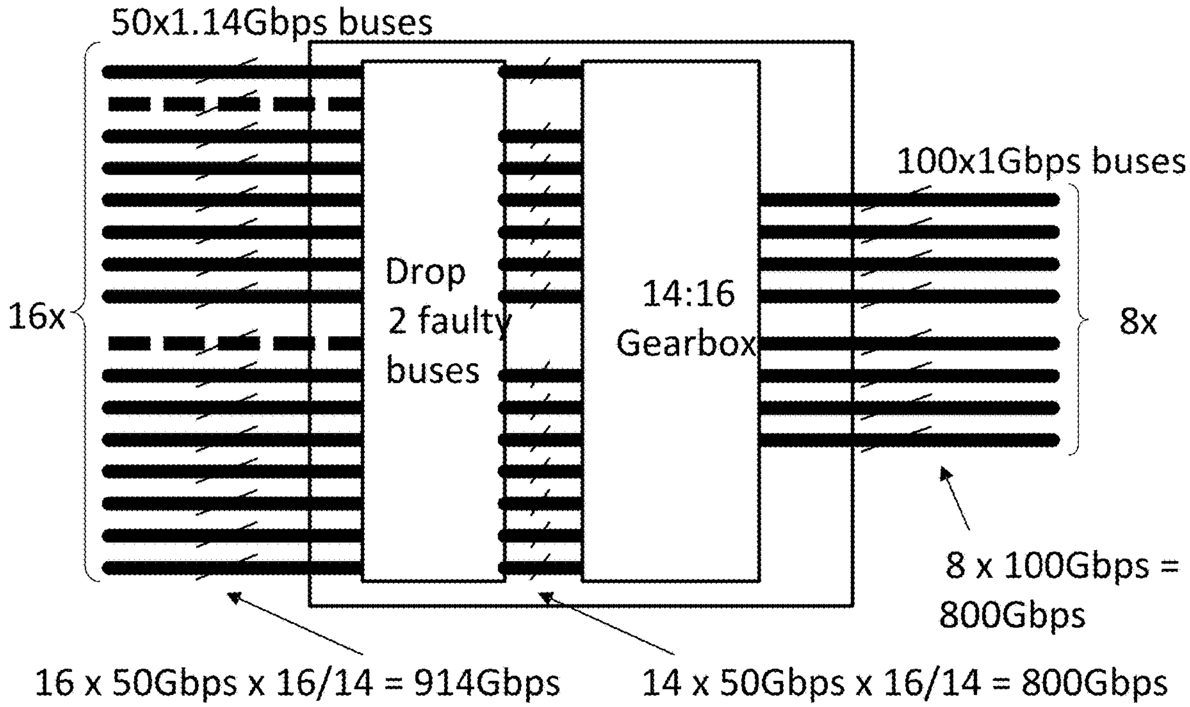

In some other examples, the bus processing unit 538 can allow for redundancy to increase reliability. For example, the first and the second serializers/deserializers blocks 532 and 534 can be jointly configured to serially interface to a total of N lanes of T×N/(N−k) Gbps electrical signals, while the third serializers/deserializers block 536 can be configured to serially interface to N lanes of T Gbps electrical signals. The bus processing unit 538 can then be configured to remap the data from only N-k out of the N lanes serially interfacing to the first and the second serializers/deserializers blocks 532 and 534 (carrying an aggregate bit rate of (N−k)×T× N/(N−k)=T×N) to the third serializers/deserializers block 536. This way, the bus processing unit 538 allows for k out of N serially interfacing electrical links to the first and the second serializers/deserializers blocks 532 and 534 to fail while still maintaining an aggregate of T×N Gbps of data serially interfacing to the third serializers/deserializers block 536. The number k is a positive integer. In some embodiments, k can be approximately 1% of N. In some other embodiments, k can be approximately 10% of N. In some embodiment, the selection of which N−k of the N serially interfacing electrical links to the first and the second serializers/deserializers blocks 532 and 534 to remap to the third serializers/deserializers block 536 using bus processing unit 538 can be dynamically selected, e.g., based on signal integrity and signal performance information extracted from the serially interfacing signals by the serializers/deserializers blocks 532 and 534. An example of the bus processing unit 538 is shown in FIG. 41B, in which N=16, k=2, T=50 Gbps.

In some examples, using the redundancy technique discussed above, the bus processing unit 538 enables N lanes of T× N/(N−k) Gbps serial electrical signals to be remapped into N/M lanes of M×T Gbps serial electrical signals. The bus processing unit 538 enables k out of N serially interfacing electrical links to fail while still maintaining an aggregate of T×N Gbps of data serially interfacing to the third serializers/deserializers block 536.

Figure 20:
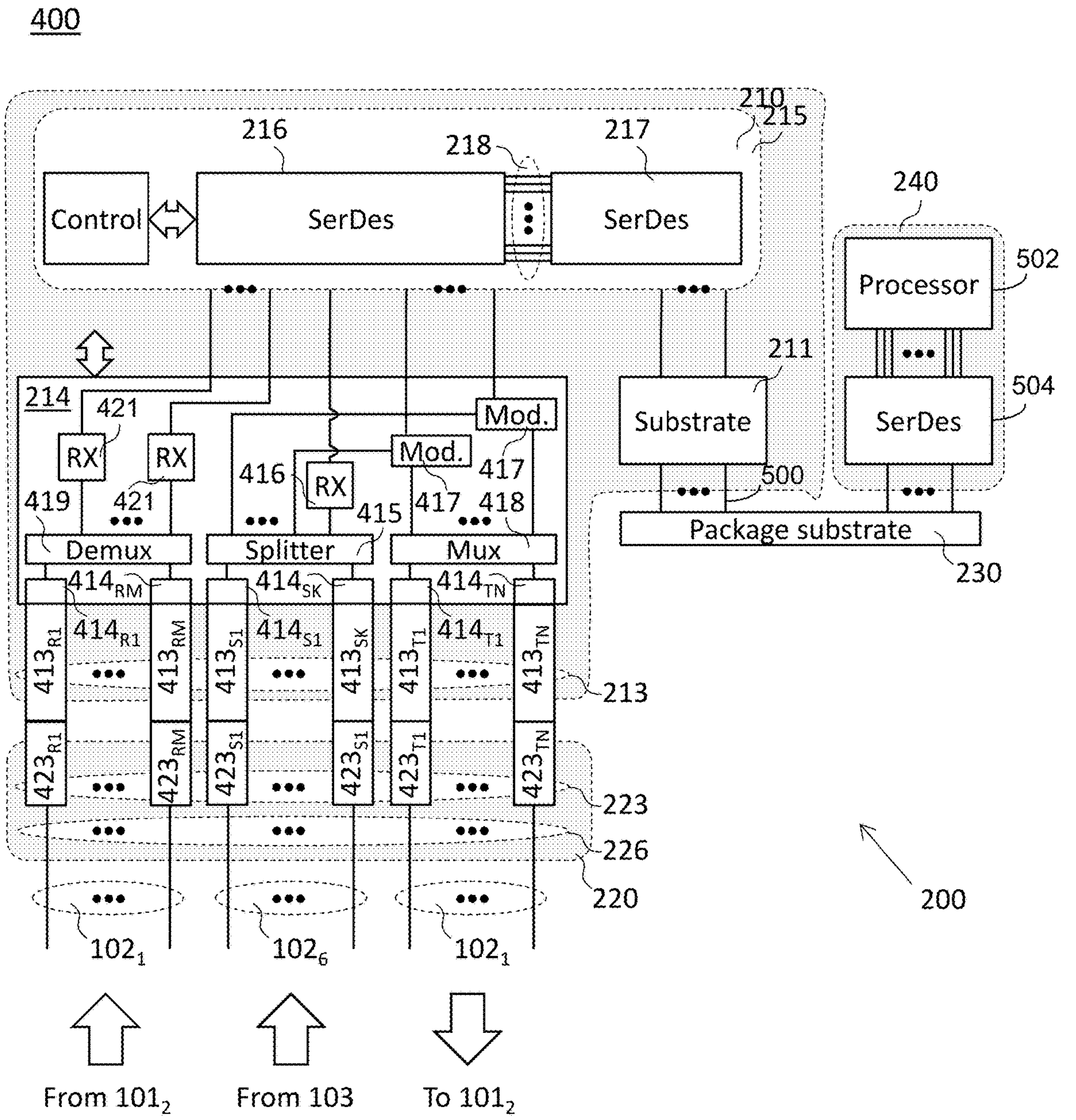
FIG. 20 is a functional block diagram of an example data processing system.

FIG. 20 is a functional block diagram of an example data processing system 200, which can be used to implement, e.g., one or more of devices 101_1 to 101_6 of FIG. 1. Without implied limitation, the data processing system 200 is shown as part of the node 101_1 for illustration purposes. The data processing system 200 can be part of any other network element of the system 100. The data processing system 200 includes an integrated communication device 210, a fiber-optic connector assembly 220, a package substrate 230, and an electronic processor integrated circuit 240.

The connector assembly 220 includes a connector 223 and a fiber array 226. The connector 223 can include multiple individual fiber-optic connectors 423_*i* (i∈{R1 . . . . RM; S1 . . . . SK; T1 . . . . TN} with K, M, and N being positive integers). In some embodiments, some or all of the individual connectors 423_*i* can form a single physical entity. In some embodiments some or all of the individual connectors 423_*i* can be separate physical entities. When operating as part of the network element 101_1 of the system 100, (i) the connectors 423_S1 through 423_SK can be connected to optical power supply 103, e.g., through link 102_6, to receive supply light; (ii) the connectors 423_R1 through 423_RM can be connected to the transmitters of the node 101_2, e.g., through the link 102_1, to receive from the node 101_2 optical communication signals; and (iii) the connectors 423_T1 through 423_TN can be connected to the receivers of the node 101_2, e.g., through the link 102_1, to transmit to the node 101_2 optical communication signals.

In some implementations, the communication device 210 includes an electronic communication integrated circuit 215, a photonic integrated circuit 214, a connector part 213, and a substrate 211. The connector part 213 can include multiple individual optical connectors 413_*i* to photonic integrated circuit 214 (i∈{R1 . . . . RM; S1 . . . . SK; T1 . . . . TN} with K, M, and N being positive integers). In some embodiments, some or all of the individual connectors 413_*i* can form a single physical entity. In some embodiments some or all of the individual connectors 413_*i* can be separate physical entities. The optical connectors 413_*i* are configured to optically couple light to the photonic integrated circuit 214 using optical coupling interfaces 414, e.g., vertical grating couplers, turning mirrors, etc., as disclosed in U.S. patent application Ser. No. 16/816,171.

In operation, light entering the photonic integrated circuit 214 from the link 102_6 through coupling interfaces 414_S1 through 414_SK can be split using an optical splitter 415. The optical splitter 415 can be an optical power splitter, an optical polarization splitter, an optical wavelength demultiplexer, or any combination or cascade thereof, e.g., as disclosed in U.S. Pat. No. 11,153,670 and in U.S. patent application Ser. No. 16/888,890, filed on Jun. 1, 2020, published as US 2021/0376950, which is incorporated herein by reference in its entirety. In some embodiments, one or more splitting functions of the splitter 415 can be integrated into the optical coupling interfaces 414 and/or into optical connectors 413. For example, in some embodiments, a polarization-diversity vertical grating coupler can be configured to simultaneously act as a polarization splitter 415 and as a part of optical coupling interface 414. In some other embodiments, an optical connector that includes a polarization-diversity arrangement can simultaneously act as an optical connector 413 and as a polarization splitter 415.

In some embodiments, light at one or more outputs of the splitter 415 can be detected using a receiver 416, e.g., to extract synchronization information as disclosed in U.S. Pat. No. 11,153,670. In various embodiments, the receiver 416 can include one or more p-i-n photodiodes, one or more avalanche photodiodes, one or more self-coherent receivers, or one or more analog (heterodyne/homodyne) or digital (intradyne) coherent receivers. In some embodiments, one or more opto-electronic modulators 417 can be used to modulate onto light at one or more outputs of the splitter 415 data for communication to other network elements.

Modulated light at the output of the modulators 417 can be multiplexed in polarization or wavelength using a multiplexer 418 before leaving the photonic integrated circuit 214 through optical coupling interfaces 414_T1 through 414_TN. In some embodiments, the multiplexer 418 is not provided, i.e., the output of each modulator 417 can be directly coupled to a corresponding optical coupling interface 414.

On the receiver side, light entering the photonic integrated circuit 214 through a coupling interfaces 414_R1 through 414_RM from, e.g., the link 101_2, can first be demultiplexed in polarization and/or in wavelength using an optical demultiplexer 419. The outputs of the demultiplexer 419 are then individually detected using receivers 421. In some embodiments, the demultiplexer 419 is not provided, i.e., the output of each coupling interface 414_R1 through 414_RM can be directly coupled to a corresponding receiver 421. In various embodiments, the receiver 421 can include one or more p-i-n photodiodes, one or more avalanche photodiodes, one or more self-coherent receivers, or one or more analog (heterodyne/homodyne) or digital (intradyne) coherent receivers.

Figure 42:
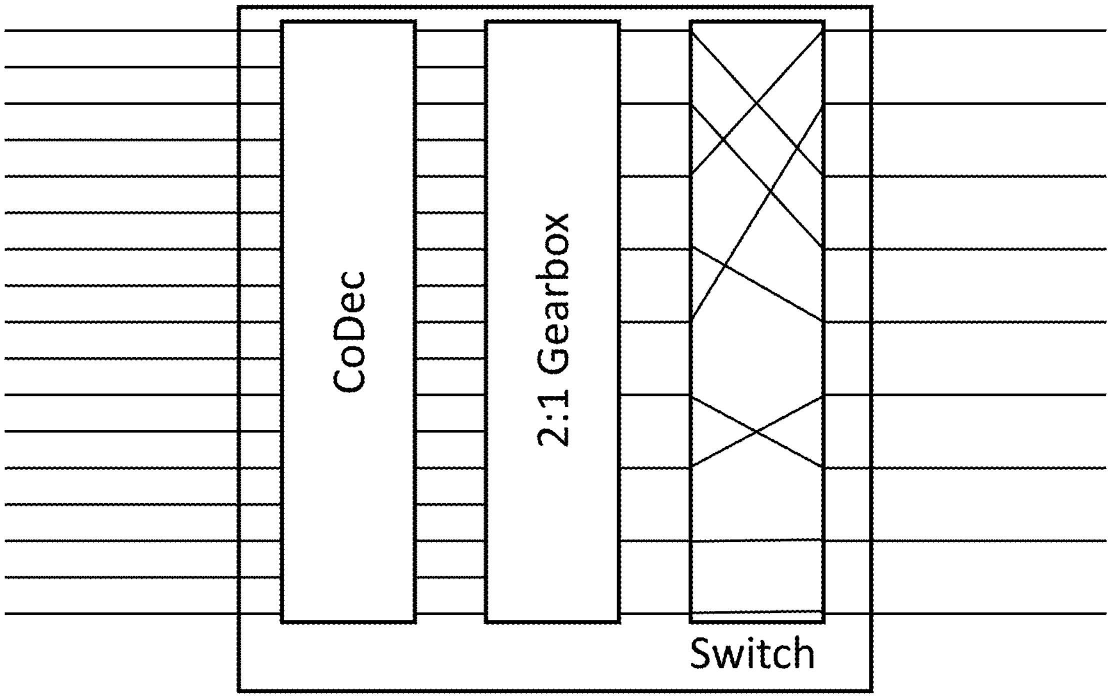

The photonic integrated circuit 214 is electrically coupled to the integrated circuit 215. In some implementations, the photonic integrated circuit 214 provides a plurality of serial electrical signals to the first serializers/deserializers module 216, which generates sets of parallel electrical signals based on the serial electrical signals, in which each set of parallel electrical signal is generated based on a corresponding serial electrical signal. The first serializers/deserializers module 216 conditions the serial electrical signals, demultiplexes them into the sets of parallel electrical signals and sends the sets of parallel electrical signals to the second serializers/deserializers module 217 through a bus processing unit 218. In some implementations, the bus processing unit 218 enables switching of signals and performs line coding and/or error-correcting coding functions. An example of the bus processing unit 218 is shown in FIG. 42.

The second serializers/deserializers module 217 generates a plurality of serial electrical signals based on the sets of parallel electrical signals, in which each serial electrical signal is generated based on a corresponding set of parallel electrical signal. The second serializers/deserializers module 217 sends the serial electrical signals through electrical connectors that pass through the substrate 211 in the thickness direction to an array of electrical terminals 500 that are arranged on the bottom surface of the substrate 211. For example, the array of electrical terminals 500 configured to enable the integrated communication device 210 to be easily coupled to, or removed from, the package substrate 230.

In some implementations, the electronic processor integrated circuit 240 includes a data processor 502 and an embedded third serializers/deserializers module 504. The third serializers/deserializers module 504 receives the serial electrical signals from the second serializers/deserializers module 217, and generates sets of parallel electrical signals based on the serial electrical signals, in which each set of parallel electrical signal is generated based on a corresponding serial electrical signal. The data processor 502 processes the sets of parallel signals generated by the third serializers/deserializers module 504.

In some implementations, the data processor 502 generates sets of parallel electrical signals, and the third serializers/deserializers module 504 generates serial electrical signals based on the sets of parallel electrical signals, in which each serial electrical signal is generated based on a corresponding set of parallel electrical signal. The serial electrical signals are sent to the second serializers/deserializers module 217, which generates sets of parallel electrical signals based on the serial electrical signals, in which each set of parallel electrical signal is generated based on a corresponding serial electrical signal. The second serializers/deserializers module 217 sends the sets of parallel electrical signals to the first serializers/deserializers module 216 through the bus processing unit 218. The first serializers/deserializers module 216 generates serial electrical signals based on the sets of parallel electrical signals, in which each serial electrical signal is generated based on a corresponding set of parallel electrical signals. The first serializers/deserializers module 216 sends the serial electrical signals to the photonic integrated circuit 214. The opto-electronic modulators 417 modulate optical signals based on the serial electrical signals, and the modulated optical signals are output from the photonic integrated circuit 214 through optical coupling interfaces 414_T1 through 414_TN.

In some embodiments, supply light from the optical power supply 103 includes an optical pulse train, and synchronization information extracted by the receiver 416 can be used by the serializers/deserializers module 216 to align the electrical output signals of the serializers/deserializers module 216 with respective copies of the optical pulse trains at the outputs of the splitter 415 at the modulators 417. For example, the optical pulse train can be used as an optical power supply at the optical modulator. In some such implementations, the first serializers/deserializers module 216 can include interpolators or other electrical phase adjustment elements.

Figure 21:
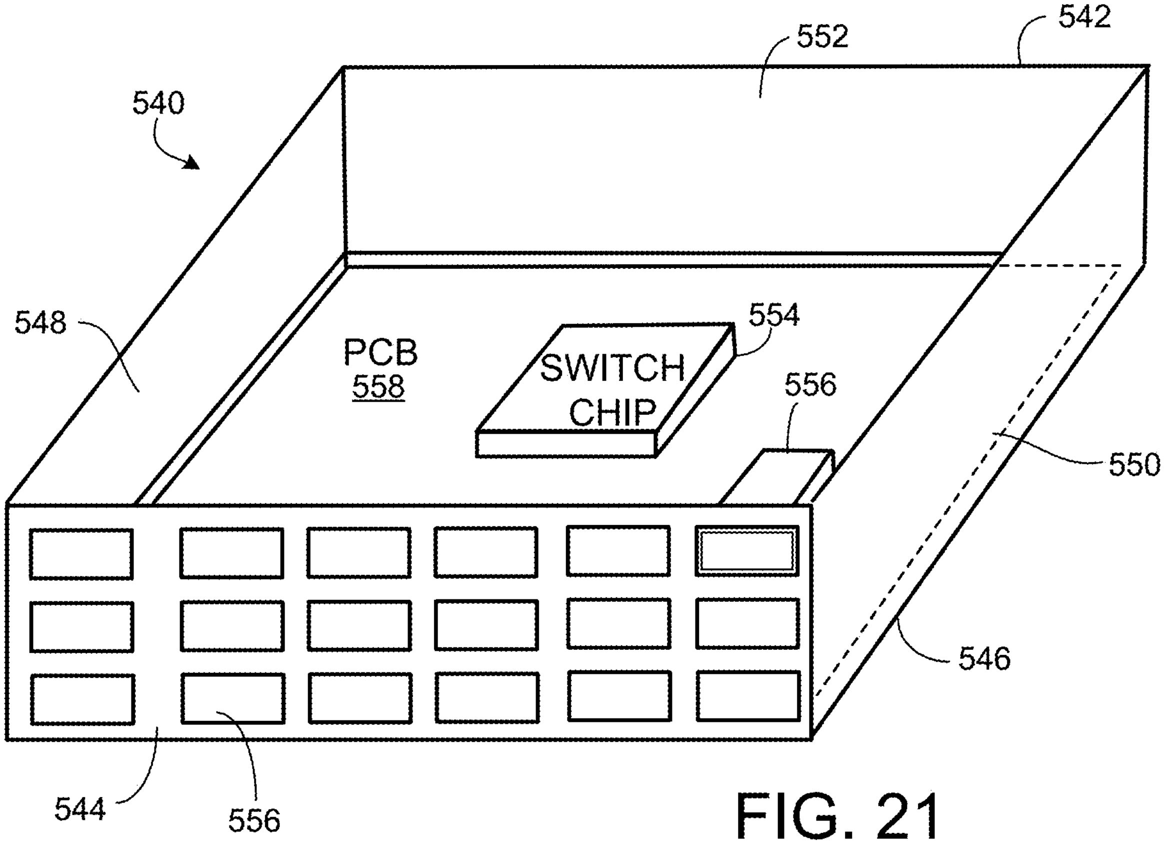
FIG. 21 is a diagram of an example rackmount data processing system.

Referring to FIG. 21, in some implementations, a data processing system 540 includes an enclosure or housing 542 that has a front panel 544, a bottom panel 546, side panels 548 and 550, a rear panel 552, and a top panel (not shown in the figure). The system 540 includes a printed circuit board 558 that extends substantially parallel to the bottom panel 546. A data processing chip 554 is mounted on the printed circuit board 558, in which the chip 554 can be, e.g., a network switch, a central processor unit, a graphics processor unit, a tensor processing unit, a neural network processor, an artificial intelligence accelerator, a digital signal processor, a microcontroller, or an application specific integrated circuit (ASIC).

At the front panel 544 are pluggable input/output interfaces 556 that allow the data processing chip 554 to communicate with other systems and devices. For example, the input/output interfaces 556 can receive optical signals from outside of the system 540 and convert the optical signals to electrical signals for processing by the data processing chip 554. The input/output interfaces 556 can receive electrical signals from the data processing chip 554 and convert the electrical signals to optical signals that are transmitted to other systems or devices. For example, the input/output interfaces 556 can include one or more of small form-factor pluggable (SFP), SFP+, SFP28, QSFP, QSFP28, or QSFP56 transceivers. The electrical signals from the transceiver outputs are routed to the data processing chip 554 through electrical connectors on or in the printed circuit board 558.

In the examples shown in FIGS. 21 to 29B, 69A, 70, 71A, 72, 72A, 74A, 75A, 75C, 76, 77A, 77B, 78, 96 to 98, 100, 110, 112, 113, 115, 117 to 122, 125A to 127, 129 to 131, various embodiments can have various form factors, e.g., in some embodiments the top panel and the bottom panel 546 can have the largest area, in other embodiments the side panels 548 and 550 can have the largest area, and in yet other embodiments the front panel 544 and the rear panel 552 can have the largest area. In various embodiments, the printed circuit board 558 can be substantially parallel to the two side panels, e.g., the data processing system 540 as shown in FIG. 21 can stand on one of its side panels during normal operation (such that the side panel 550 is positioned at the bottom, and the bottom panel 546 is positioned at the side). In various embodiments, the data processing system 540 can comprise two or more printed circuit boards some of which can be substantially parallel to the bottom panel and some of which can be substantially parallel to the side panels. For example, in some computer systems for machine learning/artificial intelligence applications have vertical circuit boards that are plugged into the systems. As used herein, the distinction between "front" and "back" is made based on where the majority of input/output interfaces 556 are located, irrespective of what a user may consider the front or back of data processing system 540.

Figure 22:
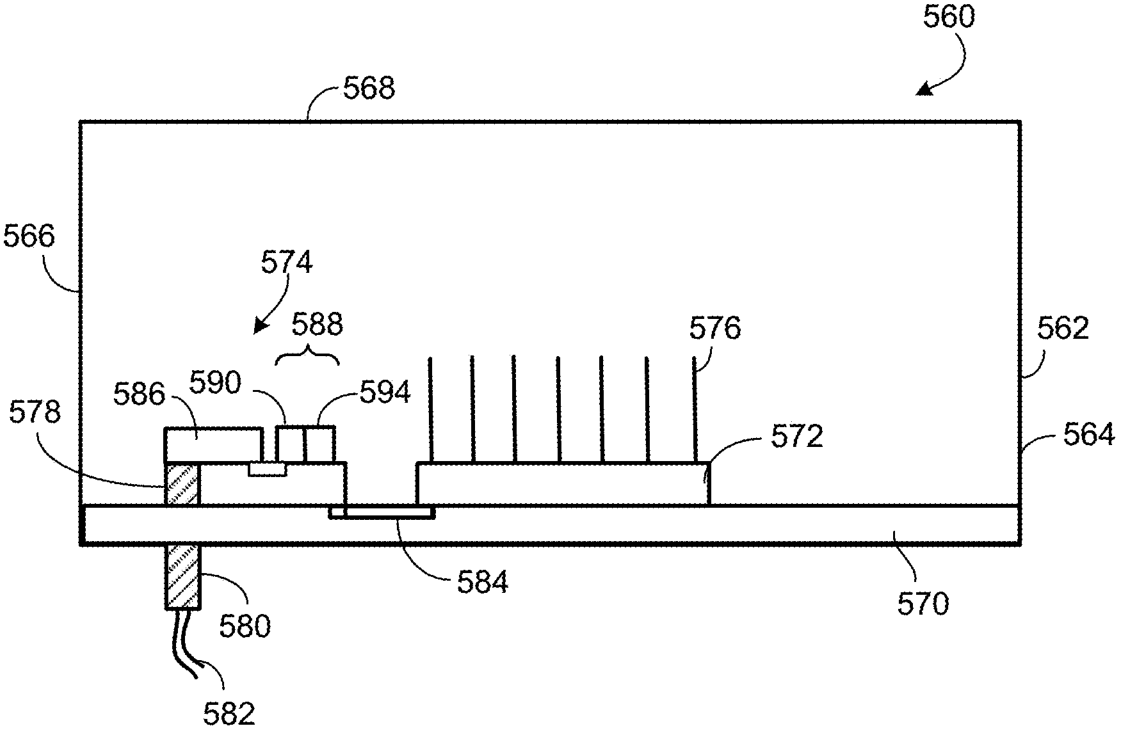
FIGS. 22, 23, 24, 25, 26A, 26B, 26C, 27, 28A, and 28B are top view diagrams of examples of rackmount data processing systems incorporating optical interconnect modules.

FIG. 22 is a diagram of a top view of an example data processing system 560 that includes a housing 562 having side panels 564 and 566, and a rear panel 568. The system 560 includes a vertically mounted printed circuit board 570 that can also function as the front panel. The surface of the printed circuit board 570 is substantially perpendicular to the bottom panel of the housing 562. The term "substantially perpendicular" is meant to take into account of manufacturing and assembly tolerances, so that if a first surface is substantially perpendicular to a second surface, the first surface is at an angle in a range from 85° to 95° relative to the second surface. On the printed circuit board 570 are mounted a data processing chip 572 and an integrated communication device 574. In some examples, the data processing chip 572 and the integrated communication device 574 are mounted on a substrate (e.g., a ceramic substrate), and the substrate is attached (e.g., electrically coupled) to the printed circuit board 570. The data processing chip 572 can be, e.g., a network switch, a central processor unit, a graphics processor unit, a tensor processing unit, a neural network processor, an artificial intelligence accelerator, a digital signal processor, a microcontroller, or an application specific integrated circuit (ASIC). A heat sink 576 is provided on the data processing chip 572.

In some implementations, the integrated communication device 574 includes a photonic integrated circuit 586 and an electronic communication integrated circuit 588 mounted on a substrate 594. The electronic communication integrated circuit 588 includes a first serializers/deserializers module 590 and a second serializers/deserializers module 592. The printed circuit board 570 can be similar to the package substrate 230 (FIGS. 2, 4, 11-14), the data processing chip 572 can be similar to the electronic processor integrated circuit or application specific integrated circuit 240, and the integrated communication device 574 can be similar to the integrated communication device 210, 252, 374, 382, 402, 428. In some embodiments, the integrated communication device 574 is soldered to the printed circuit board 570. In some other embodiments, the integrated communication device 574 is removably connected to the printed circuit board 570, e.g., via a land grid array or a compression interposer. Related holding fixtures including snap-on or screw-on mechanisms are not shown in the figure.

In some examples, the integrated communication device 574 includes a photonic integrated circuit without serializers/deserializers modules, and drivers/transimpedance amplifiers (TIA) are provided separately. In some examples, the integrated communication device 574 includes a photonic integrated circuit and drivers/transimpedance amplifiers but without serializers/deserializers modules.

The integrated communication device 574 includes a first optical connector 578 that is configured to receive a second optical connector 580 that is coupled to a bundle of optical fibers 582. The integrated communication device 574 is electrically coupled to the data processing chip 572 through electrical connectors or traces 584 on or in the printed circuit board 570. Because the data processing chip 572 and the integrated communication device 574 are both mounted on the printed circuit board 570, the electrical connectors or traces 584 can be made shorter, compared to the electrical connectors that electrically couple the transceivers 556 to the data processing chip 554 of FIG. 21. Using shorter electrical connectors or traces 584 allows the signals to have a higher data rate with lower noise, lower distortion, and/or lower crosstalk. Mounting the printed circuit board 570 perpendicular to the bottom panel of the housing allows for more easily accessible connections to the integrated communication device 574 that may be removed and re-connected without, e.g., removing the housing from a rack.

In some examples, the bundle of optical fibers 582 can be firmly attached to the photonic integrated circuit 586 without the use of the first and second optical connectors 578, 580.

The printed circuit board 570 can be secured to the side panels 564 and 566, and the bottom and top panels of the housing using, e.g., brackets, screws, clips, and/or other types of fastening mechanisms. The surface of the printed circuit board 570 can be oriented perpendicular to bottom panel of the housing, or at an angle (e.g., between −60° to) 60° relative to the vertical direction (the vertical direction being perpendicular to the bottom panel). The printed circuit board 570 can have multiple layers, in which the outermost layer (i.e., the layer facing the user) has an exterior surface that is configured to be aesthetically pleasing.

The first optical connector 578, the second optical connector 580, and the bundle of optical fibers 582 can be similar to those shown in FIGS. 2, 4, and 11-16. As described above, the bundle of fibers 582 can include 10 or more optical fibers, 100 or more optical fibers, 500 or more optical fibers, or 1000 or more optical fibers. The optical signals provided to the photonic integrated circuit 586 can have a high total bandwidth, e.g., about 1.6 Tbps, or about 12.8 Tbps, or more.

Although FIG. 22 shows one integrated communication device 574, there can be additional integrated communication devices 574 that are electrically coupled to the data processing chip 572. The data processing system 560 can include a second printed circuit board (not shown in the figure) oriented parallel to the bottom panel of the housing 562. The second printed circuit board can support other optical and/or electronic devices, such as storage devices, memory chips, controllers, power supply modules, fans, and other cooling devices.

In some examples of the data processing system 540 (FIG. 21), the transceiver 556 can include circuitry (e.g., integrated circuits) that perform some type of processing of the signals and/or the data contained in the signals. The signals output from the transceiver 556 need to be routed to the data processing chip 554 through longer signal paths that place a limit on the data rate. In some data processing systems, the data processing chip 554 outputs processed data that are routed to one of the transceivers and transmitted to another system or device. Again, the signals output from the data processing chip 554 need to be routed to the transceiver 556 through longer signal paths that place a limit on the data rate. By comparison, in the data processing system 560 (FIG. 22), the electrical signals that are transmitted between the integrated communication devices 574 and the data processing chip 572 pass through shorter signal paths and thus support a higher data rate.

Figure 23:
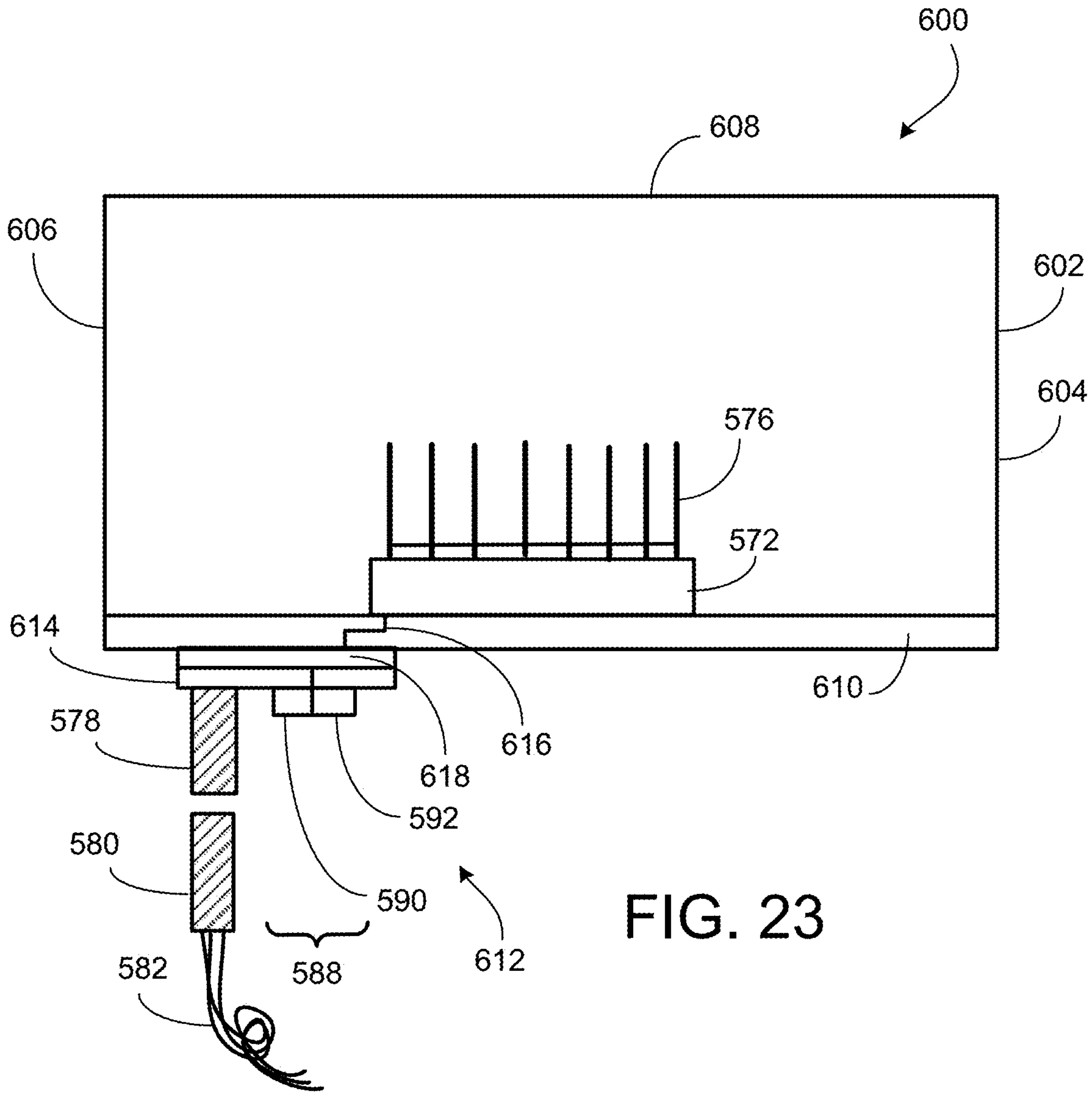

FIG. 23 is a diagram of a top view of an example data processing system 600 that includes a housing 602 having side panels 604 and 606, and a rear panel 608. The system 600 includes a vertically mounted printed circuit board 610 that functions as the front panel. The surface of the printed circuit board 610 is substantially perpendicular to the bottom panel of the housing 602. A data processing chip 572 is mounted on an interior side of the printed circuit board 610, and an integrated communication device 612 is mounted on an exterior side of the printed circuit board 610. In some examples, the data processing chip 572 is mounted on a substrate (e.g., a ceramic substrate), and the substrate is attached to the printed circuit board 610. In some embodiments, the integrated communication device 612 is soldered to the printed circuit board 610. In some other embodiments, the integrated communication device 612 is removably connected to the printed circuit board 610, e.g., via a land grid array or a compression interposer. Related holding fixtures including snap-on or screw-on mechanisms are not shown in the figure. A heat sink 576 is provided on the data processing chip 572.

In some implementations, the integrated communication device 612 includes a photonic integrated circuit 614 and an electronic communication integrated circuit 588 mounted on a substrate 618. The electronic communication integrated circuit 588 includes a first serializers/deserializers module 590 and a second serializers/deserializers module 592. The integrated communication device 612 includes a first optical connector 578 that is configured to receive a second optical connector 580 that is coupled to a bundle of optical fibers 582. The integrated communication device 612 is electrically coupled to the data processing chip 572 through electrical connectors or traces 616 that pass through the printed circuit board 610 in the thickness direction. Because the data processing chip 572 and the integrated communication device 612 are both mounted on the printed circuit board 610, the electrical connectors or traces 616 can be made shorter, thereby allowing the signals to have a higher data rate with lower noise, lower distortion, and/or lower crosstalk. Mounting the integrated communication device 612 on the outside of the printed circuit board 610 perpendicular to the bottom panel of the housing and accessible from outside the housing allows for more easily accessible connections to the integrated communication device 612 that may be removed and re-connected without, e.g., removing the housing from a rack.

In some examples, the integrated communication device 612 includes a photonic integrated circuit without serializers/deserializers modules, and drivers and transimpedance amplifiers (TIA) are provided separately. In some examples, the integrated communication device 612 includes a photonic integrated circuit and drivers/transimpedance amplifiers but without serializers/deserializers modules. In some examples, the bundle of optical fibers 582 can be firmly attached to the photonic integrated circuit 614 without the use of the first and second optical connectors 578, 580.

In some examples, the data processing chip 572 is mounted on the rear side of the substrate, and the integrated communication device 612 are removably attached to the front side of the substrate, in which the substrate provides high speed connections between the data processing chip 572 and the integrated communication device 612. For example, the substrate can be attached to a front side of a printed circuit board, in which the printed circuit board includes an opening that allows the data processing chip 572 to be mounted on the rear side of the substrate. The printed circuit board can provide from a motherboard electrical power to the substrate (and hence to the data processing chip 572 and the integrated communication device 612, and allow the data processing chip 572 and the integrated communication device 612 to connect to the motherboard using low-speed electrical links.

The printed circuit board 610 can be secured to the side panels 604 and 606, and the bottom and top panels of the housing using, e.g., brackets, screws, clips, and/or other types of fastening mechanisms. The surface of the printed circuit board 610 can be oriented perpendicular to bottom panel of the housing, or at an angle (e.g., between −60° to) 60° relative to the vertical direction (the vertical direction being perpendicular to the bottom panel). The printed circuit board 610 can have multiple layers, in which the portion of the outermost layer (i.e., the layer facing the user) not covered by the integrated communication device 612 has an exterior surface that is configured to be aesthetically pleasing.

Figure 24:
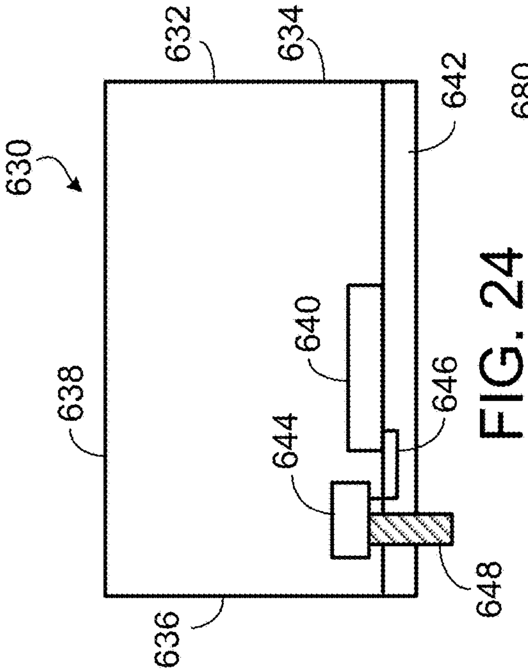

FIGS. 24-27 below illustrate four general designs in which the data processing chips are positioned near the input/output communication interfaces. FIG. 24 is a top view of an example data processing system 630 in which a data processing chip 640 is mounted near an optical/electrical communication interface 644 to enable high bandwidth data paths (e.g., one, ten, or more Gigabits per second per data path) between the data processing chip 640 and the optical/electrical communication interface 644. In this example, the data processing chip 640 and the optical/electrical communication interface 644 are mounted on a circuit board 642 that functions as the front panel of an enclosure 632 of the system 630, thus allowing optical fibers to be easily coupled to the optical/electrical communication interface 644. In some examples, the data processing chip 640 is mounted on a substrate (e.g., a ceramic substrate), and the substrate is attached to the circuit board 642.

The enclosure 632 has side panels 634 and 636, a rear panel 638, a top panel, and a bottom panel. In some examples, the circuit board 642 is perpendicular to the bottom panel. In some examples, the circuit board 642 is oriented at an angle in a range −60° to 60° relative to a vertical direction of the bottom panel. The side of the circuit board 642 facing the user is configured to be aesthetically pleasing.

The optical/electrical communication interface 644 is electrically coupled to the data processing chip 640 by electrical connectors or traces 646 on or in the circuit board 642. The circuit board 642 can be a printed circuit board that has one or more layers. The electrical connectors or traces 646 can be signal lines printed on the one or more layers of the printed circuit board 642 and provide high bandwidth data paths (e.g., one or more Gigabits per second per data path) between the data processing chip 640 and the optical/electrical communication interface 644.

In a first example, the data processing chip 640 receives electrical signals from the optical/electrical communication interface 644 and does not send electrical signals to the optical/electrical communication interface 644. In a second example, the data processing chip 640 receives electrical signals from, and sends electrical signals to, the optical/electrical communication interface 644. In the first example, the optical/electrical communication interface 644 receives optical signals from optical fibers, generates electrical signals based on the optical signals, and sends the electrical signals to the data processing chip 640. In the second example, the optical/electrical communication interface 644 also receives electrical signals from the data processing chip, generates optical signals based on the electrical signals, and sends the optical signals to the optical fibers.

An optical connector 648 is provided to couple optical signals from the optical fibers to the optical/electrical communication interface 644. In this example, the optical connector 648 passes through an opening in the circuit board 642. In some examples, the optical connector 648 is securely fixed to the optical/electrical communication interface 644. In some examples, the optical connector 648 is configured to be removably coupled to the optical/electrical communication interface 644, e.g., by using a pluggable and releasable mechanism, which can include one or more snap-on or screw-on mechanisms. In some other examples, an array of 10 or more fibers is securely or fixedly attached to the optical connector 648.

The optical/electrical communication interface 644 can be similar to, e.g., the integrated communication device 210 (FIG. 2), 252 (FIG. 4), 374 (FIG. 11), 382 (FIG. 12), 402 (FIG. 13), and 428 (FIG. 14). In some examples, the optical/electrical communication interface 644 can be similar to the integrated optical communication device 448, 462, 466, 472 (FIG. 17), except that the optical/electrical communication interface 644 is mounted on the same side of the circuit board 642 as the data processing chip 640. The optical connector 648 can be similar to, e.g., the first optical connector part 213 (FIGS. 2, 4), the first optical connector 356 (FIGS. 11, 12), the first optical connector 404 (FIGS. 13, 14), and the first optical connector part 456 (FIG. 17). In some examples, a portion of the optical connector 648 can be part of the optical/electrical communication interface 644. In some examples, the optical connector 648 can also include the second optical connector part 223 (FIGS. 2, 4), 458 (FIG. 17) that is optically coupled to the optical fibers. FIG. 24 shows that the optical connector 648 passes through the circuit board 642. In some examples, the optical connector 648 can be short so that the optical fibers pass through, or partly through, the circuit board 642. In some examples, the optical connector is not attached vertically to a photonic integrated circuit that is part of the optical/electrical communication interface 644 but rather can be attached in-plane to the photonic integrated circuit using, e.g., V-groove fiber attachments, tapered or un-tapered fiber edge coupling, etc., followed by a mechanism to direct the light interfacing to the photonic integrated circuit to a direction that is substantially perpendicular to the photonic integrated circuit, such as one or more substantially 90-degree turning mirrors, one or more substantially 90-degree bent optical fibers, etc. Any such solution is conceptually included in the vertical optical coupling attachment schematically visualized in FIGS. 24-27.

Figure 25:
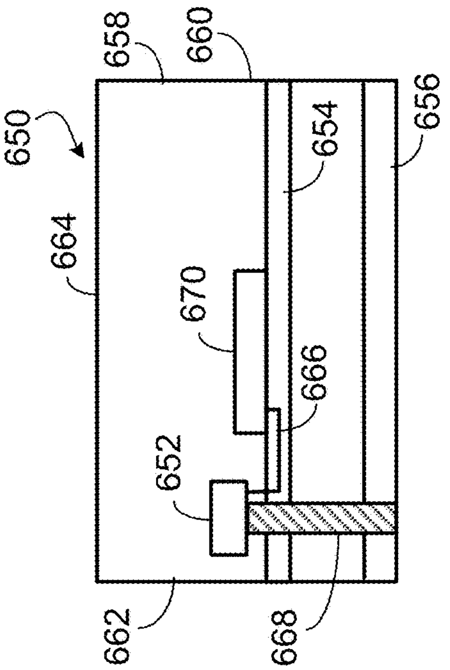

FIG. 25 is a top view of an example data processing system 650 in which a data processing chip 670 is mounted near an optical/electrical communication interface 652 to enable high bandwidth data paths (e.g., one, ten, or more Gigabits per second per data path) between the data processing chip 670 and the optical/electrical communication interface 652. In this example, the data processing chip 670 and the optical/electrical communication interface 652 are mounted on a circuit board 654 that is positioned near a front panel 656 of an enclosure 658 of the system 630, thus allowing optical fibers to be easily coupled to the optical/electrical communication interface 652. In some examples, the data processing chip 670 is mounted on a substrate (e.g., a ceramic substrate), and the substrate is attached to the circuit board 654.

The enclosure 658 has side panels 660 and 662, a rear panel 664, a top panel, and a bottom panel. In some examples, the circuit board 654 and the front panel 656 are perpendicular to the bottom panel. In some examples, the circuit board 654 and the front panel 656 are oriented at an angle in a range −60° to 60° relative to a vertical direction of the bottom panel. In some examples, the circuit board 654 is substantially parallel to the front panel 656, e.g., the angle between the surface of the circuit board 654 and the surface of the front panel 656 can be in a range of −5° to 5°. In some examples, the circuit board 654 is at an angle relative to the front panel 656, in which the angle is in a range of −45° to 45°.

The optical/electrical communication interface 652 is electrically coupled to the data processing chip 670 by electrical connectors or traces 666 on or in the circuit board 654, similar to those of the system 630. The signal path between the data processing chip 670 and the optical/electrical communication interface 652 can be unidirectional or bidirectional, similar to that of the system 630.

An optical connector 668 is provided to couple optical signals from the optical fibers to the optical/electrical communication interface 652. In this example, the optical connector 668 passes through an opening in the front panel 656 and an opening in the circuit board 654. The optical connector 668 can be securely fixed, or releasably connected, to the optical/electrical communication interface 652, similar to that of the system 630.

The optical/electrical communication interface 652 can be similar to, e.g., the integrated communication device 210 (FIG. 2), 252 (FIG. 4), 374 (FIG. 11), 382 (FIG. 12), 402 (FIG. 13), and 428 (FIG. 14). In some examples, the optical/electrical communication interface 652 can be similar to the integrated optical communication device 448, 462, 466, 472 (FIG. 17), except that the optical/electrical communication interface 652 is mounted on the same side of the circuit board 654 as the data processing chip 640. The optical connector 668 can be similar to, e.g., the first optical connector part 213 (FIGS. 2, 4), the first optical connector 356 (FIGS. 11, 12), the first optical connector 404 (FIGS. 13, 14), and the first optical connector part 456 (FIG. 17). In some examples, the optical connector is not attached vertically to a photonic integrated circuit that is part of the optical/electrical communication interface 652 but rather can be attached in-plane to the photonic integrated circuit using, e.g., V-groove fiber attachments, tapered or un-tapered fiber edge coupling, etc., followed by a mechanism to direct the light interfacing to the photonic integrated circuit to a direction that is substantially perpendicular to the photonic integrated circuit, such as one or more substantially 90-degree turning mirrors, one or more substantially 90-degree bent optical fibers, etc. In some examples, a portion of the optical connector 668 can be part of the optical/electrical communication interface 652. In some examples, the optical connector 668 can also include the second optical connector part 223 (FIGS. 2, 4), 458 (FIG. 17) that is optically coupled to the optical fibers. FIG. 25 shows that the optical connector 668 passes through the front panel 656 and the circuit board 654. In some examples, the optical connector 668 can be short so that the optical fibers pass through, or partly through, the front panel 656. The optical fibers can also pass through, or partly through, the circuit board 654.

In the examples of FIGS. 24 and 25, only one optical/electrical communication interface (544, 652) is shown in the figures. It is understood that the systems 630, 650 can include multiple optical/electrical communication interfaces that are mounted on the same circuit board as the data processing chip to enable high bandwidth data paths (e.g., one, ten, or more Gigabits per second per data path) between the data processing chip and each of the optical/electrical communication interfaces.

Figure 26A:
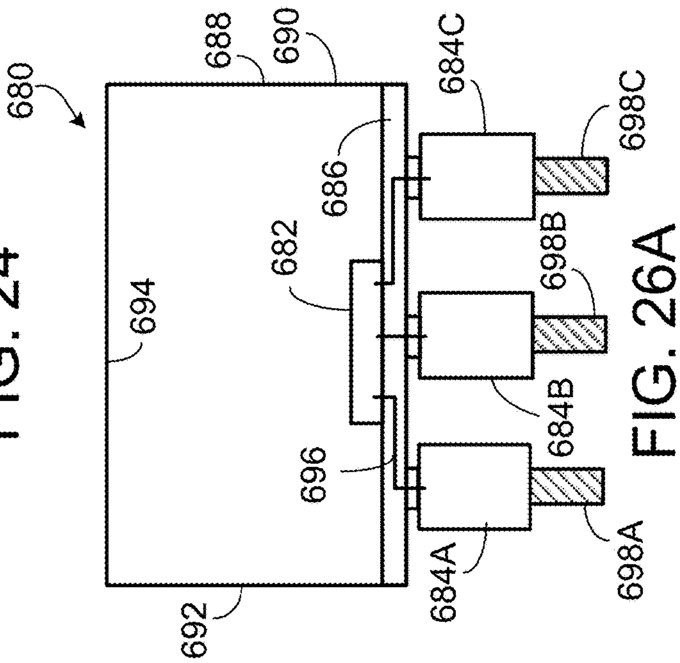

FIG. 26A is a top view of an example data processing system 680 in which a data processing chip 682 is mounted near optical/electrical communication interfaces 684A, 684B, 684C (collectively referenced as 684) to enable high bandwidth data paths (e.g., one, ten, or more Gigabits per second per data path) between the data processing chip 682 and each of the optical/electrical communication interfaces 684. The data processing chip 682 is mounted on a first side of a circuit board 686 that functions as a front panel of an enclosure 688 of the system 680. In some examples, the data processing chip 682 is mounted on a substrate (e.g., a ceramic substrate), and the substrate is attached to the circuit board 686. The optical/electrical communication interfaces 684 are mounted on a second side of the circuit board 686, in which the second side faces the exterior of the enclosure 688. In this example, the optical/electrical communication interfaces 684 are mounted on an exterior side of the enclosure 688, allowing optical fibers to be easily coupled to the optical/electrical communication interfaces 684.

The enclosure 688 has side panels 690 and 692, a rear panel 694, a top panel, and a bottom panel. In some examples, the circuit board 686 is perpendicular to the bottom panel. In some examples, the circuit board 686 is oriented at an angle in a range −60° to 60° (or −30° to 30°, or −10° to 10°, or −1° to 1°) relative to a vertical direction of the bottom panel.

Each of the optical/electrical communication interfaces 684 is electrically coupled to the data processing chip 682 by electrical connectors or traces 696 that pass through the circuit board 686 in the thickness direction. For example, the electrical connectors or traces 696 can be configured as vias of the circuit board 686. The signal paths between the data processing chip 682 and each of the optical/electrical communication interfaces 684 can be unidirectional or bidirectional, similar to those of the systems 630 and 650.

For example, the system 680 can be configured such that signals are transmitted unidirectionally between the data processing chip 682 and one of the optical/electrical communication interfaces 684, and bidirectionally between the data processing chip 682 and another one of the optical/electrical communication interfaces 684. For example, the system 680 can be configured such that signals are transmitted unidirectionally from the optical/electrical communication interface 684A to the data processing chip 682, and unidirectionally from the data processing chip to the optical/electrical communication interface 684B and/or optical/electrical communication interface 684C.

Optical connectors 698A, 698B, 698C (collectively referenced as 698) are provided to couple optical signals from the optical fibers to the optical/electrical communication interfaces 684A, 684B, 684C, respectively. The optical connectors 698 can be securely fixed, or releasably connected, to the optical/electrical communication interfaces 684, similar to those of the systems 630 and 650.

The optical/electrical communication interface 684 can be similar to, e.g., the integrated communication device 210 (FIG. 2), 252 (FIG. 4), 374 (FIG. 11), 382 (FIG. 12), 402 (FIG. 13), 428 (FIG. 14), and 512 (FIG. 32), except that the optical/electrical communication interface 684 is mounted on the side of the circuit board 686 opposite to the side of the data processing chip 682. In some examples, the optical/electrical communication interface 684 can be similar to the integrated optical communication device 448, 462, 466, 472 (FIG. 17). The optical connector 698 can be similar to, e.g., the first optical connector part 213 (FIGS. 2, 4), the first optical connector 356 (FIGS. 11, 12), the first optical connector 404 (FIGS. 13, 14), the first optical connector part 456 (FIG. 17), and the first optical connector part 520 (FIG. 32). In some examples, the optical connector is not attached vertically to a photonic integrated circuit that is part of the optical/electrical communication interface 684 but rather can be attached in-plane to the photonic integrated circuit using, e.g., V-groove fiber attachments, tapered or un-tapered fiber edge coupling, etc., followed by a mechanism to direct the light interfacing to the photonic integrated circuit to a direction that is substantially perpendicular to the photonic integrated circuit, such as one or more substantially 90-degree turning mirrors, one or more substantially 90-degree bent optical fibers, etc. In some examples, a portion of the optical connector 668 can be part of the optical/electrical communication interface 652. In some examples, the optical connector 668 can also include the second optical connector part 223 (FIGS. 2, 4), 458 (FIG. 17) that is optically coupled to the optical fibers.

In some examples, the optical/electrical communication interfaces 684 are securely fixed (e.g., by soldering) to the circuit board 686. In some examples, the optical/electrical communication interfaces 684 are removably connected to the circuit board 686, e.g., by use of mechanical mechanisms such as one or more snap-on or screw-on mechanisms. An advantage of the system 680 is that in case of a malfunction at one of the optical/electrical communication interfaces 684, the faulty optical/electrical communication interface 684 can be replaced without opening the enclosure 688.

Figure 26C:
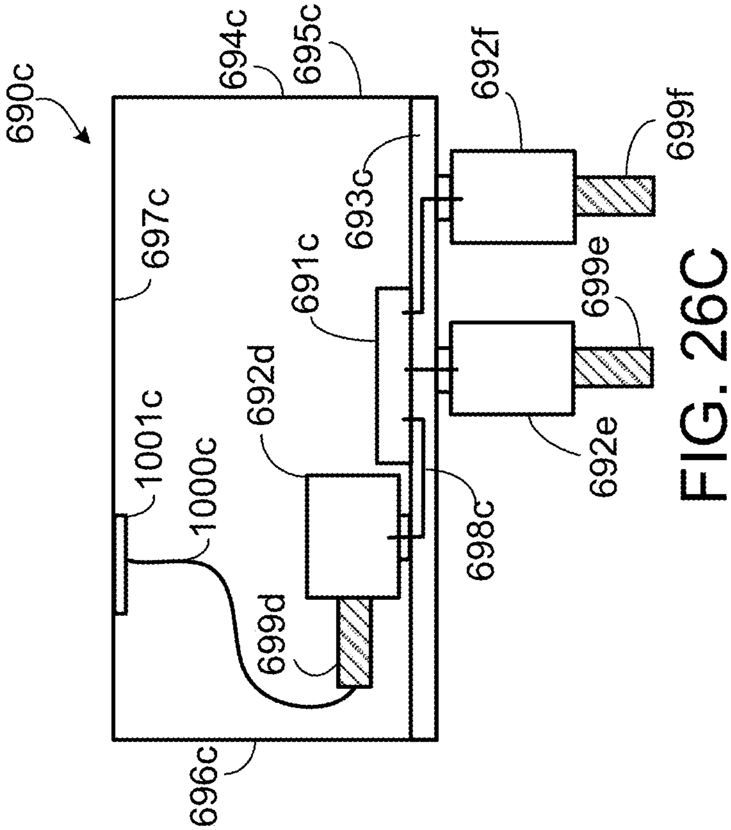
Figure 26B:
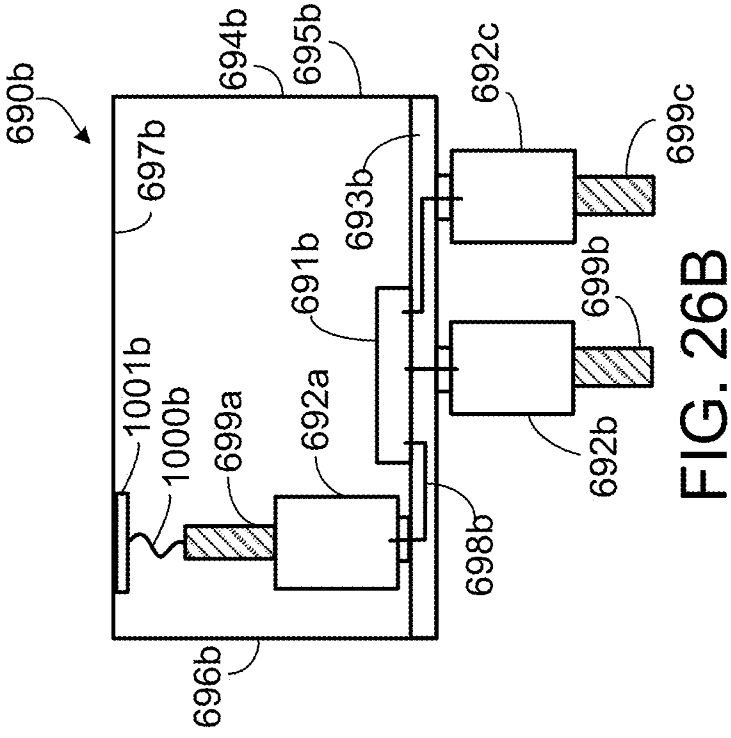

FIG. 26B is a top view of an example data processing system 690*b* in which a data processing chip 691*b* is mounted near optical/electrical communication interfaces 692*a*, 692*b*, 692*c* (collectively referenced as 692) to enable high bandwidth data paths (e.g., one, ten, or more Gigabits per second per data path) between the data processing chip 691*b* and each of the optical/electrical communication interfaces 692. The data processing chip 691*b* is mounted on a first side of a circuit board 693*b* that functions as a front panel of an enclosure 694*b* of the system 690*b*. In this example, the optical/electrical communication interface 692*a* is mounted on the first side of the circuit board 693*b* and the optical/electrical communication interfaces 692*b* and 692*c* are mounted on a second side of the circuit board 693*b*, in which the second side faces the exterior of the enclosure 694*b*. In this example, the optical/electrical communication interfaces 692*b* and 692*c* are mounted on an exterior side of the enclosure 694*b*, allowing connection to optical fiber from the front of the enclosure 694*b* while the optical/electrical communication interface 692*a* is located internal to the enclosure 694*b*, for example, to allow connection to optical fiber at the rear of the enclosure 694*b*. In some examples, two or more of the optical/electrical communication interfaces 692 can be located internal to the enclosure 694*b* and connect to optical fibers at the rear of the enclosure 694*b*.

The enclosure 694*b* has side panels 695*b* and 696*b*, a rear panel 697*b*, a top panel, and a bottom panel. In some examples, the circuit board 693*b* is perpendicular to the bottom panel. In some examples, the circuit board 693*b* is oriented at an angle in a range −60° to 60° (or −30° to 30°, or −10° to 10°, or −1° to 1°) relative to a vertical direction of the bottom panel.

Each of the optical/electrical communication interfaces 692 is electrically coupled to the data processing chip 691*b* by electrical connectors or traces 698*b* that pass through the circuit board 693*b* in the thickness direction. For example, the electrical connectors or traces 698*b* can be configured as vias of the circuit board 693*b*. In this example, the electrical connectors or traces 698*b* extend to both sides of the circuit board 693*b* (e.g., for connecting to optical/electrical communication interfaces 692 located internal to and external of the enclosure 694*b*). The signal paths between the data processing chip 691*b* and each of the optical/electrical communication interfaces 692 can be unidirectional or bidirectional, similar to those of the systems 630, 650 and 680.

For example, the system 690*b* can be configured such that signals are transmitted unidirectionally between the data processing chip 691*b* and one of the optical/electrical communication interfaces 692, and bidirectionally between the data processing chip 691*b* and another one of the optical/electrical communication interfaces 692. For example, the system 690*b* can be configured such that signals are transmitted unidirectionally from the optical/electrical communication interface 692*a* to the data processing chip 691*b*, and unidirectionally from the data processing chip 691*b* to the optical/electrical communication interface 692*b* and/or optical/electrical communication interface 692*c*.

Optical connectors 699*a*, 699*b*, 699*c* (collectively referenced as 699) are provided to couple optical signals from the optical fibers to the optical/electrical communication interfaces 692*a*, 692*b*, 692*c*, respectively. The optical connectors 699 can be securely fixed, or releasably connected, to the optical/electrical communication interfaces 692, similar to those of the systems 630, 650, and 680. In this example, optical connector 699*b* and optical connector 699*c* can connect to optical fibers at the front of the enclosure 694*b* and the optical connector 699*a* can connect to optical fibers at the rear of the enclosure 694*b*. In the illustrated example, the optical connector 699*a* connects to an optical fiber at the rear of the enclosure 694*b* by being connected to a fiber 1000*b* that connects to a rear panel interface 1001*b* (e.g., a backplane, etc.) that is mounted to the rear panel 697*b*. In some examples, the optical connectors 699 can be securely or fixedly attached to communication interfaces 692. In some examples, the optical connectors 699 can be securely or fixedly attached to an array of optical fibers.

The optical/electrical communication interface 692 can be similar to, e.g., the integrated communication device 210 (FIG. 2), 252 (FIG. 4), 374 (FIG. 11), 382 (FIG. 12), 402 (FIG. 13), 428 (FIG. 14), and 512 (FIG. 32), except that the optical/electrical communication interfaces 692*b* and 692*c* are mounted on the side of the circuit board 693*b* opposite to the side of the data processing chip 691*b*. In some examples, the optical/electrical communication interface 692 can be similar to the integrated optical communication device 448, 462, 466, 472 (FIG. 17). The optical connector 699 can be similar to, e.g., the first optical connector part 213 (FIGS. 2, 4), the first optical connector 356 (FIGS. 11, 12), the first optical connector 404 (FIGS. 13, 14), the first optical connector part 456 (FIG. 17), and the first optical connector part 520 (FIG. 32). In some examples, the optical connector is not attached vertically to a photonic integrated circuit that is part of the optical/electrical communication interface 692 but rather can be attached in-plane to the photonic integrated circuit using, e.g., V-groove fiber attachments, tapered or un-tapered fiber edge coupling, etc., followed by a mechanism to direct the light interfacing to the photonic integrated circuit to a direction that is substantially perpendicular to the photonic integrated circuit, such as one or more substantially 90-degree turning mirrors, one or more substantially 90-degree bent optical fibers, etc. In some examples, a portion of the optical connector 699 can be part of the optical/electrical communication interface 692. In some examples, the optical connector 699 can also include the second optical connector part 223 (FIGS. 2, 4), 458 (FIG. 17) that is optically coupled to the optical fibers.

In some examples, the optical/electrical communication interfaces 692 are securely fixed (e.g., by soldering) to the circuit board 693*b*. In some examples, the optical/electrical communication interfaces 692 are removably connected to the circuit board 693*b*, e.g., by use of mechanical mechanisms such as one or more snap-on or screw-on mechanisms. An advantage of the system 690*b* is that in case of a malfunction at one of the optical/electrical communication interfaces 692, the faulty optical/electrical communication interface 692 can be replaced without opening the enclosure 694*b*.

FIG. 26C is a top view of an example data processing system 690*c* in which a data processing chip 691*c* is mounted near optical/electrical communication interfaces 692*d*, 692*e*, 692*f* (collectively referenced as 692) to enable high bandwidth data paths (e.g., one, ten, or more Gigabits per second per data path) between the data processing chip 691*c* and each of the optical/electrical communication interfaces 692. The data processing chip 691*c* is mounted on a first side of a circuit board 693*c* that functions as a front panel of an enclosure 694*c* of the system 690*c*. In this example, the optical/electrical communication interface 692*d* is mounted on the first side of the circuit board 693*c* and the optical/electrical communication interfaces 692*e* and 692*f* are mounted on a second side of the circuit board 693*c*, in which the second side faces the exterior of the enclosure 694*c*. In this example, the optical/electrical communication interfaces 692*e* and 692*f* are mounted on an exterior side of the enclosure 694*c*, allowing connection to optical fibers from the front of the enclosure 694*c* while the optical/electrical communication interface 692*d* is located internal to the enclosure 694*c*, for example, to allow connection to optical fiber at the rear of the enclosure 694*c*. In some examples, two or more of the optical/electrical communication interfaces 692 can be located internal to the enclosure 694*c* and connect to optical fibers at the rear of the enclosure 694*c*.

The enclosure 694*c* has side panels 695*c* and 696*c*, a rear panel 697*c*, a top panel, and a bottom panel. In some examples, the circuit board 693*c* is perpendicular to the bottom panel. In some examples, the circuit board 693*c* is oriented at an angle in a range −60° to 60° (or −30° to 30°, or −10° to 10°, or −1° to 1°) relative to a vertical direction of the bottom panel.

Each of the optical/electrical communication interfaces 692 is electrically coupled to the data processing chip 691*c* by electrical connectors or traces 698*c* that pass through the circuit board 693*c* in the thickness direction. For example, the electrical connectors or traces 698*c* can be configured as vias of the circuit board 693*c*. In this example, the electrical connectors or traces 698*c* extend to both sides of the circuit board 693*b* (e.g., for connecting to optical/electrical communication interfaces 692 located internal to and external of the enclosure 694*b*. The signal paths between the data processing chip 691*c* and each of the optical/electrical communication interfaces 692 can be unidirectional or bidirectional, similar to those of the systems 630, 650 and 680.

For example, the system 690*c* can be configured such that signals are transmitted unidirectionally between the data processing chip 691*c* and one of the optical/electrical communication interfaces 692, and bidirectionally between the data processing chip 691*c* and another one of the optical/electrical communication interfaces 692. For example, the system 690*c* can be configured such that signals are transmitted unidirectionally from the optical/electrical communication interface 692*d* to the data processing chip 691*c*, and unidirectionally from the data processing chip 691*c* to the optical/electrical communication interface 692*e* and/or optical/electrical communication interface 692*f*.

Optical connectors 699*d*, 699*e*, 699*f* (collectively referenced as 699) are provided to couple optical signals from the optical fibers to the optical/electrical communication interfaces 692*d*, 692*e*, 692*f*, respectively. The optical connectors 699 can be securely fixed, or releasably connected, to the optical/electrical communication interfaces 692, similar to those of the systems 630, 650, and 680. In the illustrated example, the optical/electrical communication interfaces 692*d* and optical connector 699*d* are oriented differently compared to the optical/electrical communication interfaces 692*a* and optical connector 699*a* of FIG. 26B. Here the orientation change is a counter clockwise rotation of 90 degrees. Other types of orientation changes (e.g., rotations, pitches, tipping, etc.) may be implemented. Position changes (e.g., translations) and other types of location changes may also be employed. In this example, optical connector 699*e* and optical connector 699*f* can connect to optical fibers at the front of the enclosure 694*c* and the optical connector 699*d* can connect to optical fibers the rear of the enclosure 694*c*. In the illustrated example, the optical connector 699*d* connects to an optical fiber at the rear of the enclosure 694*c* by being connected to a fiber 1000*c* that connects to a rear panel interface 1001*c* (e.g., a backplane, etc.) that is mounted to the rear panel 697*c*.

The optical/electrical communication interface 692 can be similar to, e.g., the integrated communication device 210 (FIG. 2), 252 (FIG. 4), 374 (FIG. 11), 382 (FIG. 12), 402 (FIG. 13), 428 (FIG. 14), and 512 (FIG. 32), except that the optical/electrical communication interface 692*e* and 692*f* are mounted on the side of the circuit board 693*c* opposite to the side of the data processing chip 691*c*. In some examples, the optical/electrical communication interface 692 can be similar to the integrated optical communication device 448, 462, 466, 472 (FIG. 17). The optical connector 699 can be similar to, e.g., the first optical connector part 213 (FIGS. 2, 4), the first optical connector 356 (FIGS. 11, 12), the first optical connector 404 (FIGS. 13, 14), the first optical connector part 456 (FIG. 17), and the first optical connector part 520 (FIG. 32). In some examples, the optical connector is not attached vertically to a photonic integrated circuit that is part of the optical/electrical communication interface 692 but rather can be attached in-plane to the photonic integrated circuit using, e.g., V-groove fiber attachments, tapered or un-tapered fiber edge coupling, etc., followed by a mechanism to direct the light interfacing to the photonic integrated circuit to a direction that is substantially perpendicular to the photonic integrated circuit, such as one or more substantially 90-degree turning mirrors, one or more substantially 90-degree bent optical fibers, etc. In some examples, a portion of the optical connector 699 can be part of the optical/electrical communication interface 692. In some examples, the optical connector 699 can also include the second optical connector part 223 (FIGS. 2, 4), 458 (FIG. 17) that is optically coupled to the optical fibers.

In some examples, the optical/electrical communication interfaces 692 are securely fixed (e.g., by soldering) to the circuit board 693*c*. In some examples, the optical/electrical communication interfaces 692 are removably connected to the circuit board 693*c*, e.g., by use of mechanical mechanisms such as one or more snap-on or screw-on mechanisms. An advantage of the system 690*c* is that in case of a malfunction at one of the optical/electrical communication interfaces 692, the faulty optical/electrical communication interface 692 can be replaced without opening the enclosure 694*c*.

Figure 27:
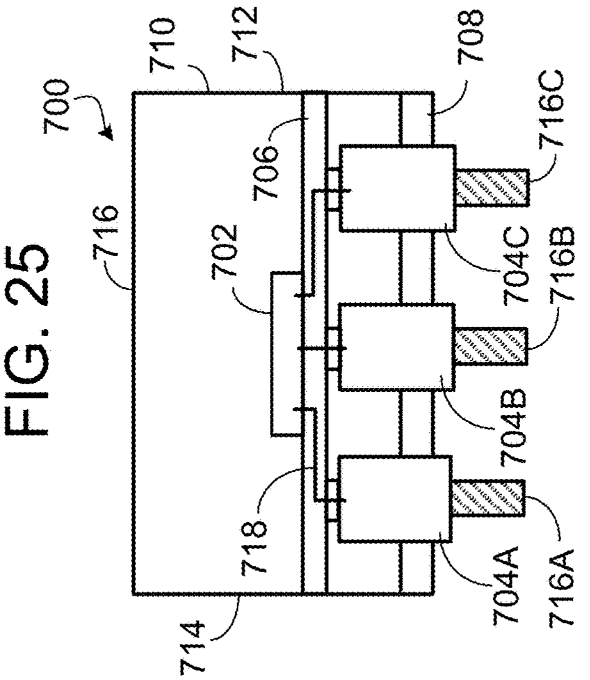

FIG. 27 is a top view of an example data processing system 700 in which a data processing chip 702 is mounted near optical/electrical communication interfaces 704*a*, 704*b*, 704*c* (collectively referenced as 704) to enable high bandwidth data paths (e.g., one, ten, or more Gigabits per second per data path) between the data processing chip 702 and each of the optical/electrical communication interfaces 704. The data processing chip 702 is mounted on a first side of a circuit board 706 that is positioned near a front panel of an enclosure 710 of the system 700, similar to the configuration of the system 650 (FIG. 25). In some examples, the data processing chip 702 is mounted on a substrate (e.g., a ceramic substrate), and the substrate is attached to the circuit board 706. The optical/electrical communication interfaces 704 are mounted on a second side of the circuit board 708. In this example, the optical/electrical communication interfaces 704 pass through openings in the front panel 708, allowing optical fibers to be easily coupled to the optical/electrical communication interfaces 704.

The enclosure 710 has side panels 712 and 714, a rear panel 716, a top panel, and a bottom panel. In some examples, the circuit board 706 and the front panel 708 are oriented at an angle in a range −60° to 60° relative to a vertical direction of the bottom panel. In some examples, the circuit board 706 is substantially parallel to the front panel 708, e.g., the angle between the surface of the circuit board 706 and the surface of the front panel 708 can be in a range of −5° to 5°. In some examples, the circuit board 706 is at an angle relative to the front panel 708, in which the angle is in a range of −45° to 45°.

For example, the angle can refer to a rotation around an axis that is parallel to the larger dimension of the front panel (e.g., the width dimension in a typical 1U, 2U, or 4U rackmount device), or a rotation around an axis that is parallel to the shorter dimension of the front panel (e.g., the height dimension in the 1U, 2U, or 4U rackmount device). The angle can also refer to a rotation around an axis along any other direction. For example, the circuit board 706 is positioned relative to the front panel such that components such as the interconnection modules, including optical modules or photonic integrated circuits, mounted on or attached to the circuit board 706 can be accessed through the front side, either through one or more openings in the front panel, or by opening the front panel to expose the components, without the need to separate the top or side panels from the bottom panel. Such orientation of the circuit board (or a substrate on which a data processing module is mounted) relative to the front panel also applies to the examples shown in FIGS. 21 to 26, 28B to 29B, 69A, 70, 71A, 72, 73A, 74A, 75A, 75C, 76, 77A, 77B, 78, 96 to 98, 100, 110, 112, 113, 115, 117 to 122, 125A to 127, and 129 to 131.

Each of the optical/electrical communication interfaces 704 is electrically coupled to the data processing chip 702 by electrical connectors or traces 718 that pass through the circuit board 706 in the thickness direction, similar to those of the system 680 (FIG. 26). The signal paths between the data processing chip 702 and each of the optical/electrical communication interfaces 704 can be unidirectional or bidirectional, similar to those of the system 630 (FIG. 24), 650 (FIG. 25), and 680 (FIG. 26).

Optical connectors 716*a*, 716*b*, 716*c* (collectively referenced as 716) are provided to couple optical signals from the optical fibers to the optical/electrical communication interfaces 704*a*, 704*b*, 704*c*, respectively. The optical connectors 716 can be securely fixed, or releasably connected, to the optical/electrical communication interfaces 704, similar to those of the systems 630, 650, and 680.

The optical/electrical communication interface 704 can be similar to, e.g., the integrated communication device 210 (FIG. 2), 252 (FIG. 4), 374 (FIG. 11), 382 (FIG. 12), 402 (FIG. 13), 428 (FIG. 14), and 512 (FIG. 32), except that the optical/electrical communication interface 704 is mounted on the side of the circuit board 706 opposite to the side of the data processing chip 702. In some examples, the optical/electrical communication interface 704 can be similar to the integrated optical communication device 448, 462, 466, 472 (FIG. 17). The optical connector 716 can be similar to, e.g., the first optical connector part 213 (FIGS. 2, 4), the first optical connector 356 (FIGS. 11, 12), the first optical connector 404 (FIGS. 13, 14), the first optical connector part 456 (FIG. 17), and the first optical connector part 520 (FIG. 32). In some examples, the optical connector is not attached vertically to a photonic integrated circuit that is part of the optical/electrical communication interface 704 but rather can be attached in-plane to the photonic integrated circuit using, e.g., V-groove fiber attachments, tapered or un-tapered fiber edge coupling, etc., followed by a mechanism to direct the light interfacing to the photonic integrated circuit to a direction that is substantially perpendicular to the photonic integrated circuit, such as one or more substantially 90-degree turning mirrors, one or more substantially 90-degree bent optical fibers, etc. In some examples, a portion of the optical connector 716 can be part of the optical/electrical communication interface 704. In some examples, the optical connector 716 can also include the second optical connector part 223 (FIGS. 2, 4), 458 (FIG. 17) that is optically coupled to the optical fibers.

In some examples, the optical/electrical communication interfaces 704 are securely fixed (e.g., by soldering) to the circuit board 706. In some examples, the optical/electrical communication interfaces 704 are removably connected to the circuit board 706, e.g., by use of mechanical mechanisms such as one or more snap-on or screw-on mechanisms. An advantage of the system 700 is that in case of a malfunction at one of the optical/electrical communication interfaces 704, the faulty optical/electrical communication interface 704 can unplugged or decoupled from the circuit board 706 and replaced without opening the enclosure 710.

In some implementations, the optical/electrical communication interfaces 704 do not protrude through openings in the front panel 708. For example, each optical/electrical communication interface 704 can be at a distance behind the front panel 708, and a fiber patchcord or pigtail can connect the optical/electrical communication interface 704 to an optical connector on the front panel 708, similar to the examples shown in FIGS. 77A, 77B, 78, 125A, 125B, 129, and 130. In some examples, the front panel 708 is configured to be removable or to be able to open to allow servicing of communication interface 704, similar to the examples shown in FIGS. 77A, 125A, and 130.

Figure 28A:
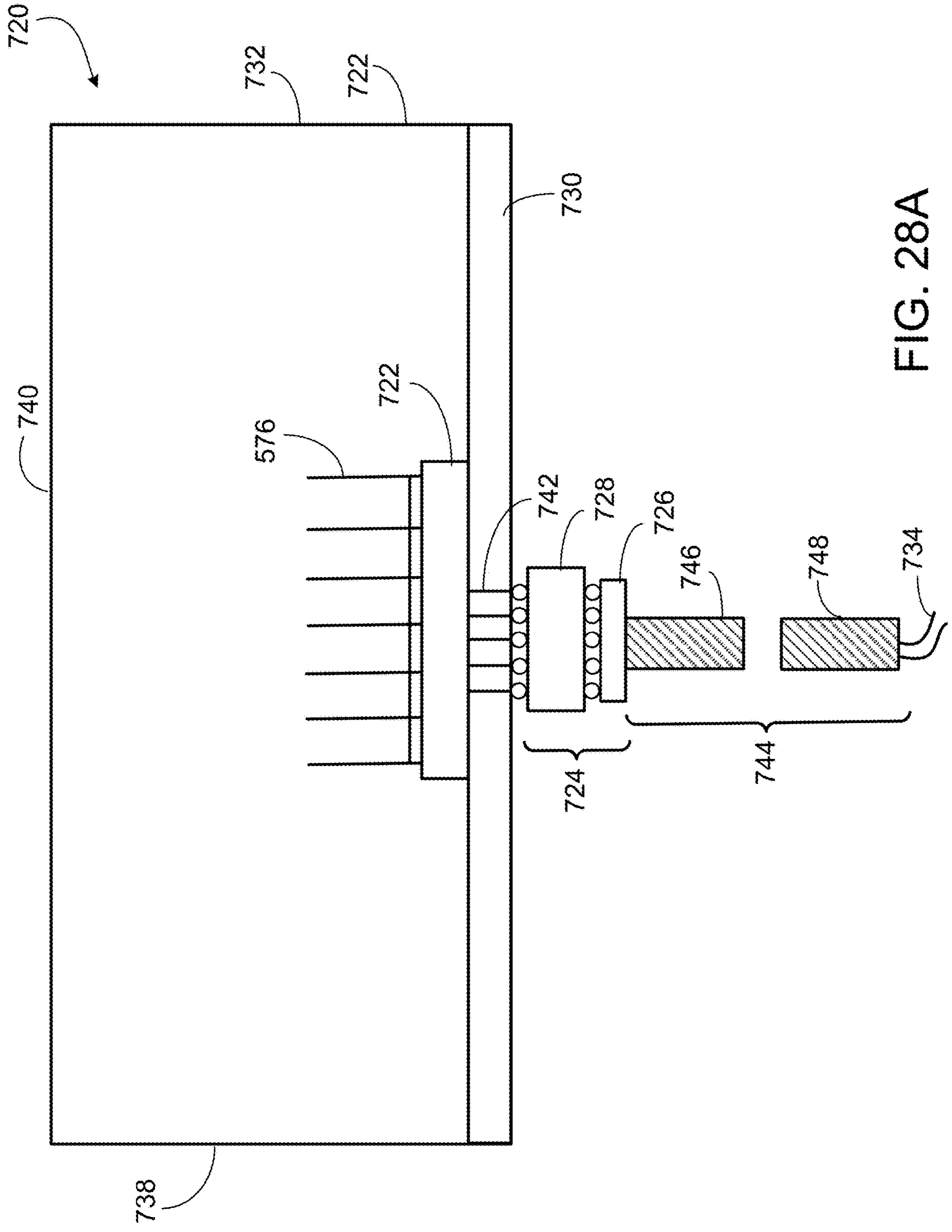

FIG. 28A is a top view of an example data processing system 720 in which a data processing chip 722 is mounted near an optical/electrical communication interface 724 to enable high bandwidth data paths (e.g., one, ten, or more Gigabits per second per data path) between the data processing chip 720 and the optical/electrical communication interface 724. The data processing chip 722 is mounted on a first side of a circuit board 730 that functions as a front panel of an enclosure 732 of the system 720. In some examples, the data processing chip 722 is mounted on a substrate (e.g., a ceramic substrate), and the substrate is attached to the circuit board 730. The optical/electrical communication interface 724 is mounted on a second side of the circuit board 730, in which the second side faces the exterior of the enclosure 732. In this example, the optical/electrical communication interface 724 is mounted on an exterior side of the enclosure 732, allowing optical fibers 734 to be easily coupled to the optical/electrical communication interface 724.

The enclosure 732 has side panels 736 and 738, a rear panel 740, a top panel, and a bottom panel. In some examples, the circuit board 730 is perpendicular to the bottom panel. In some examples, the circuit board 730 is oriented at an angle in a range −60° to 60° relative to a vertical direction of the bottom panel.

The optical/electrical communication interface 724 includes a photonic integrated circuit 726 mounted on a substrate 728 that is electrically coupled to the circuit board 730. The optical/electrical communication interface 724 is electrically coupled to the data processing chip 722 by electrical connectors or traces 742 that pass through the circuit board 730 in the thickness direction. For example, the electrical connectors or traces 742 can be configured as vias of the circuit board 730. The signal paths between the data processing chip 722 and the optical/electrical communication interface 724 can be unidirectional or bidirectional, similar to those of the systems 630, 650, 680, and 700.

An optical connector 744 is provided to couple optical signals from the optical fibers 734 to the optical/electrical communication interface 724. The optical connector 744 can be securely fixed, or removably connected, to the optical/electrical communication interface 744, similar to those of the systems 630, 650, 680, and 700.

In some implementations, the optical/electrical communication interface 724 can be similar to, e.g., the integrated communication device 448, 462, 466, and 472 of FIG. 17. The optical signals from the optical fibers are processed by the photonic integrated circuit 726, which generates serial electrical signals based on the optical signals. For example, the serial electrical signals are amplified by a set of transimpedance amplifiers and drivers (which can be part of the photonic integrated circuit 726 or a serializers/deserializers module in the data processing chip 722), which drives the output signals that are transmitted to the serializers/deserializers module embedded in the data processing chip 722.

The optical connector 744 includes a first optical connector 746 and a second optical connector 748, in which the second optical connector 748 is optically coupled to the optical fibers 734. The first optical connector 746 can be similar to, e.g., the first optical connector part 213 (FIGS. 2, 4), the first optical connector 356 (FIGS. 11, 12), the first optical connector 404 (FIGS. 13, 14), the first optical connector part 456 (FIG. 17), and the first optical connector part 520 (FIG. 32). The second optical connector 748 can be similar to the second optical connector part 223 (FIGS. 2, 4) and 458 (FIG. 17). In some examples, the optical connectors 746 and 748 can form a single piece such that the optical/electrical communication interface 724 is securely or fixedly attached to a fiber bundle. In some examples, the optical connector is not attached vertically to the photonic integrated circuit 726 but rather can be attached in-plane to the photonic integrated circuit using, e.g., V-groove fiber attachments, tapered or un-tapered fiber edge coupling, etc., followed by a mechanism to direct the light interfacing to the photonic integrated circuit to a direction that is substantially perpendicular to the photonic integrated circuit, such as one or more substantially 90-degree turning mirrors, one or more substantially 90-degree bent optical fibers, etc.

In some examples, the optical/electrical communication interface 724 is securely fixed (e.g., by soldering) to the circuit board 730. In some examples, the optical/electrical communication interface 724 is removably connected to the circuit board 730, e.g., by use of mechanical mechanisms such as one or more snap-on or screw-on mechanisms. An advantage of the system 720 is that in case of a malfunction of the optical/electrical communication interface 724, the faulty optical/electrical communication interface 724 can be replaced without opening the enclosure 732.

Figure 28B:
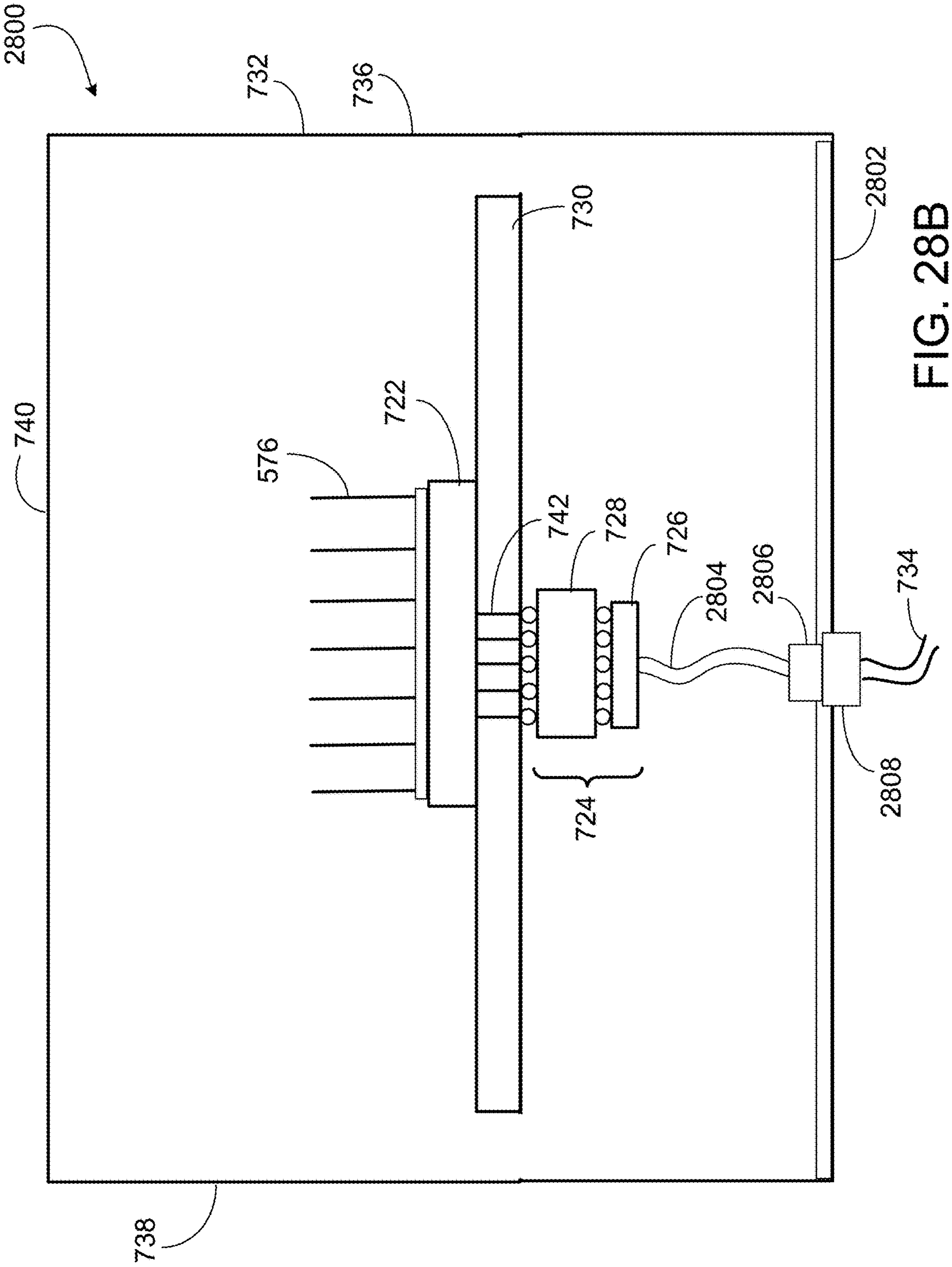

FIG. 28B is a top view of an example data processing system 2800 that is similar to the system 720 of FIG. 28A, except that the circuit board 730 that is recessed from a front panel 2802 of an enclosure 732 of the system 2800. The photonic integrated circuit 726 is optically coupled through a fiber patchcord or pigtail 2804 to a first optical connector 2806 attached to the inner side of the front panel 2802. The first optical connector 2806 is optically coupled to a second optical connector 2808 attached to the outer side of the front panel 2802. The second optical connector 2808 is optically coupled to the exterior optical fibers 734.

The technique of using a fiber patchcord or pigtail to optically couple the photonic integrated circuit to the optical connector attached to the inner side of the front panel can also be applied to the data processing system 700 of FIG. 27. For example, the modified system can have a recessed substrate or circuit board, multiple co-packaged optical modules (e.g., 704) mounted on the opposite side of the data processing chip 702 relative to the substrate or circuit board, and fiber jumpers (e.g., 2804) optically coupling the co-packaged optical modules to the front panel.

In the examples of FIGS. 28A and 28B, the data processing chip 722 can be mounted on a substrate that is electrically coupled to the circuit board 730.

In each of the examples in FIGS. 24, 25, 26, 27, and 28, the optical/electrical communication interface 644, 652, 684, 704, and 724 can be electrically coupled to the circuit board 642, 654, 686, 706, and 730, respectively, using electrical contacts that include one or more of spring-loaded elements, compression interposers, and/or land-grid arrays.

Figure 29A:
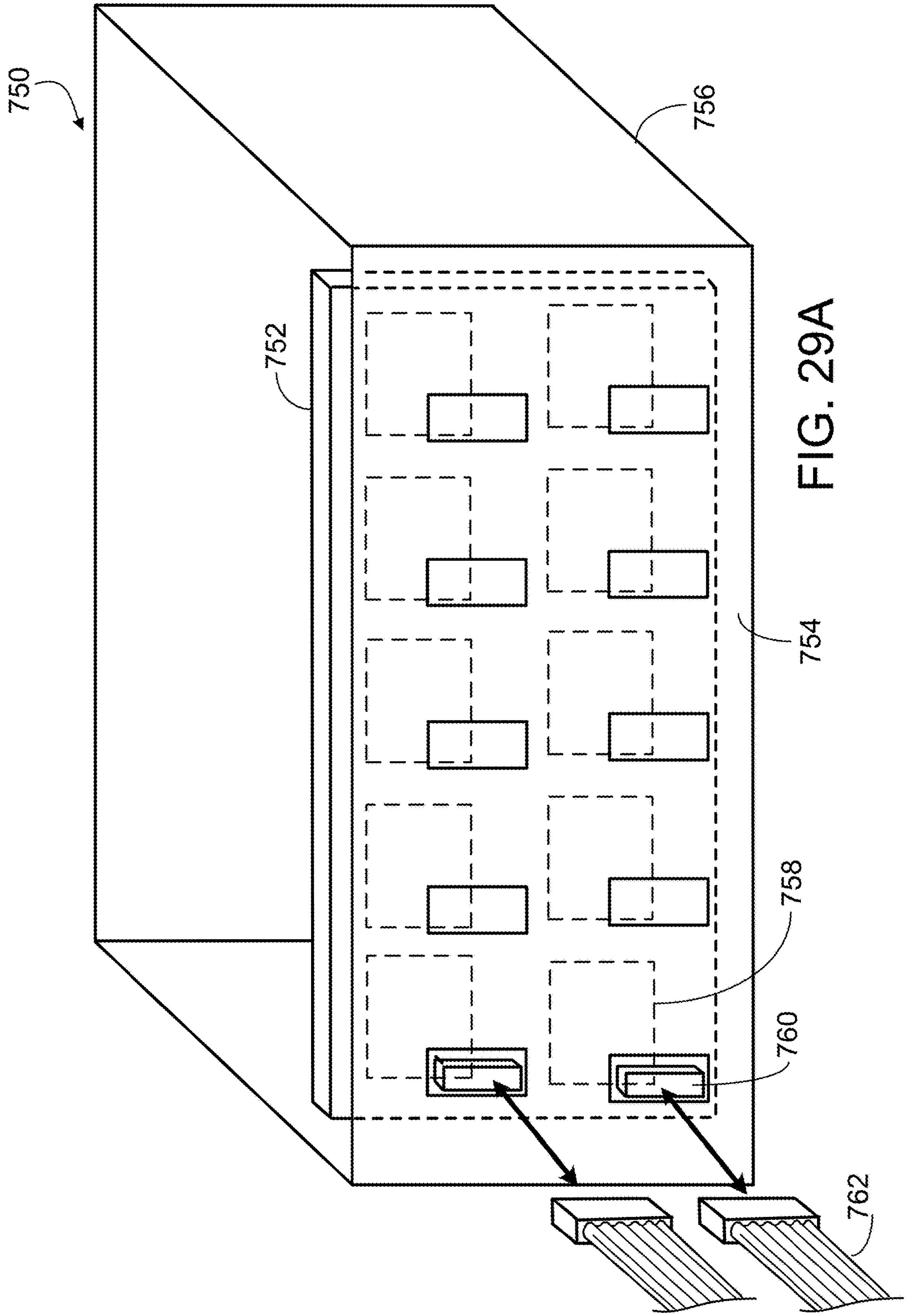
FIGS. 29A and 29B are diagrams of an example rackmount data processing system incorporating multiple optical interconnect modules.

FIG. 29A is a diagram of an example data processing system 750 that includes a vertically mounted circuit board 752 that enables high bandwidth data paths (e.g., one, ten, or more Gigabits per second per data path) between data processing chips 758 and optical/electrical communication interfaces 760. The data processing chips 758 and the optical/electrical communication interfaces 760 are mounted on the circuit board 752, in which each data processing chip 758 is electrically coupled to a corresponding optical/electrical communication interface 760. The data processing chips 758 are electrically coupled to one another by electrical connectors (e.g., electrical signal lines on one or more layers of the circuit board 752).

The data processing chips 758 can be similar to, e.g., the electronic processor integrated circuit, data processing chip, or host application specific integrated circuit 240 (FIGS. 2, 4, 6, 7, 11, 12), digital application specific integrated circuit 444 (FIG. 17), data processor 502 (FIG. 20), data processing chip 572 (FIGS. 22, 23), 640 (FIG. 24), 670 (FIG. 25), 682 (FIG. 26A), 702 (FIG. 27), and 722 (FIG. 28). Each of the data processing chips 758 can be, e.g., a network switch, a central processor unit, a graphics processor unit, a tensor processing unit, a neural network processor, an artificial intelligence accelerator, a digital signal processor, a microcontroller, or an application specific integrated circuit (ASIC).

Although the figure shows that the optical/electrical communication interfaces 760 are mounted on the side of the circuit board 752 facing the front panel 754, the optical/electrical communication interfaces 760 can also be mounted on the side of the circuit board 752 facing the interior of the enclosure 756. The optical/electrical communication interfaces 760 can be similar to, e.g., the integrated communication devices 210 (FIGS. 2, 3, 10), 252 (FIGS. 4, 5), 262 (FIG. 6), the integrated optical communication devices 282 (FIGS. 7-9), 374 (FIG. 11), 382 (FIG. 12), 390 (FIG. 13), 428 (FIG. 14), 402 (FIGS. 15, 16), 448, 462, 466, 472 (FIG. 17), the integrated communication devices 574 (FIG. 22), 612 (FIG. 23), and the optical/electrical communication interfaces 644 (FIG. 24), 652 (FIG. 25), 684 (FIG. 26), 704 (FIG. 27).

The circuit board 752 is positioned near a front panel 754 of an enclosure 756, and optical signals are coupled to the optical/electrical communication interfaces 760 through optical paths that pass through openings in the front panel 754. This allows users to conveniently removably connect optical fiber cables 762 to the input/output interfaces 760. The position and orientation of the circuit board 752 relative to the enclosure 756 can be similar to, e.g., those of the circuit board 654 (FIG. 25) and 706 (FIG. 27).

In some implementations, the data processing system 750 can include multiple types of optical/electrical communication interfaces 760. For example, some of the optical/electrical communication interfaces 760 can be mounted on the same side of the circuit board 752 as the corresponding data processing chip 758, and some of the optical/electrical communication interfaces 760 can be mounted on the opposite side of the circuit board 752 as the corresponding data processing chip 758. Some of the optical/electrical communication interfaces 760 can include first and second serializers/deserializers modules, and the corresponding data processing chips 758 can include third serializers/deserializers modules, similar to the examples in FIGS. 2-8, 11-14, 20, 22, and 23. Some of the optical/electrical communication interfaces 760 can include no serializers/deserializers module, and the corresponding data processing chips 758 can include serializers/deserializers modules, similar to the example of FIG. 17. Some of the optical/electrical communication interfaces 760 can include sets of transimpedance amplifiers and drivers, either embedded in the photonic integrated circuits or in separate chips external to the photonic integrated circuits. Some of the optical/electrical communication interfaces 760 do not include transimpedance amplifiers and drivers, in which sets of transimpedance amplifiers and drivers are included in the corresponding data processing chips 758. The data processing system 750 can also include electrical communication interfaces that interface to electrical cables, such as high speed PCIe cables, Ethernet cables, or Thunderbolt™ cables. The electrical communication interfaces can include modules that perform various functions, such as translation of communication protocols and/or conditioning of signals.

Other types of connections may be present and associated with circuit board 752 and other boards included in the enclosure 756. For example, two or more circuit boards (e.g., vertically mounted circuit boards) can be connected which may or may not include the circuit board 752. For instances in which circuit board 752 is connected to at least one other circuit board (e.g., vertically mounted in the enclosure 756), one or more connection techniques can be employed. For example, an optical/electrical communication interface (e.g., similar to optical/electrical communication interfaces 760) can be used to connect data processing chips 758 to other circuit boards. Interfaces for such connections can be located on the same side of the circuit board 752 that the processing chips 758 are mounted. In some implementations, interfaces can be located on another portion of the circuit board (e.g., a side that is opposite from the side that the processing chips 758 are mounted). Connections can utilize other portions of the circuit board 752 and/or one or more other circuit boards present in the enclosure 756. For example an interface can be located on an edge of one or more of the boards (e.g., an upper edge of a vertically mounted circuit board) and the interface can connect with one or more other interfaces (e.g., the optical/electrical communication interfaces 760, another edge mounted interface, etc.). Through such connections, two or more circuit boards can connect, receive and send signals, etc.

In the example shown in FIG. 29A, the circuit board 752 is placed near the front panel 754. In some examples, the circuit board 752 can also function as the front panel, similar to the examples in FIGS. 22-24, 26, and 28.

Figure 29B:
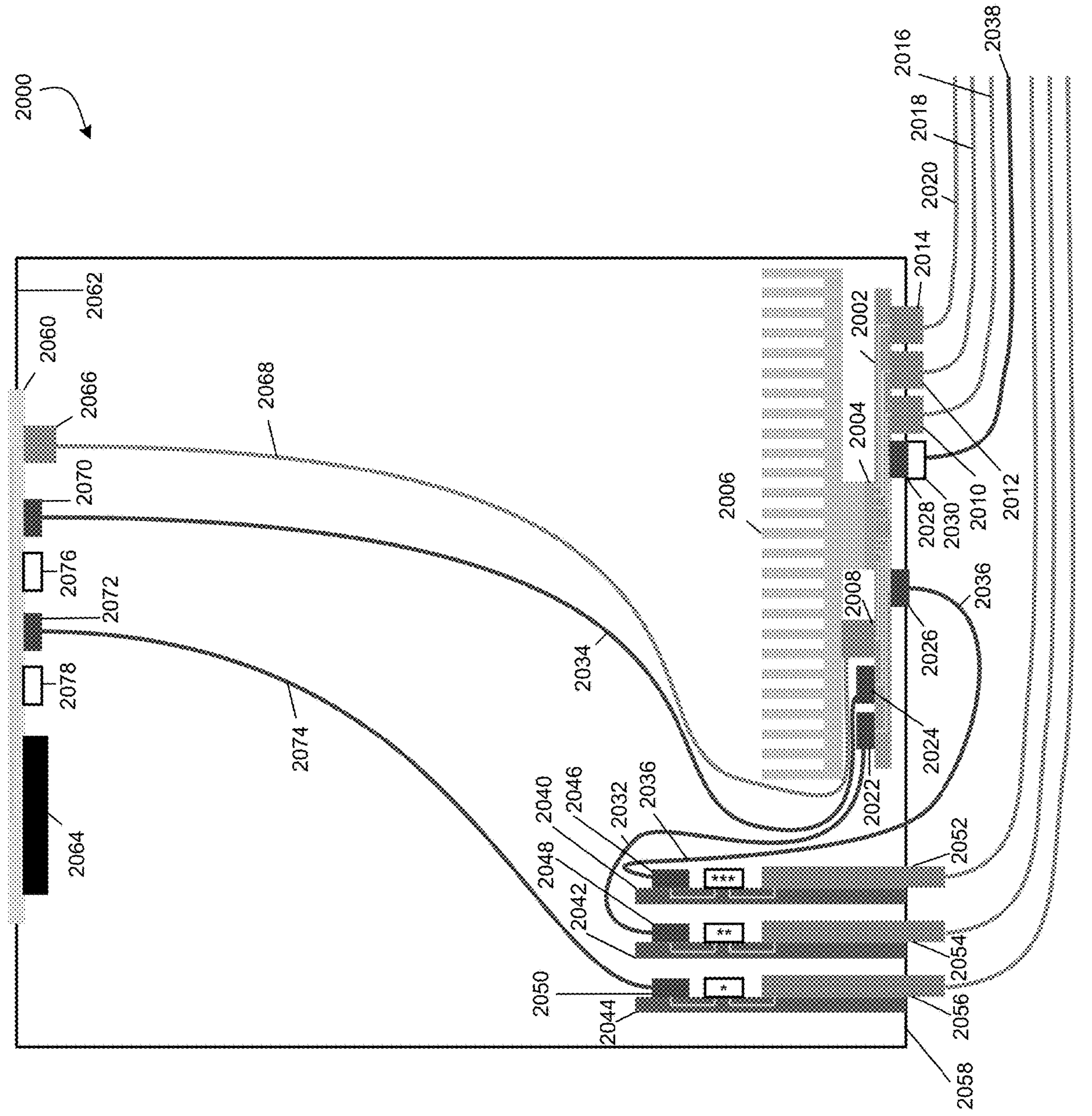

FIG. 29B is a diagram of an example data processing system 2000 that illustrates some of the configurations described with respect to FIGS. 26A to 26C and FIG. 29A along with other capabilities. The system 2000 includes a vertically mounted printed circuit board 2002 (or, e.g., a substrate) upon which is mounted a data processing chip 2004 (e.g., an ASIC), and a heat sink 2006 is thermally coupled to the data processing chip 2004. Optical/electrical communication interfaces are mounted on both sides of the printed circuit board 2002. In particular, optical/electrical communication interface 2008 is mounted on the same side of the printed circuit board 2002 as the data processing chip 2004. In this example, optical/electrical communication interfaces 2010, 2012, and 2014 are mounted on an opposite side of the printed circuit board 2002. To send and receive signals (e.g., with other optical/electrical communication interfaces), each of the optical/electrical communication interfaces 2010, 2012, and 2014 connects to optical fibers 2016, 2018, 2020, respectively. Electrical connection sockets/connectors can also be mounted to one or more sides of the printed circuit board 2002 for sending and receiving electrical signals, for example. In this example, two electrical connection sockets/connectors 2022 and 2024 are mounted to the side of the printed circuit board 2002 that the data processing chip 2004 is mounted and two electrical connection sockets/connectors 2026 and 2028 are mounted to the opposite side of the printed circuit board 2002. In this example, electrical connection sockets/connector 2028 is connected (or includes) a timing module 2030 that provides various functionality (e.g., regenerate data, retime data, maintain signal integrity, etc.). To send and receive electrical signals, each of the electrical connection sockets/connectors 2022-2028 are connected to electrical connection cables 2032, 2034, 2036, 2038, respectively. One or more types of connection cables can be implemented, for example, fly-over cables can be employed for connecting to one or more of the electrical connection sockets/connectors 2022-2028.

In this example, the system 2000 includes vertically mounted line cards 2040, 2042, 2044. In this particular example, line card 2040 includes an electrical connection sockets/connector 2046 that is connected to electrical cable 2036, and line card 2042 includes an electrical connection sockets/connector 2048 that is connected to electrical cable 2032. Line card 2044 includes an electrical connection sockets/connector 2050. Each of the line cards 2040, 2042, 2044 include pluggable optical modules 2052, 2054, 2056 that can implement various interface techniques (e.g., QSFP, QSFP-DD, XFP, SFP, CFP).

In this particular example, the printed circuit board 2002 is approximate to a forward panel 2058 of the system 2000; however, the printed circuit board 2002 can be positioned in other locations within the system 2000. Multiple printed circuit boards can also be included in the system 2000. For example, a second printed circuit board 2060 (e.g., a backplane) is included in the system 2000 and is located approximate to a back panel 2062. By locating the printed circuit board 2060 towards the rear, signals (e.g., data signals) can be sent to and received from other systems (e.g., another switch box) located, for example, in the same switch rack or other location as the system 2000. In this example, a data processing chip 2064 is mounted to the printed circuit board 2060 that can perform various operations (e.g., data processing, prepare data for transmission, etc.). Similar to the printed circuit board 2002 located forward in the system 2000, the printed circuit board 2060 includes an optical/electrical communication interface 2066 that communicates with the optical/electrical communication interface 2008 (located on the same side on printed circuit board 2002 as data processing chip 2004) using optical fibers 2068. The printed circuit board 2060 includes electrical connection sockets/connectors 2070 that uses the electrical connection cable 2034 to send electrical signals to and receive electrical signals from the electrical connection sockets/connectors 2024. The printed circuit board 2060 can also communicate with other components of the system 2000, for example, one or more of the line cards. As illustrated in the figure, electrical connection sockets/connectors 2072 located on the printed circuit board 2060 uses the electrical connection cable 2074 to send electrical signals to and/or receive electrical signals from the electrical connection sockets/connector 2050 of the line card 2044. Similar to the printed circuit board 2002, other portions of the system 2000 can include timing modules. For example, the line cards 2040, 2042, and 2044 can include timing modules (respectively identified with symbol, "", and "*"). Similarly, the second circuit board 2060 can include timing modules such as timing modules 2076 and 2078 for regenerating data, re-timing data, maintaining signal integrity, etc.

A feature of some of the systems described in this document is that the main data processing module(s) of a system, such as switch chip(s) in a switch server, and the communication interface modules that support the main data processing module(s), are configured to allow convenient access by users. In the examples shown in FIGS. 21 to 29B, 69A, 70, 71A, 72, 72A, 74A, 75A, 75C, 76, 77A, 77B, 78, 96 to 98, 100, 110, 112, 113, 115, 117 to 122, 125A to 127, 129, 136 to 149, 159, and 160, the main data processing module and the communication interface modules are positioned near the front panel, the rear panel, or both, and allow easy access by the user through the front/rear panel. However, it is also possible to position the main data processing module and the communication interface modules near one or more side panels, the top panel, the bottom panel, or two or more of the above, depending on how the system is placed in the environment. In a system that includes multiple racks of rackmount devices (see e.g., FIGS. 76 and 86), the communication interfaces (e.g., co-packaged optical modules) in each rackmount device can be conveniently accessed without the need to remove the rackmount device from the rack and opening up the housing in order to expose the inner components.

In some implementations, for a single rack of rackmount servers where there is open space at the front, rear, left, and right side of the rack, in each rackmount server, it is possible to place a first main data processing module and the communication interface modules supporting the first main data processing module near the front panel, place a second main data processing module and the communication interface modules supporting the second main data processing module near the left panel, place a third main data processing module and the communication interface modules supporting the third main data processing module near the right panel, and place a fourth main data processing module and the communication interface modules supporting the fourth main data processing module near the rear panel. The thermal solutions, including the placement of fans and heat dissipating devices, and the configuration of airflows around the main data processing modules and the communication interface modules, are adjusted accordingly.

For example, if a data processing server is mounted to the ceiling of a room or a vehicle, the main data processing module and the communication interface modules can be positioned near the bottom panel for easy access. For example, if a data processing server is mounted beneath the floor panel of a room or a vehicle, the main data processing module and the communication interface modules can be positioned near the top panel for easy access. The housing of the data processing system does not have to be in a box shape. For example, the housing can have curved walls, be shaped like a globe, or have an arbitrary three-dimensional shape.

Figure 30:
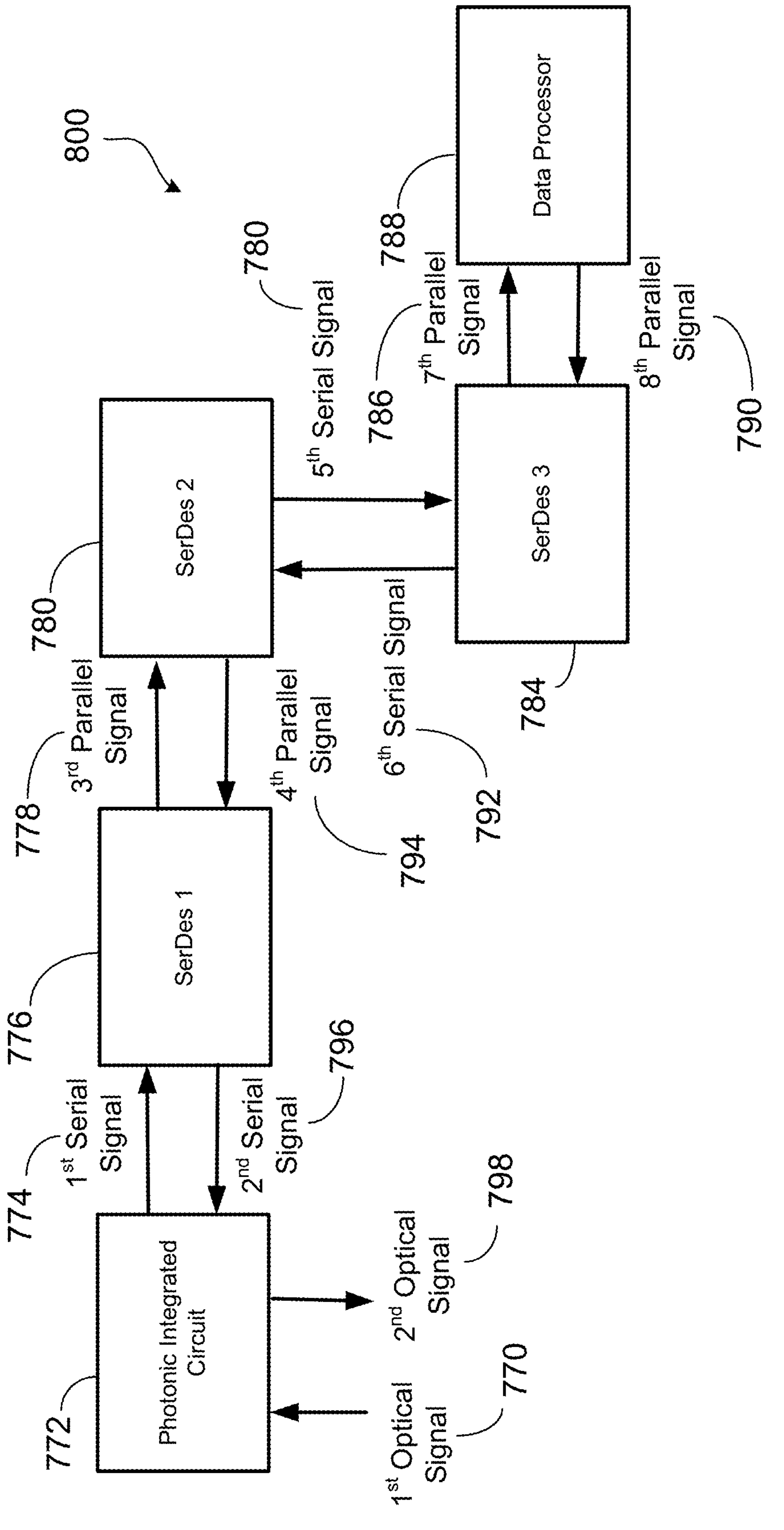
FIGS. 30 and 31 are block diagrams of example data processing systems.

FIG. 30 is a diagram of an example high bandwidth data processing system 800 that can be similar to, e.g., systems 200 (FIGS. 2, 20), 250 (FIG. 4), 260 (FIG. 6), 280 (FIG. 7), 350 (FIG. 11), 380 (FIG. 12), 390 (FIG. 13), 420 (FIG. 14), 560 (FIG. 22), 600 (FIG. 23), 630 (FIG. 24), and 650 (FIG. 25) described above. A first optical signal 770 is transmitted from an optical fiber to a photonic integrated circuit 772, which generates a first serial electrical signal 774 based on the first optical signal. The first serial electrical signal 774 is provided to a first serializers/deserializers module 776, which converts the first serial electrical signal 774 to a third set of parallel signals 778. The first serializers/deserializers module 776 conditions the serial electrical signal upon conversion into the parallel electrical signals, in which the signal conditioning can include, e.g., one or more of clock and data recovery, and signal equalization. The third set of parallel signals 778 is provided to a second serializers/deserializers module 780, which generates a fifth serial electrical signal 782 based on the third set of parallel signals 778. The fifth serial electrical signal 782 is provided to a third serializers/deserializers module 784, which generates a seventh set of parallel signals 786 that is provided to a data processor 788.

In some implementations, the photonic integrated circuit 772, the first serializers/deserializers module 776, and the second serializers/deserializers module 780 can be mounted on a substrate of an integrated communication device, an optical/electrical communication interface, or an input/output interface module. The first serializers/deserializers module 776 and the second serializers/deserializers module 780 can be implemented in a single chip. In some implementations, the third serializers/deserializers module 784 can be embedded in the data processor 788, or the third serializers/deserializers module 784 can be separate from the data processor 788.

The data processor 788 generates an eighth set of parallel signals 790 that is sent to the third serializers/deserializers module 784, which generates a sixth serial electrical signal 792 based on the eighth set of parallel signals 790. The sixth serial electrical signal 792 is provided to the second serializers/deserializers module 780, which generates a fourth set of parallel signals 794 based on the sixth serial electrical signal 792. The second serializers/deserializers module 780 can condition the serial electrical signal 792 upon conversion into the fourth set of parallel electrical signals 794. The fourth set of parallel signals 794 is provided to the first serializers/deserializers module 780, which generates a second serial electrical signal 796 based on the fourth set of parallel signals 794 that is sent to the photonic integrated circuit 772. The photonic integrated circuit 772 generates a second optical signal 798 based on the second serial electrical signal 796, and sends the second optical signal 798 to an optical fiber. The first and second optical signals 770, 798 can travel on the same optical fiber or on different optical fibers.

A feature of the system 800 is that the electrical signal paths traveled by the first, fifth, sixth, and second serial electrical signals 774, 782, 792, 796 are short (e.g., less than 5 inches), to allow the first, fifth, sixth, and second serial electrical signals 782, 792 to have a high data rate (e.g., up to 50 Gbps).

Figure 31:
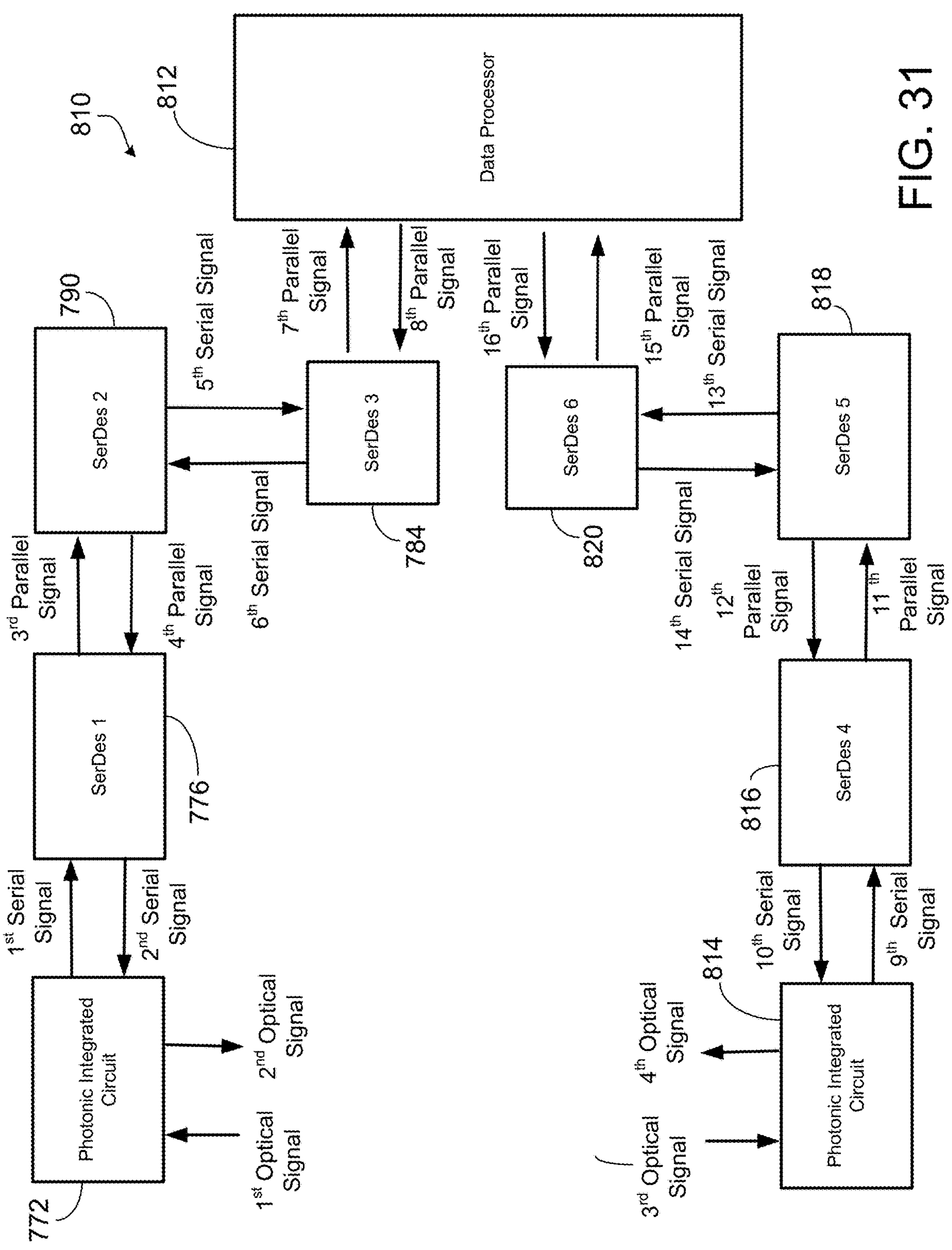

FIG. 31 is a diagram of an example high bandwidth data processing system 810 that can be similar to, e.g., systems 680 (FIG. 26), 700 (FIG. 27), and 750 (FIG. 29) described above. The system 810 includes a data processor 812 that receives and sends signals from and to multiple photonic integrated circuits. The system 810 includes a second photonic integrated circuit 814, a fourth serializers/deserializers module 816, a fifth serializers/deserializers module 818, and a sixth serializers/deserializers module 820. The operations of the second photonic integrated circuit 814, a fourth serializers/deserializers module 816, a fifth serializers/deserializers module 818, and a sixth serializers/deserializers module 820 can be similar to those of the first photonic integrated circuit 772, the first serializers/deserializers module 776, the second serializers/deserializers module 780, and the third serializers/deserializers module 784. The third serializers/deserializers module 784 and the sixth serializers/deserializers module 820 can be embedded in the data processor 812, or be implemented in separate chips.

In some examples, the data processor 812 processes first data carried in the first optical signal received at the first photonic integrated circuit 772, and generates second data that is carried in the fourth optical signal output from the second photonic integrated circuit 814.

The examples in FIGS. 30 and 31 include three serializers/deserializers modules between the photonic integrated circuit and the data processor, it is understood that the same principles can be applied to systems that has only one serializers/deserializers module between the photonic integrated circuit and the data processor.

In some implementations, signals are transmitted unidirectionally from the photonic integrated circuit 772 to the data processor 788 (FIG. 30). In that case, the first serializers/deserializers module 776 can be replaced with a serial-to-parallel converter, the second serializers/deserializers module 780 can be replaced with a parallel-to-serial converter, and the third serializers/deserializers module 784 can be replaced with a serial-to-parallel converter. In some implementations, signals are transmitted unidirectionally from the data processor 812 (FIG. 31) to the second photonic integrated circuit 814. In that case, the sixth serializers/deserializers module 820 can be replaced with a parallel-to-serial converter, the fifth serializers/deserializers module 818 can be replaced with a serial-to-parallel converter, and the fourth serializers/deserializers module 816 can be replaced with a parallel-to-serial converter.

It should be appreciated by those of ordinary skill in the art that the various embodiments described herein in the context of coupling light from one or more optical fibers, e.g., 226 (FIGS. 2 and 4) or 272 (FIGS. 6 and 7) to the photonic integrated circuit, e.g., 214 (FIGS. 2 and 4), 264 (FIG. 6), or 296 (FIG. 7) will be equally operable to couple light from the photonic integrated circuit to one or more optical fibers. This reversibility of the coupling direction is a general feature of at least some embodiments described herein, including some of those using polarization diversity.

The example optical systems disclosed herein should only be viewed as some of many possible embodiments that can be used to perform polarization demultiplexing and independent array pattern scaling, array geometry re-arrangement, spot size scaling, and angle-of-incidence adaptation using diffractive, refractive, reflective, and polarization-dependent optical elements, 3D waveguides and 3D printed optical components. Other implementations achieving the same set of functionalities are also covered by the spirit of this disclosure.

For example, the optical fibers can be coupled to the edges of the photonic integrated circuits, e.g., using fiber edge couplers. The signal conditioning (e.g., clock and data recovery, signal equalization, or coding) can be performed on the serial signals, the parallel signals, or both. The signal conditioning can also be performed during the transition from serial to parallel signals.

In some implementations, the data processing systems described above can be used in, e.g., data center switching systems, supercomputers, internet protocol (IP) routers, Ethernet switching systems, graphics processing work stations, and systems that apply artificial intelligence algorithms.

In the examples described above in which the figures show a first serializers/deserializers module (e.g., 216) placed adjacent to a second serializers/deserializers module (e.g., 217), it is understood that a bus processing unit 218 can be positioned between the first and second serializers/deserializers modules and perform, e.g., switching, re-routing, and/or coding functions described above.

In some implementations, the data processing systems described above includes multiple data generators that generate large amounts of data that are sent through optical fibers to the data processors for processing. For example, an autonomous driving vehicle (e.g., car, truck, train, boat, ship, submarine, helicopter, drone, airplane, space rover, or space ship) or a robot (e.g., an industrial robot, a helper robot, a medical surgery robot, a merchandise delivery robot, a teaching robot, a cleaning robot, a cooking robot, a construction robot, an entertainment robot) can include multiple high resolution cameras and other sensors (e.g., LIDARs (Light Detection and Ranging), radars) that generate video and other data that have a high data rate. The cameras and/or sensors can send the video data and/or sensor data to one or more data processing modules through optical fibers. The one or more data processing modules can apply artificial intelligence technology (e.g., using one or more neural networks) to recognize individual objects, collections of objects, scenes, individual sounds, collections of sounds, and/or situations in the environment of the vehicle and quickly determine appropriate actions for controlling the vehicle or robot.

Figure 34:
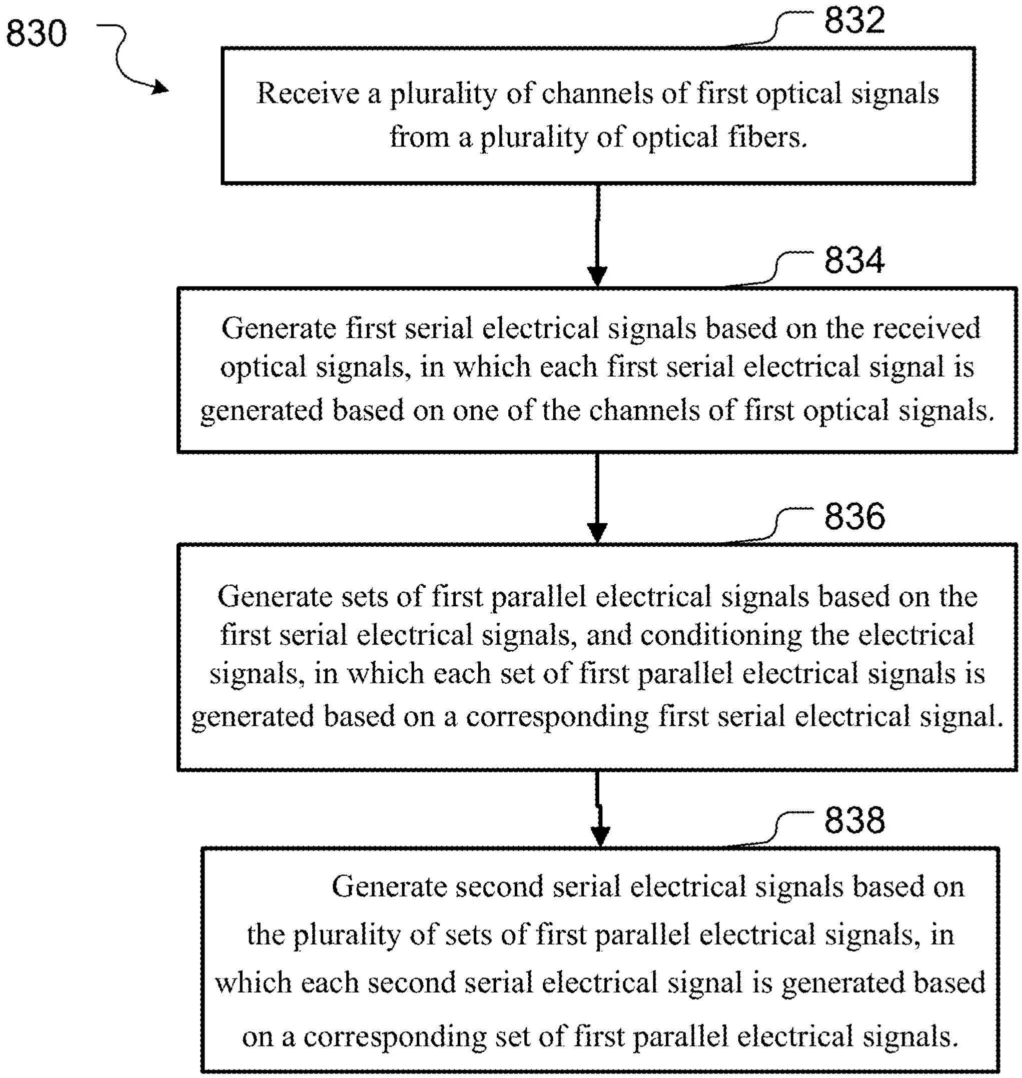
FIG. 34 is a flow diagram of an example process for processing optical and electrical signals using a data processing system.

FIG. 34 is a flow diagram of an example process for processing high bandwidth data. A process 830 includes receiving 832 a plurality of channels of first optical signals from a plurality of optical fibers. The process 830 includes generating 834 a plurality of first serial electrical signals based on the received optical signals, in which each first serial electrical signal is generated based on one of the channels of first optical signals. The process 830 includes generating 836 a plurality of sets of first parallel electrical signals based on the plurality of first serial electrical signals, and conditioning the electrical signals, in which each set of first parallel electrical signals is generated based on a corresponding first serial electrical signal. The process 830 includes generating 838 a plurality of second serial electrical signals based on the plurality of sets of first parallel electrical signals, in which each second serial electrical signal is generated based on a corresponding set of first parallel electrical signals.

In some implementations, a data center includes multiple systems, in which each system incorporates the techniques disclosed in FIGS. 22 to 29 and the corresponding description. Each system includes a vertically mounted printed circuit board, e.g., 570 (FIG. 22), 610 (FIG. 23), 642 (FIG. 24), 654 (FIG. 25), 686 (FIG. 26), 706 (FIG. 27), 730 (FIG. 28), 752 (FIG. 29) that functions as the front panel of the housing or is substantially parallel to the front panel. At least one data processing chip and at least one integrated communication device or optical/electrical communication interface are mounted on the printed circuit board. The integrated communication device or optical/electrical communication interface can incorporate techniques disclosed in FIGS. 2-22 and 30-34 and the corresponding description. Each integrated communication device or optical/electrical communication interface includes a photonic integrated circuit that receives optical signals and generates electrical signals based on the optical signals. The optical signals are provided to the photonic integrated circuit through one or more optical paths (or spatial paths) that are provided by, e.g., cores of the fiber-optic cables, which can incorporate techniques described in U.S. patent application Ser. No. 16/822,103. A large number of parallel optical paths (or spatial paths) can be arranged in two-dimensional arrays using connector structures, which can incorporate techniques described in U.S. patent application Ser. No. 16/816,171.

Figures 35A, 35B, 35C:
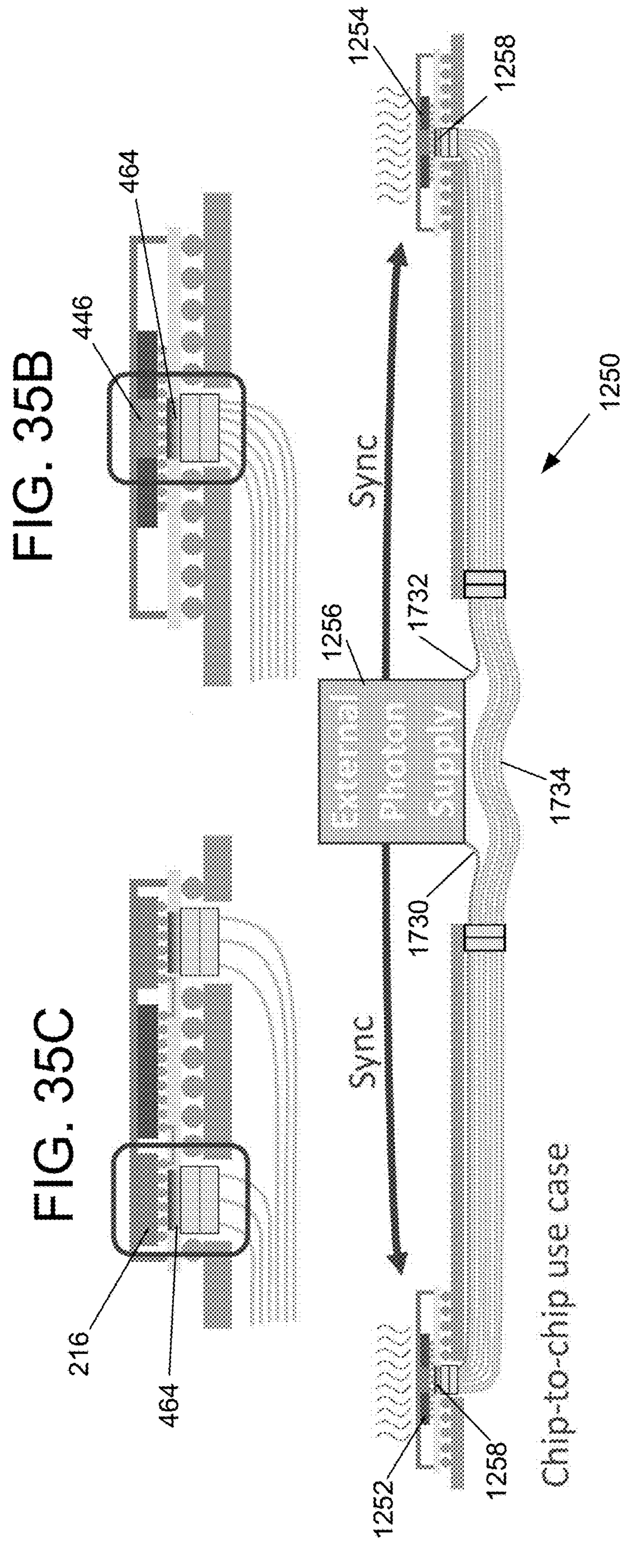
FIG. 35A is a diagram an optical communications system.
FIGS. 35B and 35C are diagrams of co-packaged optical interconnect modules.

FIG. 35A shows an optical communications system 1250 providing high-speed communications between a first chip 1252 and a second chip 1254 using co-packaged optical interconnect modules 1258 similar to those shown in, e.g., FIGS. 2-5 and 17. Each of the first and second chips 1252,

1254 can be a high-capacity chip, e.g., a high bandwidth Ethernet switch chip. The first and second chips 1252, 1254 communicate with each other through an optical fiber interconnection cable 1734 that includes a plurality of optical fibers. In some implementations, the optical fiber interconnection cable 1734 can include optical fiber cores that transmit data and control signals between the first and second chips 802, 804. As described in more detail below, optical fibers 1730 and 1732, which in some examples can be partly bundled together with the interconnection cable 1734, include one or more optical fiber cores that transmit optical power supply light from an optical power supply or photon supply to photonic integrated circuits that provide optoelectronic interfaces for the first and second chips 1252, 1254. The optical fiber interconnection cable 1734 can include single-core fibers or multi-core fibers. Similarly, the optical fibers 1730 and 1732 can include single-core fibers or multi-core fibers. Each single-core fiber includes a cladding and a core, typically made from glasses of different refractive indices such that the refractive index of the cladding is lower than the refractive index of the core to establish a dielectric optical waveguide. Each multi-core optical fiber includes a cladding and multiple cores, typically made from glasses of different refractive indices such that the refractive index of the cladding is lower than the refractive index of the core. More complex refractive index profiles, such as index trenches, multi-index profiles, or gradually changing refractive index profiles can also be used. More complex geometric structures such as non-circular cores or claddings, photonic crystal structures, photonic bandgap structures, or nested antiresonant nodeless hollow core structures can also be used.

The example of FIG. 35A illustrates a switch-to-switch use case. An external optical power supply or photon supply 1256 provides optical power supply signals, which can be, e.g., continuous-wave light, one or more trains of periodic optical pulses, or one or more trains of non-periodic optical pulses. The power supply light is provided from the photon supply 1256 to the co-packaged optical interconnect modules 1258 through optical fibers 1730 and 1732, respectively. For example, the optical power supply 1256 can provide continuous wave light, or both pulsed light for data modulation and synchronization, as described in U.S. Pat. No. 11,153,670. This allows the first chip 1252 to be synchronized with the second chip 1254.

For example, the photon supply 1256 can correspond to the optical power supply 103 of FIG. 1. The pulsed light from the photon supply 1256 can be provided to the link 102_6 of the data processing system 200 of FIG. 20. In some implementations, the photon supply 1256 can provide a sequence of optical frame templates, in which each of the optical frame templates includes a respective frame header and a respective frame body, and the frame body includes a respective optical pulse train. The modulators 417 can load data into the respective frame bodies to convert the sequence of optical frame templates into a corresponding sequence of loaded optical frames that are output through optical fiber link 102_1.

The implementation shown in FIG. 35A uses a packaging solution corresponding to FIG. 35B, whereby in contrast to FIG. 17 substrates 454 and 460 are not used and the photonic integrated circuit 464 is directly attached to the serializers/deserializers module 446. FIG. 35C shows an implementation similar to FIG. 5, in which the photonic integrated circuit 464 is directly attached to the serializers/deserializers 216.

Figure 36:
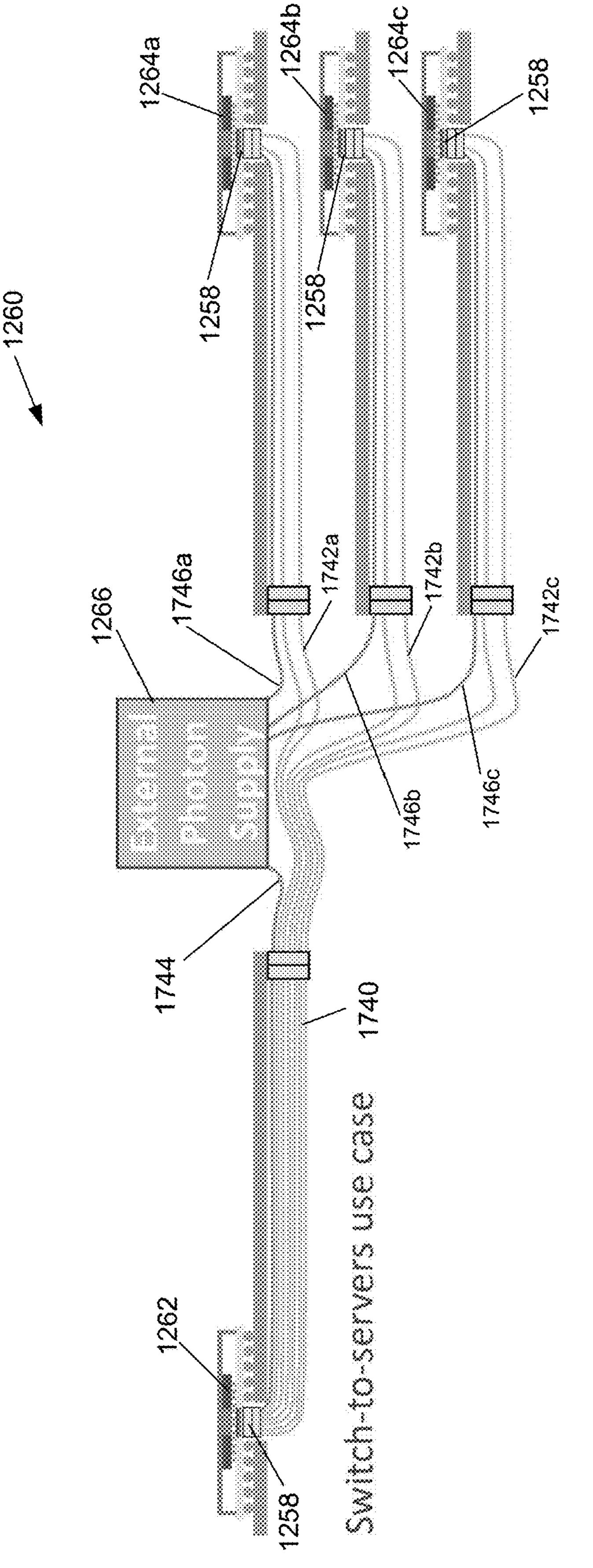
FIGS. 36 and 37 are diagrams of examples of optical communications systems.

FIG. 36 shows an example of an optical communications system 1260 providing high-speed communications between a high-capacity chip 1262 (e.g., an Ethernet switch chip) and multiple lower-capacity chips 1264*a*, 1264*b*, 1264*c*, e.g., multiple network interface chips, attached to computer servers using co-packaged optical interconnect modules 1258 similar to those shown in FIG. 35A. The high-capacity chip 1262 communicates with the lower-capacity chips 1264*a*, 1264*b*, 1264*c* through a high-capacity optical fiber interconnection cable 1740 that later branches out into several lower-capacity optical fiber interconnection cables 1742*a*, 1742*b*, 1742*c* that are connected to the lower-capacity chips 1264*a*, 1264*b*, 1264*c*, respectively. This example illustrates a switch-to-servers use case.

An external optical power supply or photon supply 1266 provides optical power supply signals, which can be continuous-wave light, one or more trains of periodic optical pulses, or one or more trains of non-periodic optical pulses. The power supply light is provided from the photon supply 1266 to the optical interconnect modules 1258 through optical fibers 1744, 1746*a*, 1746*b*, 1746*c*, respectively. For example, the optical power supply 1266 can provide both pulsed light for data modulation and synchronization, as described in U.S. Pat. No. 11,153,670. This allows the high-capacity chip 1262 to be synchronized with the lower-capacity chips 1264*a*, 1264*b*, and 1264*c*.

Figure 37:
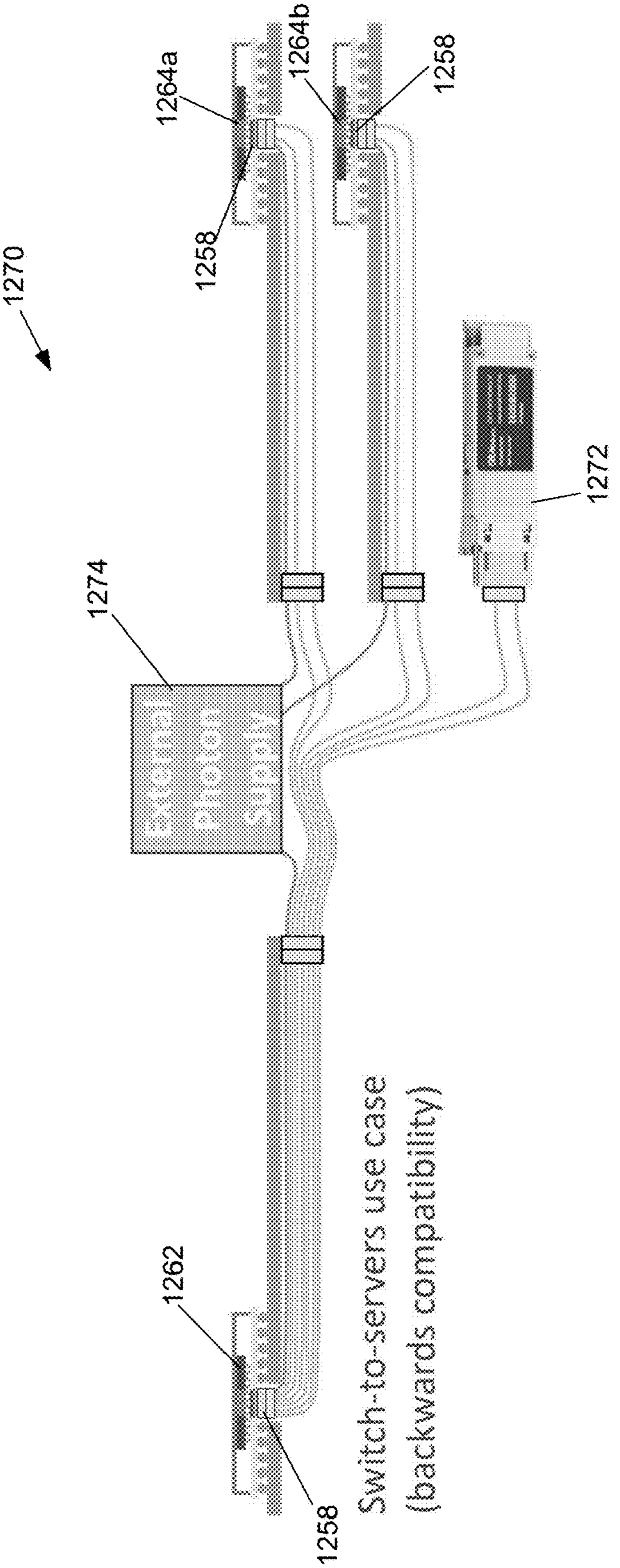

FIG. 37 shows an optical communications system 1270 providing high-speed communications between a high-capacity chip 1262 (e.g., an Ethernet switch chip) and multiple lower-capacity chips 1264*a*, 1264*b*, e.g., multiple network interface chips, attached to computer servers using a mix of co-packaged optical interconnect modules 1258 similar to those shown in FIG. 35 as well as conventional pluggable optical interconnect modules 1272.

An external optical power supply or photon supply 1274 provides optical power supply signals, which can be continuous-wave light, one or more trains of periodic optical pulses, or one or more trains of non-periodic optical pulses. For example, the optical power supply 1274 can provide both pulsed light for data modulation and synchronization, as described in U.S. Pat. No. 11,153,670. This allows the high-capacity chip 1262 to be synchronized with the lower-capacity chips 1264*a* and 1264*b*.

Some aspects of the systems 1250, 1260, and 1270 are described in more detail in connection with FIGS. 79 to 84B.

Figure 43:
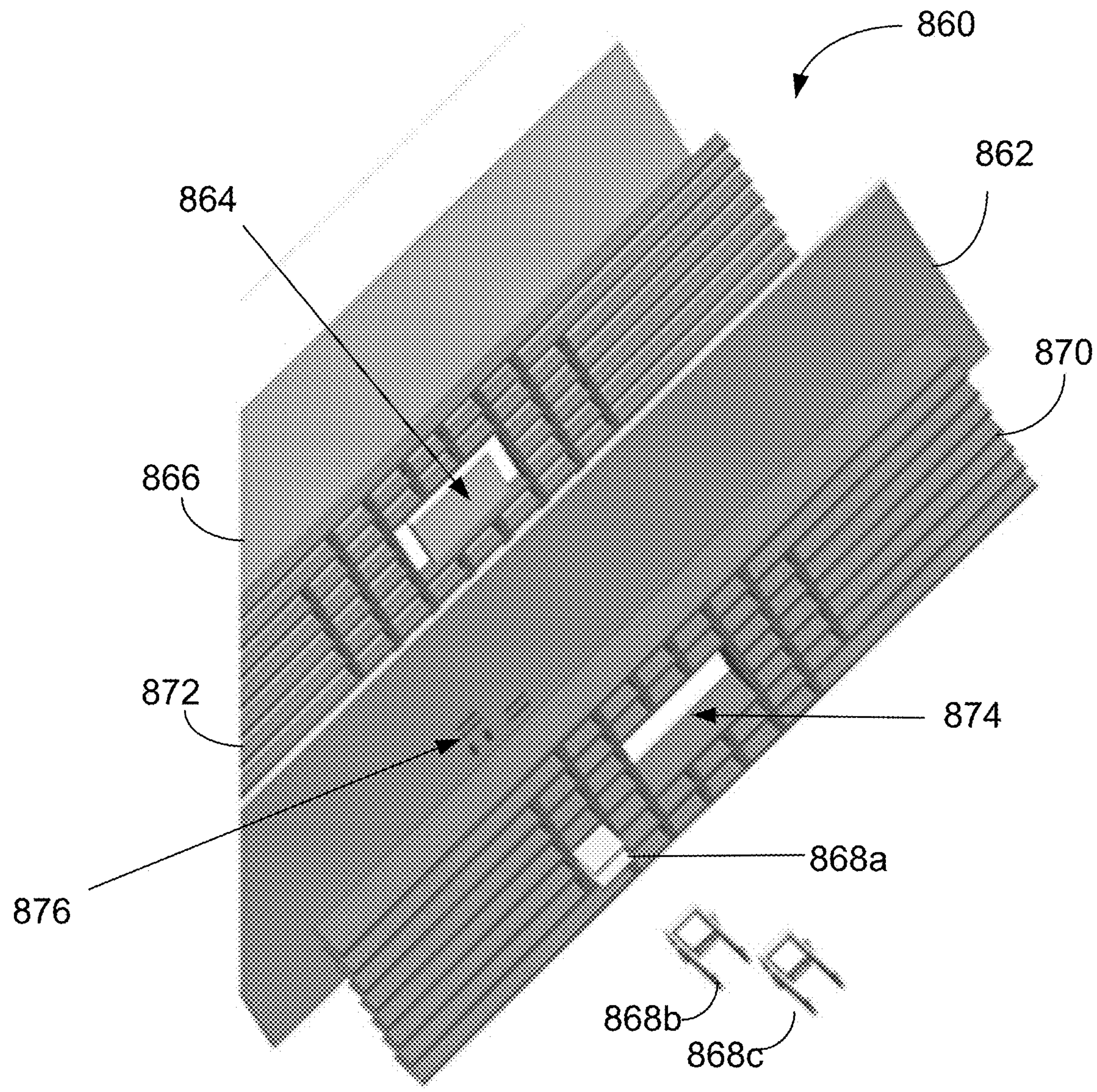
FIG. 43 is an exploded view of an example of a front-mounted module of a data processing system.

FIG. 43 shows an exploded view of an example of a front-mounted module 860 of a data processing system that includes a vertically mounted printed circuit board 862, (or substrate made of, e.g., organic or ceramic material), a host application specific integrated circuit 864 mounted on the back-side of the circuit board 862, and a heat sink 866. In some examples, the host application specific integrated circuit 864 is mounted on a substrate (e.g., a ceramic substrate), and the substrate is attached to the circuit board 862. The front-mounted module 860 can be, e.g., the front panel of the housing of the data processing system, similar to the configuration shown in FIGS. 26A, 28A or positioned near the front panel of the housing, similar to the configuration shown in FIGS. 27, 28B. Three optical modules with connectors, e.g., 868*a*, 868*b*, 868*c*, collectively referenced as 868, are shown in the figure. Additional optical modules with connectors can be used. The data processing system can be similar to, e.g., the data processing system 680 (FIG. 26A) or 700 (FIG. 27). The printed circuit board 862 can be similar to, e.g., the printed circuit board 686 (FIG. 26A) or 706 (FIG. 27). The application specific integrated circuit 864 can be similar to, e.g., the application specific integrated circuit 682 (FIG. 26A) or 702 (FIG. 27). The heat sink 866 can be similar to, e.g., the heat sink 576 (FIG. 23). The optical modules with connector 868 each include an optical module 880 (see FIGS. 44, 45) and a mechanical connector structure 900 (see FIGS. 46, 47). The optical module 880 can be similar to, e.g., the optical/electrical communication interfaces 682 (FIG. 26A) or 704 (FIG. 27), or the integrated optical communication device 512 of FIG. 32.

The optical module with connector 868 can be inserted into a first grid structure 870, which can function as both (i) a heat spreader/heat sink and (ii) a mechanical holding fixture for the optical modules with connectors 868. The first grid structure 870 includes an array of receptors, and each receptor can receive an optical module with connector 868. When assembled, the first grid structure 870 is connected to the printed circuit board 862. The first grid structure 870 can be firmly held in place relative to the printed circuit board 862 by sandwiching the printed circuit board 862 in between the first grid structure 870 and a second structure 872 (e.g., a second grid structure) located on the opposite side of the printed circuit board 862 and connected to the first grid structure 870 through the printed circuit board 862, e.g., by use of screws. Thermal vias between the first grid structure 870 and the second structure 872 can conduct heat from the front-side of the printed circuit board 862 to the heat sink 866 on the back-side of the printed circuit board 862. Additional heat sinks can also be mounted directly onto the first grid structure 870 to provide cooling in the front.

The printed circuit board 862 includes electrical contacts 876 configured to electrically connect to the removable optical module with connectors 868 after the removable optical module with connectors 868 are inserted into the first grid structure 870. The first grid structure 870 can include an opening 874 at the location in which the host application specific integrated circuit 864 is mounted on the other side of the printed circuit board 862 to allow for components such as voltage regulators, filters, and/or decoupling capacitors to be mounted on the printed circuit board 862 in immediate lateral vicinity to the host application specific integrated circuit 864.

In some examples, the host application specific integrated circuit 864 is mounted on a substrate (e.g., a ceramic substrate), and the substrate is attached to the circuit board 862, similar to the examples shown in FIGS. 136 to 159. The substrate can be similar to the substrate 13602 of FIGS. 136 to 159, the second grid structure 872 can be similar to the rear lattice structure 13626, the circuit board 862 can be similar to the printed circuit board 13604, the host application specific integrated circuit 864 can be similar to the data processing chip 12312, and the heat sink 866 can be similar to the heat dissipating device 13610. The first grid structure 870 can have an overall shape similar to the front lattice structure 13606 of FIGS. 136 to 159, except that the first grid structure 870 includes mechanisms for coupling to the removable optical module with connectors 868.

Figure 44:
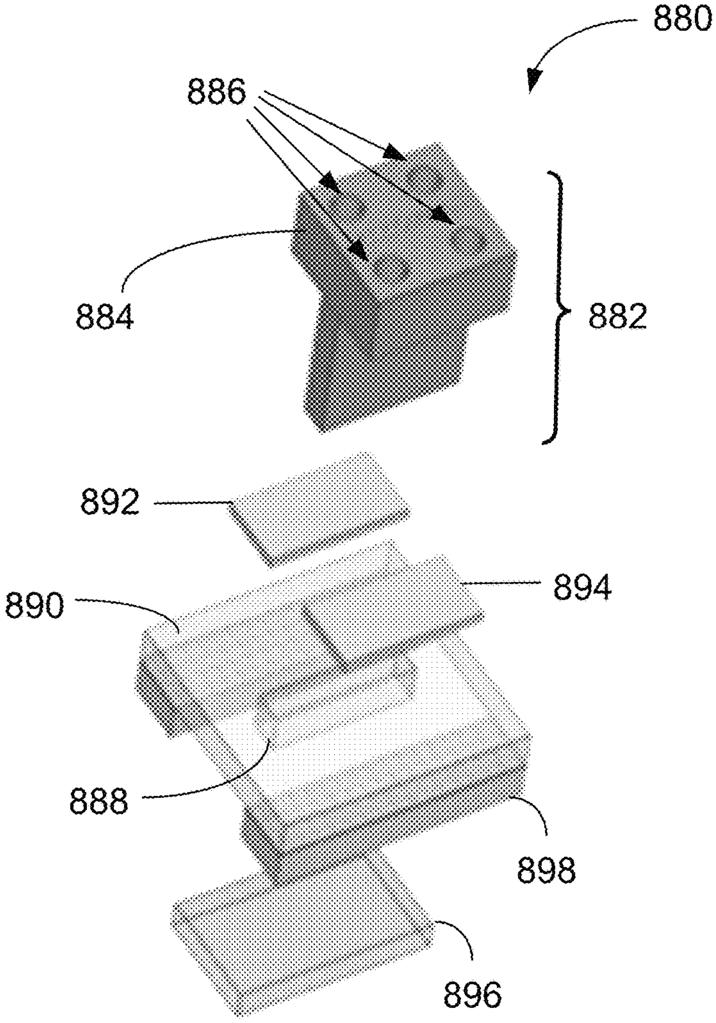
FIG. 44 is an exploded view of an example of the internals of an optical module.
Figure 45:
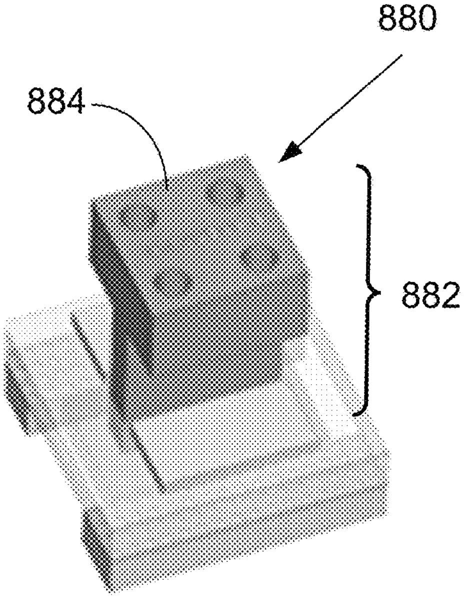
FIG. 45 is an assembled view of the internals of an optical module.

FIGS. 44 and 45 show an exploded view and an assembled view, respectively, of an example optical module 880, which can be similar to the integrated optical communication device 512 of FIG. 32. The optical module 880 includes an optical connector part 882 (which can be similar to the first optical connector 520 of FIG. 32) that can either directly or through an (e.g., geometrically wider) upper connector part 884 receive light from fibers embedded in a second optical connector part (not shown in FIGS. 44, 45), which can be similar to, e.g., the optical connector part 268 of FIGS. 6 and 7). In the example shown in FIGS. 44, 45, a matrix of fibers, e.g., 2×18 fibers, can be optically coupled to the optical connector part 882. The matrix of fibers can have other configurations, such as a 3×12, 1×12, 3×12, 6×12, 12×12, 16×16, or 32×32 array of fibers. For example, the optical connector part 882 can have a configuration similar to the fiber coupling region 430 of FIG. 15 that is configured to couple 2×18 fibers, or any other number of fibers. The upper connector part 884 can also include alignment structures 886 (e.g., holes, grooves, posts) to receive corresponding mating structures of the second optical connector part.

The optical module 880 can have any of various configurations, including an optical module containing silicon photonics integrated optics, indium phosphide integrated optics, one or more vertical-cavity surface-emitting lasers (VCSEL) s, one or more direct-detection optical receivers, or one or more coherent optical receivers. The optical module 880 can include any of the optical modules, co-packaged optical modules, integrated optical communication devices (e.g., 448, 462, 466, or 472 of FIG. 17, or 210 of FIG. 20), integrated communication devices (e.g., 612 of FIG. 23), or optical/electrical communication interfaces (e.g., 684 of FIG. 26, 724 of FIG. 28, or 760 of FIG. 29) described in this specification and the documents incorporated by reference.

The optical connector part 882 is inserted through an opening 888 of a substrate 890 and optically coupled to a photonic integrated circuit 896 mounted on the underside of the substrate 890. The substrate 890 can be similar to the substrate 514 of FIG. 32, and the photonic integrated circuit 896 can be similar to the photonic integrated circuit 524. A first serializers/deserializers chip 892 and a second serializers/deserializers chip 894 are mounted on the substrate 890, in which the chip 892 is positioned on one side of the optical connector part 882, and the chip 894 is positioned on the other side of the optical connector part 882. The first serializers/deserializers chip 892 can include circuitry similar to, e.g., the third serializers/deserializers module 398 and the fourth serializers/deserializers module 400 of FIG. 32. The second serializers/deserializers chip 894 can include circuitry similar to, e.g., the first serializers/deserializers module 394 and the second serializers/deserializers module 396. A second slab 898 (which can be similar to the second slab 518 of FIG. 32) can be provided on the underside of the substrate 890 to provide a removable connection to a package substrate (e.g., 230).

Figure 46:
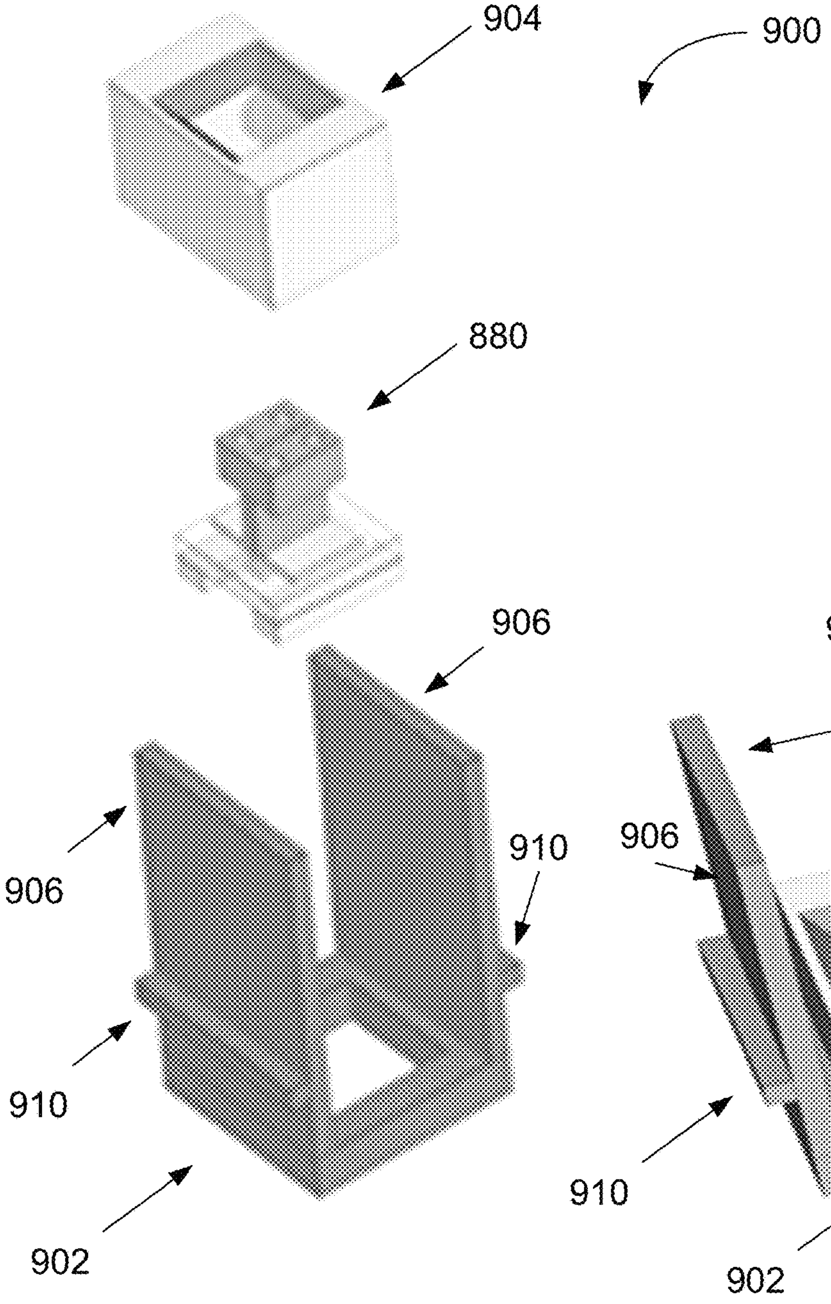
FIG. 46 is an exploded view of an optical module.
Figure 47:
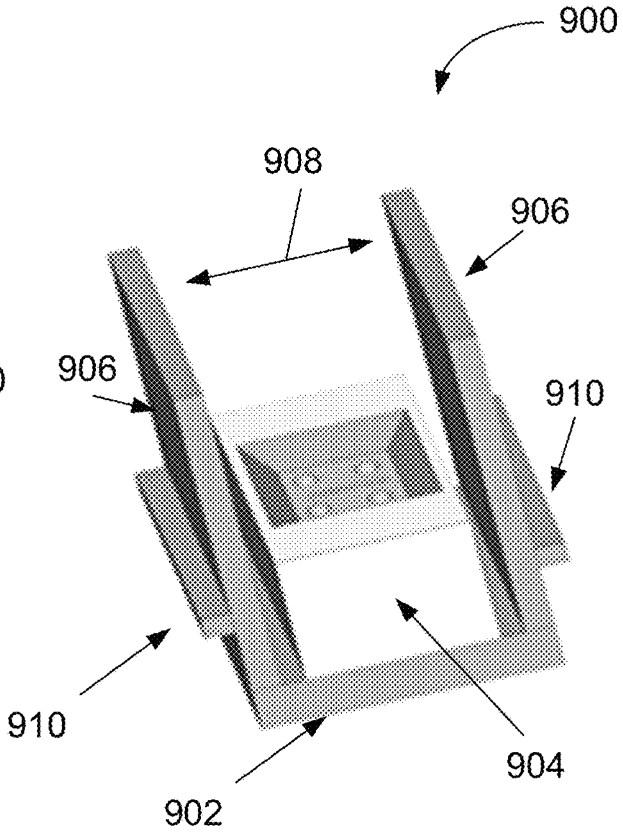
FIG. 47 is an assembled view of an optical module.

FIGS. 46 and 47 show an exploded view and an assembled view, respectively, of a mechanical connector structure 900 built around the functional optical module 880 of FIGS. 44, 45. In this example embodiment, the mechanical connector structure 900 includes a lower mechanical part 902 and an upper mechanical part 904 that together receive the optical module 880. Both lower and upper mechanical connector parts 902, 904 can be made of a heat-conducting and rigid material, e.g., a metal.

In some implementations, the upper mechanical part 904, at its underside, is brought in thermal contact with the first serializers/deserializers chip 892 and the second serializers/deserializers chip 894. The upper mechanical part 904 is also brought in thermal contact with the lower mechanical part 902. The lower mechanical part 902 includes a removable latch mechanism, e.g., two wings 906 that can be elastically bent inwards (the movement of the wings 906 are represented by a double-arrow 908 in FIG. 47), and each wing 906 includes a tongue 910 on an outer side.

Figure 48:
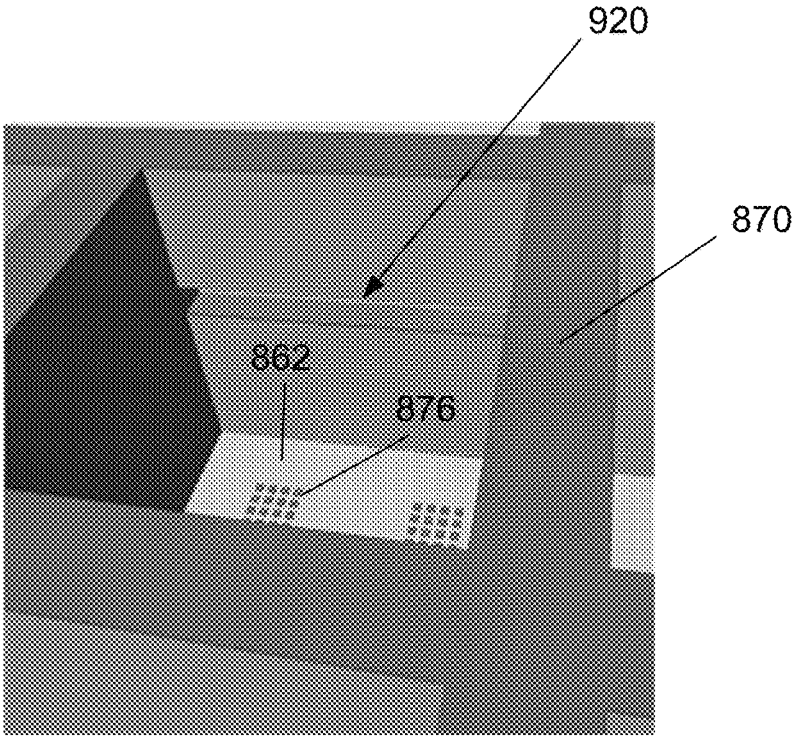
FIG. 48 is a diagram of a portion of a grid structure and a circuit board.

FIG. 48 is a diagram of a portion of the first grid structure 870 and the circuit board 862. In some examples, a substrate (e.g., a ceramic substrate) can be used in place of the circuit board 862. Grooves 920 are provided on the walls of the first grid structure 870. As shown in the figure, the printed circuit board 862 (or substrate) has electrical contacts 876 that can be electrically coupled to electrical contacts on the second slab 898 of the optical module 880. For example, the electrical contacts 876 can include an array of electrical contacts that has at least four rows and four columns of electrical contacts. For example, the array of electrical contacts can have ten or more rows or columns of electrical contacts. The electrical contacts 876 can be arranged in any two-dimensional pattern and do not necessarily have to be arranged in rows and columns. The circuit board 862 (or substrate) can also have three-dimensional features, such as on protruding elements or recessed elements, and the electrical contacts can be provided on the three-dimensional features. The optical module with connectors 868 can have three-dimensional features with electrical contacts that mate with the corresponding three-dimensional features with electrical contacts on the circuit board 862 (or substrate).

Figure 49:
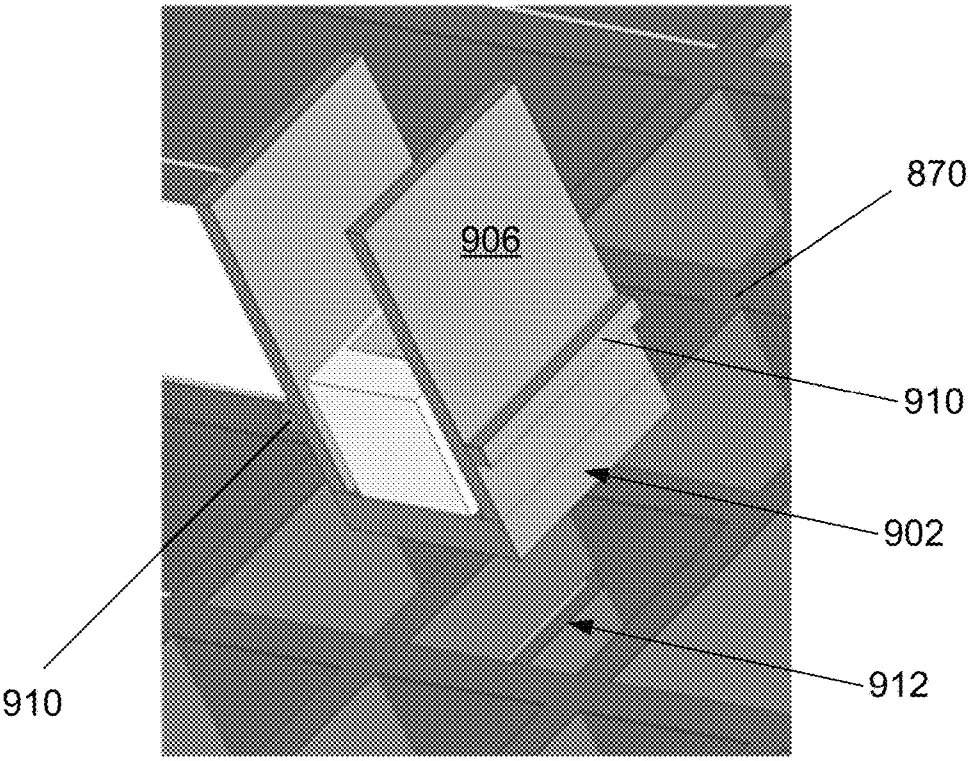
FIG. 49 is a diagram showing a lower mechanical part prior to insertion into the grid structure.

Referring to FIG. 49, when the lower mechanical part 902 is inserted into the first grid structure 870, the tongues 910 (on the wings 906 of the lower mechanical part 902) can snap into corresponding grooves 920 within the first grid structure 870 to mechanically hold the optical module 880 in place. The position of the tongues 910 on the wings 906 is selected such that when the mechanical connector structure 900 and the optical module 880 are inserted into the first grid structure 870, the electrical connectors at the bottom of the second slab 898 are electrically coupled to the electrical contacts 876 on the printed circuit board 862 (or substrate). For example, the second slab 898 can include spring-loaded contacts that are mated with the contacts 876.

Figure 50:
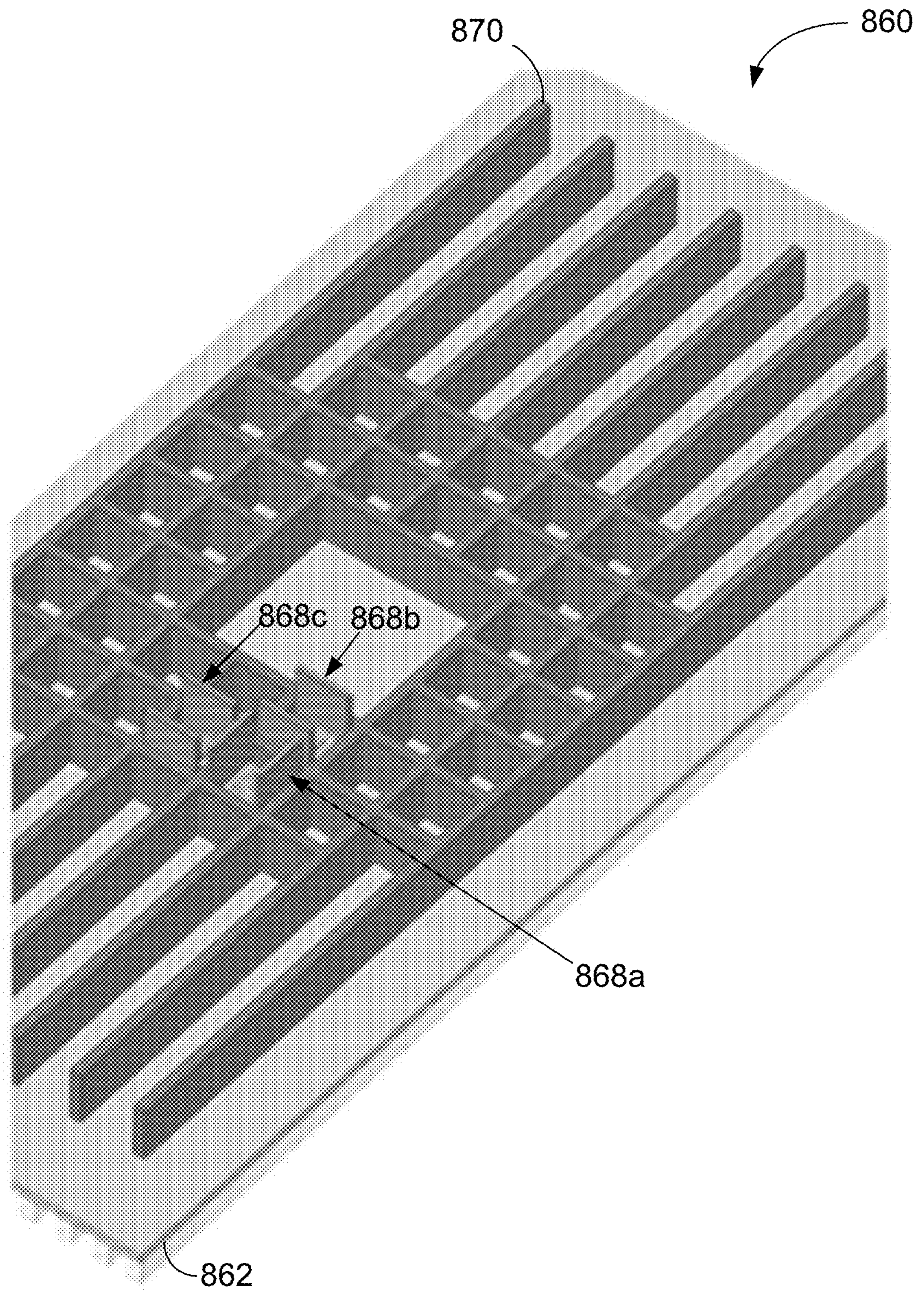
FIG. 50 is a diagram of an example of a partially populated front-view of an assembled system.

FIG. 50 shows the front-view of an assembled front module 860. Three optical module with connectors (e.g., 868*a*, 868*b*, 868*c*) are inserted into the first grid structure 870. In some embodiments, the optical modules 880 are arranged in a checkerboard pattern, whereby adjacent optical modules 880 and the corresponding mechanical connector structures 900 are rotated by 90 degrees such as to not allow any two wings to touch. This facilitates the removal of individual modules. In this example, the optical module with connector 868*a* is rotated 90 degrees relative to the optical module with connectors 868*b*, 868*c*.

Figure 51A:
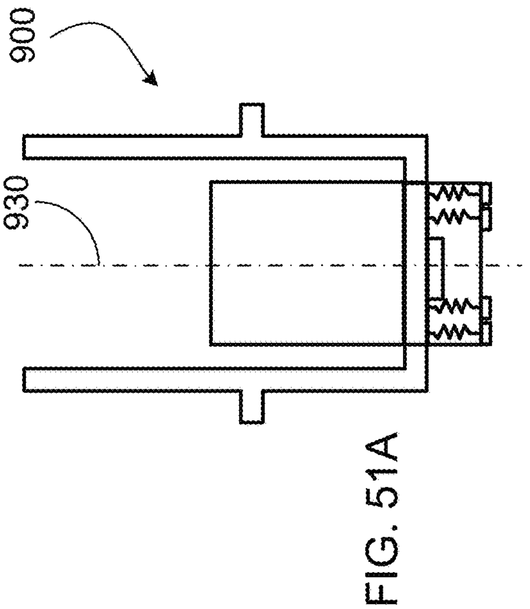
FIG. 51A is a front view of an example of the mounting of the module.
Figure 51B:
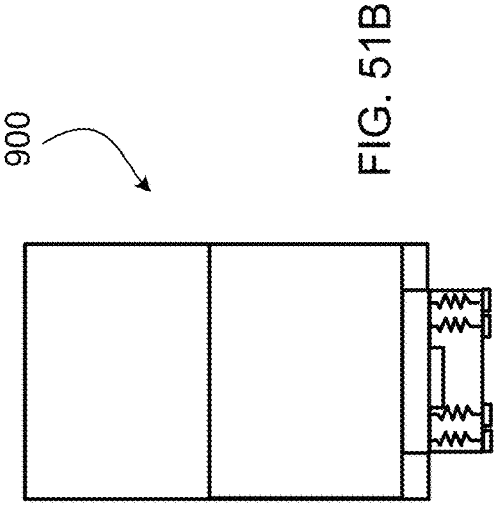
FIG. 51B is a side view of an example of the mounting of the module.

FIG. 51A shows a first side view of the mechanical connector structure 900. FIG. 51B shows a cross-sectional view of the mechanical connector structure 900 along a plane 930 shown in FIG. 51A. In some examples, the compression interposer (e.g., spring-loaded contacts) can be part of the receiving structure (e.g., mounted on the circuit board or substrate) as opposed to the removable module.

Figure 52A:
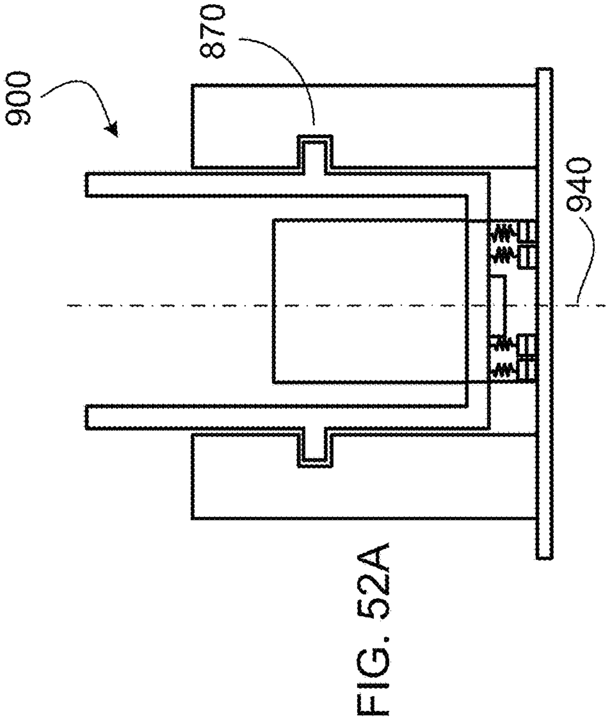
FIG. 52A is a front view of an example of the mechanical connector structure and an optical module mounted within a grid structure.
Figure 52B:
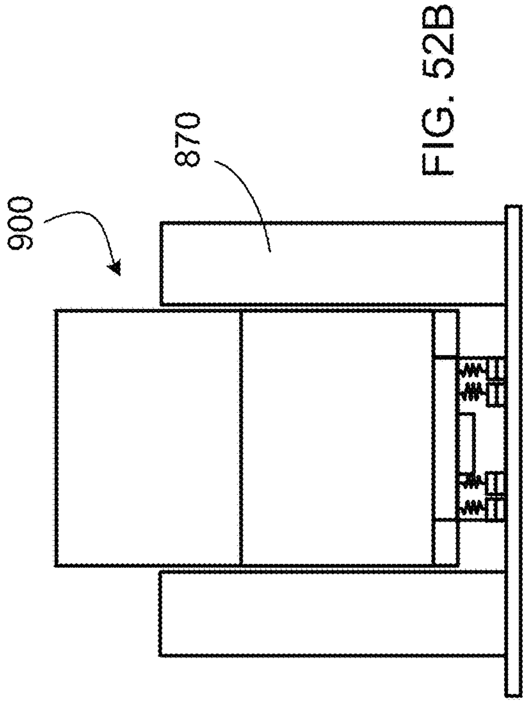
FIG. 52B is a side view of an example of the mechanical connector structure and an optical module mounted within a grid structure.

FIG. 52A shows a first side view of the mechanical connector structure 900 mounted within the first grid structure 870. FIG. 52B shows a cross-sectional view of the mechanical connector structure 900 mounted within the first grid structure 870 along a plane 940 shown in FIG. 52A.

Figure 53:
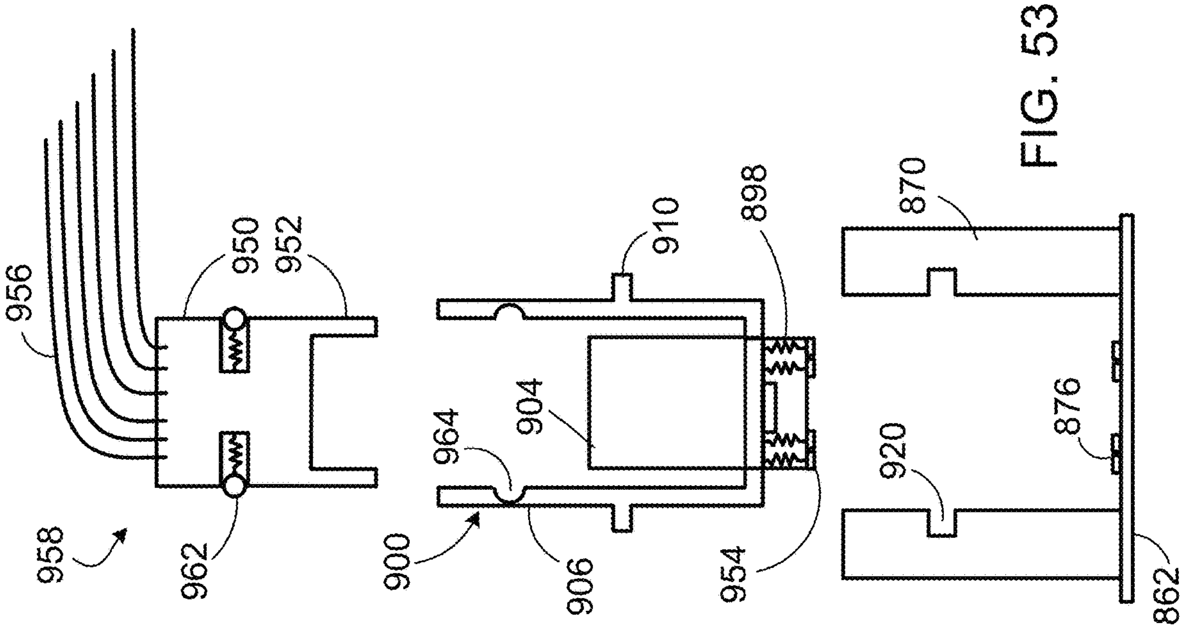

FIG. 53 is a diagram of an assembly 958 that includes a fiber cable 956 that includes a plurality of optical fibers, an optical fiber connector 950, the mechanical connector module 900, and the first grid structure 870. The optical fiber connector 950 can be inserted into the mechanical connector module 900, which can be further inserted into the first grid structure 870. The printed circuit board 862 (or substrate) is attached to the first grid structure 870, in which the electrical contacts 876 face electrical contacts 954 on the bottom side of the second slab 898 of the optical module 880.

Figure 54:
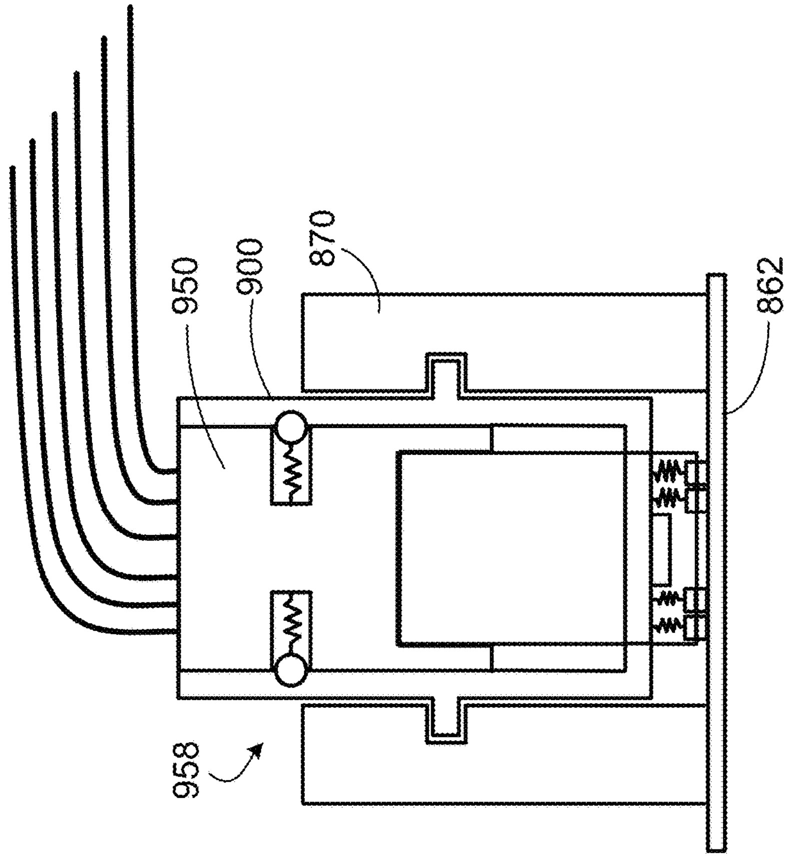
FIGS. 53 and 54 are diagrams of an example of an assembly that includes a fiber cable, an optical fiber connector, a mechanical connector module, and a grid structure.

FIG. 53 shows the individual components before they are connected. FIG. 54 is a diagram that shows the components after they are connected. The optical fiber connector 950 includes a lock mechanism 952 that disables the snap-in mechanism of the mechanical connector structure 900 so as to lock in place the mechanical connector structure 900 and the optical module 880. In this example embodiment, the lock mechanism 952 includes studs on the optical fiber connector 950 that insert between the wings 906 and the upper mechanical part 904 of the mechanical connector module 900, hence disabling the wings 906 from elastically bending inwards and consequentially locking the mechanical connector structure 900 and the optical module 880 in place. Further, the mechanical connector structure 900 includes a mechanism to hold the optical fiber connector 950 in place, such as a ball-detent mechanism as shown in the figure. When the optical fiber connector 950 is inserted into the mechanical connector structure 900, spring-loaded balls 962 on the optical fiber connector 950 engage detents 964 in the wings 906 of the mechanical connector structure 900. The springs push the balls 962 against the detents 964 and secure the optical fiber connector 950 in place.

To remove the optical module 880 from the first grid structure 870, the user can pull the optical fiber connector 950 and cause the balls 962 to disengage from the detents 964. The user can then bend the wings 906 inwards so that the tongues 910 disengage from the grooves 920 on the walls of the first grid structure 870.

Figure 55A:
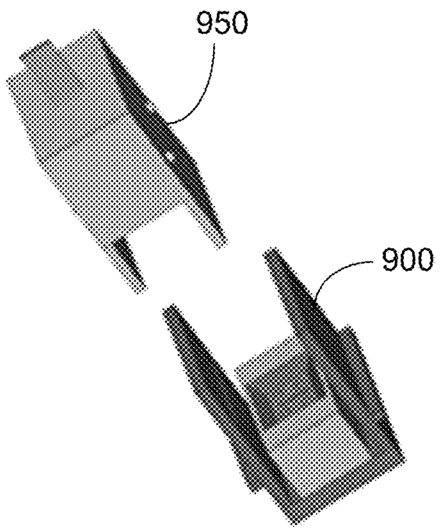
FIGS. 55A and 55B are perspective views of the mechanisms shown in FIGS. 53 and 54 before the optical fiber connector is inserted into the mechanical connector structure.
Figure 55B:
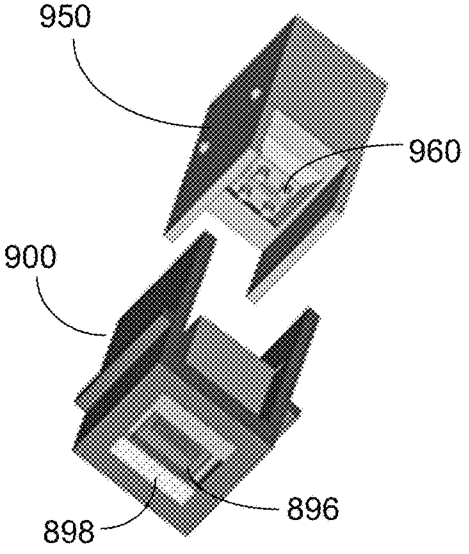

FIGS. 55A and 55B show perspective views of the mechanisms shown in FIGS. 53 and 54 before the optical fiber connector 950 is inserted into the mechanical connector structure 900. As shown in FIG. 55B, the lower side of the optical connector 950 includes alignment structures 960 that mate with the alignment structures 886 (FIG. 44) on the upper connector part 884 of the optical module 880. FIG. 55B also shows the photonic integrated circuit 896 and the second slab 898 that includes electrical contacts (e.g., spring-loaded electrical contacts).

Figure 56:
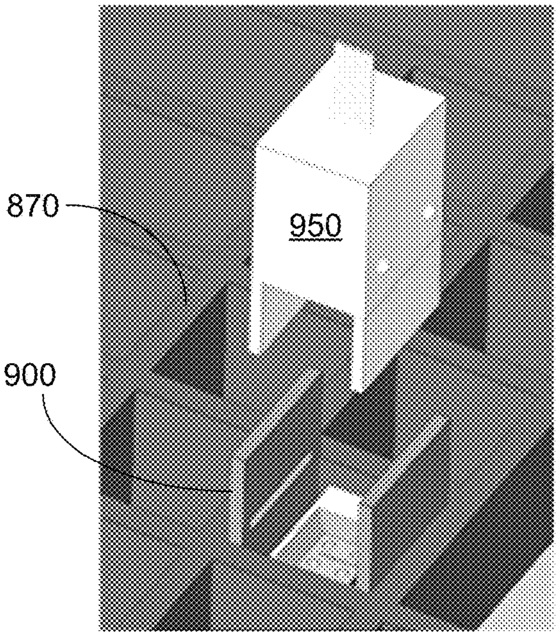
FIG. 56 is a perspective view showing that the optical module and the mechanical connector structure are inserted into the grid structure.

FIG. 56 is a perspective view showing that the optical module 880 and the mechanical connector structure 900 are inserted into the first grid structure 870, and the optical fiber connector 950 is separated from the mechanical connector structure 900.

Figure 57:
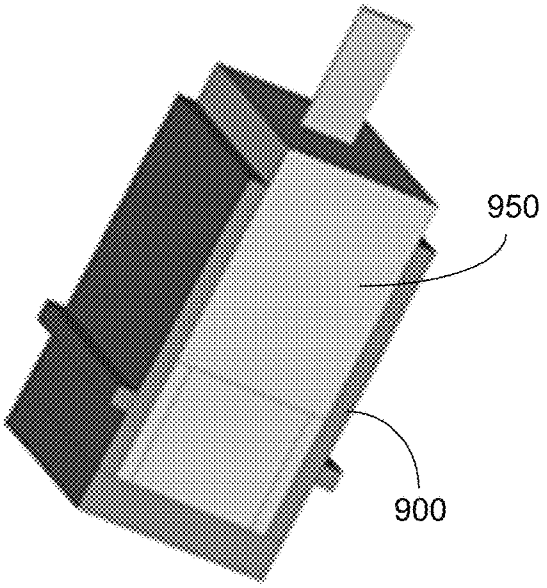
FIG. 57 is a perspective view showing that the optical fiber connector is mated with the mechanical connector structure.

FIG. 57 is a perspective view showing that the optical fiber connector 950 is mated with the mechanical connector structure 900, locking the optical module 880 within the mechanical connector structure 900.

Figure 58B:
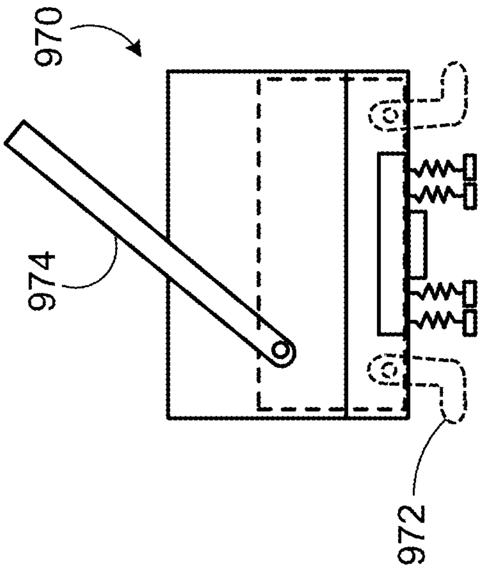
FIGS. 58A, 58B, 58C, and 58D are diagrams of an example an optical module that includes a latch mechanism.
Figure 58D:
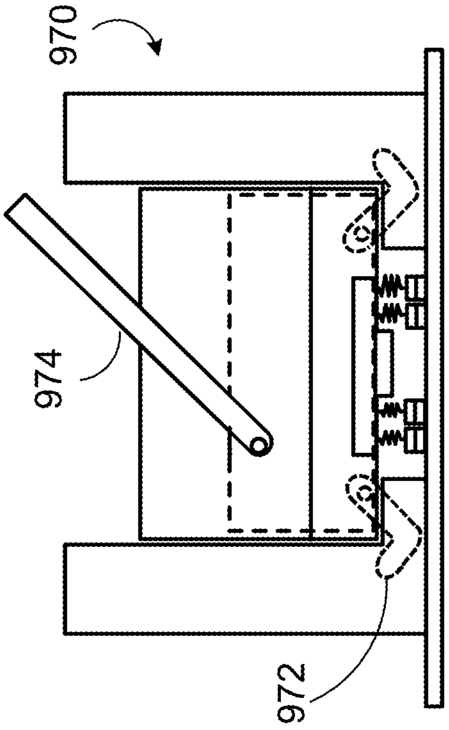
Figure 58A:
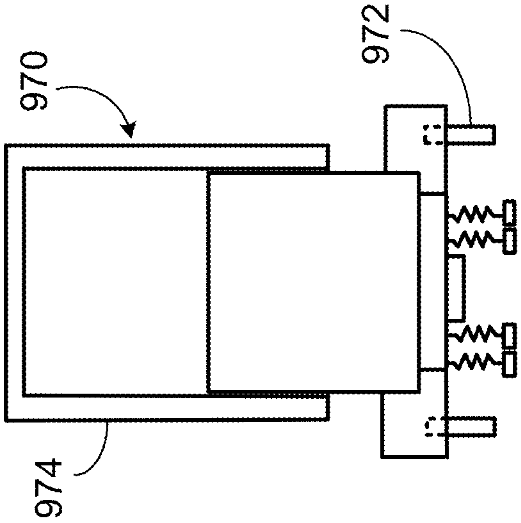
Figure 58C:
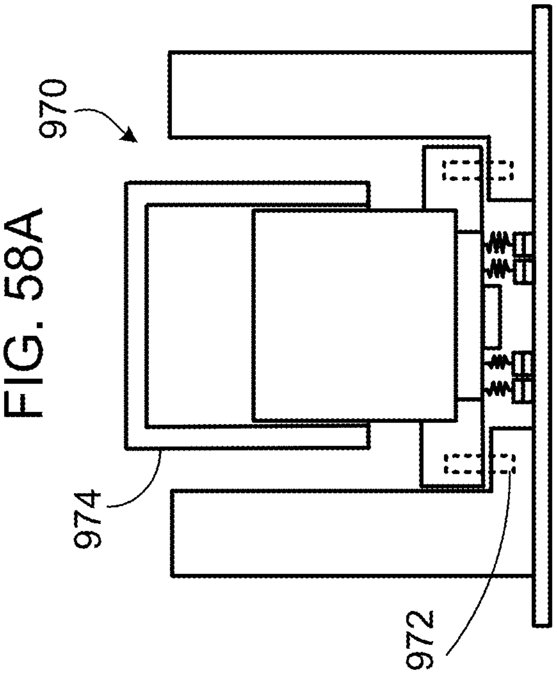

FIGS. 58A to 58D show an alternate embodiment in which an optical module with connector 970 includes a latch mechanism 972 that acts as a mechanical fastener that joins the optical module 880 to the printed circuit board 862 (or substrate) using the first grid structure 870 as a support. FIGS. 58A and 58B show various views of the optical module with connector 970 that includes the latch mechanism 972. FIGS. 58C and 58D show various views of the optical module with connector 970 coupled to the printed circuit board 862 (or substrate) and the first grid structure 870 . . . . For example, the user can easily attach or remove the optical module with connector 970 by pressing a lever 974 activating the latch mechanism 972. The lever 974 is built in a way that it does not block the optical fibers (not shown in the figure) coming out of the optical module with connector 970. Alternatively, an external tool can be used as a removable lever.

Figure 59:
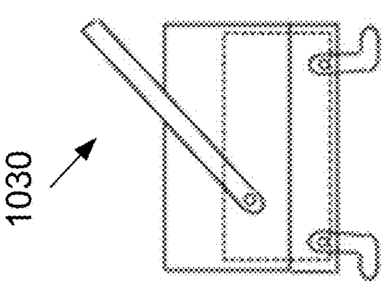
FIG. 59 is a diagram of an alternative example of the optical module.
Figure 60A:
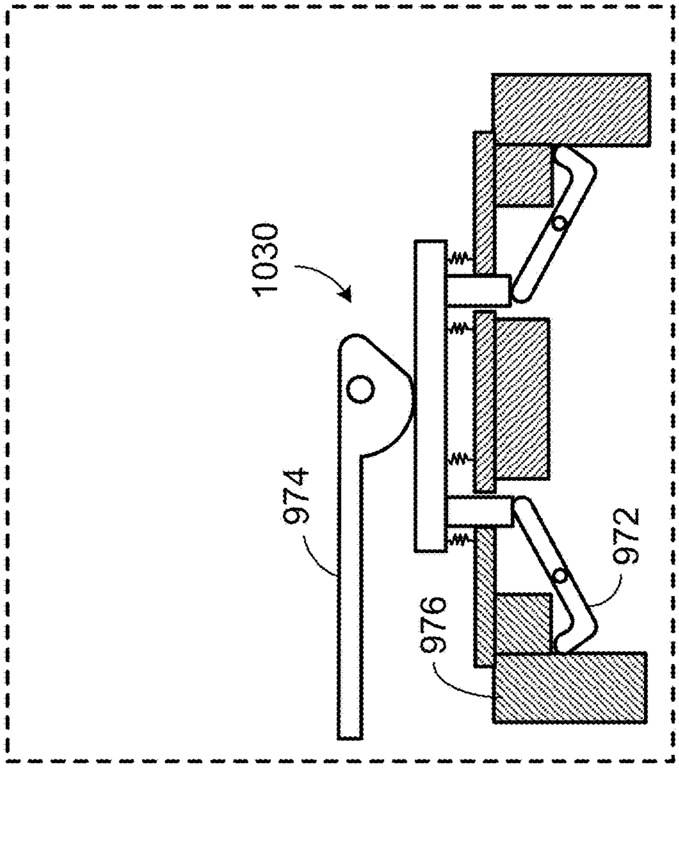
FIGS. 60A and 60B are diagrams of an example implementation of the lever and the latch mechanism in the optical module with connector.
Figure 60B:
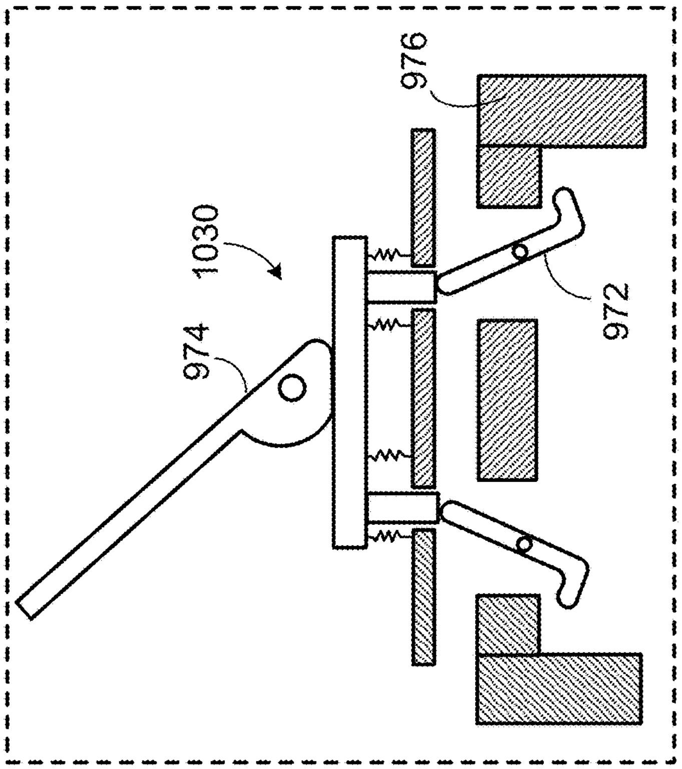

FIG. 59 is a view of an optical module 1030 that includes an optical engine with a latch mechanism used to realize the compression and attachment of the optical engine to the printed circuit board. The module 1030 is similar to the example shown in FIG. 58B but without the compression interposer. FIGS. 60A and 60B show an example latch mechanism that can be used for securing (with enough compression force) and removing the optical engine.

FIGS. 60A and 60B show an example implementation of the lever 974 and the latch mechanism 972 in the optical module 1030. FIG. 60A shows an example in which the lever 974 is pushed down, causing the latch mechanism 972 to latch on to a support structure 976, which can be part of the first grid structure 870. FIG. 60B shows an example in which the lever 974 is pulled up, causing the latch mechanism 972 to be released from the support structure 976.

Figure 61:
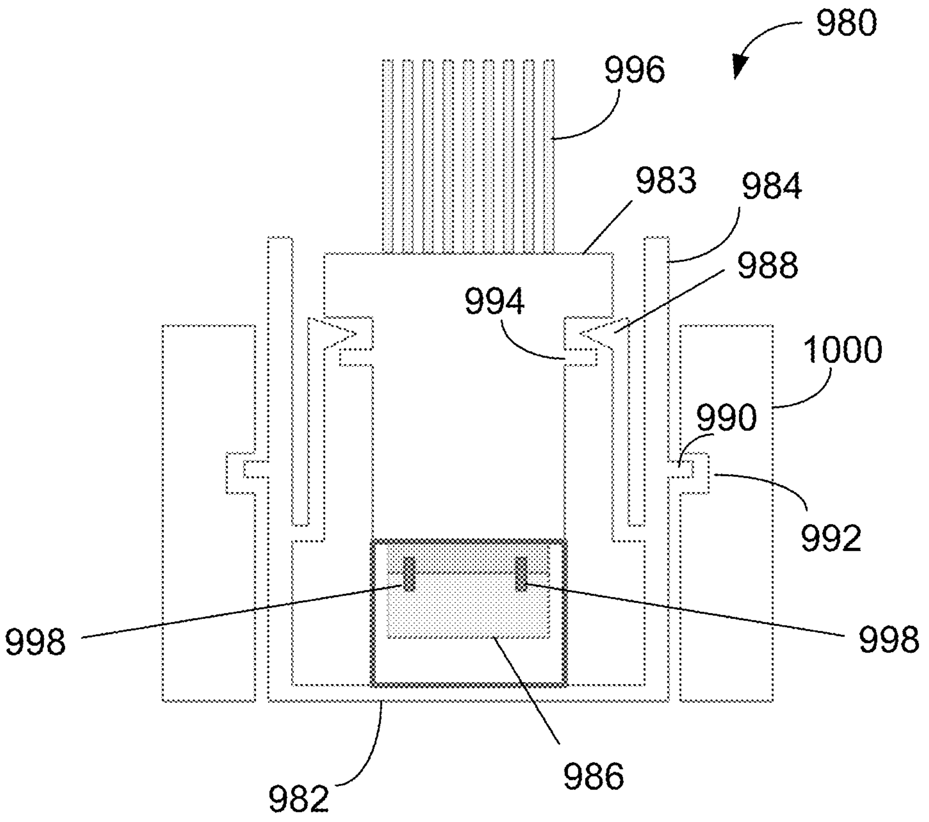
FIG. 61 is a diagram of cross section of the module viewed from the front mounted in the assembly with the connector.

FIG. 61 is a diagram of an example of a fiber cable connection design 980 that includes nested fiber optic cable and co-packaged optical module connections. In this design, a co-packaged optical module 982 is removably coupled to a co-packaged optical port 1000 formed in a support structure, such as the first grid structure 870, and a fiber connector 983 is removably coupled to the co-packaged optical module 982. The fiber connector 983 is coupled to a fiber cable 996 that includes a plurality of optical fibers. The fiber cable connection can be designed to be, e.g., MTP/MPO (Multi-fiber Termination Push-on/Multi-fiber Push On) compatible, or compatible to new standards as they emerge. Multi-fiber push on (MPO) connectors are commonly used to terminate multi-fiber ribbon connections in indoor environments and conforms to IEC-61754-7; EIA/TIA-604-5 (FOCIS 5) standards.

In some implementations, the co-packaged optical module 982 includes a mechanical connector structure 984 and a smart optical assembly 986. The smart optical assembly 986 includes, e.g., a photonic integrated circuit (e.g., 896 of FIG. 44), and components for guiding light, power splitting, polarization management, optical filtering, and other light beam management before the photonic integrated circuit. The components can include, e.g., optical couplers, waveguides, polarization optics, filters, and/or lenses. Additional examples of the components that can be included in the co-packaged optical module 982 are described in U.S. published application US 2021/0286140. The mechanical connector structure 984 includes one or more fiber connector latches 988 and one or more co-packaged optical module latches 990. The mechanical connector structure 984 can be inserted into the co-packaged optical port 1000 (e.g., formed in the first grid structure 870), in which the co-packaged optical module latches 990 engage grooves 992 in the walls of the first grid structure 870, thus securing the co-packaged optical module 982 to the co-packaged optical port 1000, and causing the electrical contacts of the smart optical assembly 986 to be electrically coupled to the electrical contacts 876 on the printed circuit board 862 (or substrate). When the fiber connector 983 is inserted into the mechanical connector structure 984, the fiber connector latches 988 engage grooves 994 in the fiber connector 983, thus securing the fiber connector 983 to the co-packaged optical module 982, and causing the fiber cable 996 to be optically coupled to the smart optical assembly 986, e.g., through optical paths in the fiber connector 983.

In some examples, the fiber connector 983 includes guide pins 998 that are inserted into holes in the smart optical assembly 986 to improve alignment of optical components (e.g., waveguides and/or lenses) in the fiber connector 983 to optical components (e.g., optical couplers and/or waveguides) in the smart optical assembly 986. In some examples, the guide pins 998 can be chamfered shaped, or elliptical shaped that reduces wear.

In some implementations, after the fiber connector 983 is installed in the co-packaged optical module 982, the fiber connector 983 prevents the co-packaged optical module latches 990 from bending inwards, thus preventing the co-packaged optical module 982 from being inserted into, or released from, the co-packaged optical port 1000. To couple the fiber cable 996 to the data processing system, the co-packaged optical module 982 is first inserted into the co-packaged optical port 1000 without the fiber connector 983, then the fiber connector 983 is inserted into the mechanical connector structure 984. To remove the fiber cable 996 from the data processing system, the fiber connector 983 can be removed from the mechanical connector structure 984 while the co-packaged optical module 982 is still coupled to the co-packaged optical port 1000.

In some implementations, the nested connection latches can be designed to allow the co-packaged optical module 982 to be inserted in, or removed from, the co-packaged optical port 1000 when a fiber cable is connected to the co-packaged optical module 982.

Figure 62:
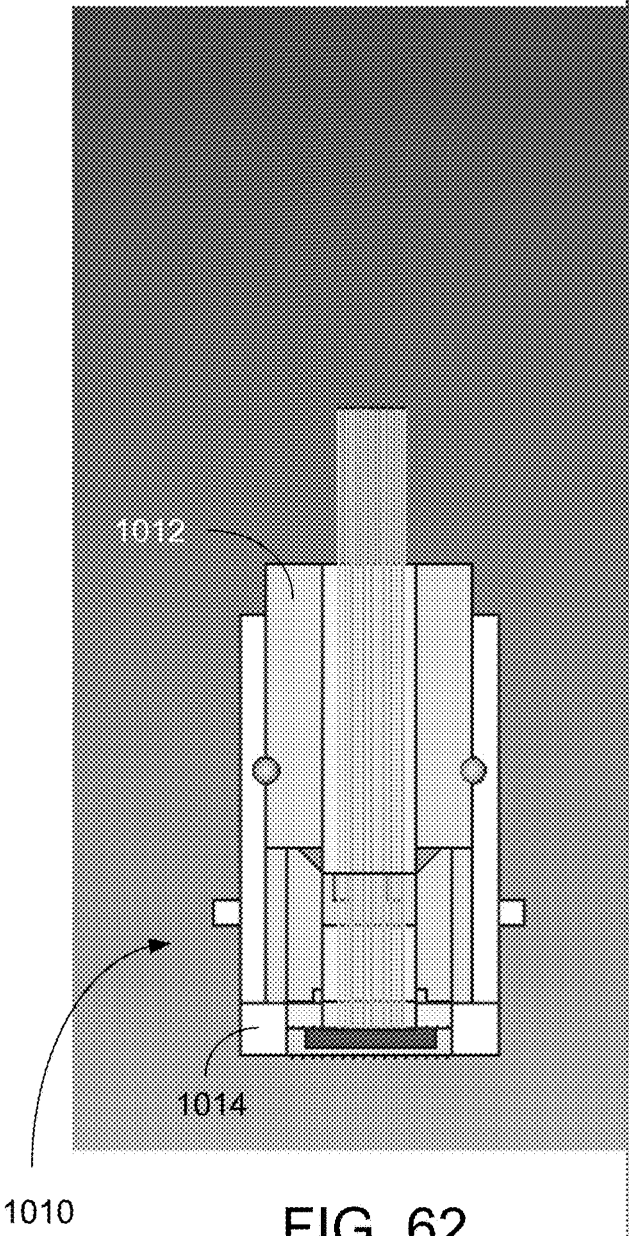
FIGS. 62, 63, 64, and 65 are diagrams showing cross-sectional views of an example of a fiber cable connection design.
Figure 63:
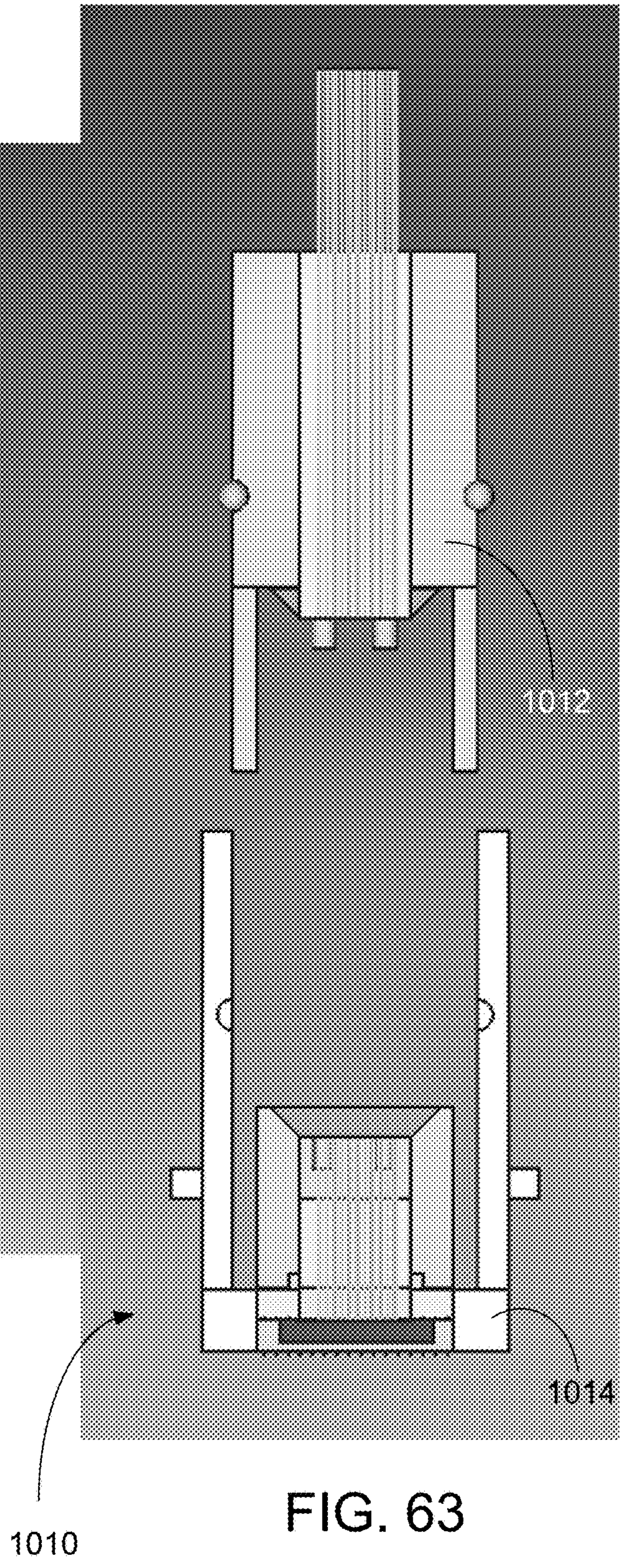

FIGS. 62 and 63 are diagrams showing cross-sectional views of an example of a fiber cable connection design 1010 that includes nested fiber optic cable and co-packaged optical module connections. FIG. 62 shows an example in which a fiber connector 1012 is removably coupled to a co-packaged optical module 1014. FIG. 63 shows an example in which the fiber connector 1012 is separated from the co-packaged optical module 1014.

Figure 64:
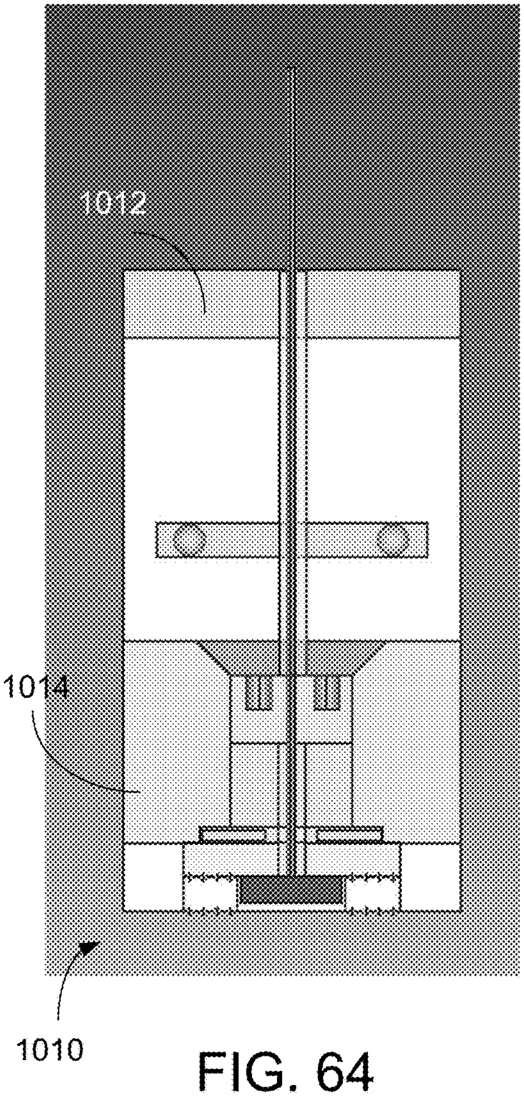
Figure 65:
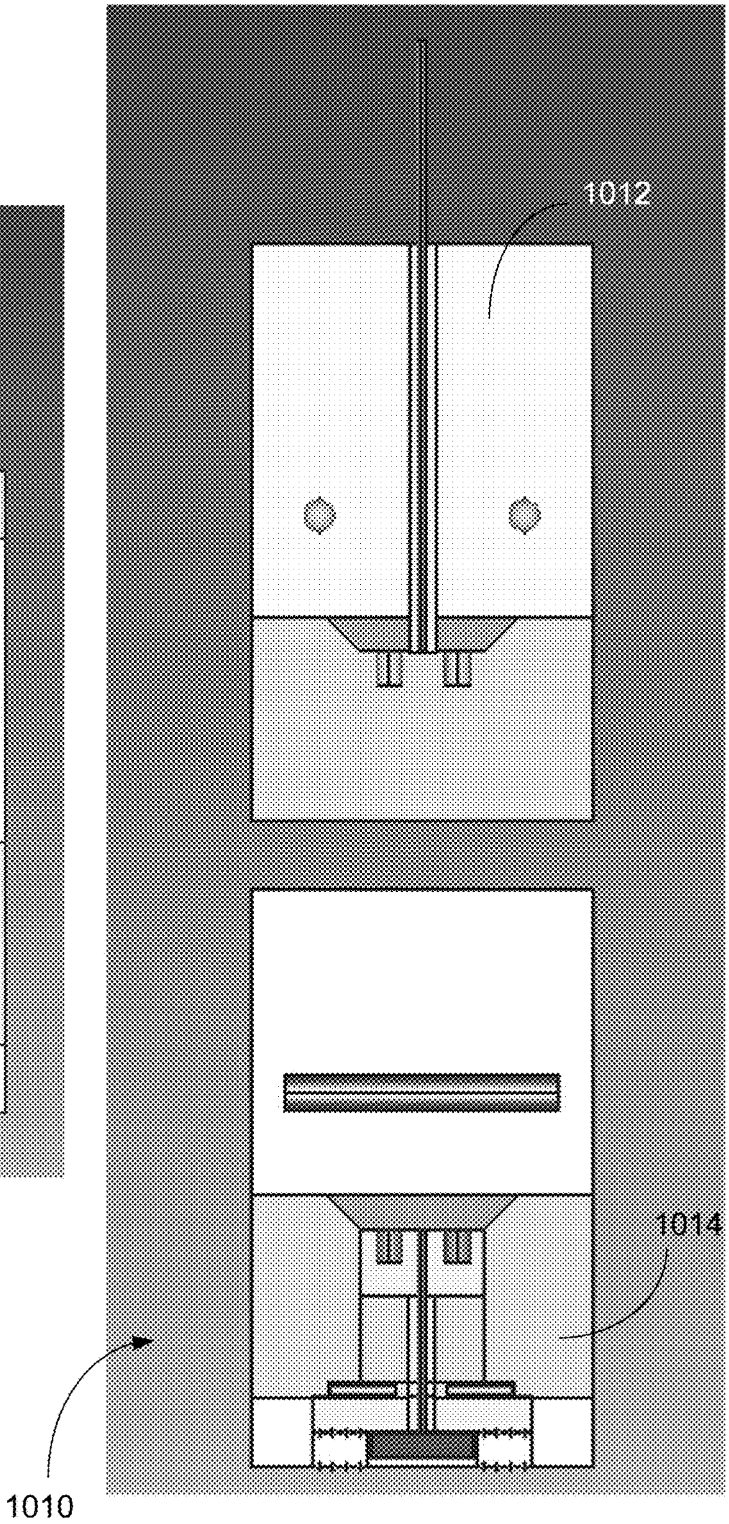

FIGS. 64 and 65 are diagrams showing additional cross-sectional views of the fiber cable connection design 1010. The cross-sections are made along planes that vertically cut through the middle of the components shown in FIGS. 62 and 63. FIG. 64 shows an example in which the fiber connector 1012 is removably coupled to the co-packaged optical module 1014. FIG. 65 shows an example in which the fiber connector 1012 is separated from the co-packaged optical module 1014.

The following describes rack unit thermal architectures for rackmount systems (e.g., 560 of FIG. 22, 600 of FIG. 23, 630 of FIG. 24, 680 of FIG. 26, 720 of FIG. 28, 750 of FIG. 29, 860 of FIG. 43) that include data processing chips (e.g., 572 of FIGS. 22, 23, 640 of FIG. 24, 682 of FIG. 26A, 722 of FIG. 28, 758 of FIG. 29, 864 of FIG. 43) that are mounted on vertically oriented circuit boards that are substantially vertical to the bottom surfaces of the system housings or enclosures. In some implementations, the rack unit thermal architectures use air cooling to remove heat generated by the data processing chips. In these systems, the heat-generating data processing chips are positioned near the input/output interfaces, which can include, e.g., one or more of the integrated optical communication device 448, 462, 466, or 472 of FIG. 17, the integrated communication device 574 of FIG. 22 or 612 of FIG. 23, the optical/electrical communication interface 644 of FIG. 24, 684 of FIG. 26, 724 of FIG. 28, or 760 of FIG. 29, or the optical module with connector 868 of FIG. 43, that are positioned at or near the front panel to enable users to conveniently connect/disconnect optical transceivers to/from the rackmount systems. The rack unit thermal architectures described in this specification include mechanisms for increasing airflow across the surfaces of the data processing chips, or heat sinks thermally coupled to the data processing chips, taking into consideration that a substantial portion of the surface area on the front panel of the housing needs to be allocated to the input/output interfaces.

The rackmount systems and rackmount devices described in this document can include, and are not limited to, e.g., rackmount computer servers, rackmount network switches, rackmount controllers, and rackmount signal processors.

Figure 67:
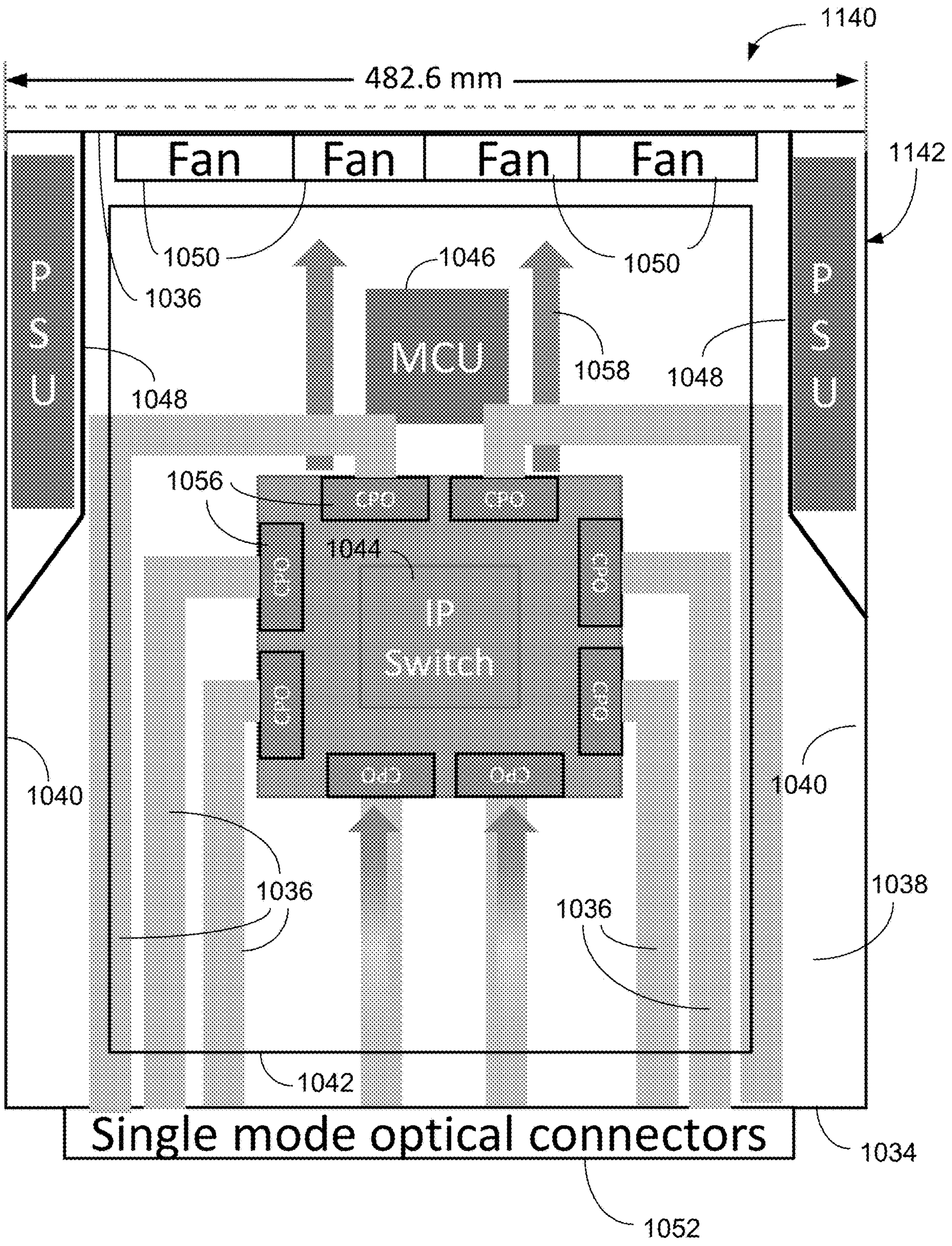
FIG. 67 is a top view of an example of a rackmount server.

Referring to FIG. 67, a data server 1140 suitable for installation in a standard server rack can include a housing

1042 that has a front panel 1034, a rear panel 1036, a bottom panel 1038, a top panel, and side panels 1040. For example, the housing 1042 can have a 2 rack unit (RU) form factor, having a width of about 482.6 mm (19 inches) and a height of 2 rack units. One rack unit is about 44.45 mm (approximately 1.75 inches). A printed circuit board 1042 is mounted on the bottom panel 1038, and at least one data processing chip 1044 is electrically coupled to the printed circuit board 1042. A microcontroller unit 1046 is provided to control various modules, such as power supplies 1048 and exhaust fans 1050. In this example, the exhaust fans 1050 are mounted at the rear panel 1036. For example, single mode optical connectors 1052 are provided at the front panel 1034 for connection to external optical cables. Optical interconnect cables 1036 transmit signals between the single mode optical connectors 1052 and the at least one data processing chip 1044. The exhaust fans 1050 mounted at the rear panel 1036 cause the air to flow from the front side to the rear side of the housing 1042. The directions of air flow are represented by arrows 1058. Warm air inside the housing 1042 is vented out of the housing 1042 through the exhaust fans 1050 at the rear panel 1036. In this example, the front panel 1034 does not include any fan in order to maximize the area used for the single mode optical connectors 1052.

For example, the data server 1300 can be a network switch server, and the at least one data processing chip 1044 can include at least one switch chip configured to process data having a total bandwidth of, e.g., about 51.2 Tbps. The at least one switch chip 1044 can be mounted on a substrate 1054 having dimensions of, e.g., about 100 mm×100 mm, and co-packaged optical modules 1056 can be mounted near the edges of the substrate 1054. The co-packaged optical modules 1056 convert input optical signals received from the optical interconnect cables 1036 to input electrical signals that are provided to the at least one switch chip 1044, and converts output electrical signals from the at least one switch chip 1044 to output optical signals that are provided to the optical interconnect cables 1036. When any of the co-packaged optical modules 1056 fails, the user needs to remove the network switch server 1030 from the server rack and open the housing 1042 in order to repair or replace the faulty co-packaged optical module 1056.

Figure 68A:
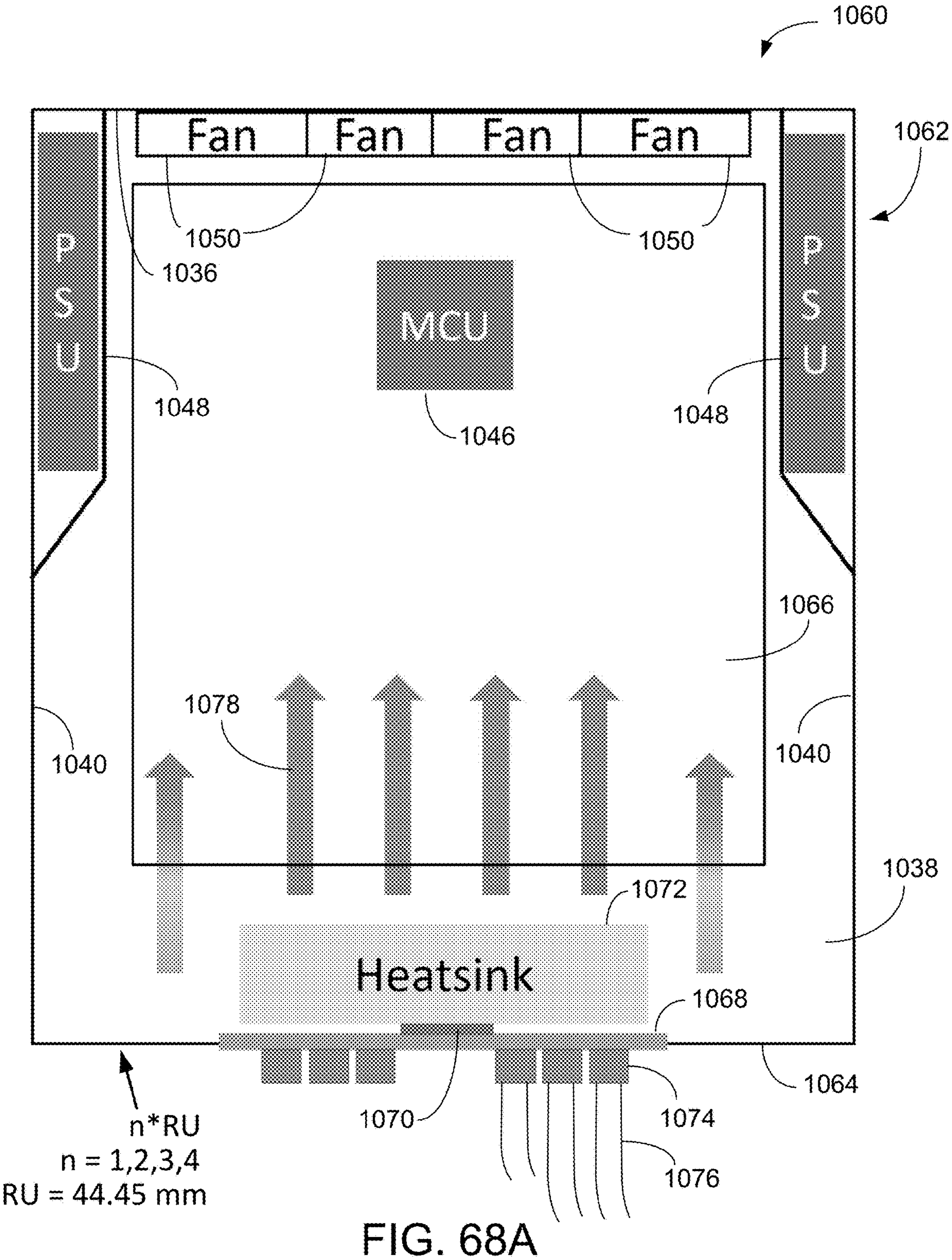
FIG. 68A is a top view of an example of a rackmount server.
Figure 68B:
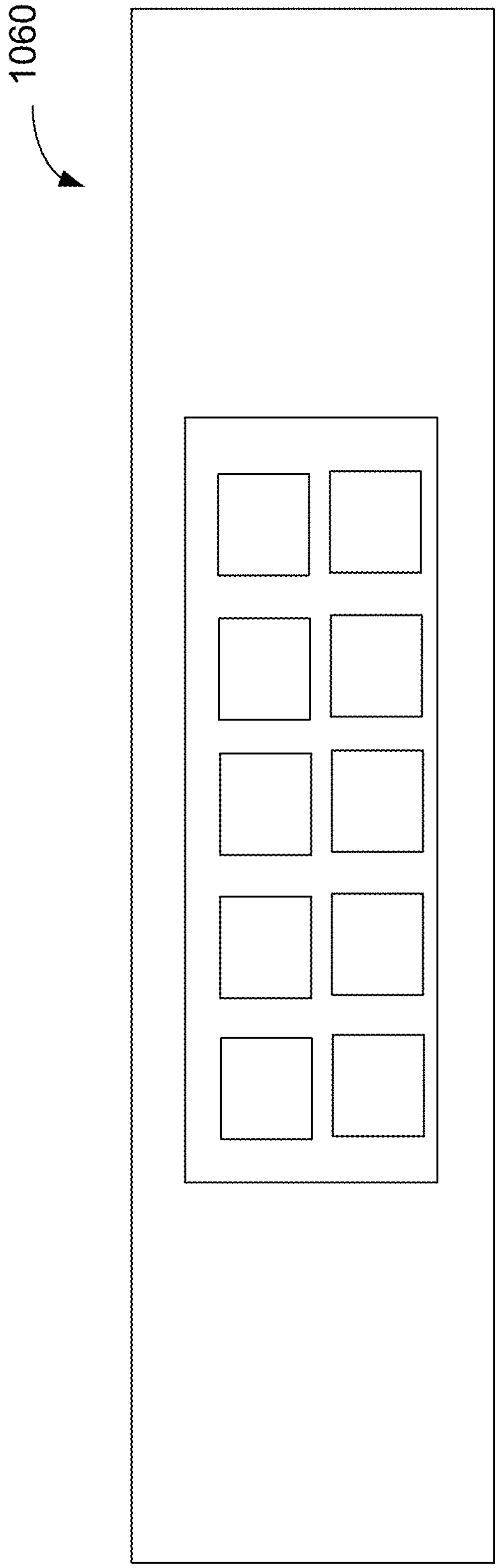
FIG. 68B is a diagram of an example of a front panel of the rackmount server.

Referring to FIGS. 68A and 68B, in some implementations, a rackmount server 1060 includes a housing or case 1062 having a front panel 1064 (or face plate), a rear panel 1036, a bottom panel 1038, a top panel, and side panels 1040. For example, the housing 1062 can have a form factor of 1RU, 2RU, 3RU, or 4RU, having a width of about 482.6 mm (19 inches) and a height of 1, 2, 3, or 4 rack units. A first printed circuit board 1066 is mounted on the bottom panel 1038, and a microcontroller unit 1046 is electrically coupled to the first printed circuit board 1066 and configured to control various modules, such as power supplies 1048 and exhaust fans 1050.

Figure 68C:
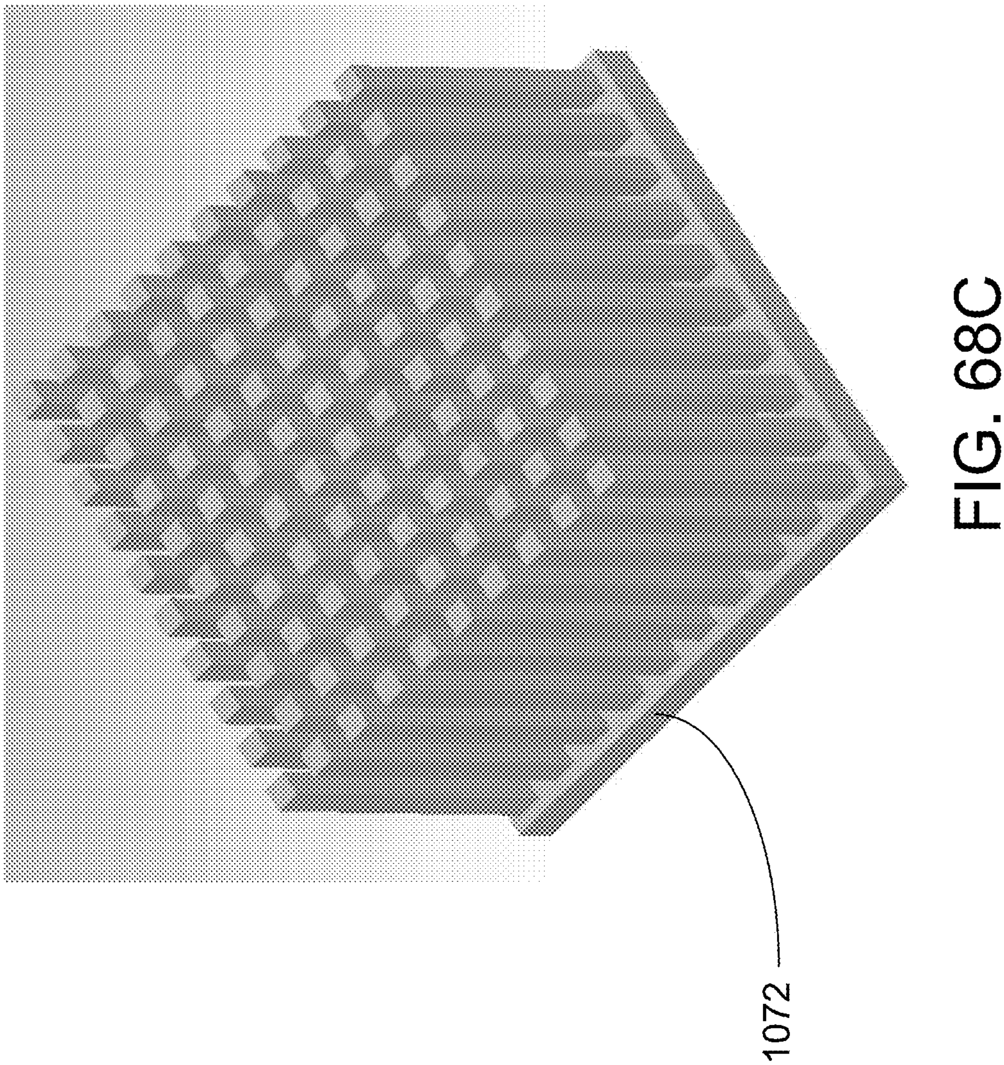
FIG. 68C is a perspective view of an example of a heat sink.

In some implementations, the front panel 1064 includes a second printed circuit board 1068 that is oriented in a vertical direction, e.g., substantially perpendicular to the first circuit board 1066 and the bottom panel 1038. In the following, the second printed circuit board 1068 is referred to as the vertical printed circuit board 1068. The figures show that the second printed circuit board 1066 forms part of the front panel 1064, but in some examples the second printed circuit board 1066 can also be attached to the front panel 1064, in which the front panel 1064 includes openings to allow input/output connectors to pass through. The second printed circuit board 1066 includes a first side facing the front direction relative to the housing 1062 and a second side facing the rear direction relative to the housing 1062. At least one data processing chip 1070 is electrically coupled to the second side of the vertical printed circuit board 1068, and a heat dissipating device or heat sink 1072 is thermally coupled to the at least one data processing chip 1070. In some examples, the at least one data processing chip 1070 is mounted on a substrate (e.g., a ceramic substrate), and the substrate is attached to the printed circuit board 1068. FIG. 68C is a perspective view of an example of the heat dissipating device or heat sink 1072. For example, the heat dissipating device 1072 can include a vapor chamber thermally coupled to heat sink fins. The exhaust fans 1050 mounted at the rear panel 1036 cause the air to flow from the front side to the rear side of the housing 1042. The directions of air flow are represented by arrows 1078. Warm air inside the housing 1042 is vented out of the housing 1042 through the exhaust fans 1050 at the rear panel 1036.

Co-packaged optical modules 1074 (also referred to as the optical/electrical communication interfaces) are attached to the first side (i.e., the side facing the front exterior of the housing 1062) of the vertical printed circuit board 1068 for connection to external fiber cables 1076. Each fiber cable 1076 can include an array of optical fibers. By placing the co-packaged optical modules 1074 on the exterior side of the front panel 1064, the user can conveniently service (e.g., repair or replace) the co-packaged optical modules 1074 when needed. Each co-packaged optical module 1074 is configured to convert input optical signals received from the external fiber cable 1076 into input electrical signals that are transmitted to the at least one data processing chip 1070 through signal lines in or on the vertical circuit board 1068. The co-packaged optical module 1074 also converts output electrical signals from the at least one data processing chip 1070 into output optical signals that are provided to the external fiber cables 1076. Warm air inside the housing 1062 is vented out of the housing 1062 through the exhaust fans 1050 mounted at the rear panel 1036.

For example, the at least one data processing chip 1070 can include a network switch, a central processor unit, a graphics processor unit, a tensor processing unit, a neural network processor, an artificial intelligence accelerator, a digital signal processor, a microcontroller, or an application specific integrated circuit (ASIC). The rackmount server can be, and not limited to, e.g., a rackmount computer server, a rackmount switch, a rackmount controller, a rackmount signal processor, a rackmount storage server, a rackmount multi-purpose processing unit, a rackmount graphics processor, a rackmount tensor processor, a rackmount neural network processor, or a rackmount artificial intelligence accelerator. For example, each co-packaged optical module 1074 can include a module similar to the integrated optical communication device 448, 462, 466, or 472 of FIG. 17, the integrated optical communication device 210 of FIG. 20, the integrated communication device 612 of FIG. 23, the optical/electrical communication interface 684 of FIG. 26, 724 of FIG. 28, or 760 of FIG. 29, the integrated optical communication device 512 of FIG. 32, or the optical module with connector 868 of FIG. 43. For example, each fiber cable 1076 can include the optical fibers 226 (FIGS. 2, 4), 272 (FIGS. 6, 7), 582 (FIG. 22, 23), or 734 (FIG. 28), or the optical fiber cable 762 (FIG. 762), 956 (FIG. 53), or 996 (FIG. 61).

For example, the co-packaged optical module 1074 can include a first optical connector part (e.g., 456 of FIG. 17, 578 of FIG. 22 or 23, 746 of FIG. 28) that is configured to be removably coupled to a second optical connector part (e.g., 458 of FIG. 17, 580 of FIG. 22 or 23, 748 of FIG. 28)

that is attached to the external fiber cable 1076. For example, the co-packaged optical module 1074 includes a photonic integrated circuit (e.g., 450, 464, 468, or 474 of FIG. 17, 586 of FIG. 22, 618 of FIG. 23, or 726 of FIG. 28) that is optically coupled to the first optical connector part. The photonic integrated circuit receives input optical signals from the first optical connector part and generates input electrical signals based on the input optical signals. At least a portion of the input electrical signals generated by the photonic integrated circuit are transmitted to the at least one data processing chip 1070 through electrical signal lines in or on the vertical printed circuit board 1068. For example, the photonic integrated circuit can be configured to receive output electrical signals from the at least one data processing chip 1070 and generate output optical signals based on the output electrical signals. The output optical signals are transmitted through the first and second optical connector parts to the external fiber cable 1076.

In some examples, the fiber cable 1076 can include, e.g., 10 or more cores of optical fibers, and the first optical connector part is configured to couple 10 or more channels of optical signals to the photonic integrated circuit. In some examples, the fiber cable 1076 can include 100 or more cores of optical fibers, and the first optical connector part is configured to couple 100 or more channels of optical signals to the photonic integrated circuit. In some examples, the fiber cable 1076 can include 500 or more cores of optical fibers, and the first optical connector part is configured to couple 500 or more channels of optical signals to the photonic integrated circuit. In some examples, the fiber cable 1076 can include 1000 or more cores of optical fibers, and the first optical connector part is configured to couple 1000 or more channels of optical signals to the photonic integrated circuit.

In some implementations, the photonic integrated circuit can be configured to generate first serial electrical signals based on the received optical signals, in which each first serial electrical signal is generated based on one of the channels of first optical signals. Each co-packaged optical module 1074 can include a first serializers/deserializers module that includes serializer units and deserializer units, in which the first serializers/deserializers module is configured to generate sets of first parallel electrical signals based on the first serial electrical signals and condition the electrical signals, and each set of first parallel electrical signals is generated based on a corresponding first serial electrical signal. Each co-packaged optical module 1074 can include a second serializers/deserializers module that includes serializer units and deserializer units, in which the second serializers/deserializers module is configured to generate second serial electrical signals based on the sets of first parallel electrical signals, and each second serial electrical signal is generated based on a corresponding set of first parallel electrical signals.

In some examples, the rackmount server 1060 can include 4 or more co-packaged optical modules 1074 that are configured to be removably coupled to corresponding second optical connector parts that are attached to corresponding fiber cables 1076. For example, the rackmount server 1060 can include 16 or more co-packaged optical modules 1074 that are configured to be removably coupled to corresponding second optical connector parts that are attached to corresponding fiber cables 1076. In some examples, each fiber cable 1076 can include 10 or more cores of optical fibers. In some examples, each fiber cable 1076 can include 100 or more cores of optical fibers. In some examples, each fiber cable 1076 can include 500 or more cores of optical fibers. In some examples, each fiber cable 1076 can include 1000 or more cores of optical fibers. Each optical fiber can transmit one or more channels of optical signals. For example, the at least one data processing chip 1070 can include a network switch that is configured to receive data from an input port associated with a first one of the channels of optical signals, and forward the data to an output port associated with a second one of the channels of optical signals.

In some implementations, the co-packaged optical modules 1074 are removably coupled to the vertical printed circuit board 1068. For example, the co-packaged optical modules 1074 can be electrically coupled to the vertical printed circuit board 1068 using electrical contacts that include, e.g., spring-loaded elements, compression interposers, or land-grid arrays.

Figure 69A:
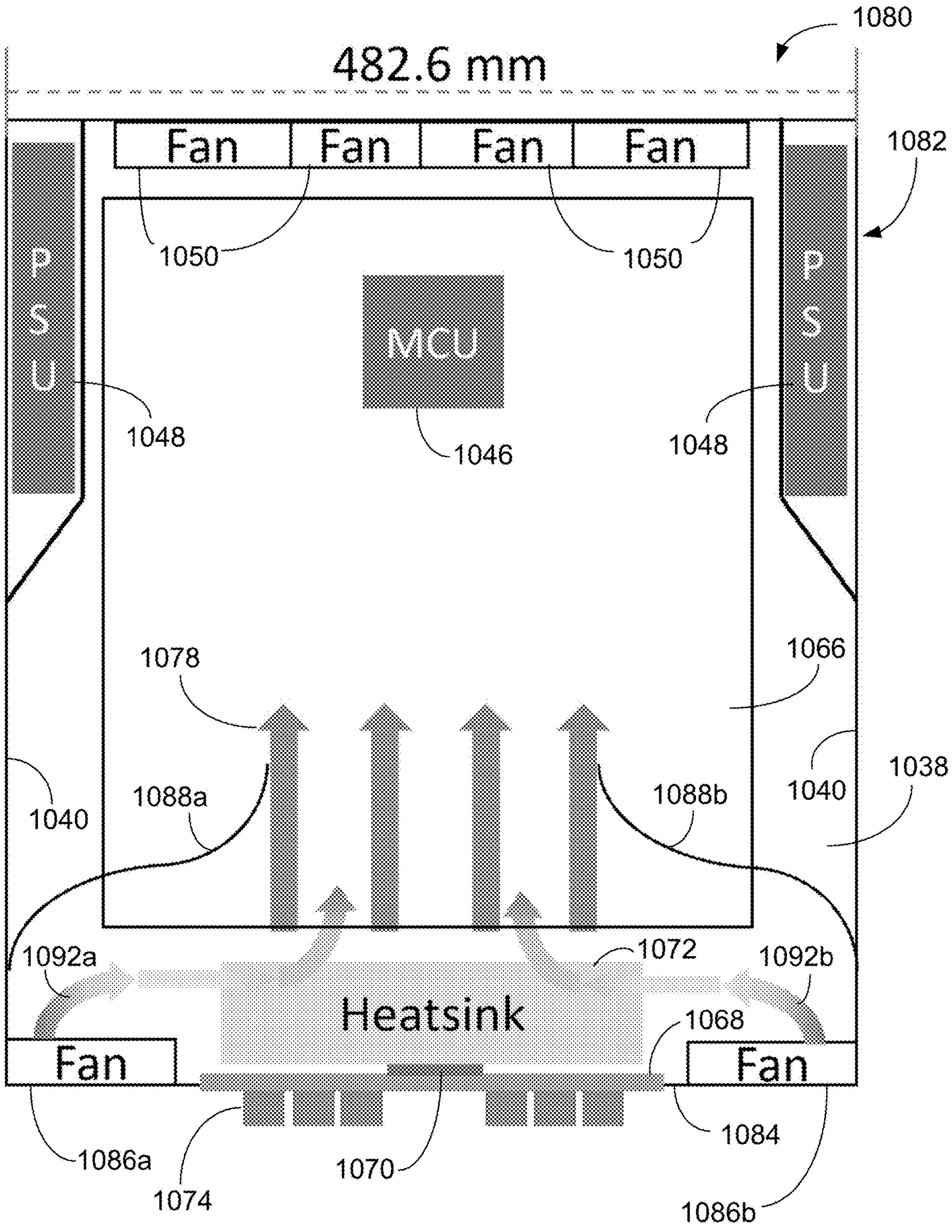
FIG. 69A is a top view of an example of a rackmount server.
Figure 69B:
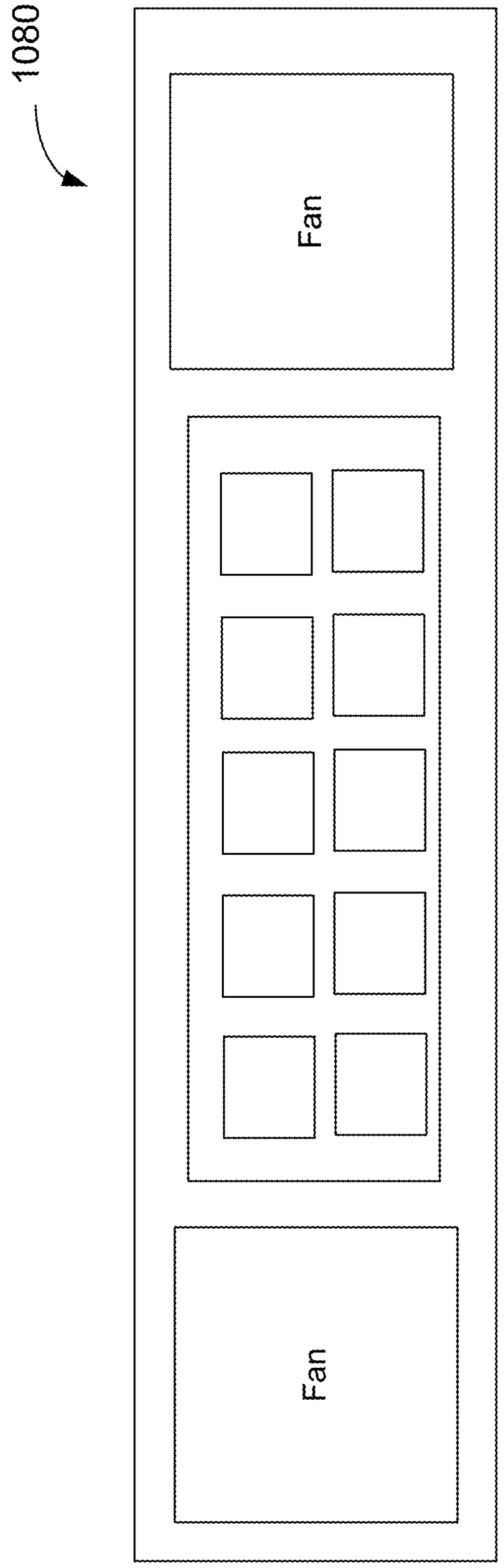
FIG. 69B is a diagram of an example of a front panel of the rackmount server.

Referring to FIGS. 69A and 69B, in some implementations, a rackmount server 1080 includes a housing 1082 having a front panel 1084. The rackmount server 1080 is similar to the rackmount server 1060 of FIG. 68A, except that one or more fans are mounted on the front panel 1084, and one or more air louvers installed in the housing 1082 to direct air flow towards the heat dissipating device. For example, the rackmount server 1080 can include a first inlet fan 1086*a* mounted on the front panel 1084 to the left of the vertical printed circuit board 1068, and a second inlet fan 1086*b* mounted on the front panel 1084 to the right of the vertical printed circuit board 1068. The terms "right" and "left" refer to relative positions of components shown in the figure. It is understood that, depending on the orientation of a device having a first and second modules, a first module that is positioned to the "left" or "right" of a second module can in fact be to the "right" or "left" (or any other relative position) of the second module. For example, depending on the orientation of the rackmount server 1080, the inlet fans can be positioned below and/or above the vertical printed circuit board 1068. Depending on the shape of the rackmount server 1080, it is possible to have inlet fans positioned left, right, below and/or above the vertical printed circuit board 1068, or in any combination of those positions. One or more fans can be positioned in front of the plane that extends along the printed circuit board and designed to blow air towards components coupled to the front side of the printed circuit board, and one or more fans can be positioned to the rear of the plane that extends along the printed circuit board and designed to blow air towards components coupled to the back side of the printed circuit board. The inlet and exhaust fans operate in a push-pull manner, in which the inlet fans 1086*a* and 1086*b* (collectively referenced as 1086) pull cool air into the housing 1082, and the exhaust fans 1050 push warm air out of the housing 1082. The inlet fans 1086 in the front panel or face plate 1064 and the exhaust fans 1050 on the backside of the rack generate a pressure gradient through the housing or case to improve air cooling compared to standard 1RU implementations that include only backside exhaust fans.

The inlet fans do not necessarily have to be attached to the front panel, and can also be positioned at a distance front the front panel. The vertical printed circuit board 1068 can be positioned at a distance from the front panel, and the position of the inlet fans can be adjusted accordingly to maximize the efficiency for transferring heat away from the heat sink 1072.

In some implementations, a left air louver 1088*a* and a right air louver 1088*b* are installed in the housing 1082 to direct airflow toward the heat dissipating device 1072. The air louvers 1088*a*, 1088*b* (collectively referenced as 1088)

partition the space in the housing 1082 and force air to flow from the inlet fans 1086*a* and 1086*b*, pass over surfaces of fins of the heat dissipating device 1072, and towards an opening 1090 between distal ends of the air louvers 1088. The directions of air flow near the inlet fans 1086*a* and 1086*b* are represented by arrows 1092*a* and 1092*b*. The air louvers 1088 increase the amount of air flows across the surfaces of the heat sink fins and enhance the efficiency of heat removal. The heat sink fins are oriented to extend along planes that are substantially parallel to the bottom surface 1038 of the housing 1082. For example, the air louvers 1088 can have a curved shape, e.g., an S-shape as shown in the figure. The curved shape of the air louvers 1088 can be configured to maximize the efficiency of the heat sink. In some examples, the air louvers 1088 can also have a linear shape.

For example, the heat sink can be a plate-fin heat sink, a pin-fin heat sink, or a plate-pin-fin heat sink. The pins can have a square or circular cross section. The heat sink configuration (e.g., pin pitch, length of pins or fins) and the louver configuration can be designed to optimize heat sink efficiency.

For example, the co-packaged optical modules 1074 can be electrically coupled to the vertical printed circuit board 1068 using electrical contacts that include, e.g., spring-loaded elements, compression interposers, or land-grid arrays. For example, when compression interposers are used, the vertical circuit board 1068 can be positioned such that the face of compression interposers of the co-packaged optical module 1074 is coplanar with the face plate 1064 and the inlet fans 1086.

Figure 70:
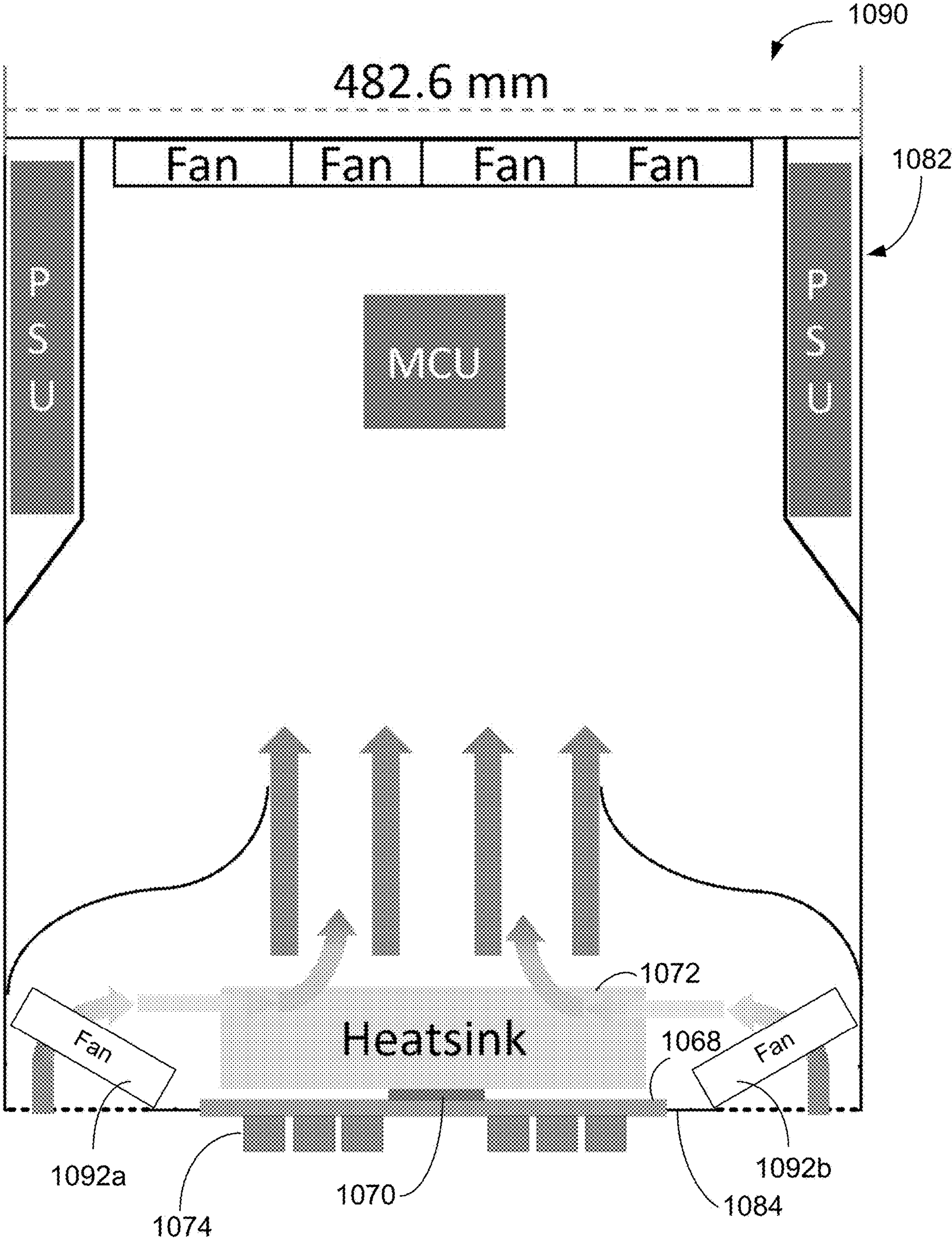
FIG. 70 is a top view of an example of a rackmount server.

Referring to FIG. 70, in some implementations, a rackmount server 1090 is similar to the rackmount server 1080 of FIG. 69, which includes inlet fans mounted on the front panel. The inlet fans of the rackmount server 1090 are slightly rotated, as compared to the inlet fans of the rackmount server 1080 to improve efficiency of the heat sink. The rotational axes of the inlet fans, instead of being parallel to the front-to-rear direction relative to the housing 1082, can be rotated slightly inwards. For example, the rotational axis of a left inlet fan 1092*a* can be rotated slightly clockwise and the rotational axis of a right inlet fan 1092*b* can be rotated slightly counter-clockwise, to enhance the air flow across the surfaces of the heat sink fins, further improving the efficiency of heat removal.

In some implementations heat removal efficiency can be improved by positioning the vertical circuit board 1068 and the heat dissipating device 1072 further toward the rear of the housing so that a larger amount of air flows across the surface of the fins of the heat dissipating device 1072.

Figure 71A:
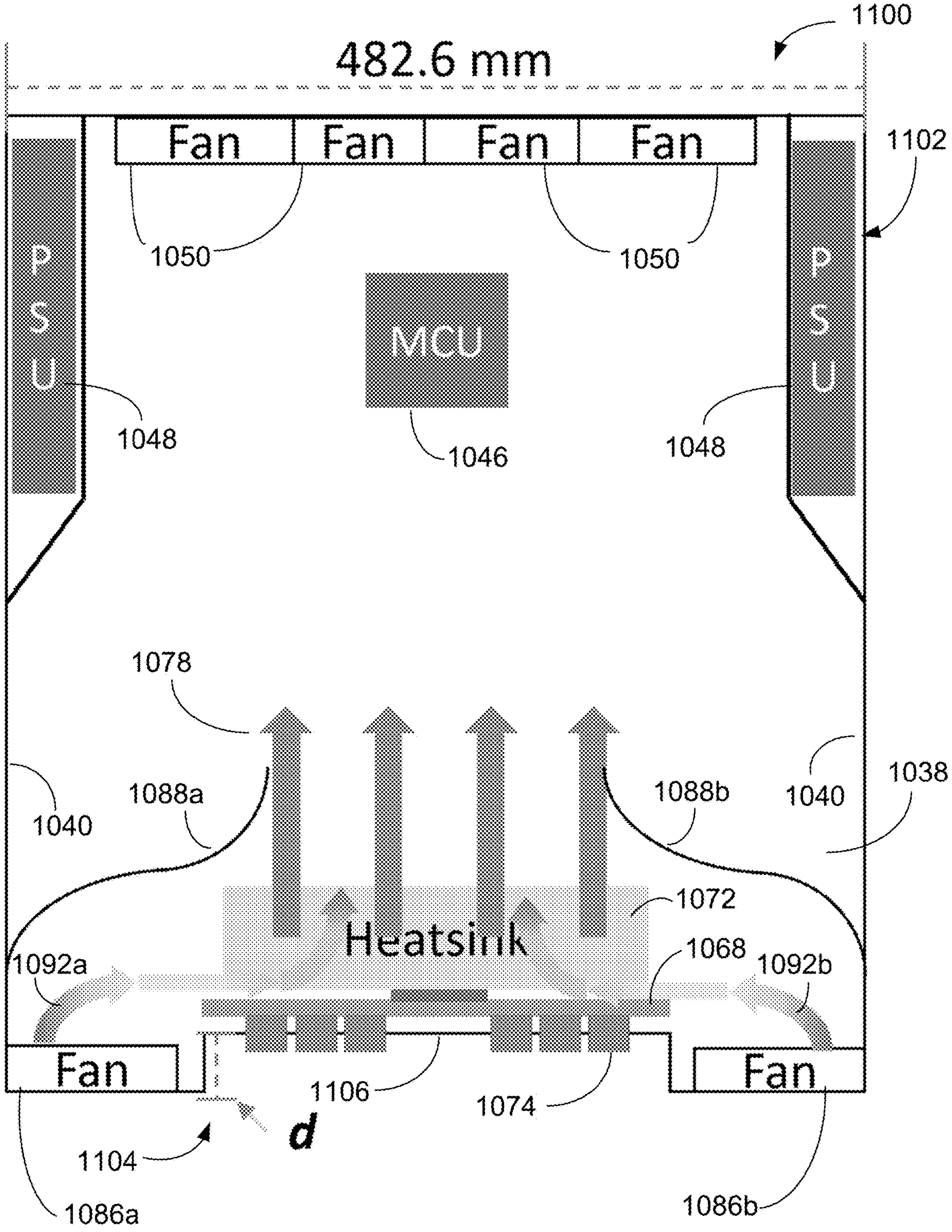
FIG. 71A is a top view of an example of a rackmount server.
Figure 71B:
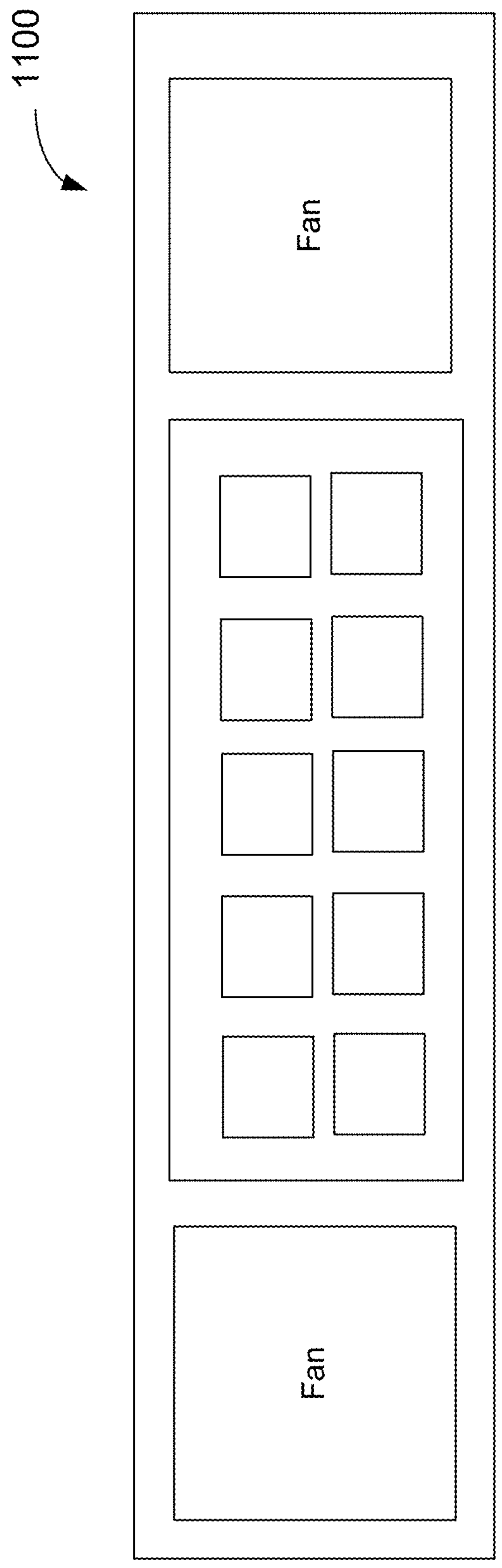
FIG. 71B is a front view of the rackmount server.

Referring to FIGS. 71A to 71B, a rackmount server 1100 includes a housing 1102 having a front panel or face plate 1104, in which the portion of the face plate 1104 where the compression interposers for the co-packaged optical module 1074 are located are inset by a distance d with respect to the original face plate 1104. The face plate 1104 has a recessed portion or an inset portion 1106 that is offset at a distance d (referred to as the "front panel inset distance") toward the rear of the housing 1102 relative to the other portions (e.g., the portions on which the inlet fans 1086*a* and 1086*b* are mounted) of the front panel 1104. The inset portion 1106 is referred to as the "recessed front panel," "recessed face plate," "front panel inset," or "face plate inset." The vertical printed circuit board 1068 is attached to the inset portion 1106, which includes openings to allow the co-packaged optical modules 1074 to pass through. The inset portion 1106 is configured to have sufficient area to accommodate the co-packaged optical modules 1074.

By providing the inset portion 1106 in the front panel 1104, the fins of the heat dissipating device 1072 can be more optimally positioned to be closer to the main air flow generated by the inlet fans 1086, while maintaining serviceability of the co-packaged optical modules 1074, e.g., allowing the user to repair or replace damaged co-packaged optical modules 1074 without opening the housing 1102. The heat sink configuration (e.g., pin pitch, length of pins or fins) and the louver configuration can be designed to optimize heat sink efficiency. In addition, the front panel inset distance d can be optimized to improve heat sink efficiency.

Figure 72:
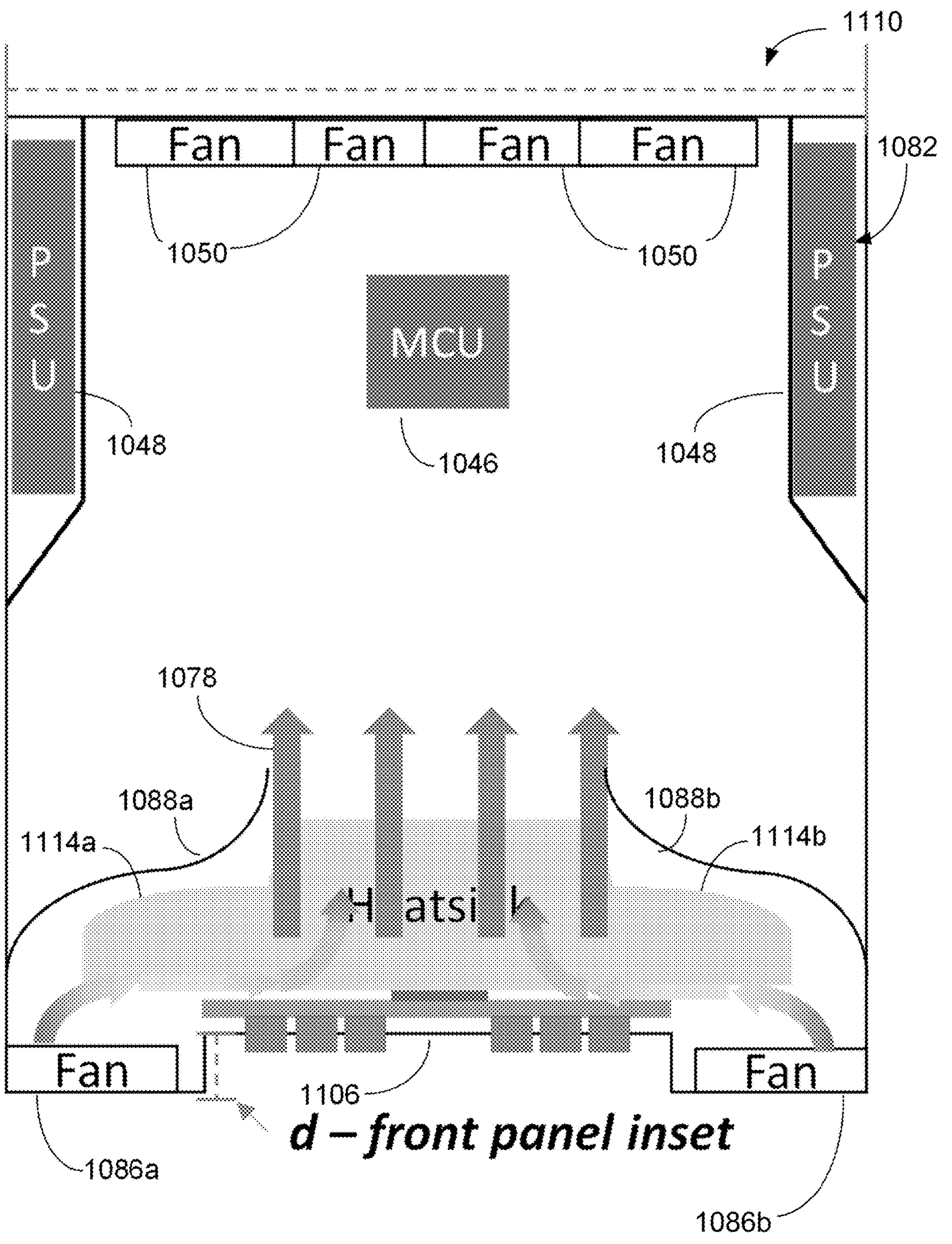
FIG. 72 is a top view of an example of a rackmount server.

Referring to FIG. 72, in some implementations, a rackmount server 1110 is similar to the rackmount server 1100 of FIG. 71, except that the server 1110 includes a heat dissipating device 1112 that has fins 1114*a* and 1114*b* that extend beyond the edge of the vertical printed circuit board 1068 and closer to the inlet fans 1086*a*, 1086*b*, as compared to the fins in the example of FIG. 71. The configuration of the fins (e.g., the shapes, sizes, and number of fins) can be selected to maximize the efficiency of heat removal.

Figure 73A:
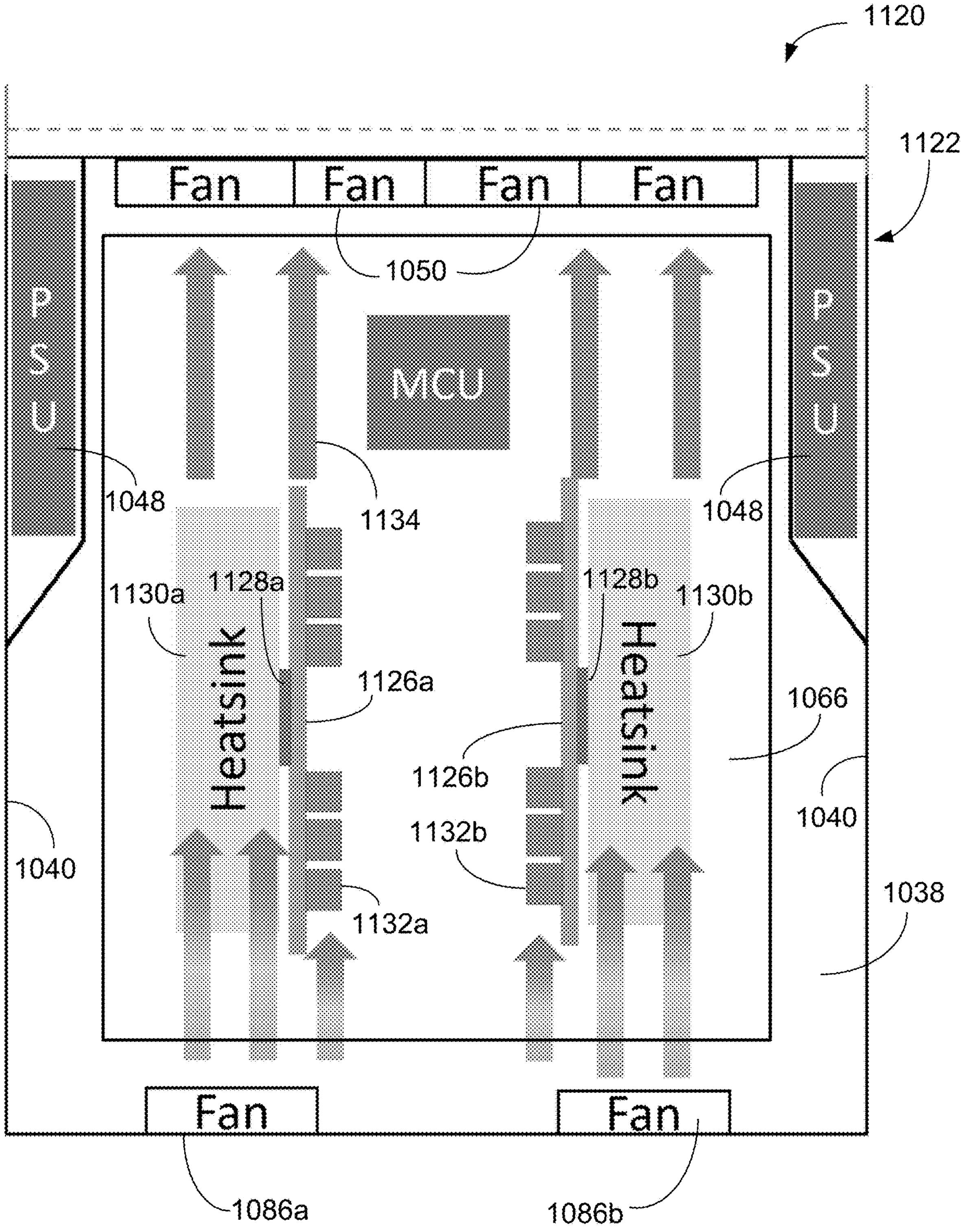
FIG. 73A is a top view of an example of a rackmount server.
Figure 73B:
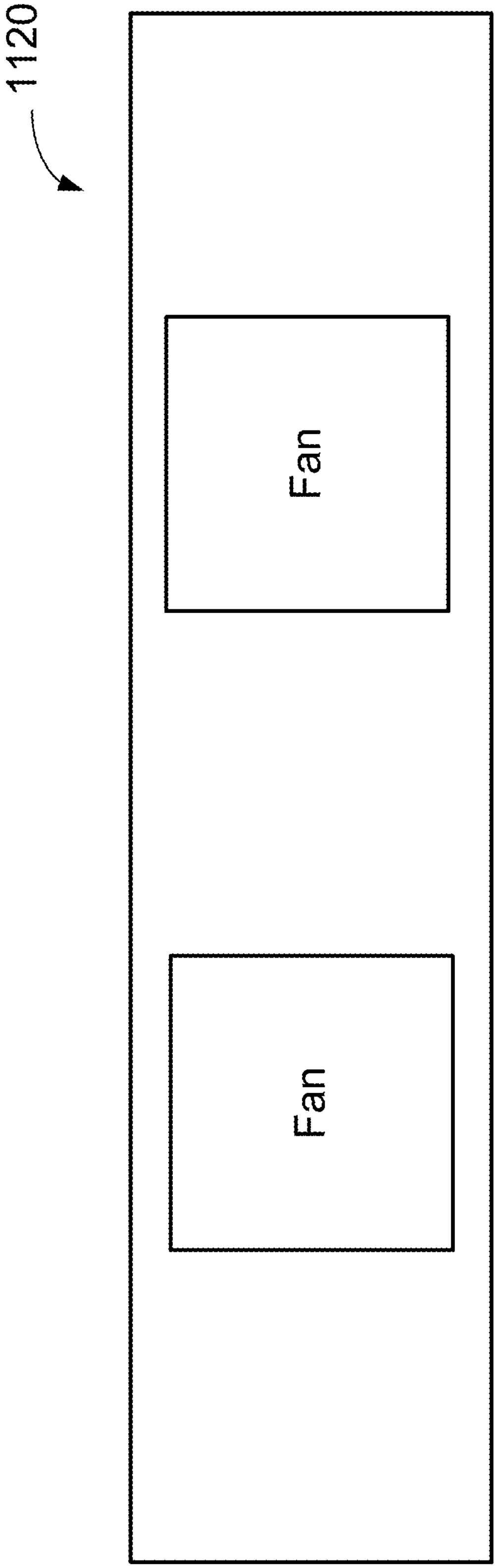
FIG. 73B is a front view of the rackmount server.

Referring to FIGS. 73A and 73B, in some implementations, a rackmount server 1120 includes a housing 1122 having a front panel 1124, a rear panel 1036, a bottom panel 1038, a top panel, and side panels 1040. The width and height of the housing 1122 can be similar to those of the housing 1062 of FIG. 68A. The server 1120 includes a first printed circuit board 1066 that extends parallel to the bottom panel 1038, and one or more vertical printed circuit boards, e.g., 1126*a* and 1126*b* (collectively referenced as 1126), that are mounted perpendicular to the first printed circuit board 1066. The server 1120 includes one or more inlet fans 1086 mounted on the front panel 1124 and one or more exhaust fans 1050 mounted on the rear panel 1036. The air flow in the housing 1122 is generally in the front-to-rear direction. The directions of the air flows are represented by the arrows 1134.

Each vertical printed circuit board 1126 has a first surface and a second surface. The first surface defines the length and width of the vertical printed circuit board 1126. The distance between the first and second surfaces defines the thickness of the vertical printed circuit board 1126. The vertical printed circuit board 1126*a* or 1126*b* is oriented such that the first surface extends along a plane that is substantially parallel to the front-to-rear direction relative to the housing 1122. At least one data processing chip 1128*a* or 1128*b* is electrically coupled to the first surface of the vertical printed circuit board 1126*a* or 1126*b*, respectively. In some examples, the at least one data processing chip 1128*a* or 1128*b* is mounted on a substrate (e.g., a ceramic substrate), and the substrate is attached to the printed circuit board 1126*a* or 1126*b*. A heat dissipating device 1130*a* or 1130*b* is thermally coupled to the at least one data processing chip 1128*a* or 1128*b*, respectively. The heat dissipating device 1130 includes fins that extend along planes that are substantially parallel to the bottom panel 1038 of the housing 1122. The heat sinks 1130*a* and 1130*b* are positioned directly behind to the inlet fans 1086*a* and 1086*b*, respectively, to maximize air flow across the fins and/or pins of the heat sinks 1130.

At least one co-packaged optical module 1132*a* or 1132*b* is mounted on the second side of the vertical printed circuit board 1126*a* or 1126*b*, respectively. The co-packaged optical modules 1132 are optically coupled, through optical interconnection links, to optical interfaces (not shown in the figure) mounted on the front panel 1124. The optical interfaces are optically coupled to external fiber cables. The orientations of the vertical printed circuit boards 1126 and the fins of the heat dissipating devices 1130 are selected to maximize heat removal.

Figure 74A:
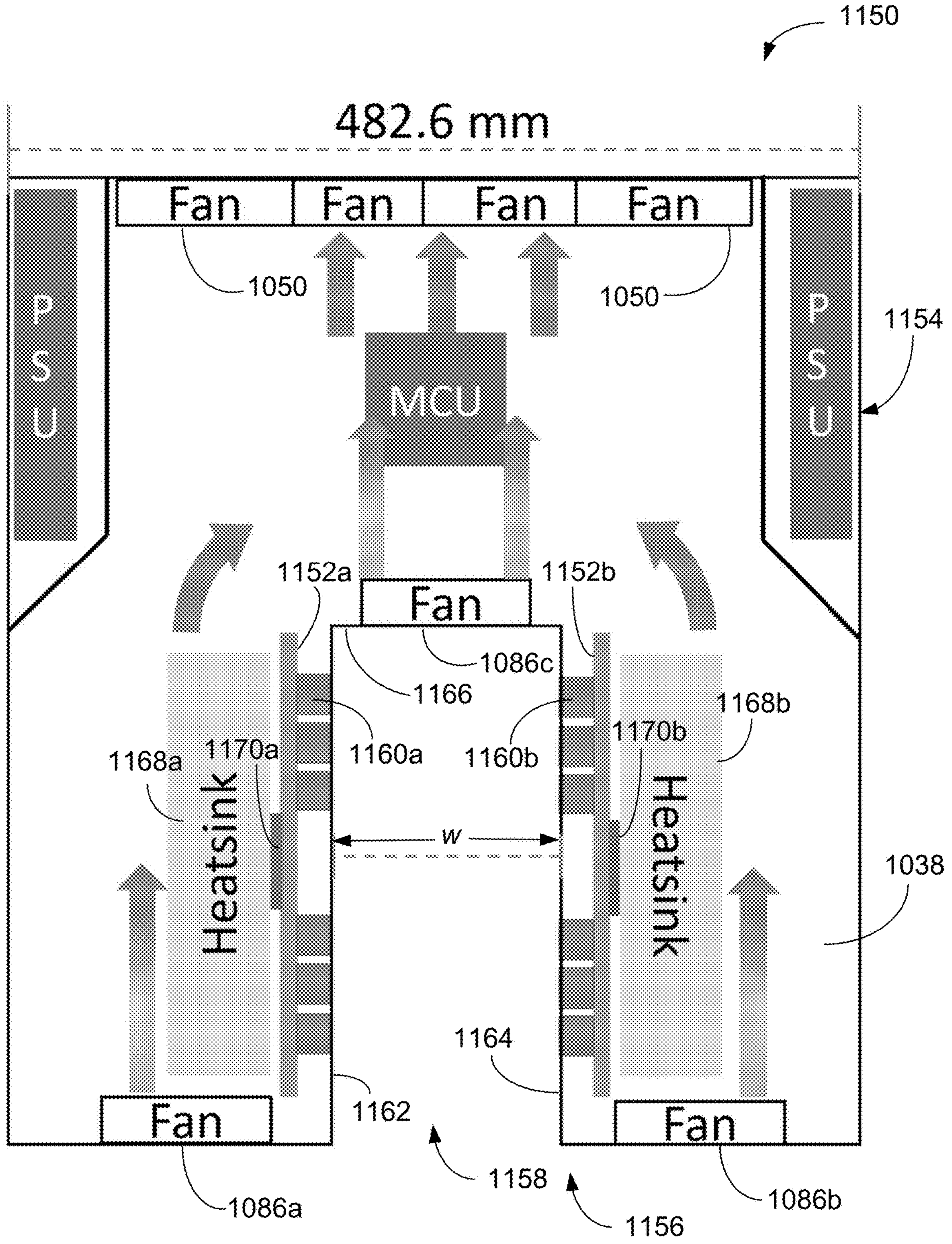
FIG. 74A is a top view of an example of a rackmount server.
Figure 74B:
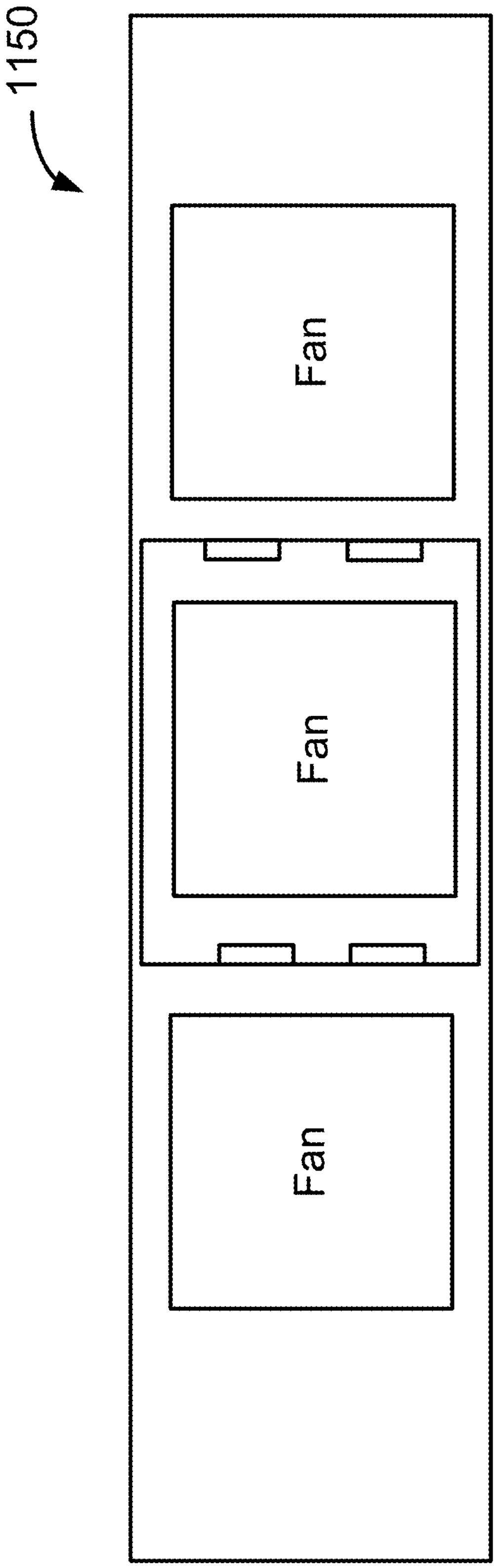
FIG. 74B is a front view of the rackmount server.

Referring to FIGS. 74A to 74B, in some implementations, a rackmount server 1150 includes vertical printed circuit boards 1152*a* and 1152*b* (collectively referenced as 1152) that have surfaces that extend along planes substantially parallel to the front-to-rear direction relative to the housing or case, similar to the vertical printed circuit boards 1126*a* and 1126*b* of FIG. 73. The rackmount server 1150 includes a housing 1154 that has a modified front panel or face plate 1156 that has an inset portion 1158 configured to improve access and field serviceability of co-packaged optical modules 1160*a* and 1160*b* (collectively referenced as 1160) that are mounted on the vertical printed circuit boards 1152*a* and 1152*b*, respectively. The inset portion 1158 is referred to as the “front panel inset” or “face plate inset.” The inset portion 1158 has a width w that is selected to enable hot-swap, in-field serviceability of the co-packaged optical modules 1160 to avoid the need to take the rackmount server 1150 out of service for maintenance.

For example, the inset portion 1158 includes a first wall 1162, a second wall 1164, and a third wall 1166. The first wall 1162 is substantially parallel to the second wall 1164, and the third wall 1166 is positioned between the first wall 1162 and the second wall 1164. For example, the first wall 1162 extends along a direction that is substantially parallel to the front-to-rear direction relative to the housing 1122. The vertical printed circuit board 1152*a* is attached to the first wall 1162 of the inset portion 1158, and the vertical printed circuit board 1152*b* is attached to the first wall 1162 of the inset portion 1158. The first wall 1162 includes openings to allow the co-packaged optical modules 1160*a* to pass through, and the second wall 1164 includes openings to allow the co-packaged optical modules 1160*b* to pass through. For example, an inlet fan 1086*c* can be mounted on the third wall 1166.

Each vertical printed circuit board 1152 has a first surface and a second surface. The first surface defines the length and width of the vertical printed circuit board 1152. The distance between the first and second surfaces defines the thickness of the vertical printed circuit board 1152. The vertical printed circuit board 1152*a* or 1152*b* is oriented such that the first surface extends along a plane that is substantially parallel to the front-to-rear direction relative to the housing 1154. At least one data processing chip 1170*a* or 1170*b* is electrically coupled to the first surface of the vertical printed circuit board 1152*a* or 1152*b*, respectively. In some examples, the at least one data processing chip 1170*a* or 1170*b* is mounted on a substrate (e.g., a ceramic substrate), and the substrate is attached to the printed circuit board 1152*a* or 1152*b*. A heat dissipating device 1168*a* or 1168*b* is thermally coupled to the at least one data processing chip 1170*a* or 1170*b*, respectively. The heat dissipating device 1168 includes fins that extend along planes that are substantially parallel to the bottom panel 1038 of the housing 1154. The heat sinks 1168*a* and 1168*b* are positioned directly behind to the inlet fans 1086*a* and 1086*b*, respectively, to maximize air flow across the fins and/or pins of the heat sinks 1168*a* and 1168*b*.

Figure 75A:
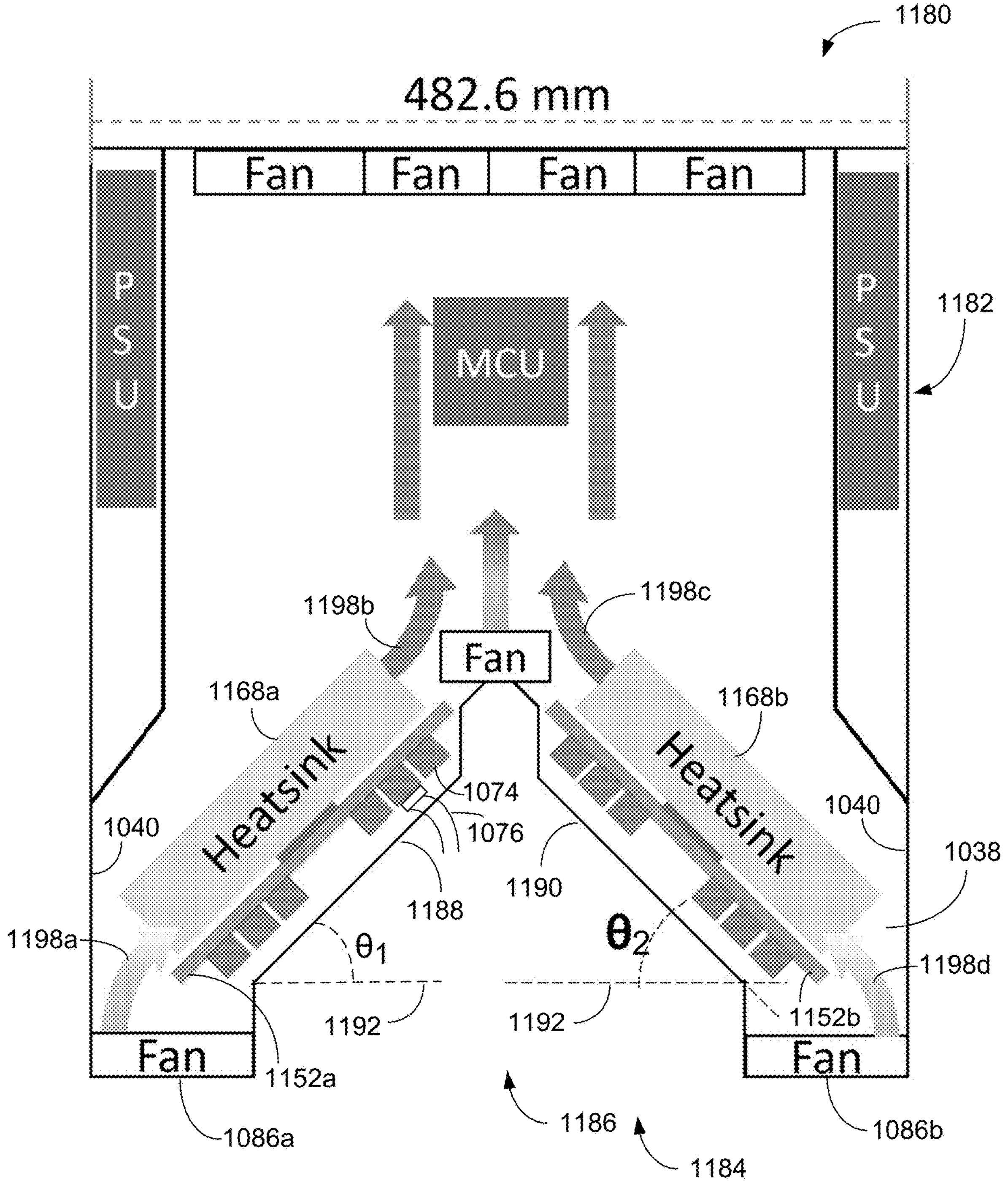
FIG. 75A is a top view of an example of a rackmount server.
Figure 75B:
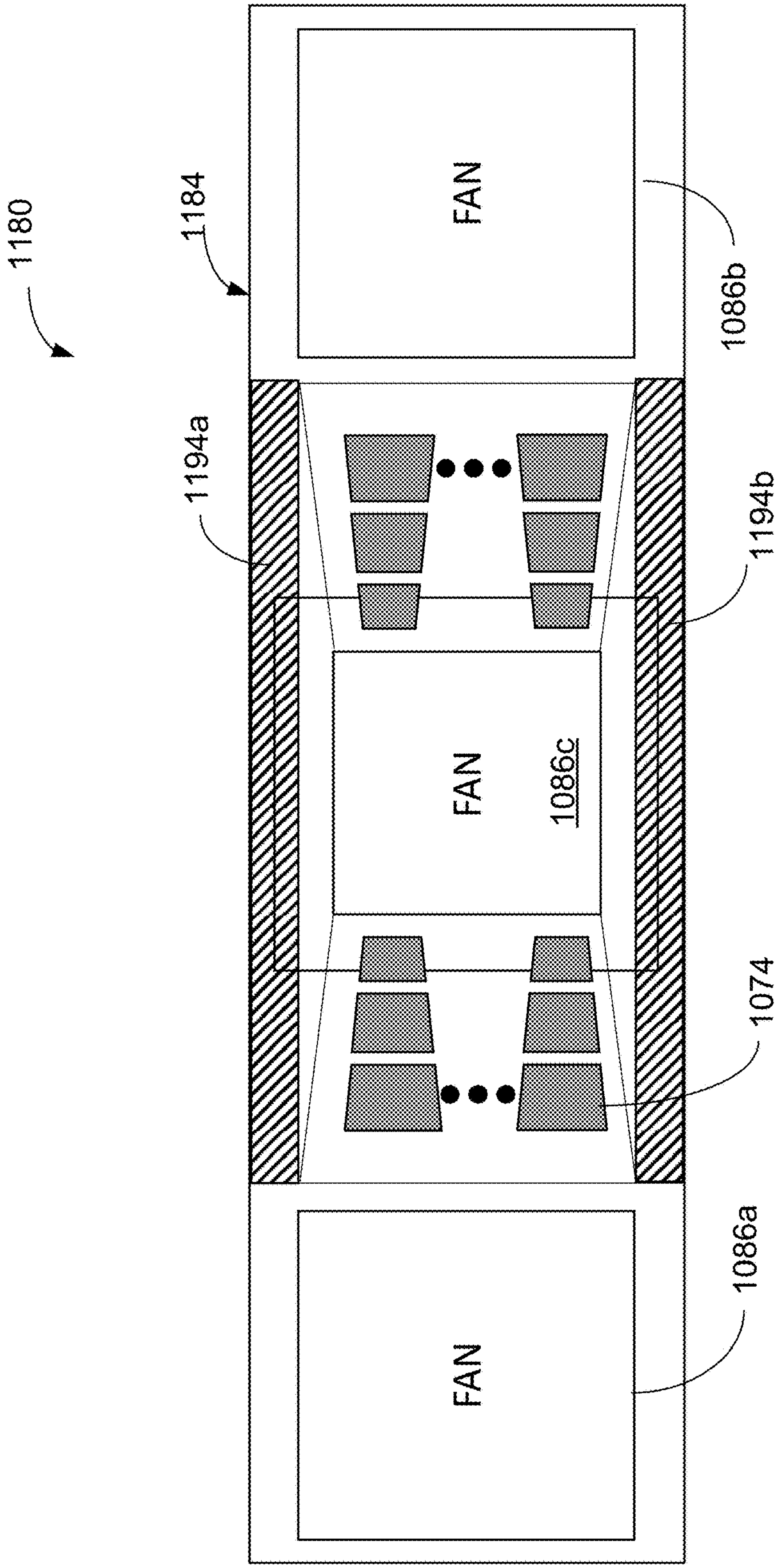
FIG. 75B is a front view of the rackmount server.

Referring to FIGS. 75A to 75B, in some implementations, a rackmount server 1180 includes a housing 1182 having a front panel 1184 that has an inset portion 1186 (referred to as the “front panel inset” or “face plate inset”). For example, the inset portion 1186 includes a first wall 1188 and a second wall 1190 that are oriented to make it easier for the user to connect or disconnect the fiber cables (e.g., 1076) to the server 1180, or to service the co-packaged optical modules 1074. For example, the first wall 1188 can be at an angle $\theta_1$ relative to a nominal plane 1192 of the front panel 1184, in which $0<\theta_1<90°$. The second wall 1190 can be at an angle $\theta_2$ relative to the nominal plane 1192 of the front panel, in which $0<\theta_2<90°$. The angles $\theta_1$ and $\theta_2$ can be the same or different. The nominal plane 1192 of the front panel 1184 is perpendicular to the side panels 1040 and the bottom panel.

For example, a first vertical printed circuit board 1152*a* is attached to the first wall 1188, and a second vertical printed circuit board 1152*b* is attached to the second wall 1190. Comparing the rackmount server 1180 with the rackmount servers 1060 of FIG. 68A, 1080 of FIG. 69A, and 1100 of FIG. 71, the server 1180 has a larger front panel area due to the angled front panel inset and can be connected to more fiber cables.

Positioning the first and second walls 1188, 1190 at an angle between 0 and 90° relative to the nominal plane of the front panel improves access and field serviceability of the co-packaged optical modules. Comparing the rackmount server 1180 with the rackmount server 1150 of FIG. 74A, the server 1180 allows the user to more easily access the co-packaged optical modules that are positioned farther away from the nominal plane of the front panel. The angles $\theta_1$ and $\theta_2$ are selected to strike a balance between increasing the number of fiber cables that can be connected to the server and providing easy access to all of the co-packaged optical modules of the server. The front panel inset width and angle are configured to enable hot-swap, in-field serviceability to avoid taking the switch and rack out of service for maintenance.

For examples, intake fans 1086*a* and 1086*b* can be mounted on the front panel 1184. Outside air is drawn in by the intake fans 1086*a*, 1086*b*, passes through the surfaces of the fins and/or pins of the heatsinks 1168*a*, 1168*b*, and flows towards the rear of the housing 1182. Examples of the flow directions for the air entering through the intake fans 1186*a* and 1186*b* are represented by arrows 1198*a*, 1198*b*, 1198*c*, and 1198*d*.

Figure 75C:
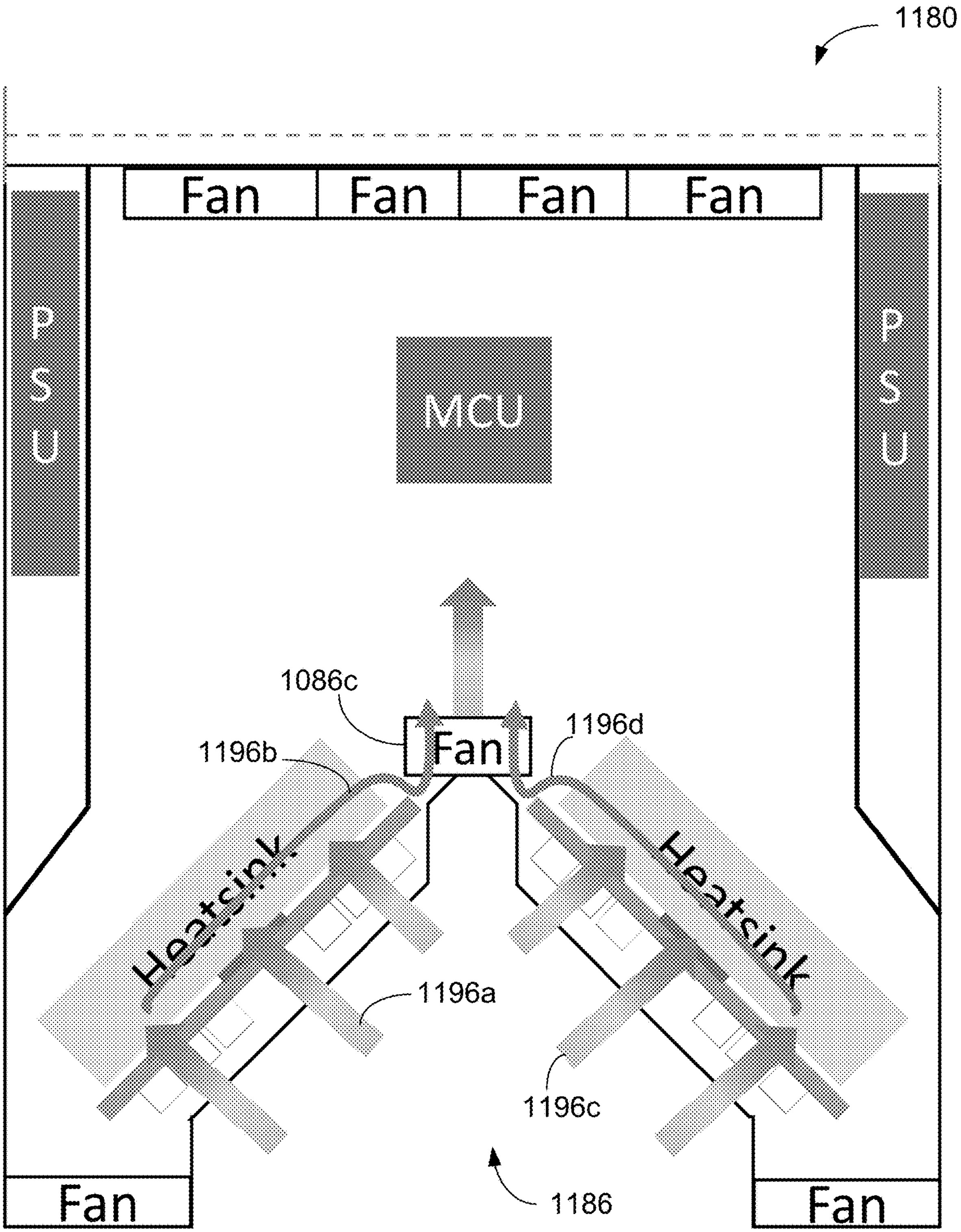
FIG. 75C is a diagram of the air flow in the rackmount server.

Referring to FIGS. 75B and 75C, in some implementations, the front panel 1184 includes an upper air vent 1194*a* and baffles to direct outside air to enter through the upper air vent 1194*a*, flows downward and rearward such that the air passes over the surfaces of some of the fins and/or pins of the heat sinks 1186 (e.g., including the fins and/or pins closer to the top of the heat sinks 1186) and then flows toward an intake fan 1086*c* mounted at or near the distal or rear end of the front panel inset portion 1186. The front panel 1184 includes a lower air vent 1194*b* and baffles to direct outside air to enter through the lower air vent 1194*b*, flows upward and rearward such that the air passes over the surfaces of some of the fins and/or pins of the heat sinks 1186 (e.g., including the fins and/or pins closer to the bottom of the heat sinks 1186) and then flows toward the intake fan 1086*c*. Examples of the air flows through the upper and lower air vents 1194*a*, 1194*b* to the intake fan 1086*c* are represented by arrows 1196*a*, 1196*b*, 1196*c*, and 1196*d* in FIG. 75C.

For example, fiber cables connected to the co-packaged optical modules 1074 can block air flow for the intake fan 1086*c* if the intake fan 1086*c* is configured to receive air through openings directly in front of the intake fan 1086*c*. By using the upper air vent 1194*a*, the lower air vent 1194*b*, and the baffles to direct air flow as described above, the heat dissipating efficiency of the system can be improved (as compared to not having the air vents 1194 and the baffles).

Figure 76:
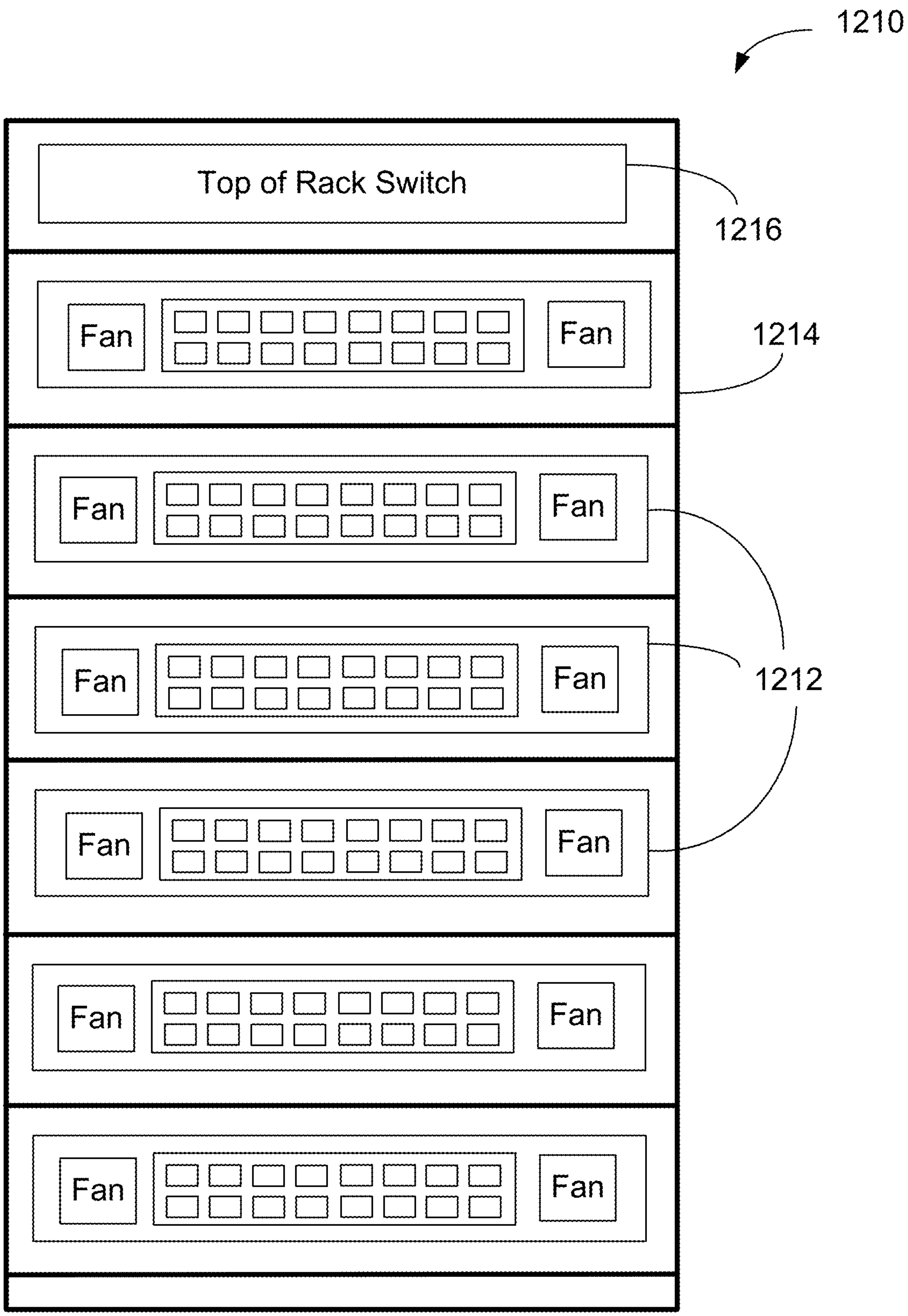
FIG. 76 is a diagram of a network rack that includes a plurality of rackmount servers.

Referring to FIG. 76, in some implementations, a network switch system 1210 includes a plurality of rackmount switch servers 1212 installed in a server rack 1214. The network switch rack includes a top of the rack switch 1216 that routes data among the switch servers 1212 within the network switch system 1210, and serves as a gateway between the network switch system 1210 and other network switch systems. The rackmount switch servers 1212 in the network switch system 1210 can be configured in a manner similar to any of the rackmount servers described above or below.

In some implementations, the examples of rackmount servers shown in in FIGS. 68A, 69A, and 70 can be modified by positioning the vertical printed circuit board behind the front panel. The co-packaged optical modules can be optically connected to fiber connector parts mounted on the front panel through short optical connection paths, e.g., fiber jumpers.

Figure 77A:
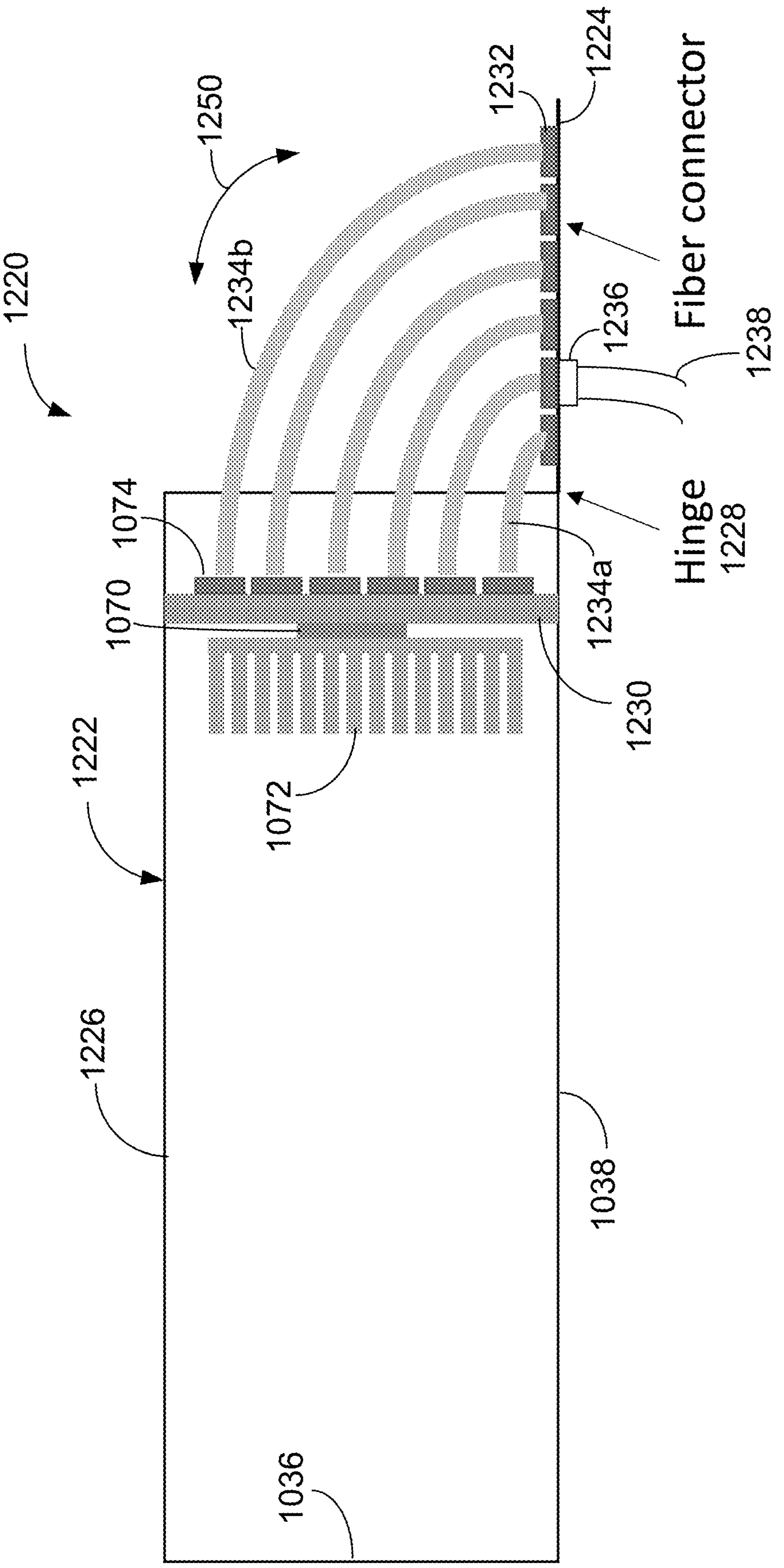
FIG. 77A is a side view of an example of a rackmount server.
Figure 77B:
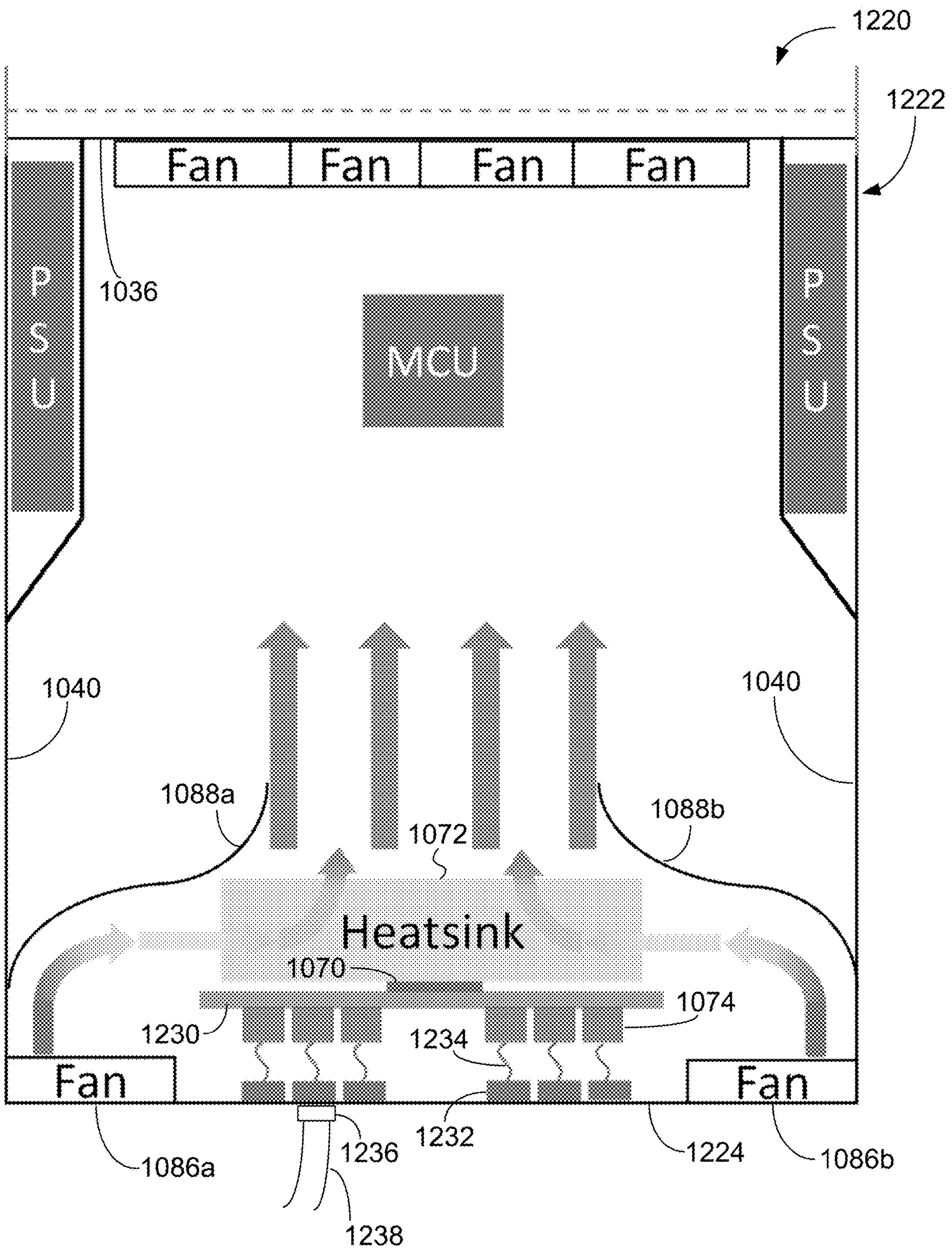
FIG. 77B is a top view of the rackmount server.

Referring to FIGS. 77A and 77B, in some implementations, a rackmount server 1220 includes a housing 1222 having a front panel 1224, a rear panel 1036, a top panel 1226, a bottom panel 1038, and side panels 1040. The front panel 1224 can be opened to allow the user to access components without removing the rackmount server 1220 from the rack. A vertically mounted printed circuit board 1230 is positioned substantially parallel to the front panel 1224 and recessed from the front panel 1224, i.e., spaced apart at a small distance (e.g., less than 12 inches, or less than 6 inches, or less than 3 inches, or less than 2 inches) to the rear of the front panel 1224. The printed circuit board 1230 includes a first side facing the front direction relative to the housing 1222 and a second side facing the rear direction relative to the housing 1222. At least one data processing chip 1070 is electrically coupled to the second side of the vertical printed circuit board 1226, and a heat dissipating device or heat sink 1072 is thermally coupled to the at least one data processing chip 1070. In some examples, the at least one data processing chip 1070 is mounted on a substrate (e.g., a ceramic substrate), and the substrate is attached to the printed circuit board 1226.

Co-packaged optical modules 1074 (also referred to as the optical/electrical communication interfaces) are attached to the first side (i.e., the side facing the front exterior of the housing 1222) of the vertical printed circuit board 1230. In some examples, the co-packaged optical modules 1074 are mounted on a substrate that is attached to the vertical printed circuit board 1230, in which electrical contacts on the substrate are electrically coupled to corresponding electrical contacts on the vertical printed circuit board 1230. In some examples, the at least one data processing chip 1070 is mounted on the rear side of the substrate, and the co-packaged optical modules 1074 are removably attached to the front side of the substrate, in which the substrate provides high speed connections between the at least one data processing chip 1070 and the co-packaged optical modules 1074. For example, the substrate can be attached to a front side of the printed circuit board 1068, in which the printed circuit board 1068 includes one or more openings that allow the at least one data processing chip 1070 to be mounted on the rear side of the substrate. The printed circuit board 1068 can provide from a motherboard electrical power to the substrate (and hence to the at least one data processing chip 1070 and the co-packaged optical modules 1074, and allow the at least one data processing chip 1070 and the co-packaged optical modules 1074 to connect to the motherboard using low-speed electrical links. An array of co-packaged optical modules 1074 can be mounted on the vertical printed circuit board 1230 (or the substrate), similar to the examples shown in FIGS. 69B and 71B. The electrical connections between the co-packaged optical modules 1074 and the vertical printed circuit board 1070 (or the substrate) can be removable, e.g., by using land-grid arrays and/or compression interposers. The co-packaged optical modules 1074 are optically connected to first fiber connector parts 1232 mounted on the front panel 1224 through short fiber jumpers 1234*a*, 1234*b* (collectively referenced as 1234). When the front panel 1224 is closed, the user can plug a second fiber connector part 1236 into the first fiber connector part 1232 on the front panel 1224, in which the second fiber connector part 1236 is connected to an optical fiber cable 1238 that includes an array of optical fibers.

In some implementations, the rackmount server 1220 is pre-populated with co-packaged optical modules 1074, and the user does not need to access the co-packaged optical modules 1074 unless the modules need maintenance. During normal operation of the rackmount server 1220, the user mostly accesses the first fiber connector parts 1232 on the front panel 1224 to connect to fiber cables 1238.

One or more intake fans, e.g., 1086*a*, 1086*b*, can be mounted on the front panel 1224, similar to the examples shown in FIGS. 69A and 70. The positions and configurations of the intake fans 1086, the heat sink 1072, and the air louvers 1088*a*, 1088*b* are selected to maximize the heat transfer efficiency of the heat sink 1072.

The rackmount server 1220 can have a number of advantages. By placing the vertical printed circuit board 1230 at a recessed position inside the housing 1222, the vertical printed circuit board 1230 is better protected by the housing 1222, e.g., preventing users from accidentally bumping into the circuit board 1230. By orienting the vertical printed circuit board 1230 substantially parallel to the front panel 1224 and mounting the co-packaged optical modules 1074 on the side of the circuit board 1230 facing the front direction, the co-packaged optical modules 1074 can be accessible to users for maintenance without the need to remove the rackmount server 1220 from the rack.

In some implementations, the front panel 1224 is coupled to the bottom panel 1038 using a hinge 1228 and configured such that the front panel 1224 can be securely closed during normal operation of the rackmount server 1220 and easily opened for maintenance. For example, if a co-packaged optical module 1074 fails, a technician can open and rotate the front panel 1224 down to a horizontal position to gain access to the co-packaged optical module 1074 to repair or replace it. For example, the movements of the front panel 1224 is represented by the bi-directional arrow 1250. In some implementations, different fiber jumpers 1234 can have different lengths, depending on the distance between the parts that are connected by the fiber jumpers 1234. For example, the distance between the co-packaged optical module 1074 and the first fiber connector part 1232 connected by the fiber jumper 1234*a* is less than the distance between the co-packaged optical module 1074 and the first fiber connector part 1232 connected by the fiber jumper 1234*b*, so the fiber jumper 1234*a* can be shorter than the fiber jumper 1234*b*. This way, by using fiber jumpers with appropriate lengths, it is possible to reduce the clutter caused by the fiber jumpers 1234 inside the housing 1222 when the front panel 1224 is closed and in its vertical position.

In some implementations, the front panel 1224 can be configured to be opened and lifted upwards using lift-up hinges. This can be useful when the rackmount server is positioned near the top of the rack. In some examples, the front panel 1224 can be coupled to the side panel 1040 by using a hinge so that the front panel 1224 can be opened and rotated sideways. In some examples, the front panel can include a left front subpanel and a right front subpanel, in which the left front subpanel is coupled to the left side panel 1040 by using a first hinge, and the right front subpanel is coupled to the right panel 1040 by using a second hinge. The left front subpanel can be opened and rotated towards the left side, and the right front subpanel can be opened and rotated towards the right side. These various configurations for the front panel enable protection of the vertical printed circuit board 1230 and convenient access to the co-packaged optical modules 1074.

In some examples, the front panel can have an inset portion, similar to the example shown in FIG. 71A, in which the vertical printed circuit board is in a recessed position relative to the inset portion of the front panel, i.e., at a small distance to the rear of the inset portion of the front panel. The front panel inset distance, the distance between the vertical printed circuit board and the front panel inset portion, and the air louver configuration can be selected to maximize the heat sink efficiency.

Figure 78:
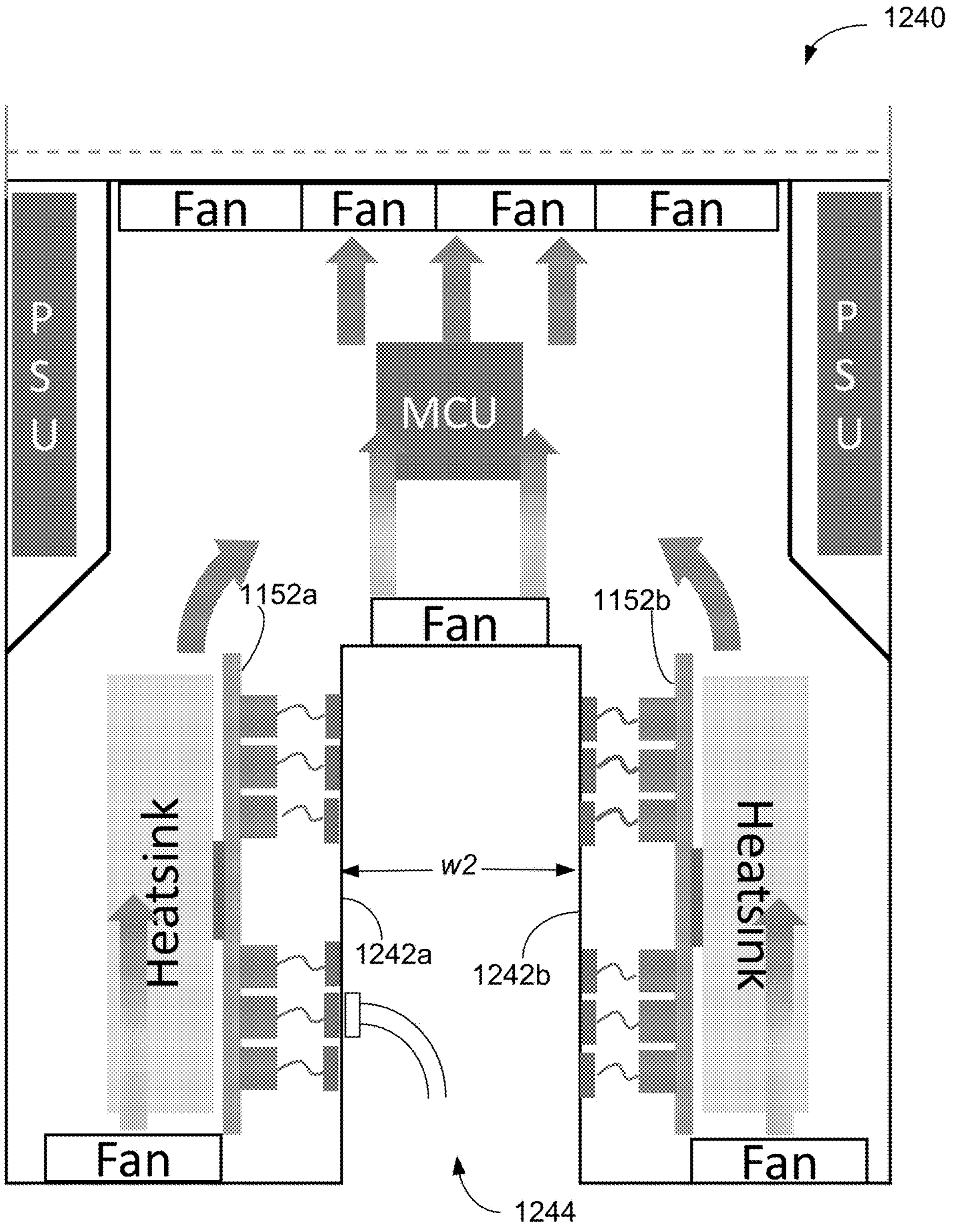
FIG. 78 is a top view of an example of a rackmount server.

Referring to FIG. 78, in some implementations, a rackmount server 1240 can be similar to the rackmount server 1150 of FIG. 74A, except that the vertical printed circuit boards are at recessed positions relative to the walls of the inset portion of the front panel. For example, a vertical printed circuit board 1152*a* is in a recessed position relative to a first wall 1242*a* of an inset portion 1244, i.e., the vertical printed circuit board 1152*a* is spaced apart a small distance to the left from the first wall 1242*a*. A vertical printed circuit board 1152*b* is in a recessed position relative to a second wall 1242*b* of the inset portion 1244, i.e., the vertical printed circuit board 1152*b* is spaced apart a small distance to the right from the second wall 1242*b*.

For example, the first wall 1242*a* can be coupled to the bottom or top panel through hinges so that the first wall 1242*a* can be closed during normal operation of the rackmount server 1240 and opened for maintenance of the server 1240. The distance w2 between the first wall 1242*a* and the second wall 1242*b* is selected to be sufficiently large to enable the first wall 1242*a* and the second wall 1242*b* to be opened properly. This design has advantages similar to those of the rackmount server 1220 in FIGS. 77A, 77B.

In some implementations, a rackmount server can be similar to the rackmount server 1180 shown in FIGS. 75A to 75C, except that the vertical printed circuit boards are at recessed positions relative to the walls of the inset portion of the front panel. For example, a first vertical printed circuit board is in a recessed position relative to the first wall 1188 of the inset portion 1186, and a second vertical printed circuit board is in a recessed position relative to the second wall 1190 of the inset portion 1186. For example, the first wall 1188 can be coupled to the bottom or top panel through hinges so that the first wall 1188 can be closed during normal operation of the rackmount server and opened for maintenance of the server. The angles $\theta_1$ and $\theta_2$ are selected to enable the first wall 1188 and the second wall 1190 to be opened properly. This design has advantages similar to those of the rackmount server 1220 in FIGS. 77A, 77B.

A feature of the thermal architecture for the rackmount units (e.g., the rackmount servers 1060 of FIG. 68A, 1090 of FIGS. 69A, 70, 1100 of FIGS. 71A, 72, 1120 of FIG. 73A, 1150 of FIG. 74A, 1180 of FIG. 75A, 1220 of FIG. 77B, and 1240 of FIG. 78) described above is the use of co-packaged optical modules or optical/electrical communication interfaces that have higher bandwidth per module or interface, as compared to conventional designs. For example, each co-packaged optical module or optical/electrical communication interface can be coupled to a fiber cable that carries a large number of densely packed optical fiber cores. FIG. 9 shows an example of the integrated optical communication device 282 in which the optical signals provided to the photonic integrated circuit can have a total bandwidth of about 12.8 Tbps. By using co-packaged optical modules or optical/electrical communication interfaces that have higher bandwidth per module or interface, the number of co-packaged optical modules or optical/electrical communication interfaces required for a given total bandwidth for the rackmount unit is reduced, so the amount of area on the front panel of the housing reserved for connecting to optical fibers can be reduced. Therefore, it is possible to add one or more inlet fans on the front panel to improve thermal management while still maintaining or even increasing the total bandwidth of the rackmount unit, as compared to conventional designs.

In some implementations, for the examples shown in FIGS. 72, 74A, 75A, and 78, and the variations in which the vertical printed circuit boards are at recessed positions relative to the front panel, the shape of each of the top and bottom panels of the housing can have an inset portion at the front that corresponds to the inset portion of the front panel. This makes it more convenient to access the co-packaged optical modules or the optical connector parts mounted on the front panel without being hindered by the top and bottom panels. In some implementations, the server rack (e.g., 1214 of FIG. 76) is designed such that front support structures of the server rack also have inset portions that correspond to the insert portions of the front panels of the rackmount servers installed in the server rack. For example, a custom server rack can be designed to install rackmount servers that all have the inset portions similar to the inset portion 1158 of FIG. 74A. For example, a custom server rack can be designed to install rackmount servers that all have the inset portions similar to the inset portion 1186 of FIG. 75A. In such examples, the inset portions extend vertically from the bottom-most server to the top-most server without any obstruction, making it easier for the user to access the co-packaged optical modules or optical connector parts.

In some implementations, for the examples shown in FIGS. 72, 74A, 75A, and 78, and the variations in which the vertical printed circuit boards are at recessed positions relative to the front panel, the shape of the top and bottom panels of the housing can be similar to standard rackmount units, e.g., the top and bottom panels can have a generally rectangular shape.

In the examples shown in FIGS. 68A, 68B, 69A to 75C, and 77A to 78, a grid structure similar to the grid structure 870 shown in FIG. 43 can be attached to the vertical printed circuit board. The grid structure can function as both (i) a heat spreader/heat sink and (ii) a mechanical holding fixture for the co-packaged optical modules (e.g., 1074) or optical/electrical communication interfaces.

Figure 96:
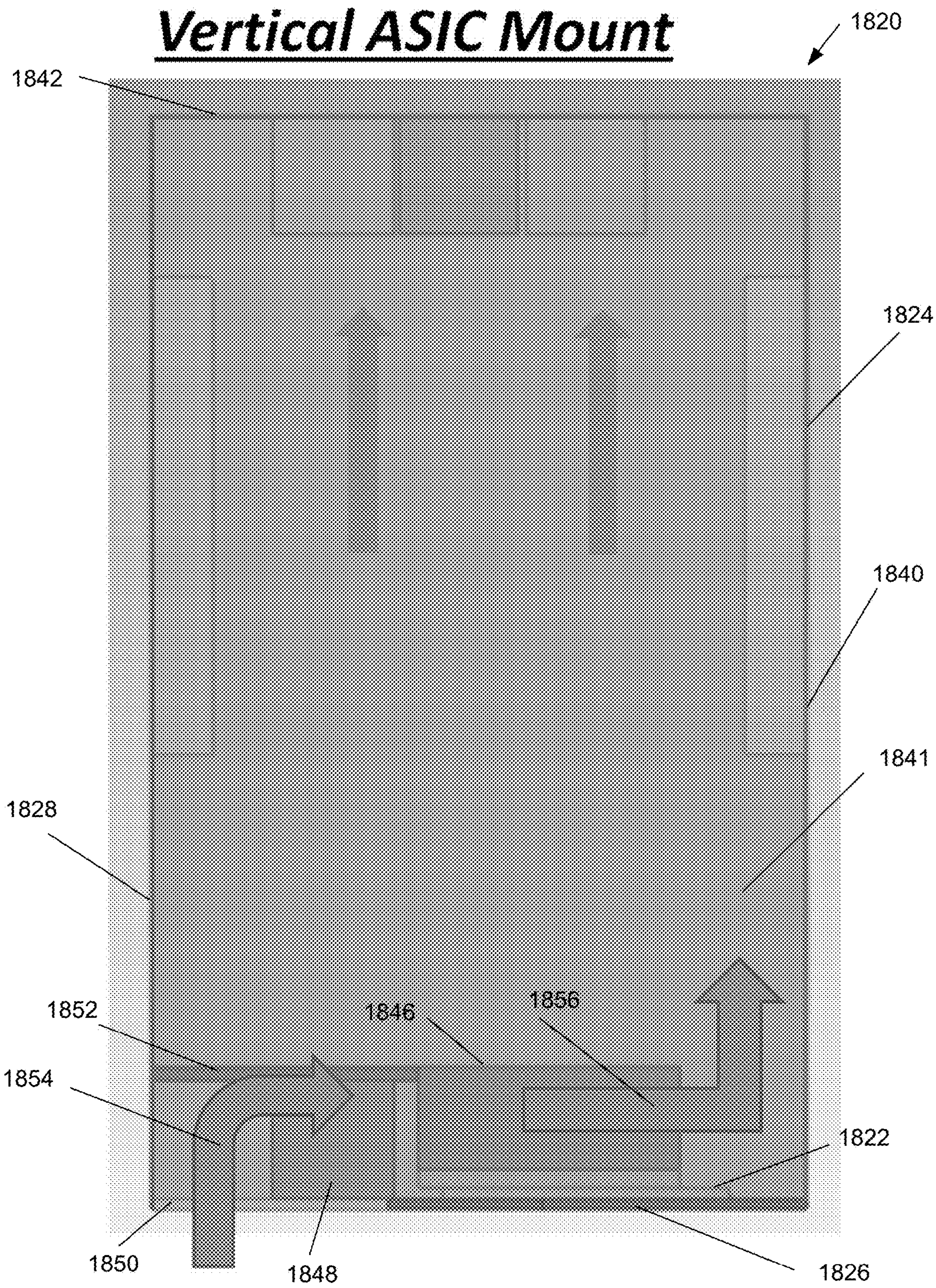
FIG. 96 is a top view of an example of a rackmount server.
Figure 97B:
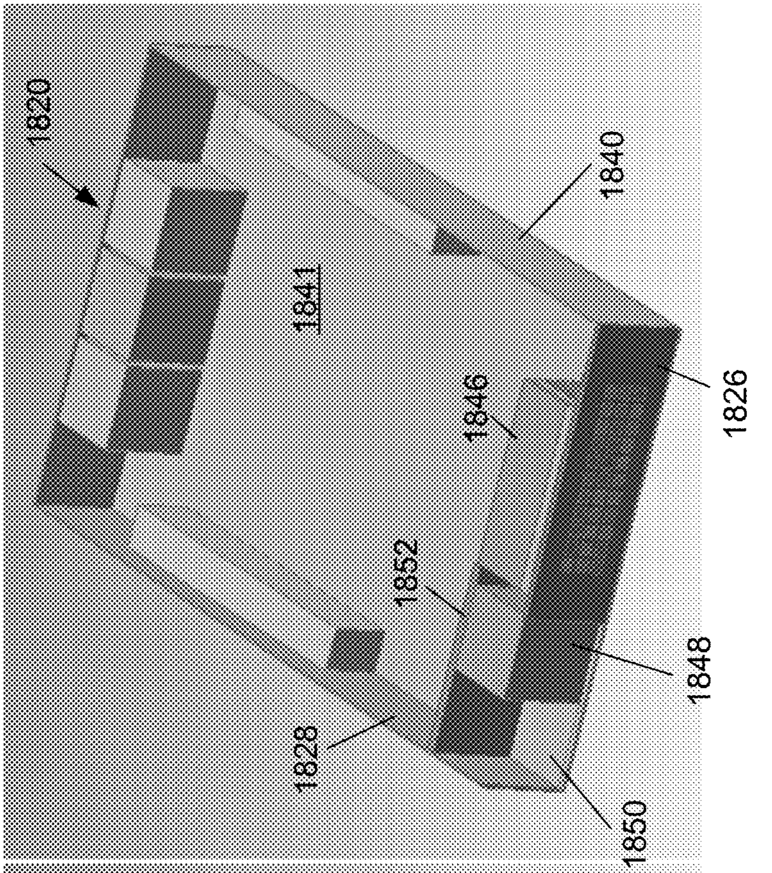
FIG. 97B is a perspective view of the rackmount server of FIG. 96 with the top panel removed.
Figure 97A:
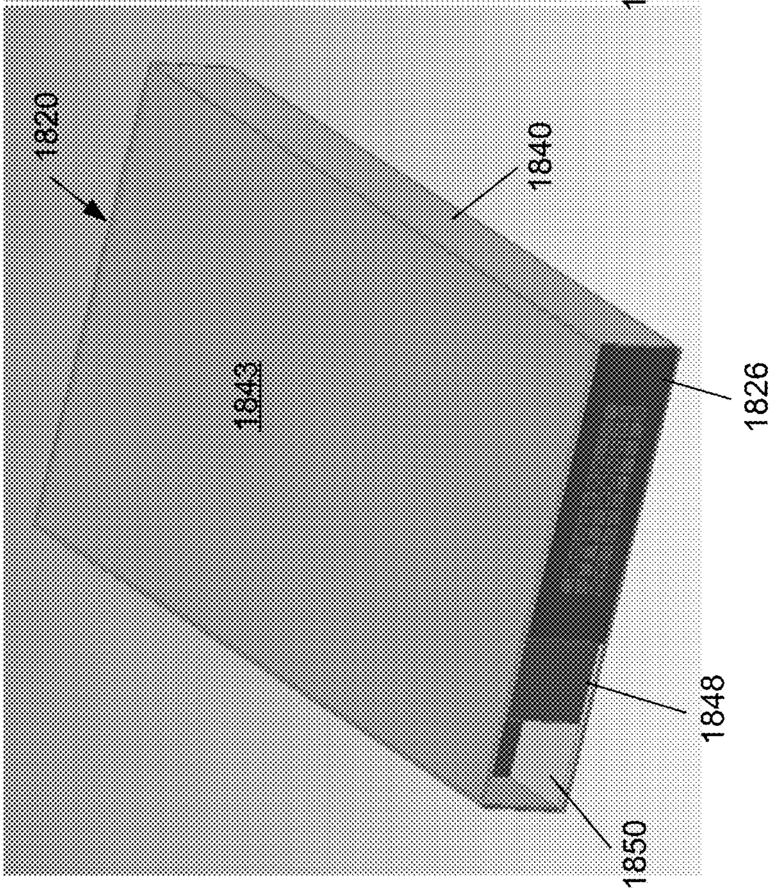
FIG. 97A is a perspective view of the rackmount server of FIG. 96.

FIGS. 96 to 97B are diagrams of an example of a rackmount server 1820 that includes a vertically oriented circuit board 1822 positioned at a front portion of the rackmount server 1820. FIG. 96 shows a top view of the rackmount server 1820, FIG. 97A shows a perspective view of the rackmount server 1820, and FIG. 97B shows a perspective view of the rackmount server 1820 with the top panel removed. The rackmount server 1820 has an active airflow management system that is configured to remove heat from a data processor during operation of the rackmount server 1820.

Referring to FIGS. 96, 97A, and 97B, in some implementations, the rackmount server 1820 includes a housing 1824 that has a front panel 1826, a left side panel 1828, a right side panel 1840, a bottom panel 1841, a top panel 1843, and a rear panel 1842. The front panel 1826 can be similar to the front panels in the examples shown in FIGS. 68A, 68B, 69A to 72, 77A, and 77B. For example, the vertically oriented circuit board 1822 can be part of the front panel 1826, or attached to the front panel 1826, or positioned in a vicinity of the front panel 1826, in which a distance between the circuit board 1822 and the front panel 1826 is not more than, e.g., 6 inches. A data processor 1844 (which can be, e.g., a network switch, a central processor unit, a graphics processor unit, a tensor processing unit, a neural network processor, an artificial intelligence accelerator, a digital signal processor, a microcontroller, or an application specific integrated circuit) (see FIG. 99) is mounted on the circuit board 1822.

A heat dissipating module 1846, e.g., a heat sink, is thermally coupled to the data processor 1844 and configured to dissipate heat generated by the data processor 1828 during operation. The heat dissipating module 1846 can be similar to the heat dissipating device 1072 of FIGS. 68A, 68C, 69A, 70, and 71A. In some examples, the heat dissipating module 1846 includes heat sink fins or pins having heat dissipating surfaces configured to optimize heat dissipation. In some examples, the heating dissipating module 1846 includes a vapor chamber thermally coupled to heat sink fins or pins. The rackmount server 1820 can include other components, such as power supply units, rear outlet fans, one or more additional horizontally oriented circuit boards, one or more additional data processors mounted on the horizontally oriented circuit boards, and one or more additional air louvers, that have been previously described in other embodiments of rackmount servers and are not repeated here.

In some implementations, the active airflow management system includes an inlet fan 1848 that is positioned at a left side of the heat dissipating module 1846 and oriented to blow incoming air to the right toward the heat dissipating module 1846. A front opening 1850 provides incoming air for the inlet fan 1848. The front opening 1850 can be positioned to the left of the inlet fan 1848. In the example of FIG. 96, the circuit board 1822 is substantially parallel to the front panel 1826, and the rotational axis of the inlet fan 1848 is substantially parallel to the plane of the circuit board 1822. The inlet fan 1848 can also be oriented slightly differently. For example, the rotational axis of the inlet fan 1848 can be at an angle θ relative to the plane of the front panel 1826, the angle θ being measured along a plane parallel to the bottom panel 1841, in which $\theta \leq 45°$, or in some examples $\theta \leq 25°$, or in some examples $\theta \leq 5°$, or in some examples $\theta = 0°$.

In some implementations, a baffle or an air louver 1852 (or internal panel or internal wall) is provided to guide the air entering the opening 1850 towards the inlet fan 1848. An arrow 1854 shows the general direction of airflow from the opening 1850 to the inlet fan 1848. In some examples, the air louver 1852 extends from the left side panel 1828 of the housing 1840 to a rear edge of the inlet fan 1848. The air louver 1852 can be straight or curved. In some examples, the air louver 1852 can be configured to guide the inlet air blown from the inlet fan 1848 towards the heat dissipating module 1846. For example, the air louver 1852 can extend from the left side panel 1828 to the left edge of the heat dissipating module 1846. For example, the air louver 1852 can extend from the left side panel 1828 to a position at or near the rear of the heat dissipating module 1846, in which the position can be anywhere from the left rear portion of the heat dissipating module 1846 to the right rear portion of the heat dissipating module 1846. The air louver 1852 can extend from the bottom panel 1841 to the top panel 1843 in the vertical direction. An arrow 1856 shows the general direction of air flow through and out of the heating dissipating module 1846.

For example, the air louver 1852, a front portion of the left side panel 1828, the front panel 1826, the circuit board 1822, a front portion of the bottom panel 1841, and a front portion of the top panel 1843 can form an air duct that guides the incoming cool air to flow across the heat dissipating surface of the heat dissipating module 1846. Depending on the design, the air duct can extend to the left edge of the heat dissipating module 1846, to a middle portion of the heat dissipating module 1846, or extend approximately the entire length (from left to right) of the heat dissipating module 1846.

The inlet fan 1848 and the air louver 1852 are designed to improve airflow across the heat dissipating surface of the heat dissipating module 1846 to optimize or maximize heat dissipation from the data processor 1844 through the heat dissipating module 1846 to the ambient air. Different rackmount servers can have vertically mounted circuit boards with different lengths, can have data processors with different heat dissipation requirements, and can have heat dissipating modules with different designs. For example, the heat sink fins and/or pins can have different configurations. The inlet fan 1848 and the air louver 1852 can also have any of various configurations in order to optimize or maximize the heat dissipation from the data processor 1844. In the example of FIG. 96, the inlet fan 1848 directs air to flow generally in a direction (in this example, from left to right) that is parallel to the front panel across the heat dissipating surface of the heat dissipating module 1846. In some implementations, the front opening can be positioned to the right side of the front panel, and the inlet fan can be positioned to the right side of the heat dissipating module and direct air to flow from right to left across the heat dissipating surface of the heat dissipating module. The air louver can be modified accordingly to optimize airflow and heat dissipation from the data processor.

Figure 98:
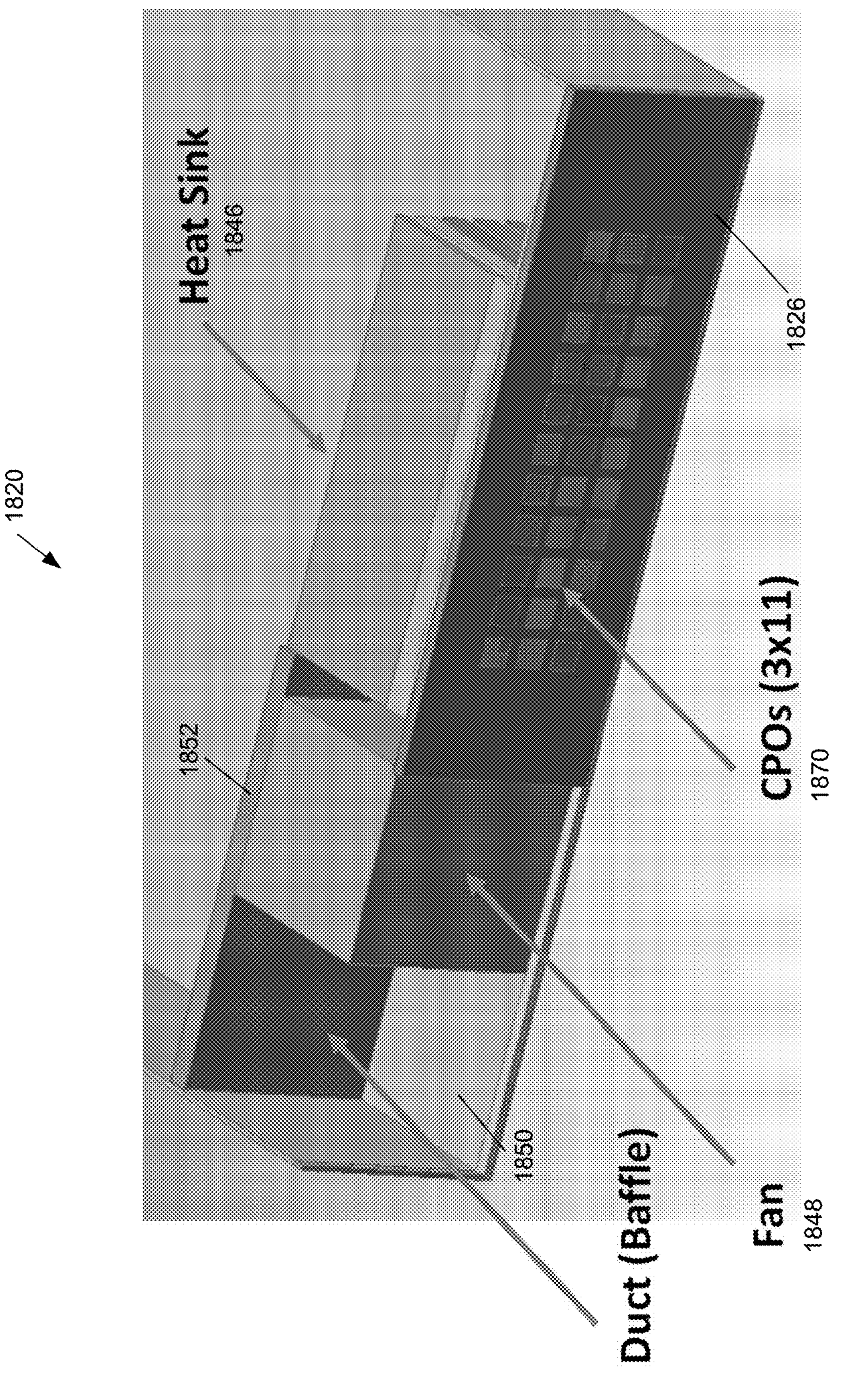
FIG. 98 is a diagram of the front portion of the rackmount server of FIG. 96.

FIG. 98 is a diagram showing the front portion of the rackmount server 1820. The baffle or air louver 1852, a portion of the bottom panel 1841, a portion of the top panel 1843, and a portion of the left side panel 1828 form a duct that directs external air toward the inlet fan 1848. A safety mechanism (not shown in the figure), such as a protective mesh, that allows air to pass through substantially freely while blocking larger objects from contacting the fan blades can be placed across the opening 1850. In some implementations, an air filter can be provided in front of the inlet fan to reduce dust buildup inside the rackmount server.

In some examples, orienting the inlet fan to face towards the side direction instead of the front direction (as in the examples shown in FIGS. 69A and 71A) can improve the safety and comfort of users operating the rackmount server 1820. In some examples, orienting the inlet fan towards the side direction instead of the front direction can avoid the presence of a region in the heat dissipating module having little to no air flow. In the example of FIG. 71A, the left and right inlet fans blow air toward the left and right side regions, respectively, of the heat dissipating device 1072. The incoming air is drawn toward the rear of the heat dissipating module due to the air pressure gradient generated by the front and rear inlet fans. In some cases, the incoming air entering the left side of the heat dissipating device 1072 is drawn toward the rear of the heat dissipating device 1072 before reaching the middle part of the heat dissipating device 1072. Similarly, the incoming air entering the right side of the heat dissipating device 1072 is drawn toward the rear of the heat dissipating device 1072 before reaching the middle part of the heat dissipating device 1072. As a result, near the middle or middle-front region of the heat dissipating device 1072 there may be a region having little to no air flow, reducing the efficiency of heat dissipation. The design shown in FIGS. 96 to 98 avoids or reduces this problem.

The front panel 1826 includes openings or interface ports 1860 that allow the rackmount server 1820 to be coupled to optical fiber cables and/or electrical cables. In some implementations, co-packaged optical modules 1870 can be inserted into the interface ports 1860, in which the co-packaged optical modules 1870 function as optical/electrical communication interfaces for the data processor 1844. The co-packaged optical modules have been described earlier in this document.

Figure 99:
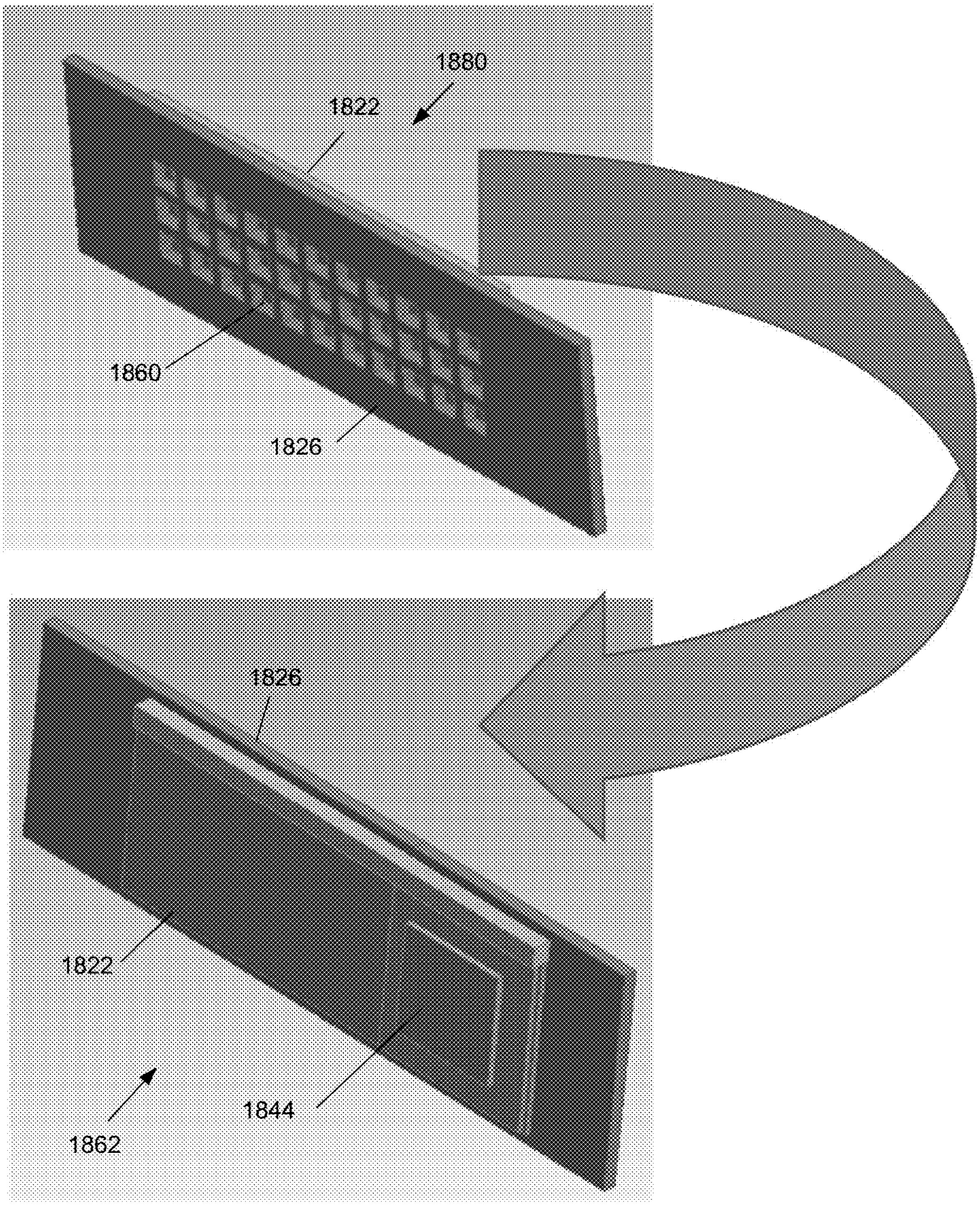
FIG. 99 includes perspective front and rear views of the front panel of the rackmount server of FIG. 96.

FIG. 99 includes an upper diagram 1880 that shows a perspective front view of an example of the front panel 1826, and a lower diagram 1882 that shows a perspective rear view of the front panel 1826. The lower diagram 1882 shows the data processor 1844 mounted to the back side of the vertically oriented circuit board 1822. The front panel 1826 includes openings or interface ports 1860 that allow insertion of communication interface modules, such as co-packaged optical modules, that provide interfaces between the data processor 1844 and external optical or electrical cables. The optical and electrical signal paths between the data processor 1844 and the co-packaged optical modules have been previously described in this document.

Figure 100:
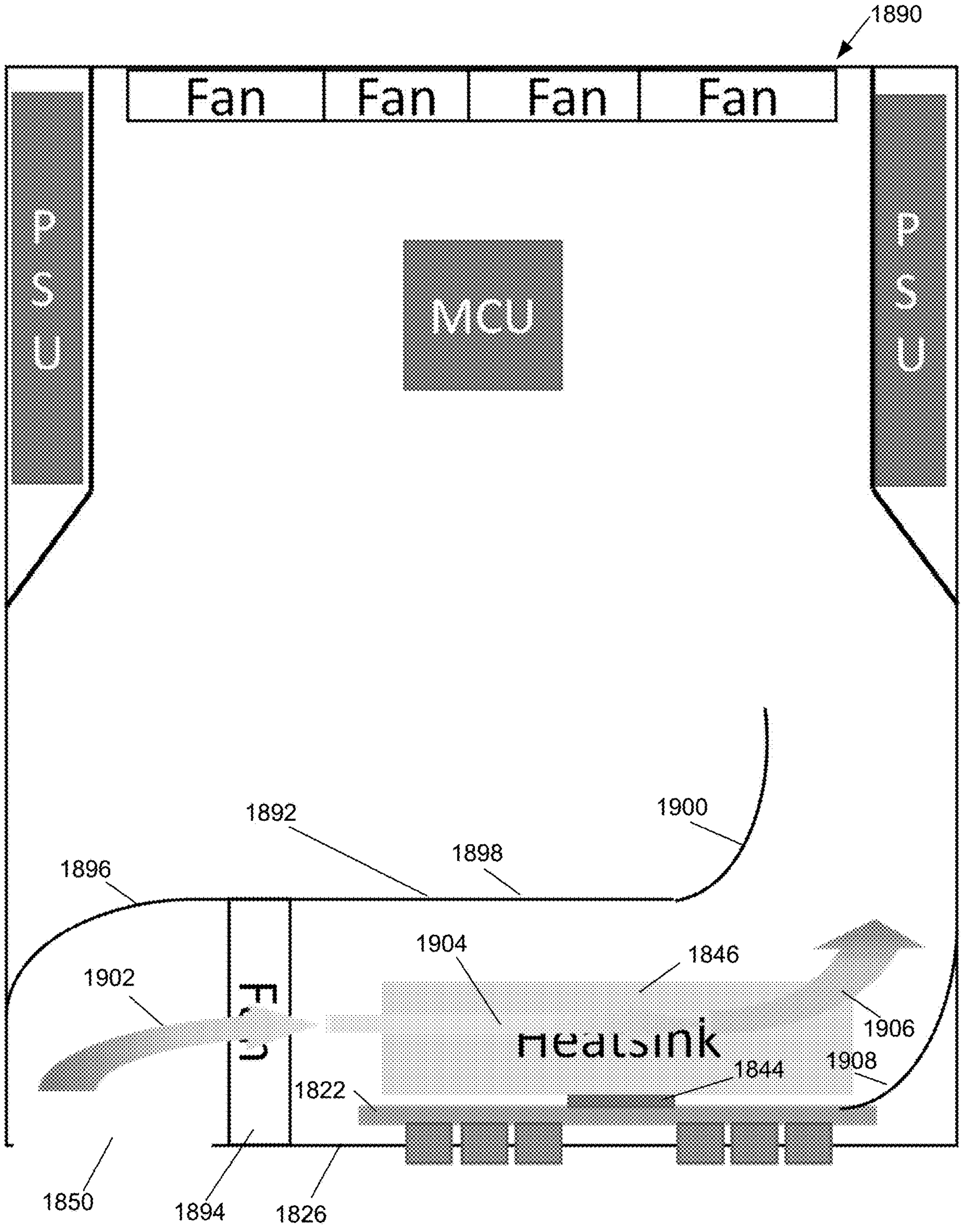
FIG. 100 is a top view of an example of a rackmount server.

FIG. 100 is a diagram of a top view of an example of a rackmount server 1890 that includes a vertically oriented circuit board 1822 positioned at a front portion of the rackmount server 1890. A data processor 1844 is mounted on the circuit board 1822, and a heat dissipating module 1846 is thermally coupled to the data processor 1844. The rackmount server 1890 has an active airflow management system that is configured to remove heat from the data processor 1844 during operation. The rackmount server 1890 includes components that are similar to those of the rackmount server 1820 (FIG. 96) and are not otherwise described here.

In some implementations, the active airflow management system includes an inlet fan 1894 that is positioned at a left side of the heat dissipating module 1846 and oriented to blow inlet air to the right toward the heat dissipating module 1846. A front opening 1850 allows incoming air to pass to the inlet fan 1894. The front opening 1850 can be positioned to the left of the inlet fan 1894. For example, the inlet fan 1894 can have a rotational axis that is at an angle $\theta$ relative to the front panel 1826, in which $\theta \leq 45°$. In some examples, $\theta \leq 25°$. In some examples, $\theta \leq 5°$. In some examples, the circuit board 1822 is substantially parallel to the front panel 1826, and the rotational axis of the inlet fan 1894 is substantially parallel to the circuit board 1822. An inlet fan 1894, In some implementations, a first baffle or air louver 1892 is provided to guide air from the opening 1850 towards the inlet fan 1894, and from the inlet fan 1894 towards the heat dissipating module 1846. A second baffle or air louver 1908 is provided to guide air from the right portion of the heat dissipating module 1846 toward the rear of the rackmount server 1890. The first and second air louvers 1892, 1894 can extend from the bottom panel to the top panel in the vertical direction.

An arrow 1902 shows a general direction of airflow from the opening 1850 to the inlet fan 1894. An arrow 1904 shows a general direction of airflow from the inlet fan 1894 to, and through, a center portion the heat dissipating module 1846. An arrow 1906 shows a general direction of airflow through, and exiting, the right portion of the heat dissipating module 1846. The first air louver 1892, a front portion of the left panel, a front portion of the top panel, a front portion of the bottom panel, the front panel 1826, the circuit board 1822, and the second air louver 1908 in combination form a duct that channels the air to flow through the entire heat dissipating module 1846, or a substantial portion of the heat dissipating module 1846, thereby increasing the efficiency of heat dissipation from the data processor 1844.

In this example, the first air louver 1892 includes a left curved section 1896, a middle straight section 1898, and a right curved section 1900. The left curved section 1896 extends from the left side panel to the inlet fan 1894. The left curved section 1896 directs incoming air to turn from flowing in the front to rear direction to flowing in the left-to-right direction. The middle straight section 1898 is positioned to the rear of the heat dissipating module 1846 and extends from the inlet fan 1894 to beyond the center portion of the heat dissipating module 1846. The middle straight section 1898 directs the air to flow generally in a left-to-right direction through a substantial portion (e.g., more than half) of the heat dissipating module 1846. The right curved section 1900 and the second air louver 1908 in combination guide the air to turn from flowing in the left-to-right direction to flowing in a front to rear direction. The designs of the first and second air louvers 1892, 1908 are selected to optimize the heat dissipation efficiency. The heat dissipating module 1846 can have a design that is different from what is shown in the figure, and the first and second air louvers 1892, 1908 can also be modified accordingly.

In the example of FIG. 100, the inlet fan 1894 directs air to flow generally in a direction (in this example, from left to right) that is parallel to the front panel 1826 across the heat dissipating surface of the heat dissipating module 1846. In some implementations, the front opening can be positioned to the right side of the front panel, and the inlet fan can be positioned to the right side of the heat dissipating module and direct air to flow from right to left across the heat dissipating surface of the heat dissipating module. The first and second air louvers can be modified accordingly to optimize airflow and heat dissipation from the data processor.

Rackmount devices are typically installed in a rack such that the bottom panel is parallel to the horizontal direction, and the front panel has a width and a height in which the width is much larger than the height. For example, the housing of a rackmount device that has a 2 rack unit form factor can have a width of about 482.6 mm (19 inches) and a height of about 88.9 mm (3.5 inches). In some implementations, the rackmount device can be oriented differently, e.g., the housing can be rotated 90° about an axis that is parallel to the front-to-rear direction such that the nominal top and bottom panels become parallel to the vertical direction, and the nominal side panels become parallel to the horizontal direction. In some implementations, the housing can be turned an arbitrary angle $\theta$ about an axis that is parallel to the front-to-rear direction such that the nominal bottom panel is at the angle $\theta$ relative to the horizontal direction. For rackmount devices that are oriented such that the nominal bottom panel is not parallel to the horizontal direction, the inlet fan(s), the air louvers, and the heat sinks are designed to take into account that hot air rises in the upward direction. The inlet fan(s) is/are positioned at a lower position or lower positions than the heat sink and blow(s) incoming cool air upwards towards the heat sink.

FIGS. 35A to 37 show examples of optical communications systems 1250, 1260, 1270 in which in each system an optical power supply or photon supply provides optical power supply light to photonic integrated circuits hosted in multiple communication devices (e.g., optical transponders), and the optical power supply is external to the communication devices. The optical power supply can have its own housing, electrical power supply, and control circuitry, independent of the housings, electrical power supplies, and control circuitry of the communication devices. This allows the optical power supply to be serviced, repaired, or replaced independent of the communication devices. Redundant optical power supplies can be provided so that a defective external optical power supply can be repaired or replaced without taking the communication devices off-line. The external optical power supply can be placed at a convenient centralized location with a dedicated temperature environment (as opposed to being crammed inside the communication devices, which may have a high temperature). The external optical power supply can be built more efficiently than individual power supply units, as certain common parts such as monitoring circuitry and thermal control units can be amortized over many more communication devices. The following describes implementations of the fiber cabling for remote optical power supplies.

Figure 79:
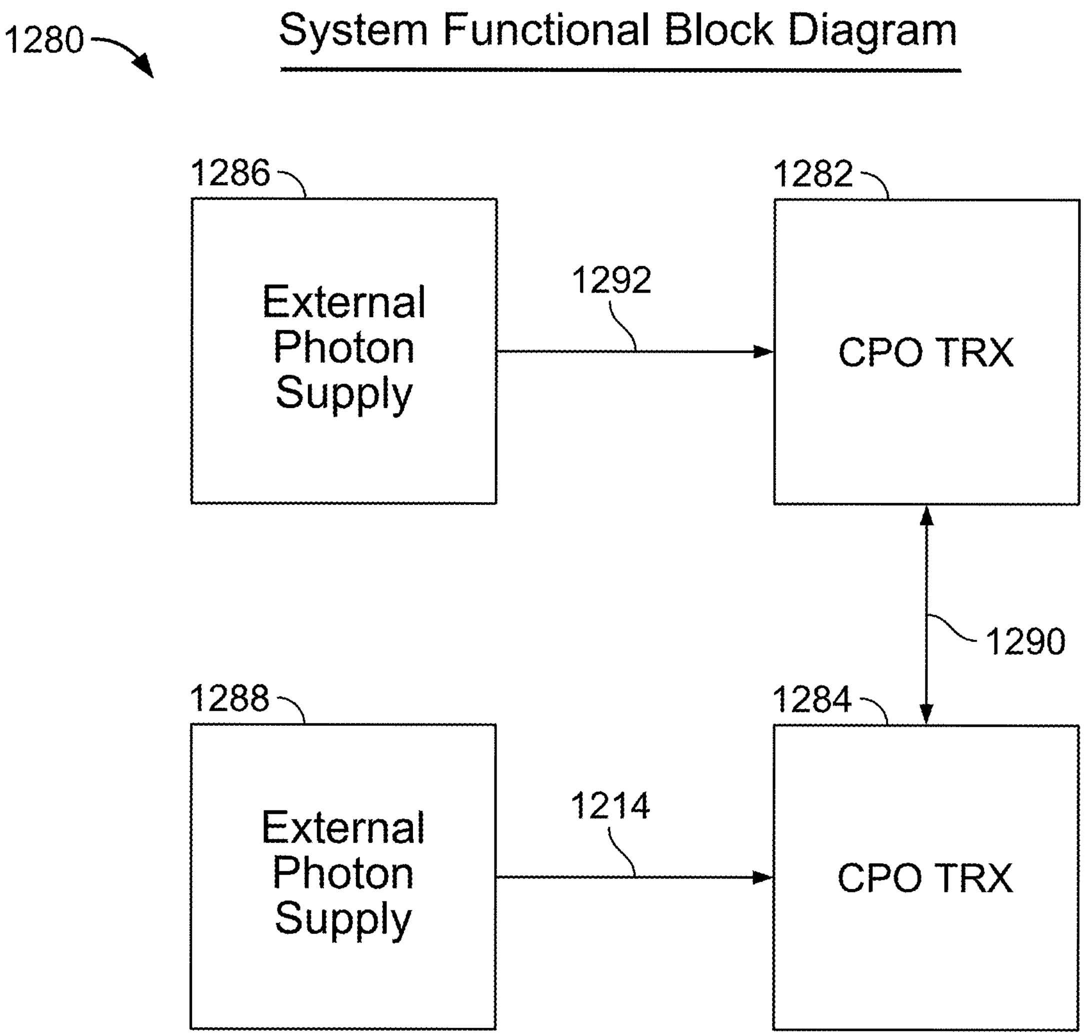
FIG. 79 is a block diagram of an example of an optical communication system.

FIG. 79 is a system functional block diagram of an example of an optical communication system 1280 that includes a first communication transponder 1282 and a second communication transponder 1284. Each of the first and second communication transponders 1282, 1284 can include one or more co-packaged optical modules described above. Each communication transponder can include, e.g., one or more data processors, such as network switches, central processing units, graphics processor units, tensor processing units, digital signal processors, and/or other application specific integrated circuits (ASICs). In this example, the first communication transponder 1282 sends optical signals to, and receives optical signals from, the second communication transponder 1284 through a first optical communication link 1290. The one or more data processors in each communication transponder 1282, 1284 process the data received from the first optical communication link 1290 and outputs processed data to the first optical communication link 1290. The optical communication system 1280 can be expanded to include additional communication transponders. The optical communication system 1280 can also be expanded to include additional communication between two or more external photon supplies, which can coordinate aspects of the supplied light, such as the respectively emitted wavelengths or the relative timing of the respectively emitted optical pulses.

A first external photon supply 1286 provides optical power supply light to the first communication transponder 1282 through a first optical power supply link 1292, and a second external photon supply 1288 provides optical power supply light to the second communication transponder 1284 through a second optical power supply link 1294. In one example embodiment, the first external photon supply 1286 and the second external photon supply 1288 provide continuous wave laser light at the same optical wavelength. In another example embodiment, the first external photon supply 1286 and the second external photon supply 1288 provide continuous wave laser light at different optical wavelengths. In yet another example embodiment, the first external photon supply 1286 provides a first sequence of optical frame templates to the first communication transponder 1282, and the second external photon supply 1288 provides a second sequence of optical frame templates to the second communication transponder 1284. For example, as described in U.S. Pat. No. 11,153,670, each of the optical frame templates can include a respective frame header and a respective frame body, and the frame body includes a respective optical pulse train. The first communication transponder 1282 receives the first sequence of optical frame templates from the first external photon supply 1286, loads data into the respective frame bodies to convert the first sequence of optical frame templates into a first sequence of loaded optical frames that are transmitted through the first optical communication link 1290 to the second communication transponder 1284. Similarly, the second communication transponder 1284 receives the second sequence of optical frame templates from the second external photon supply 1288, loads data into the respective frame bodies to convert the second sequence of optical frame templates into a second sequence of loaded optical frames that are transmitted through the first optical communication link 1290 to the first communication transponder 1282.

Figure 80B:
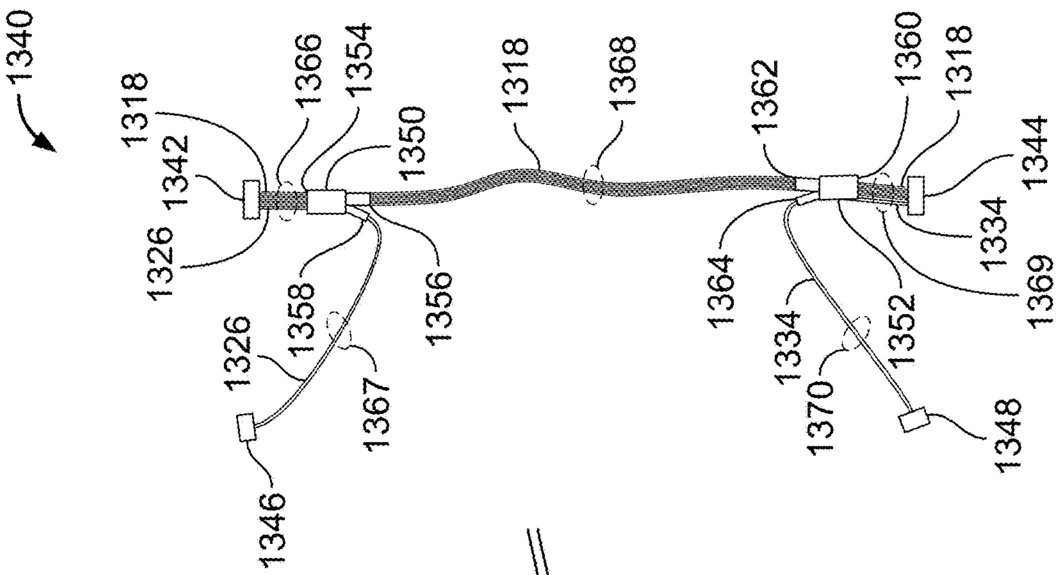
FIG. 80B is a diagram of an example of an optical cable assembly used in the optical communication system of FIG. 80A.
Figure 80A:
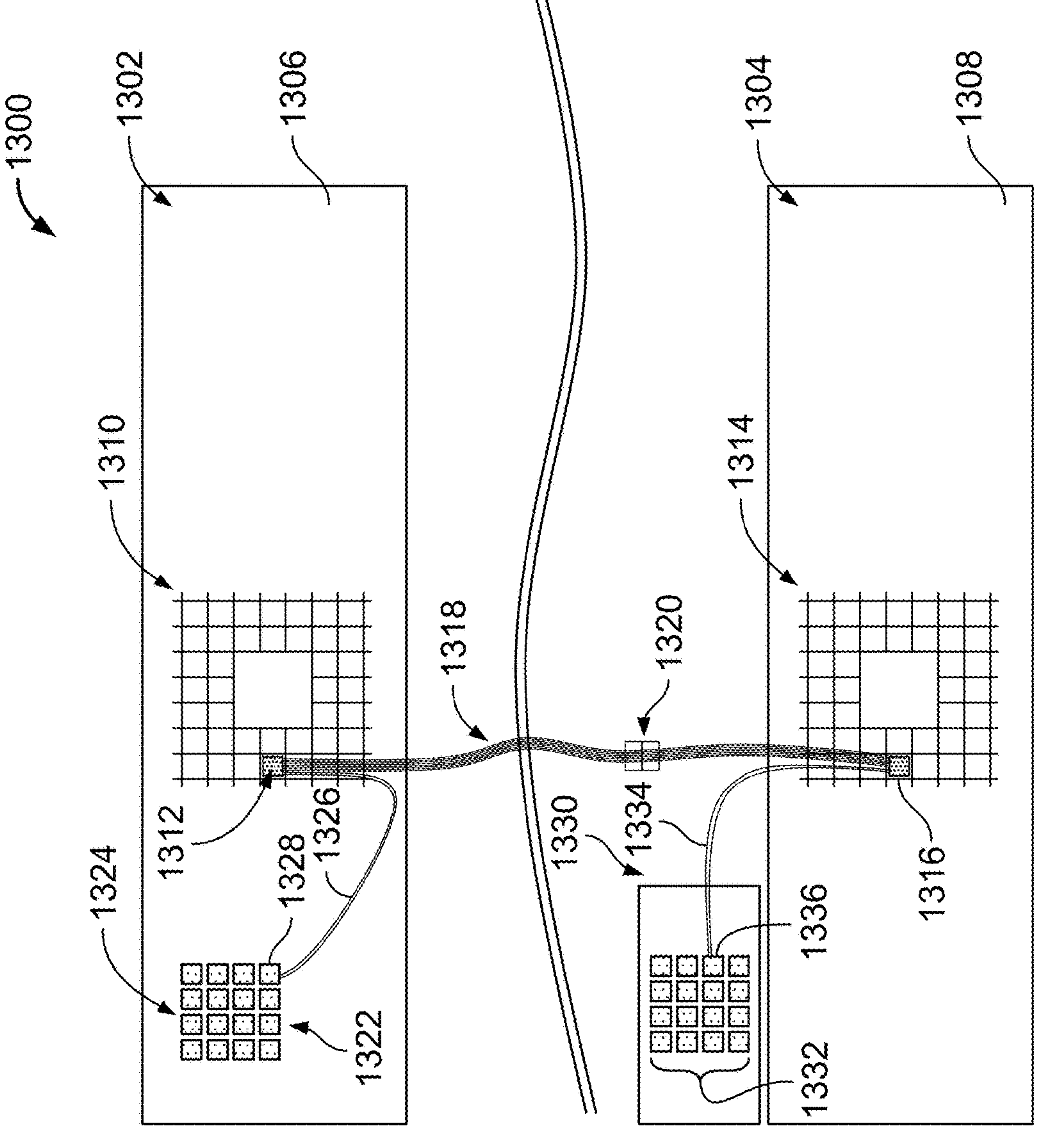
FIG. 80A is a diagram of an example of an optical communication system.

FIG. 80A is a diagram of an example of an optical communication system 1300 that includes a first switch box 1302 and a second switch box 1304. Each of the switch boxes 1302, 1304 can include one or more data processors, such as network switches. The first and second switch boxes 1302, 1304 can be separated by a distance greater than, e.g., 1 foot, 3 feet, 10 feet, 100 feet, or 1000 feet. The figure shows a diagram of a front panel 1306 of the first switch box 1302 and a front panel 1308 of the second switch box 1304. In this example, the first switch box 1302 includes a vertical ASIC mount grid structure 1310, similar to the grid structure 870 of FIG. 43. A co-packaged optical module 1312 is attached to a receptor of the grid structure 1310. The second switch box 1304 includes a vertical ASIC mount grid structure 1314, similar to the grid structure 870 of FIG. 43. A co-packaged optical module 1316 is attached to a receptor of the grid structure 1314. The first co-packaged optical module 1312 communicates with the second co-packaged optical module 1316 through an optical fiber bundle 1318 that includes multiple optical fibers. Optional fiber connectors 1320 can be used along the optical fiber bundle 1318, in which shorter sections of optical fiber bundles are connected by the fiber connectors 1320.

In some implementations, each co-packaged optical module (e.g., 1312, 1316) includes a photonic integrated circuit configured to convert input optical signals to input electrical signals that are provided to a data processor, and convert output electrical signals from the data processor to output optical signals. The co-packaged optical module can include an electronic integrated circuit configured to process the input electrical signals from the photonic integrated circuit before the input electrical signals are transmitted to the data processor, and to process the output electrical signals from the data processor before the output electrical signals are transmitted to the photonic integrated circuit. In some implementations, the electronic integrated circuit can include a plurality of serializers/deserializers configured to process the input electrical signals from the photonic integrated circuit, and to process the output electrical signals transmitted to the photonic integrated circuit. The electronic integrated circuit can include a first serializers/deserializers module having multiple serializer units and deserializer units, in which the first serializers/deserializers module is configured to generate a plurality of sets of first parallel electrical signals based on a plurality of first serial electrical signals provided by the photonic integrated circuit, and condition the electrical signals, in which each set of first parallel electrical signals is generated based on a corresponding first serial electrical signal. The electronic integrated circuit can include a second serializers/deserializers module having multiple serializer units and deserializer units, in which the second serializers/deserializers module is configured to generate a plurality of second serial electrical signals based on the plurality of sets of first parallel electrical signals, and each second serial electrical signal is generated based on a corresponding set of first parallel electrical signals. The plurality of second serial electrical signals can be transmitted toward the data processor.

The first switch box 1302 includes an external optical power supply 1322 (i.e., external to the co-packaged optical module) that provides optical power supply light through an optical connector array 1324. In this example, the optical power supply 1322 is located internal of the housing of the switch box 1302. Optical fibers 1326 are optically coupled to an optical connector 1328 (of the optical connector array 1324) and the co-packaged optical module 1312. The optical power supply 1322 sends optical power supply light through the optical connector 1328 and the optical fibers 1326 to the co-packaged optical module 1312. For example, the co-packaged optical module 1312 includes a photonic integrated circuit that modulates the power supply light based on data provided by a data processor to generate a modulated optical signal, and transmits the modulated optical signal to the co-packaged optical module 1316 through one of the optical fibers in the fiber bundle 1318.

In some examples, the optical power supply 1322 is configured to provide optical power supply light to the co-packaged optical module 1312 through multiple links that have built-in redundancy in case of malfunction in some of the optical power supply modules. For example, the co-packaged optical module 1312 can be designed to receive N channels of optical power supply light (e.g., N1 continuous wave light signals at the same or at different optical wavelengths, or N1 sequences of optical frame templates), N1 being a positive integer, from the optical power supply 1322. The optical power supply 1322 provides N1+M1 channels of optical power supply light to the co-packaged optical module 1312, in which M1 channels of optical power supply light are used for backup in case of failure of one or more of the N1 channels of optical power supply light, M1 being a positive integer.

The second switch box 1304 receives optical power supply light from a co-located optical power supply 1330, which is, e.g., external to the second switch box 1304 and located near the second switch box 1304, e.g., in the same rack as the second switch box 1304 in a data center. The optical power supply 1330 includes an array of optical connectors 1332. Optical fibers 1334 are optically coupled to an optical connector 1336 (of the optical connectors 1332) and the co-packaged optical module 1316. The optical power supply 1330 sends optical power supply light through the optical connector 1336 and the optical fibers 1334 to the co-packaged optical module 1316. For example, the co-packaged optical module 1316 includes a photonic integrated circuit that modulates the power supply light based on data provided by a data processor to generate a modulated optical signal, and transmits the modulated optical signal to the co-packaged optical module 1312 through one of the optical fibers in the fiber bundle 1318.

In some examples, the optical power supply 1330 is configured to provide optical power supply light to the co-packaged optical module 1316 through multiple links that have built-in redundancy in case of malfunction in some of the optical power supply modules. For example, the co-packaged optical module 1316 can be designed to receive N2 channels of optical power supply light (e.g., N2 continuous wave light signals at the same or at different optical wavelengths, or N2 sequences of optical frame templates), N2 being a positive integer, from the optical power supply 1322. The optical power supply 1322 provides N2+M2 channels of optical power supply light to the co-packaged optical module 1312, in which M2 channels of optical power supply light are used for backup in case of failure of one or more of the N2 channels of optical power supply light, M2 being a positive integer.

Figure 80C:
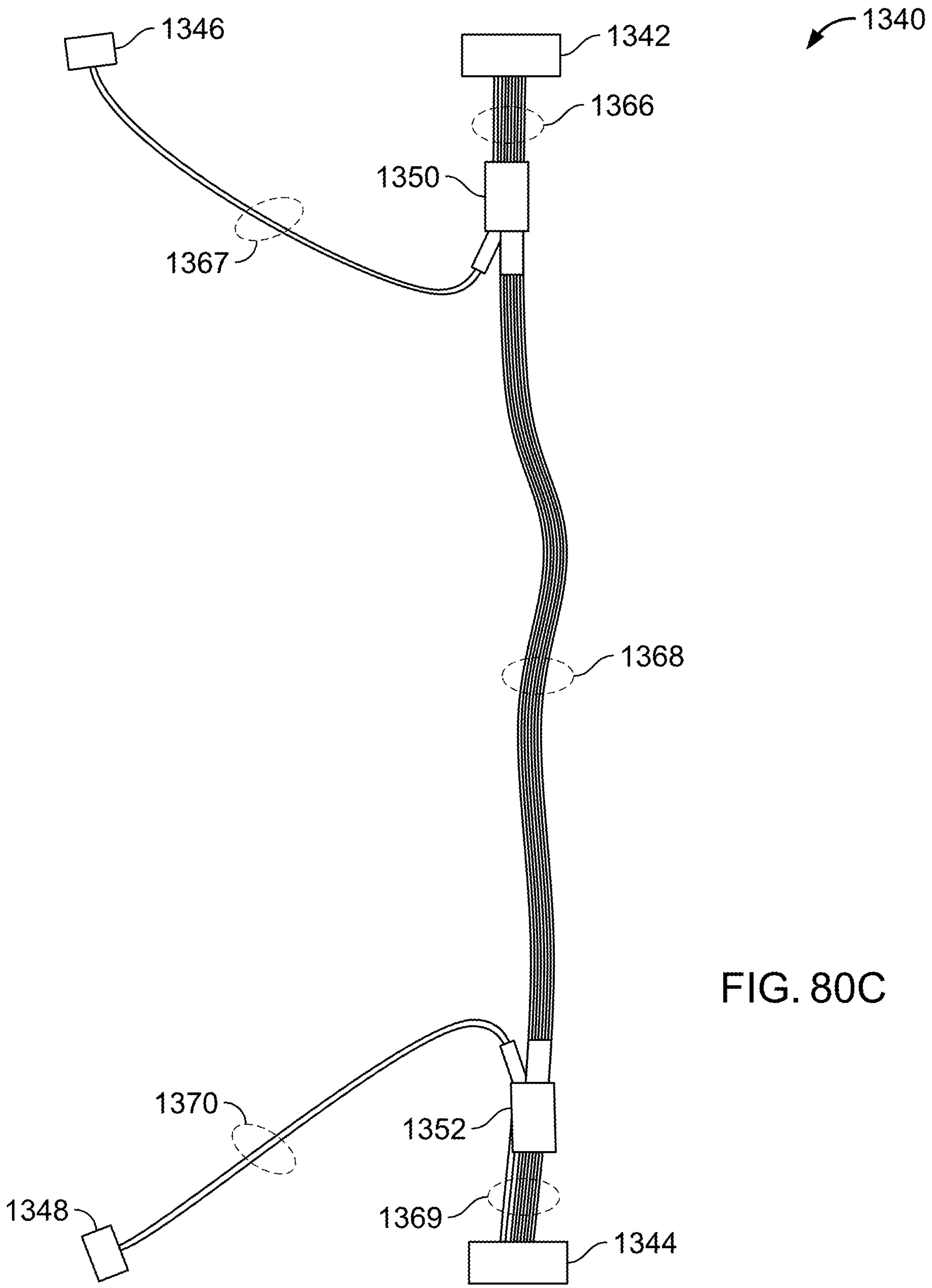
FIG. 80C is an enlarged diagram of the optical cable assembly of FIG. 80B.

FIG. 80B is a diagram of an example of an optical cable assembly 1340 that can be used to enable the first co-packaged optical module 1312 to receive optical power supply light from the first optical power supply 1322, enable the second co-packaged optical module 1316 to receive optical power supply light from the second optical power supply 1330, and enable the first co-packaged optical module 1312 to communicate with the second co-packaged optical module 1316. FIG. 80C is an enlarged diagram of the optical cable assembly 1340 without some of the reference numbers to enhance clarity of illustration.

The optical cable assembly 1340 includes a first optical fiber connector 1342, a second optical fiber connector 1344, a third optical fiber connector 1346, and a fourth optical fiber connector 1348. The first optical fiber connector 1342 is designed and configured to be optically coupled to the first co-packaged optical module 1312. For example, the first optical fiber connector 1342 can be configured to mate with a connector part of the first co-packaged optical module 1312, or a connector part that is optically coupled to the first co-packaged optical module 1312. The first, second, third, and fourth optical fiber connectors 1342, 1344, 1346, 1348 can comply with an industry standard that defines the specifications for optical fiber interconnection cables that transmit data and control signals, and optical power supply light.

The first optical fiber connector 1342 includes optical power supply (PS) fiber ports, transmitter (TX) fiber ports, and receiver (RX) fiber ports. The optical power supply fiber ports provide optical power supply light to the co-packaged optical module 1312. The transmitter fiber ports allow the co-packaged optical module 1312 to transmit output optical signals (e.g., data and/or control signals), and the receiver fiber ports allow the co-packaged optical module 1312 to receive input optical signals (e.g., data and/or control signals). Examples of the arrangement of the optical power supply fiber ports, the transmitter ports, and the receiver ports in the first optical fiber connector 1342 are shown in FIGS. 80D, 89, and 90.

Figure 80D:
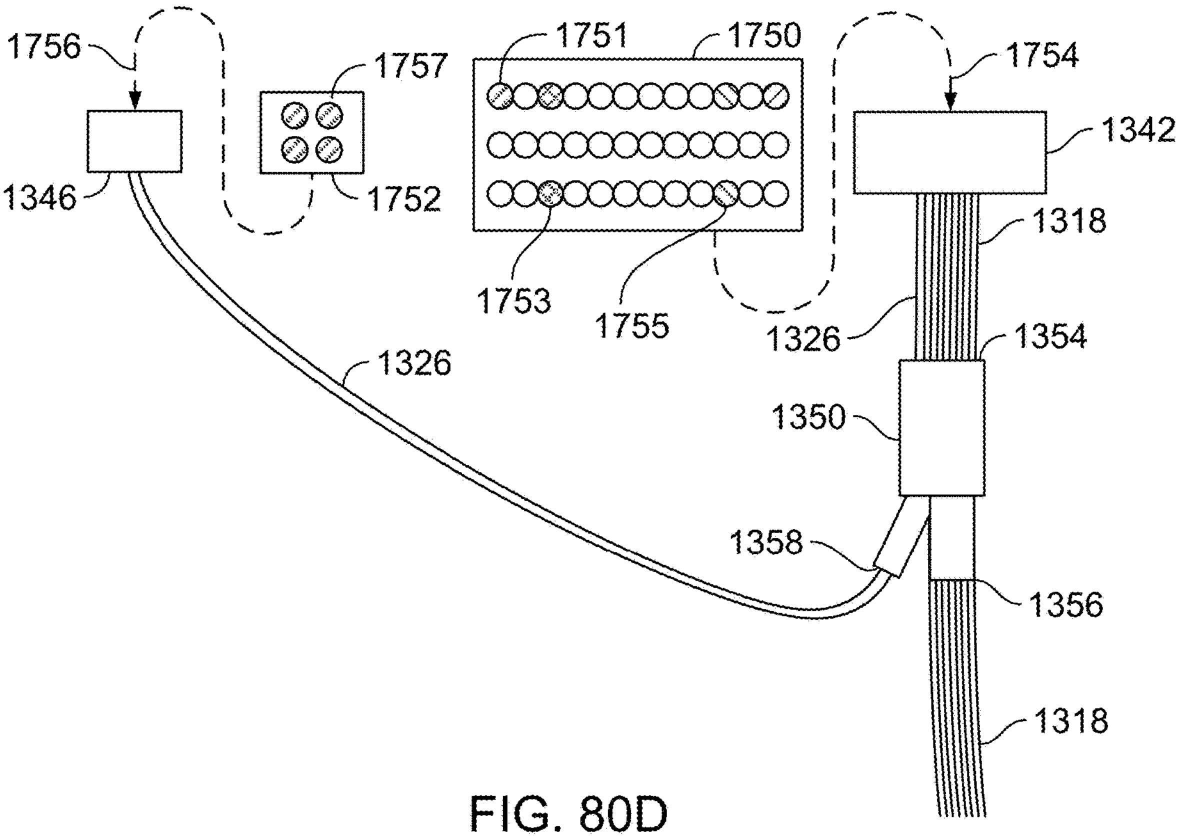
FIG. 80D is an enlarged diagram of the upper portion of the optical cable assembly of FIG. 80B.

FIG. 80D shows an enlarged upper portion of the diagram of FIG. 80B, with the addition of an example of a mapping of fiber ports 1750 of the first optical fiber connector 1342 and a mapping of fiber ports 1752 of the third optical fiber connector 1346. FIG. 80F shows an enlarged view of the diagram of FIG. 80D. The power supply power ports are labeled ‘P’, the transmitter fiber ports are labeled ‘T’, and the receiver fiber ports are labeled ‘R’. Only some of the fiber ports are labeled in the figure. The mapping of fiber ports 1750 shows the positions of the transmitter fiber ports (e.g., 1753), receiver fiber ports (e.g., 1755), and power supply fiber ports (e.g., 1751) of the first optical fiber connector 1342 when viewed in the direction 1754 into the first optical fiber connector 1342. The mapping of fiber ports 1752 shows the positions of the power supply fiber ports (e.g., 1757) of the third optical fiber connector 1346 when viewed in the direction 1756 into the third optical fiber connector 1346.

The second optical fiber connector 1344 is designed and configured to be optically coupled to the second co-packaged optical module 1316. The second optical fiber connector 1344 includes optical power supply fiber ports, transmitter fiber ports, and receiver fiber ports. The optical power supply fiber ports provide optical power supply light to the co-packaged optical module 1316. The transmitter fiber ports allow the co-packaged optical module 1316 to transmit output optical signals, and the receiver fiber ports allow the co-packaged optical module 1316 to receive input optical signals. Examples of the arrangement of the optical power supply fiber ports, the transmitter ports, and the receiver ports in the second optical fiber connector 1344 are shown in FIGS. 80E, 89, and 90.

Figure 80E:
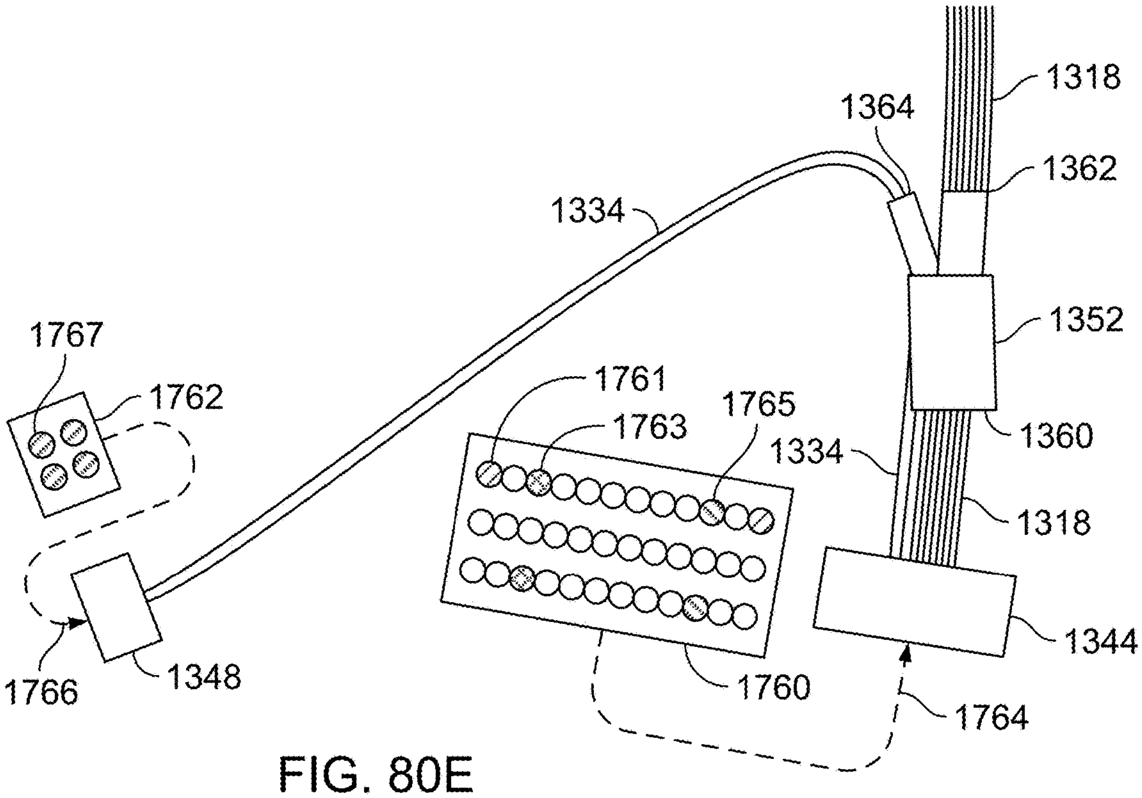
FIG. 80E is an enlarged diagram of the lower portion of the optical cable assembly of FIG. 80B.
Figure 80F:
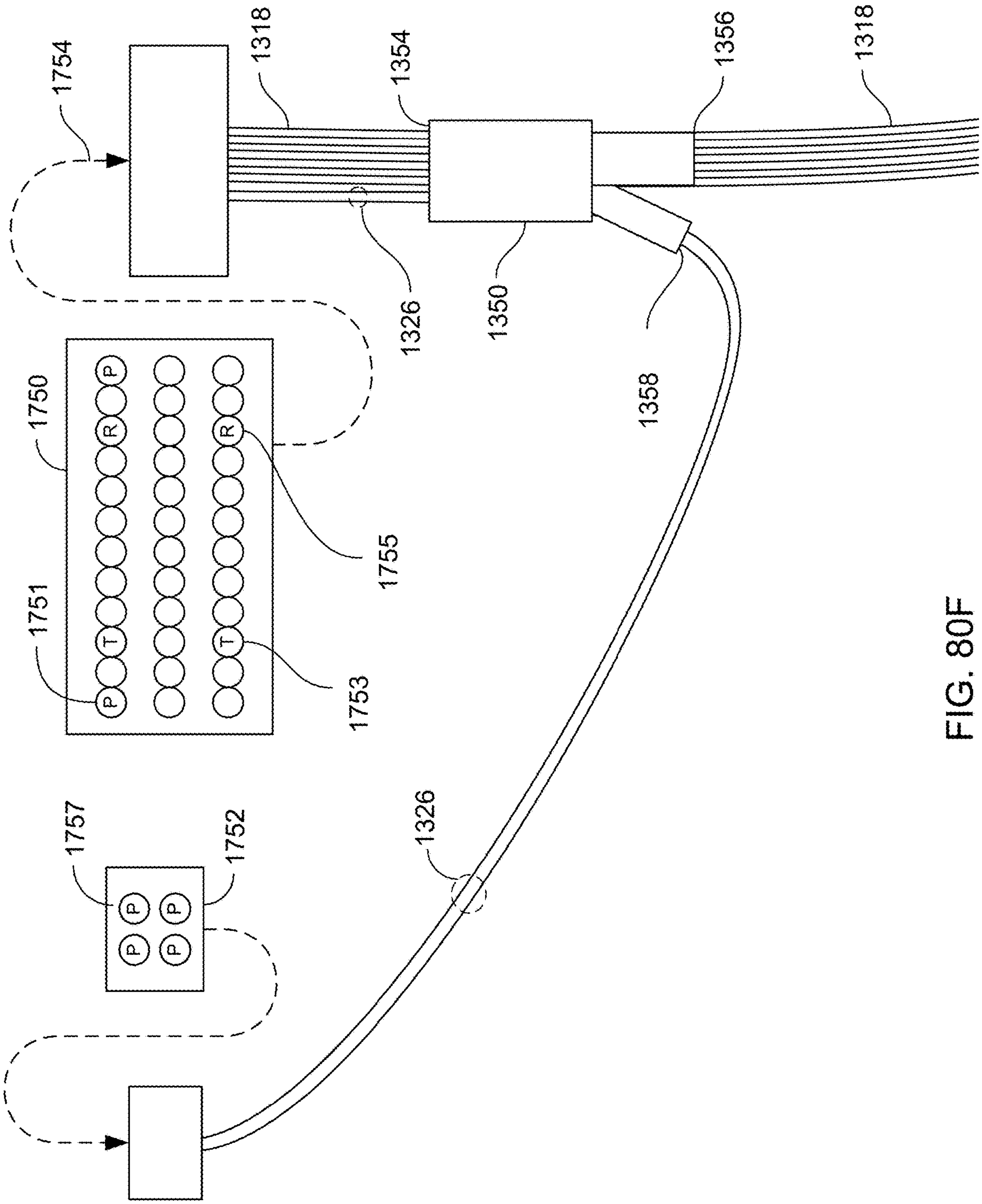
FIG. 80F is an enlarged view of the diagram of FIG. 80D.
Figure 80G:
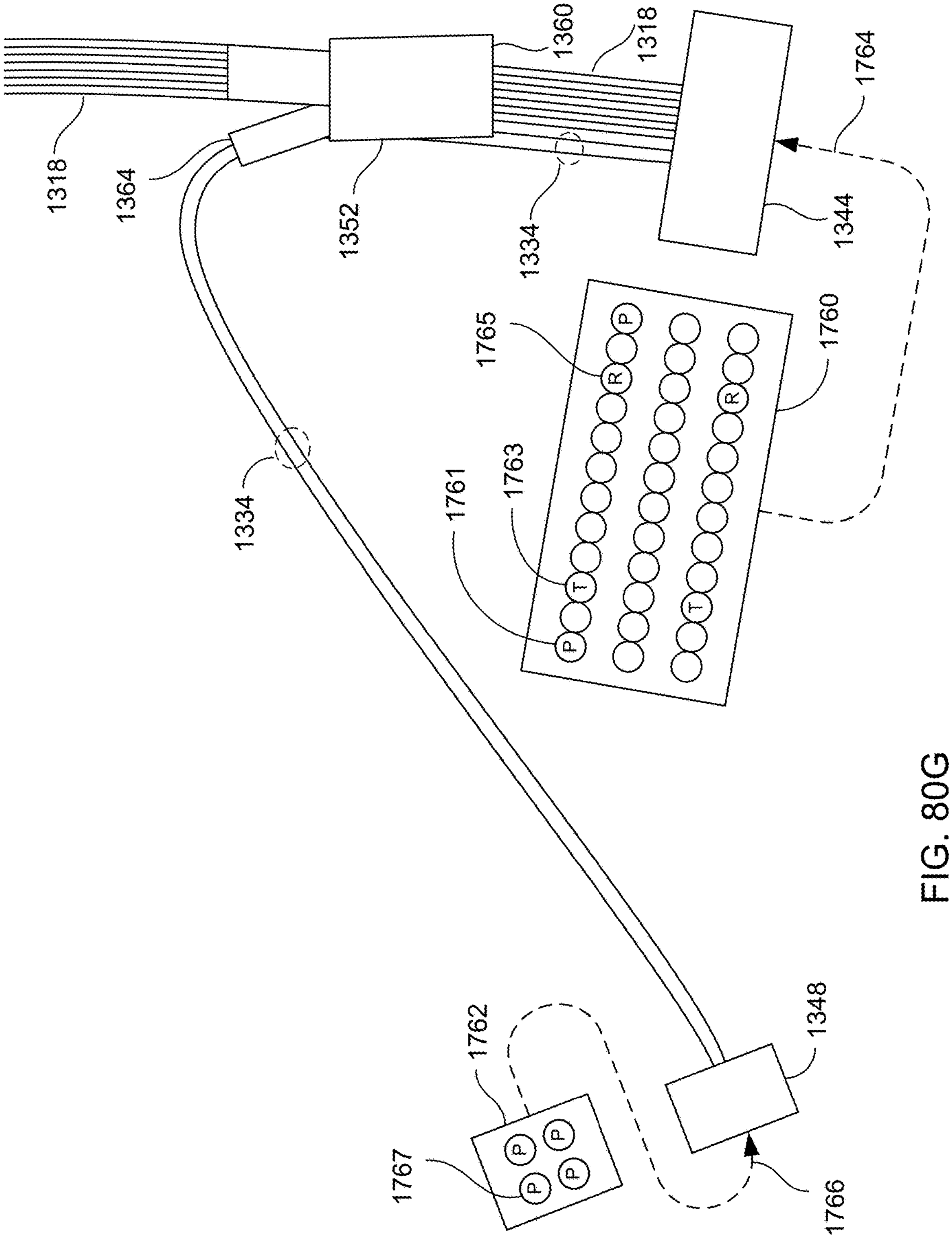
FIG. 80G is an enlarged view of the diagram of FIG. 80E.

FIG. 80E shows an enlarged lower portion of the diagram of FIG. 80B, with the addition of an example of a mapping of fiber ports 1760 of the second optical fiber connector 1344 and a mapping of fiber ports 1762 of the fourth optical fiber connector 1348. FIG. 80G shows an enlarged view of the diagram of FIG. 80E. The power supply power ports are labeled ‘P’, the transmitter fiber ports are labeled ‘T’, and the receiver fiber ports are labeled ‘R’. Only some of the fiber ports are labeled in the figure. The mapping of fiber ports 1760 shows the positions of the transmitter fiber ports (e.g., 1763), receiver fiber ports (e.g., 1765), and power supply fiber ports (e.g., 1761) of the second optical fiber connector 1344 when viewed in the direction 1764 into the second optical fiber connector 1344. The mapping of fiber ports 1762 shows the positions of the power supply fiber ports (e.g., 1767) of the fourth optical fiber connector 1348 when viewed in the direction 1766 into the fourth fiber connector 1348.

The third optical connector 1346 is designed and configured to be optically coupled to the power supply 1322. The third optical connector 1346 includes optical power supply fiber ports (e.g., 1757) through which the power supply 1322 can output the optical power supply light. The fourth optical connector 1348 is designed and configured to be optically coupled to the power supply 1330. The fourth optical connector 1348 includes optical power supply fiber ports (e.g., 1762) through which the power supply 1322 can output the optical power supply light.

In some implementations, the optical power supply fiber ports, the transmitter fiber ports, and the receiver fiber ports in the first and second optical fiber connectors 1342, 1344 are designed to be independent of the communication devices, i.e., the first optical fiber connector 1342 can be optically coupled to the second switch box 1304, and the second optical fiber connector 1344 can be optically coupled to the first switch box 1302 without any re-mapping of the fiber ports. Similarly, the optical power supply fiber ports in the third and fourth optical fiber connectors 1346, 1348 are designed to be independent of the optical power supplies, i.e., if the first optical fiber connector 1342 is optically coupled to the second switch box 1304, the third optical fiber connector 1346 can be optically coupled to the second optical power supply 1330. If the second optical fiber connector 1344 is optically coupled to the first switch box 1302, the fourth optical fiber connector 1348 can be optically coupled to the first optical power supply 1322.

The optical cable assembly 1340 includes a first optical fiber guide module 1350 and a second optical fiber guide module 1352. The optical fiber guide module depending on context is also referred to as an optical fiber coupler or splitter because the optical fiber guide module combines multiple bundles of fibers into one bundle of fibers, or separates one bundle of fibers into multiple bundles of fibers. The first optical fiber guide module 1350 includes a first port 1354, a second port 1356, and a third port 1358. The second optical fiber guide module 1352 includes a first port 1360, a second port 1362, and a third port 1364. The fiber bundle 1318 extends from the first optical fiber connector 1342 to the second optical fiber connector 1344 through the first port 1354 and the second port 1356 of the first optical fiber guide module 1350 and the second port 1362 and the first port 1360 of the second optical fiber guide module 1352. The optical fibers 1326 extend from the third optical fiber connector 1346 to the first optical fiber connector 1342 through the third port 1358 and the first port 1354 of the first optical fiber guide module 1350. The optical fibers 1334 extend from the fourth optical fiber connector 1348 to the second optical fiber connector 1344 through the third port 1364 and the first port 1360 of the second optical fiber guide module 1352.

A portion (or section) of the optical fibers 1318 and a portion of the optical fibers 1326 extend from the first port 1354 of the first optical fiber guide module 1350 to the first optical fiber connector 1342. A portion of the optical fibers 1318 extend from the second port 1356 of the first optical fiber guide module 1350 to the second port 1362 of the second optical fiber guide module 1352, with optional optical connectors (e.g., 1320) along the paths of the optical fibers 1318. A portion of the optical fibers 1326 extend from the third port 1358 of the first optical fiber connector 1350 to the third optical fiber connector 1346. A portion of the optical fibers 1334 extend from the third port 1364 of the second optical fiber connector 1352 to the fourth optical fiber connector 1348.

The first optical fiber guide module 1350 is designed to restrict bending of the optical fibers such that the bending radius of any optical fiber in the first optical fiber guide module 1350 is greater than the minimum bending radius specified by the optical fiber manufacturer to avoid excess optical light loss or damage to the optical fiber. For example, the minimum bend radii can be 2 cm, 1 cm, 5 mm, or 2.5 mm. Other bend radii are also possible. For example, the fibers 1318 and the fibers 1326 extend outward from the first port 1354 along a first direction, the fibers 1318 extend outward from the second port 1356 along a second direction, and the fibers 1326 extend outward from the third port 1358 along a third direction. A first angle is between the first and second directions, a second angle is between the first and third directions, and a third angle is between the second and third directions. The first optical fiber guide module 1350 can be designed to limit the bending of optical fibers so that each of the first, second, and third angles is in a range from, e.g., 30° to 180°.

For example, the portion of the optical fibers 1318 and the portion of the optical fibers 1326 between the first optical fiber connector 1342 and the first port 1354 of the first optical fiber guide module 1350 can be surrounded and protected by a first common sheath 1366. The optical fibers 1318 between the second port 1356 of the first optical fiber guide module 1350 and the second port 1362 of the second optical fiber guide module 1352 can be surrounded and protected by a second common sheath 1368. The portion of the optical fibers 1318 and the portion of the optical fibers

1334 between the second optical fiber connector 1344 and the first port 1360 of the second optical fiber guide module 1352 can be surrounded and protected by a third common sheath 1369. The optical fibers 1326 between the third optical fiber connector 1346 and the third port 1358 of the first optical fiber guide module 1350 can be surrounded and protected by a fourth common sheath 1367. The optical fibers 1334 between the fourth optical fiber connector 1348 and the third port 1364 of the second optical fiber guide module 1352 can be surrounded and protected by a fifth common sheath 1370. Each of the common sheaths can be laterally flexible and/or laterally stretchable, as described in, e.g., U.S. patent application Ser. No. 16/822,103.

One or more optical cable assemblies 1340 (FIGS. 80B, 80C) and other optical cable assemblies (e.g., 1400 of FIG. 82B, 82C, 1490 of FIG. 84B, 84C) described in this document can be used to optically connect switch boxes that are configured differently compared to the switch boxes 1302, 1304 shown in FIG. 80A, in which the switch boxes receive optical power supply light from one or more external optical power supplies. For example, in some implementations, the optical cable assembly 1340 can be attached to a fiber-optic array connector mounted on the outside of the front panel of an optical switch, and another fiber-optic cable then connects the inside of the fiber connector to a co-packaged optical module that is mounted on a circuit board positioned inside the housing of the switch box. The co-packaged optical module (which includes, e.g., a photonic integrated circuit, optical-to-electrical converters, such as photodetectors, and electrical-to-optical converters, such as laser diodes) can be co-packaged with a switch ASIC and mounted on a circuit board that can be vertically or horizontally oriented. For example, in some implementations, the front panel is mounted on hinges and a vertical ASIC mount is recessed behind it. See the examples in FIGS. 77A, 77B, and 78. The optical cable assembly 1340 provides optical paths for communication between the switch boxes, and optical paths for transmitting power supply light from one or more external optical power supplies to the switch boxes. The switch boxes can have any of a variety of configurations regarding how the power supply light and the data and/or control signals from the optical fiber connectors are transmitted to or received from the photonic integrated circuits, and how the signals are transmitted between the photonic integrated circuits and the data processors.

One or more optical cable assemblies 1340 and other optical cable assemblies (e.g., 1400 of FIG. 82B, 82C, 1490 of FIG. 84B, 84C) described in this document can be used to optically connect computing devices other than switch boxes. For example, the computing devices can be server computers that provide a variety of services, such as cloud computing, database processing, audio/video hosting and streaming, electronic mail, data storage, web hosting, social networking, supercomputing, scientific research computing, healthcare data processing, financial transaction processing, logistics management, weather forecasting, or simulation, to list a few examples. The optical power light required by the optoelectronic modules of the computing devices can be provided using one or more external optical power supplies. For example, in some implementations, one or more external optical power supplies that are centrally managed can be configured to provide the optical power supply light for hundreds or thousands of server computers in a data center, and the one or more optical power supplies and the server computers can be optically connected using the optical cable assemblies (e.g., 1340, 1400, 1490) described in this document and variations of the optical cable assemblies using the principles described in this document.

Figure 81:
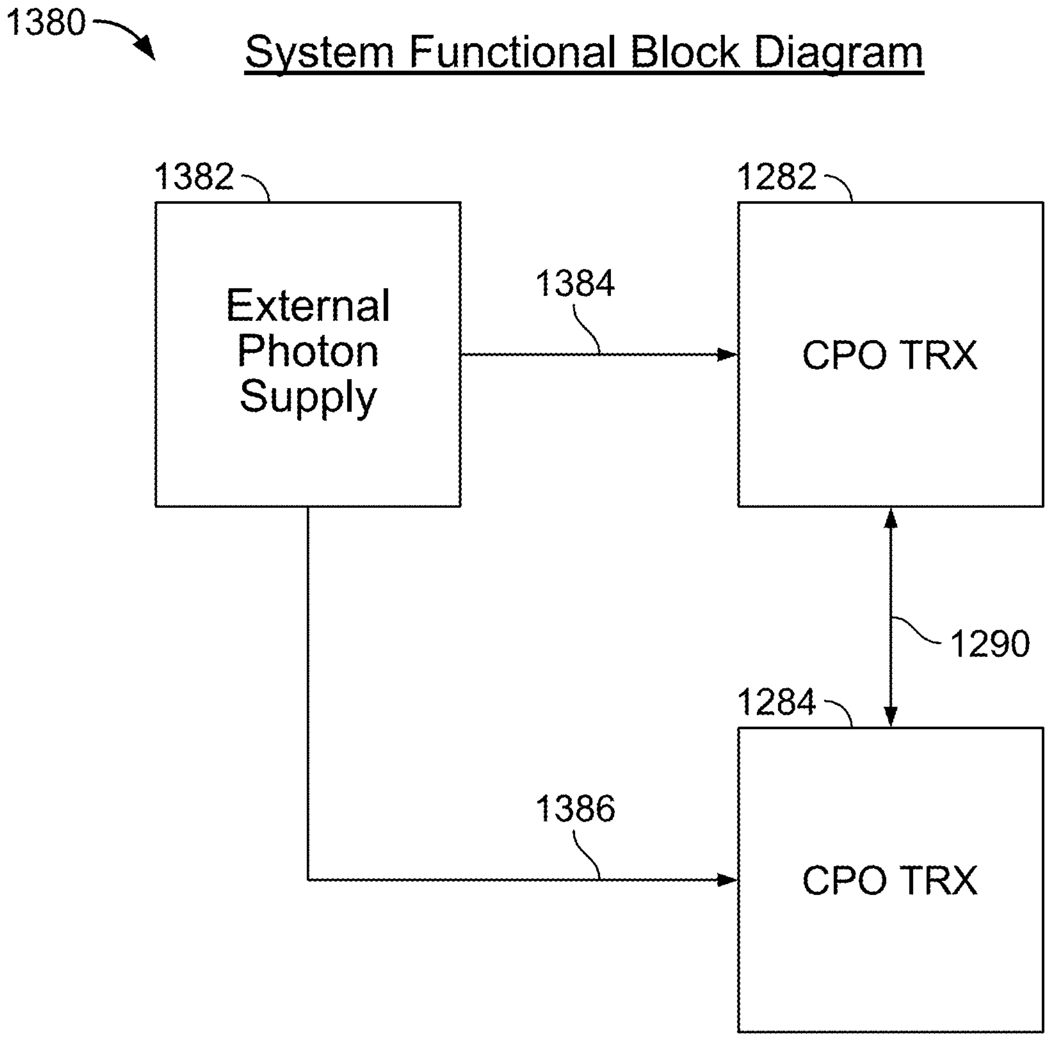
FIG. 81 is a block diagram of an example of an optical communication system.

FIG. 81 is a system functional block diagram of an example of an optical communication system 1380 that includes a first communication transponder 1282 and a second communication transponder 1284, similar to those in FIG. 79. The first communication transponder 1282 sends optical signals to, and receives optical signals from, the second communication transponder 1284 through a first optical communication link 1290. The optical communication system 1380 can be expanded to include additional communication transponders.

An external photon supply 1382 provides optical power supply light to the first communication transponder 1282 through a first optical power supply link 1384, and provides optical power supply light to the second communication transponder 1284 through a second optical power supply link 1386. In one example, the external photon supply 1282 provides continuous wave light to the first communication transponder 1282 and to the second communication transponder 1284. In one example, the continuous wave light can be at the same optical wavelength. In another example, the continuous wave light can be at different optical wavelengths. In yet another example, the external photon supply 1282 provides a first sequence of optical frame templates to the first communication transponder 1282, and provides a second sequence of optical frame templates to the second communication transponder 1284. Each of the optical frame templates can include a respective frame header and a respective frame body, and the frame body includes a respective optical pulse train. The first communication transponder 1282 receives the first sequence of optical frame templates from the external photon supply 1382, loads data into the respective frame bodies to convert the first sequence of optical frame templates into a first sequence of loaded optical frames that are transmitted through the first optical communication link 1290 to the second communication transponder 1284. Similarly, the second communication transponder 1284 receives the second sequence of optical frame templates from the external photon supply 1382, loads data into the respective frame bodies to convert the second sequence of optical frame templates into a second sequence of loaded optical frames that are transmitted through the first optical communication link 1290 to the first communication transponder 1282.

Figure 82B:
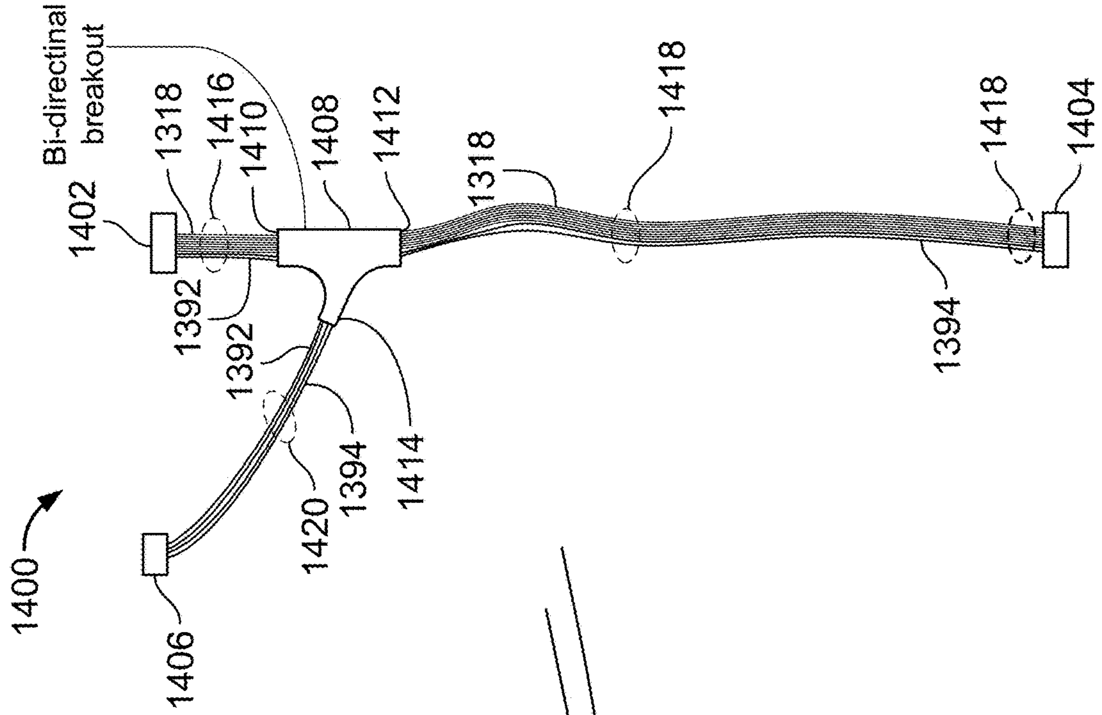
FIG. 82B is a diagram of an example of an optical cable assembly.
Figure 82A:
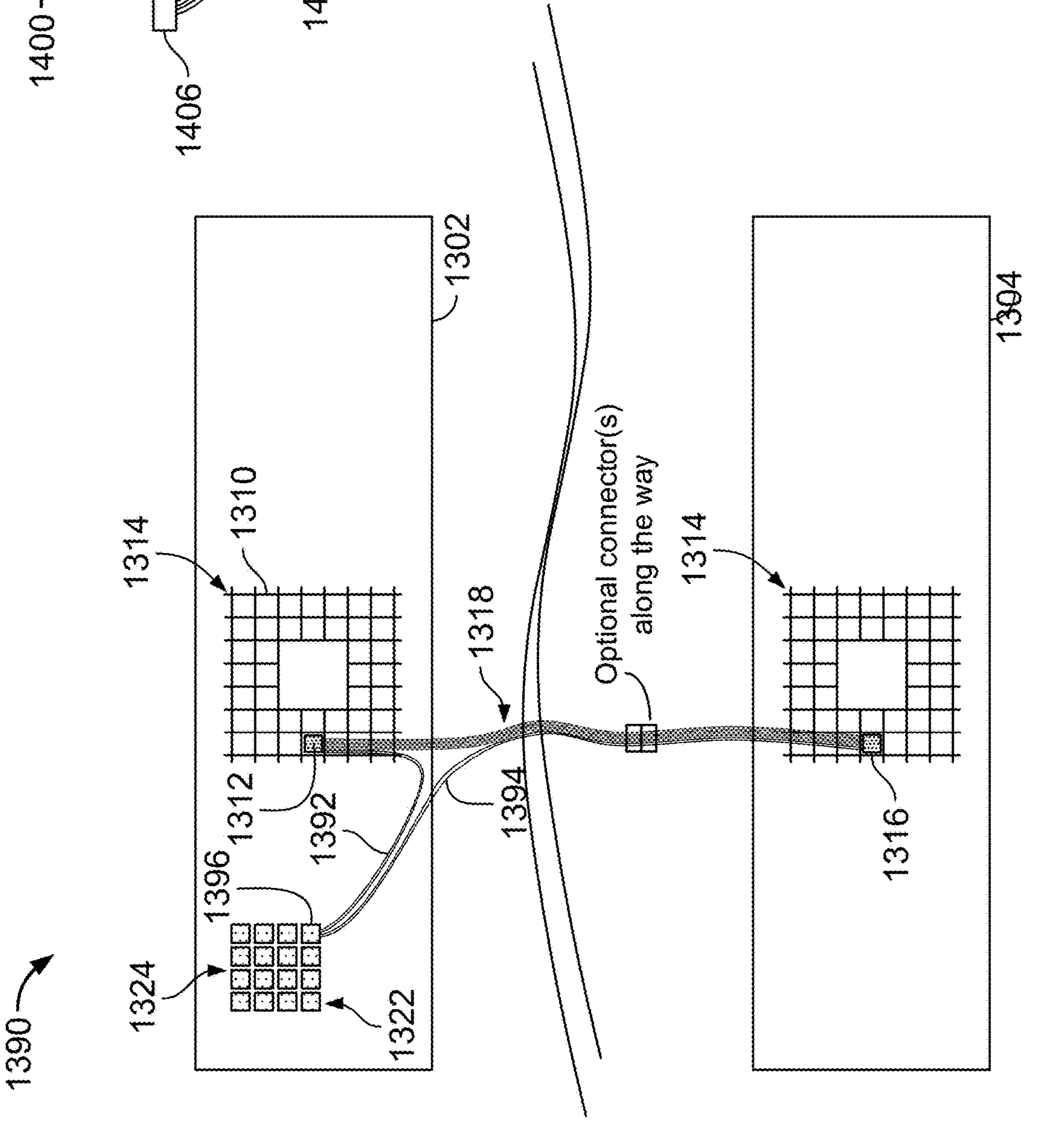
FIG. 82A is a diagram of an example of an optical communication system.
Figure 82C:
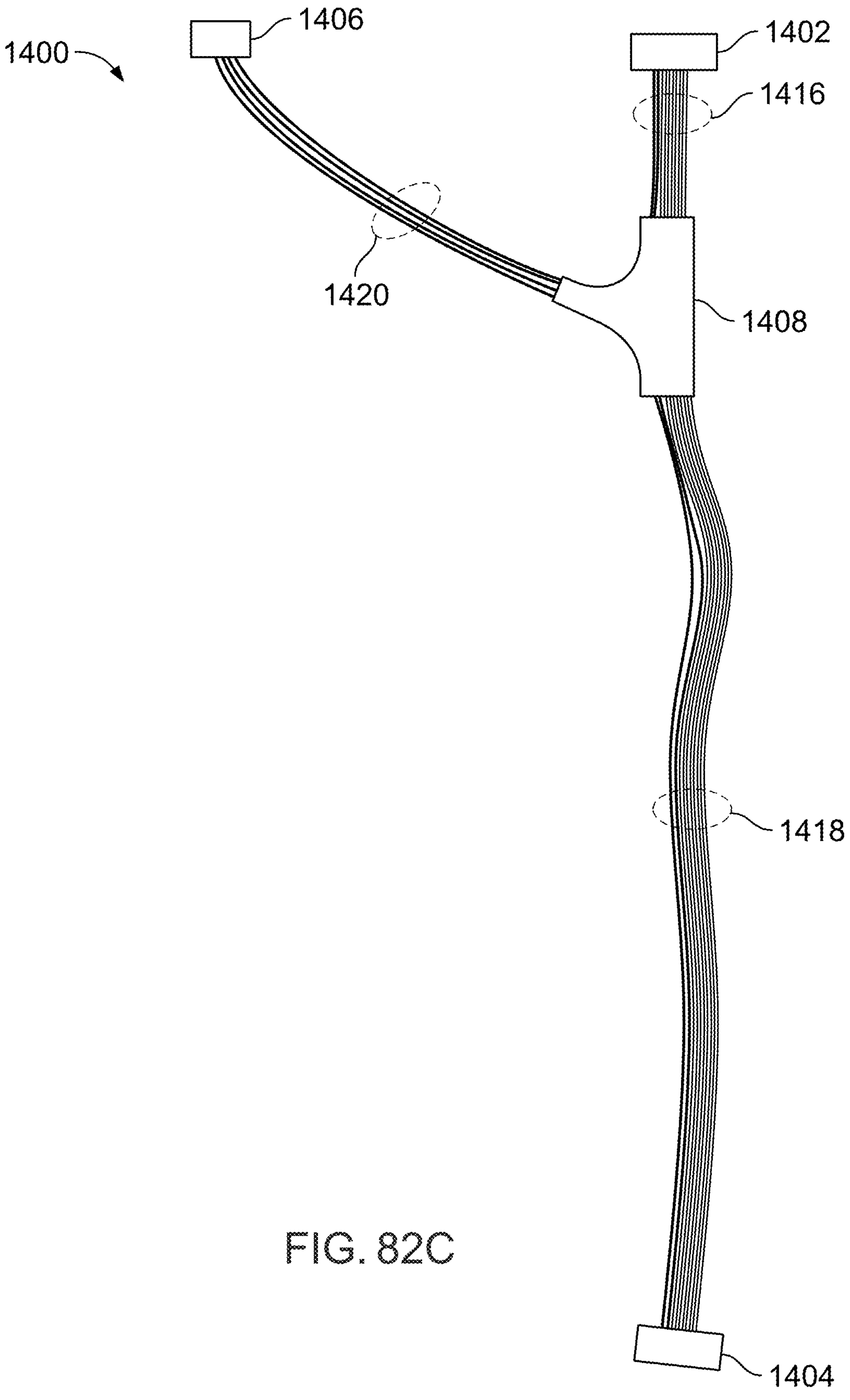
FIG. 82C is an enlarged diagram of the optical cable assembly of FIG. 82B.

FIG. 82A is a diagram of an example of an optical communication system 1390 that includes a first switch box 1302 and a second switch box 1304, similar to those in FIG. 80A. FIG. 82F shows an enlarged view of a portion of the diagram of FIG. 82A, including the switch box 1302 and a portion of the fiber bundle 1318. The first switch box 1302 includes a vertical ASIC mount grid structure 1310, and a co-packaged optical module 1312 is attached to a receptor of the grid structure 1310. The second switch box 1304 includes a vertical ASIC mount grid structure 1314, and a co-packaged optical module 1316 is attached to a receptor of the grid structure 1314. The first co-packaged optical module 1312 communicates with the second co-packaged optical module 1316 through an optical fiber bundle 1318 that includes multiple optical fibers.

As discussed above in connection with FIGS. 80A to 80E, the first and second switch boxes 1302, 1304 can have other configurations. For example, horizontally mounted ASICs can be used. A fiber-optic array connector attached to a front panel can be used to optically connect the optical cable assembly 1340 to another fiber-optic cable that connects to a co-packaged optical module mounted on a circuit board inside the switch box. The front panel can be mounted on hinges and a vertical ASIC mount can be recessed behind it. The switch boxes can be replaced by other types of server computers.

In an example embodiment, the first switch box 1302 includes an external optical power supply 1322 that provides optical power supply light to both the co-packaged optical module 1312 in the first switch box 1302 and the co-packaged optical module 1316 in the second switch box 1304. In another example embodiment, the optical power supply can be located outside the switch box 1302 (cf. 1330, FIG. 80A). The optical power supply 1322 provides the optical power supply light through an optical connector array 1324. Optical fibers 1392 are optically coupled to an optical connector 1396 and the co-packaged optical module 1312. The optical power supply 1322 sends optical power supply light through the optical connector 1396 and the optical fibers 1392 to the co-packaged optical module 1312 in the first switch box 1302. Optical fibers 1394 are optically coupled to the optical connector 1396 and the co-packaged optical module 1316. The optical power supply 1322 sends optical power supply light through the optical connector 1396 and the optical fibers 1394 to the co-packaged optical module 1316 in the second switch box 1304.

FIG. 82B shows an example of an optical cable assembly 1400 that can be used to enable the first co-packaged optical module 1312 to receive optical power supply light from the optical power supply 1322, enable the second co-packaged optical module 1316 to receive optical power supply light from the optical power supply 1322, and enable the first co-packaged optical module 1312 to communicate with the second co-packaged optical module 1316. FIG. 82C is an enlarged diagram of the optical cable assembly 1400 without some of the reference numbers to enhance clarity of illustration.

The optical cable assembly 1400 includes a first optical fiber connector 1402, a second optical fiber connector 1404, and a third optical fiber connector 1406. The first optical fiber connector 1402 is similar to the first optical fiber connector 1342 of FIGS. 80B, 80C, 80D, and is designed and configured to be optically coupled to the first co-packaged optical module 1312. The second optical fiber connector 1404 is similar to the second optical fiber connector 1344 of FIGS. 80B, 80C, 80E, and is designed and configured to be optically coupled to the second co-packaged optical module 1316. The third optical connector 1406 is designed and configured to be optically coupled to the power supply 1322. The third optical connector 1406 includes first optical power supply fiber ports (e.g., 1770, FIG. 82D) and second optical power supply fiber ports (e.g., 1772). The power supply 1322 outputs optical power supply light through the first optical power supply fiber ports to the optical fibers 1392, and outputs optical power supply light through the second optical power supply fiber ports to the optical fibers 1394. The first, second, and third optical fiber connectors 1402, 1404, 1406 can comply with an industry standard that defines the specifications for optical fiber interconnection cables that transmit data and control signals, and optical power supply light.

Figure 82D:
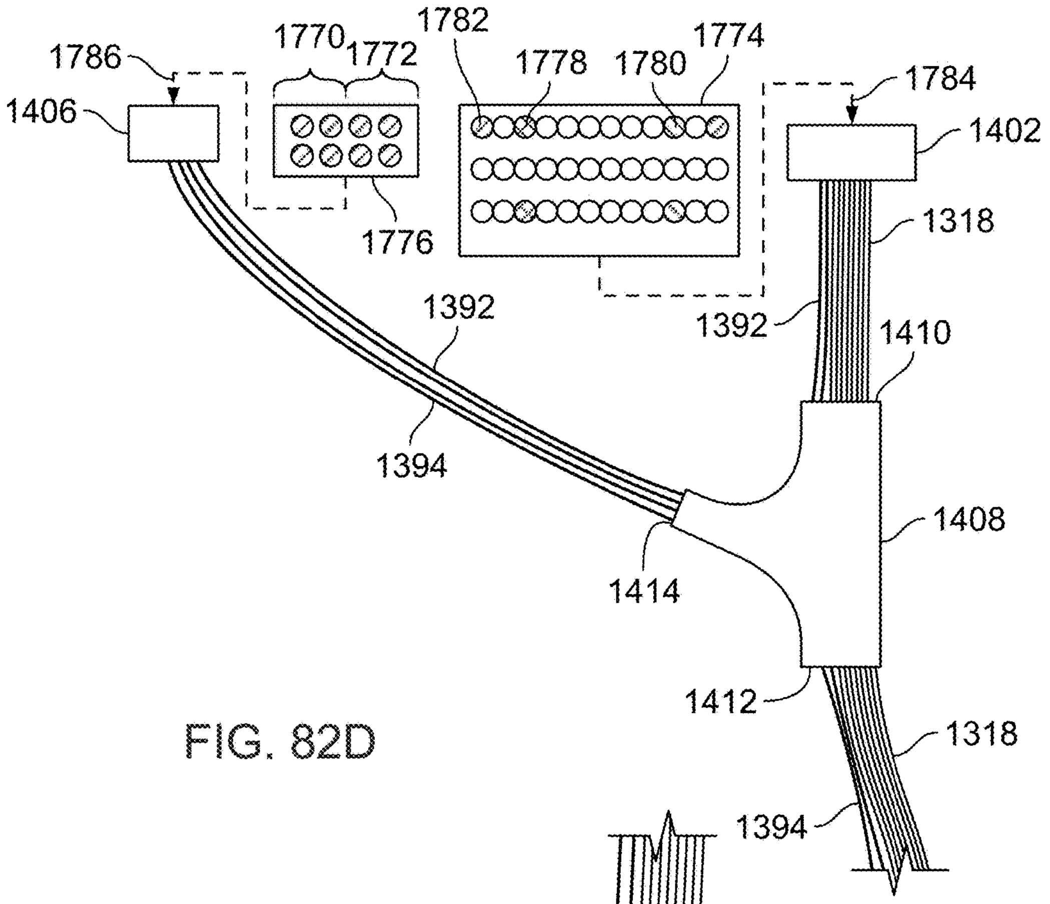
FIG. 82D is an enlarged diagram of the upper portion of the optical cable assembly of FIG. 82B.

FIG. 82D shows an enlarged upper portion of the diagram of FIG. 82B, with the addition of an example of a mapping of fiber ports 1774 of the first optical fiber connector 1402 and a mapping of fiber ports 1776 of the third optical fiber connector 1406. FIG. 82G shows an enlarged view of the diagram of FIG. 82D. The power supply power ports are labeled ‘P’, the transmitter fiber ports are labeled ‘T’, and the receiver fiber ports are labeled ‘R’. Only some of the fiber ports are labeled in the figure. The mapping of fiber ports 1774 shows the positions of the transmitter fiber ports (e.g., 1778), receiver fiber ports (e.g., 1780), and power supply fiber ports (e.g., 1782) of the first optical fiber connector 1402 when viewed in the direction 1784 into the first optical fiber connector 1402. The mapping of fiber ports 1776 shows the positions of the power supply fiber ports (e.g., 1770, 1772) of the third optical fiber connector 1406 when viewed in the direction 1786 into the third optical fiber connector 1406. In this example, the third optical fiber connector 1406 includes 8 optical power supply fiber ports.

In some examples, optical connector array 1324 of the optical power supply 1322 can include a first type of optical connectors that accept optical fiber connectors having 4 optical power supply fiber ports, as in the example of FIG. 80D, and a second type of optical connectors that accept optical fiber connectors having 8 optical power supply fiber ports, as in the example of FIG. 82D. In some examples, if the optical connector array 1324 of the optical power supply 1322 only accepts optical fiber connectors having 4 optical power supply fiber ports, then a converter cable can be used to convert the third optical fiber connector 1406 of FIG. 82D to two optical fiber connectors, each having 4 optical power supply fiber ports, that is compatible with the optical connector array 1324.

Figure 82E:
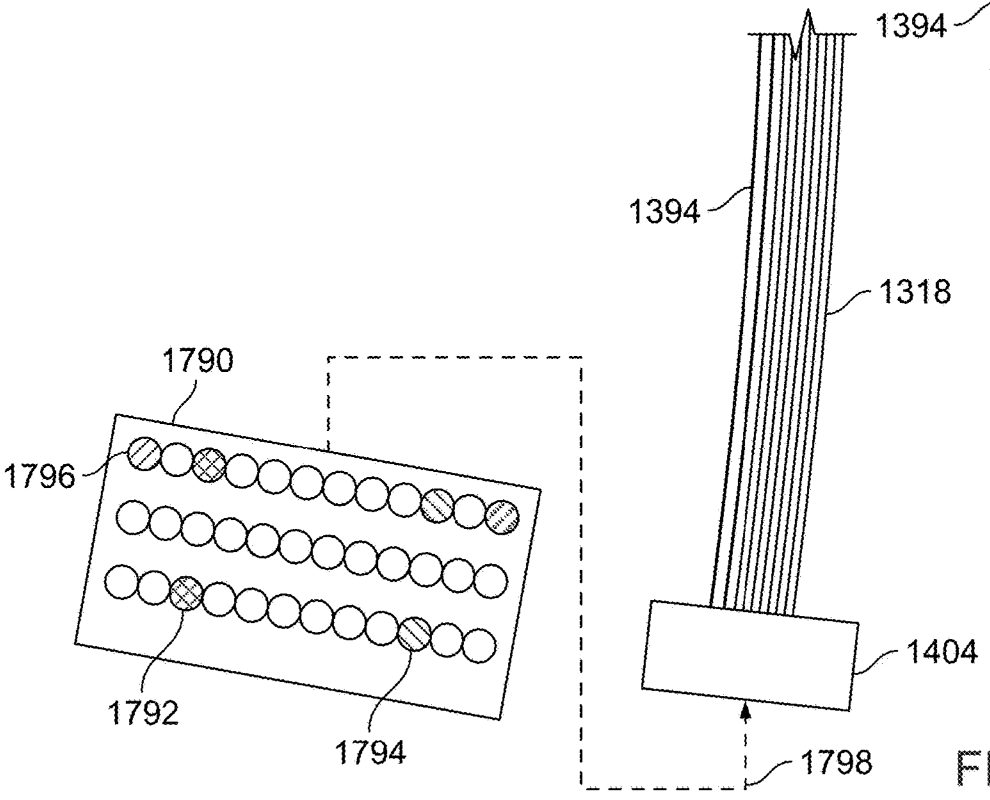
FIG. 82E is an enlarged diagram of the lower portion of the optical cable assembly of FIG. 82B.
Figure 82F:
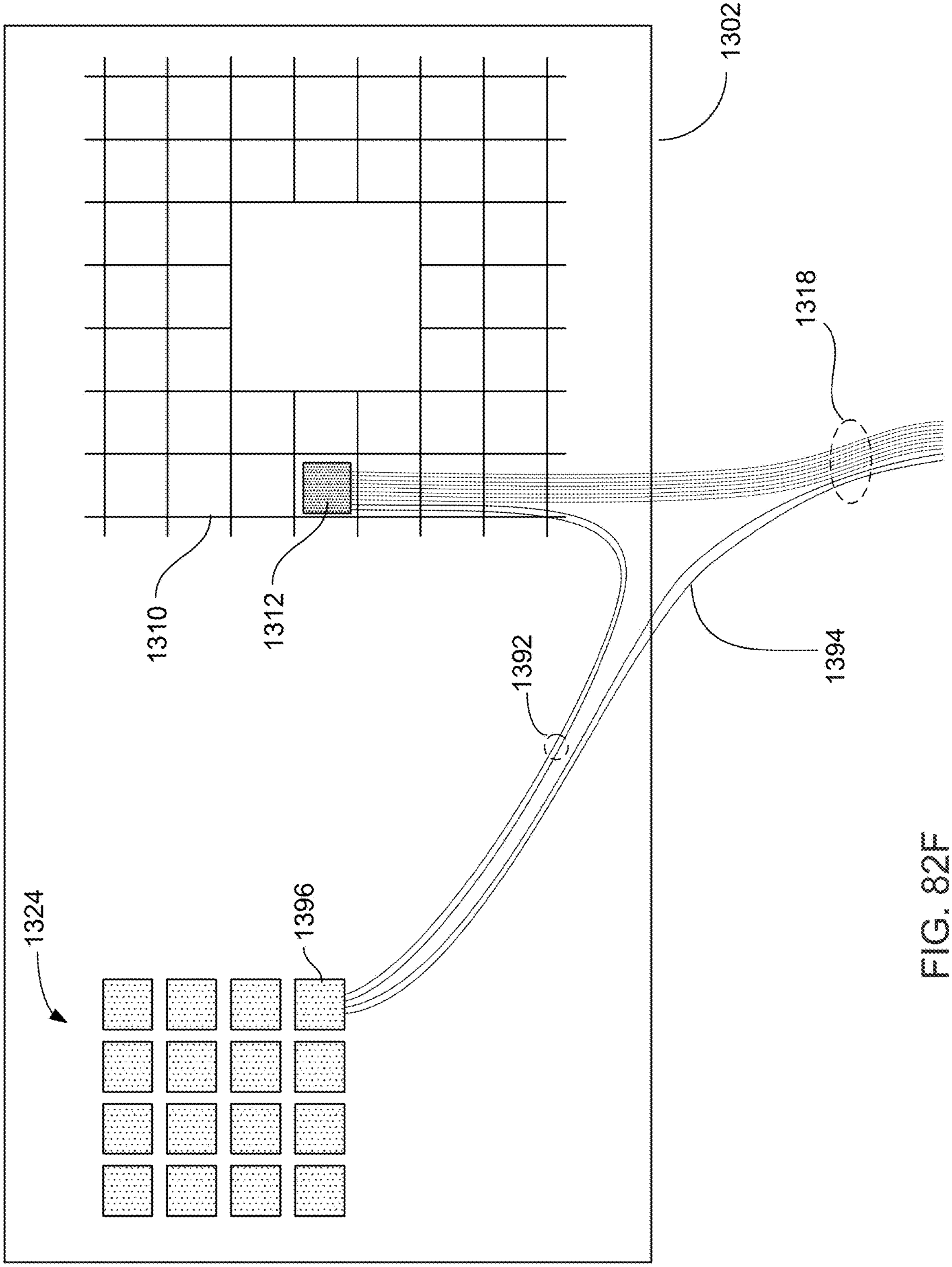
FIG. 82F is an enlarged view of a portion of the diagram of FIG. 82A.
Figure 82G:
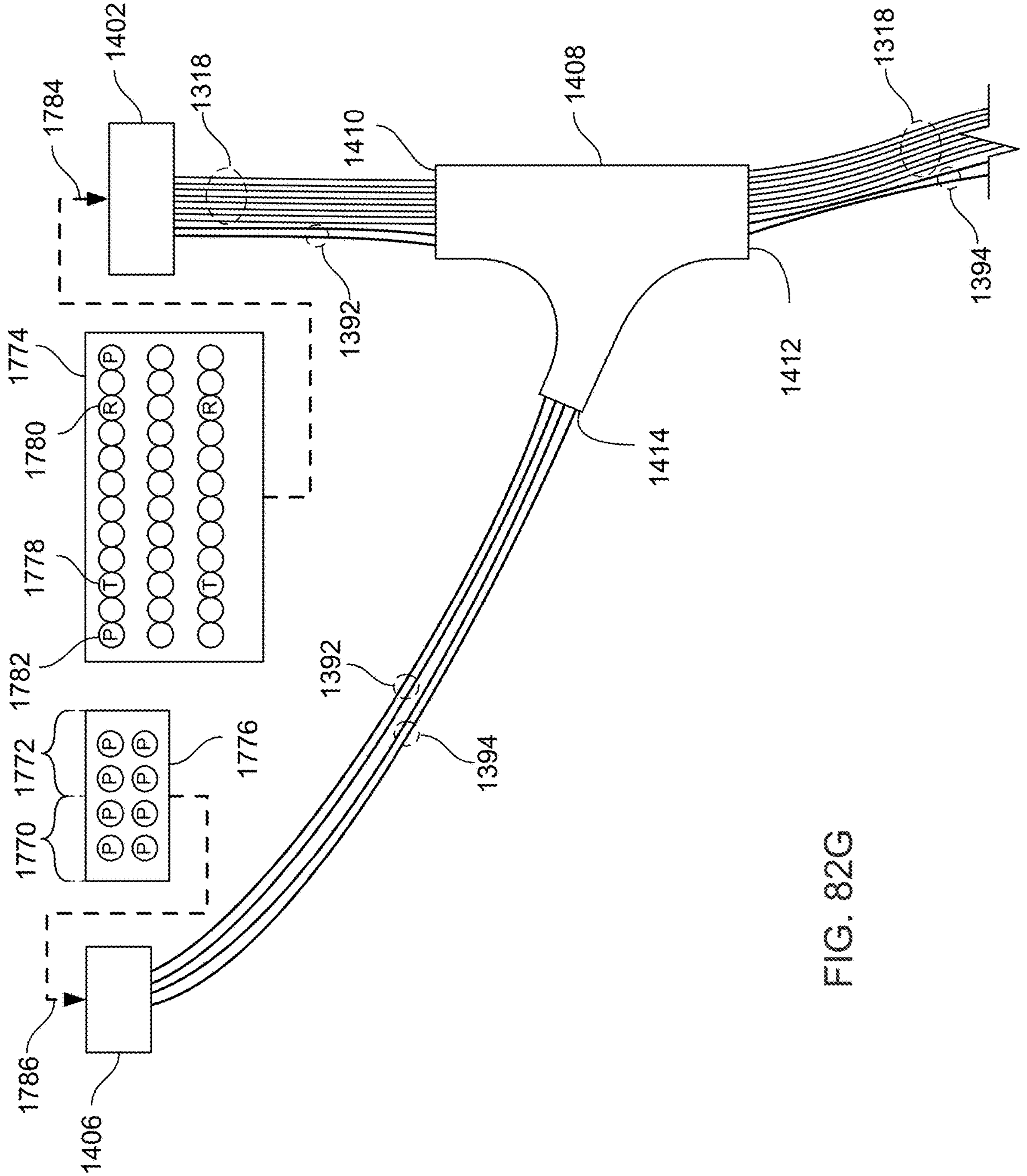
FIG. 82G is an enlarged view of the diagram of FIG. 82D.
Figure 82H:
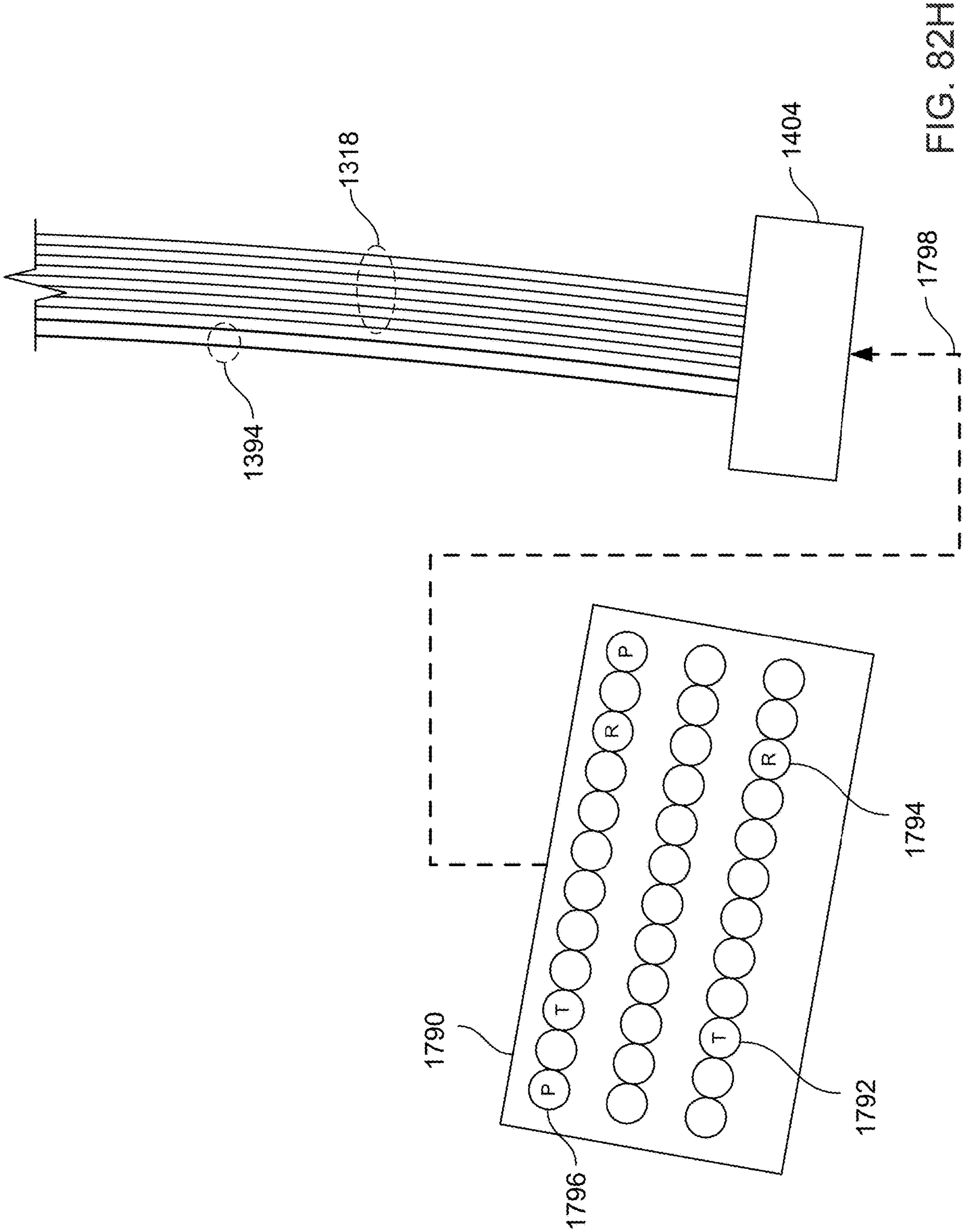
FIG. 82H is an enlarged view of the diagram of FIG. 82E.

FIG. 82E shows an enlarged lower portion of the diagram of FIG. 82B, with the addition of an example of a mapping of fiber ports 1790 of the second optical fiber connector 1404. FIG. 82H shows an enlarged view of the diagram of FIG. 82E. The power supply power ports are labeled ‘P’, the transmitter fiber ports are labeled ‘T’, and the receiver fiber ports are labeled ‘R’. Only some of the fiber ports are labeled in the figure. The mapping of fiber ports 1790 shows the positions of the transmitter fiber ports (e.g., 1792), receiver fiber ports (e.g., 1794), and power supply fiber ports (e.g., 1796) of the second optical fiber connector 1404 when viewed in the direction 1798 into the second optical fiber connector 1404.

The port mappings of the optical fiber connectors shown in FIGS. 80D, 80E, 82D, and 82E are merely examples. Each optical fiber connector can include a greater number or a smaller number of transmitter fiber ports, a greater number or a smaller number of receiver fiber ports, and a greater number or a smaller number of optical power supply fiber ports, as compared to those shown in FIGS. 80D, 80E, 82D, and 82E. The arrangement of the relative positions of the transmitter, receiver, and optical power supply fiber ports can also be different from those shown in FIGS. 80D, 80E, 82D, and 82E.

The optical cable assembly 1400 includes an optical fiber guide module 1408, which includes a first port 1410, a second port 1412, and a third port 1414. The optical fiber guide module 1408 depending on context is also referred as an optical fiber coupler (for combining multiple bundles of optical fibers into one bundle of optical fiber) or an optical fiber splitter (for separating a bundle of optical fibers into multiple bundles of optical fibers). The fiber bundle 1318 extends from the first optical fiber connector 1402 to the second optical fiber connector 1404 through the first port 1410 and the second port 1412 of the optical fiber guide module 1408. The optical fibers 1392 extend from the third optical fiber connector 1406 to the first optical fiber connector 1402 through the third port 1414 and the first port 1410 of the optical fiber guide module 1408. The optical fibers 1394 extend from the third optical fiber connector 1406 to the second optical fiber connector 1404 through the third port 1414 and the second port 1412 of the optical fiber guide module 1408.

A portion of the optical fibers 1318 and a portion of the optical fibers 1392 extend from the first port 1410 of the optical fiber guide module 1408 to the first optical fiber connector 1402. A portion of the optical fibers 1318 and a portion of the optical fibers 1394 extend from the second port 1412 of the optical fiber guide module 1408 to the second optical fiber connector 1404. A portion of the optical fibers 1394 extend from the third port 1414 of the optical fiber connector 1408 to the third optical fiber connector 1406.

The optical fiber guide module 1408 is designed to restrict bending of the optical fibers such that the radius of curvature of any optical fiber in the optical fiber guide module 1408 is greater than the minimum radius of curvature specified by the optical fiber manufacturer to avoid excess optical light loss or damage to the optical fiber. For example, the optical fibers 1318 and the optical fibers 1392 extend outward from the first port 1410 along a first direction, the optical fibers 1318 and the optical fibers 1394 extend outward from the second port 1412 along a second direction, and the optical fibers 1392 and the optical fibers 1394 extend outward from the third port 1414 along a third direction. A first angle is between the first and second directions, a second angle is between the first and third directions, and a third angle is between the second and third directions. The optical fiber guide module 1408 is designed to limit the bending of optical fibers so that each of the first, second, and third angles is in a range from, e.g., 30° to 180°.

For example, the portion of the optical fibers 1318 and the portion of the optical fibers 1392 between the first optical fiber connector 1402 and the first port 1410 of the optical fiber guide module 1408 can be surrounded and protected by a first common sheath 1416. The optical fibers 1318 and the optical fibers 1394 between the second optical fiber connector 1404 and the second port 1412 of the optical fiber guide module 1408 can be surrounded and protected by a second common sheath 1418. The optical fibers 1392 and the optical fibers 1394 between the third optical fiber connector 1406 and the third port 1414 of the optical fiber guide module 1408 can be surrounded and protected by a third common sheath 1420. Each of the common sheaths can be laterally flexible and/or laterally stretchable.

Figure 83:
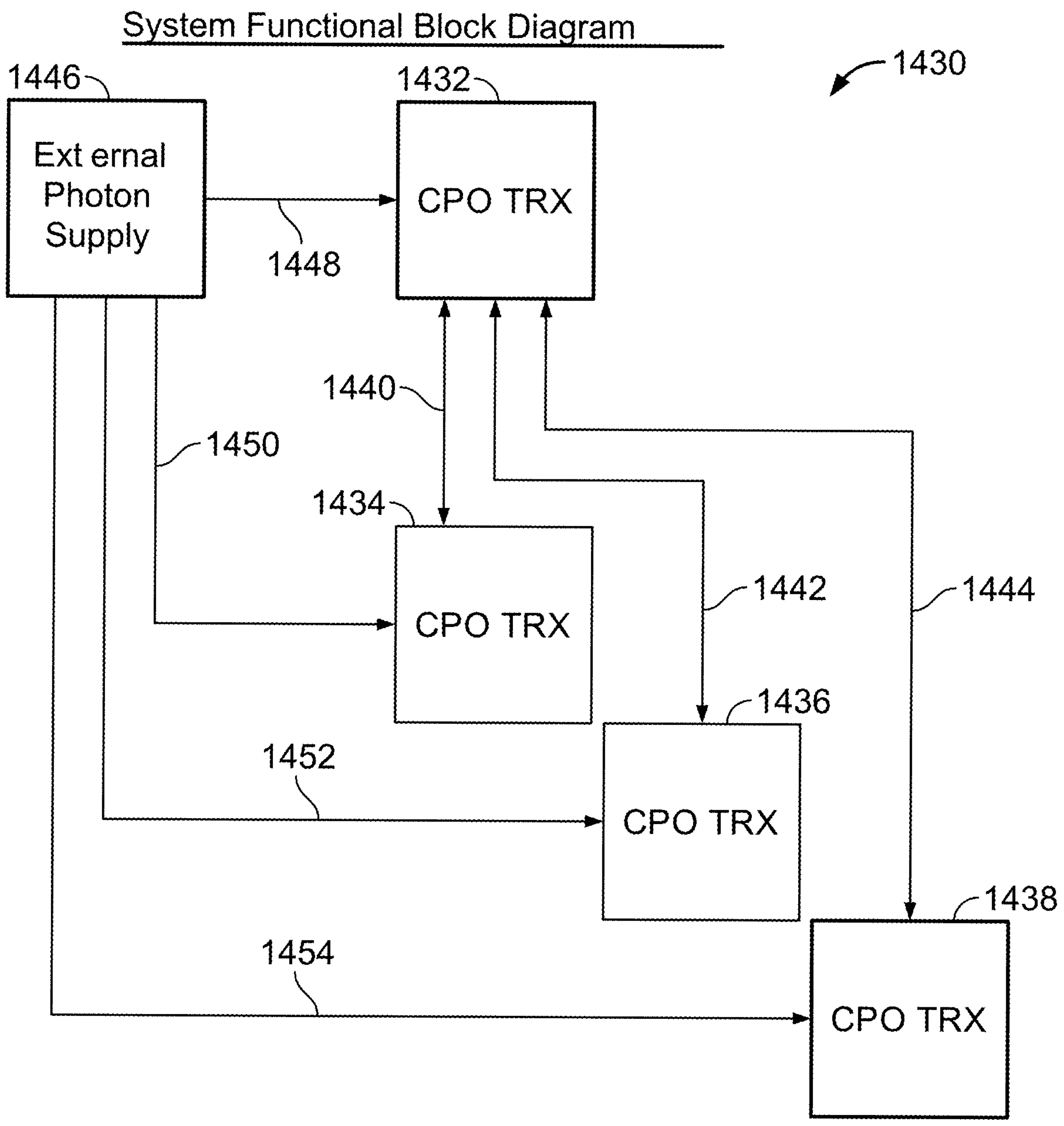
FIG. 83 is a block diagram of an example of an optical communication system.

FIG. 83 is a system functional block diagram of an example of an optical communication system 1430 that includes a first communication transponder 1432, a second communication transponder 1434, a third communication transponder 1436, and a fourth communication transponder 1438. Each of the communication transponders 1432, 1434, 1436, 1438 can be similar to the communication transponders 1282, 1284 of FIG. 79. The first communication transponder 1432 communicates with the second communication transponder 1434 through a first optical link 1440. The first communication transponder 1432 communicates with the third communication transponder 1436 through a second optical link 1442. The first communication transponder 1432 communicates with the fourth communication transponder 1438 through a third optical link 1444.

An external photon supply 1446 provides optical power supply light to the first communication transponder 1432 through a first optical power supply link 1448, provides optical power supply light to the second communication transponder 1434 through a second optical power supply link 1450, provides optical power supply light to the third communication transponder 1436 through a third optical power supply link 1452, and provides optical power supply light to the fourth communication transponder 1438 through a fourth optical power supply link 1454.

Figure 84B:
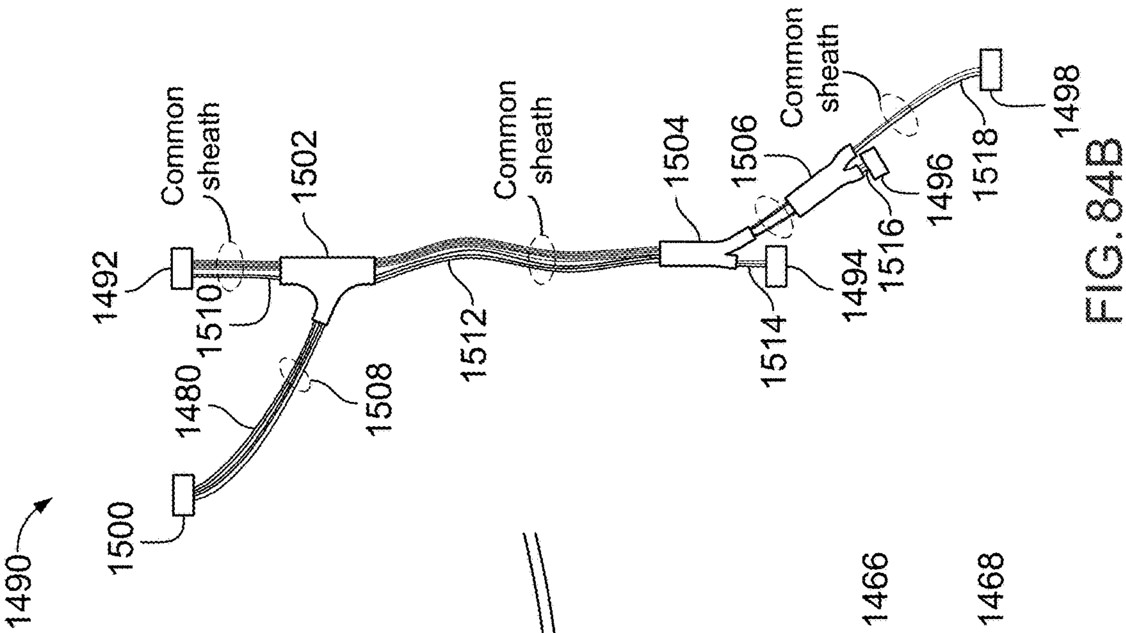
FIG. 84B is a diagram of an example of an optical cable assembly.
Figure 84A:
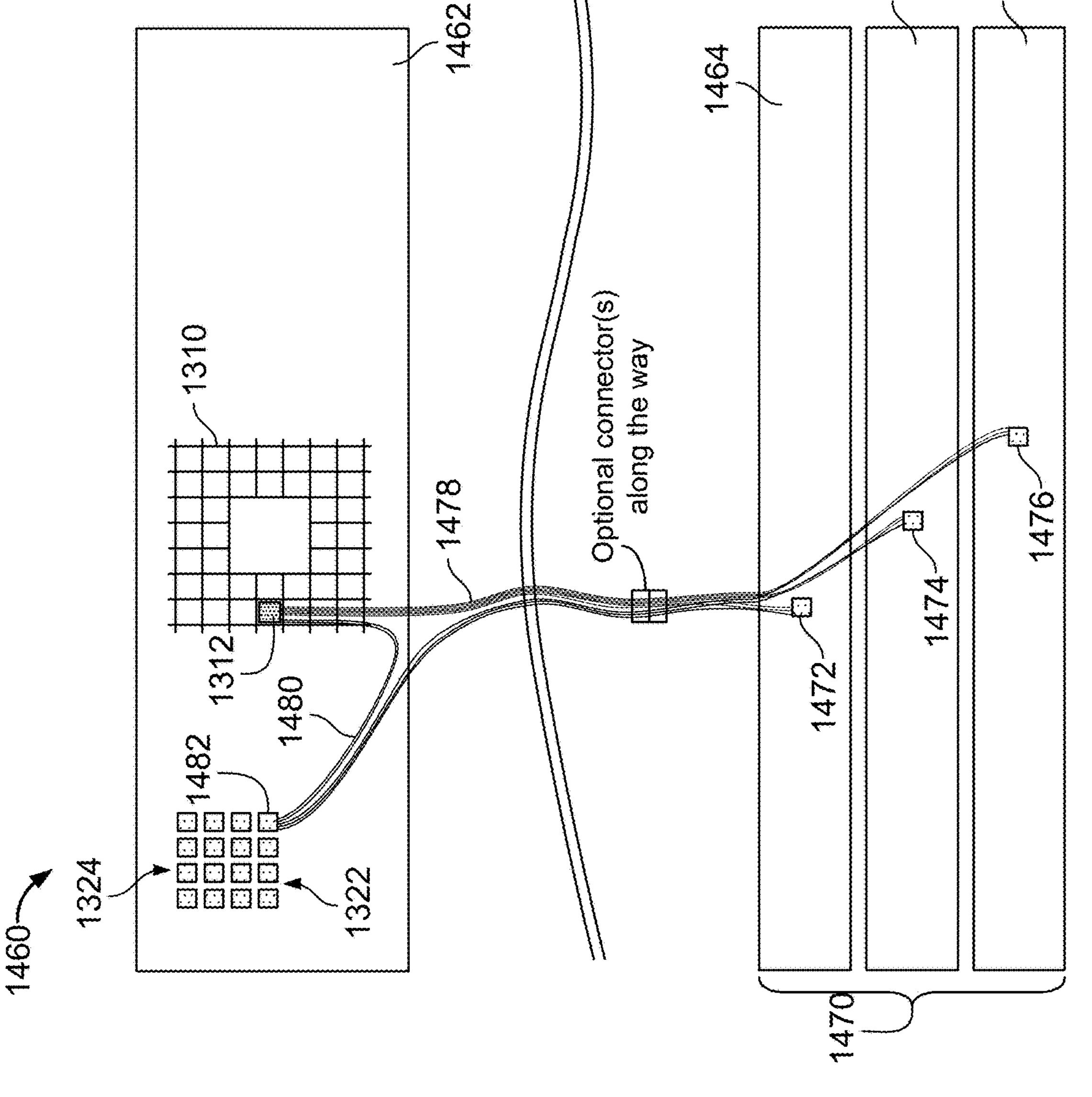
FIG. 84A is a diagram of an example of an optical communication system.

FIG. 84A is a diagram of an example of an optical communication system 1460 that includes a first switch box 1462 and a remote server array 1470 that includes a second switch box 1464, a third switch box 1466, and a fourth switch box 1468. The first switch box 1462 includes a vertical ASIC mount grid structure 1310, and a co-packaged optical module 1312 is attached to a receptor of the grid structure 1310. The second switch box 1464 includes a co-packaged optical module 1472, the third switch box 1466 includes a co-packaged optical module 1474, and the third switch box 1468 includes a co-packaged optical module 1476. The first co-packaged optical module 1312 communicates with the co-packaged optical modules 1472, 1474, 1476 through an optical fiber bundle 1478 that later branches out to the co-packaged optical modules 1472, 1474, 1476.

In one example embodiment, the first switch box 1462 includes an external optical power supply 1322 that provides optical power supply light through an optical connector array 1324. In another example embodiment, the optical power supply can be located external to switch box 1462 (cf. 1330, FIG. 80A). Optical fibers 1480 are optically coupled to an optical connector 1482, and the optical power supply 1322 sends optical power supply light through the optical connector 1482 and the optical fibers 1480 to the co-packaged optical modules 1312, 1472, 1474, 1476.

Figure 84C:
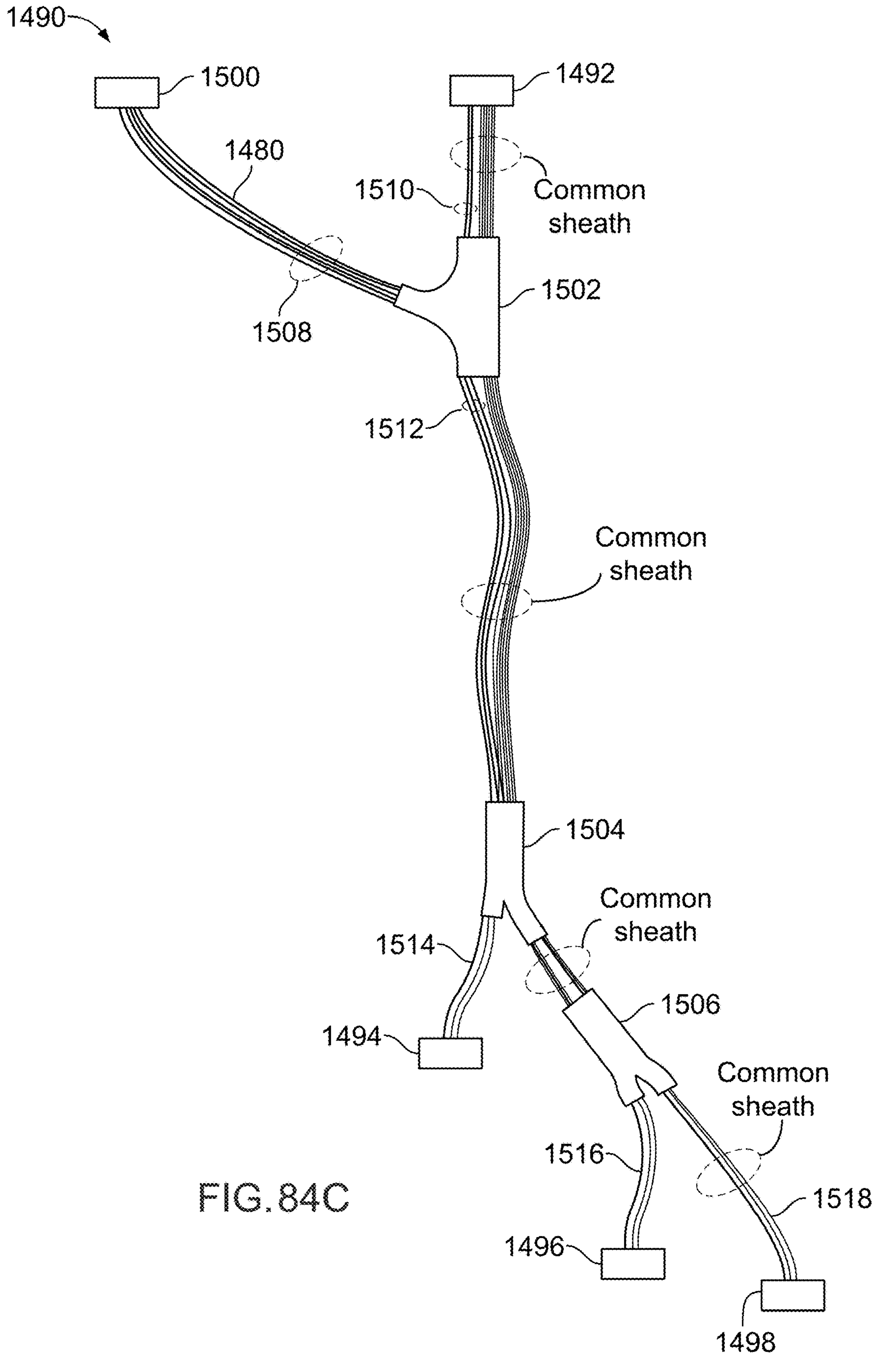
FIG. 84C is an enlarged diagram of the optical cable assembly of FIG. 84B.

FIG. 84B shows an example of an optical cable assembly 1490 that can be used to enable the optical power supply 1322 to provide optical power supply light to the co-packaged optical modules 1312, 1472, 1474, 1476, and enable the co-packaged optical module 1312 to communicate with the co-packaged optical modules 1472, 1474, 1476. The optical cable assembly 1490 includes a first optical fiber connector 1492, a second optical fiber connector 1494, a third optical fiber connector 1496, a fourth optical fiber connector 1498, and a fifth optical fiber connector 1500. The first optical fiber connector 1492 is configured to be optically coupled to the co-packaged optical module 1312. The second optical fiber connector 1494 is configured to be optically coupled to the co-packaged optical module 1472. The third optical fiber connector 1496 is configured to be optically coupled to the co-packaged optical module 1474. The fourth optical fiber connector 1498 is configured to be optically coupled to the co-packaged optical module 1476. The fifth optical fiber connector 1500 is configured to be optically coupled to the optical power supply 1322. FIG. 84C is an enlarged diagram of the optical cable assembly 1490.

Optical fibers that are optically coupled to the optical fiber connectors 1500 and 1492 enable the optical power supply 1322 to provide the optical power supply light to the co-packaged optical module 1312. Optical fibers that are optically coupled to the optical fiber connectors 1500 and 1494 enable the optical power supply 1322 to provide the optical power supply light to the co-packaged optical module 1472. Optical fibers that are optically coupled to the optical fiber connectors 1500 and 1496 enable the optical power supply 1322 to provide the optical power supply light to the co-packaged optical module 1474. Optical fibers that are optically coupled to the optical fiber connectors 1500 and 1498 enable the optical power supply 1322 to provide the optical power supply light to the co-packaged optical module 1476.

Optical fiber guide modules 1502, 1504, 1506, and common sheaths are provided to organize the optical fibers so that they can be easily deployed and managed. The optical fiber guide module 1502 is similar to the optical fiber guide module 1408 of FIG. 82B. The optical fiber guide modules 1504, 1506 are similar to the optical fiber guide module 1350 of FIG. 80B. The common sheaths gather the optical fibers in a bundle so that they can be more easily handled, and the optical fiber guide modules guide the optical fibers so that they extend in various directions toward the devices that need to be optically coupled by the optical cable assembly 1490. The optical fiber guide modules restrict bending of the optical fibers such that the bending radiuses are greater than minimum values specified by the optical fiber manufacturers to prevent excess optical light loss or damage to the optical fibers.

The optical fibers 1480 that extend from the include optical fibers that extend from the optical 1482 are surrounded and protected by a common sheath 1508. At the optical fiber guide module 1502, the optical fibers 1480 separate into a first group of optical fibers 1510 and a second group of optical fibers 1512. The first group of optical fibers 1510 extend to the first optical fiber connector 1492. The second group of optical fibers 1512 extend toward the optical fiber guide modules 1504, 1506, which together function as a 1:3 splitter that separates the optical fibers 1512 into a third group of optical fibers 1514, a fourth group of optical fibers 1516, and a fifth group of optical fibers 1518. The group of optical fibers 1514 extend to the optical fiber connector 1494, the group of optical fibers 1516 extend to the optical fiber connector 1496, and the group of optical fibers 1518 extend to the optical fiber connector 1498. In some examples, instead of using two 1:2 split optical fiber guide modules 1504, 1506, it is also possible to use a 1:3 split optical fiber guide module that has four ports, e.g., one input port and three output ports. In general, separating the optical fibers in a 1:N split (N being an integer greater than 2) can occur in one step or multiple steps.

Figure 85:
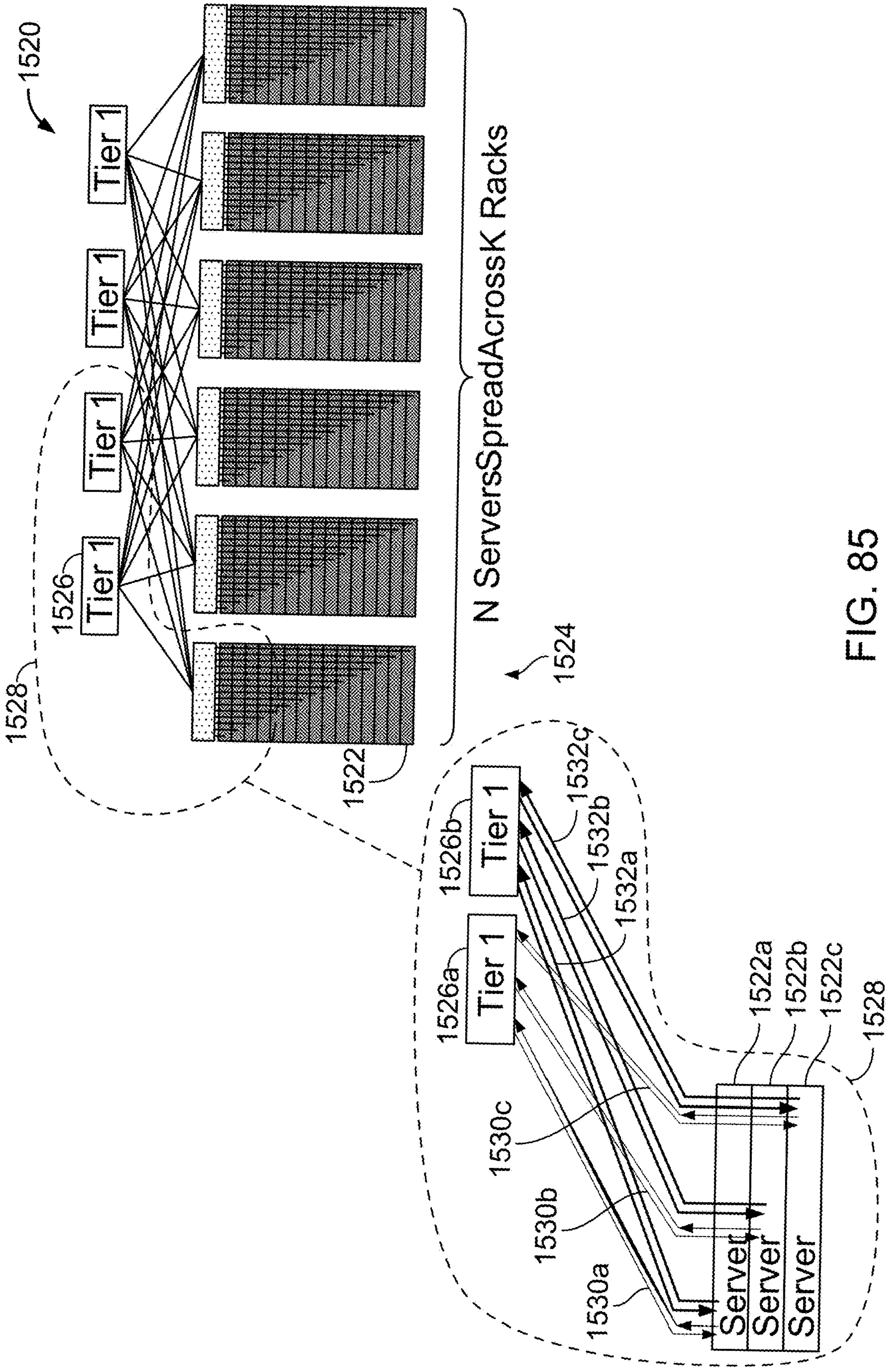
FIGS. 85, 86, 87A, and 87B are diagrams of examples of data processing systems.

FIG. 85 is a diagram of an example of a data processing system (e.g., data center) 1520 that includes N servers 1522 spread across K racks 1524. In this example, there are 6 racks 1524, and each rack 1524 includes 15 servers 1522. Each server 1522 directly communicates with a tier 1 switch 1526. The left portion of the figure shows an enlarged view of a portion 1528 of the system 1520. A server 1522*a* directly communicates with a tier 1 switch 1526*a* through a communication link 1530*a*. Similarly, servers 1522*b*, 1522*c* directly communicate with the tier 1 switch 1526*a* through communication links 1530*b*, 1530*c*, respectively. The server 1522*a* directly communicates with a tier 1 switch 1526*b* through a communication link 1532*a*. Similarly, servers 1522*b*, 1522*c* directly communicate with the tier 1 switch 1526*b* through communication links 1532*b*, 1532*c*, respectively. Each communication link can include a pair of optical fibers to allow bi-directional communication. The system 1520 bypasses the conventional top-of-rack switch and can have the advantage of higher data throughput. The system 1520 includes a point-to-point connection between every server 1522 and every tier 1 switch 1526. In this example, there are 4 tier 1 switches 1526, and 4 fiber pairs are used per server 1522 for communicating with the tier 1 switches 1526. Each tier-1 switch 1526 is connected to N servers, so there are N fiber pairs connected to each tier-1 switch 1526.

Figure 86:
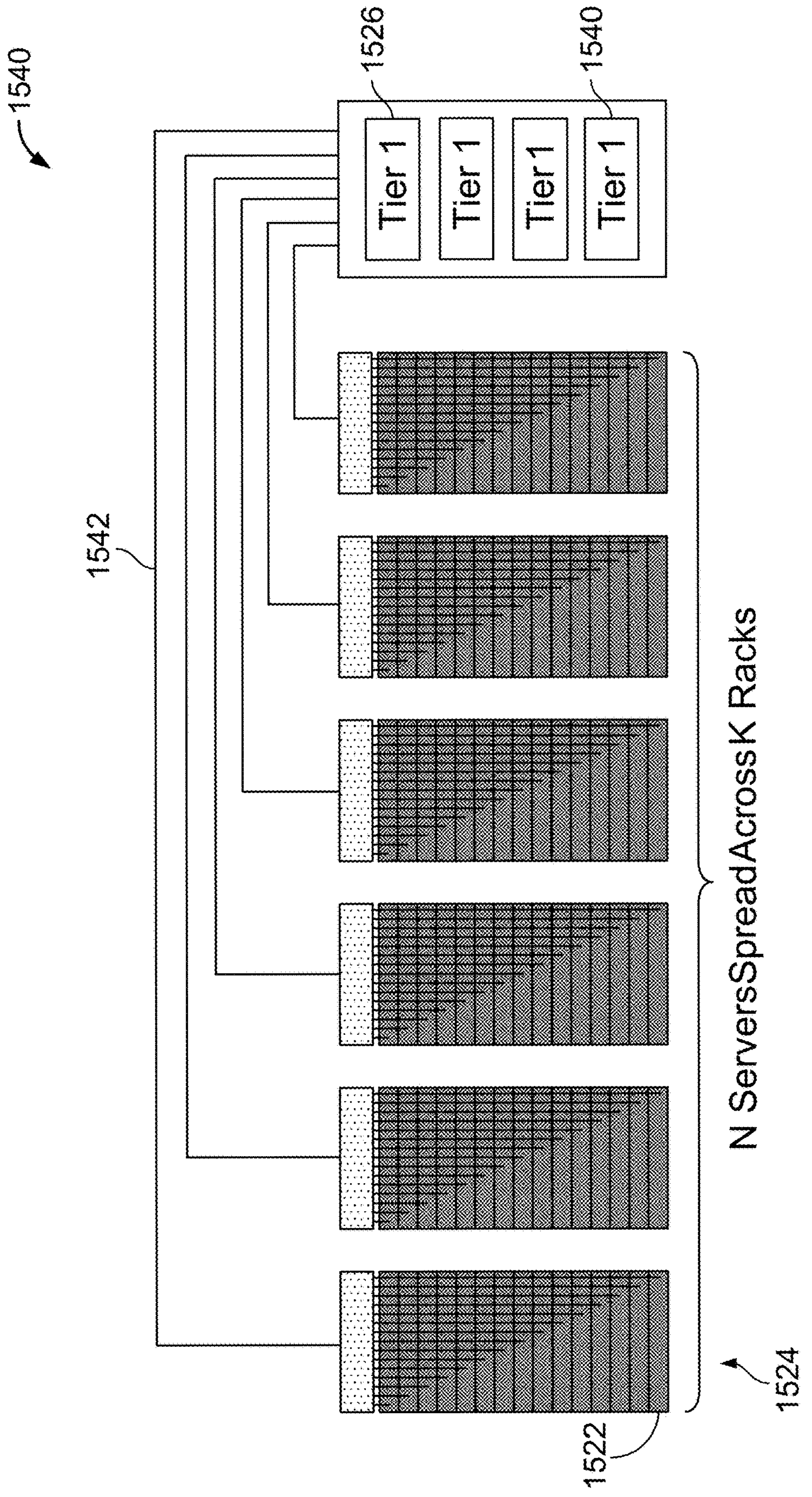

Referring to FIG. 86, in some implementations, a data processing system (e.g., data center) 1540 includes tier-1 switches 1526 that are co-located in a rack 1540 separate from the N servers 1522 that are spread across K racks 1524. Each server 1522 has a direct link to each of the tier-1 switches 1526. In some implementations, there is one fiber cable 1542 (or a small number<<N/K of fiber cables) from the tier-1 switch rack 1540 to each of the K server racks 1524.

Figure 87A:
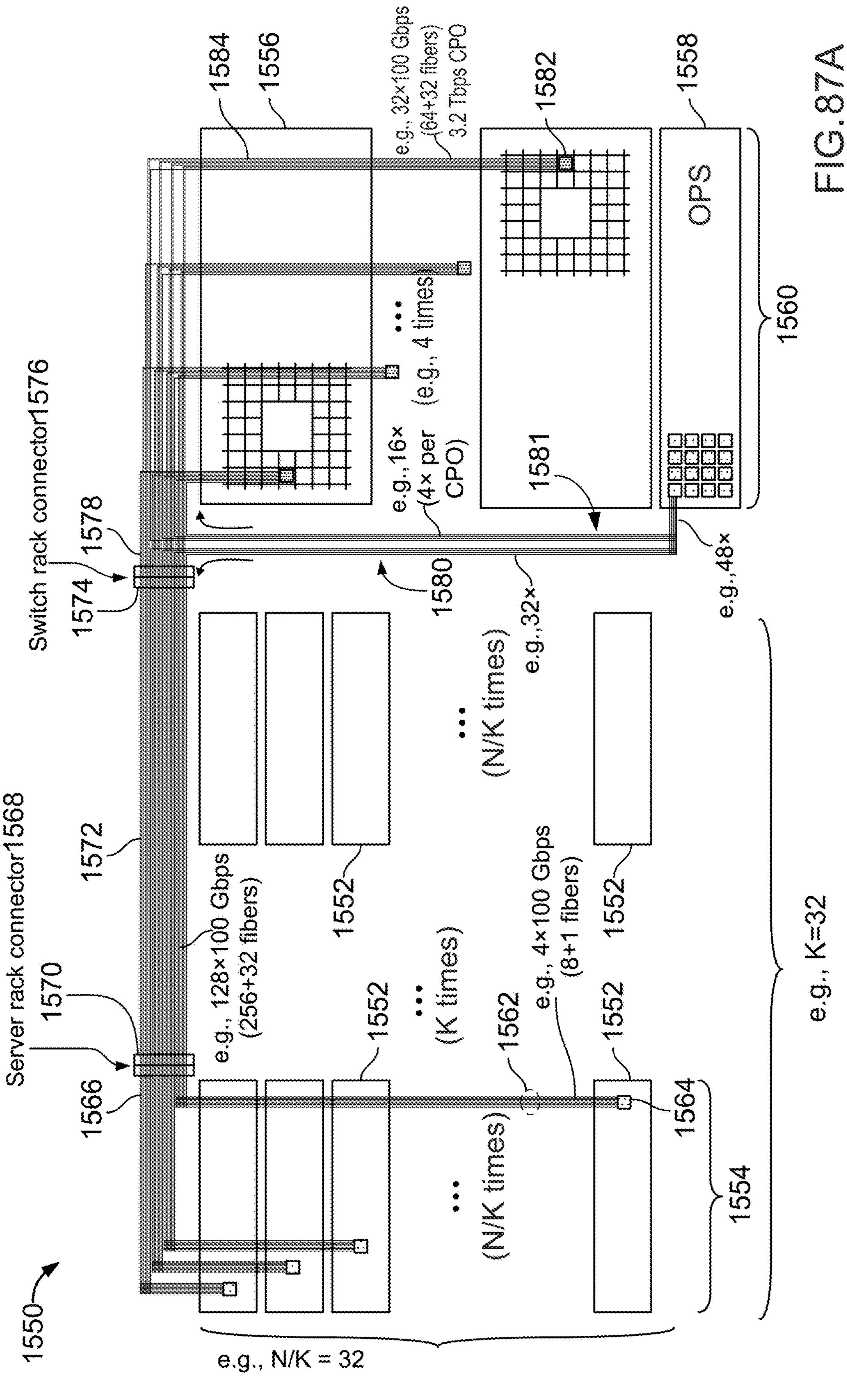

FIG. 87A is a diagram of an example of a data processing system 1550 that includes N=1024 servers 1552 spread across K=32 racks 1554, in which each rack 1554 includes N/K=1024/32=32 servers 1552. There are 4 tier-1 switches 1556 and an optical power supply 1558 that is co-located in a rack 1560.

Optical fibers connect the servers 1552 to the tier-1 switches 1556 and the optical power supply 1558. In this example, a bundle 1562 of 9 optical fibers is optically coupled to a co-packaged optical module 1564 of a server 1552, in which 1 optical fiber provides the optical power supply light, and 4 pairs of (a total of 8) optical fibers provide 4 bi-directional communication channels, each channel having a 100 Gbps bandwidth, for a total of 4×100 Gbps bandwidth in each direction. Because there are 32 servers 1552 in each rack 1554, there are a total of 256+32=288 optical fibers that extend from each rack 1554 of servers 1552, in which 32 optical fibers provide the optical power supply light, and 256 optical fibers provide 128 bi-directional communication channels, each channel having a 100 Gbps bandwidth.

For example, at the server rack side, optical fibers 1566 (that are connected to the servers 1552 of a rack 1554) terminate at a server rack connector 1568. At the switch rack side, optical fibers 1578 (that are connected to the switch boxes 1556 and the optical power supply 1558) terminate at a switch rack connector 1576. An optical fiber extension cable 1572 is optically coupled to the server rack side and the switch rack side. The optical fiber extension cable 1572 includes 256+32=288 optical fibers. The optical fiber extension cable 1572 includes a first optical fiber connector 1570 and a second optical fiber connector 1574. The first optical fiber connector 1570 is connected to the server rack connector 1568, and the second optical fiber connector 1574 is connected to the switch rack connector 1576. At the switch rack side, the optical fibers 1578 include 288 optical fibers, of which 32 optical fibers 1580 are optically coupled to the optical power supply 1558. The 256 optical fibers that carry 128 bi-directional communication channels (each channel having a 100 Gbps bandwidth in each direction) are separated into four groups of 64 optical fibers, in which each group of 64 optical fibers is optically coupled to a co-packaged optical module 1582 in one of the switch boxes 1556. The co-packaged optical module 1582 is configured to have a bandwidth of 32×100 Gbps=3.2 Tbps in each direction (input and output). Each switch box 1556 is connected to each server 1552 of the rack 1554 through a pair of optical fibers that carry a bandwidth of 100 Gbps in each direction.

The optical power supply 1558 provides optical power supply light to co-packaged optical modules 1582 at the switch boxes 1556. In this example, the optical power supply 1558 provides optical power supply light through 4 optical fibers to each co-packaged optical module 1582, so that a bundle 1581 having a total of 16 optical fibers is used to provide the optical power supply light to the 4 switch boxes 1556. A bundle of optical fibers 1584 is optically coupled to the co-packaged optical module 1582 of the switch box 1556. The bundle of optical fibers 1584 includes 64+16=80 fibers. In some examples, the optical power supply 1558 can provide additional optical power supply light to the co-packaged optical module 1582 using additional optical fibers. For example, the optical power supply

1558 can provide optical power supply light to the co-packaged optical module 1582 using 32 optical fibers with built-in redundancy.

In some implementations, the server rack on which the servers 1552 are mounted is provided with a server rack connector 1568 attached to the server rack chassis, and an optical fiber cable system that includes the optical fibers 1566 optically connected to the server rack connector 1568, in which the optical fibers 1566 divides into separate bundles 1562 of optical fibers that are optically connected to the servers 1552.

Similarly, the server rack on which the switch boxes 1556 are mounted is provided with switch rack connectors 1576 attached to the switch rack chassis, and corresponding optical fiber cable systems that each includes the optical fibers 1578 optically connected to the corresponding switch rack connector 1576, in which the optical fibers 1578 divides into separate bundles of optical fibers that are optically connected to the switch boxes 1556 and the optical power supply 1558. For example, a switch rack that is configured to connect up to 32 racks of servers 1552 can include 32 built-in switch rack connectors 1576, and 32 corresponding optical fiber cable systems that are optically connected to 32 co-packaged optical modules in each of the switch boxes 1556, and 32 laser sources in the optical power supply 1556.

When an operator sets up a first rack of servers 1552, the operator connects the bundles 1562 of optical fibers (that is provided with the first server rack) to the servers 1552 in the first rack, connects the optical fiber connector 1570 of a first optical fiber extension cable 1572 to the server rack connector 1568 at the first server rack, and connects the optical fiber connector 1574 of the first optical fiber extension cable 1572 to a first one of the switch rack connectors 1578 at the switch rack. When the operator sets up a second rack of servers 1552, the operator connects the bundles 1562 of optical fibers (that is provided with the second server rack) to the servers 1552 in the second rack, connects the optical fiber connector 1570 of a second optical fiber extension cable 1572 to the server rack connector 1568 at the second server rack, and connects the optical fiber connector 1574 of the second optical fiber extension cable 1572 to a second one of the switch rack connectors 1578, and so forth.

In some implementations, the optical power supply 1558 can be any optical power supply described above, and the power supply light can include any control signals and/or optical frame templates described above.

Figure 87B:
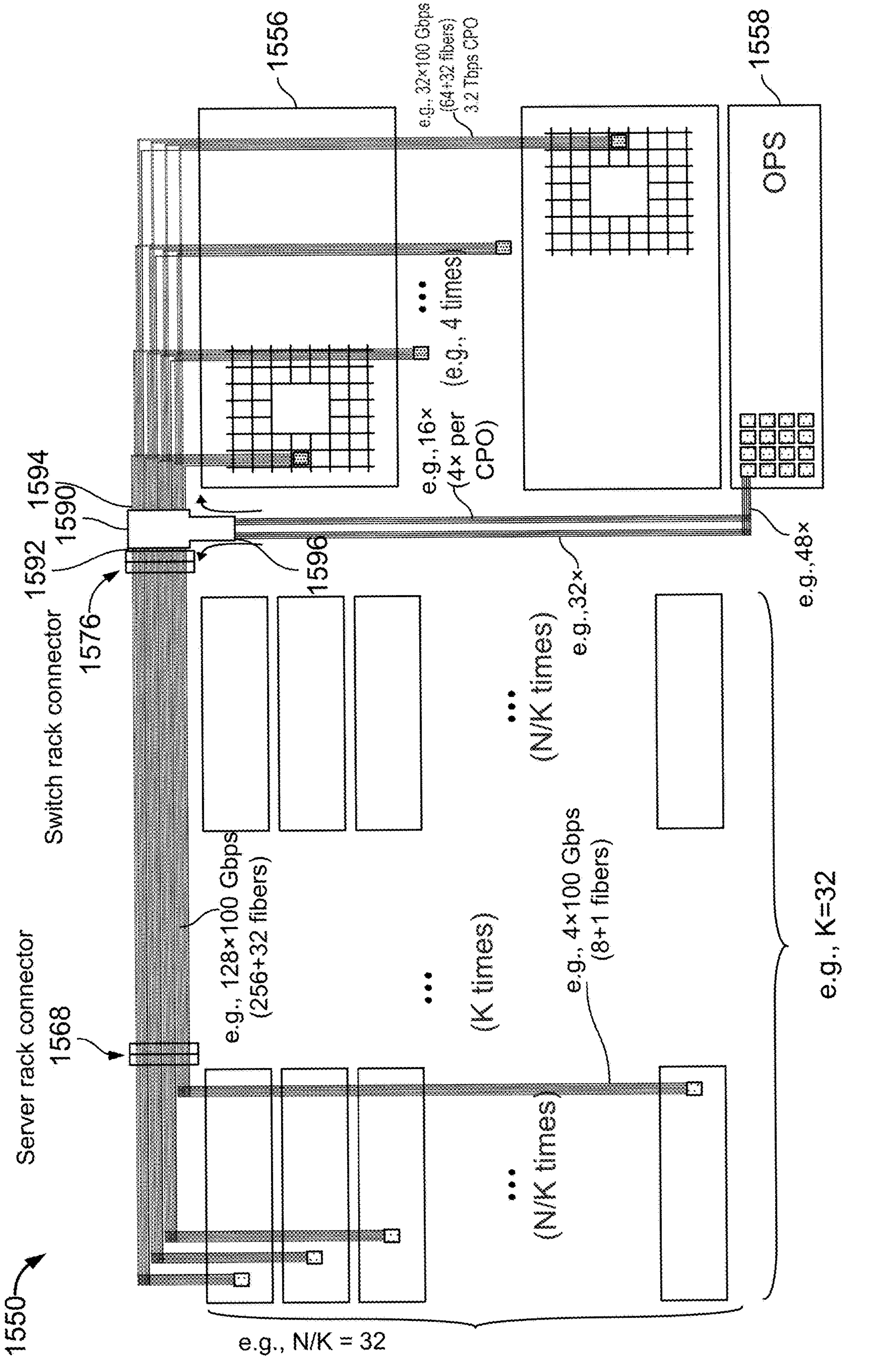

Referring to FIG. 87B, the data processing system 1550 includes an optical fiber guide module 1590 that helps organize the optical fibers so that they are directed to the appropriate directions. The optical fiber guide module 1590 also restricts bending of the optical fibers to be within the specified limits to prevent excess optical light loss or damage to the optical fibers. The optical fiber guide module 1590 includes a first port 1592, a second port 1594, and a third port 1596. The optical fibers that extend outward from the first port 1592 are optically coupled to the switch rack connector 1576. The optical fibers that extend outward from the second port 1594 are optically coupled to the switch boxes. The optical fibers that extend outward from the third port 1596 are optically coupled to the optical power supply 1558.

Figure 136B:
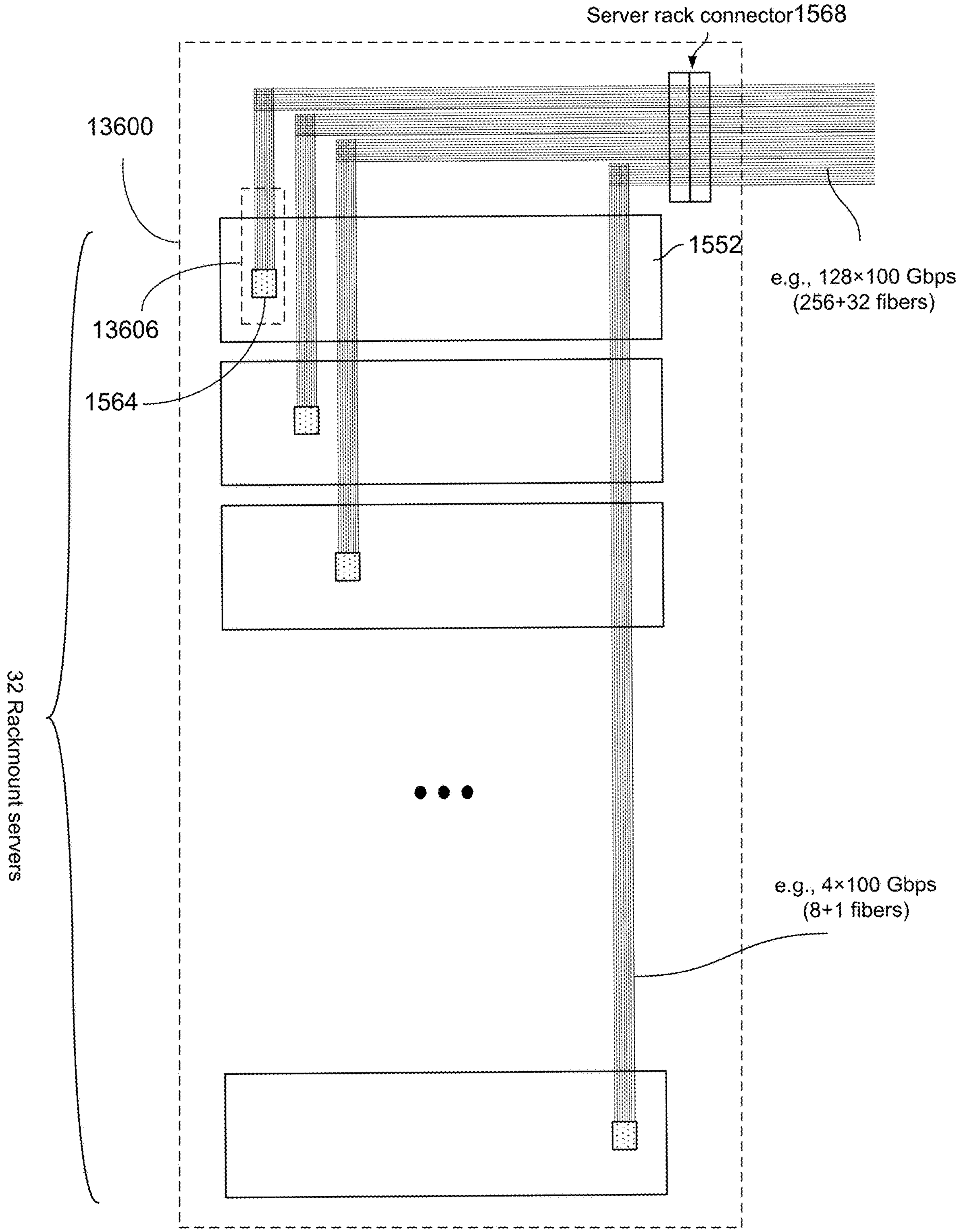
Figure 136C:
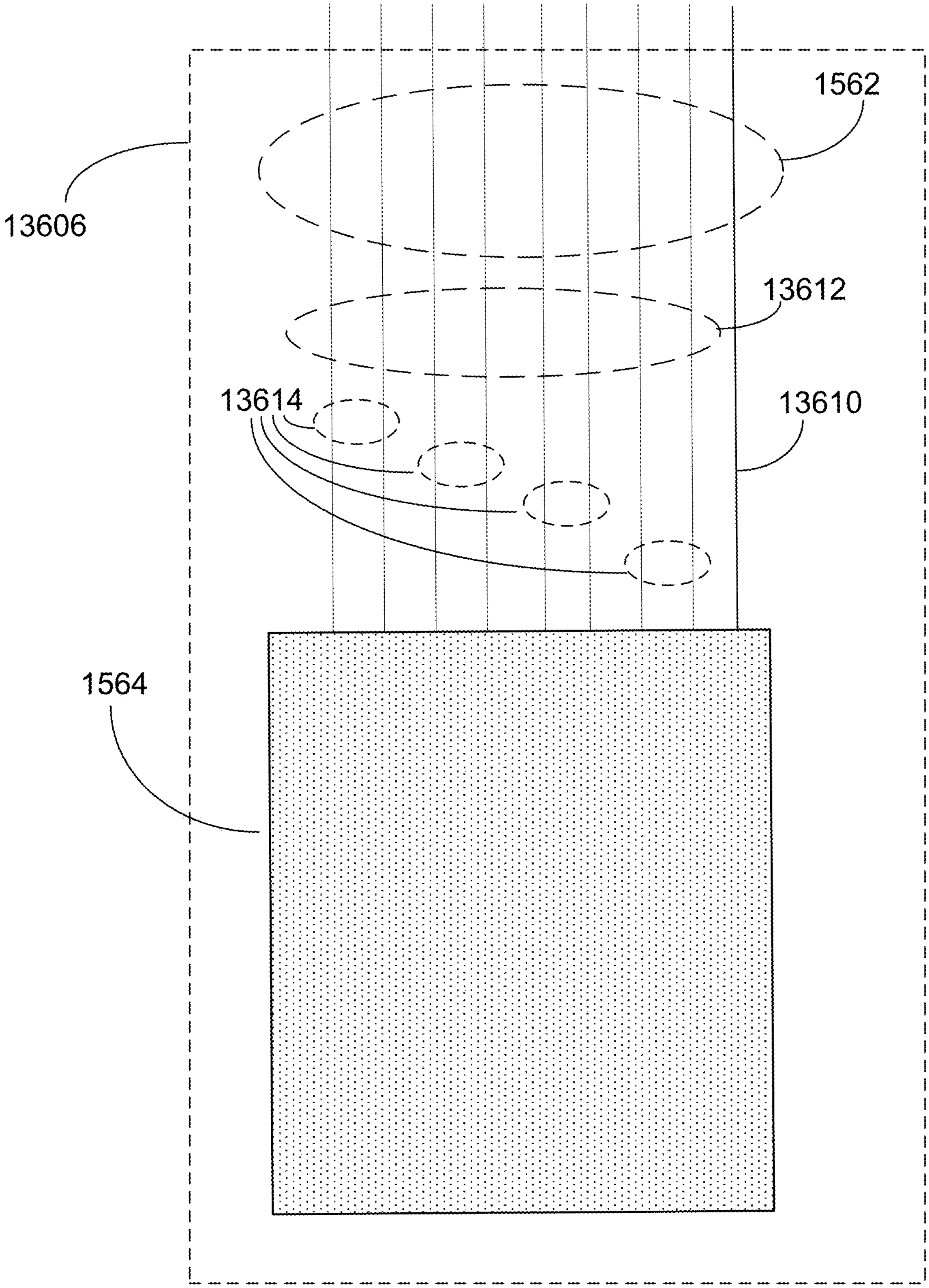
Figure 136D:
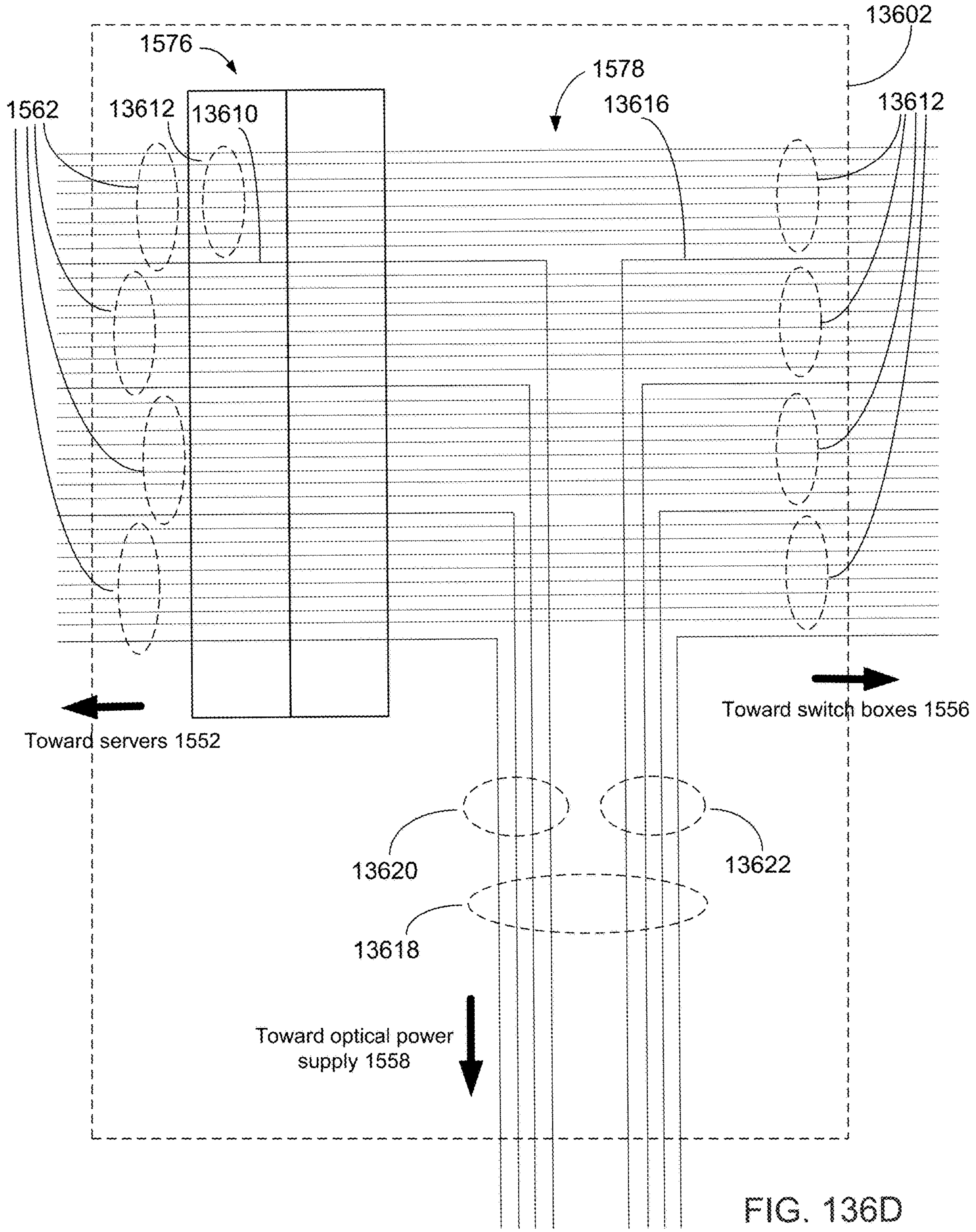

The following figures show enlarged portions of FIG. 87A to more clearly illustrate how the optical power supply is distributed from the optical power supply 1558 to the co-packaged optical modules 1564, and how the data from the servers 1552 are switched by the switch boxes 1556. FIG. 136A shows the same modules as FIG. 87A. FIGS. 136B, 136D, and 136F show enlarged portions 13600, 13602, and 13604, respectively, of the data processing system 1550 shown in FIG. 136A. FIG. 136C shows an enlarged portion 13606 of the portion 13600 in FIG. 136B.

Referring to FIGS. 136B and 136C, the bundle 1562 of 9 optical fibers is optically coupled to the co-packaged optical module 1564 of the server 1552. The bundle 1562 of 9 optical fibers includes a bundle 13162 of 8 data optical fibers and 1 power supply optical fiber 13610 that provides the power supply light. In this example, the bundle 13162 of 8 data fibers includes 4 pairs 13612 of optical fibers that provide 4 bi-directional communication channels, each channel having a 100 Gbps bandwidth, for a total of 4×100 Gbps bandwidth in each direction. In FIGS. 87A, 87B, 136A, 136B, and 136C, the optical fiber connectors are not shown. The optical fiber connectors are shown in FIG. 137.

Referring to FIG. 136D, 32 bundles 1562 of optical fibers extend from the switch rack connector 1576 toward the servers 1552, in which each bundle 1562 includes 9 optical fibers as shown in FIG. 136C. Only 4 bundles 1562 of optical fibers are shown in the figure. The bundle 1562 of 9 optical fibers includes a bundle 13162 of 8 data optical fibers and 1 power supply optical fiber 13610. The bundle 13612 of 8 data fibers extend from the switch rack connector 1576 toward the switch boxes 1556. The power supply optical fiber 13610 extend towards the optical power supply 1558. Power supply optical fibers 13616 extend from the optical power supply 1558 toward the switch boxes 1556 and are used to carry power supply light to the switch boxes 1556. In this example, a bundle 13618 of 48 power supply optical fibers are used to carry power supply light from the optical power supply 1558 to the servers 1552 and the switch boxes 1556. The bundle 13618 of power supply optical fibers includes a bundle 13620 of 32 power supply optical fibers 13612 that provide power supply light to the 32 servers 1552, and a bundle 13622 of 16 power supply optical fibers 13616 that provide power supply light to the 4 switch boxes 1556, in which each switch box 1556 receives power supply light from 4 power supply optical fibers 13616.

Figure 136E:
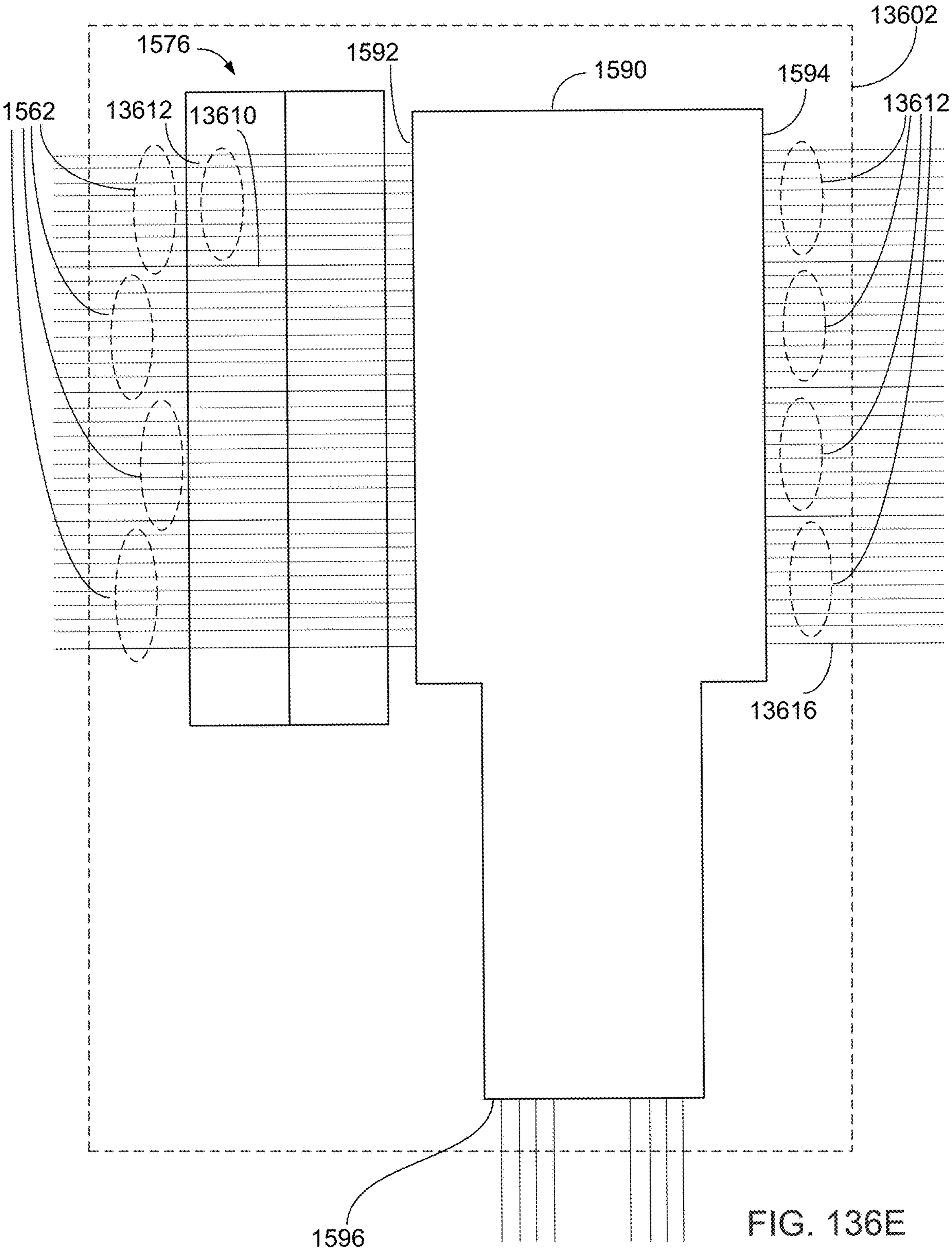
Figure 136F:
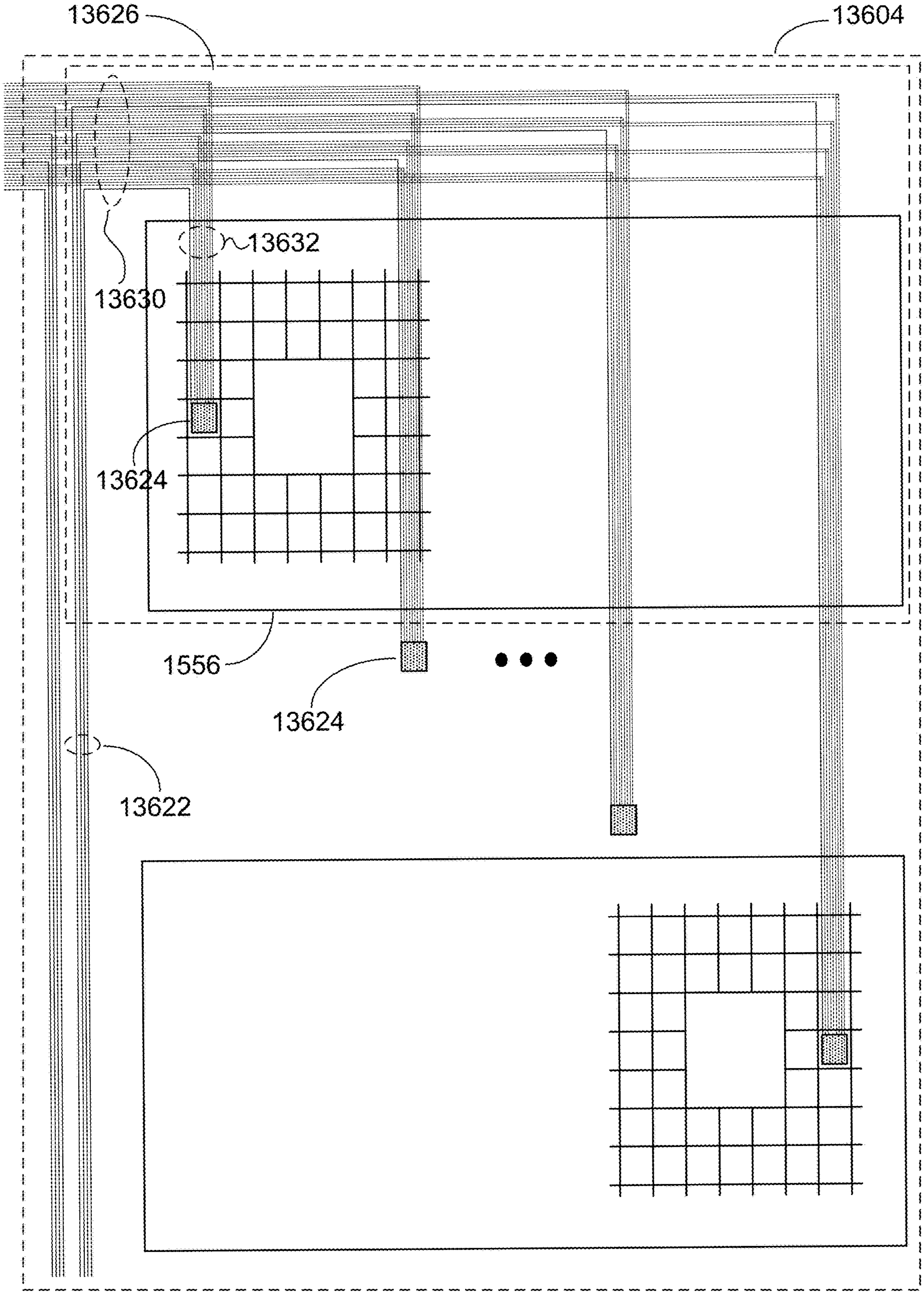

FIG. 136E shows the portion 13602 with the optical fiber guide module 1590. The optical fiber guide module 1590 includes the first port 1592, the second port 1594, and the third port 1596. The optical fibers that extend outward from the first port 1592 are optically coupled to the switch rack connector 1576. The optical fibers that extend outward from the second port 1594 are optically coupled to the switch boxes 1556. The optical fibers that extend outward from the third port 1596 are optically coupled to the optical power supply 1558.

Figure 136G:
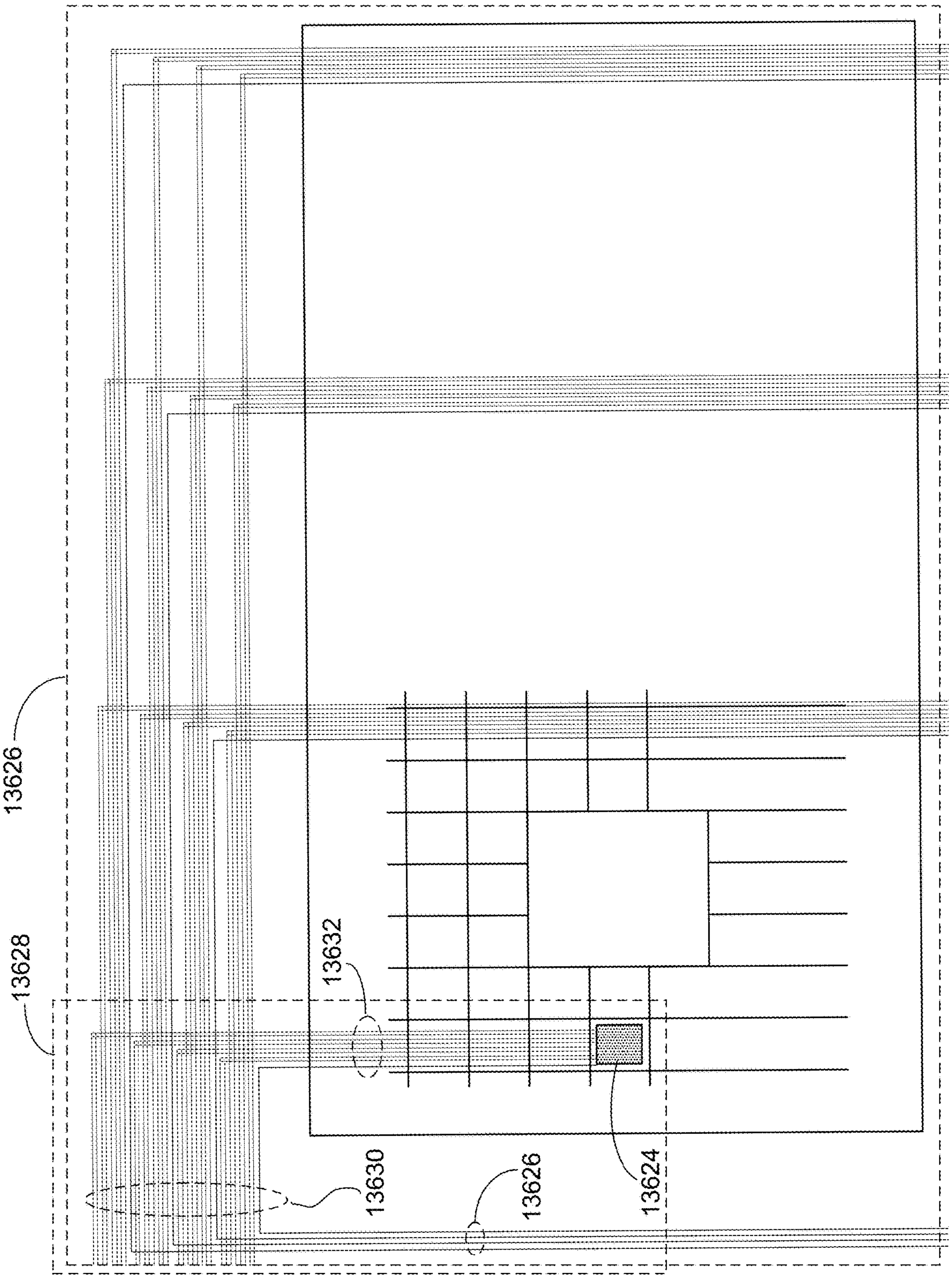
Figure 136H:
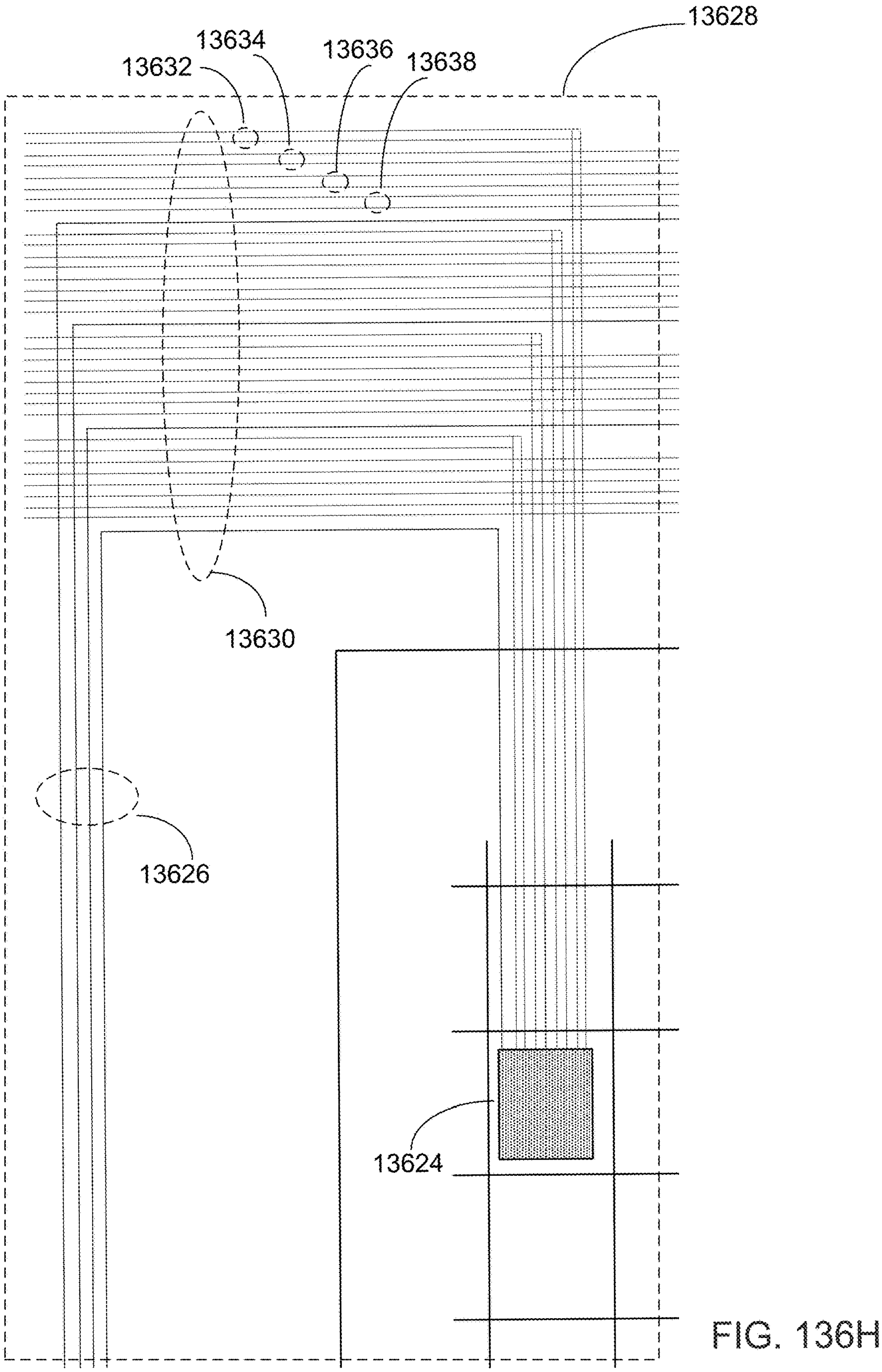

FIG. 136F shows an enlarged view of the portion 13604 of the data processing system 1550 in FIG. 136A. FIG. 136G shows an enlarged portion 13626 of the portion 13604 in FIG. 136F. FIG. 136H shows an enlarged portion 13628 of the portion 13626 in FIG. 136G. Referring to FIGS. 136F, 136G, and 136H, in this example, a bundle 13630 of optical fibers includes the 32 bundles 13612 (see FIG. 136D) of data optical fibers optically connected to the 32 servers 1552, respectively, and the bundle 13622 (see FIG. 136D) of 16 power supply optical fibers optically connected to the optical power supply 1558. Each bundle 13612 of data optical fibers includes 8 data optical fibers. The 8 data optical fibers of the first bundle 13612 (connected to the first server 1552) are optically connected to the 4 switch boxes 1556, in which a first pair 13632 of data optical fibers are optically connected to a first co-packaged optical module 13624 of the first switch box 1556, a second pair 13634 of data optical fibers are optically connected to a first co-packaged optical module

13624 of the second switch box 1556, a third pair 13636 of data optical fibers are optically connected to a first co-packaged optical module 13624 of the third switch box 1556, and a fourth pair 13638 of data optical fibers are optically connected to a first co-packaged optical module 13624 of the fourth switch box 1556. Each co-packaged optical module 13624 is also optically connected to 4 power supply optical fibers 13616 (see FIG. 136D). Each co-packaged optical module 13624 is optically connected to a bundle 13632 of optical fibers that include 64 data optical fibers (optically connected to the 32 servers 1552) and 4 power supply optical fibers (connected to the optical power supply 1558).

The 8 data optical fibers of the second bundle 13612 (optically connected to the second server 1552) are optically connected to the 4 switch boxes 1556 in a similar manner, in which a first pair of data optical fibers are optically connected to a second co-packaged optical module of the first switch box 1556, a second pair of data optical fibers are optically connected to a second co-packaged optical module of the second switch box 1556, a third pair of data optical fibers are optically connected to a second co-packaged optical module of the third switch box 1556, and a fourth pair of data optical fibers are optically connected to a second co-packaged optical module of the fourth switch box 1556, and so forth.

For example, each co-packaged optical module 13624 in the switch box 1556 is optically connected to a total of 64 data optical fibers from the 32 servers 1552. Each co-packaged optical module 13624 is optically connected to a pair of data optical fibers from each server 1552, allowing the co-packaged optical module 13624 to be in optical communication with every one of the 32 servers 1552 in a server rack. For example, each switch box 1556 can include 32 co-packaged optical modules 13624, in which each co-packaged optical module 13624 is in optical communication with 32 servers in a server rack, and different co-packaged optical modules 13624 are in optical communication with the servers in different server racks. This way, each server 1552 is in optical communication with each of the 4 switch boxes 1556, and each switch box 1556 is in optical communication with every server 1552 in every server rack.

Each co-packaged optical module 13624 in the switch box 1556 is also optically connected to 4 power supply optical fibers 13616 (see FIG. 136D). Each co-packaged optical module 13624 can be optically connected to any number of power supply optical fibers, depending on the amount of power supply light needed for the operation of optical modulators in the co-packaged optical module 13624. For example, each co-packaged optical module can be optically connected through multiple power supply optical fibers to multiple optical power supplies to provide redundancy and increase reliability. The co-packaged optical modules 13624 of the switch boxes 1556 receive power supply light from a remote optical power supply 1558 that is located outside of the housings of the switch boxes 1556 and optically connected to the co-packaged optical modules 13624 through power supply optical fibers 13616. In some implementations, this allows management and service of the optical power supply 1558 to be independent of the switch boxes 1556. The optical power supply 1558 can have a thermal environment that is different from that of the switch boxes 1556. For example, the optical power supply 1558 can be placed in an enclosure that is equipped with an active thermal control system to ensure that the laser sources operate in an environment with a stable temperature. This way, the laser sources are not affected by the thermal fluctuations caused by the operations of the switch boxes 1556.

FIGS. 136A to 136H show the optical fiber connections between the switch boxes 1556 and one rack of 32 servers 1552. The other racks of servers can be optically connected to the switch boxes 1556 and the optical power supply 1558 in a similar manner. This way, each switch box 1556 is capable of switching or transmitting data between any two servers 1552 among the multiple racks of servers.

FIGS. 87A, 87B, and 136A to 136H show an example of optical fiber cable configuration for optically connecting the co-packaged optical modules or optical interfaces of multiple servers to co-packaged optical modules or optical interfaces of switch boxes, and providing power supply light from a remote optical power supply to the co-packaged optical modules of the servers and the switch boxes. Referring to FIG. 137, in some implementations, an optical fiber cable 13700 configured to optically connect the servers 1552, the switch boxes 1556, and the optical power supply 1558 includes three main segments: (i) a first segment 13702 that includes optical fiber connectors 13708 that are optically coupled to the co-packaged optical modules of the servers 1552, (ii) a second segment 13704 includes optical fiber connectors 13710 and 13722 that are optically coupled to the co-packaged optical modules of the switch boxes 1556 and the optical power supply 1558, and (iii) a third segment 13706 that is optically connected between the first segment 13702 and the second segment 13704. The third segment 13706 functions as an optical fiber extension cable.

In some implementations, the first segment 13702 includes an optical fiber connector 13712 that is optically coupled to an optical fiber connector 13714 of the third segment 13706. The first segment 13702 includes 32 optical fiber connectors 13708 that are optically coupled to 32 servers 1552. The optical fiber connector 13712 includes 32 power supply fiber ports, 128 transmitter fiber ports, and 128 receiver fiber ports, and each optical fiber connector 13708 includes 1 power supply fiber port, 4 transmitter fiber ports, and 4 receiver fiber ports. The second segment 13704 includes an optical fiber connector 13718 that is optically coupled to an optical fiber connector 13720 of the third segment 13706.

In some implementations, the second segment 13704 includes 4 optical fiber connectors 13710 that are optically coupled to 4 switch boxes 1556 and 1 optical fiber connector 13722 that is optically coupled to the optical power supply 1558. The optical fiber connector 13720 includes 32 power supply fiber ports, 128 transmitter fiber ports, and 128 receiver fiber ports. The optical fiber connector 13722 includes 48 power supply fiber ports. Each optical fiber connector 13710 includes 4 power supply fiber ports, 32 transmitter fiber ports, and 32 receiver fiber ports.

The number of power supply fiber ports, transmitter fiber ports, and receiver fiber ports described above are used as examples only, it is possible to have different numbers of power supply fiber ports, transmitter fiber ports, and receiver fiber ports depending on application. It is also possible to have different numbers of optical fiber connectors 13708, 13710, and 13722 depending on application.

For example, when a data center is set up to include a first rack of servers 1552 and a rack of switch boxes 1556 and optical power supply 1558, the optical fiber cable 13700 can be used to optically connect the servers 1552 in the first rack to the switch boxes 1556 and the optical power supply 1558. When a second rack of servers 1552 is set up in the data center, another optical fiber cable 13700 can be used to optically connect the servers 1552 in the second rack to the switch boxes 1556 and the optical power supply 1558, and so forth.

Referring to FIG. 138, in some implementations, a data processing system 13800 uses wavelength division multiplexing (WMD) to transmit signals having multiple wavelengths (e.g., w1, w2, w3, w4) in the optical fibers, thereby reducing the number of optical fibers needed between the servers 1552 and the switch boxes 1556 for a given bandwidth, or increasing the bandwidth for a given number of optical fibers. In this example, "w1" represents the first wavelength, "w2" represents the second wavelength, "w3" represents the third wavelength, and "w4" represents the fourth wavelength, and so forth.

In this example, the data processing system 13800 includes N=1024 servers 13802 spread across K=32 racks 13804, in which each rack 13804 includes N/K=1024/32=32 servers 13802. There are 4 tier-1 switches 13806 and an optical power supply 13808 that is co-located in a rack 13810.

Optical fibers connect the servers 13802 to the tier-1 switches 13806 and the optical power supply 13808. In this example, a bundle 13812 of 3 optical fibers is optically coupled to a co-packaged optical module 113814 of a server 13802, in which 1 optical fiber provides the optical power supply light, and 1 pair of optical fibers provide 4 bi-directional communication channels by using 4 different wavelengths per fiber, each channel having a 100 Gbps bandwidth, for a total of 4×100 Gbps bandwidth in each direction. Because there are 32 servers 13802 in each rack 13804, there are a total of 64+32=96 optical fibers that extend from each rack 13804 of servers 13802, in which 32 optical fibers provide the optical power supply light, and 64 optical fibers provide 128 bi-directional communication channels using 4 different wavelengths, each channel having a 100 Gbps bandwidth.

For example, at the server rack side, optical fibers 13816 (that are connected to the servers 153802 of a rack 13804) terminate at a server rack connector 13818. At the switch rack side, optical fibers 13820 (that are connected to the switch boxes 13806 and the optical power supply 13808) terminate at a switch rack WDM translator 13822. The switch rack WDM translator 13822 includes 4×4 wavelength/space shuffle matrices. A 4×4 wavelength/space shuffle matrix shuffles the WDM signals between 4 servers and 4 switch boxes 13806 so that (i) 4 signals having 4 different wavelengths from a sever 13802 are sent to 4 switch boxes 13806, (ii) 4 single-wavelength signals from 4 different servers 13802 are sent to a single switch box 13806, (iii) 4 signals having 4 different wavelengths from a switch box 13806 are sent to 4 different servers 13802, and (iv) 4 single-wavelength signals from 4 different switch boxes 13806 are sent to a single server 13802. The switch rack WDM translator 13822 is described in more detail below.

An optical fiber extension cable 13824 is optically coupled to the server rack side and the switch rack side. The optical fiber extension cable 13824 includes 64+32=96 optical fibers. The optical fiber extension cable 13824 includes a first optical fiber connector 13826 and a second optical fiber connector 13828. The first optical fiber connector 13826 is connected to the server rack connector 13818, and the second optical fiber connector 13828 is connected to the switch rack WDM translator 13822. At the switch rack side, the optical fibers 13820 include 72 optical fibers, of which 8 optical fibers 13832 are optically coupled to the optical power supply 13808. The 64 optical fibers that carry 128 bi-directional communication channels (each channel having a 100 Gbps bandwidth in each direction) are separated into four groups of 16 optical fibers, in which each group of 16 optical fibers is optically coupled to a co-packaged optical module 13834 in one of the switch boxes 13806. The co-packaged optical module 13834 is configured to have a bandwidth of 32×100 Gbps=3.2 Tbps in each direction (input and output). Each switch box 13806 is connected to each server 13802 of the rack 13804 through a pair of optical fibers that carry a bandwidth of 100 Gbps in each direction. In this example, each switch box 13806 is capable of switching data from the 32 servers 13802, and each switch box 13806 has a 32×32×100 Gbps=102 Tbps bandwidth.

The optical power supply 13810 provides optical power supply light to co-packaged optical modules 13834 at the switch boxes 13806. In this example, the optical power supply 13808 provides optical power supply light through 2 optical fibers to each co-packaged optical module 13834, so that a total of 8 optical fibers are used to provide the optical power supply light to the 4 switch boxes 13834. A bundle of optical fibers 13836 is optically coupled to the co-packaged optical module 13834 of the switch box 13806. The bundle of optical fibers 13836 includes 16+2=18 fibers. In some examples, the optical power supply 13808 can provide additional optical power supply light to the co-packaged optical module 13834 using additional optical fibers. For example, the optical power supply 13808 can provide optical power supply light to the co-packaged optical module 13834 using 4 optical fibers with built-in redundancy.

An optical fiber guide module, similar to the module 1590 in FIG. 87B, can be provided to help organize the optical fibers so that they are directed to the appropriate directions.

In some implementations, the server rack on which the servers 13802 are mounted is provided with a server rack connector 13818 attached to the server rack chassis, and an optical fiber cable system that includes the optical fibers 13816 optically connected to the server rack connector 13818, in which the optical fibers 13816 divide into separate bundles 13812 of optical fibers that are optically connected to the servers 13802.

In some implementations, the server rack on which the switch boxes 13806 are mounted is provided with switch rack WDM translators 13822 attached to the switch rack chassis, and corresponding optical fiber cable systems that each includes the optical fibers 13820 optically connected to the corresponding switch rack WDM translator 13822, in which the optical fibers 13820 divide into separate bundles of optical fibers that are optically connected to the switch boxes 13806 and the optical power supply 13808. For example, a switch rack that is configured to connect up to 32 racks of servers 13802 can include 32 built-in switch rack WDM translators 13822, and 32 corresponding optical fiber cable systems that are optically connected to 32 co-packaged optical modules in each of the switch boxes 13806, and 32 laser sources in the optical power supply 13808.

When an operator sets up a first rack of servers 13802, the operator connects the bundles 13812 of optical fibers (that is provided with the first server rack) to the servers 13802 in the first rack, connects the optical fiber connector 13826 of a first optical fiber extension cable 13824 to the server rack connector 13826 at the first server rack, and connects the optical fiber connector 13828 of the first optical fiber extension cable 13824 to a first one of the switch rack WDM translators 13822 at the switch rack. When the operator sets up a second rack of servers 13802, the operator connects the bundles 13812 of optical fibers (that is provided with the second server rack) to the servers 13802 in the second rack, connects the optical fiber connector 13826 of a second optical fiber extension cable 13824 to the server rack connector 13818 at the second server rack, and connects the optical fiber connector 13828 of the second optical fiber extension cable 13824 to a second one of the switch rack WDM translators 13822, and so forth.

In some implementations, the optical power supply 13808 can be any optical power supply described above, and the power supply light can include any control signals and/or optical frame templates described above.

FIG. 139A is a diagram of the switch rack WDM translator 13822, which includes wavelength/space shuffle matrices 13970 that shuffle the WDM signals so that (i) a WDM signal from a server 13802 is demultiplexed into 4 single-wavelength signals that are sent to 4 different switch boxes 13806, (ii) 4 single-wavelength signals from different servers 13802 are multiplexed into a WDM signal that is sent to a single switch box 13806, (iii) a WDM signal from a switch box 13806 is demultiplexed into 4 single-wavelength signals that are sent to 4 different servers 13802, and (iv) 4 single-wavelength signals from different switch boxes 13806 are multiplexed into a WDM signal that is sent to a single server 13802.

FIG. 139B is a diagram of the wavelength/space shuffle matrix 13970. In the example shown in FIGS. 139A and 139B, the WDM signals use four different wavelengths (e.g., w1, w2, w3, w4), and the switch rack WDM translator 13822 uses 4×4 wavelength/space shuffle matrices 13970. It is also possible to use a different number of wavelengths, such as 2, 3, 5, 6, 7, 8, . . . , 16, 40, 88, 96, or 120, etc., different wavelengths. If the WDM signals are configured to have N different wavelengths, N×N wavelength/space shuffle matrices can be used to shuffle the N signals carried by the N different wavelengths.

In this example, the switch rack WDM translator 13822 includes eight 4×4 wavelength/space shuffle matrices 13970 to process the WDM signals from and to the 32 servers 13802. A first 4×4 wavelength/space shuffle matrix 13970 includes 4 multiplexer/demultiplexers 13972*a*, 13972*b*, 13972*c*, 13972*d* (collectively referenced as 13972) that process the WDM signals from and to servers 1 to 4. A second 4×4 wavelength/space shuffle matrix 13970 includes 4 multiplexer/demultiplexers that process the WDM signals from and to servers 5 to 8. A third 4×4 wavelength/space shuffle matrix 13970 includes 4 multiplexer/demultiplexers that process the WDM signals from and to servers 9 to 12, and so forth. The first 4×4 wavelength/space shuffle matrix 13970 includes 4 multiplexer/demultiplexers 13974*a*, 13974*b*, 13974*c*, 13974*d* (collectively referenced as 13974) that process the WDM signals from and to switches 1 to 4. The second 4×4 wavelength/space shuffle matrix 13970 includes 4 multiplexer/demultiplexers that process the WDM signals from and to switches 5 to 8. The third 4×4 wavelength/space shuffle matrix 13970 includes 4 multiplexer/demultiplexers that process the WDM signals from and to switches 9 to 12, and so forth.

In the first 4×4 wavelength/space shuffle matrix 13970, the multiplexer/demultiplexer 13972*a* receives WDM signals from server 1 through optical fiber 13976*a*1, and sends WDM signals to server 1 through optical fiber 13976*a*2. The multiplexer/demultiplexer 13972*b* receives WDM signals from server 2 through optical fiber 13976*b*1, and sends WDM signals to server 2 through optical fiber 13976*b*2. The multiplexer/demultiplexer 13972*c* receives WDM signals from server 3 through optical fiber 13976*c*1, and sends WDM signals to server 3 through optical fiber 13976*c*2. The multiplexer/demultiplexer 13972*d* receives WDM signals from server 4 through optical fiber 13976*d*1, and sends WDM signals to server 4 through optical fiber 13976*d*2.

The multiplexer/demultiplexer 13974*a* receives WDM signals from switch 1 through optical fiber 13978*a*1, and sends WDM signals to switch 1 through optical fiber 13978*a*2. The multiplexer/demultiplexer 13974*b* receives WDM signals from switch 2 through optical fiber 13978*b*1, and sends WDM signals to switch 2 through optical fiber 13978*b*2. The multiplexer/demultiplexer 13974*c* receives WDM signals from switch 3 through optical fiber 13978*c*1, and sends WDM signals to switch 3 through optical fiber 13978*c*2. The multiplexer/demultiplexer 13974*d* receives WDM signals from switch 4 through optical fiber 13978*d*1, and sends WDM signals to switch 4 through optical fiber 13978*d*2.

The following describes the signal paths from the servers 13802 to the switches 13806. The multiplexer/demultiplexer 13972*a* demultiplexes the WDM signal received from server 1 and provides a signal having the wavelength w1 to the multiplexer/demultiplexer 13974*a*, provides a signal having the wavelength w2 to the multiplexer/demultiplexer 13974*b*, provides a signal having the wavelength w3 to the multiplexer/demultiplexer 13974*c*, and provides a signal having the wavelength w4 to the multiplexer/demultiplexer 13974*d*.

The multiplexer/demultiplexer 13972*b* demultiplexes the WDM signal received from server 2 and provides a signal having the wavelength w1 to the multiplexer/demultiplexer 13974*b*, provides a signal having the wavelength w2 to the multiplexer/demultiplexer 13974*c*, provides a signal having the wavelength w3 to the multiplexer/demultiplexer 13974*d*, and provides a signal having the wavelength w4 to the multiplexer/demultiplexer 13974*a*.

The multiplexer/demultiplexer 13972*c* demultiplexes the WDM signal received from server 3 and provides a signal having the wavelength w1 to the multiplexer/demultiplexer 13974*c*, provides a signal having the wavelength w2 to the multiplexer/demultiplexer 13974*d*, provides a signal having the wavelength w3 to the multiplexer/demultiplexer 13974*a*, and provides a signal having the wavelength w4 to the multiplexer/demultiplexer 13974*b*.

The multiplexer/demultiplexer 13972*d* demultiplexes the WDM signals received from server 4 and provides a signal having the wavelength w1 to the multiplexer/demultiplexer 13974*d*, provides a signal having the wavelength w2 to the multiplexer/demultiplexer 13974*a*, provides a signal having the wavelength w3 to the multiplexer/demultiplexer 13974*b*, and provides a signal having the wavelength w4 to the multiplexer/demultiplexer 13974*c*.

The multiplexer/demultiplexer 13974*a* receives a signal having the wavelength w1 from the multiplexer/demultiplexer 13972*a*, receives a signal having the wavelength w2 from the multiplexer/demultiplexer 13972*d*, receives a signal having the wavelength w3 from the multiplexer/demultiplexer 13972*c*, receives a signal having the wavelength w4 from the multiplexer/demultiplexer 13972*b*, combines the signals having the wavelengths w1, w2, w3, w4 into a WDM signal having wavelengths w1, w2, w3, w4, and sends the WDM signal to switch 1 through the optical fiber 13978*a*1.

The multiplexer/demultiplexer 13974*b* receives a signal having the wavelength w1 from the multiplexer/demultiplexer 13972*b*, receives a signal having the wavelength w2 from the multiplexer/demultiplexer 13972*a*, receives a signal having the wavelength w3 from the multiplexer/demultiplexer 13972*d*, receives a signal having the wavelength w4 from the multiplexer/demultiplexer 13972*c*, combines the signals having the wavelengths w1, w2, w3, w4 into a WDM signal having wavelengths w1, w2, w3, w4, and sends the WDM signal to switch 2 through the optical fiber **13978*b*1**.

The multiplexer/demultiplexer **13974*c* receives a signal having the wavelength w1 from the multiplexer/demultiplexer 13972*c*, receives a signal having the wavelength w2 from the multiplexer/demultiplexer 13972*b*, receives a signal having the wavelength w3 from the multiplexer/demultiplexer 13972*a*, receives a signal having the wavelength w4 from the multiplexer/demultiplexer 13972*d*, combines the signals having the wavelengths w1, w2, w3, w4 into a WDM signal having wavelengths w1, w2, w3, w4, and sends the WDM signal to switch 3 through the optical fiber 13978*c*1**.

The multiplexer/demultiplexer **13974*d* receives a signal having the wavelength w1 from the multiplexer/demultiplexer 13972*d*, receives a signal having the wavelength w2 from the multiplexer/demultiplexer 13972*c*, receives a signal having the wavelength w3 from the multiplexer/demultiplexer 13972*b*, receives a signal having the wavelength w4 from the multiplexer/demultiplexer 13972*a*, combines the signals having the wavelengths w1, w2, w3, w4 into a WDM signal having wavelengths w1, w2, w3, w4, and sends the WDM signal to switch 4 through the optical fiber 13978*d*1**.

The following describes the signal paths from the switches 13806 to the servers 13802. The multiplexer/demultiplexer **13974*a* receives a WDM signal from switch 1, demultiplexes the WDM signal, and provides a signal having the wavelength w1 to the multiplexer/demultiplexer 13972*a*, provides a signal having the wavelength w2 to the multiplexer/demultiplexer 13972*d*, provides a signal having the wavelength w3 to the multiplexer/demultiplexer 13972*c*, and provides a signal having the wavelength w4 to the multiplexer/demultiplexer 13972*b***.

The multiplexer/demultiplexer **13974*b* receives a WDM signal from switch 2, demultiplexes the WDM signal, and provides a signal having the wavelength w1 to the multiplexer/demultiplexer 13972*b*, provides a signal having the wavelength w2 to the multiplexer/demultiplexer 13972*a*, provides a signal having the wavelength w3 to the multiplexer/demultiplexer 13974*d*, and provides a signal having the wavelength w4 to the multiplexer/demultiplexer 13974*c***.

The multiplexer/demultiplexer **13974*c* receives a WDM signal from switch 3, demultiplexes the WDM signal, and provides a signal having the wavelength w1 to the multiplexer/demultiplexer 13972*c*, provides a signal having the wavelength w2 to the multiplexer/demultiplexer 13972*b*, provides a signal having the wavelength w3 to the multiplexer/demultiplexer 13972*a*, and provides a signal having the wavelength w4 to the multiplexer/demultiplexer 13972*d***.

The multiplexer/demultiplexer **13974*d* receives a WDM signal from switch 4, demultiplexes the WDM signal, and provides a signal having the wavelength w1 to the multiplexer/demultiplexer 13972*d*, provides a signal having the wavelength w2 to the multiplexer/demultiplexer 13972*c*, provides a signal having the wavelength w3 to the multiplexer/demultiplexer 13972*b*, and provides a signal having the wavelength w4 to the multiplexer/demultiplexer 13972*a***.

The multiplexer/demultiplexer **13972*a* receives a signal having the wavelength w1 from the multiplexer/demultiplexer 13974*a*, receives a signal having the wavelength w2 from the multiplexer/demultiplexer 13974*b*, receives a signal having the wavelength w3 from the multiplexer/demultiplexer 13974*c*, receives a signal having the wavelength w4 from the multiplexer/demultiplexer 13974*d*, combines the signals having the wavelengths w1, w2, w3, w4 into a WDM signal having wavelengths w1, w2, w3, w4, and sends the WDM signal to sever 1 through the optical fiber 13976*a*2**.

The multiplexer/demultiplexer **13972*b* receives a signal having the wavelength w1 from the multiplexer/demultiplexer 13974*b*, receives a signal having the wavelength w2 from the multiplexer/demultiplexer 13974*c*, receives a signal having the wavelength w3 from the multiplexer/demultiplexer 13974*d*, receives a signal having the wavelength w4 from the multiplexer/demultiplexer 13974*a*, combines the signals having the wavelengths w1, w2, w3, w4 into a WDM signal having wavelengths w1, w2, w3, w4, and sends the WDM signal to sever 2 through the optical fiber 13976*b*2**.

The multiplexer/demultiplexer **13972*c* receives a signal having the wavelength w1 from the multiplexer/demultiplexer 13974*c*, receives a signal having the wavelength w2 from the multiplexer/demultiplexer 13974*d*, receives a signal having the wavelength w3 from the multiplexer/demultiplexer 13974*a*, receives a signal having the wavelength w4 from the multiplexer/demultiplexer 13974*b*, combines the signals having the wavelengths w1, w2, w3, w4 into a WDM signal having wavelengths w1, w2, w3, w4, and sends the WDM signal to sever 3 through the optical fiber 13976*c*2**.

The multiplexer/demultiplexer **13972*d* receives a signal having the wavelength w1 from the multiplexer/demultiplexer 13974*d*, receives a signal having the wavelength w2 from the multiplexer/demultiplexer 13974*a*, receives a signal having the wavelength w3 from the multiplexer/demultiplexer 13974*b*, receives a signal having the wavelength w4 from the multiplexer/demultiplexer 13974*c*, combines the signals having the wavelengths w1, w2, w3, w4 into a WDM signal having wavelengths w1, w2, w3, w4, and sends the WDM signal to sever 4 through the optical fiber 13976*d*2**.

16 data optical fibers are used to connect the switch rack WDM translator 13822 to a co-packaged optical module of a switch 13806. Each of 8 data optical fiber transmits a WDM signal have 4 wavelengths carrying signals from 4 servers 13802 to the switch 13806. Each of 8 data optical fiber transmits a WDM signal have 4 wavelengths carrying signals from the switch 13806 to 4 servers 13802.

In some implementations, the power supply optical fibers pass through the switch rack WDM translator 13822 without being affected by the wavelength/space shuffle matrices 13970. In some implementations, the power supply optical signals do not pass through the switch rack WDM translator 13822, in which the power supply optical fibers are combined with the data fibers at a location external to the WDM translator 13822.

The WDM translator 13822 includes a first interface that is optically coupled to the plurality of optical fibers that are optically to the servers 13802. The WDM translator 13822 includes a second interface that is optically coupled to the plurality of optical fibers that are optically to the switches 13806 and the optical power supply 13808. In FIG. 139, the first interface is shown at the left side of the WDM translator 13822, and the second interface is shown at the right side of the WDM translator 13822. The first interface includes a first set of optical fiber ports, a second set of optical fiber ports, and a first set of power supply fiber ports. The first set of optical fiber ports are optically coupled to optical fibers that transmit WDM signals to the servers 13802. The second set of optical fiber ports are optically coupled to optical fibers that transmit WDM signals from the servers 13802. The first set of power supply fiber ports are optically coupled to optical fibers that provide power supply light to the photonic integrated circuits of the servers 13802.

The second interface of the WDM translator 13822 includes a third set of optical fiber ports, a fourth set of optical fiber ports, and a second set of power supply fiber ports. The third set of optical fiber ports are optically coupled to optical fibers that transmit WDM signals to the switches 13806. The fourth set of optical fiber ports are optically coupled to optical fibers that transmit WDM signals from the switches 13806. The second set of power supply fiber ports are optically coupled to optical fibers that are optically coupled to the optical power supply 13808.

The first set of optical fiber ports and the second set of optical fiber ports are optically coupled to the multiplexer/demultiplexers 13972 of the wavelength/space shuffle matrix 13970. The third set of optical fiber ports and the fourth set of optical fiber ports are optically coupled to the multiplexer/demultiplexers 13974 of the wavelength/space shuffle matrix 13970. The first set of power supply fiber ports are optically coupled to the second set of power supply fiber ports, in which the power supply light is transmitted from the optical power supply 13808 to the servers 13802 through the second set of power supply fiber ports and the first set of power supply fiber ports.

In the signal paths from the servers 13802 to the switches 13806, each multiplexer/demultiplexer 13972 functions as a demultiplexer that demultiplexes a WDM signal (from a corresponding server 13802) having multiple wavelengths into the component signals, in which each component signal has a single wavelength, and the different component signals are sent to different switches 13806. Each multiplexer/demultiplexer 13974 functions as re-multiplexer that multiplexes the component signals from different servers 13802 into a WDM signal having multiple wavelengths that is sent to a corresponding switch 13806.

In the signal paths from the switches 13806 to the servers 13802, each multiplexer/demultiplexer 13974 functions as a demultiplexer that demultiplexes a WDM signal (from a corresponding switch 13806) having multiple wavelengths into the component signals, in which each component signal has a single wavelength, and the different component signals are sent to different servers 13802. Each multiplexer/demultiplexer 13972 functions as re-multiplexer that multiplexes the component signals from different switches 13806 into a WDM signal having multiple wavelengths that is sent to a corresponding server 13802.

In some implementations, the data processing system includes N switches 13806 and uses WDM signals that include N different wavelengths w1, w2, . . . , wn that are transmitted between the servers 13802 and the switches 13806. In this example, the WDM translator includes N×N wavelength/space shuffle matrices. The first interface of the WDM translator includes a first set of optical fiber ports that output WDM signals having N wavelengths to the servers 13802, a second set of optical fiber ports that receive WDM signals having N wavelengths from the servers 13802, and a first set of power supply fiber ports that provide power supply light to the photonic integrated circuits of the servers 13802. The second interface of the WDM translator includes a third set of optical fiber ports that output WDM signals having N wavelengths to the switches 13806, a fourth set of optical fiber ports that receive WDM signals having N wavelengths from the switches 13806, and a second set of power supply fiber ports that are optically coupled to the optical power supply module 13808.

In some implementations, the optical power supply 13808 provides power supply light having multiple wavelengths that correspond to the wavelengths in the WDM signals transmitted by the servers 13802 and the switches 13806. Any technique for providing power supply light for supporting photonic integrated circuits that process WDM signals can be used.

Figure 140B:
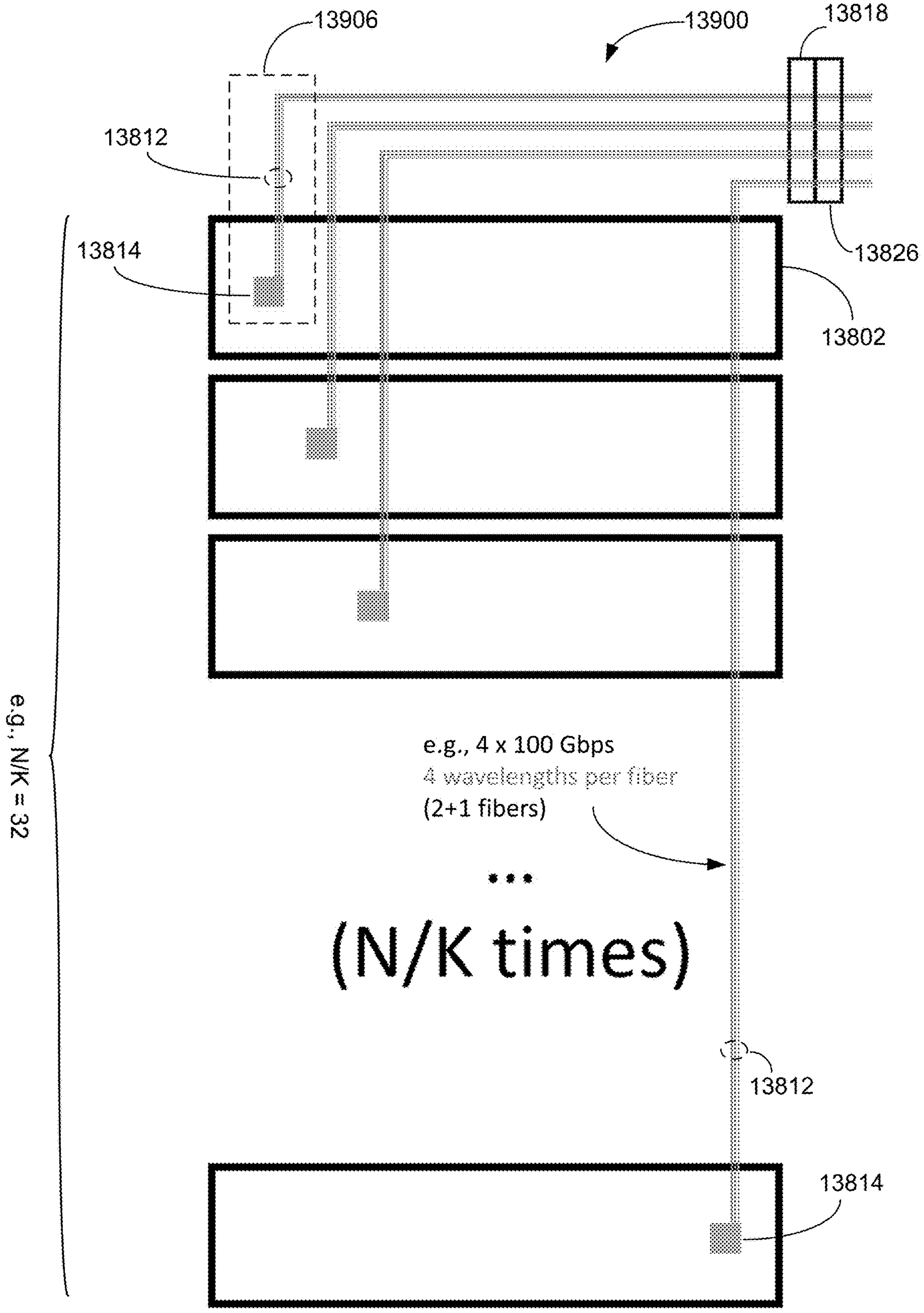
Figure 140C:
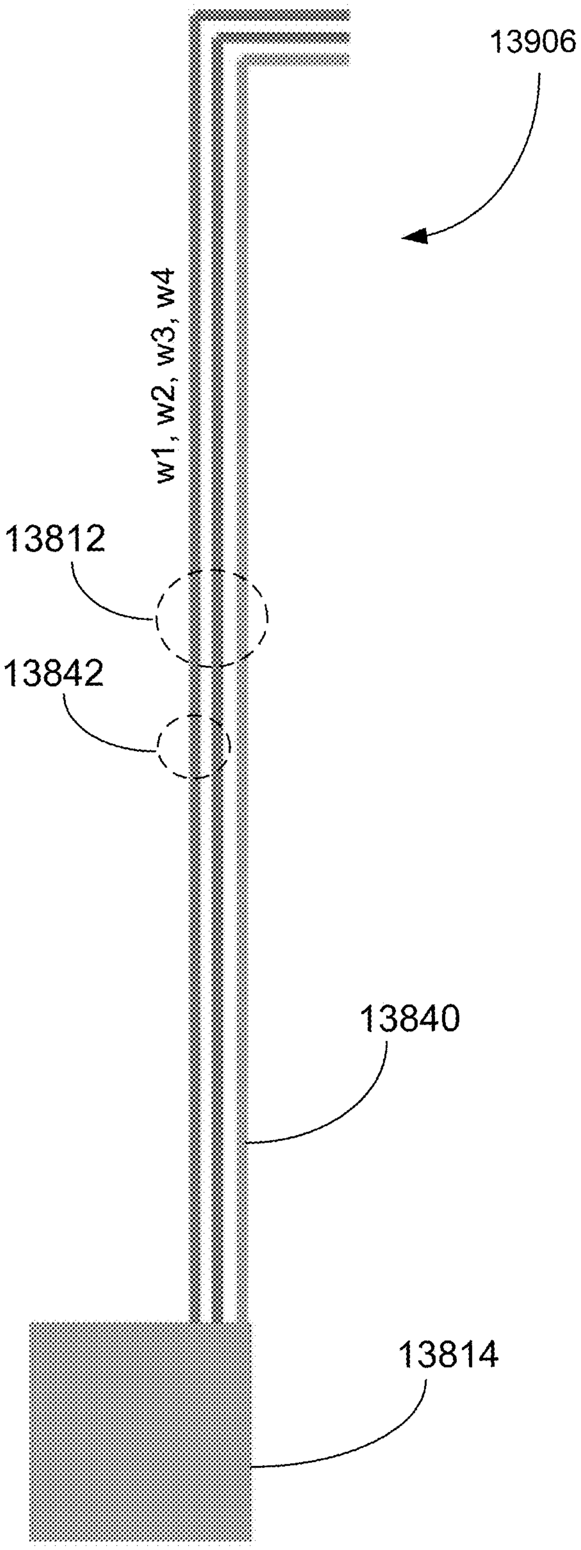
Figure 140D:
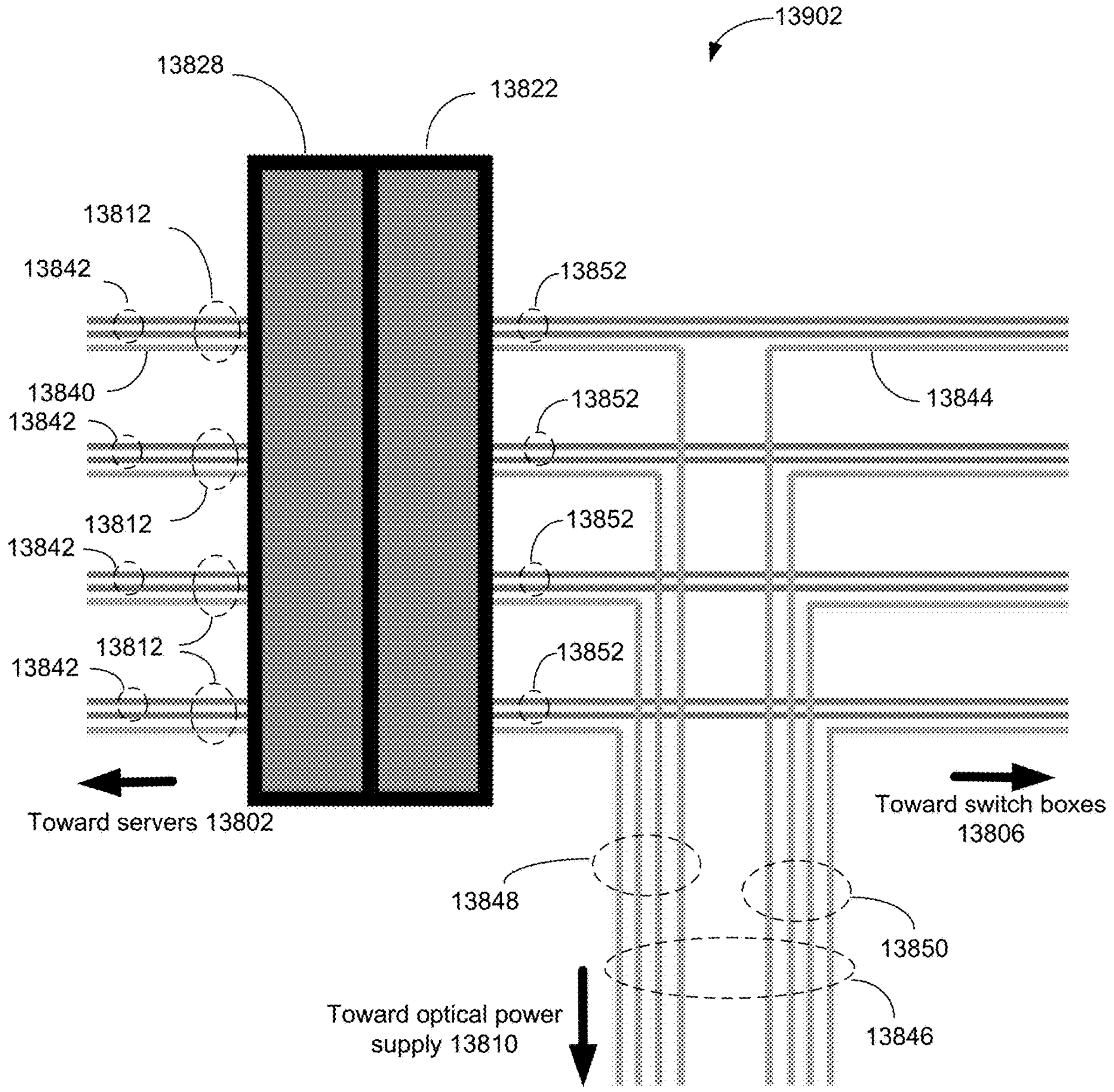

The following describes the components of the data processing system 13800 in greater detail. FIG. 140A shows the same data processing system 13800 of FIG. 138. FIGS. 140B, 140D, and 140F show enlarged portions 13900, 13902, and 13904, respectively, of the data processing system 13800. FIG. 140C shows an enlarged portion 13906 of the portion 13900 in FIG. 140B.

Referring to FIGS. 140B and 140C, the bundle 13812 of 3 optical fibers is optically coupled to the co-packaged optical module 13814 of a server 13802. The bundle 13812 of 3 optical fibers includes a power supply optical fiber 13840 for transmitting power supply light from the optical power supply 13810 to the co-packaged optical module 13814. The bundle 13812 further includes a pair of data optical fibers 13842 that each carry WDM signals having 4 different wavelengths w1, w2, w3, and w4. For example, the pair of data optical fibers 13842 provide 4 bi-directional communication channels, each channel having a 100 Gbps bandwidth, for a total of 4×100 Gbps bandwidth in each direction. In FIGS. 138, 140A, 140B, and 140C, the optical fiber connectors that are used to connect the optical fibers to the co-packaged optical module are not shown.

Referring to FIG. 140D, 32 bundles 13812 of optical fibers extend from the switch rack connector 13828 toward the 32 servers 13802, in which each bundle 13812 includes 3 optical fibers as shown in FIG. 140C. Only 4 bundles 13812 of optical fibers are shown in the figure. Each bundle 13812 of 3 optical fibers includes a pair 13842 of data optical fibers and 1 power supply optical fiber 13840. The WDM signals transmitted from the 32 servers 13802 in the 32 pairs 13842 of data optical fibers are shuffled by the switch rack WDM translator 13822, which sends the shuffled WDM signals through 32 pairs 13852 of data optical fibers toward the switch boxes 13806.

The power supply optical fiber 13840 extends towards the optical power supply 13810. Power supply optical fibers 13844 extend from the optical power supply 13810 toward the switch boxes 13806 and are used to carry power supply light to the switch boxes 13806. In this example, a bundle 13846 of 40 power supply optical fibers are used to carry power supply light from the optical power supply 13810 to the servers 13802 and the switch boxes 13806. The bundle 13846 of power supply optical fibers includes a bundle 13848 of 32 power supply optical fibers 13840 that provide power supply light to the 32 servers 13802, and a bundle 13850 of 8 power supply optical fibers 13844 that provide power supply light to the 4 switch boxes 13806, in which each switch box 13806 receives power supply light from 2 power supply optical fibers 13844.

Figure 140E:
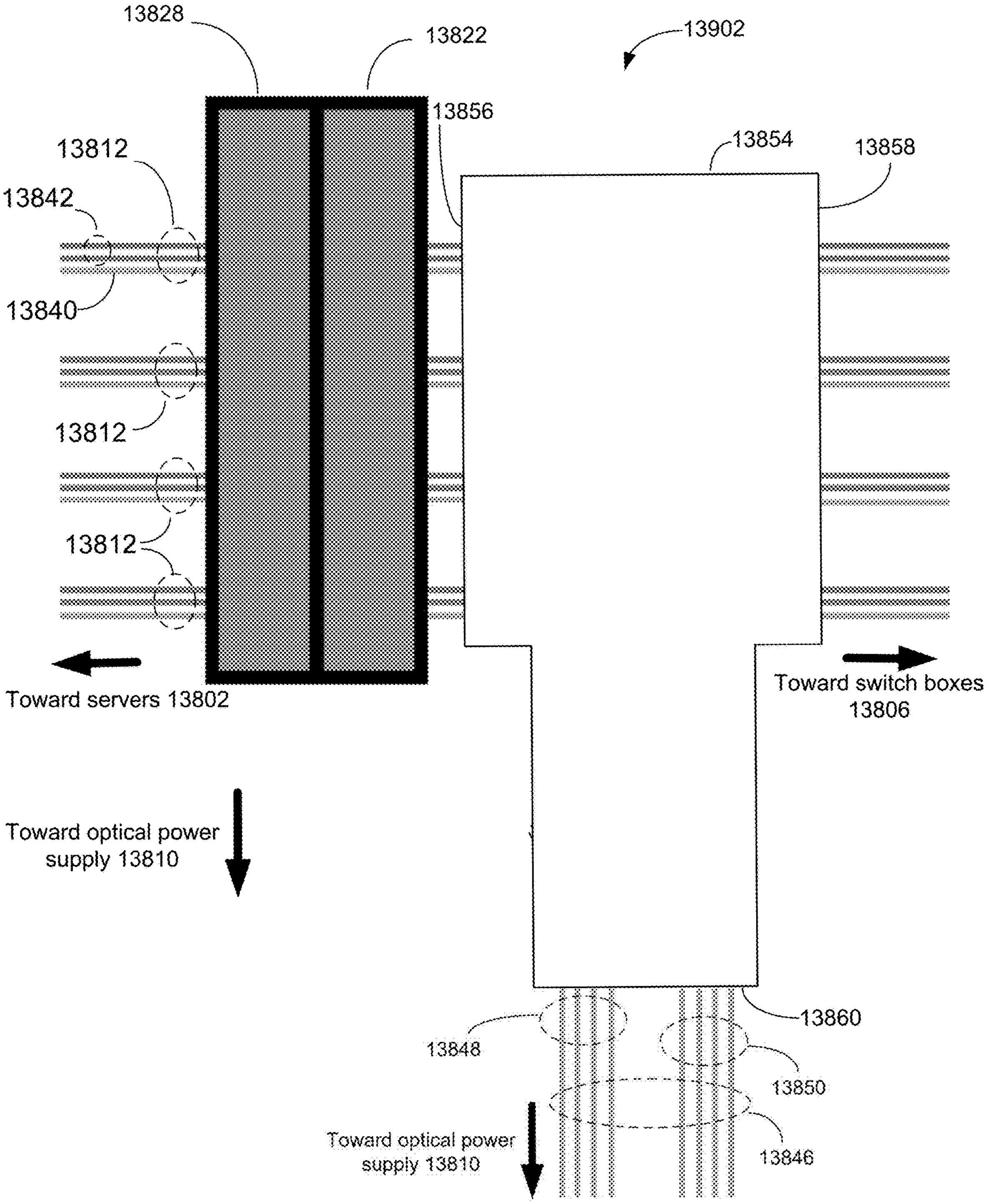
Figure 140F:
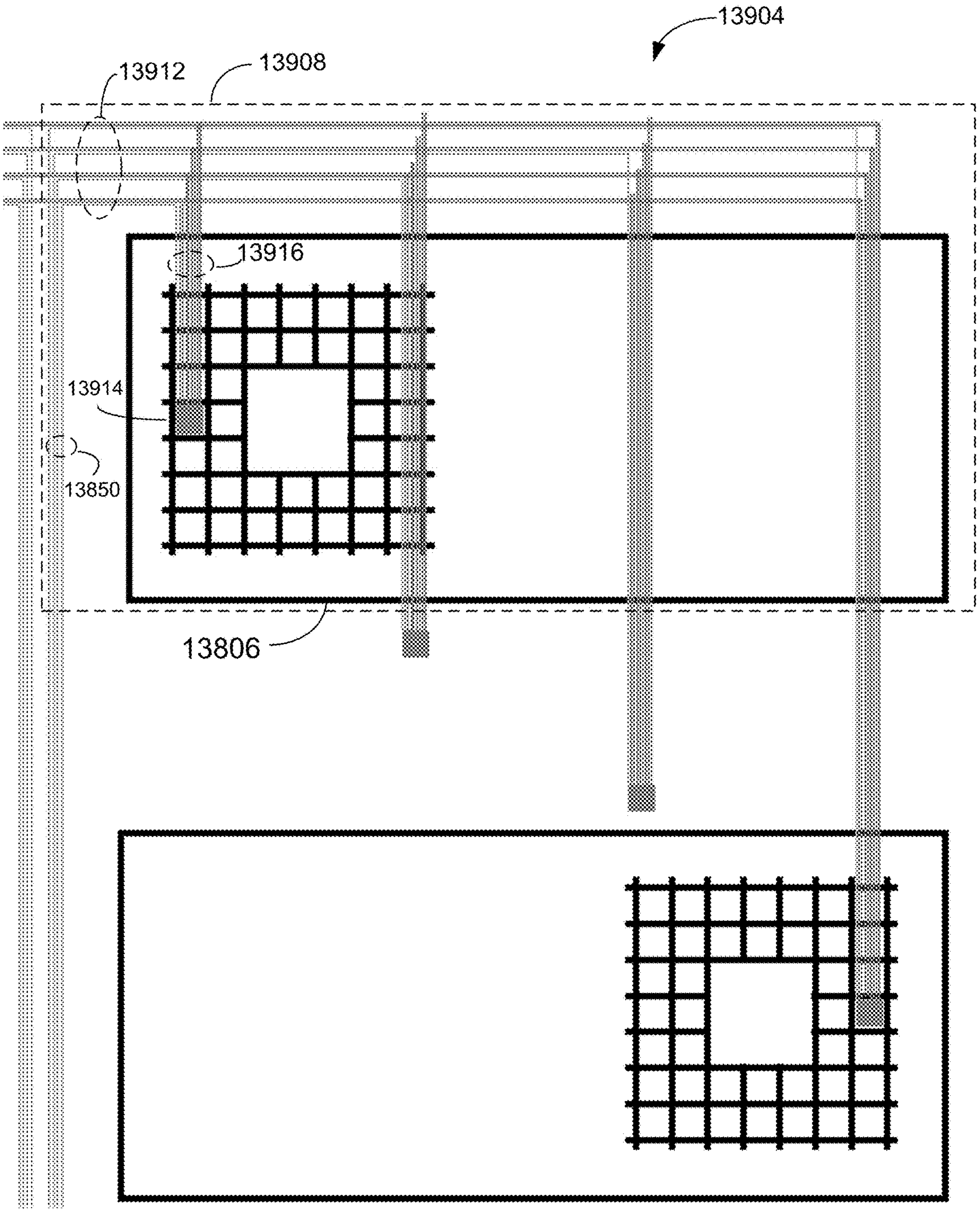

FIG. 140E shows the portion 13902 with an optical fiber guide module 13854. The optical fiber guide module 13854 includes a first port 13856, a second port 13858, and a third port 13860. The optical fibers that extend outward from the first port 13856 are optically coupled to the switch rack WDM translator 13822. The optical fibers that extend outward from the second port 13858 are optically coupled to the switch boxes 13806. The optical fibers that extend outward from the third port 13860 are optically coupled to the optical power supply 13810.

Figure 140G:
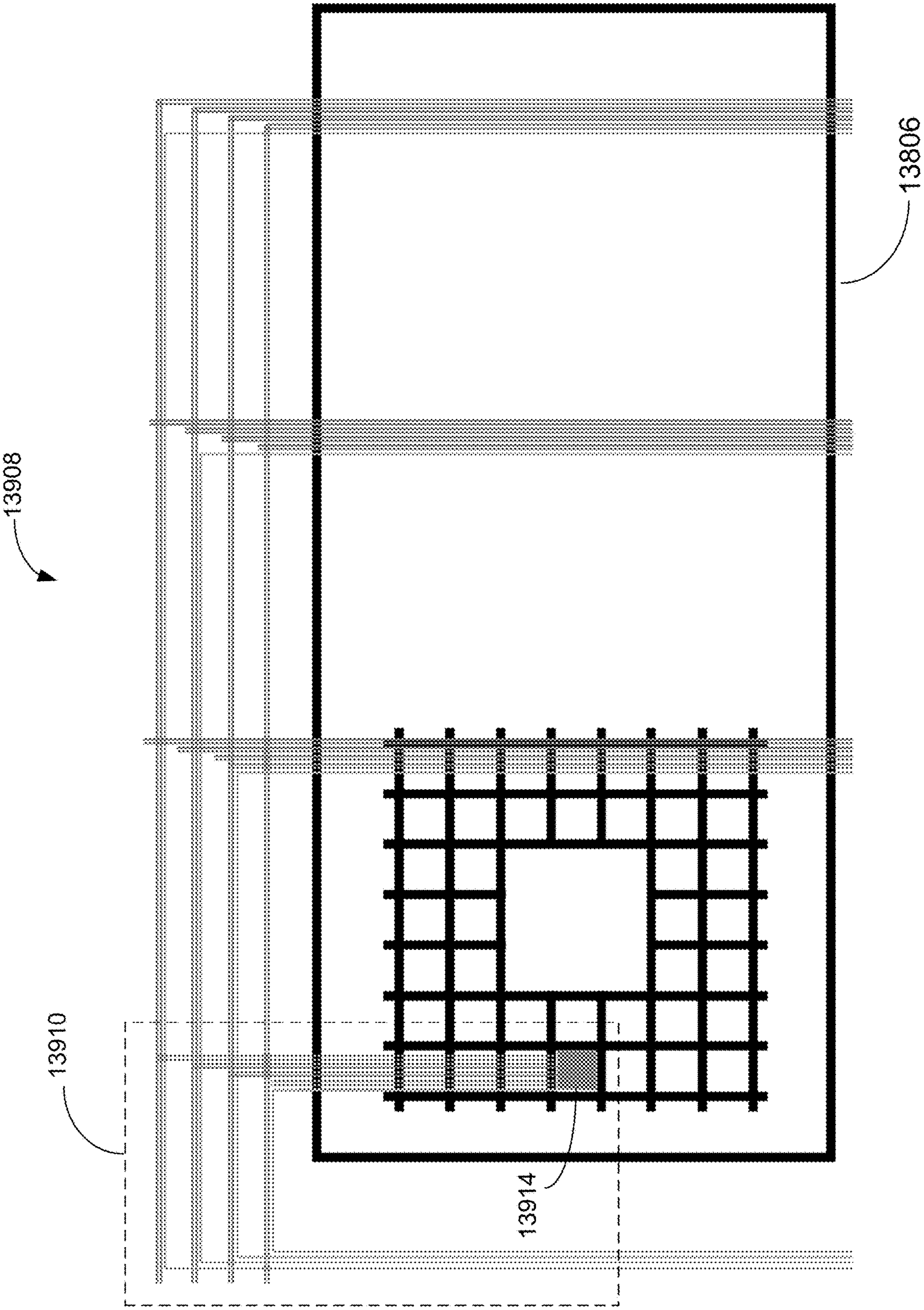
Figure 140H:
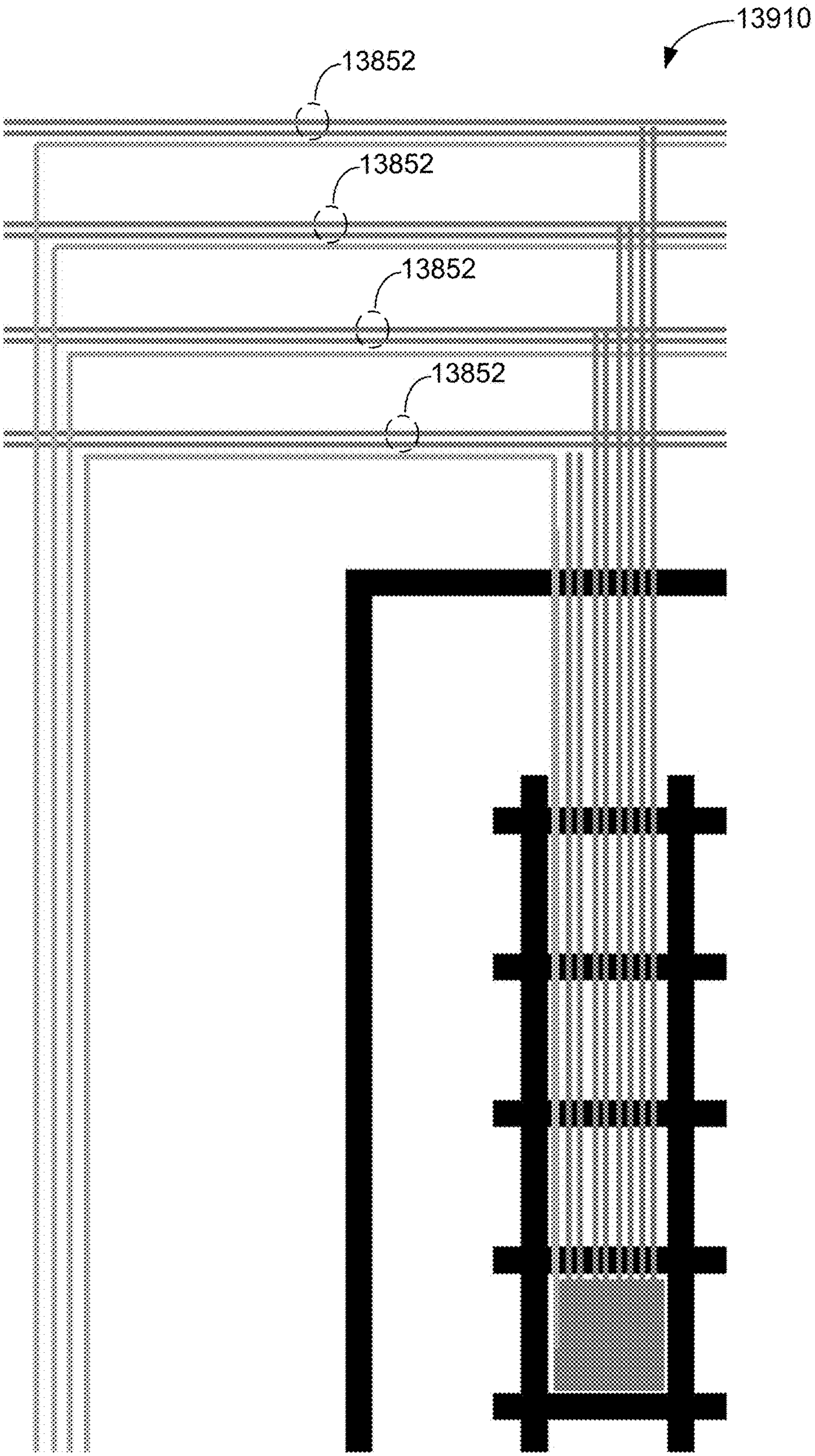

FIG. 140F shows an enlarged view of the portion 13904 of the data processing system 13800 in FIG. 140A. FIG. 140G shows an enlarged portion 13908 of the portion 13904 in FIG. 140F. FIG. 140H shows an enlarged portion 13910 of the portion 13908 in FIG. 140G. Referring to FIGS. 140F, 140G, and 140H, in this example, a bundle 13912 of optical fibers includes the 32 pairs 13852 of data optical fibers optically connected to the switch rack WDM translator

13822, and the bundle 13850 of 8 power supply optical fibers optically connected to the optical power supply 13810.

The bundle 13912 of optical fibers includes eight pairs of data optical fibers and a pair of power supply optical fibers that are optically coupled to a co-packaged optical module 13914 of the first switch box 13806, eight pairs of data optical fibers and a pair of power supply optical fibers that are optically coupled to a co-packaged optical module 13914 of the second switch box 13806, eight pairs of data optical fibers and a pair of power supply optical fibers that are optically coupled to a co-packaged optical module 13914 of the third switch box 13806, and eight pairs of data optical fibers and a pair of power supply optical fibers that are optically coupled to a co-packaged optical module 13914 of the fourth switch box 13806.

Among the eight pairs of data optical fibers that are optically coupled to each switch box 13806, the first pair of data optical fibers carry WDM signals from and to servers 1 to 4, the second pair of data optical fibers carry WDM signals from and to servers 5 to 8, the third pair of data optical fibers carry WDM signals from and to servers 9 to 12, and so forth. This allows the co-packaged optical module 13914 to communicate with every one of the 32 servers 13802 in a server rack. For example, each switch box 13806 can include 32 co-packaged optical modules 13914, in which each co-packaged optical module 13914 is capable of communicating with 32 servers in a server rack, and different co-packaged optical modules 13914 are capable of communicating with the servers in different server racks. This way, each server 13802 is in optical communication with each of the 4 switch boxes 13806, and each switch box 13806 is in optical communication with every one of the 32 servers 13802 in every one of the 32 server racks.

In this example, each co-packaged optical module 1391 in the switch box 13806 is optically connected to 2 power supply optical fibers 13844 (see FIG. 140D). Each co-packaged optical module 1391 can be optically connected to any number of power supply optical fibers, depending on the amount of power supply light needed for the operation of optical modulators in the co-packaged optical module 1391. For example, each co-packaged optical module can be optically connected through multiple power supply optical fibers to multiple optical power supplies to provide redundancy and increase reliability. The co-packaged optical modules 13914 of the switch boxes 13806 receive power supply light from a remote optical power supply 13808 that is located outside of the housings of the switch boxes 13806 and optically connected to the co-packaged optical modules 13914 through power supply optical fibers 13844. In some implementations, this allows management and service of the optical power supply 13808 to be independent of the switch boxes 13806. The optical power supply 13808 can have a thermal environment that is different from that of the switch boxes 13806. For example, the optical power supply 13808 can be placed in an enclosure that is equipped with an active thermal control system to ensure that the laser sources operate in an environment with a stable temperature. This way, the laser sources are not affected by the thermal fluctuations caused by the operations of the switch boxes 13806.

FIGS. 140A to 140H show the optical fiber connections between the switch boxes 13806 and one rack of 32 servers 13802. The other racks of servers can be optically connected to the switch boxes 13806 and the optical power supply 13808 in a similar manner. This way, each switch box 13806 is capable of switching or transmitting data between any two server 13802 among the multiple racks of servers.

FIGS. 138 and 140A to 140H show an example of optical fiber cable configuration in a WDM data processing system for optically connecting the co-packaged optical modules or optical interfaces of multiple servers to co-packaged optical modules or optical interfaces of switch boxes, and providing power supply light from a remote optical power supply to the co-packaged optical modules of the servers and the switch boxes. Referring to FIG. 141, in some implementations, an optical fiber cable 14100 configured to optically connect the servers 13802, the switch boxes 13806, and the optical power supply 13808 includes three main segments: (i) a first segment 14102 that includes optical fiber connectors 14108 that are optically coupled to the co-packaged optical modules of the servers 13802, (ii) a second segment includes optical fiber connectors 14110 that are optically coupled to the co-packaged optical modules of the switch boxes 13806, and an optical fiber connector 14112 that is optically coupled to the optical power supply 13808, and (iii) an optical fiber extension cable 14106 that is optically connected between the first segment 14102 and the second segment 14104.

In some implementations, the first segment 14102 includes an optical fiber connector 14114 that is optically coupled to an optical fiber connector 14116 of the optical fiber extension cable 14106. The first segment 14102 includes 32 optical fiber connectors 14108 that are optically coupled to the 32 servers 13802. The optical fiber connector 14114 includes 32 power supply fiber ports, 32 transmitter fiber ports, and 32 receiver fiber ports. Each optical fiber connector 14108 includes 1 power supply fiber port, 1 transmitter fiber port, and 1 receiver fiber port. The second segment 14104 includes a switch rack WDM translator 14118 that is optically coupled to an optical fiber connector 14120 of the optical fiber extension cable 14106.

In some implementations, the second segment 14104 includes 4 optical fiber connectors 14110 that are optically coupled to 4 switch boxes 13806 and 1 optical fiber connector 14112 that is optically coupled to the optical power supply 13808. The switch rack WDM translator 14118 includes 32 power supply fiber ports, 32 transmitter fiber ports, and 32 receiver fiber ports. The optical fiber connector 14112 includes 40 power supply fiber ports. Each optical fiber connector 14110 includes 2 power supply fiber ports, 8 transmitter fiber ports, and 8 receiver fiber ports.

The number of power supply fiber ports, transmitter fiber ports, and receiver fiber ports described above are used as examples only, it is possible to have different numbers of power supply fiber ports, transmitter fiber ports, and receiver fiber ports depending on application. It is also possible to have different numbers of optical fiber connectors 14108, 14110, and 14112 depending on application.

The data processing system 13800 of FIG. 138 uses 4 wavelengths over a fiber pair as opposed to 4 parallel spatial paths over 8 fibers used in the data processing system 1550 of FIG. 87A. The data processing system 13800 of FIG. 138 includes a switch-to-rack WDM translator that has combinations of demultiplexers and multiplexers that function as wavelength/space shuffle matrices. In some implementations, it is possible to replace the server-to-rack connector 13818 with a server-to-rack WDM translator that has combinations of demultiplexers and multiplexers that function as wavelength/space shuffle matrices. In this example, the switch-to-rack WDM translator 13822 can be replaced with an optical fiber connector. Thus, the WDM translator that includes combinations of demultiplexers and multiplexers that function as wavelength/space shuffle matrices can be placed either near the servers 13802 or near the switches 13806.

Figure 88:
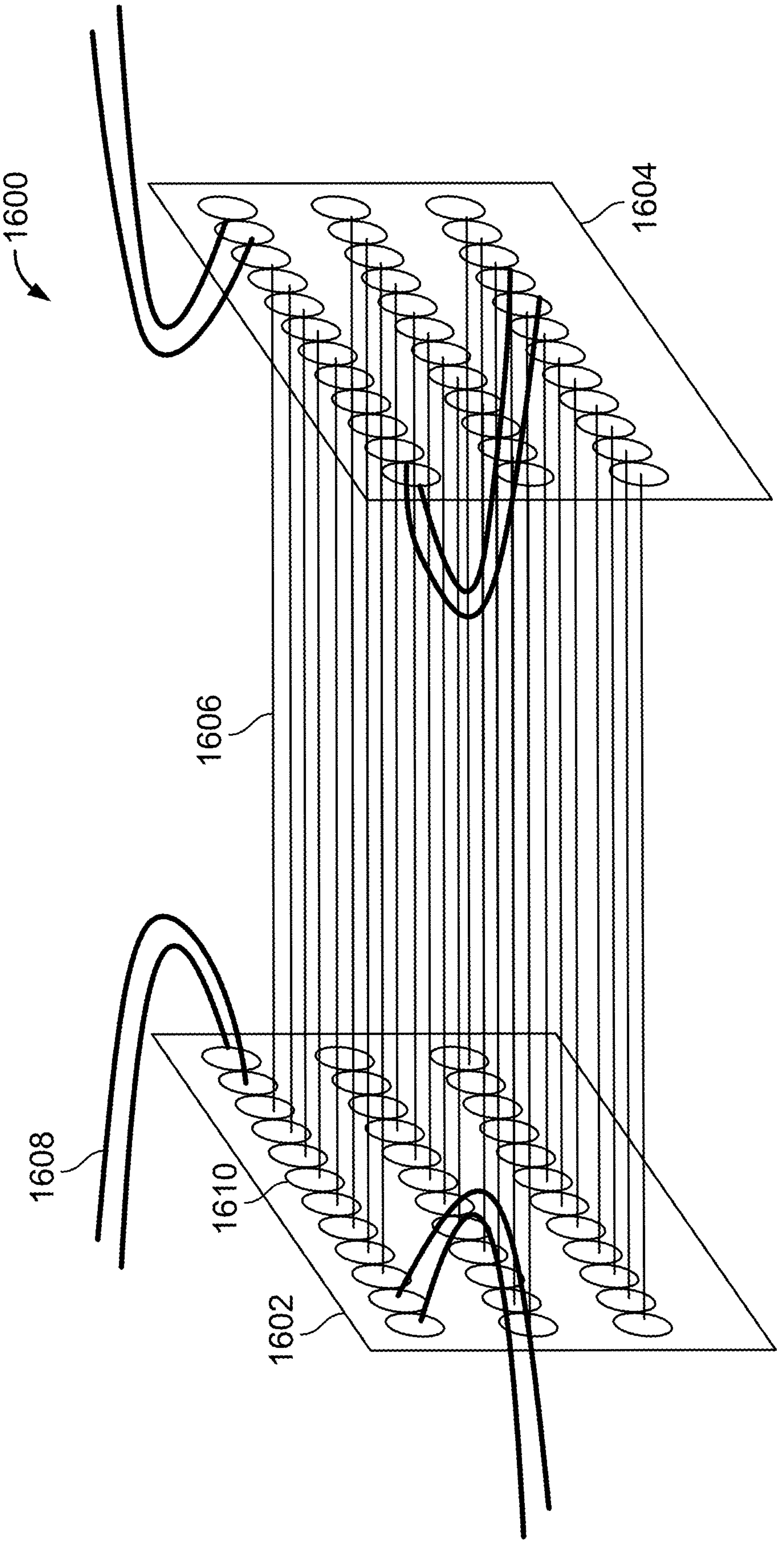
FIG. 88 is a diagram of an example of connector port mapping for an optical fiber interconnection cable.

FIG. 88 is a diagram of an example of the connector port mapping for an optical fiber interconnection cable 1600, which includes a first optical fiber connector 1602, a second optical fiber connector 1604, optical fibers 1606 that transmit data and/or control signals between the first and second optical fiber connectors 1602, 1604, and optical fibers 1608 that transmit optical power supply light. Each optical fiber terminates at an optical fiber port 1610, which can include, e.g., lenses for focusing light entering or exiting the optical fiber port 1610. The first and second optical fiber connectors 1602, 1604 can be, e.g., the optical fiber connectors 1342 and 1344 of FIGS. 80B, 80C, the optical fiber connectors 1402 and 1404 of FIGS. 82B, 82C, or the optical fiber connectors 1570 and 1574 of FIG. 87A. The principles for designing the optical fiber interconnection cable 1600 can be used to design the optical cable assembly 1340 of FIGS. 80B, 80C, the optical cable assembly 1400 of FIGS. 82B, 82C, and the optical cable assembly 1490 of FIGS. 84B, 84C.

In the example of FIG. 88, each optical fiber connector 1602 or 1604 includes 3 rows of optical fiber ports, each row including 12 optical fiber ports. Each optical fiber connector 1602 or 1604 includes 4 power supply fiber ports that are connected to optical fibers 1608 that are optically coupled to one or more optical power supplies. Each optical fiber connector 1602 or 1604 includes 32 fiber ports (some of which are transmitter fiber ports, and some of which are receiver fiber ports) that are connected to the optical fibers 1606 for data transmission and reception.

In some implementations, the mapping of the fiber ports of the optical fiber connectors 1602, 1604 are designed such that the interconnection cable 1600 can have the most universal use, in which each fiber port of the optical fiber connector 1602 is mapped to a corresponding fiber port of the optical fiber connector 1604 with a 1-to-1 mapping and without transponder-specific port mapping that would require fibers 1606 to cross over. This means that for an optical transponder that has an optical fiber connector compatible with the interconnection cable 1600, the optical transponder can be connected to either the optical fiber connector 1602 or the optical fiber connector 1604. The mapping of the fiber ports is designed such that each transmitter port of the optical fiber connector 1602 is mapped to a corresponding receiver port of the optical fiber connector 1604, and each receiver port of the optical fiber connector 1602 is mapped to a corresponding transmitter port of the optical fiber connector 1604.

FIG. 89 is a diagram showing an example of the fiber port mapping for an optical fiber interconnection cable 1660 that includes a pair of optical fiber connectors, i.e., a first optical fiber connector 1662 and a second optical fiber connector 1664. FIG. 142 is an enlarged view of the diagram of FIG. 89. The power supply fiber ports are labeled ‘P’, the transmitter fiber ports are labeled ‘T’, and the receiver fiber ports are labeled ‘R’. Only some of the fiber ports are labeled in the figure. The optical fiber connectors 1662 and 1664 are designed such that either the first optical fiber connector 1662 or the second optical fiber connector 1664 can be connected to a given communication transponder that is compatible with the optical fiber interconnection cable 1660. The diagram shows the fiber port mapping when viewed from the outer edge of the optical fiber connector into the optical fiber connector (i.e., toward the optical fibers in the interconnection cable 1660).

The first optical fiber connector 1662 includes transmitter fiber ports (e.g., 1614*a*, 1616*a*), receiver fiber ports (e.g., 1618*a*, 1620*a*), and optical power supply fiber ports (e.g., 1622*a*, 1624*a*). The second optical fiber connector 1664 includes transmitter fiber ports (e.g., 1614*b*, 1616*b*), receiver fiber ports (e.g., 1618*b*, 1620*b*), and optical power supply fiber ports (e.g., 1622*b*, 1624*b*). For example, assume that the first optical fiber connector 1662 is connected to a first optical transponder, and the second optical fiber connector 1664 is connected to a second optical transponder. The first optical transponder transmits first data and/or control signals through the transmitter ports (e.g., 1614*a*, 1616*a*) of the first optical fiber connector 1662, and the second optical transponder receives the first data and/or control signals from the corresponding receiver fiber ports (e.g., 1618*b*, 1620*b*) of the second optical fiber connector 1664. The transmitter ports 1614*a*, 1616*a* are optically coupled to the corresponding receiver fiber ports 1618*b*, 1620*b* through optical fibers 1628, 1630, respectively. The second optical transponder transmits second data and/or control signals through the transmitter ports (e.g., 1614*b*, 1616*b*) of the second optical fiber connector 1664, and the first optical transponder receives the second data and/or control signals from the corresponding receiver fiber ports (1618*a*, 1620*a*) of the first optical fiber connector 1662. The transmitter port 1616*b* is optically coupled to the corresponding receiver fiber port 1620*a* through an optical fiber 1632.

A first optical power supply transmits optical power supply light to the first optical transponder through the power supply fiber ports of the first optical fiber connector 1662. A second optical power supply transmits optical power supply light to the second optical transponder through the power supply fiber ports of the second optical fiber connector 1664. The first and second power supplies can be different (such as the example of FIG. 80B) or the same (such as the example of FIG. 82B).

In the following description, when referring to the rows and columns of fiber ports of the optical fiber connector, the uppermost row is referred to as the $1^{st}$ row, the second uppermost row is referred to as the $2^{nd}$ row, and so forth. The leftmost column is referred to as the $1^{st}$ column, the second leftmost column is referred to as the $2^{nd}$ column, and so forth.

For an optical fiber interconnection cable having a pair of optical fiber connectors (i.e., a first optical fiber connector and a second optical fiber connector) to be universal, i.e., either one of the pair of optical fiber connectors can be connected to a given optical transponder, the arrangement of the transmitter fiber ports, the receiver fiber ports, and the power supply fiber ports in the optical fiber connectors have a number of properties. These properties are referred to as the “universal optical fiber interconnection cable port mapping properties.” The term “mapping” here refers to the arrangement of the transmitter fiber ports, the receiver fiber ports, and the power supply fiber ports at particular locations within the optical fiber connector. The first property is that the mapping of the transmitter, receiver, and power supply fiber ports in the first optical fiber connector is the same as the mapping of the transmitter, receiver, and power supply fiber ports in the second optical fiber connector (as in the example of FIG. 89).

In the example of FIG. 89, the individual optical fibers connecting the transmitter, receiver, and power supply fiber ports in the first optical fiber connector to the transmitter, receiver, and power supply fiber ports in the second optical fiber connector are parallel to one another.

In some implementations, each of the optical fiber connectors includes a unique marker or mechanical structure, e.g., a pin, that is configured to be at the same spot on the co-packaged optical module, similar to the use of a “dot” to denote “pin 1” on electronic modules. In some examples, such as those shown in FIGS. 89 and 90, the larger distance from the bottom row (the third row in the examples of FIGS. 89 and 90) to the connector edge can be used as a “marker” to guide the user to attach the optical fiber connector to the co-packaged optical module connector in a consistent manner.

The mapping of the fiber ports of the optical fiber connectors of a “universal optical fiber interconnection cable” has a second property: When mirroring the port map of an optical fiber connector and replacing each transmitter port with a receiver port as well as replacing each receiver port with a transmitter port in the mirror image, the original port mapping is recovered. The mirror image can be generated with respect to a reflection axis at either connector edge, and the reflection axis can be parallel to the row direction or the column direction. The power supply fiber ports of the first optical fiber connector are mirror images of the power supply fiber ports of the second optical fiber connector.

The transmitter fiber ports of the first optical fiber connector and the receiver fiber ports of the second optical fiber connector are pairwise mirror images of each other, i.e., each transmitter fiber port of the first optical fiber connector is mirrored to a receiver fiber port of the second optical fiber connector. The receiver fiber ports of the first optical fiber connector and the transmitter fiber ports of the second optical fiber connector are pairwise mirror images of each other, i.e., each receiver fiber port of the first optical fiber connector is mirrored to a transmitter fiber port of the second optical fiber connector.

Another way of looking at the second property is as follows: Each optical fiber connector is transmitter port-receiver port (TX-RX) pairwise symmetric and power supply port (PS) symmetric with respect to one of the main or center axes, which can be parallel to the row direction or the column direction. For example, if an optical fiber connector has an even number of columns, the optical fiber connector can be divided along a center axis parallel to the column direction into a left half portion and a right half portion. The power supply fiber ports are symmetric with respect to the main axis, i.e., if there is a power supply fiber port in the left half portion of the optical fiber connector, there will also be a power supply fiber port at the mirror location in the right half portion of the optical fiber connector. The transmitter fiber ports and the receiver fiber ports are pairwise symmetric with respect to the main axis, i.e., if there is a transmitter fiber port in the left half portion of the optical fiber connector, there will be a receiver fiber port at a mirror location in the right half portion of the optical fiber connector. Likewise, if there is a receiver fiber port in the left half portion of the optical fiber connector, there will be a transmitter fiber port at a mirror location in the right half portion of the optical fiber connector.

For example, if an optical fiber connector has an even number of rows, the optical fiber connector can be divided along a center axis parallel to the row direction into an upper half portion and a lower half portion. The power supply fiber ports are symmetric with respect to the main axis, i.e., if there is a power supply fiber port in the upper half portion of the optical fiber connector, there will also be a power supply fiber port at the mirror location in the lower half portion of the optical fiber connector. The transmitter fiber ports and the receiver fiber ports are pairwise symmetric with respect to the main axis, i.e., if there is a transmitter fiber port in the upper half portion of the optical fiber connector, there will be a receiver fiber port at a mirror location in the lower half portion of the optical fiber connector. Likewise, if there is a receiver fiber port in the upper half portion of the optical fiber connector, there will be a transmitter fiber port at a mirror location in the lower half portion of the optical fiber connector.

The mapping of the transmitter fiber ports, receiver fiber ports, and power supply fiber ports follow a symmetry requirement that can be summarized as follows:

(i) Mirror all ports on either one of the two connector edges.

(ii) Swap TX (transmitter) and RX (receiver) functionality on the mirror image.

(iii) Leave mirrored PS (power supply) ports as PS ports.

(iv) The resulting port map is the same as the original one.

Essentially, a viable port map is TX-RX pairwise symmetric and PS symmetric with respect to one of the main axes.

The properties of the mapping of the fiber ports of the optical fiber connectors can be mathematically expressed as follows:

Port matrix M with entries PS=0, TX=+1, RX=−1;

Column-mirror operation $\overleftrightarrow{M}$;

Row-mirror operation $\updownarrow M$;

➔ A viable port map either satisfies $-\overleftrightarrow{M}=M$ or $-\updownarrow M=M$.

In some implementations, if a universal optical fiber interconnection cable has a first optical fiber connector and a second optical fiber connector that are mirror images of each other after swapping the transmitter fiber ports to receiver fiber ports and swapping the receiver fiber ports to transmitter fiber ports in the mirror image, and the mirror image is generated with respect to a reflection axis parallel to the column direction, as in the example of FIG. 89, then each optical fiber connector should be TX-RX pairwise symmetric and PS symmetric with respect to a center axis parallel to the column direction. If a universal optical fiber interconnection cable has a first optical fiber connector and a second optical fiber connector that are mirror images of each other after swapping the transmitter and receiver fiber ports in the mirror image, and the mirror image is generated with respect to a reflection axis parallel to the row direction, as in the example of FIG. 90, then each optical fiber connector should be TX-RX pairwise symmetric and PS symmetric with respect to a center axis parallel to the row direction.

In some implementations, a universal optical fiber interconnection cable:

a. Comprises n_trx strands of TX/RX fibers and n_p strands of power supply fibers, in which 0≤n_p≤n_trx.

b. The n_trx strands of TX/RX fibers are mapped 1:1 from a first optical fiber connector to the same port positions on a second optical fiber connector through the optical fiber cable, i.e. the optical fiber cable can be laid out in a straight manner without leading to any cross-over fiber strands.

c. Those connector ports that are not 1:1 connected by TX/RX fibers may be connected to power supply fibers via a break-out cable.

In some implementations, a universal optical module connector has the following properties:

a. Starting from a connector port map PM0.

b. First mirror port map PM0 either across the row dimension or across the column dimension.

c. Mirroring can be done either across a column axis or across a row axis.

d. Replace TX ports by RX ports and vice versa.

e. If at least one mirrored and replaced version of the port map again results in the starting port map PM0, the connector is called a universal optical module connector.

In FIG. 89, the arrangement of the transmitter, receiver, and power supply fiber ports in the first optical fiber connector 1662, and the arrangement of the transmitter, receiver, and power supply fiber ports in the second optical fiber connector 1664 have the two properties described above. First property: When looking into the optical fiber connector (from the outer edge of the connector inward toward the optical fibers), the mapping of the transmitter, receiver, and power supply fiber ports in the first optical fiber connector 1662 is the same as the mapping of the transmitter, receiver, and power supply fiber ports in the optical fiber connector 1664. Row 1, column 1 of the optical fiber connector 1662 is a power supply fiber port (1622*a*), and row 1, column 1 of the optical fiber connector 1664 is also a power supply fiber port (1622*b*). Row 1, column 3 of the optical fiber connector 1662 is a transmitter fiber port (1614*a*), and row 1, column 3 of the optical fiber connector 1664 is also a transmitter fiber port (1614*b*). Row 1, column 10 of the optical fiber connector 1662 is a receiver fiber port (1618*a*), and row 1, column 10 of the optical fiber connector 1664 is also a receiver fiber port (1618*b*), and so forth.

The optical fiber connectors 1662 and 1664 have the second universal optical fiber interconnection cable port mapping property described above. The port mapping of the optical fiber connector 1662 is a mirror image of the port mapping of the optical fiber connector 1664 after swapping each transmitter port to a receiver port and swapping each receiver port to a transmitter port in the mirror image. The mirror image is generated with respect to a reflection axis 1626 at the connector edge that is parallel to the column direction. The power supply fiber ports (e.g., 1662*a*, 1624*a*) of the optical fiber connector 1662 are mirror images of the power supply fiber ports (e.g., 1622*b*, 1624*b*) of the optical fiber connector 1664. The transmitter fiber ports (e.g., 1614*a*, 1616*a*) of the optical fiber connector 1662 and the receiver fiber ports (e.g., 1618*b*, 1620*b*) of the optical fiber connector 1664 are pairwise mirror images of each other, i.e., each transmitter fiber port (e.g., 1614*a*, 1616*a*) of the optical fiber connector 1662 is mirrored to a receiver fiber port (e.g., 1618*b*, 1620*b*) of the optical fiber connector 1664. The receiver fiber ports (e.g., 1618*a*, 1620*a*) of the optical fiber connector 1662 and the transmitter fiber ports (e.g., 1618*b*, 1620*b*) of the optical fiber connector 1664 are pairwise mirror images of each other, i.e., each receiver fiber port (e.g., 1618*a*, 1620*a*) of the optical fiber connector 1662 is mirrored to a transmitter fiber port (e.g., 1618*b*, 1620*b*) of the optical fiber connector 1664.

For example, the power supply fiber port 1622*a* at row 1, column 1 of the optical fiber connector 1662 is a mirror image of the power supply fiber port 1624*b* at row 1, column 12 of the optical fiber connector 1664 with respect to the reflection axis 1626. The power supply fiber port 1624*a* at row 1, column 12 of the optical fiber connector 1662 is a mirror image of the power supply fiber port 1622*b* at row 1, column 1 of the optical fiber connector 1664. The transmitter fiber port 1614*a* at row 1, column 3 of the optical fiber connector 1662 and the receiver fiber port 1618*b* at row 1, column 10 of the optical fiber connector 1604 are pairwise mirror images of each other. The receiver fiber port 1618*a* at row 1, column 10 of the optical fiber connector 1662 and the transmitter fiber port 1614*b* at row 1, column 3 of the optical fiber connector 1664 are pairwise mirror images of each other. The transmitter fiber port 1616*a* at row 3, column 3 of the optical fiber connector 1662 and the receiver fiber port 1620*b* at row 3, column 10 of the optical fiber connector 1664 are pairwise mirror images of each other. The receiver fiber port 1620*a* at row 3, column 10 of the optical fiber connector 1662 and the transmitter fiber port 1616*b* at row 3, column 3 of the optical fiber connector 1664 are pairwise mirror images of each other.

In addition, and as an alternate view of the second property, each optical fiber connector 1662, 1664 is TX-RX pairwise symmetric and PS symmetric with respect to the center axis that is parallel to the column direction. Using the first optical fiber connector 1662 as an example, the power supply fiber ports (e.g., 1622*a*, 1624*a*) are symmetric with respect to the center axis, i.e., if there is a power supply fiber port in the left half portion of the first optical fiber connector 1662, there will also be a power supply fiber port at the mirror location in the right half portion of the first optical fiber connector 1662. The transmitter fiber ports and the receiver fiber ports are pairwise symmetric with respect to the main axis, i.e., if there is a transmitter fiber port in the left half portion of the first optical fiber connector 1662, there will be a receiver fiber port at a mirror location in the right half portion of the first optical fiber connector 1662. Likewise, if there is a receiver fiber port in the left half portion of the optical fiber connector 1662, there will be a transmitter fiber port at a mirror location in the right half portion of the optical fiber connector 1662.

If the port mapping of the first optical fiber connector 1662 is represented by port matrix M with entries PS=0, TX=+1, RX=−1, then $-\overleftrightarrow{M}=M$, in which $\overleftrightarrow{M}$ represents the column-mirror operation, e.g., generating a mirror image with respect to the reflection axis 1626.

FIG. 90 is a diagram showing another example of the fiber port mapping for an optical fiber interconnection cable 1670 that includes a pair of optical fiber connectors, i.e., a first optical fiber connector 1672 and a second optical fiber connector 1674. FIG. 143 is an enlarged view of the diagram of FIG. 90. The power supply power ports are labeled ‘P’, the transmitter fiber ports are labeled ‘T’, and the receiver fiber ports are labeled ‘R’. Only some of the fiber ports are labeled in the figure. In the diagram, the port mapping for the second optical fiber connector 1674 is the same as that of optical fiber connector 1672. The optical fiber interconnection cable 1670 has the two universal optical fiber interconnection cable port mapping properties described above.

First property: The mapping of the transmitter, receiver, and power supply fiber ports in the first optical fiber connector 1672 is the same as the mapping of the transmitter, receiver, and power supply fiber ports in the second optical fiber connector 1674.

Second property: The port mapping of the first optical fiber connector 1672 is a mirror image of the port mapping of the second optical fiber connector 1674 after swapping each transmitter port to a receiver port and swapping each receiver port to a transmitter port in the mirror image. The mirror image is generated with respect to a reflection axis 1640 at the connector edge parallel to the row direction.

Alternative view of the second property: Each of the first and second optical fiber connectors 1672, 1674 is TX-RX pairwise symmetric and PS symmetric with respect to the central axis that is parallel to the row direction. For example, the optical fiber connector 1672 can be divided in two halves along a central axis parallel to the row direction. The power supply fiber ports (e.g., 1678, 1680) are symmetric with respect to the center axis. The transmitter fiber ports (e.g., 1682, 1684) and the receiver fiber ports (e.g., 1686, 1688) are pairwise symmetric with respect to the center axis, i.e., if there is a transmitter fiber port (e.g., 1682 or 1684) in the upper half portion of the first optical fiber connector 1672, then there will be a receiver fiber port (e.g., 1686, 1688) at a mirror location in the lower half of the optical fiber connector 1672. Likewise, if there is a receiver fiber port in the upper half portion of the optical fiber connector 1672, then there is a transmitter fiber port at a mirror location in the lower half portion of the optical fiber connector 1672. In the example of FIG. 90, the middle row 1690 should all be power supply fiber ports.

In general, if the port mapping of the first optical fiber connector is a mirror image of the port mapping of the second optical fiber connector after swapping the transmitter and receiver ports in the mirror image, the mirror image is generated with respect to a reflection axis at the connector edge parallel to the row direction (as in the example of FIG. 90), and there is an odd number of rows in the port matrix, then the center row should all be power supply fiber ports. If the port mapping of the first optical fiber connector is a mirror image of the port mapping of the second optical fiber connector after swapping the transmitter and receiver ports in the mirror image, the mirror image is generated with respect to a reflection axis at the connector edge parallel to the column direction, and there is an odd number of columns in the port matrix, then the center column should all be power supply fiber ports.

FIG. 91 is a diagram of an example of a viable port mapping for an optical fiber connector 1700 of a universal optical fiber interconnection cable. FIG. 144 shows the diagram of FIG. 91 in which the power supply power ports 1702 are labeled 'P', the transmitter fiber ports 1704 are labeled 'T', and the receiver fiber ports 1706 are labeled 'R'. The optical fiber connector 1700 includes power supply fiber ports (e.g., 1702), transmitter fiber ports (e.g., 1704), and receiver fiber ports (e.g., 1706). The optical fiber connector 1700 is TX-RX pairwise symmetric and PS symmetric with respect to the center axis that is parallel to the column direction.

FIG. 92 is a diagram of an example of a viable port mapping for an optical fiber connector 1710 of a universal optical fiber interconnection cable. FIG. 145 shows the diagram of FIG. 92 in which the power supply power ports are labeled 'P', the transmitter fiber ports are labeled 'T', and the receiver fiber ports are labeled 'R'. The optical fiber connector 1710 includes power supply fiber ports (e.g., 1712), transmitter fiber ports (e.g., 1714), and receiver fiber ports (e.g., 1716). The optical fiber connector 1710 is TX-RX pairwise symmetric and PS symmetric with respect to the center axis that is parallel to the column direction.

FIG. 93 is a diagram of an example of a port mapping for an optical fiber connector 1720 that is not appropriate for a universal optical fiber interconnection cable. FIG. 146 shows the diagram of FIG. 93 in which the power supply power ports are labeled 'P', the transmitter fiber ports are labeled 'T', and the receiver fiber ports are labeled 'R'. The optical fiber connector 1720 includes power supply fiber ports (e.g., 1722), transmitter fiber ports (e.g., 1724), and receiver fiber ports (e.g., 1726). The optical fiber connector 1720 is not TX-RX pairwise symmetric with respect to the center axis that is parallel to the column direction, or the center axis that is parallel to the row direction.

Figure 94:
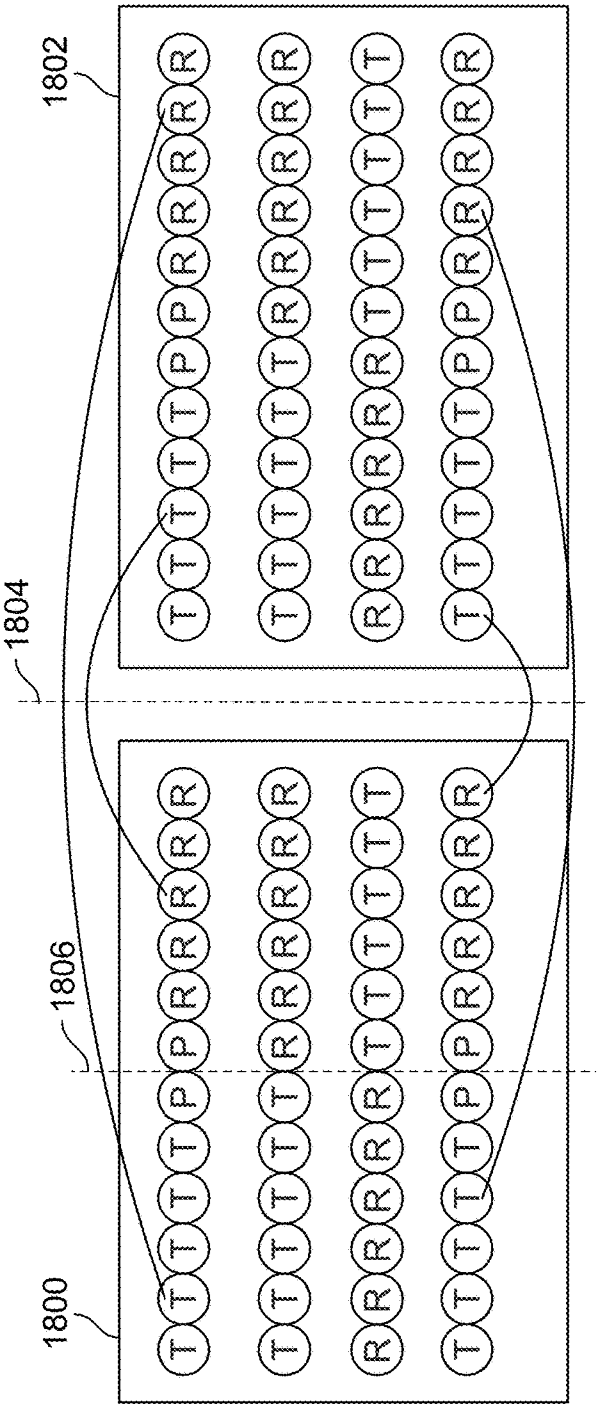
FIGS. 94 and 95 are diagrams of examples of viable port mapping for optical fiber connectors of universal optical fiber interconnection cables.

FIG. 94 is a diagram of an example of a viable port mapping for a universal optical fiber interconnection cable that includes a pair of optical fiber connectors, i.e., a first optical fiber connector 1800 and a second optical fiber connector 1802. The power supply power ports are labeled 'P', the transmitter fiber ports are labeled 'T', and the receiver fiber ports are labeled 'R'. The mapping of the transmitter, receiver, and power supply fiber ports in the first optical fiber connector 1800 is the same as the mapping of the transmitter, receiver, and power supply fiber ports in the second optical fiber connector 1802. The port mapping of the first optical fiber connector 1800 is a mirror image of the port mapping of the second optical fiber connector 1802 after swapping the transmitter and receiver ports in the mirror image. The mirror image is generated with respect to a reflection axis 1804 at the connector edge parallel to the column direction. The optical fiber connector 1800 is TX-RX pairwise symmetric and PS symmetric with respect to the center axis 1806 that is parallel to the column direction.

Figure 95:
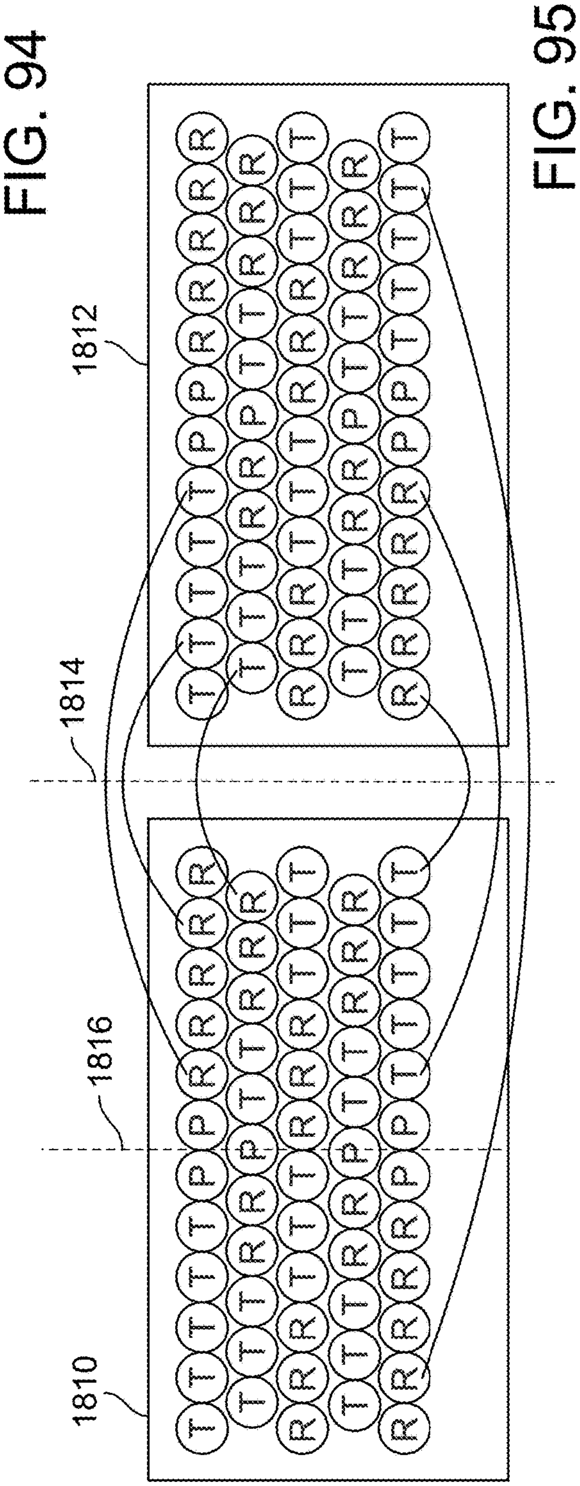

FIG. 95 is a diagram of an example of a viable port mapping for a universal optical fiber interconnection cable that includes a pair of optical fiber connectors, i.e., a first optical fiber connector 1810 and a second optical fiber connector 1812. The power supply power ports are labeled 'P', the transmitter fiber ports are labeled 'T', and the receiver fiber ports are labeled 'R'. The mapping of the transmitter, receiver, and power supply fiber ports in the first optical fiber connector 1810 is the same as the mapping of the transmitter, receiver, and power supply fiber ports in the second optical fiber connector 1812. The port mapping of the first optical fiber connector 1810 is a mirror image of the port mapping of the second optical fiber connector 1812 after swapping the transmitter and receiver ports in the mirror image. The mirror image is generated with respect to a reflection axis 1814 at the connector edge parallel to the column direction. The optical fiber connector 1810 is TX-RX pairwise symmetric and PS symmetric with respect to the center axis 1816 that is parallel to the column direction.

In the example of FIG. 95, the first, third, and fifth rows each has an even number of fiber ports, and the second and fourth rows each has an odd number of fiber ports. In general, a viable port mapping for a universal optical fiber interconnection cable can be designed such that an optical fiber connector includes (i) rows that all have even numbers of fiber ports, (ii) rows that all have odd numbers of fiber ports, or (iii) rows that have mixed even and odd numbers of fiber ports. A viable port mapping for a universal optical fiber interconnection cable can be designed such that an optical fiber connector includes (i) columns that all have even numbers of fiber ports, (ii) columns that all have odd numbers of fiber ports, or (iii) columns that have mixed even and odd numbers of fiber ports.

The optical fiber connector of a universal optical fiber interconnection cable does not have be a rectangular shape as shown in the examples of FIGS. 89, 90, 92 to 95. The optical fiber connectors can also have an overall triangular, square, pentagonal, hexagonal, trapezoidal, circular, oval, or n-sided polygon shape, in which n is an integer larger than 6, as long as the arrangement of the transmitter, receiver, and power supply fiber ports in the optical fiber connectors have the three universal optical fiber interconnection cable port mapping properties described above.

In the examples of FIGS. 80A, 82A, 84A, and 87A, the switch boxes (e.g., 1302, 1304) includes co-packaged optical modules (e.g., 1312, 1316) that is optically coupled to the optical fiber interconnection cables or optical cable assemblies (e.g., 1340, 1400, 1490) through fiber array connectors. For example, the fiber array connector can correspond to the first optical connector part 213 in FIG. 20. The optical fiber connector (e.g., 1342, 1344, 1402, 1404, 1492, 1498) of the optical cable assembly can correspond to the second optical connector part 223 in FIG. 20. The port map (i.e., mapping of power supply fiber ports, transmitter fiber ports, and receiver fiber ports) of the fiber array connector (which is optically coupled to the photonic integrated circuit) is a mirror image of the port map of the optical fiber connector (which is optically coupled to the optical fiber interconnection cable). The port map of the fiber array connector refers to the arrangement of the power supply, transmitter, and receiver fiber ports when viewed from an external edge of the fiber array connector into the fiber array connector.

As described above, universal optical fiber connectors have symmetrical properties, e.g., each optical fiber connector is TX-RX pairwise symmetric and PS symmetric with respect to one of the main or center axes, which can be parallel to the row direction or the column direction. The fiber array connector also has the same symmetrical properties, e.g., each fiber array connector is TX-RX pairwise symmetric and PS symmetric with respect to one of the main or center axes, which can be parallel to the row direction or the column direction.

In some implementations, a restriction can be imposed on the port mapping of the optical fiber connectors of the optical cable assembly such that the optical fiber connector can be pluggable when rotated by 180 degrees, or by 90 degrees in the case of a square connector. This results in further port mapping constraints.

Figure 101:
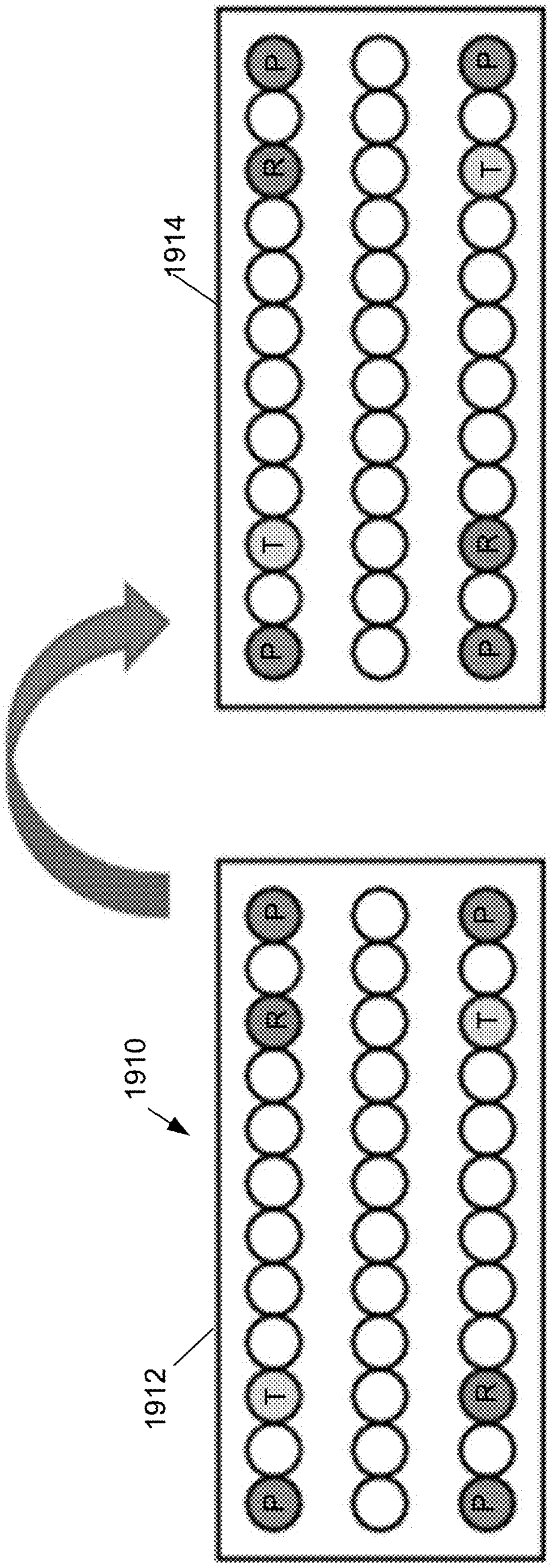
FIGS. 101, 102, 103A, and 103B are diagrams of examples of optical fiber connectors.

FIG. 101 is a diagram of an example of an optical fiber connector 1910 having a port map 1912 that is invariant against a 180-degree rotation. Rotating the optical fiber connector 1910 180 degrees results in a port map 1914 that is the same as the port map 1912. The port map 1912 also satisfies the second universal optical fiber interconnection cable port mapping property, e.g., the optical fiber connector is TX-RX pairwise symmetric and PS symmetric with respect to the center axis parallel to the column direction.

Figure 102:
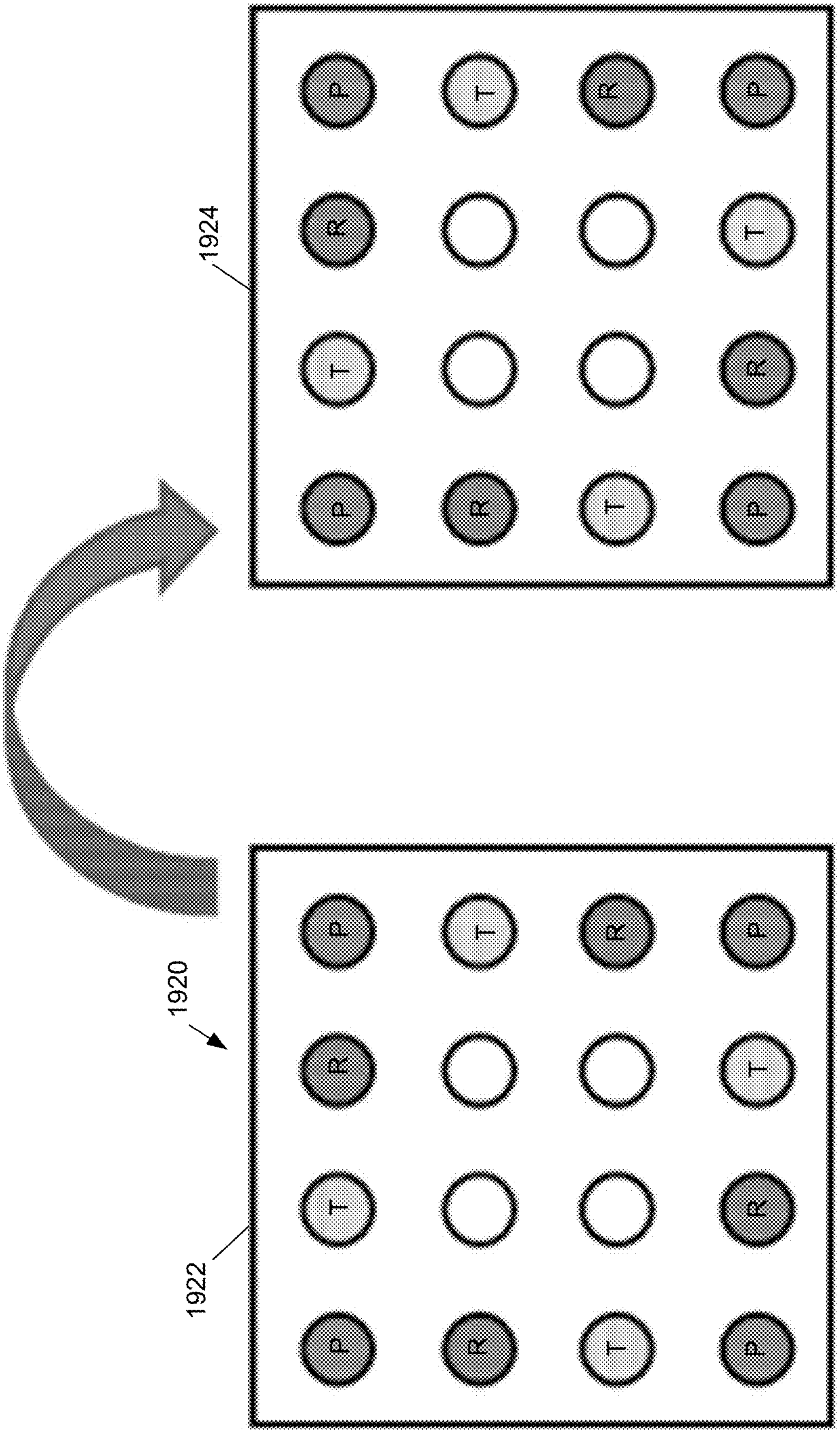

FIG. 102 is a diagram of an example of an optical fiber connector 1920 having a port map 1922 that is invariant against a 90-degree rotation. Rotating the optical fiber connector 1920 180 degrees results in a port map 1924 that is the same as the port map 1922. The port map 1922 also satisfies the second universal optical fiber interconnection cable port mapping property, e.g., the optical fiber connector is TX-RX pairwise symmetric and PS symmetric with respect to the center axis parallel to the column direction.

Figure 103A:
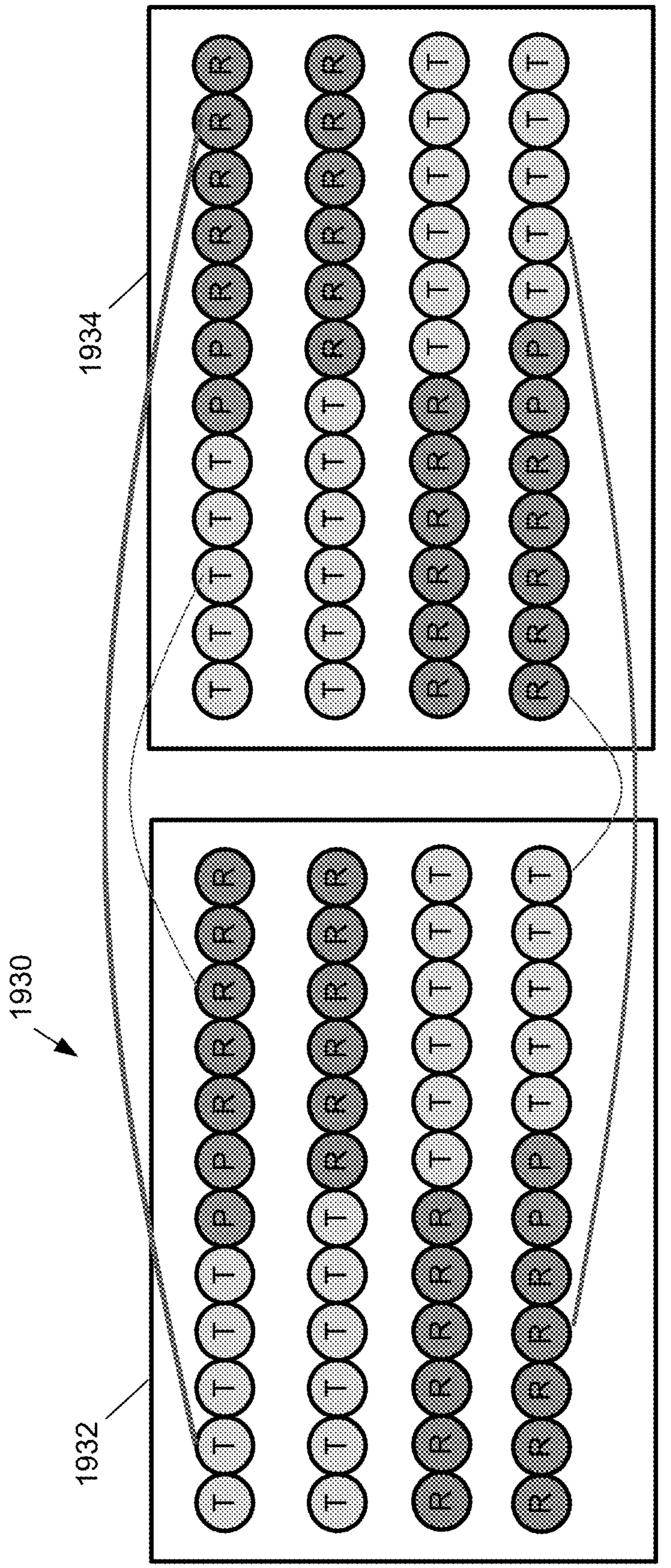

FIG. 103A is a diagram of an example of an optical fiber connector 1930 having a port map 1932 that is TX-RX pairwise symmetric and PS symmetric with respect to the center axis parallel to the column direction. When mirroring the port map 1932 to generate a mirror image 1934 and replacing each transmitter port with a receiver port as well as replacing each receiver port with a transmitter port in the mirror image 1934, the original port map 1932 is recovered. The mirror image 1934 is generated with respect to a reflection axis at the connector edge parallel to the column direction.

Figure 103B:
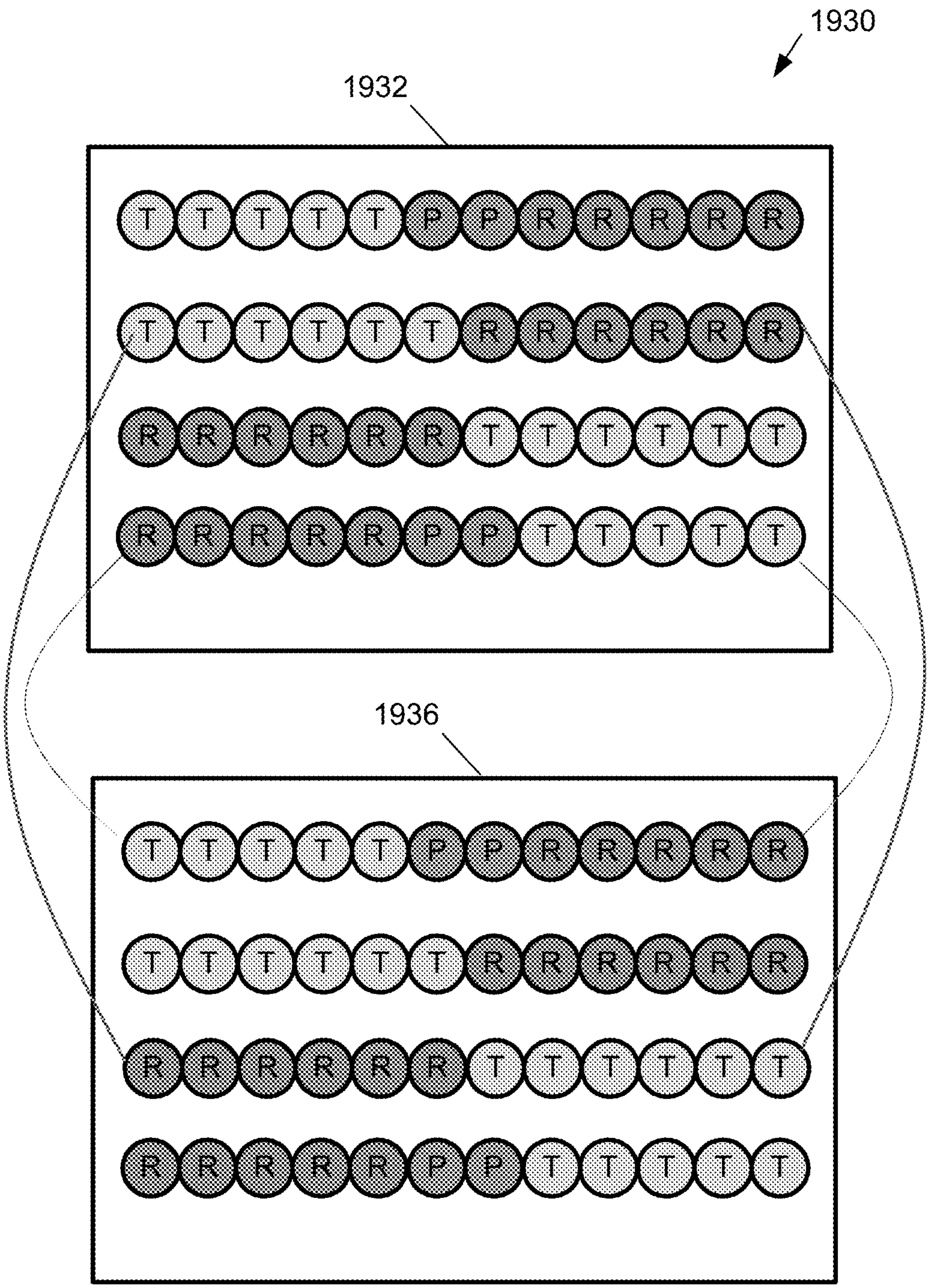

Referring to FIG. 103B, the port map 1932 of the optical fiber connector 1930 is also TX-RX pairwise symmetric and PS symmetric with respect to the center axis parallel to the row direction. When mirroring the port map 1932 to generate a mirror image 1936 and replacing each transmitter port with a receiver port as well as replacing each receiver port with a transmitter port in the mirror image 1936, the original port map 1932 is recovered. The mirror image 1936 is generated with respect to a reflection axis at the connector edge parallel to the row direction.

In the examples of FIGS. 69A to 78, 96 to 98, and 100, one or more fans (e.g., 1086, 1092, 1848, 1894) blow air across the heatsink (e.g., 1072, 1114, 1130, 1168, 1846) thermally coupled to the data processor (e.g., 1844). The co-packaged optical modules can generate heat, in which some of the heat can be directed toward the heatsink and dissipated through the heatsink. To further improve heat dissipation from the co-packaged optical modules, in some implementations, the rackmount system includes two fans placed side-by-side, in which a first fan blows air toward the co-packaged optical modules that are mounted on a front side of the printed circuit board (e.g., 1068), and a second fan blows air toward the heatsink that is thermally coupled to the data processor mounted on a rear side of the printed circuit board.

In some implementations, the one or more fans can have a height that is smaller than the height of the housing (e.g., 1824) of the rackmount server (e.g., 1820). The co-packaged optical modules (e.g., 1074) can occupy a region on the printed circuit board (e.g., 1068) that extends in the height direction greater than the height of the one or more fans. One or more baffles can be provided to guide the cool air from the one or more fans or intake air duct to the heatsink and the co-packaged optical modules. One or more baffles can be provided to guide the warm air from the heatsink and the co-packaged optical modules to an air duct that directs the air toward the rear of the housing.

When the one or more fans have a height that is smaller than the height of the housing (e.g., 1824), the space above and/or below the one or more fans can be used to place one or more remote laser sources. The remote laser sources can be positioned near the front panel and also near the co-packaged optical modules. This allows the remote laser sources to be serviced conveniently.

Figure 104:
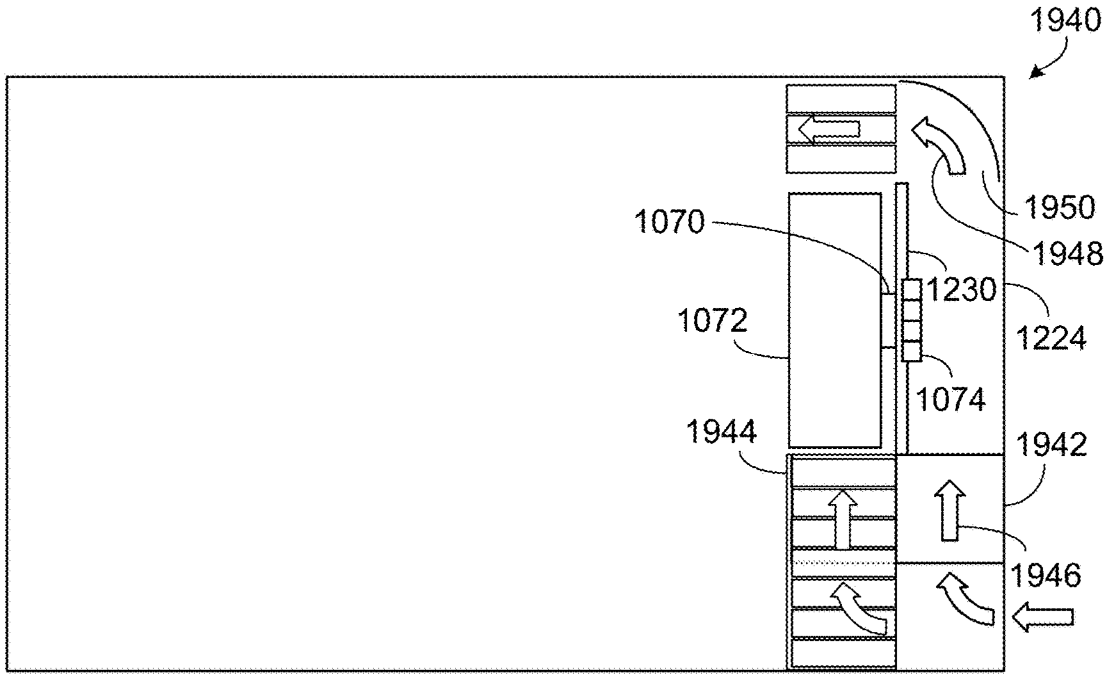
FIGS. 104 and 105 are a top view and a front view, respectively, of an example of a rackmount device that includes a vertical printed circuit board on which co-packaged optical modules are mounted.

FIG. 104 shows a top view of an example of a rackmount device 1940. The rackmount device 1940 includes a vertically oriented printed circuit board 1230 positioned at a distance behind a front panel 1224 that can be closed during normal operation of the device, and opened for maintenance of the device, similar to the configuration of the rackmount server 1220 of FIG. 77A. A data processing chip 1070 is electrically coupled to the rear side of the vertical printed circuit board 1230, and a heat dissipating device or heat sink 1072 is thermally coupled to the data processing chip 1070. Co-packaged optical modules 1074 are attached to the front side (i.e., the side facing the front exterior of the housing 1222) of the vertical printed circuit board 1230. A first fan 1942 is provided to blow air across the co-packaged optical modules 1074 at the front side of the printed circuit board 1230. A second fan 1944 is provided to blow air across the heatsink 1072 to the rear of the printed circuit board 1230. The first and second fans 1942, 1944 are positioned at the left of the printed circuit board 1230. Cooler air (represented by arrows 1946) is directed from the first and second fans 1942, 1944 toward the heatsink 1072 and the co-packaged optical modules 1074. Warmer air (represented by arrows 1948) is directed from the heatsink 1072 and the co-packaged optical modules 1074 through an air duct 1950 positioned at the right of the printed circuit board 1230 toward the rear of the housing.

Figure 105:
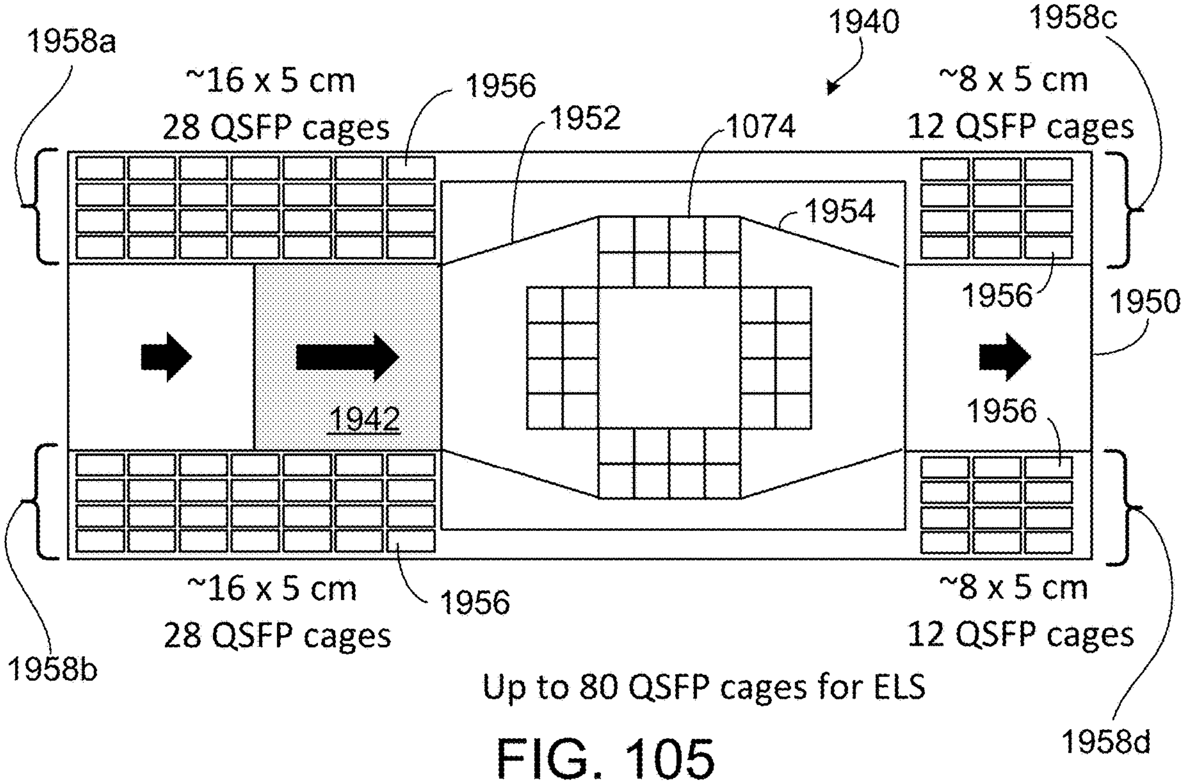

FIG. 105 shows a front view of an example of the rackmount device 1940 when the front panel 1224 is opened to allow access to the co-packaged optical modules 1074. The first and second fans 1942, 1944 have a height that is smaller than the height of the region occupied by the co-packaged optical modules 1074. A first baffle 1952 directs the air from the fan 1942 to the region where the co-packaged optical modules 1074 are mounted, and a second baffle 1954 directs the air from the region where the co-packaged optical modules 1074 are mounted to the air duct 1950.

In this example, the first and second fans 1942, 1944 have a height that is smaller than the height of the housing of the rackmount device 1940. Remote laser sources 1956 can be positioned above and below the fans. Remote laser sources 1956 can also be positioned above and below the air duct 1950.

For example, a switch device having a 51.2 Tbps bandwidth can use thirty-two 1.6 Tbps co-packaged optical modules. Two to four power supply fibers (e.g., 1326 in FIG. 80A) can be provided for each co-packaged optical module, and a total of 64 to 128 power supply fibers can be used to provide optical power to the 32 co-packaged optical modules. One or two laser modules at 500 mW each can be used to provide the optical power to each co-packaged optical module, and 32 to 64 laser modules can be used to provide the optical power to the 32 co-packaged optical modules. The 32 to 64 laser modules can be fitted in the space above and below the fans 1942, 1944 and the air duct 1950.

For example, the area 1958*a* above the fans 1942, 1944 can have an area (measured along a plane parallel to the front panel) of about 16 cm×5 cm and can fit about 28 QSFP cages, and the area 1958*b* below the fans can have an area of about 16 cm×5 cm and can fit about 28 QSFP cages. The area 1958*c* above the air duct 1950 can have an area of about 8 cm×5 cm and can fit about 12 QSFP cages, and the area 1958*d* below the air duct 1950 can have an area of about 8 cm×5 cm and can fit about 12 QSFP cages. Each QSFP cage can include a laser module. In this example, a total of 80 QSFP cages can be fit above and below the fans and the air duct, allowing 80 laser modules to be positioned near the front panel and near the co-packaged optical modules, making it convenient to service the laser modules in the event of malfunction or failure.

Figure 106:
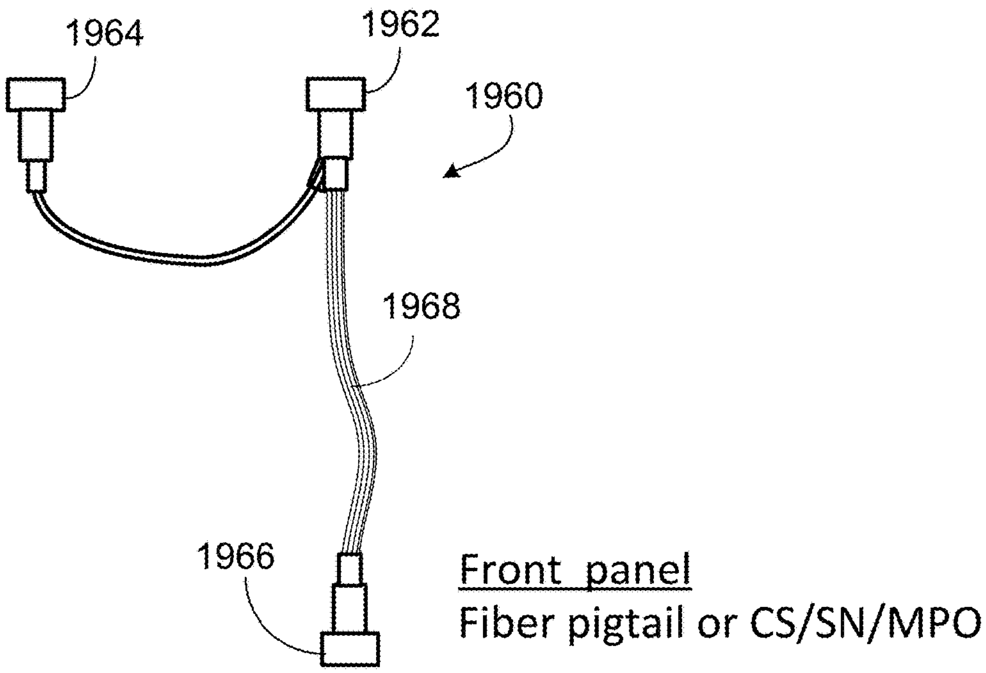
FIG. 106 is a diagram of an example of an optical cable assembly.
Figure 107:
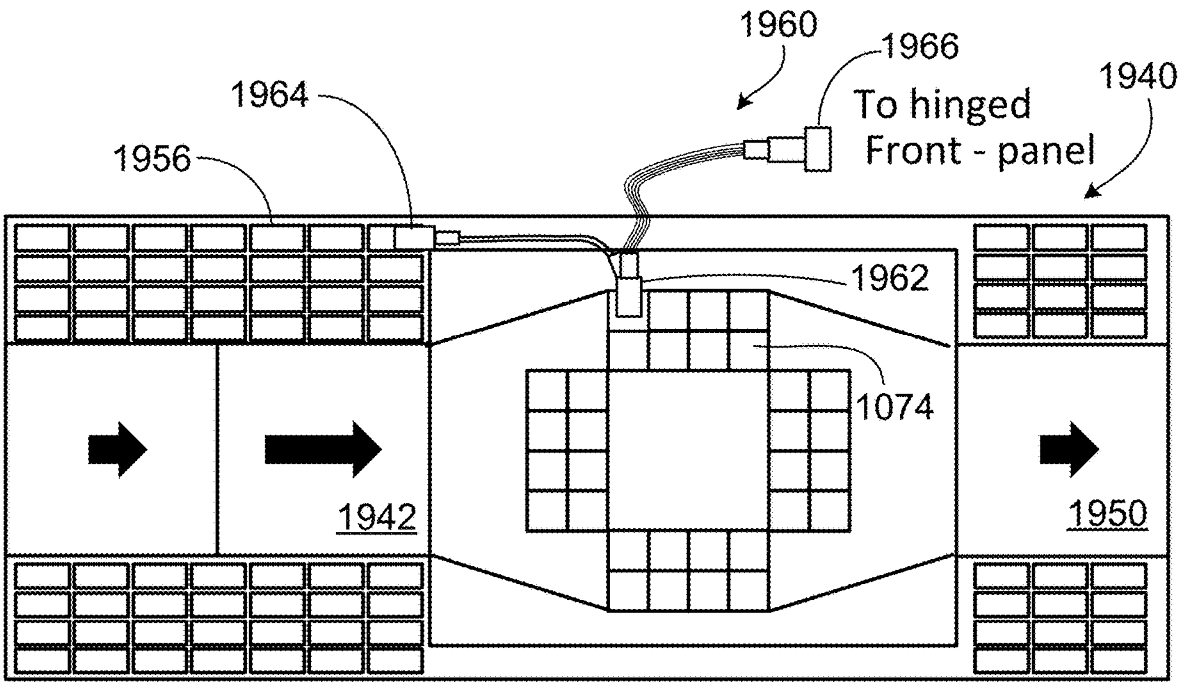
FIG. 107 is a front view diagram of the rackmount device with the optical cable assembly.

Referring to FIGS. 106 and 107, an optical cable assembly 1960 includes a first fiber connector 1962, a second fiber connector 1964, and a third fiber connector 1966. The first fiber connector 1962 can be optically connected to the co-packaged optical module 1074, the second fiber connector 1964 can be optically connected to the laser module, and the third fiber connector 1966 can be optically connected to the fiber connector part (e.g., 1232 of FIG. 77A) at the front panel 1224. The first fiber connector 1962 can have a configuration similar to that of the fiber connector 1342 of FIGS. 80C, 80D. The second fiber connector 1964 can have a configuration similar to that of the fiber connector 1346. The third fiber connector 1966 can have a configuration similar to that of the first fiber connector 1962 but without the power supply fiber ports. The optical fibers 1968 between the first fiber connector 1962 and the third fiber connector 1966 perform the function of the fiber jumper 1234 of FIG. 77A.

Figure 108:
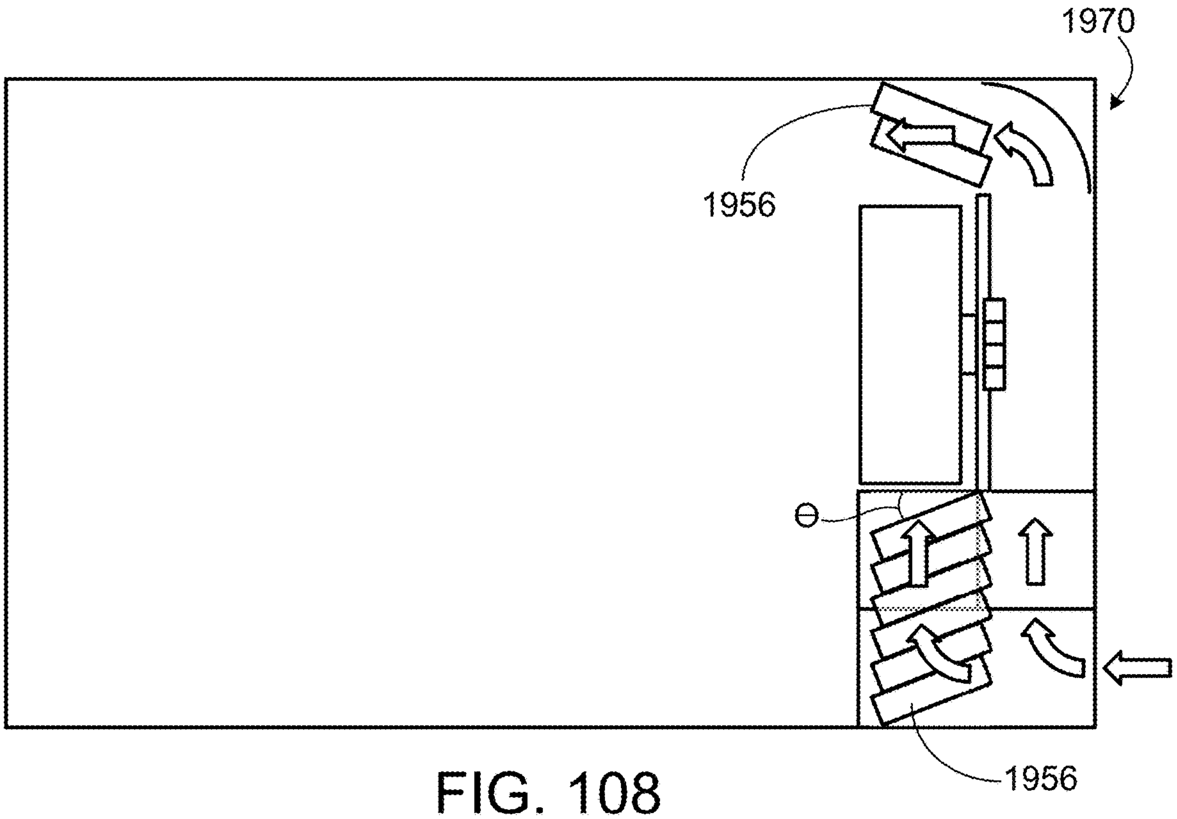
FIG. 108 is a top view diagram of an example of a rackmount device that includes a vertical printed circuit board on which co-packaged optical modules are mounted.

FIG. 108 is a diagram of an example of a rackmount device 1970 that is similar to the rackmount device 1940 of FIGS. 104, 105, 107, except that the optical axes of the laser modules 1956 are oriented at an angle θ relative to the front-to-rear direction, 0<θ<90°. This can reduce the bending of the optical fibers that are optically connected to the laser modules 1956.

Figure 109:
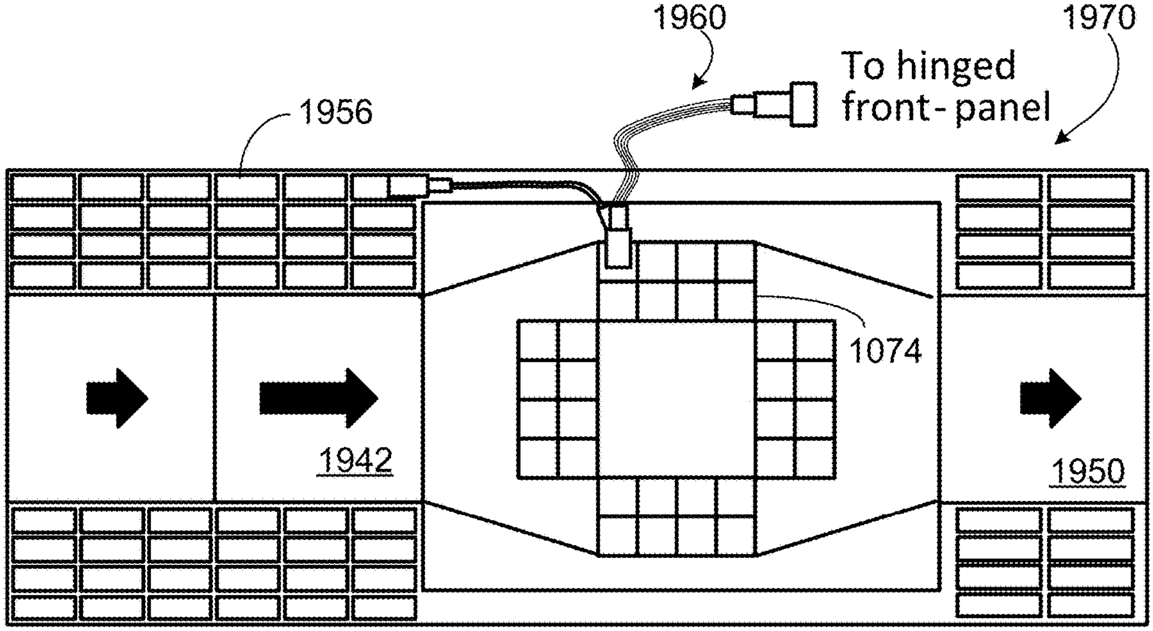
FIG. 109 is a front view diagram of the rackmount device with the optical cable assembly.

FIG. 109 is a diagram showing the front view of the rackmount device 1970, with the optical cable assembly 1960 optically connected to modules of the rackmount device 1970. When the laser modules 1956 are oriented at an angle θ relative to the front-to-rear direction, 0<θ<90°, fewer laser modules 1956 can be placed in the spaces above and below the fans 1942, 1944 and the air duct 1950, as compared to the example of FIGS. 104, 105, 107, in which the optical axes of the laser modules 1956 are oriented parallel to the front-to-rear direction. In the example of FIG. 109, a total of 64 laser modules are placed in the spaces above and below the fans 1942, 1944 and the air duct 1950.

Figure 110:
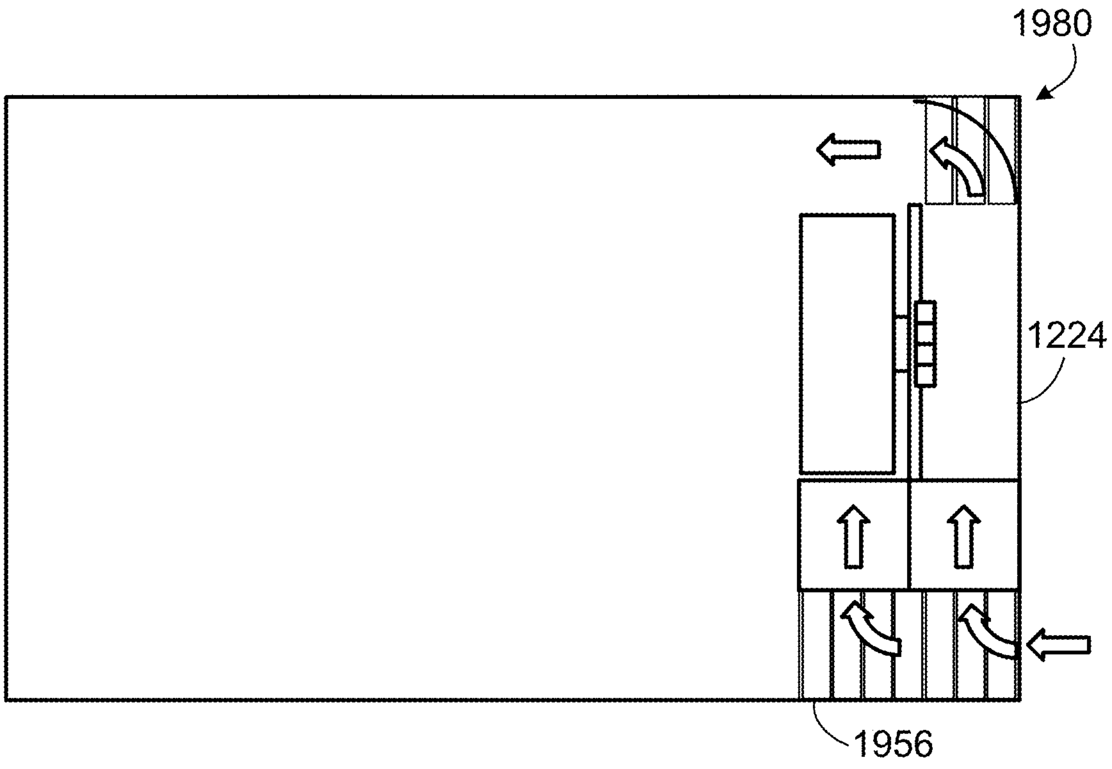
FIGS. 110 and 111 are a top view and a front view, respectively, of an example of a rackmount device.

FIG. 110 is a top view diagram of an example of a rackmount device 1980 that is similar to the rackmount device 1940 of FIGS. 104, 105, 107, except that the optical axes of the laser modules 1956 are oriented parallel to the front panel 1224. This can reduce the bending of the optical fibers that are optically connected to the laser modules 1956.

Figure 111:
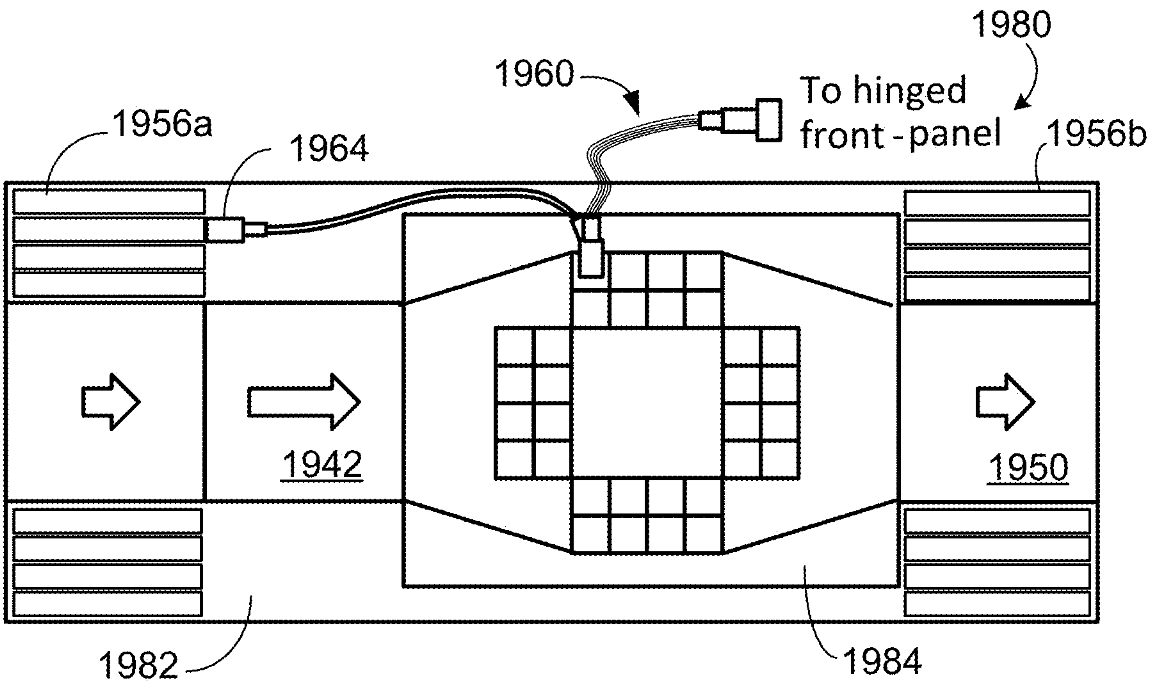

FIG. 111 is a front view diagram of the rackmount device 1980, with the optical cable assembly 1960 optically connected to modules of the rackmount device 1980. The laser modules 1956*a* are positioned to the left side of the space above and below the fans 1942, 1944. Sufficient space (e.g., 1982) is provided at the right of the laser modules 1956*a* to allow the user to conveniently connect or disconnect the fiber connectors 1964 to the laser modules 1956*a*. The laser modules 1956*b* are positioned above and below the air duct 1950. Sufficient space (e.g., 1984) is provided at the left of the laser modules 1956*b* to allow the user to conveniently connect or disconnect the fiber connectors 1964 to the laser modules 1956*b*.

Figure 112:
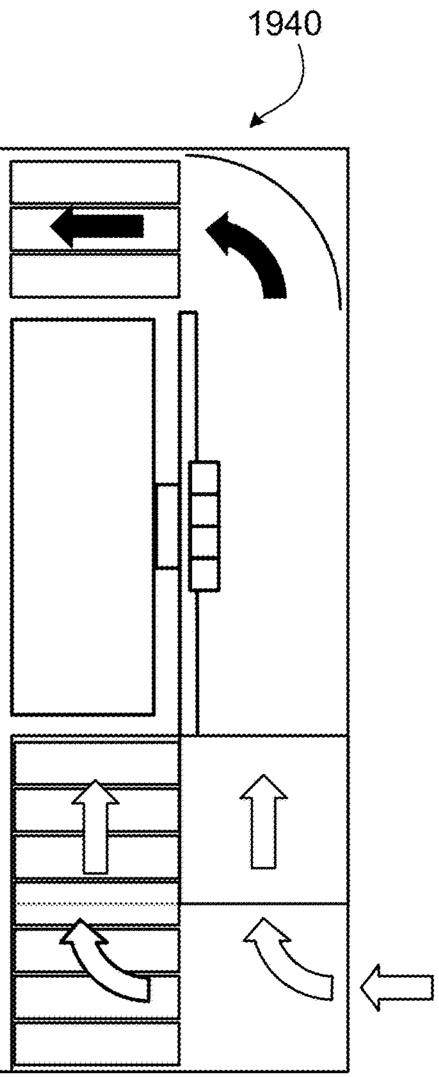
FIG. 112 is diagram of an example of a rackmount device with example parameter values.

Referring to FIG. 112, a table 1990 shows example parameter values of the rackmount device 1940.

Figure 113:
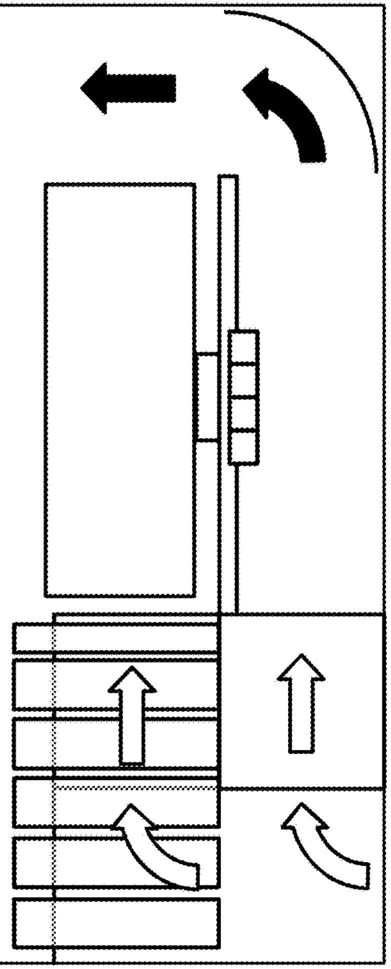
FIGS. 113 and 114 show another example of a rackmount device with example parameter values.
Figure 114:
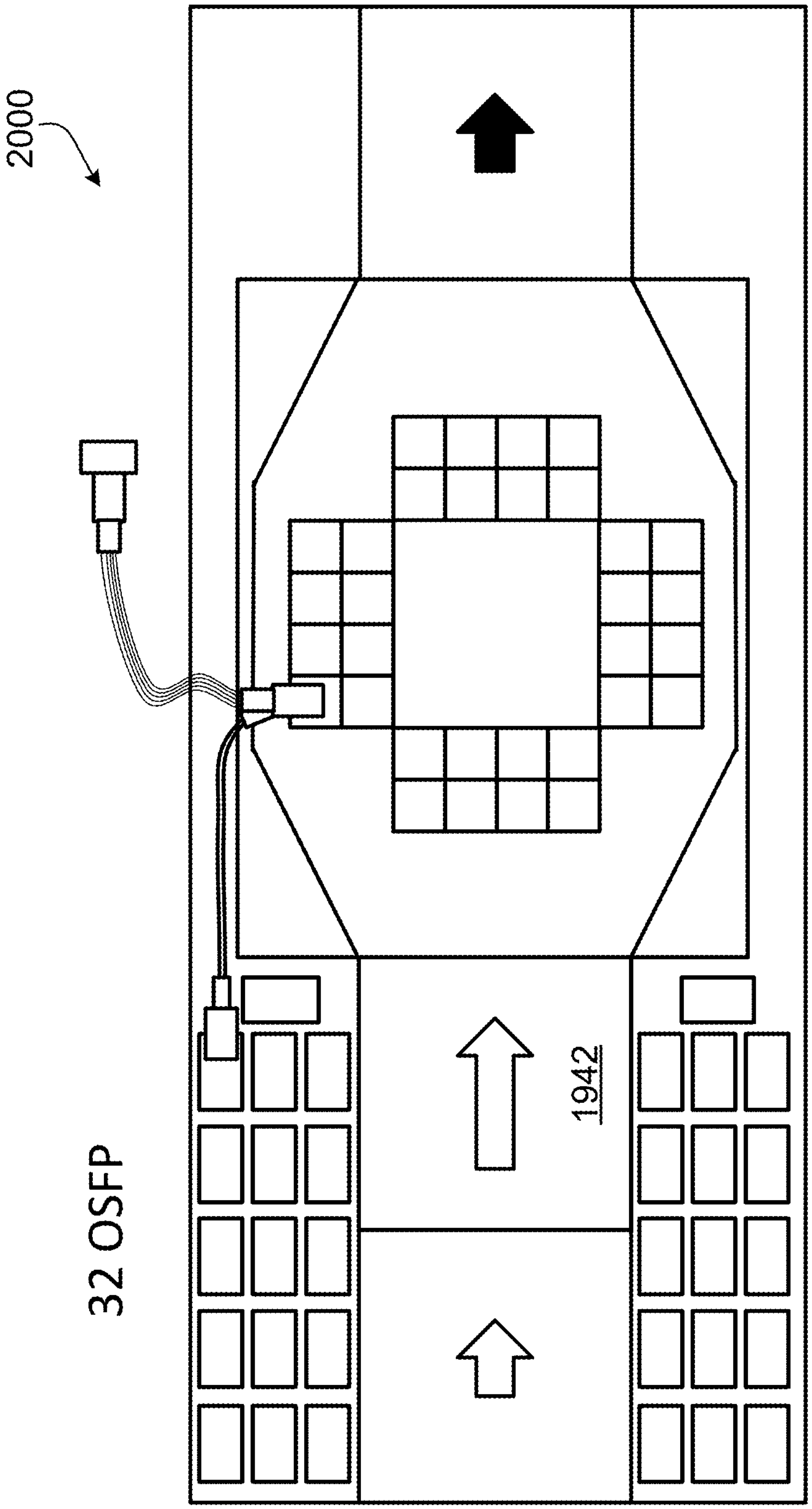

FIGS. 113 and 114 show another example of a rackmount device 2000 and example parameter values.

Figure 115:
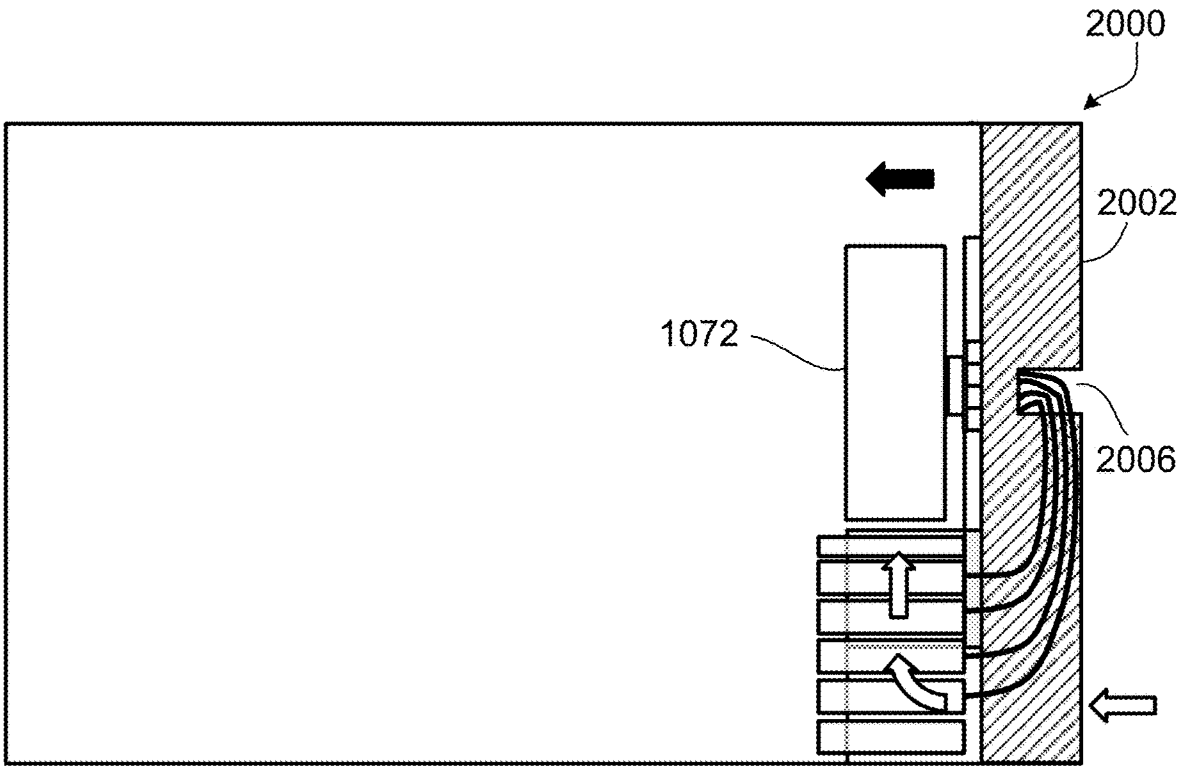
FIGS. 115 and 116 are a top view and a front view, respectively, of an example of a rackmount device.
Figure 116:
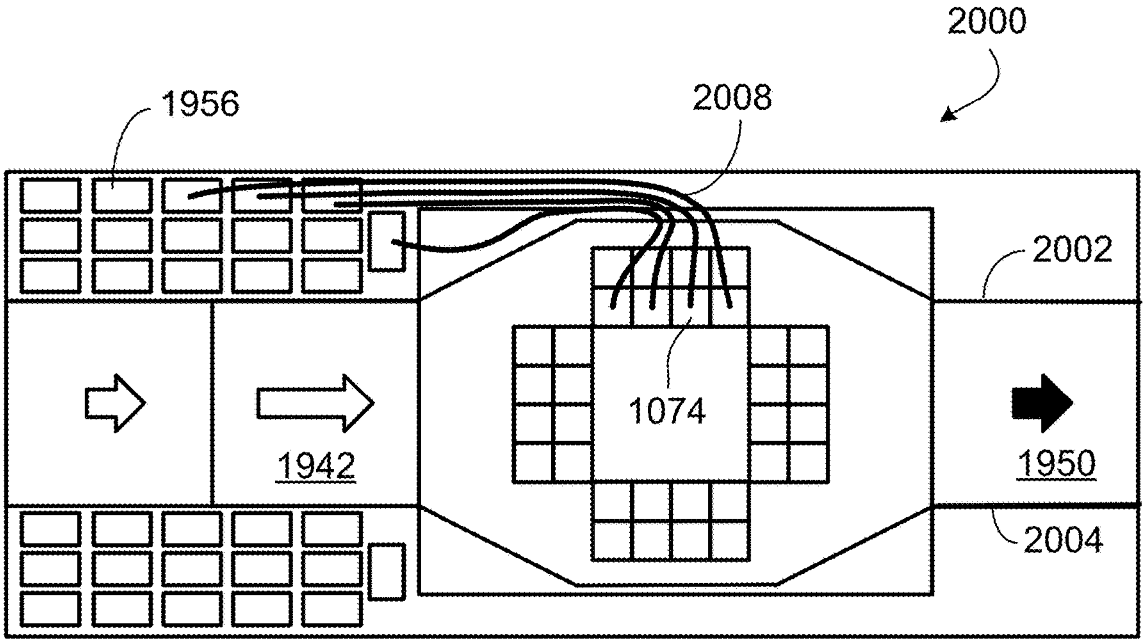

FIGS. 115 and 116 are a top view and a front view, respectively, of the rackmount device 2000. An upper baffle 2002 and a lower baffle 2004 are provided to guide the air flowing from the fans 1942, 1944 to the heatsink 1072 and the co-packaged optical modules 1074, and from the heatsink 1072 and the co-packaged optical modules 1074 to the air duct 1950. In this example, portions of the upper and lower baffles 2002, 2004 form portions of the upper and lower walls of the air duct 1950.

The upper baffle 2002 includes a cutout or opening 2006 that allows optical fibers 2008 to pass through. As shown in FIG. 116, the optical fibers 2008 extend from the co-packaged optical modules 1074 upward, through the cutout or opening 2006 in the upper baffle 2002, and extend toward the laser modules 1956 along the space above the upper baffle 2002. The upper baffle 2002 allows the optical fibers 2008 to be better organized to reduce the obstruction to the air flow caused by the optical fibers 2008. The lower baffle 2004 has a similar cutout or opening to help organize the optical fibers that are optically connected to the laser modules located in the space below the fans 1942, 1944.

Figure 117:
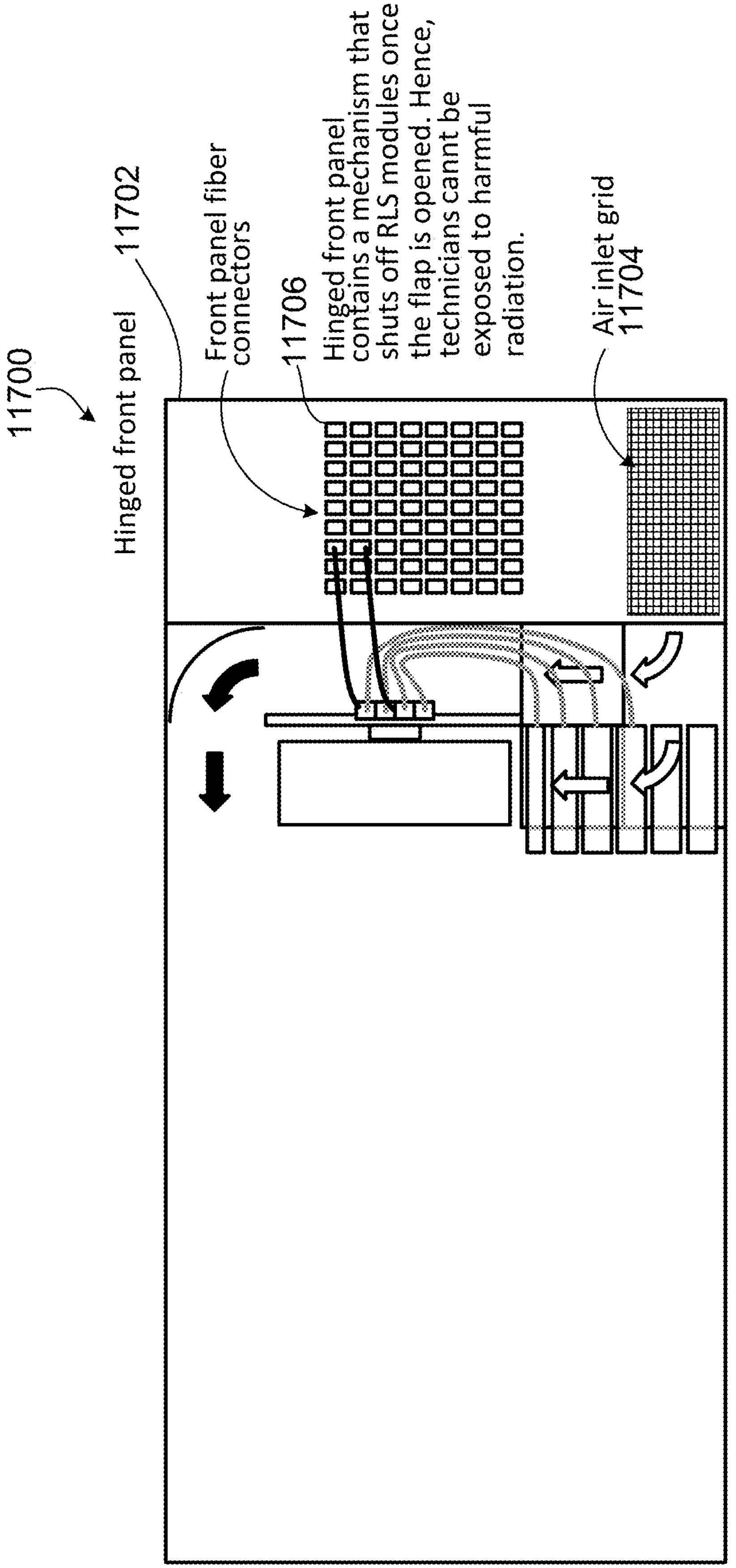
FIGS. 117, 118, 119, 120, 121, and 122 are diagrams of examples of systems that include co-packaged optical modules.

FIG. 117 is a top view diagram of a system 11700 that includes a front panel 11702, which can be rotatably coupled to the lower panel by a hinge. FIG. 117 shows the front panel 11702 in the open position. The front panel 11702 includes an air inlet grid 11704 and an array of fiber connector parts 11706. Each fiber connector part 11706 can be optically coupled to the third fiber connector 1966 of the cable assembly 1960 of FIG. 106. In some implementations, the hinged front panel includes a mechanism that shuts off the remote laser source modules 1956, or reduces the power to the remote laser source modules 1956, once the front panel 11702 is opened. This prevents the technicians from being exposed to harmful radiation. In this example, the laser source modules 1956 and the optical fibers for providing the power supply light are disposed behind the front panel 11702.

Figure 118:
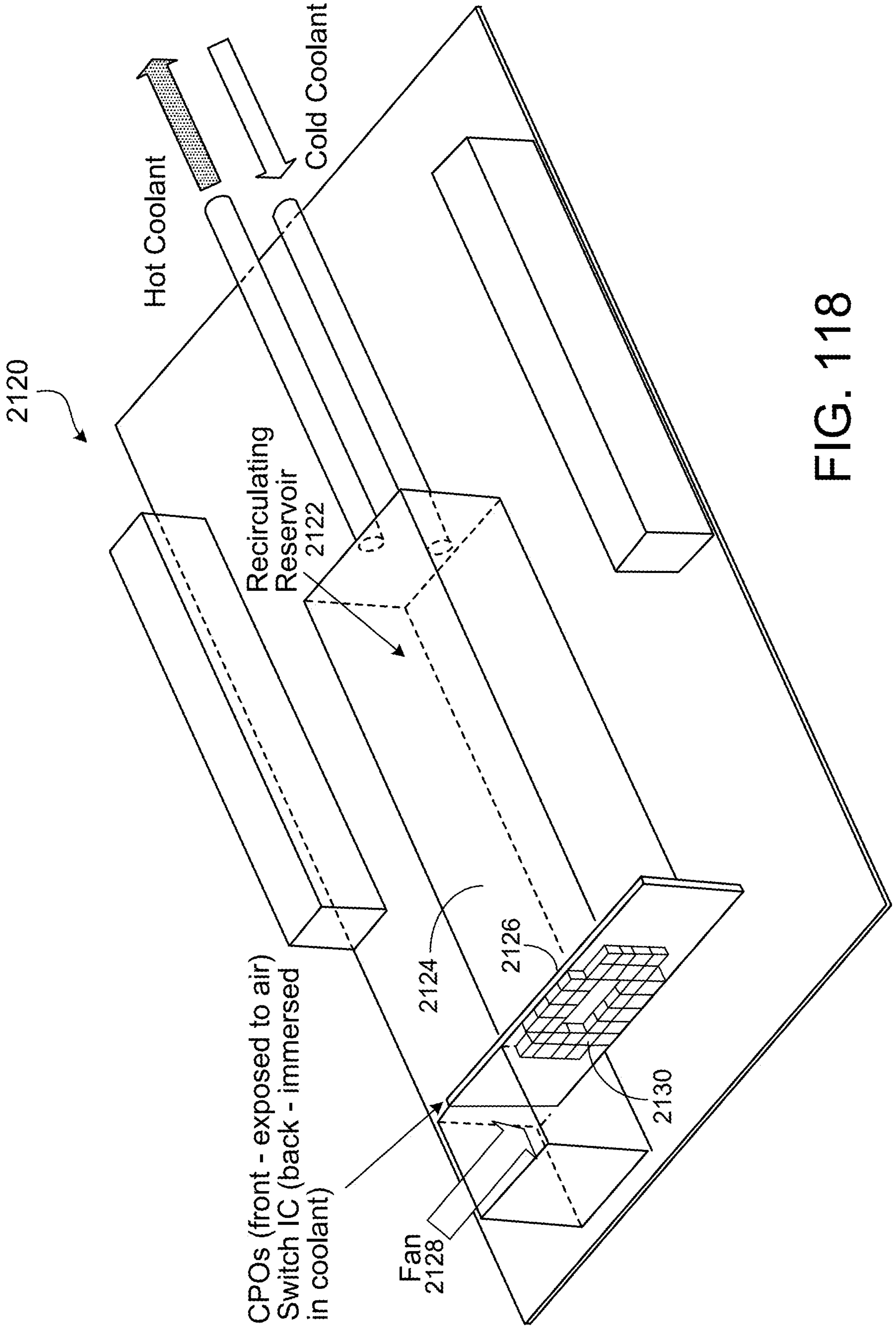

FIG. 118 is a diagram of an example of a system 2120 that includes a recirculating reservoir 2122 that circulates a coolant 2124 to carry heat away from the data processor 2126, which for example can be a switch integrated circuit. In this example, the data processor 2126 is mounted at the back side of the substrate and obscured from view. In this example, the data processor 2126 is immersed in the coolant 2124, and the inlet fan 2128 is used to blow air across the surface of the co-packaged optical modules 2130 to a heat dissipating device thermally coupled to the co-packaged optical modules.

Figure 119:
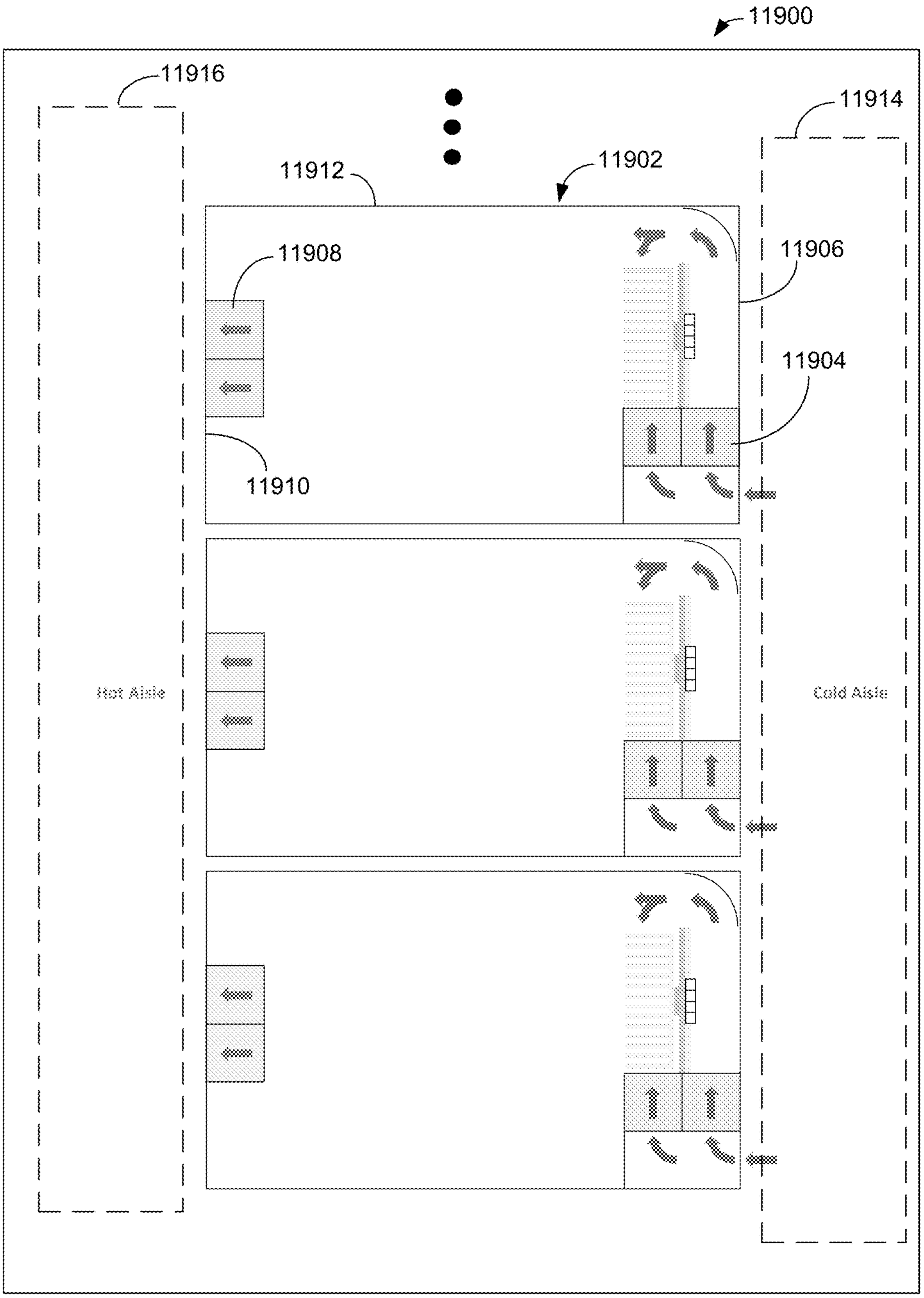

FIGS. 119 to 122 are examples that provide heat dissipating solutions for co-packaged optical modules, taking into consideration the locations of "hot aisles" in data centers. FIG. 119 shows a top view of an environment 11900, e.g., in a data center, in which multiple rackmount servers 11902 are installed. The servers 11902 include inlet fans 11904 positioned at the front 11906 and outlet fans 11908 at the rear 11910. Cold air enters the housing 11912 from the front 11906, the air is warmed by the heat generating electronic devices in the server 11902, and hot air is blown out of the housing 11912 from the rear 11910. The aisle in the data center in front of the servers 11902 is referred to as the "cold aisle" 11914, and the aisle to the rear of the servers 11902 is referred to as the "hot aisle" 11916.

Figure 120:
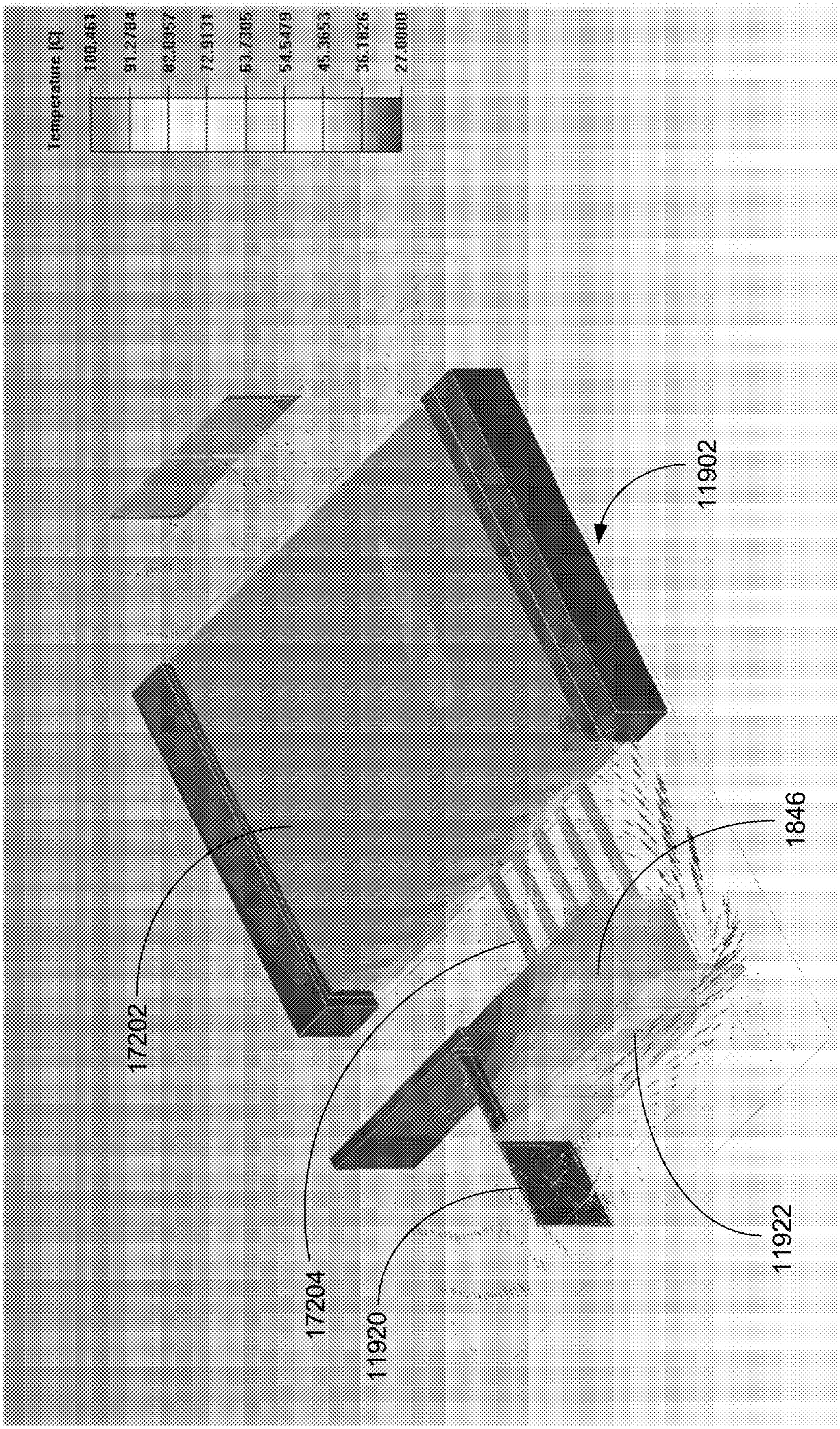

FIG. 120 is a simulation of the thermal properties of the rackmount server 11902 in which the heat sink 1846 is thermally coupled a second heat sink 17202 through heat pipes 17204. In this simulation, the temperature distribution of the server 11902 ranged from about 27° C. to about 110.5° C. The region 11920 where the inlet fans 11904 are located has a temperature of about 27° C., which is the room temperature used in the simulation. The junction 11922 between the data processor and the heat sink has a temperatures below 105° C., which shows that the thermal design used in this example can provide adequate cooling to the data processor electrically coupled to the vertical circuit board positioned near the front panel.

Figure 121:
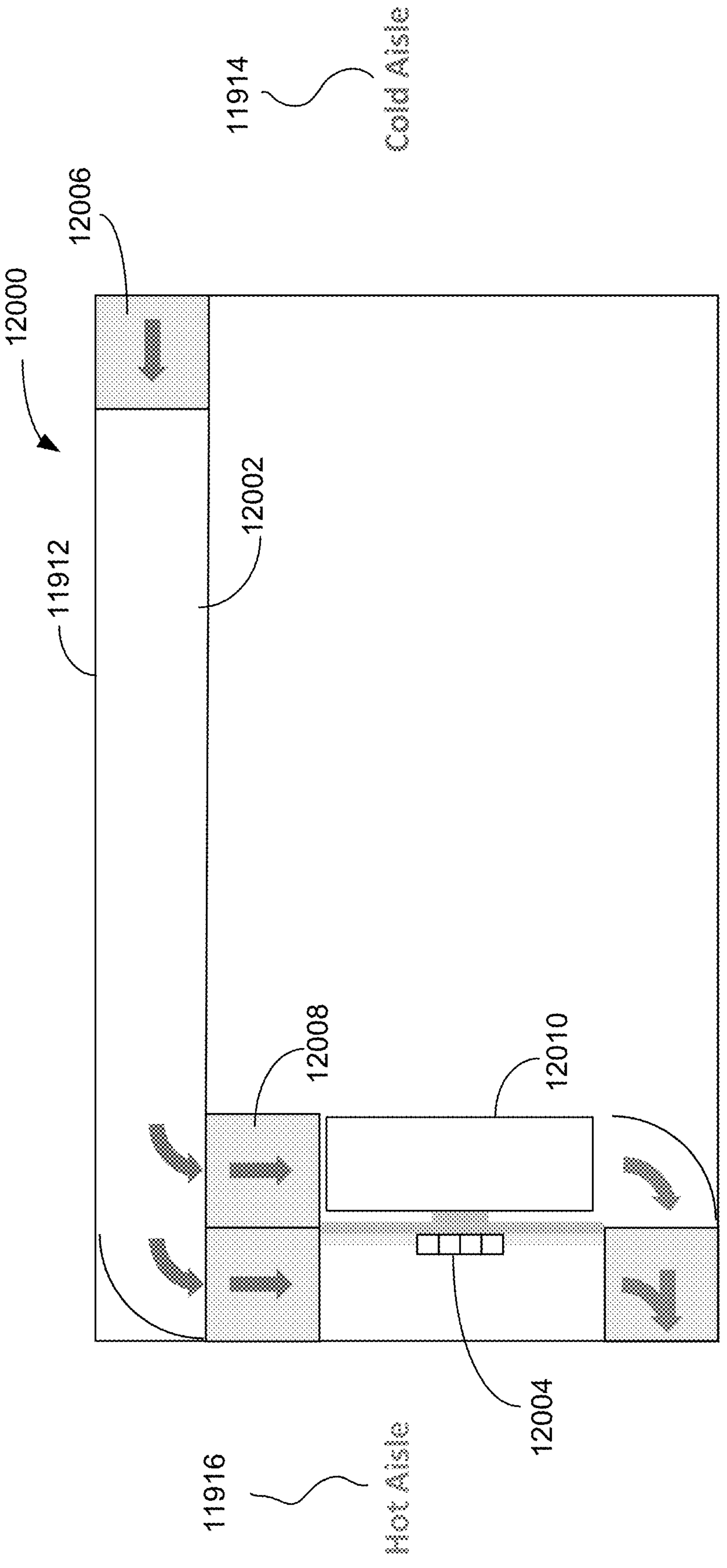

Referring to FIG. 121, in some implementations, in case it is desirable that fiber cabling be implemented on the back side of a rack (where the hot aisle is located), a rackmount server 12000 can include a duct 12002 inside the housing 11912 to transfer cold air to the co-packaged optical modules 12004 that are now mounted on the back side. In this example, one or more inlet fans 12006 are provided at the front of the duct 12002, and one or more fans 12008 are provided at the rear of the duct 12002 to blow the air toward the heat sink 12010 thermally coupled to the data processor, and to the co-packaged optical modules 12004.

Figure 122:
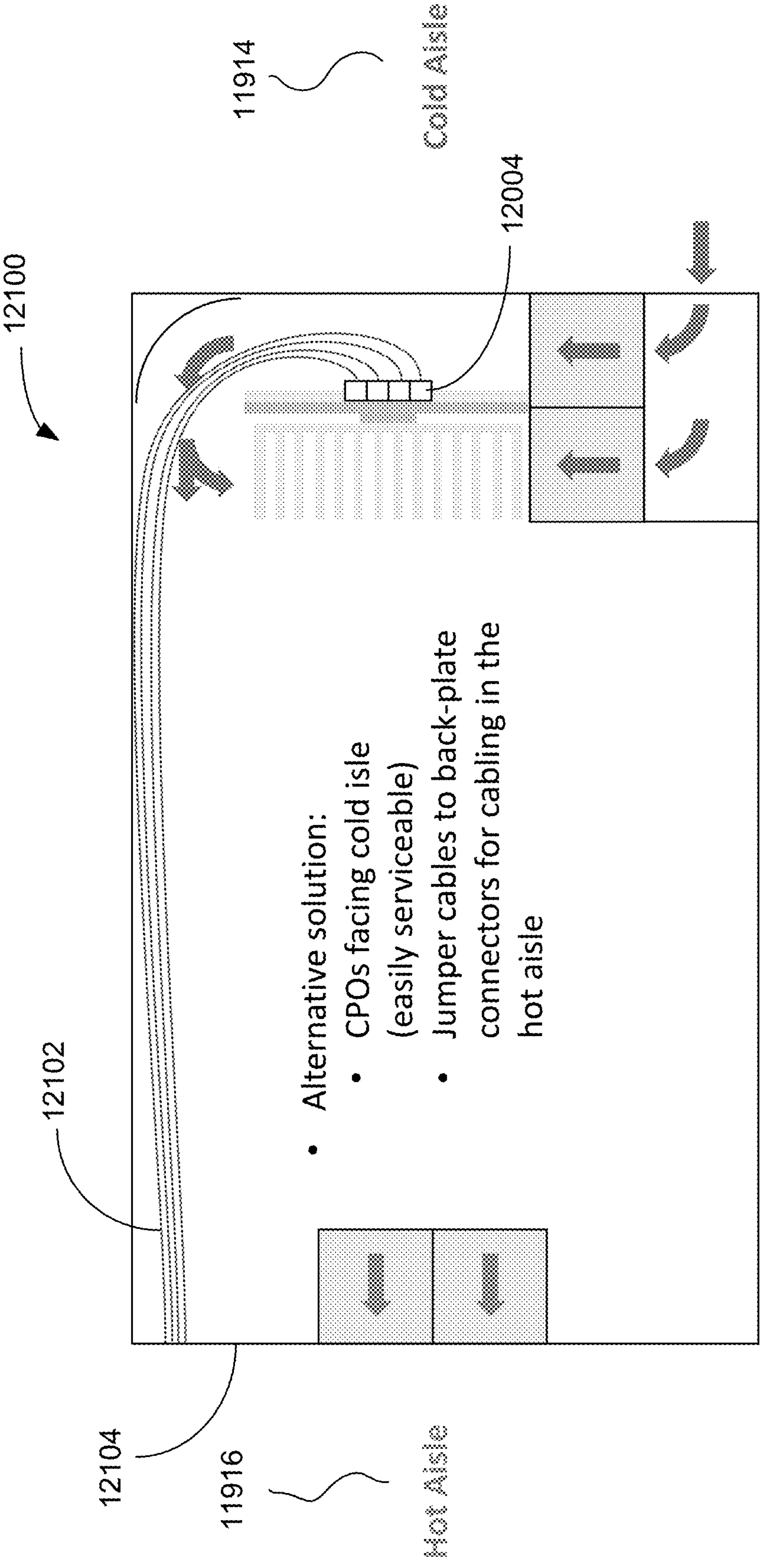

Referring to FIG. 122, in some implementations, a rackmount server 12100 includes fiber jumper cables 12102 that connect the co-packaged optical modules 12004 that are still facing the front aisle (towards the cold aisle 11914) to a back-panel 12104 facing the hot aisle 11916.

Figure 123:
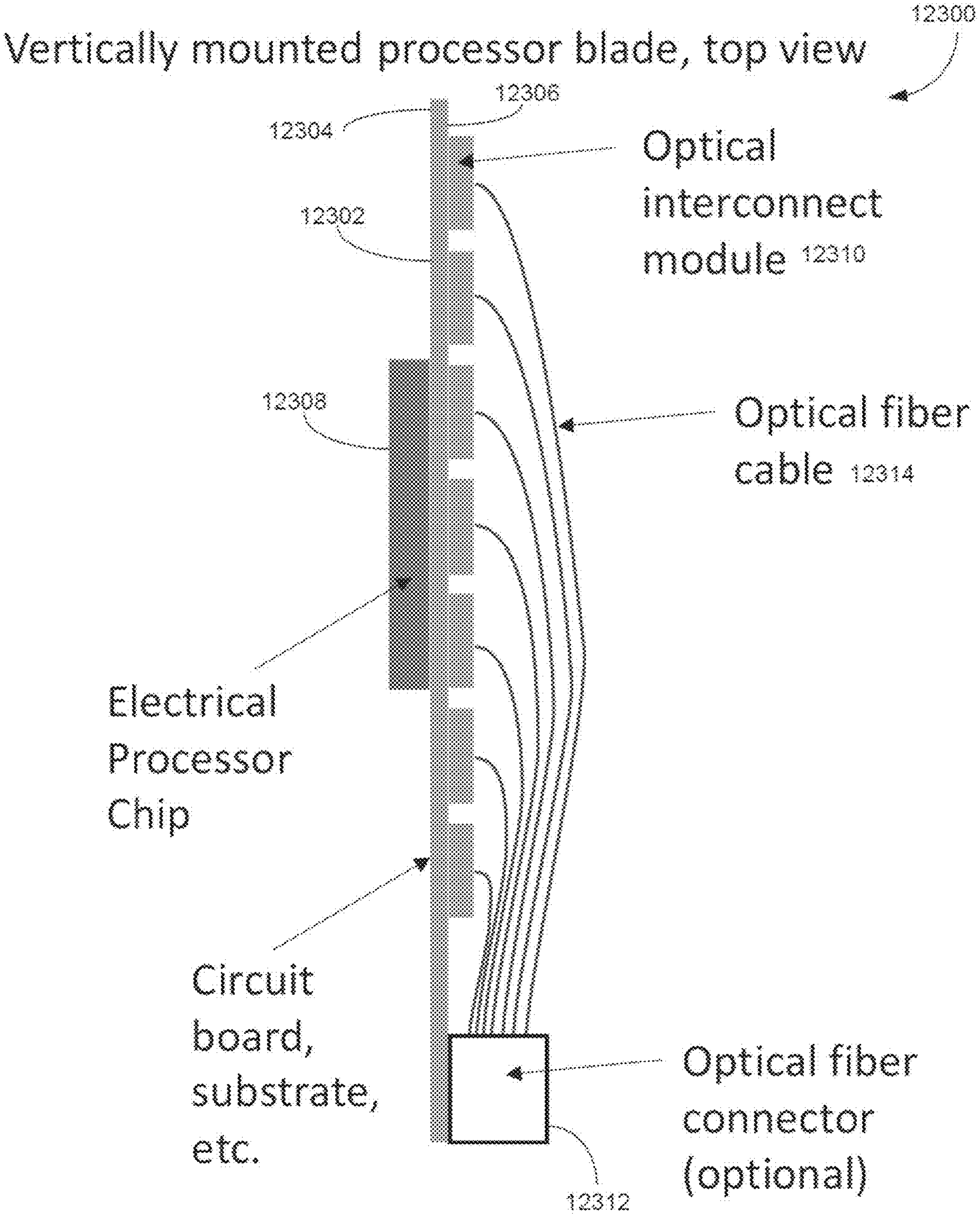
FIG. 123 is a diagram of an example of a vertically mounted processor blade.

Referring to FIG. 123, in some implementations, a vertically mounted processor blade 12300 can include a substrate 12302 having a first side 12304 and a second side 12306. The substrate 12302 can be made of, e.g., one or more ceramic materials, or organic "high density build-up" (HDBU). For example, the substrate 12303 can be a printed circuit board. An electronic processor 12308 is mounted on the first side 12304 of the substrate 12302, in which the electronic processor 12308 is configured to process or store data. For example, the electronic processor 12308 can be a network switch, a central processor unit, a graphics processor unit, a tensor processing unit, a neural network processor, an artificial intelligence accelerator, a digital signal processor, a microcontroller, or an application specific integrated circuit (ASIC). For example, the electronic processor 12308 can be a memory device or a storage device. In this context, processing of data includes writing data to, or reading data from, the memory or storage device, and optionally performing error correction. The memory device can be, e.g., random access memory (RAM), which can include, e.g., dynamic RAM (DRAM) or static RAM (SRAM). The storage device can include, e.g., solid state memory or drive, which can include, e.g., one or more non-volatile memory (NVM) Express® (NVMe) SSD (solid state drive) modules, or Intel® Optane™ persistent memory. The example of FIG. 123 shows one electronic processor 12308, through there can also be multiple electronic processors 12308 mounted on the substrate 12302.

The vertically mounted processor blade 12300 includes one or more optical interconnect modules or co-packaged optical modules 12310 mounted on the second side 12306 of the substrate 12302. For example, the optical interconnect module 12310 includes an optical port configured to receive optical signals from an external optical fiber cable, and a photonic integrated circuit configured to generate electrical signals based on the received optical signals, and transmit the electrical signals to the electronic processor 12308. The photonic integrated circuit can also be configured to generate optical signals based on electrical signals received from the electronic processor 12308, and transmit the optical signals to the external optical fiber cable. The optical interconnect module or co-packaged optical module 12310 can be similar to, e.g., the integrated optical communication device 262 of FIG. 6; 282 of FIGS. 7-9; 462, 466, 448, 472 of FIG. 17; 612 of FIG. 23; 684 of FIG. 26; 704 of FIG. 27; 724 of FIG. 28; the co-packaged optical module 1074 of FIGS. 68A, 69A, 70, 71A; 1132 of FIG. 73A; 1160 of FIG. 74A; 1074 of FIGS. 75A, 75B, 77A, 77B, 104, 107, 109, 116; 1312 of FIGS. 80A, 82A, 84A; or 1564, 1582 of FIG. 87A. In the example of FIG. 123, the optical interconnect module or co-packaged optical module 12310 does not necessarily have to include serializers/deserializers (SerDes), e.g., 216, 217 of FIGS. 2 to 8 and 10 to 12. The optical interconnect module or co-packaged optical module 12310 can include the photonic integrated circuit 12314 without any serializers/deserializers. For example, the serializers/deserializers can be mounted on the substrate separate from the optical interconnect module or co-packaged optical module 12310.

For example, the substrate 12302 can include electrical connectors that extend from the first side 12304 to the second side 12306 of the substrate 12302, in which the electrical connectors pass through the substrate 12302 in a thickness direction. For example, the electrical connectors can include vias of the substrate 12302. The optical interconnect module 12310 is electrically coupled to the electronic processor 12308 by the electrical connectors.

For example, the vertically mounted processor blade 12300 can include an optional optical fiber connector 12312 for connection to an optical fiber cable bundle. The optical fiber connector 12312 can be optically coupled to the optical interconnector modules 12310 through optical fiber cables 12314. The optical fiber cables 12314 can be connected to the optical interconnect modules 12310 through a fixed connector (in which the optical fiber cable 12314 is securely fixed to the optical interconnect module 12310) or a removable connector in which the optical fiber cable 12314 can be easily detached from the optical interconnect module 12310, such as with the use of an optical connector part 266 as shown in FIG. 6. The removable connector can include a structure similar to the mechanical connector structure 900 of FIGS. 46, 47 and 51A to 57.

For example, the substrate 12302 can be positioned near the front panel of the housing of the server that includes the vertically mounted processor blade 12300, or away from the front panel and located anywhere inside the housing. For example, the substrate 12302 can be parallel to the front panel of the housing, perpendicular to the front panel, or oriented in any angle relative to the front panel. For example, the substrate 12302 can be oriented vertically to facilitate the flow of hot air and improve dissipation of heat generated by the electronic processor 12308 and/or the optical interconnect modules 12310.

For example, the optical interconnect module or co-packaged optical module 12310 can receive optical signals through vertical or edge coupling. FIG. 123 shows an example in which the optical fiber cables are vertically coupled to the optical interconnect modules or co-packaged optical modules 12310. It is also possible to connect the optical fiber cables to the edges of the optical interconnect modules or co-packaged optical modules 12310. For example, optical fibers in the optical fiber cable can be attached in-plane to the photonic integrated circuit using, e.g., V-groove fiber attachments, tapered or un-tapered fiber edge coupling, etc., followed by a mechanism to direct the light interfacing to the photonic integrated circuit to a direction that is substantially perpendicular to the photonic integrated circuit, such as one or more substantially 90-degree turning mirrors, one or more substantially 90-degree bent optical fibers, etc.

For example, the optical interconnect modules 12310 can receive optical power from an optical power supply, such as 1322 of FIG. 80A, 1558 of FIG. 87A. For example, the optical interconnect modules 12310 can include one or more of optical coupling interfaces 414, demultiplexers 419, splitters 415, multiplexers 418, receivers 421, or modulators 417 of FIG. 20.

Figure 124:
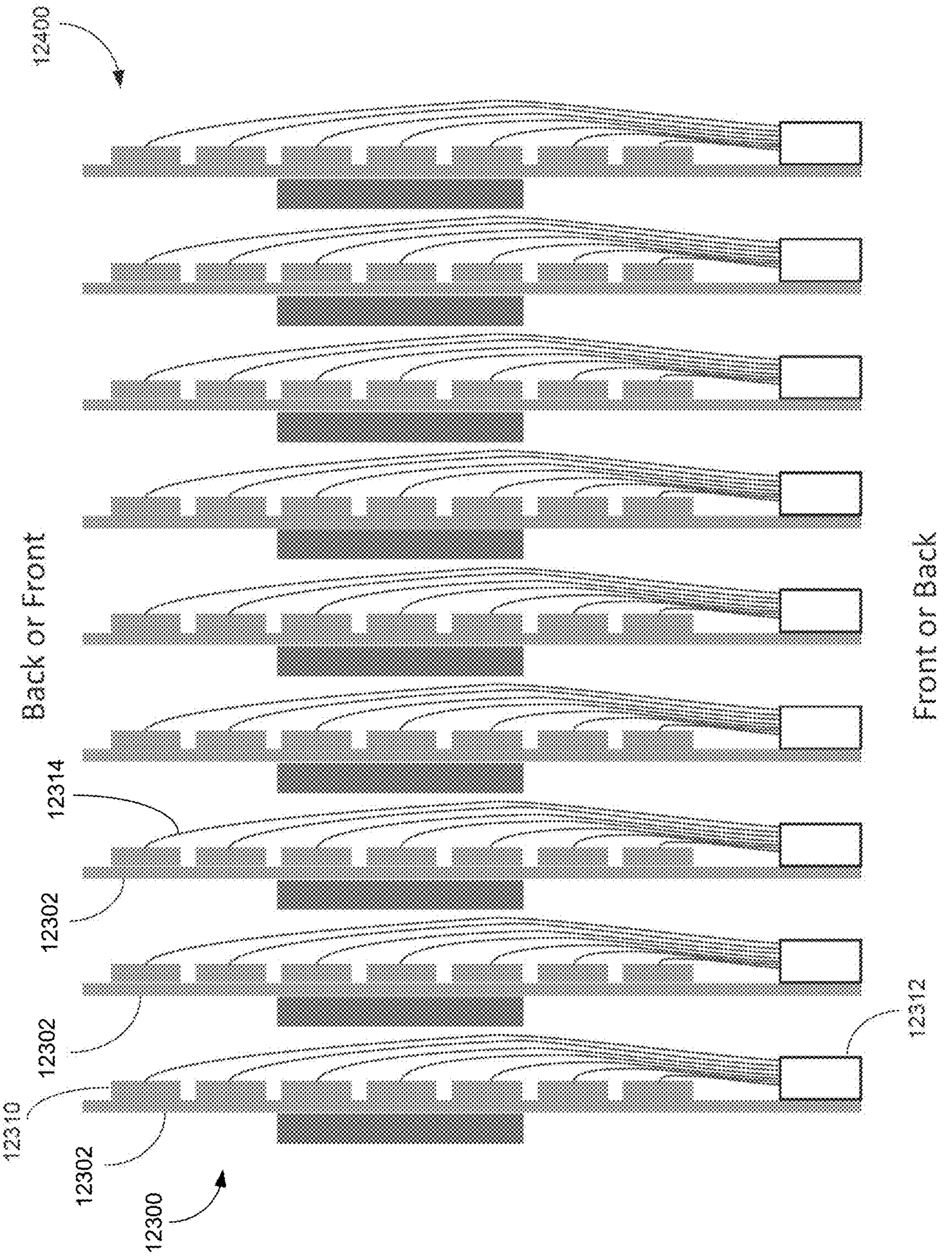
FIG. 124 is a top view of an example of a rack system that includes several vertically mounted processor blades.

FIG. 124 is a top view of an example of a rack system 12400 that includes several vertically mounted processor blades 12300. The vertically mounted processor blades 12300 can be positioned such that the optical fiber connectors 12312 are near the front of the rack system 12400 (which allows external optical fiber cables to be optically coupled to the front of the rack system 12400), or near the back of the rack system 12400 (which allows external optical fiber cables to be optically coupled to the back of the rack system 12400). Several rack systems 12400 can be stacked vertically similar to the example shown in FIG. 76, in which the server rack 1214 includes several servers 1212 stacked vertically, or the example shown in FIG. 87A, in which several servers 1552 are stacked vertically in a rack 1554. For example, the optical interconnect modules 12310 can receive optical power from an optical power supply, such as 1558 of FIG. 87A.

In some implementations, the vertically mounted processor blades 12300 can include blade pairs, in which each blade pair includes a switch blade and a processor blade. The electronic processor of the switch blade includes a switch, and the electronic processor of the processor blade is configured to process data provided by the switch. For example, the electronic processor of the processor blade is configured to send processed data to the switch, which switches the processed data with other data, e.g., data from other processor blades.

In the examples shown in FIGS. 123 and 124, the optical interconnect module or co-packaged optical module 12310 is mounted on the second side of the substrate 12302. In some implementations, the optical interconnect module 12310 or the optical fiber cable 12314 extends through or partially through an opening in the substrate 12302, similar to the example shown in FIGS. 35A to 35C. The photonic integrated circuit in the optical interconnect module 12310 is electrically coupled to the electronic processor 12308 or to another electronic circuit, such as a serializers/deserializers module positioned at or near the first side of the substrate 12302. The optical interconnect module 12310 and the optical fiber cable 12314 define a signal path that allows a signal from the optical fiber cable 12314 to be transmitted from the second side of the substrate 12302 through the opening to the electronic processor 12308. The signal is converted from an optical signal to an electric signal by the photonic integrated circuit, which defines part of the signal path. This allows the optical fiber cables to be positioned on the second side of the substrate 12302.

In the example of FIG. 104, the printed circuit board 1230 is positioned a short distance from the front panel 1224 to improve air flow between the printed circuit board 1230 and the front panel 1224 to help dissipate heat generated by the co-packaged optical modules 1074. The following describes a mechanism that allows the user to conveniently connect the co-packaged optical module to an optical fiber cable using a pluggable module that has a rigid structure that spans the distance between the co-packaged optical modules and the front panel.

Figure 125A:
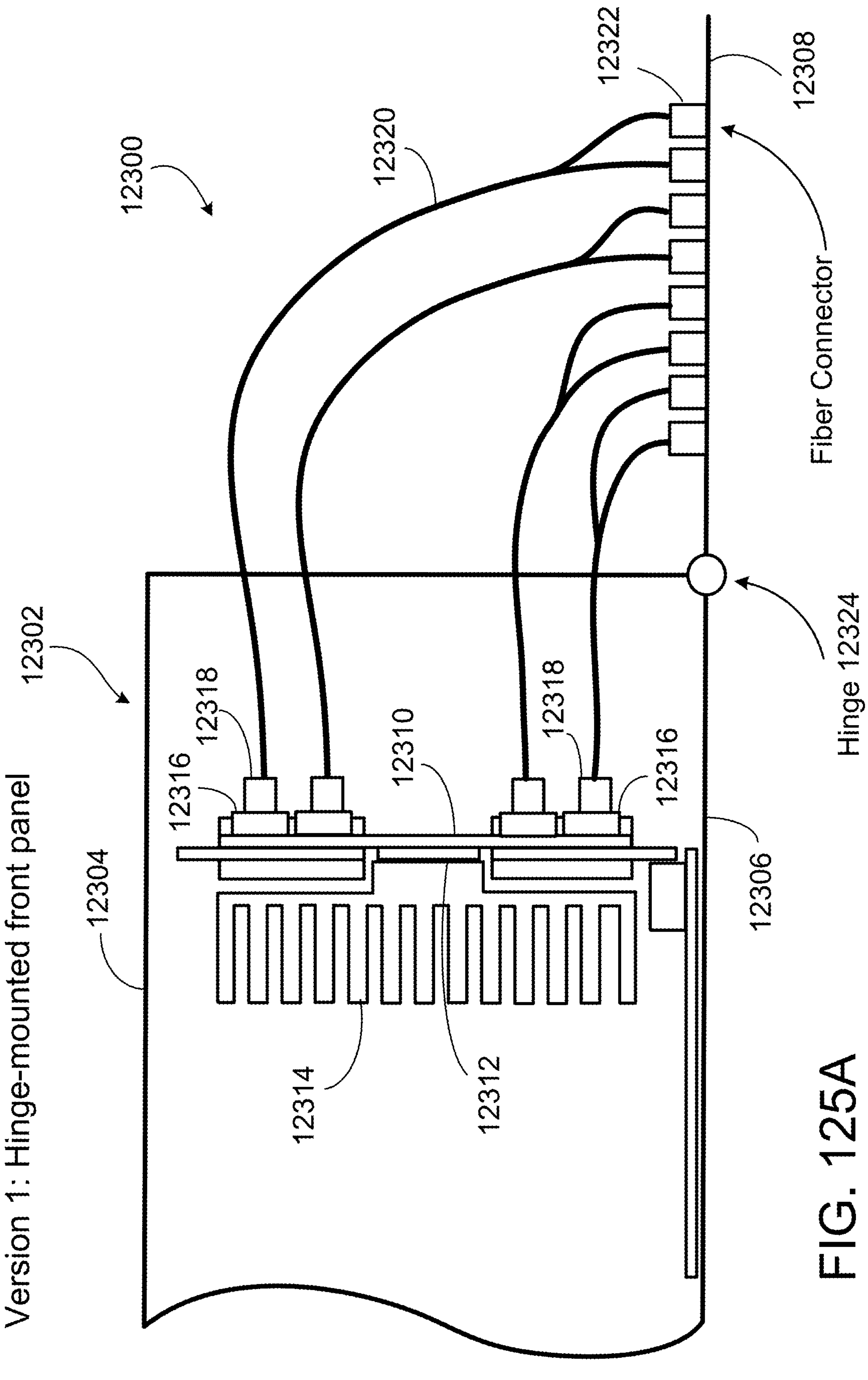
FIG. 125A is a side view of an example of a rackmount server that has a hinged front panel.

Referring to FIG. 125A, in some implementations, a rackmount server 12300 can have a hinge-mounted front panel, similar to the example shown in FIG. 77A. The rackmount server 12300 includes a housing 12302 having a top panel 12304, a bottom panel 12306, and a front panel 12308 that is coupled to the bottom panel 12306 using a hinge 12324. A vertically mounted substrate 12310 is positioned substantially perpendicular to the bottom panel 12306 and recessed from the front panel 12308. The substrate 12310 includes a first side facing the front direction relative to the housing 12302 and a second side facing the rear direction relative to the housing 12302. At least one electronic processor or data processing chip 12312 is electrically coupled to the second side of the vertical substrate 12310, and a heat dissipating device or heat sink 12314 is thermally coupled to the at least one data processing chip 12312. Co-packaged optical modules 12316 (or optical interconnect modules) are attached to the first side of the vertical substrate 12310. The substrate 12310 provides high-speed connections between the co-packaged optical modules 12316 and the data processing chip 12312. The co-packaged optical module 12316 is optically connected to a first fiber connector part 12318, which is optically connected through a fiber pigtail 12320 to one or more second fiber connector parts 12322 mounted on the front panel 12308.

In the example of FIG. 125A, the front panel 12308 is rotatably connected to the bottom panel by the hinge 12324. In other examples, the front panel can be rotatably connected to the top panel or the side panel so as to flap upwards or to flap sideways when opened.

For example, the electronic processor 12312 can be a network switch, a central processor unit, a graphics processor unit, a tensor processing unit, a neural network processor, an artificial intelligence accelerator, a digital signal processor, a microcontroller, or an application specific integrated circuit (ASIC). For example, the electronic processor 12312 can be a memory device or a storage device. In this context, processing of data includes writing data to, or reading data from, the memory or storage device, and optionally performing error correction. The memory device can be, e.g., random access memory (RAM), which can include, e.g., dynamic RAM (DRAM) or static RAM (SRAM). The storage device can include, e.g., solid state memory or drive, which can include, e.g., one or more non-volatile memory (NVM) Express® (NVMe) SSD (solid state drive) modules, or Intel® Optane™ persistent memory. The example of FIG. 125A shows one electronic processor 12312, through there can also be multiple electronic processors 12312 mounted on the substrate 12310. In some examples, the substrate 12310 can also be replaced by a circuit board.

The co-packaged optical module (or optical interconnect module) 12316 can be similar to, e.g., the integrated optical communication device 262 of FIG. 6; 282 of FIGS. 7-9; 462, 466, 448, 472 of FIG. 17; 612 of FIG. 23; 684 of FIG. 26; 704 of FIG. 27; 724 of FIG. 28; the co-packaged optical module 1074 of FIGS. 68A, 69A, 70, 71A; 1132 of FIG. 73A; 1160 of FIG. 74A; 1074 of FIGS. 75A, 75B, 77A, 77B, 104, 107, 109, 116; 1312 of FIGS. 80A, 82A, 84A; or 1564, 1582 of FIG. 87A. In the example of FIG. 125A, the optical interconnect module or co-packaged optical module 12316 does not necessarily have to include serializers/deserializers (SerDes), e.g., 216, 217 of FIGS. 2 to 8 and 10 to 12. The optical interconnect module or co-packaged optical module 12316 can include the photonic integrated circuit without any serializers/deserializers. For example, the serializers/deserializers can be mounted on the circuit board separate from the optical interconnect module or co-packaged optical module 12316.

Figure 130:
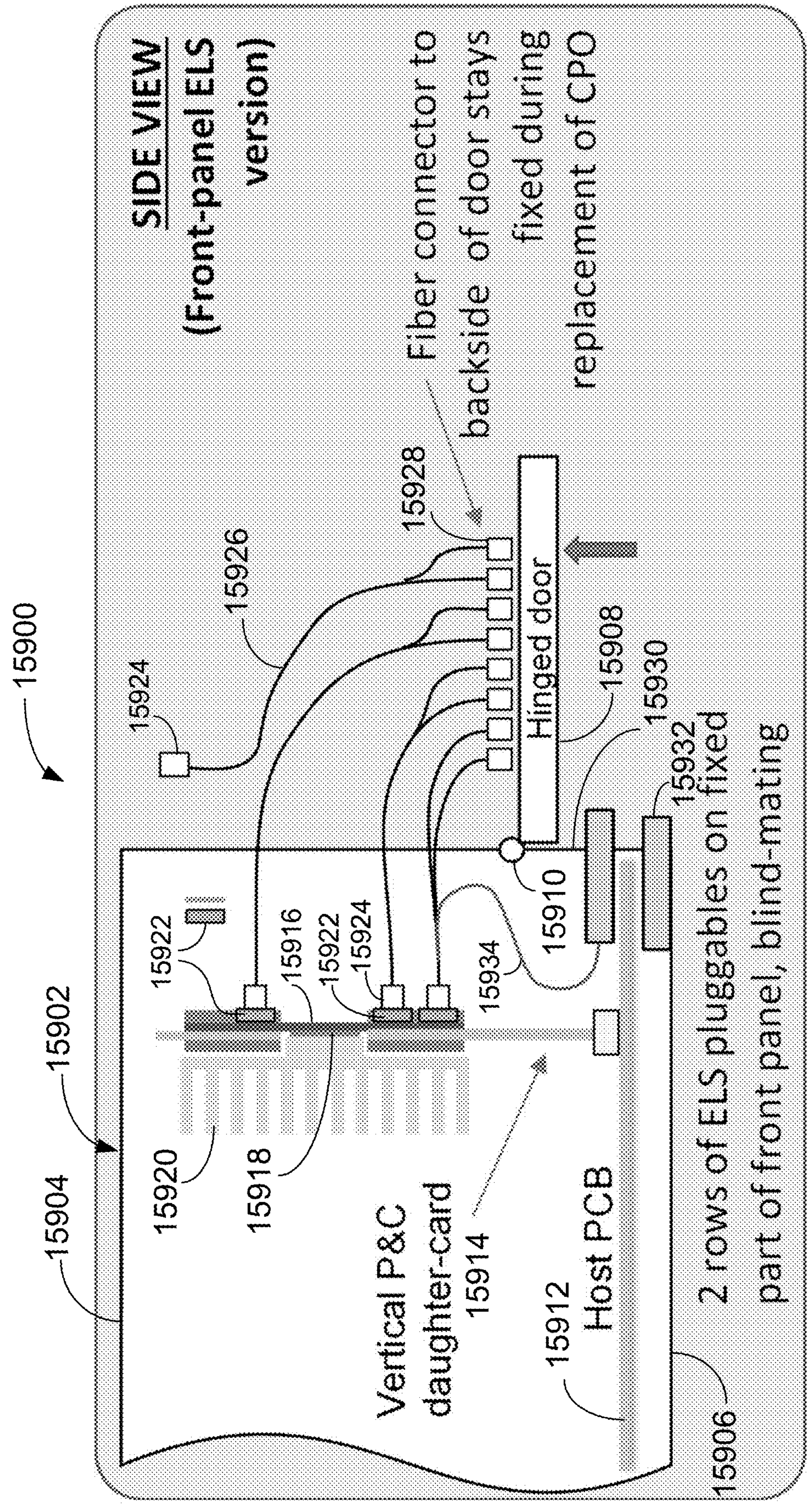

FIG. 130 is a side view of an example of a rackmount server 15900 that has a hinge-mounted front panel. The rackmount server 15900 includes a housing 15902 having a top panel 15904, a bottom panel 15906, and an upper swivel front panel 15908 that is coupled to a lower fixed front panel 15930 using a hinge 15910. In some examples, the hinge can be attached to the side panel so that the front panel is opened horizontally. A horizontally mounted host printed circuit board 15912 is attached to the bottom panel 15906. A vertically mounted printed circuit board 15914, which can be, e.g., a daughter-card, is positioned substantially vertically and perpendicular to the bottom panel 15906 and recessed from the front panel 15908. A package substrate 15916 is attached to the front side of the vertical printed circuit board 15914. At least one electronic processor or data processing chip 15918 is electrically coupled to the rear side of the package substrate 15916, and a heat dissipating device or heat sink 15920 is thermally coupled to the at least one data processing chip 15918. Co-packaged optical modules 15922 (or optical interconnect modules) are removably attached to the front side of the package substrate 15916. The package substrate 15916 provides high-speed connections between the co-packaged optical modules 15922 and the data processing chip 15918. The co-packaged optical module 15922 is optically connected to a first fiber connector part 15924, which is optically connected through a fiber pigtail 15926 to one or more second fiber connector parts 15928 attached to the back side of the front panel 15908. The second fiber connector parts 15928 can be optically connected to optical fiber cables that pass through openings in the hinged front panel 15908.

For example, the fiber connector 15928 can be connected to the backside of the front panel 15908 during replacement of the CPO module 15922. The CPO module 15922 can be unplugged from the connector (e.g., an LGA socket) on the package substrate 15916, and be disconnected from the first fiber connector part 15924.

For example, one or more rows of pluggable external laser sources (ELS) 15932 can be in standard pluggable form factor accessible from the lower fixed part 15930 of the front panel with rear blind-mate connectors. Optical fibers 15934 transmit the power supply light from the laser sources 15932 to the CPO modules 15922. The external laser sources 15932 are electrically connected to a conventionally (horizontal) oriented system printed circuit board or the vertically oriented daughterboard. In this example, the row(s) of pluggable external laser sources 15932 is/are positioned below the datapath optical connection. The pluggable external laser sources 15932 do not need to connect to the CPO substrate because there are no high-speed signals that require proximity.

Figure 131:
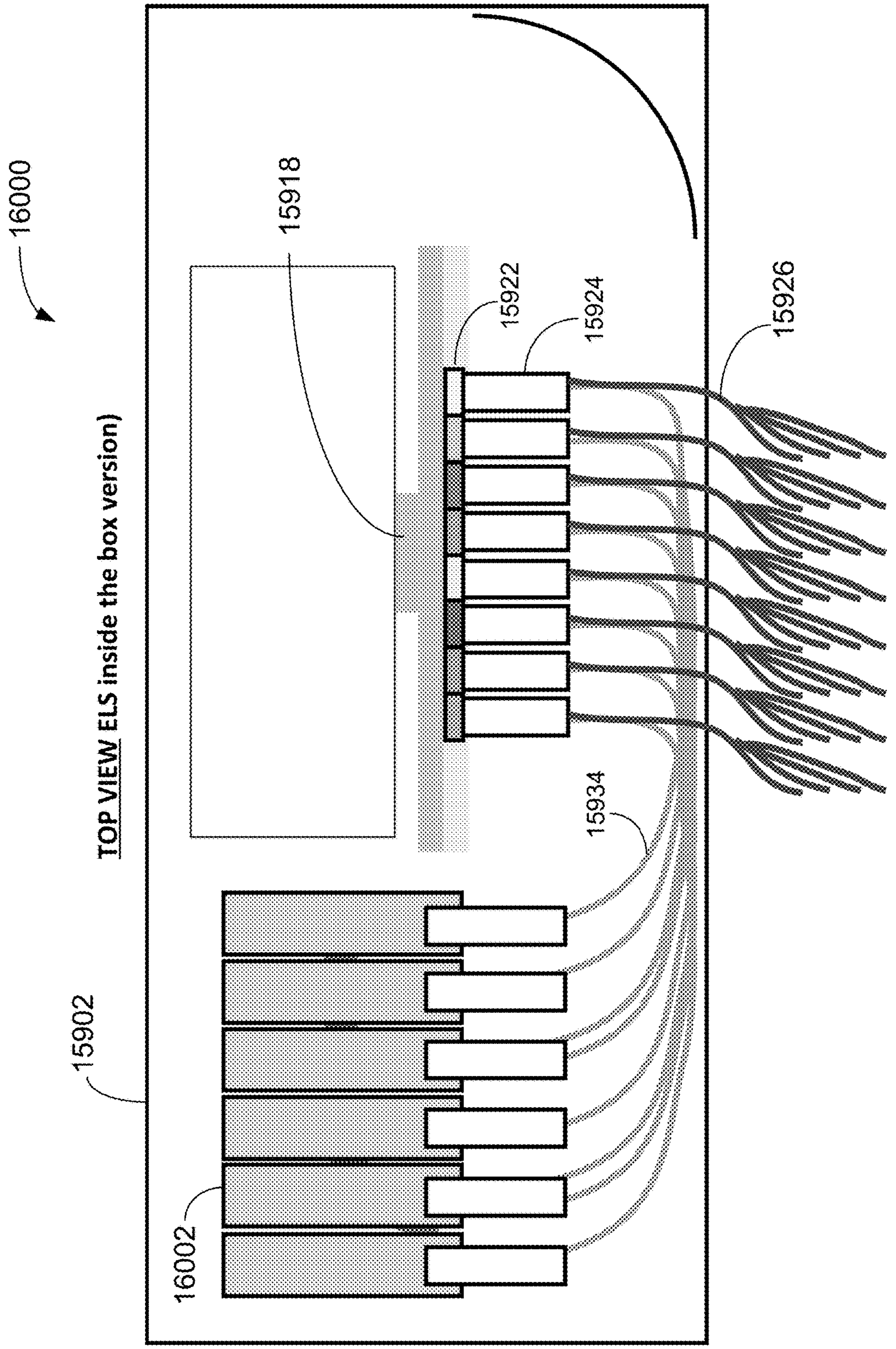

In some implementations, as shown in FIG. 131, external laser sources can be located behind the hinged front panel (not user accessible without opening the door) and can then be front-mating similar to typical optical pluggables. FIG. 131 is a top view of an example of a rackmount server 16000 that is similar to the rackmount server 15900 of FIG. 130 except that one or more rows of external laser sources 16002 are placed inside the housing 15902. Optical fibers 15934 transmit the power supply light from the laser sources 16002 to the CPO modules 15922.

Figure 132:
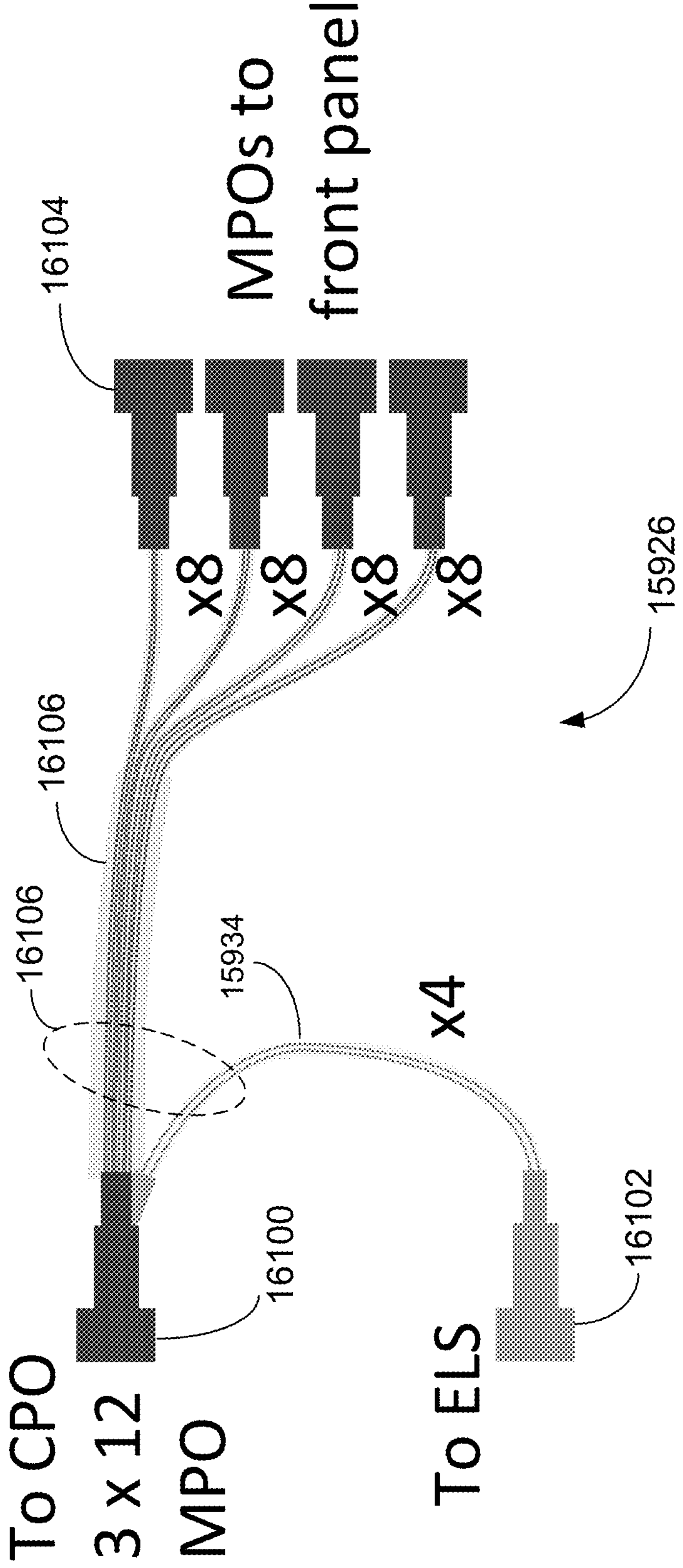

FIG. 132 is a diagram of an example of the optical cable 15926 that optically couples the CPO modules 15922 to the optical fiber cables at the front panel 15908. The optical cable 15926 includes a first multi-fiber push on (MPO) connector 16100, a laser supply MPO connector 16102, four datapath MPO connectors 16104, and a jumper cable 16106 that includes optical fibers that optically connect the MPO connectors. In this example, the optical cable 15926 supports a total bandwidth of 1.6 Tb/s, including 16 full-duplex 400G DR4+ signals (100G per fiber) plus 4 external laser source (ELS) connections.

The first MPO connector 16100 is optically coupled to the CPO module 15922 and includes, e.g., 36 fiber ports (e.g., 3 rows of fiber ports, each row having 12 fiber ports, similar to the fiber ports shown in FIGS. 80D, 80E, 82D, 82E, 89 to 93), which includes 4 power supply fiber ports and 32 data fiber ports. The laser supply MPO connector 16102 is optically coupled to the external laser source, such as 15932 (FIG. 130) or 16002 (FIG. 131). The datapath MPO connectors 16104 are optically coupled to external optical fiber cables. For example, each external optical fiber cable can support a 400GBASE-DR4 link, so the four datapath MPO connectors 16104 can support 16 full-duplex 400G DR4+ signals (100G per fiber). The jumper cable 16106 fans the MPO connector 16100 out to datapath MPOs 16104 on the front panel 15908 (e.g., 4×400G DR4+ using 4×1×12 MPOs or 2×800G DR8+ using 2×2×12 MPOs) and the laser supply MPO 16102. For example, the optical cable 15926 can be DR-16+ (e.g., 1.6 Tb/s at 100G per fiber, gray optics, ~2 km reach). This architecture also supports FR-n (WDM).

In this example, the CPO module 15922 is configured to support 4×400 Gb/s=1.6 Tb/s data rate. The jumper cable 16106 includes four (4) power supply optical fibers 15934 that optically connect four (4) power supply fiber ports of the laser supply MPO connector 16102 to the corresponding power supply fiber ports of the first MPO connector 16100. The jumper cable 16106 includes four (4) sets of eight (8) data optical fibers. The eight (8) data optical fibers 16106 optically connect eight (8) transmit or receive fiber ports of each datapath MPO connector 16104 to the corresponding transmit or receive fiber ports of the first MPO connector 16100. For example, the power supply optical fibers 15934 can be polarization maintaining optical fibers. The fan-out cable 16106 can handle multiple functions including merging the external laser source and data paths, splitting of external light source between multiple CPO modules 15922, and handling polarization. Regarding the force requirement on the CPO module's connector, the optical connector leverages an MPO type connection and can have a similar or smaller force as compared to a standard MPO connector.

Figure 125B:
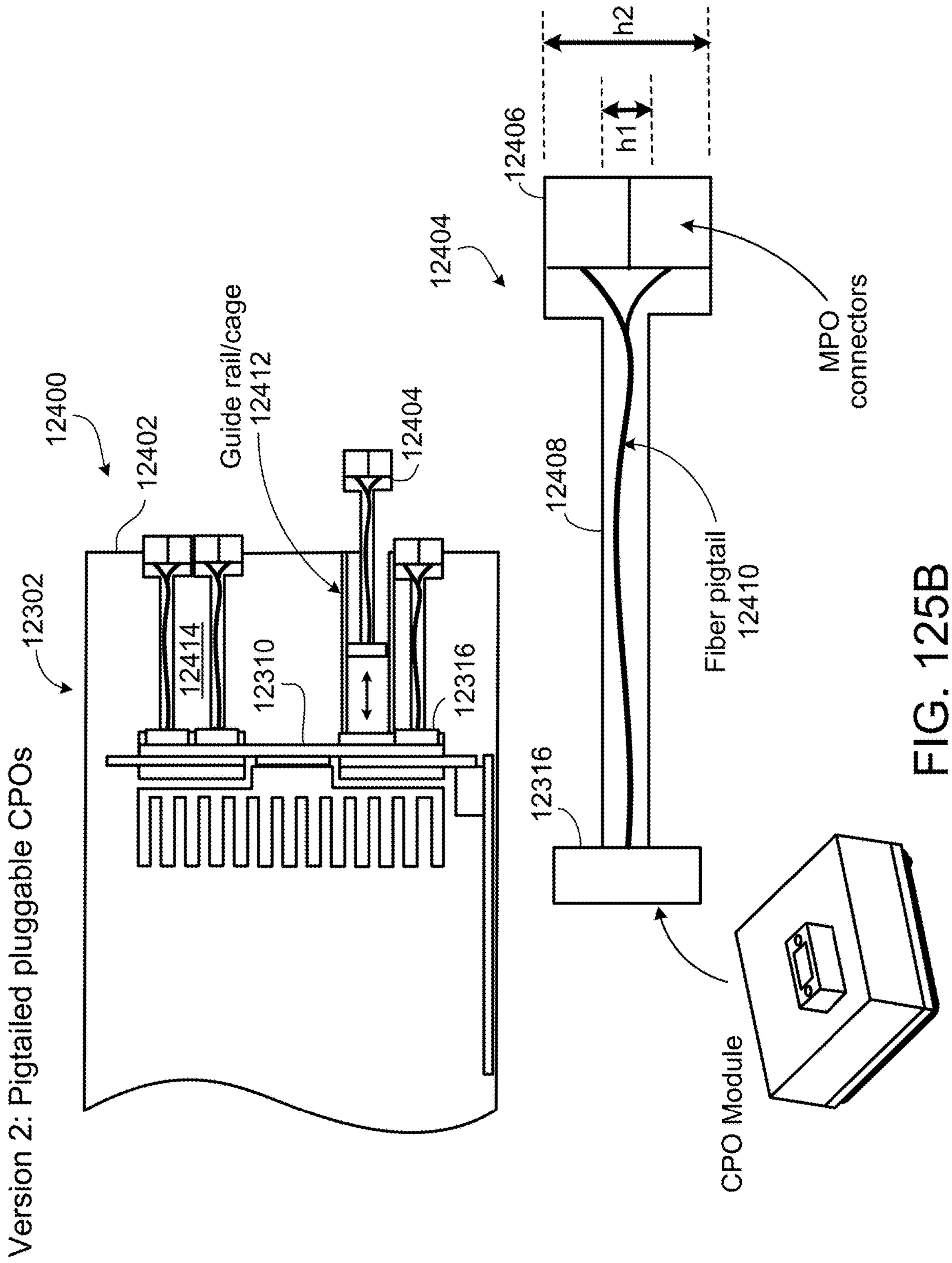
FIG. 125B is a diagram of an example of a rackmount server that has pluggable modules.

Referring to FIG. 125B, in some implementations, a rackmount server 12400 has a front panel 12402 (which can be, e.g., fixed) and a vertically mounted substrate 12310 recessed from the front panel 12402. The front panel 12402 has openings that allow pluggable modules 12404 to be inserted. Each pluggable module 12404 includes a co-packaged optical module 12316, one or more multi-fiber push on (MPO) connectors 12406, a fiber guide 12408 that mechanically connects the co-packaged optical module 12316 to the one or more multi-fiber push on connectors 12406, and a fiber pigtail 12410 that optically connects the co-packaged optical module 12316 to the one or more multi-fiber push on connectors 12406. For example, the length of the fiber guide 12408 is designed such that when the pluggable module 12404 is inserted into the opening of the front panel 12402 and the co-packaged optical module 12316 is electrically coupled to the vertically mounted substrate 12310, the one or more multi-fiber push on connectors 12406 are near the front panel, e.g., flush with, or slightly protrude from, the front panel 12402 so that the user can conveniently attach external fiber optic cables. For example, the front face of the connectors 12406 can be within an inch, or half an inch, or one-fourth of an inch, of the front surface of the front panel 12402.

For example, the housing 12302 can include guide rails or guide cage 12412 that help guide the pluggable modules 12404 so that the electrical connectors of the co-packaged optical modules 12316 are aligned with the electrical connectors on the printed circuit board.

In some implementations, the rackmount server 12400 has inlet fans mounted near the front panel 12402 and blow air in a direction substantially parallel to the front panel 12402, similar to the examples shown in FIGS. 96 to 98, 100, 104, 105, 107 to 116. The height h1 of the fiber guide 12408 (measured along a direction perpendicular to the bottom panel) can be designed to be smaller than the height h2 of the multi-fiber push on connectors 12406 so that there is space 12412 between adjacent fiber guides 12408 (in the vertical direction) to allow air to flow between the fiber guides 12408. The fiber guide 12408 can be a hollow tube with inner dimensions sufficiently large to accommodate the fiber pigtail 12410. The fiber guide 12408 can be made of metal or other thermally conductive material to help dissipate heat generated by the co-packaged optical module 12316. The fiber guide 12408 can have arbitrary shapes, e.g., to optimize thermal properties. For example, the fiber guide 12408 can have side openings, or a web structure, to allow air to flow pass the fiber guide 12408. The fiber guide 12408 is designed to be sufficiently rigid to enable the pluggable module 12404 to be inserted and removed from the rackmount server 12400 multiple times (e.g., several hundred times, several thousand times) under typical usage without deformation.

Figure 126A:
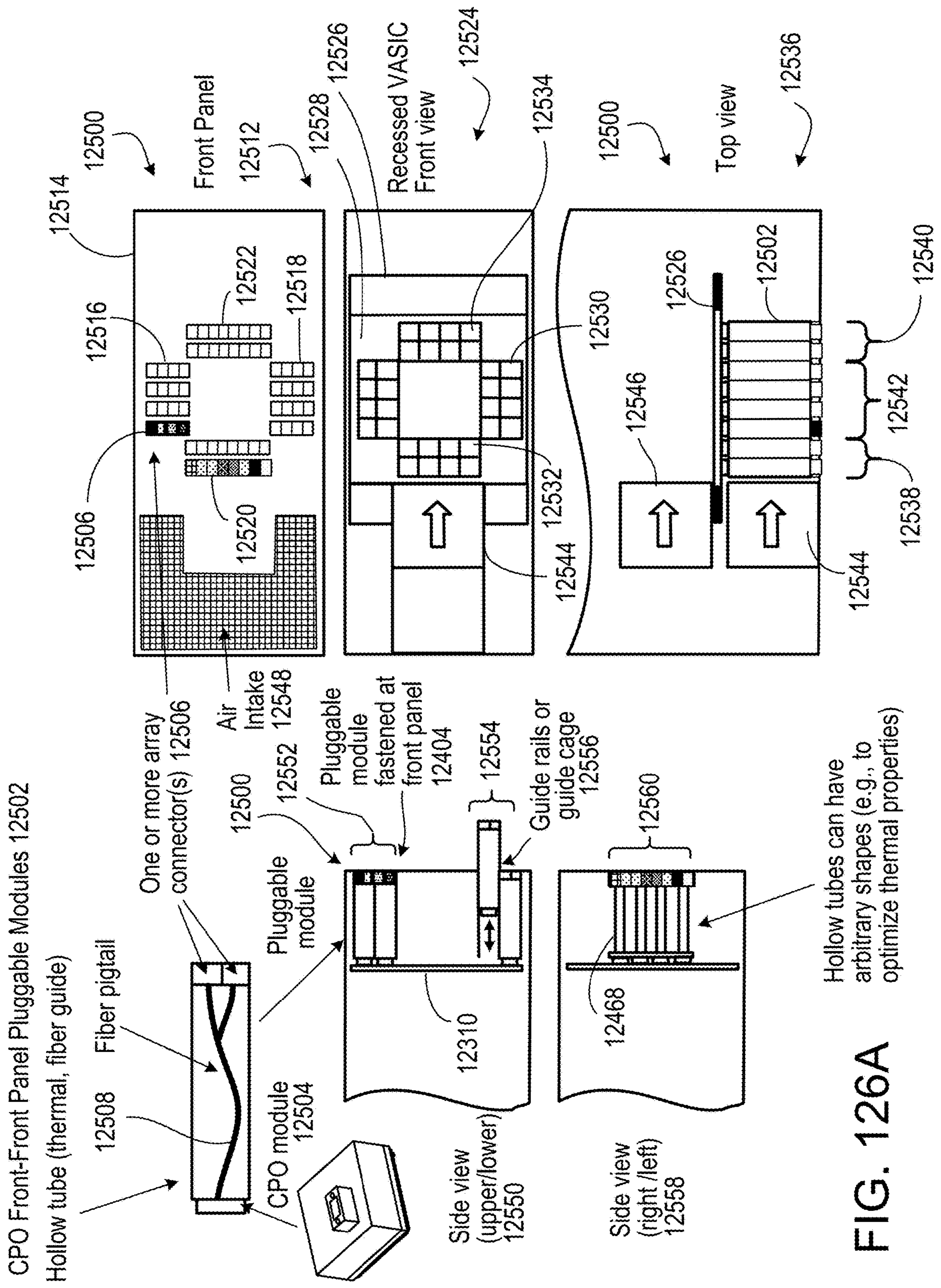
FIGS. 126A, 126B, and 127 are diagrams of examples of rackmount servers that have pluggable modules.

FIG. 126A includes various views of an example of a rackmount server 12500 that includes CPO front-panel pluggable modules 12502. Each pluggable module 12502 includes a co-packaged optical module 12504 that is optically coupled to one or more array connectors, such as multi-fiber push on connectors 12506, through a fiber pigtail 12508. In this example, each co-packaged optical module 12504 is optically coupled to 2 array connectors 12506. The pluggable module 12502 includes a rigid fiber guide 12510 that approximately spans the distance between the front panel and the vertically mounted printed circuit board.

A front view 12512 (at the upper right of FIG. 126A) shows an example of a front panel 12514 with an upper group of array connectors 12516, a lower group of array connectors 12518, a left group of array connectors 12520, and a right group of array connectors 12522. Each rectangle in the front view 12512 represents an array connector 12506. In this example, each group of array connectors 12516, 12518, 12520, 12522 includes 16 array connectors 12506.

A front view 12524 (at the middle right of FIG. 126A) shows an example of a recessed vertically mounted printed circuit board 12526 on which an application specific integrated circuit (ASIC) or data processing chip 12312 is mounted on the rear side and not shown in the front view 12524. The printed circuit board 12526 has an upper group of electrical contacts 12528, a lower group of electrical contacts 12530, a left group of electrical contacts 12532, and a right group of electrical contacts 12534. Each rectangle in the front view 12524 represents an array of electrical contacts associated with one co-packaged optical module 12504. In this example, each group of electrical contacts 12528, 12530, 12532, 12534 includes 8 arrays of electrical contacts that are configured to be electrically coupled to the electrical contacts of 8 co-packaged optical modules 12504. In this example, each co-packaged optical module 12504 is optically coupled to two array connectors 12506, so the number of rectangles shown in the front view 12512 is twice the number of squares shown in the front view 12524. The front panel 12514 includes openings that allow insertion of the pluggable modules 12502. In this example, each opening has a size that can accommodate two array connectors 12506.

A top view 12536 (at the lower right of FIG. 126A) of the front portion of the rackmount server 12500 shows a top view of the pluggable modules 12506. In the top view 12536, the two left-most pluggable modules 12538 include co-packaged optical modules 12504 that are electrically coupled to the electrical contacts in the left group of electrical contacts 12532 shown in the front view 12524, and include array connectors 12506 in the left group of array connectors 12520 shown in the front view 12512. In the top view 12536, the two right-most pluggable modules 12540 include co-packaged optical modules 12504 that are electrically coupled to the electrical contacts in the right group of electrical contacts 12534 shown in the front view 12524, and include array connectors 12506 in the right group of array connectors 12522 shown in the front view 12512. In the top view 12536, the four middle pluggable modules 12542 include co-packaged optical modules 12504 that are electrically coupled to the electrical contacts in the upper group of electrical contacts 12528 shown in the front view 12524, and include array connectors 12506 in the upper group of array connectors 12516 shown in the front view 12512.

The front view 12524 (at the middle right of FIG. 126A) shows a first inlet fan 12544 that blows air from left to right across the space between the front panel 12514 and the printed circuit board 12526. The top view 12536 (at the lower right of FIG. 126A) shows the first inlet fan 12544 and a second inlet fan 12546. The first inlet fan 12544 is mounted at the front side of the printed circuit board 12526 and blows air across the pluggable modules 12502 to help dissipate the heat generated by the co-packaged optical modules 12504. The second inlet fan 12546 is mounted at the rear side of the printed circuit board 12526 and blows air across the data processing chip 12312 and the heat dissipating device 12314.

As shown in the front view 12512 (at the upper right of the FIG. 126A), the front panel 12514 includes an opening 12548 that provides incoming air for the front inlet fans 12544, 12546. A protective mesh or grid can be provided at the opening 12548.

A left side view 12550 (at the middle left of FIG. 126A) of the front portion of the rackmount server 12500 shows pluggable modules 12552 that correspond to the upper group of array connectors 12516 in the front view 12512 and the upper group of electrical contacts 12528 in the front view 12524. The left side view 12550 also shows pluggable modules 12554 that correspond to the lower group of array connectors 12518 in the front view 12512 and the lower group of electrical contacts 12530 in the front view 12524. As shown in the left side view 12550, guide rails or guide cage 12556 can be provided to help guide the pluggable modules 12502 so that the electrical connectors of the co-packaged optical modules 12504 are aligned with the electrical contacts on the printed circuit board 12526. The pluggable modules 12502 can be fastened at the front panel 12514, e.g., using clip mechanisms.

A left side view 12558 of the front portion of the rackmount server 12500 shows pluggable modules 12560 that correspond to the left group of array connectors 12520 in the front view 12512 and the left group of electrical contacts 12532 in the front view 12524.

In this example, the fiber guides 12510 for the pluggable modules 12502 that correspond to the left and right groups of array connectors 12520, 12522, and the left and right groups of electrical contacts 12532, 12534 are designed to have smaller heights so that there are gaps between adjacent fiber guides 12510 in the vertical direction to allow air to flow through.

In some implementations, each co-packaged optical module can receive optical signals from a large number of fiber cores, and each co-packaged optical module can be optically coupled to external fiber optic cables through three or more array connectors that occupy an overall area at the front panel that is larger than the overall area occupied by the co-packaged optical module on the printed circuit board.

Figure 126B:
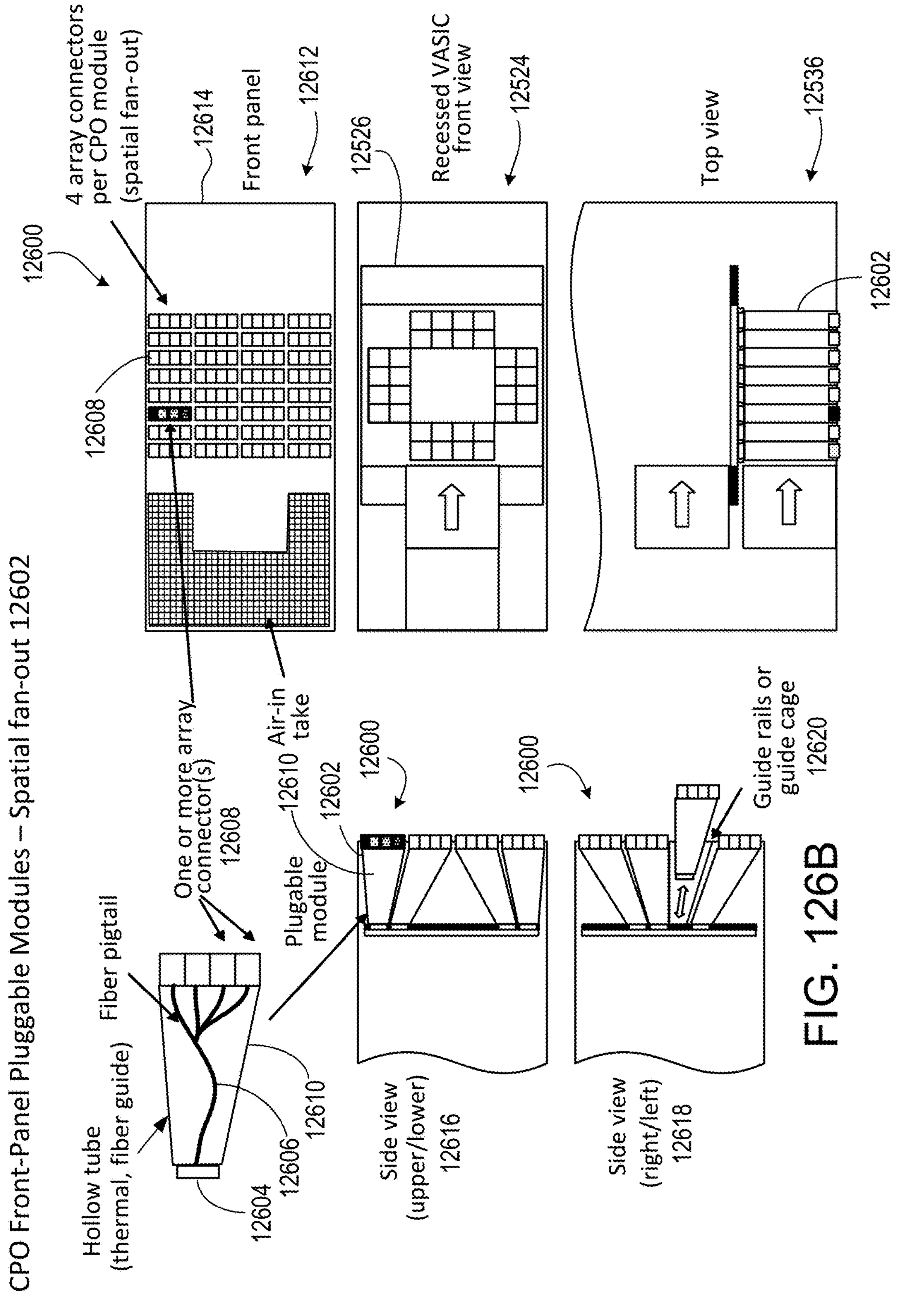

Referring to FIG. 126B, in some implementations, a rackmount server 12600 is designed to use pluggable modules 12602 having a spatial fan-out design. Each pluggable module 12602 includes a co-packaged optical module 12604 that is optically coupled, through a fiber pigtail 12606, to one or more array connectors 12608 that have an overall area larger than the area of the co-packaged optical module 12604. The area is measured along the plane parallel to the front panel. In this example, each co-packaged optical module 12604 is optically coupled to 4 array connectors 12608. The pluggable module 12602 includes a tapered fiber guide 12610 that is narrower near the co-packaged optical module 12604 and wider near the array connectors 12608.

A front view 12612 (at the upper right of FIG. 126B) shows an example of a front panel 12614 that can accommodate an array of 128 array connectors 12608 arranged in 16 rows and 8 columns. The front view 12524 (at the middle right of FIG. 126B) of the recessed printed circuit board 12526 and the top view (at the lower right of FIG. 126B) of the front portion of the rackmount server 12600 are similar to corresponding views in FIG. 126A.

A left side view 12616 (at the middle left of FIG. 126B) shows an example of pluggable modules 12602 that have co-packaged optical modules that are connected to the upper and lower groups of electrical contacts on the printed circuit board 12526. A left side view 12618 (at the lower left of FIG. 126B) shows an example of pluggable modules 12602 that have co-packaged optical modules that are connected to the left group of electrical contacts on the printed circuit board 12526. As shown in the left side view 12618, guide rails or guide cage 12620 can be provided to help guide the pluggable modules 12602 so that the electrical contacts of the co-packaged optical modules 12604 are aligned with corresponding electrical contacts on the printed circuit board 12526.

For example, the rackmount server 12400, 12500, 12600 can be provided to customers with or without the pluggable modules. The customer can insert as many pluggable modules as needed.

Figure 127:
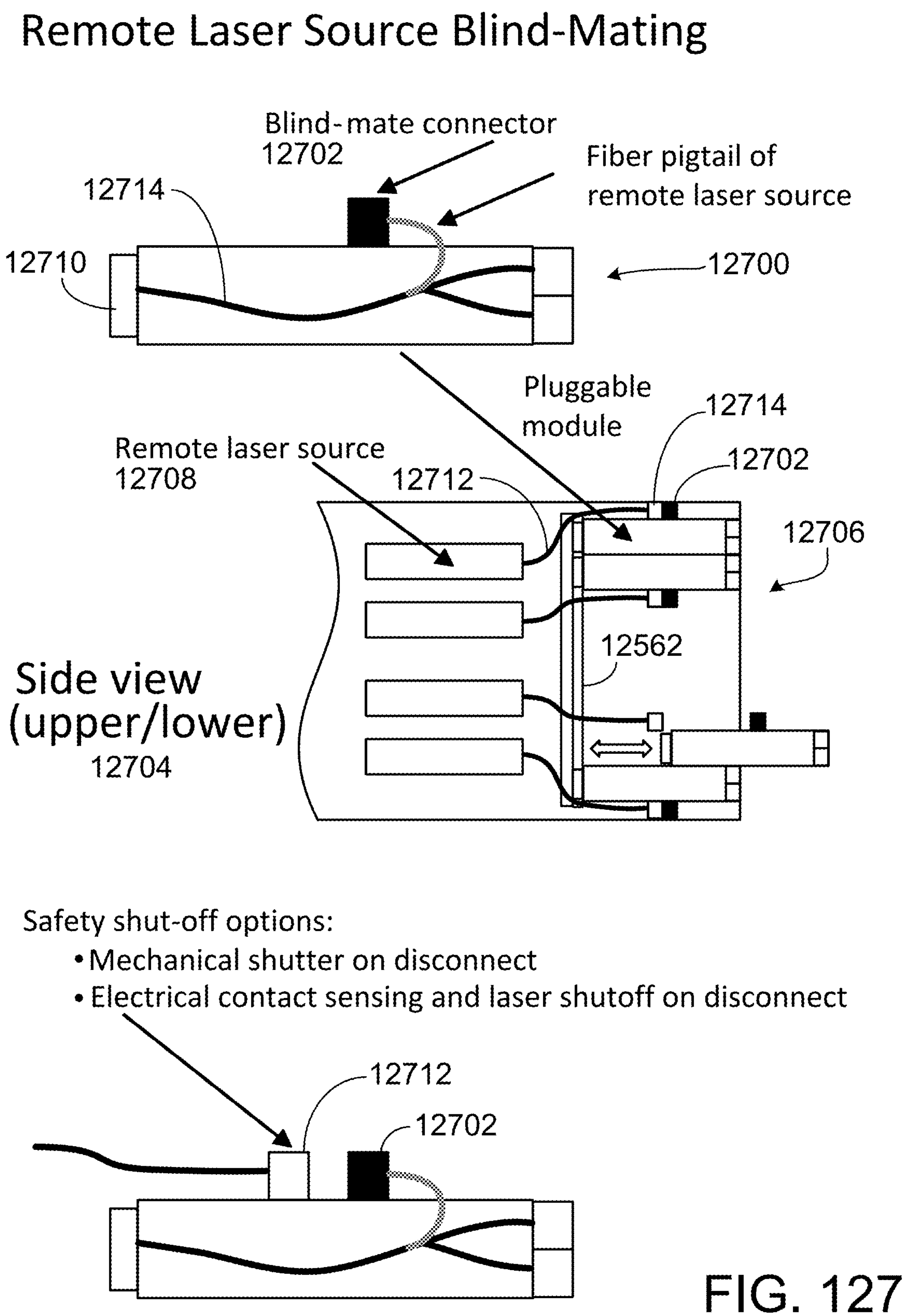

Referring to FIG. 127, in some implementations, a CPO front panel pluggable module 12700 can include a blind mate connector 12702 that is designed receive optical power supply light. A portion of the fiber pigtail 12714 is optically coupled to the blind mate connector 12702. FIG. 127 includes a side view 12704 of a rackmount server 12706 that includes laser sources 12708 that provide optical power supply light to the co-packaged optical modules 12710 in the pluggable modules 12700. The laser sources 12708 are optically coupled, through optical fibers 12712, to optical connectors 12714 that are configured to mate with the blind-mate connectors 12702 on the pluggable modules 12700. When the pluggable module 12700 is inserted into the rackmount server 12706, the electrical contacts of the co-packaged optical module 12710 contacts the corresponding electrical contacts on the printed circuit board 12526, and the blind-mate connector 12702 mates with the optical connector 12714. This allows the co-packaged optical module 12710 to receive optical signals from external fiber optic cables and the optical power supply light through the fiber pigtail 12714.

In some implementations, to prevent the light from the laser source 12708 from harming operators of the rackmount server 12706, a safety shut-off mechanism is provided. For example, a mechanical shutter can be provided on disconnection of the blind-mate connector 12702 from the optical connector 12712. As another example, electrical contact sensing can be used, and the laser can be shut off upon detecting disconnection of the blind-mate connector 12702 from the optical connector 12712.

Figure 128:
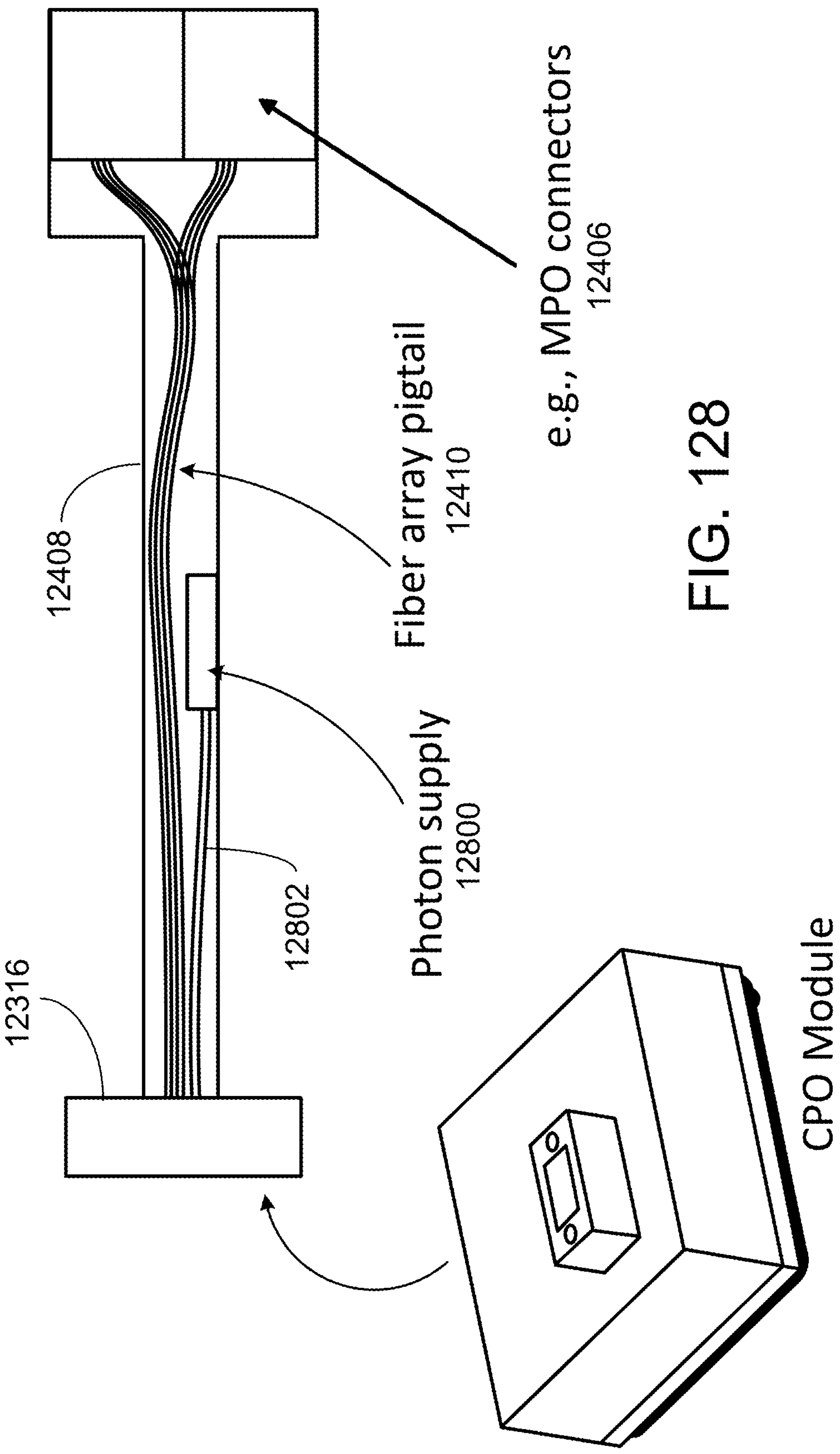

Referring to FIG. 128, in some implementations, one or more photon supplies 12800 can be provided in the fiber guide 12408 to provide power supply light to the co-packaged optical module 12316 through one or more power supply optical fibers 12802. The one or more photon supplies 12800 can be selected to have a wavelength (or wavelengths) and power level (or power levels) suitable for the co-packaged optical module 12316. Each photon supply 12800 can include, e.g., one or more diode lasers having the same or different wavelengths.

Electrical connections (not shown in the figure) can be used to provide electrical power to the one or more photon supplies 12800. In some implementations, the electrical connections are configured such that when the co-packaged optical module 12316 is removed from the substrate 12310, the electrical power to the one or more photon supplies 12800 is turned off. This prevents light from the one or more photon supplies 12800 from harming operators. Additional signals lines (not shown in the figure) can provide control signals to the photon supply 12800. In some embodiments, electrical connections to the photon supplies 12800 are made to the system through the CPO module 12316. In some embodiments, electrical connections to the photon supplies 12800 use parts of the fiber guide 12408, which in some embodiments is made from electrically conductive materials. In some embodiments, the fiber guide 12408 is made of multiple parts, some of which are made from electrically conductive materials and some of which are made from electrically insulating materials. In some embodiments, two electrically conductive parts are mechanically connected but electrically separated by an electrical insulating part.

For example, the photon supply 12800 is thermally coupled to the fiber guide 12408, and the fiber guide 12408 can help dissipate heat from the photon supply 12800.

In some examples, the CPO module 12316 is coupled to spring-loaded elements or compression interposers mounted on the substrate 12310. The force required to press the CPO module 12316 into the spring-loaded elements or the compression interposers can be large. The following describes mechanisms to facilitate pressing the CPO module 12361 into the spring-loaded elements or the compression interposers.

Figure 129:
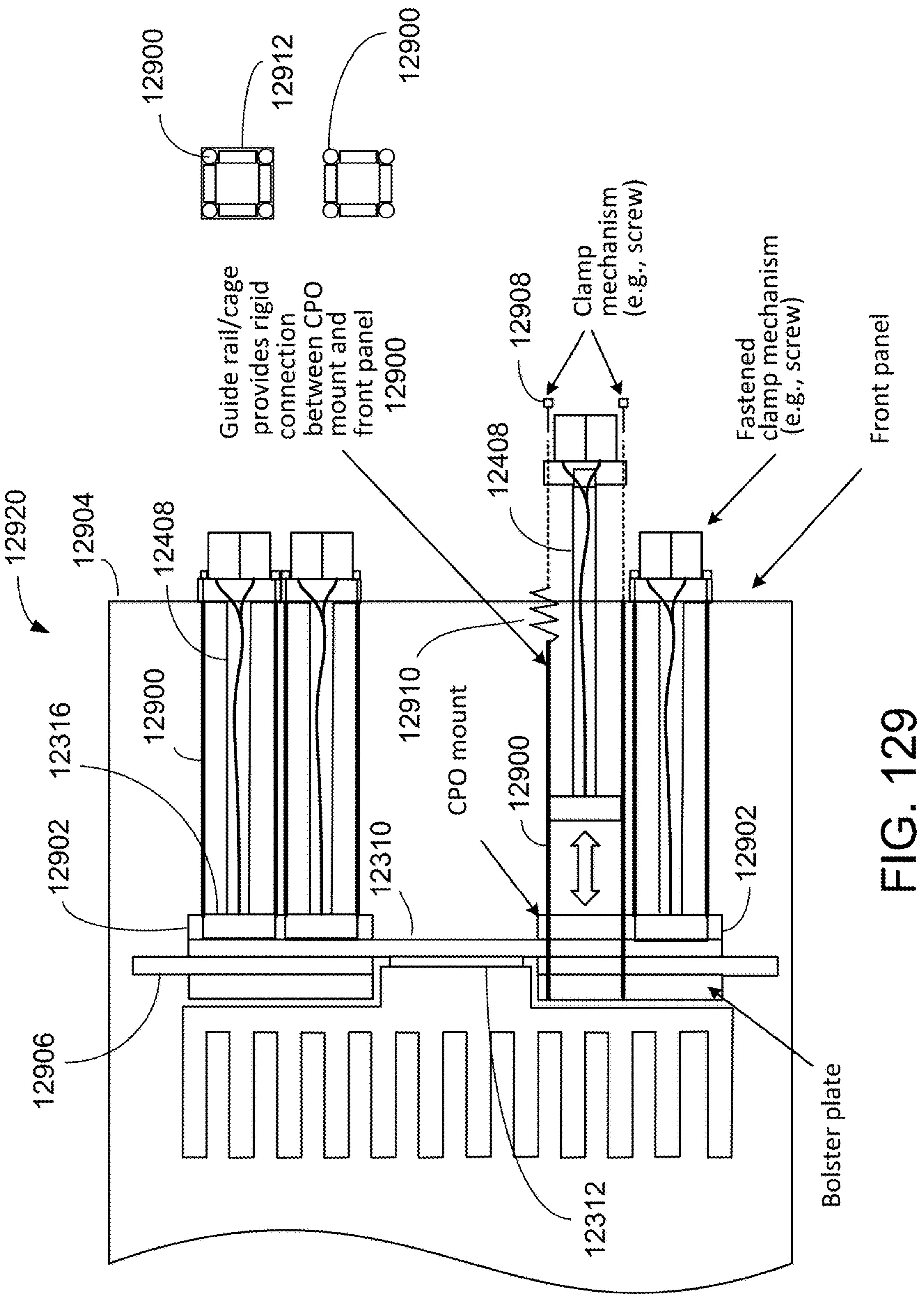

Referring to FIG. 129, in some implementations, a rackmount server 12920 includes a substrate 12310 that is attached to a printed circuit board 12906, which has an opening to allow the data processing chip 12312 to protrude or partially protrude through the opening and be attached to the substrate 12310. The printed circuit board 12906 can have many functions, such as providing support for a large number of electrical power connections for the data processing chip 12312. The CPO module 12316 can be mounted on the substrate 12310 through a CPO mount or a front lattice 12902. A bolster plate 12914 is attached to the rear side of the printed circuit board 12906. Both the substrate 12310 and the printed circuit board 12906 are sandwiched between the CPO mount or front lattice 12902 and the bolster plate 12914 to provide mechanical strength so that CPO modules 12316 can exert the required pressure onto the substrate 12310. Guide rails/cage 12900 extend from the front panel 12904 or the front portion of the fiber guide 12408 to the bolster plate 12914 and provide rigid connections between the CPO mount 12902 and the front panel 12904 or the front portion of the fiber guide 12408.

Clamp mechanisms 12908, such as screws, are used to fasten the guide rails/cage 12900 to the front portion of the fiber guide 12408. After the CPO module 12316 is initially pressed into the spring-loaded elements or the compression interposers, the screws 12908 are tightened, which pulls the guide rails/cage 12900 forward, thereby pulling the bolster plate 12914 forward and provide a counteracting force that pushes the spring-loaded elements or the compression interposers in the direction of the CPO module 12316. Springs 12910 can be provided between the guide rails 12900 and the front portion of the fiber guide 12408 to provide some tolerance in the positioning of the front portion of the fiber guide 12408 relative to the guide rails 12900.

The right side of FIG. 129 shows front views of the guide rails/cage 12900. For example, the guide rails 12900 can include multiple rods (e.g., four rods) that are arranged in a configuration based on the shape of the front portion of the fiber guide 12408. If the front portion of the fiber guide 12408 has a square shape, the four rods of the guide rails 12900 can be positioned near the four corners of the front portion of the squared-shaped fiber guide 12408. In some examples, a guide cage 12912 can be provided to enclose the guide rails 12900. The guide rails 12900 can also be used without the guide cage 12912.

The following describes examples of rackmount servers having various thermal solutions to assist in dissipating heat generated from the data processors and the co-packaged optical modules coupled to the vertically oriented circuit boards or substrates positioned near the front panel.

Figure 133:
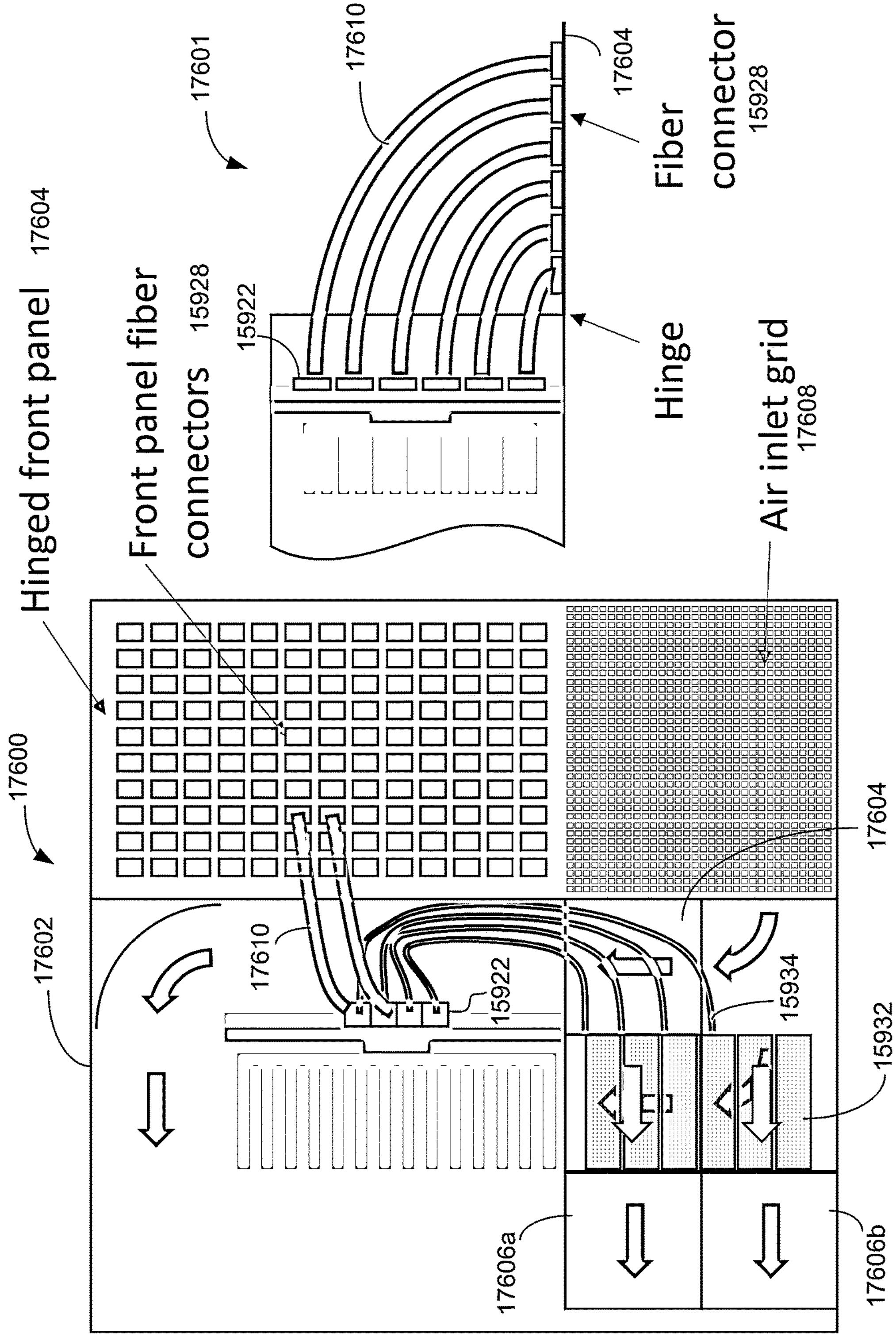

FIG. 133 shows a top view diagram 17600 and a side view diagram 17601 of a rackmount server 17602 that has a hinged front panel 17604 having front panel fiber connectors 15928 (see FIG. 130). Co-packaged optical modules 15922 are optically coupled to the fiber connectors 15928 through fiber pigtails 15926. Pluggable external laser sources (ELS) 15932 provide power supply light that are transmitted through optical fibers 15934 to the CPO modules 15922. The server 17602 is similar to the server 11700 of FIG. 117, except that the air inlet grid 17608 is larger, and the external laser sources 15932 (or 1956) have front-to-back airflow cooling through the use of two extra fans behind the laser sources 19532. In this example, an inlet fan 17604 blows air in the left-to-right direction toward the CPO modules 15922. A second fan 17606*a* and a third fan 17606*b* are positioned behind the laser sources 15932 to direct air flow to assist in cooling the laser sources 15932.

Figure 134:
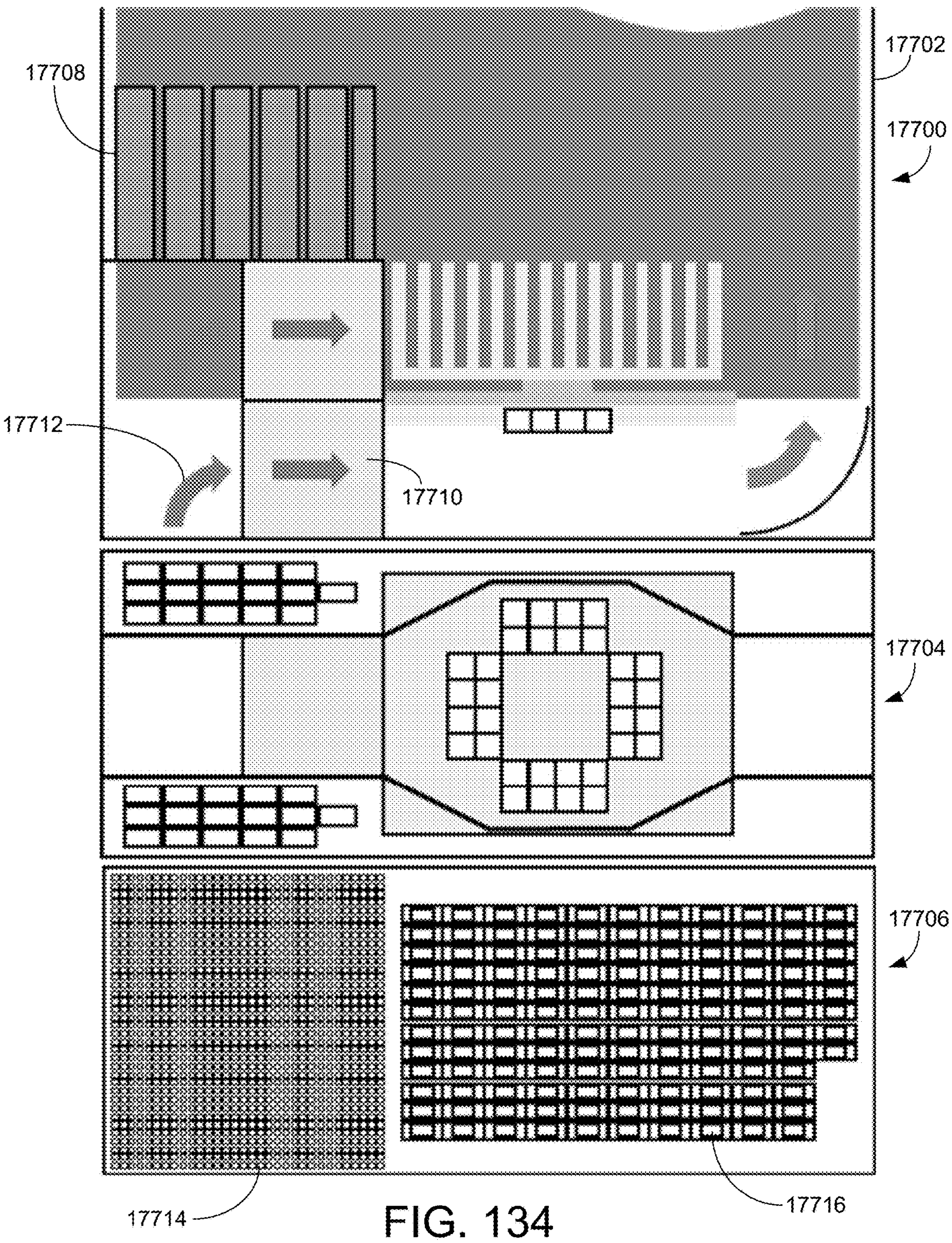

FIG. 134 shows a top view 17700 of an example of a rackmount server 17702, a VASIC-plane front view 17704 of the rackmount server 17702, and a front-panel front view 17706 of the rackmount server 17702. In this example, front-connected recessed remote laser sources 17708 are placed behind the left-to-right fans 17710. The configuration of the inlet fans 17710 results in unidirectional airflow, as represented by the arrows 17712. The VASIC-plane front view 17704 shows the front view when the hinged front panel is opened and lowered. The front-panel front view 17706 shows the air inlet grid 17714 and front panel fiber connectors 17716. For example, the connectors 17716 can includes 64 LC connectors (providing a bandwidth of 1.6 Tbps FR16) or 128 MPO connectors (providing a bandwidth of 400 Gbps DR4).

Figure 135:
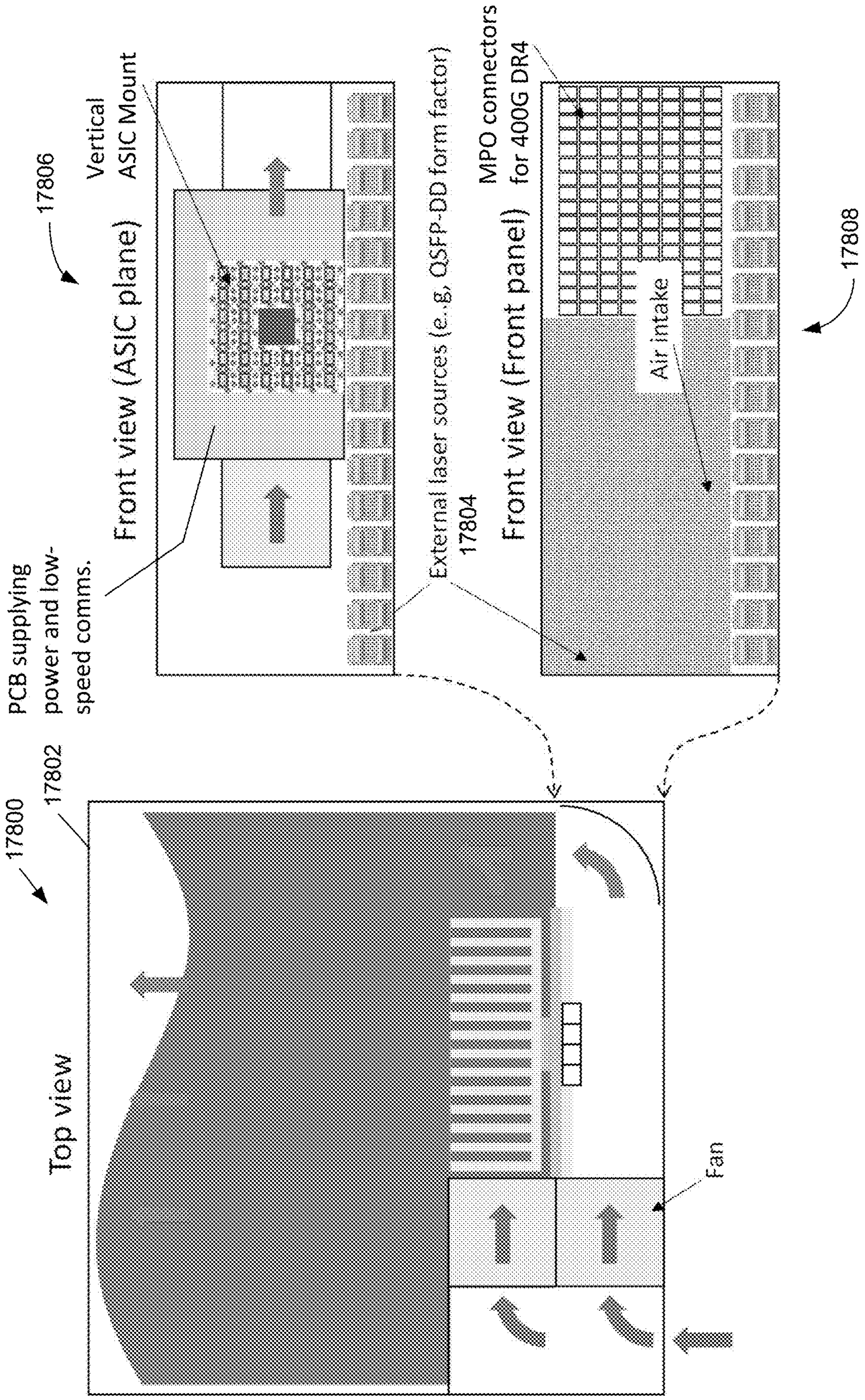

FIG. 135 shows a top view 17800 of an example of a rackmount server 17802 in which the external laser sources 17804 are mounted below the VASIC-plane and directly accessible from the front panel for easy front-panel access/serviceability. A VASIC-plane front view 17806 shows the front view when the hinged front panel is opened and lowered. A front-panel front view 17808 shows the air intake grid, the front panel fiber connectors, and the external laser sources.

In the examples shown in FIGS. 69A to 76, 77B, 78, 96 to 98, 100, 104, 108, 110, 112, 113, 117, 119, 121, 122, 126A, 126B, and 133 to 135, one of the inlet fans is mounted, attached, or coupled to the front panel, or positioned very close to the front panel. In some implementations, depending on the position of the circuit board or substrate on which the data processor and the co-packaged optical modules are coupled, the inlet fan nearest the front panel can be positioned at a distance from the front panel, e.g., a few inches from the front panel, or within one-fourth of the distance between the front panel and the rear panel (which can correspond to the depth of the housing). Here, the distance between the fan and the front panel refers to the distance between the tip of the fan blade and the front panel. The fan blade rotates during operation, so when we say that the distance between the fan and the front panel is within one-fourth the distance between the front panel and the rear panel, we mean that the fan is positioned near the front panel in which at least a portion of a fan blade of the fan is within one-fourth of the distance between the front and rear panels for at least some time period during operation of the fan.

Figure 147:
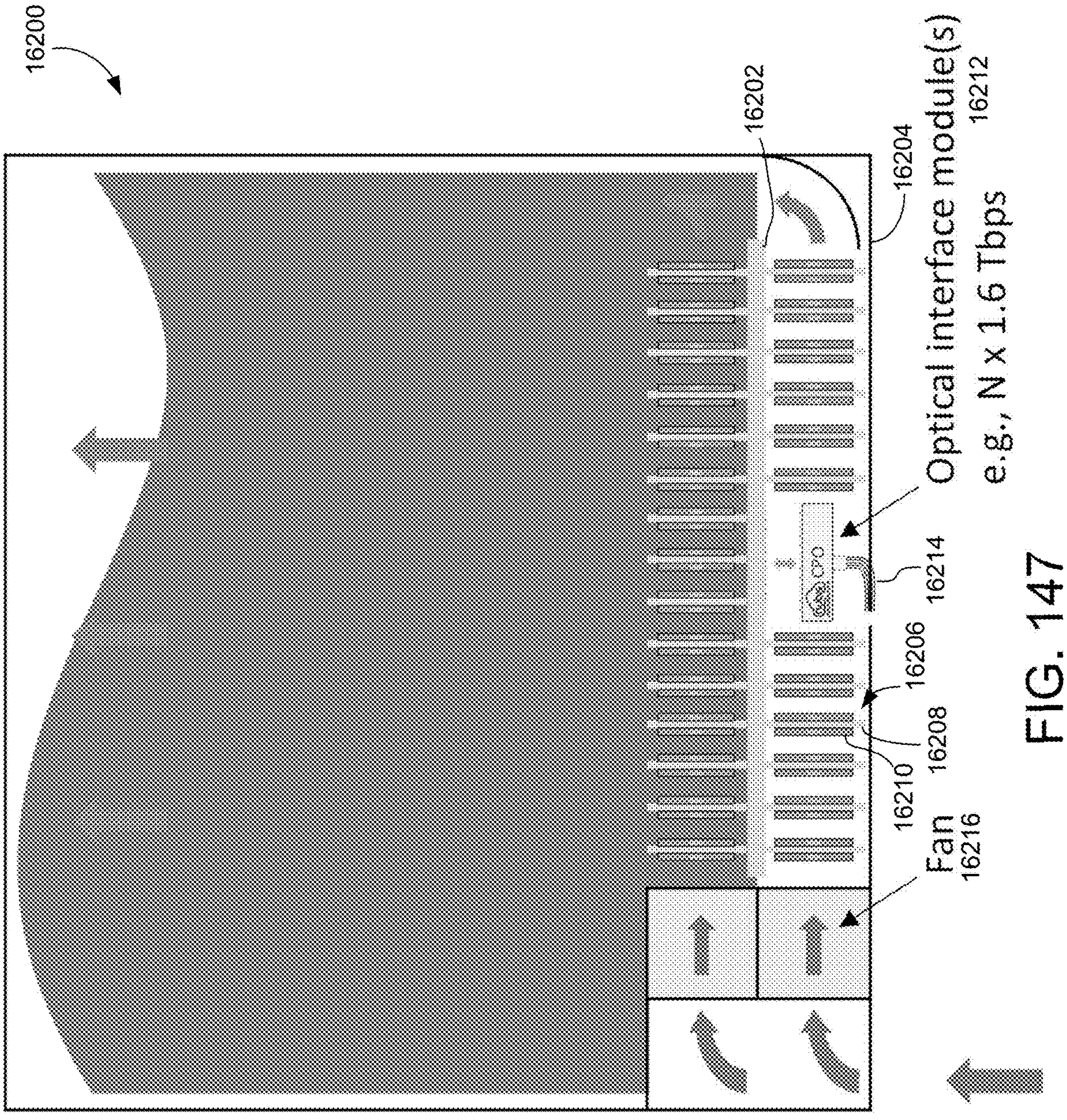

The following describes an example in which the communication interface(s) support memory modules mounted in smaller circuit boards that are electrically coupled to a larger circuit board positioned near the front panel. FIG. 147 shows a top view of an example of a system 16200 that includes a vertically oriented circuit board 16202 (also referred to as a carrier card) that is substantially parallel to the front panel 16204. Several memory modules 16206 are electrically coupled to the circuit board 16202, e.g., using sockets, such as DIMM (dual in line memory module) sockets. Each memory module 16202 includes a circuit board 16208 and one or more memory integrated circuits 16210, which can be mounted on one side or both sides of the circuit board 16208. One or more optical interface modules 16212 (e.g., co-packaged optical modules) are electrically coupled to the circuit board 16202 and function as the interface between the memory modules 16206 and one or more communication optical fiber cables 16214. For example, each optical interface module 16214 can support up to 1.6 Tbps bandwidth. When N optical interface modules 16214 are used (N being a positive integer), the total bandwidth can be up to N×1.6 Tbps. One or more fans 16216 can be mounted near the front panel 16204 to assist in removing heat generated by the various components (e.g., the optical interface modules 16212 and the memory modules 16206) coupled to the circuit board 16202. The technologies for implementing the optical interface modules 16212 and configuring the fans 16216 and airflows for optimizing heat removal have been described above and not repeated here.

Figure 148:
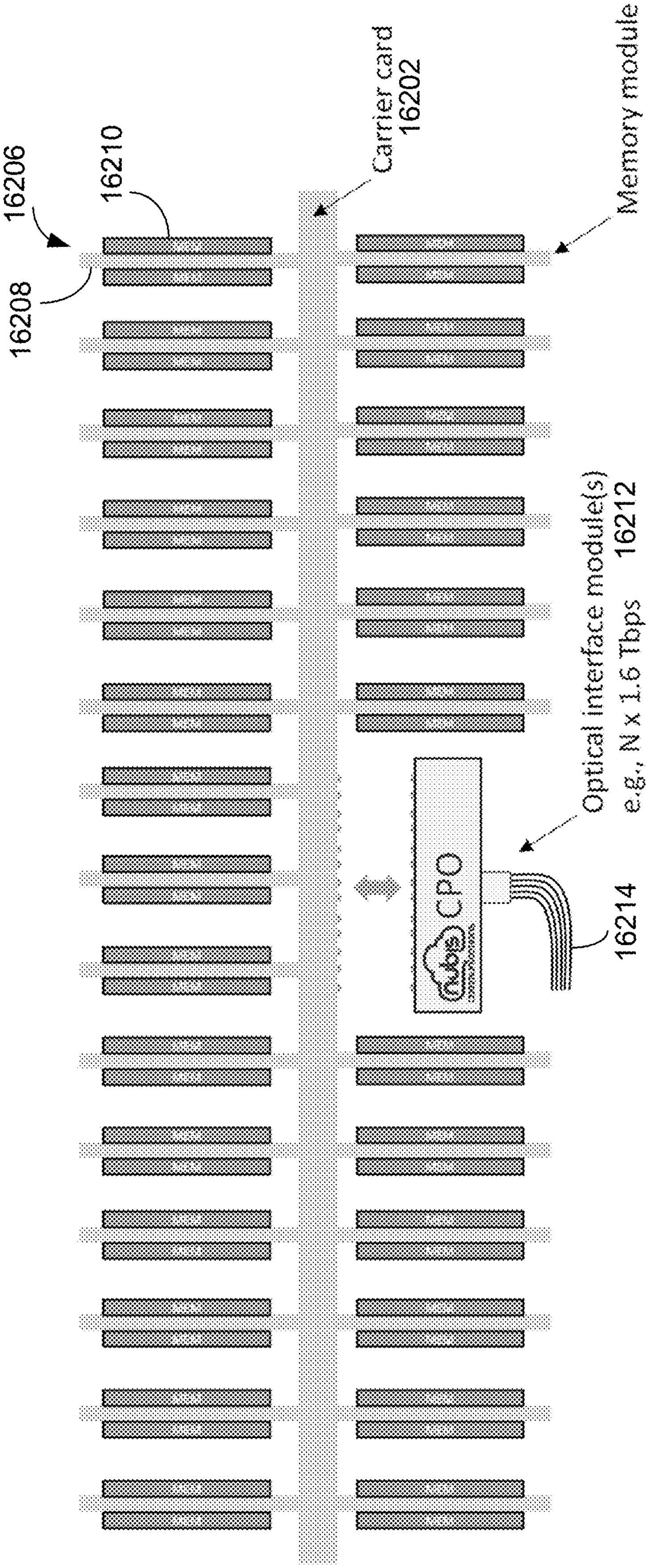

FIG. 148 is an enlarged diagram of the carrier card 16202, the optical interface module(s) 16212, and the memory modules 16206. In this example, the memory modules 16206 are mounted on both the front side and the rear side of the carrier card 16202. It is also possible mount the memory modules 16206 to just the front side, or just the rear side, of the carrier card 16202. In some examples, heat sinks are thermally attached to the memory chips 16210.

In some implementations, the memory modules 16206 on the carrier card 16202 can be used as, e.g., computer memory, disaggregated memory, or a memory pool. For example, the system 16200 can provide a large memory bank or memory pool that is accessible by more than one central processing unit. A data processing system can be implemented as a spatially co-located solution, e.g., 4 sets of the memory modules 16206 supporting 4 processors sitting in a common box or housing. A data processing system can also be implemented as a spatially separated solution, e.g., a rack full of processors, connected by optical fiber cables to another rack full of DIMMs (or other memory). In this example, the rack full of memory modules can includes multiple systems 16200. For example, the system 16200 is useful for implementing memory disaggregation to decouple physical memory allocated to virtual servers (e.g., virtual machines or containers or executors) at their initialization time from the runtime management of the memory. The decoupling allows a server under high memory usage to use the idle memory either from other servers hosted on the same physical node (node level memory disaggregation) or from remote nodes in the same cluster (cluster level memory disaggregation).

Figure 149:
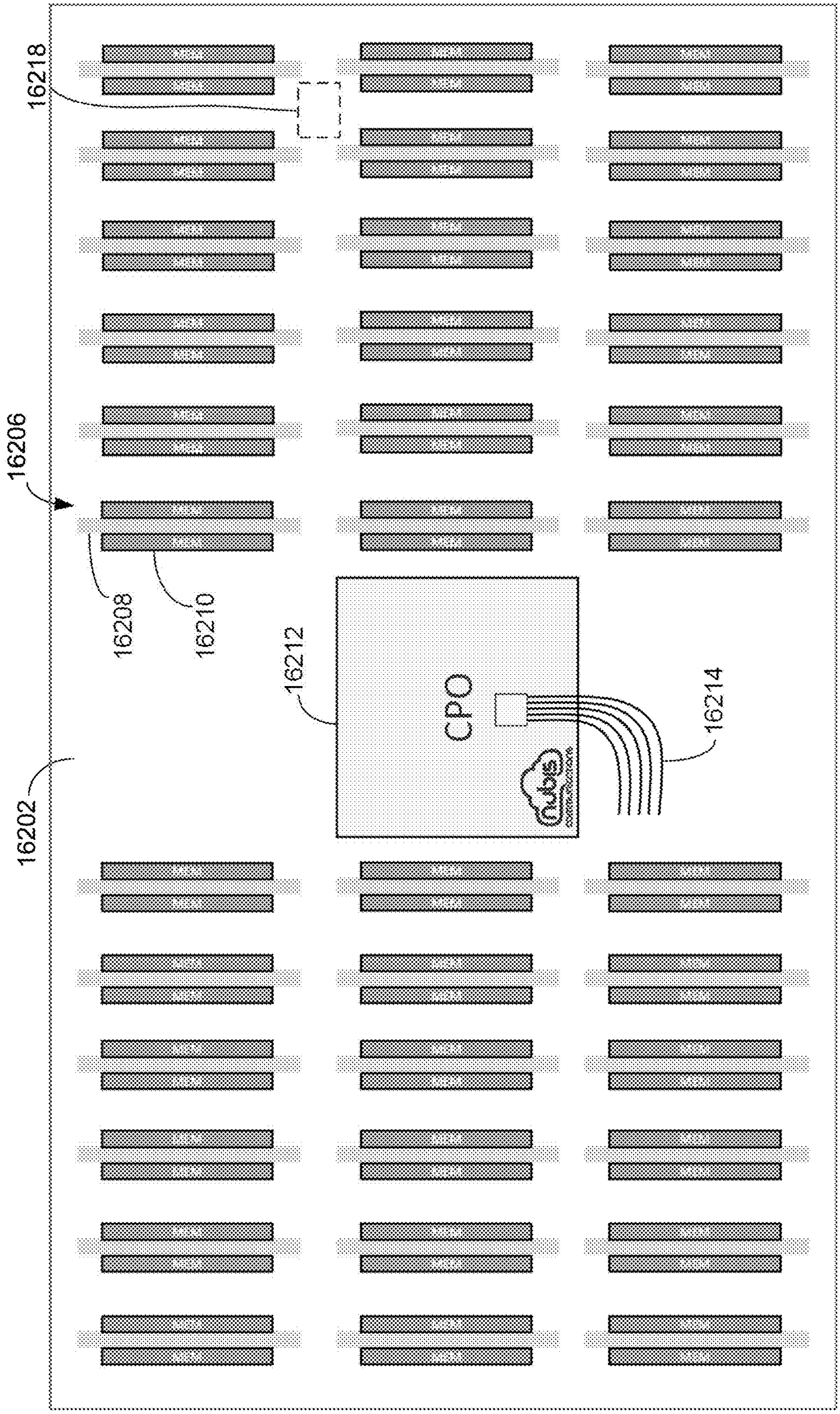

FIG. 149 is a front view of an example of the carrier card 16202, the optical interface module(s) 16212, and the memory modules 16206. In this example, three rows of memory modules 16206 are attached to the circuit board 16202. The number of memory modules 16206 can vary depending on application. The orientation of the memory modules 16206 can also be modified depending on how the system is configured. For example, instead of orienting the memory modules 16206 to extend in the vertical direction as shown in FIG. 164, the memory modules 16206 can also be oriented to extend in the horizontal direction, or at an angle between 0° to 90° relative to the horizontal direction, in order to optimize air flow and heat dissipation.

Figure 150:
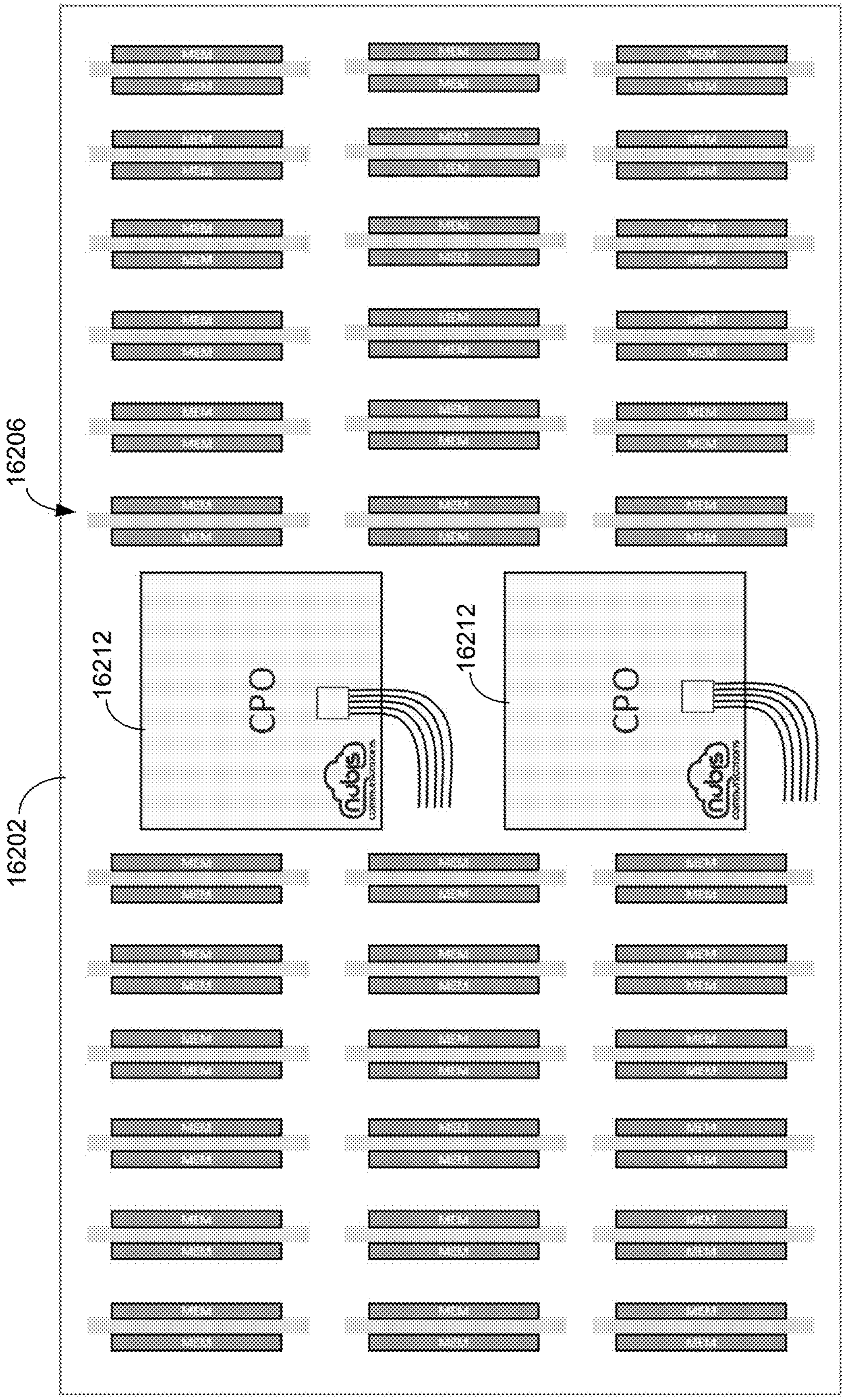

FIG. 150 is a front view of an example of the carrier card 16202 with two optical interface modules 16212, and memory modules 16206. FIGS. 149 and 150, as well as many other figures, are not drawn to scale. The optical interface modules 16212 can be much smaller than what is shown in the figure, and many more optical interface modules 16212 can be attached to the circuit board 16202. For example, the optical interface module 16212 can be positioned in the space 16218 (shown in dashed lines) between the four memory modules 16206. In some examples, the memory modules 16206 can interface directly with the optical interface module 16212.

Figure 151:
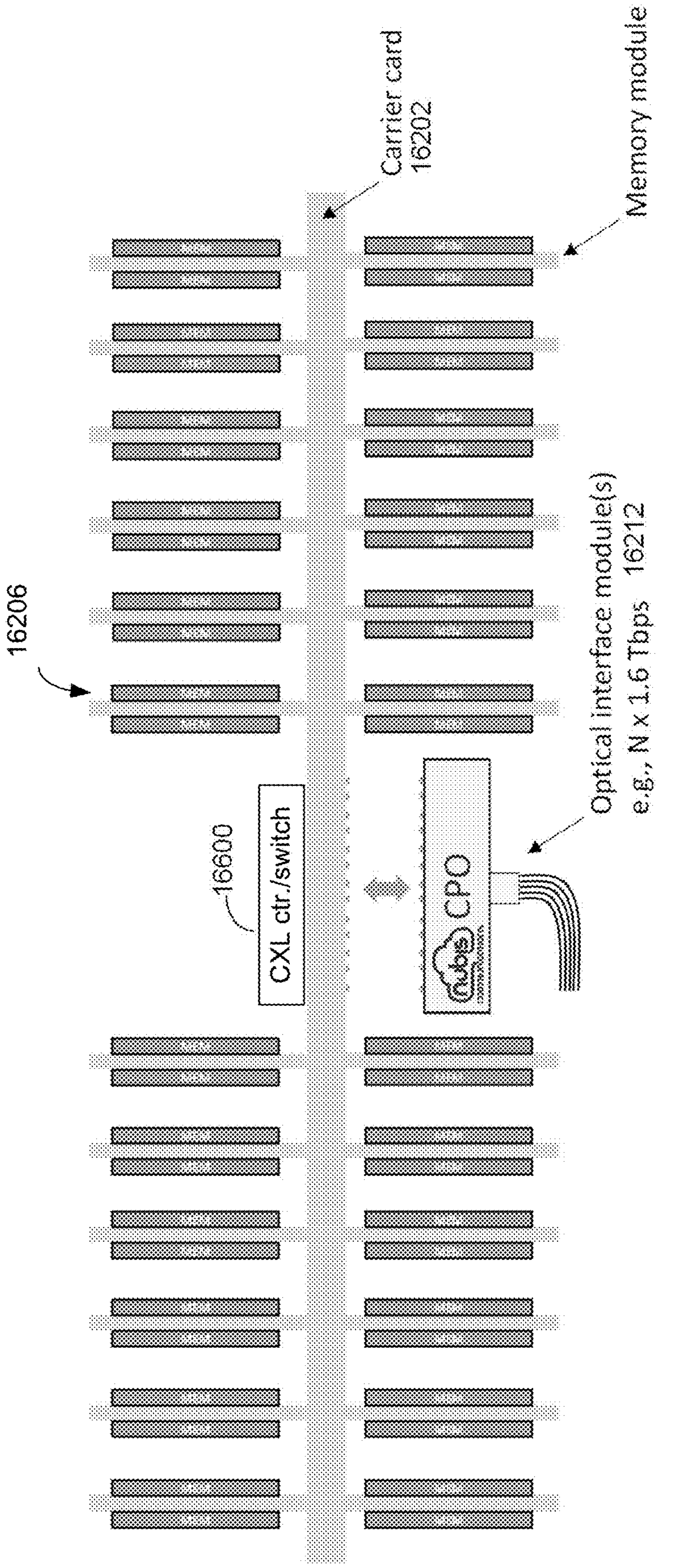

Referring to FIG. 151, in some implementations, one or more memory controllers or switches 16600 (e.g. Compute Express Link (CXL) controller(s)) is/are electrically coupled to the carrier card 16202 and configured to aggregate the traffic from the memory modules 16206. For example, the memory controller(s) or switch(es) 16600 can be implemented as an integrated circuit mounted on the rear side of the carrier card 16202, opposite to the optical interface module(s) 16212. Electrical traces are provided on or in the circuit board 16202 to connect the memory modules 16206 to the CXL controller/switch(es) 16600, and the CXL controller/switch(es) 16600 then aggregate the traffic from the memory modules 16206 and interface them to the CPO module 16212.

The carrier card 16202 and the memory modules 16206 can be any of a variety of sizes depending on the available space in the housing. The capacity of the memory modules 16206 can vary depending on application. As memory technology improves in the future, it is expected that the capacity of the memory modules 16206 will increase in the future. For example, the carrier card 16202 can have dimensions of 20 cm×20 cm, each memory module 16206 can have dimensions of 10 cm×2 cm, and each memory module can have a capacity of 64 GB. A spacing of 6 mm can be provided between memory modules 16206. The memory modules 16206 can occupy both sides of the carrier card 16202. In this example, the carrier card 16202 has a height of 20 cm and can support 2 rows of memory modules 16206, with each memory module 16206 extending 10 cm in the vertical direction. With a carrier card width of 20 cm and a 6 mm spacing between memory modules 16206, there can be about 32 memory modules per row, and about 64 memory modules per side of the carrier card 16202. When the memory modules are mounted on both sides of the carrier card 16202, there can be up to a total of about 128 memory modules 16206 per carrier card. With up to 64 GB capacity for each memory module 16206, the carrier card 16202 can support up to about 8 TB memory in a space approximately the size of 1,600 $cm^3$.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

For example, the techniques described above for improving the operations of systems that include rackmount servers (see FIGS. 76, 85 to 87B) can also be applied to systems that include blade servers. In the examples shown in FIGS. 80A and 82A, each of the switch boxes 1302 and 1304 can be replaced with any type of data processing device, such as a data processing device that includes one or more of a network switch, a central processor unit, a graphics processor unit, a tensor processing unit, a neural network processor, an artificial intelligence accelerator, a digital signal processor, a microcontroller, a storage device, or an application specific integrated circuit (ASIC). For example, in FIG. 84A, each of the switch boxes 1462, 1464, 1466, and 1468 can be replaced with any type of data processing device, such as a data processing device that includes one or more of a network switch, a central processor unit, a graphics processor unit, a tensor processing unit, a neural network processor, an artificial intelligence accelerator, a digital signal processor, a microcontroller, a storage device, or an application specific integrated circuit (ASIC).

In some implementations, the devices 1464, 1466, and 1468 can be rackmount servers mounted on a same rack, the switch box 1462 can be a top-of-rack switch 1462, and the servers (e.g., 1464, 1466, 1468) in the rack communicate with each other through the top-of-rack switch 1462. In this example, the co-packaged optical modules or optical communication interfaces are configured to receive power supply light provided by the optical power supply 1322 and/or 1332.

For example, in FIGS. 85 and 86, each of the servers 1522 (e.g., 1522*a*, 1522*b*, 1522*c*) can be any type of server that includes one or more of a network switch, a central processor unit, a graphics processor unit, a tensor processing unit, a neural network processor, an artificial intelligence accelerator, a digital signal processor, a microcontroller, a storage device, or an application specific integrated circuit (ASIC). For example, one or more of the servers 1522 can be data storage servers, and one or more of the servers 1522 can be data processing servers that execute application programs that access (e.g., read and write) data stored in the data storage servers.

For example, in FIGS. 87A and 87B, each of the servers 1552 can be any type of server that includes one or more of a network switch, a central processor unit, a graphics processor unit, a tensor processing unit, a neural network processor, an artificial intelligence accelerator, a digital signal processor, a microcontroller, a storage device, or an application specific integrated circuit (ASIC). For example, each of the switch boxes 1556 can be replaced with any type of high-bandwidth data processing system, such as a data processing system that includes one or more of a network switch, a central processor unit, a graphics processor unit, a tensor processing unit, a neural network processor, an artificial intelligence accelerator, a digital signal processor, a microcontroller, a storage device, or an application specific integrated circuit (ASIC).

For example, in FIG. 138, each of the servers 13802 can be any type of server that includes one or more of a network switch, a central processor unit, a graphics processor unit, a tensor processing unit, a neural network processor, an artificial intelligence accelerator, a digital signal processor, a microcontroller, a storage device, or an application specific integrated circuit (ASIC). For example, each of the switch boxes 13806 can be replaced with any type of high-bandwidth data processing system, such as a data processing system that includes one or more of a network switch, a central processor unit, a graphics processor unit, a tensor processing unit, a neural network processor, an artificial intelligence accelerator, a digital signal processor, a microcontroller, a storage device, or an application specific integrated circuit (ASIC).

For example, the data processing system 1550 of FIG. 87A and the data processing system 13800 of FIG. 138 can implement a high-speed, high-bandwidth data processing system that includes one or more high-speed, high-bandwidth data processors that access large memory banks or memory pools through optical communication links. For example, one or more of the switch boxes 1556 of FIG. 87A can be replaced with one or more of the rack systems 12400 of FIG. 124 that include several vertically mounted processor blades 12300. One or more of the servers 1552 can be one or more of the storage systems 16200 that include vertically oriented circuit boards 16202 on which several memory modules 16206 are mounted. One or more of the optical fiber cables 13700 (FIG. 137) can be used to optically connect the one or more rack systems 12400 to one or more storage systems 16200. The co-packaged optical modules or optical communication interfaces at the one or more rack systems 12400 and the one or more storage systems 16200 can receive power supply light provided by an external laser source, such as the optical power supply 1558.

Similarly, one or more of the switch boxes 13806 of FIG. 138 can be replaced with one or more of the rack systems 12400 of FIG. 124 that include several vertically mounted processor blades 12300. One or more of the servers 13802 can be one or more of the storage systems 16200 that include vertically oriented circuit boards 16202 on which several memory modules 16206 are mounted. One or more of the optical fiber cables 14100 (FIG. 141) can be used to optically connect the one or more rack systems 12400 to one or more storage systems 16200. The co-packaged optical modules or optical communication interfaces at the one or more rack systems 12400 and the one or more storage systems 16200 can receive power supply light provided by an external laser source, such as the optical power supply 13808.

For example, the processor blades 12300 of the rack systems 12400 can include data processors that implement a variety of services, such as cloud computing, database processing, audio/video hosting and streaming, electronic mail, data storage, web hosting, social networking, supercomputing, scientific research computing, healthcare data processing, financial transaction processing, logistics management, weather forecasting, simulation, hosting virtual worlds, or hosting one or more metaverses, to list a few examples. Such services may require fast access to large amounts of data. For example, implementing a metaverse platform may require access to vast amounts of stored data that are used to simulate virtual worlds and interactions among users and objects in the virtual worlds. Such data can be stored across multiple storage systems 16200 across multiple racks. The optical fiber cables 13700 allow the processor blades 12300 to access the data stored in the storage systems 16200 through high-bandwidth optical links.

In some implementations, optical transceiver modules can have form factors that comply with common industry standards, such as SFP (small form-factor pluggable), SFP+ (or 10 Gb SFP), SFP28, OSFP (octal SFP), OSFP-XD (OSFP extra dense), QSFP (quad small form-factor pluggable), QSFP+, QSFP28, QSFP56, or QSFP-DD (quad small form-factor pluggable double density).

Referring to FIG. 152A, in some implementations, a pluggable optical module 15200 is configured to be plugged into a cage mounted on a circuit board of a host device, such as a network switch box or a server computer. The pluggable optical module 15200 includes a housing (or case) 15202, a user fiber connector 15204, a fiber harness 15206, a circuit board or substrate 15208, a receiver photonic integrated circuit 15210, a transmitter photonic integrated circuit 15211, a receiver fiber connector 15212, a transmitter fiber connector 15213, a receiver application specific integrated circuit (ASIC) 15214, a transmitter ASIC 15215, an electrical connector (or connector tongue) 15216, and a handle 15230.

For example, the handle 15230 enables the user to conveniently push the pluggable optical module 15200 into the corresponding cage, or pull the pluggable optical module 15200 from the cage. The user fiber connector 15204 is configured to be optically connected to a fiber-optic cable provided by the user. The fiber harness 15206 includes several optical fibers that optically connect the user fiber connector 15204 to the receiver fiber connector 15212 and the transmitter fiber connector 15213, which can be, e.g., turning mirrors. The receiver fiber connector 15212 couples input light beams from the optical fibers of the fiber harness 15206 to optical couplers (e.g., v-groove couplers, grating couplers, etc.) on the receiver photonic integrated circuit 15210. The transmitter fiber connector 15213 couples output light beams from the optical couplers (e.g., v-groove couplers, grating couplers, etc.) on the transmitter photonic integrated circuit 15211 to optical fibers of the fiber harness 15206.

For example, the receiver photonic integrated circuit 15210 is configured to convert the input optical signals to electrical signals, which are processed by the receiver ASIC 15214. The transmitter photonic integrated circuit 15211 is configured to convert the output electrical signals from the transmitter ASIC 15215 to output optical signals. The output optical signals are sent through the transmitter fiber connector 15213, the fiber harness 15206, and the user fiber connector 15204 to the optical fiber cable.

The receiver ASIC 15214 and the transmitter ASIC 15215 can perform a number of functions, such as digital signal processing for preparing the electrical signals in a format suitable for conversion to optical signals (e.g., PAM4 DSP equalization), signal quality monitoring, electrical interface (sometimes the electrical signals can have the same data rate as the optical signals, sometimes the data rate of the electrical signals are increased using a 2:1 gearbox to twice their rate before converting to optical signals). In some examples, the output electrical signals from the receiver photonic integrated circuit 15210 are amplified by a transimpedance amplifier (TIA) before being sent to the receiver ASIC 15214, and the electrical signals output from the transmitter ASIC 15215 are amplified by driver amplifiers before being sent to the transmitter photonic integrated circuit 15211.

In some examples, the transimpedance amplifiers are integrated into the receiver ASIC 15214, and the driver amplifiers are integrated into the transmitter ASIC 15215. In some examples, the receiver ASIC 15214 and the transmitter ASIC 15215 are integrated into a single electrical integrated circuit. In some examples, the receiver photonic integrated circuit 15210 and the transmitter photonic integrated circuit 15211 are integrated into a single photonic integrated circuit. In some examples, the receiver photonic integrated circuit 15210, the transmitter photonic integrated circuit 15211, the receiver ASIC 15214, and the transmitter 15215 are formed on a single semiconductor substrate. In some examples, some or all of the electronic functionality (e.g., electronic amplification, signal conditioning, control loop functionality, monitoring functionality, etc.) is monolithically integrated into one or more of the photonic integrated circuits.

The processed electrical signals are sent to the host device through the electrical connector 15216 as input electrical signals for the host device. The electrical connector 15216 can include, e.g., an Ethernet interface, a CMIS (common management interface specification) interface, an SPI (serial peripheral interface) interface an I2C (inter-integrated circuit) interface, etc. For example, the electrical connector 15216 is formed by a portion of a printed circuit board with contact pads. The electrical connector 15216 can be, e.g., an edge connector, connector tongue, or connector card. An example pinout specification for the contact pads is provided in FIG. 158.

In some implementations, the pluggable optical module 15200 complies with a small form factor pluggable module specification, which can be, e.g., SFP, SFP+, 10 Gb SFP, SFP28, OSFP, OSFP-XD, QSFP, QSFP+, QSFP28, QSFP56, or QSFP-DD. For example, the small form factor pluggable module specification can be "Specification for OSFP OCTAL SMALL FORM FACTOR PLUGGABLE MODULE," Rev 4.0, May 28, 2021, available from OSFP MSA. For example, the small form factor pluggable module specification can be "QSFP-DD/QSFP-DD800/QSFP112 Hardware Specification for QSFP Double Density 8× and QSFP 4× Pluggable Transceivers," Revision 6.01, May 28, 2021, available from QSFP-DD MSA.

In the description of the pluggable optical module, the optical connector 15204 is said to be closer to the front side relative to the electrical connector 15216, and the electrical connector 15216 is said to be closer to the rear side relative to the optical connector 15204. The longitudinal or axial direction 15218 extends parallel to the front-to-rear direction. To facilitate discussion of the orientation of various components of the pluggable module 15200, a coordinate system is used in which the z-direction is parallel to the longitudinal direction 15218 (or lengthwise direction), the x-direction is parallel to the width direction, and the y-direction is parallel to the height direction of the housing of the pluggable optical module 15200. For example, the bottom surface of the housing of the pluggable optical module 15200 extends substantially parallel to the x-z plane, and side walls of the housing extend substantially parallel to the y-z plane. In some examples, the length of the pluggable optical module is at least 50% greater than the width and at least 50% greater than the height. In some examples, the length of the pluggable optical module is at least twice the width and at least twice the height.

FIG. 152B is a cross-sectional diagram of the pluggable optical module 15200 along a plane parallel to the x-y plane and perpendicular to the longitudinal direction 15218. In some implementations, the housing 15202 includes a bottom wall 15220, an upper wall 15222, and side walls 15224*a*, 15224*b*. A heat sink 15226 is provided on the exterior of the upper wall 15222. For example, the circuit board (or substrate) 15208 is substantially parallel to the bottom wall 15220, the receiver and transmitter photonic integrated circuits 15210, 15211 are mounted on the circuit board (or substrate) 15208. The receiver and transmitter fiber connectors 15212, 15213 are mounted on the receiver and transmitter photonic integrated circuits 15210, 15211, respectively. In this example, the circuit board (or substrate) 15208 has a width that is slightly smaller than the width of the inner bottom wall, and a length that is at least 50% larger than the width. The dimensions of the circuit board (or substrate)

15208 naturally lends to its orientation being substantially parallel to the bottom wall and extending lengthwise in the longitudinal direction 15218.

FIG. 153A is a side view (along a plane parallel to the y-z plane) of an example pluggable optical module 15200. FIG. 153B is a perspective view of a rear portion 15240 of the pluggable optical module 15200. The pluggable optical module 15200 includes an edge connector (also referred to as a connector tongue or paddle card) 15404 that includes several connector pads 15408 on the top and bottom sides of the paddle card 15404. For example, the paddle card 15404 can be part of the circuit board 15208. The connector pads 15408 of the pluggable optical module 15400 are configured to be electrically coupled to the connector pads of a receptacle mounted on the circuit board of the host device.

FIG. 153C is a side view cross-sectional diagram (along a plane parallel to the y-z plane) of the pluggable optical module 15200 plugged into a cage 15402, in which the edge connector or paddle card 15404 is mated with a receptacle 15406. In this example, the edge connector 15404 is part of the substrate or circuit board 15208 on which the photonic integrated circuits 15210 and 15211 are mounted.

In the example of FIGS. 152A to 153C, the pluggable optical module 15200 uses a flat arrangement of photonic integrated circuits, application specific integrated circuits, and fiber coupling. In some examples, such a configuration limits the pluggable optical module 15200 to using one-dimensional fiber arrays (e.g., in the form of ribbons) that are coupled into the photonic integrated circuits either horizontally (e.g., using v-grooves) or vertically (e.g., using one-dimensional arrays of grating couplers). In order to significantly scale capacity, it may be useful to adopt two-dimensional arrays of fiber interfaces to connect two-dimensional arrays of optical fibers to the photonic integrated circuits. However, it is difficult to implement two-dimensional interfaces in the pluggable optical module 15200 because the vertical spacing between the substrate or circuit board 15208 and the upper wall 15222 of the housing 15202 is too small for implementing two-dimensional fiber array interfacing.

The inventors realized that by orienting the substrate or circuit board vertically, i.e., perpendicular to the bottom surface of the housing 15202, it is possible to implement two-dimensional fiber array interfacing to the photonic integrated circuits, thereby significantly increasing the bandwidth supported by the pluggable optical module. Furthermore, as the technology for manufacturing the photonic integrated circuits and the electrical integrated circuits improve, the photonic integrated circuits and the electrical integrated circuits can be made smaller, and some electronic integrated circuits can be stacked on the photonic integrated circuit, resulting in a co-packaged optical module that can be mounted on the vertically oriented substrate or circuit board.

In some implementations, the photonic integrated circuit can be mounted on a vertical substrate or circuit board substantially parallel to the front face of the pluggable optical module. This configuration allows a vertical two-dimensional fiber array to be coupled to the photonic integrate circuit without any fiber bends or turning mirrors.

Other configurations are also possible. In some implementations, in a second configuration, the photonic integrated circuit is mounted on a horizontal substrate or circuit board (parallel to the bottom surface of the housing) that is positioned lower than the edge connector (or paddle card or connector tongue) 15404. This configuration provides more space between the substrate or circuit board and the upper wall 15222, allowing for fiber bends from vertical to horizontal, or a turning mirror solution from vertical to horizontal, for two-dimensional fiber arrays.

In some implementations, in a third configuration, the photonic integrated circuit is mounted on a vertical substrate or circuit board that is oriented parallel to a side wall of the housing. This allows a vertical two dimensional fiber array to be coupled to the photonic integrated circuit with a large fiber bend radius taking up the entire width of the module.

FIG. 154A is a rear view of an example OSFP optical transceiver module (or "OSFP module") 15300, showing the electrical connector 15216 positioned in the space defined by the inner walls of the housing 15304 of the OSFP module 15300. The space defined by the inner walls of the housing 15304 has dimensions of about 7.2 mm×20.58 mm along a plane parallel to the x-y plane.

FIG. 154B is a rear view of an example OSFP-XD optical transceiver module (or "OSFP-XD module") 15302, showing the electrical connector 15216 positioned in the space defined by the inner walls of the housing 15306 of the OSFP-XD module 15302. The space defined by the inner walls of the housing 15306 has dimensions of about 6.2 mm×20.58 mm along a plane parallel to the x-y plane.

FIG. 154C is a diagram of an example co-packaged optical module 15310 that can fit inside the housing 15304 of the OSFP module 15300 with the substrate or circuit board oriented vertically (relative to the horizontal bottom wall of the housing). The co-packaged optical module 15310 includes a photonic integrated circuit 15312 mounted on a substrate (or circuit board) 15314, in which a first set of electrical integrated circuits 15316 are mounted on the photonic integrated circuit 15312, and a second set of electrical integrated circuits 15318 are mounted on the substrate 15314 adjacent to the photonic integrated circuit 15312. A micro optics connector 15322 optically couples the photonic integrated circuit 15312 to an optical fiber cable.

FIG. 154D is a diagram of an example co-packaged optical module 15320 that can fit inside the housing 15306 of the OSFP-XD module 15302 with the substrate or circuit board oriented vertically (relative to the horizontal bottom wall of the housing). The co-packaged optical module 15320 can be similar to the co-packaged optical module 15310 (FIG. 153C) except that the dimensions of the components are slightly different in order to fit inside the housing 15306 of the OSFP-XD module 15302. Additional details of the co-packaged optical modules 15310 and 15320 are provided later in this document.

FIG. 154E is a cross-sectional diagram of an example OSFP pluggable optical module 15330 in which the co-packaged optical module 15310 is fitted in the space defined by the housing 15304, with the substrate 15314 of the co-packaged optical module 15310 substantially perpendicular to the bottom surface of the housing 15304 of the OSFP pluggable optical module 15330. The top surface of the photonic integrated circuit 15312 is substantially perpendicular to the bottom surface of the housing 15304, allowing a two-dimensional array of optical fibers to be coupled to the photonic integrated circuit 15312.

FIG. 154F is a cross-sectional diagram of an example OSFP-XD pluggable optical module 15340 in which the co-packaged optical module 15320 is fitted in the space defined by the housing 15306, with the substrate 15314 of the co-packaged optical module 15320 substantially perpendicular to the bottom surface of the housing 15304 of the OSFP pluggable optical module 15340. The top surface of the photonic integrated circuit 15312 is substantially perpendicular to the bottom surface of the housing 15304, allowing a two-dimensional array of optical fibers to be coupled to the photonic integrated circuit 15312.

FIG. 155A is a side view cross-sectional diagram (along a plane parallel to the y-z plane) of an example pluggable optical module 15500 plugged into a cage 15402, in which an edge connector 15404 (e.g., a paddle card) is mated with a receptacle 15406. The pluggable optical module 15500 includes an optical connector 15204, a fiber harness 15508, a co-packaged optical module 15502, a connector module 15504 (or tongue module or connector card), and flexible radio frequency (RF) cables 15506. The co-packaged optical module 15502 includes a photonic integrated circuit 15312 having a surface that faces the front side of the pluggable optical module 15500. The fiber harness 15508 optically couples the optical connector 15204 to the photonic integrated circuit 15312. The fiber harness 15508 includes a bundle of optical fibers that are coupled to an optical fiber connector 15510 that is coupled to the photonic integrated circuit 15312. The optical fiber connector 15510 includes a two-dimensional array of fiber ports, which can be variations of the two-dimensional array of fiber ports shown in FIGS. 89 to 95, either with or without the power supply fiber ports.

FIG. 155E is a diagram of an example of the fiber port mapping for the optical fiber connector 15510. The transmitter fiber ports 1704 are labeled 'T', and the receiver fiber ports 1706 are labeled 'R'. The fiber port mapping shown in FIG. 155E is merely an example, other fiber port mappings can also be used.

The flexible RF cables 15506 (e.g., available from Molex, Lisle, IL, or similar cables) electrically couple the co-packaged optical module 15502 to the connector module 15504. For example, the co-packaged optical module 15502 can be similar to the co-packaged optical module 15310 (FIG. 153C) or 15320 (FIG. 153D). For example, the connector module 15504 includes a paddle card 15404 that includes several connector pads 15408 on the top and bottom sides of the paddle card 15404. First terminations of the flexible RF cables 15506 are connected to first connector parts 15512, and second terminations of the flexible RF cables 15506 are connected to second connector parts 15514. The first connector parts 15512 are electrically coupled to the photonic integrated circuit 15312 through conductive vias in the substrate 15314. The second connector parts 15514 are electrically coupled to the conductive pads 15408 through conductive traces in or on the paddle card 15404. Use of the flexible RF cables 15506 allows the co-packaged optical module 15502 to be mechanically decoupled from the connector module 15504. This allows the co-packaged optical module 15502 and the connector module 15504 to be used in different pluggable optical modules having different lengths.

FIG. 155B is a front view (along a plane parallel to the x-y plane) of the co-packaged optical module 15502. FIG. 155C is a rear view of the connector module 15504. FIG. 155D is a side view of the co-packaged optical module 15502, the flexible RF cables 15506, and the connector module 15504.

FIG. 156A is a side view cross-sectional diagram (along a plane parallel to the y-z plane) of an example pluggable optical module 15600 plugged into a cage 15402, in which an edge connector 15404 (e.g., a paddle card) is mated with a receptacle 15406. The pluggable optical module 15600 includes an optical connector 15204, a fiber harness 15508, a co-packaged optical module 15502, and a connector module 15602. In this example, the connector module 15602 is mechanically and electrically coupled to the co-packaged optical module 15502. The pluggable optical module 15600 can be used in situations where it is not necessary to mechanically decouple the pluggable optical module 15600 from the connector module 15602.

FIG. 156B is a front view (along a plane parallel to the x-y plane) of the co-packaged optical module 15502. FIG. 156C is a rear view of the connector module 15602. FIG. 156D is a side view of the co-packaged optical module 15502 and the connector module 15602. The connector module 15602 includes the paddle card 15404, which has several connector pads 15408 on the top and bottom sides of the paddle card 15404.

FIG. 157A is a side view cross-sectional diagram (along a plane parallel to the y-z plane) of an example pluggable optical module 15700 plugged into a cage 15402, in which an edge connector 15404 (e.g., a paddle card) is mated with a receptacle 15406. FIG. 157B is a top view cross-sectional diagram (along a plane parallel to the x-z plane) of the pluggable optical module 15700. As shown in FIG. 157B, in some examples, the connector pads 15408 extend in a direction parallel to the longitudinal direction or the z-axis. FIG. 157C is a side view (along a plane parallel to the y-z plane) of the pluggable optical module 15700.

The pluggable optical module 15700 includes one or more laser sources 15702 that provide power supply light through one or more optical fibers 15704 to the photonic circuit(s) of the co-packaged optical module 15502. In the example of FIGS. 157A and 157B, the pluggable optical module 15700 includes two laser sources 15702. It is also possible to have a different number of laser source(s).

The pluggable optical module 15700 includes a fiber harness 15706 that optically couples the optical connector 15204 to the photonic integrated circuit 15312. The fiber harness 15706 includes a bundle of fibers 15708 that are coupled to an optical fiber connector 15710 that is coupled to the photonic integrated circuit 15312. The fiber harness 15706 includes the optical fibers 15704, which are also optically connected to the optical fiber connector 15710. Power supply light is transmitted from the laser sources 15702 through the optical fibers 15704 and the power supply fiber ports of the optical fiber connector 15710 to the photonic integrated circuit 15312.

FIG. 157D is a diagram of an example of the fiber port mapping for the optical fiber connector 15710. The power supply power ports 1702 are labeled 'P', the transmitter fiber ports 1704 are labeled 'T', and the receiver fiber ports 1706 are labeled 'R'. The fiber port mapping shown in FIG. 157D is merely an example, other fiber port mappings can also be used.

FIG. 158 shows an example of the OSFP module pinout configuration. A diagram 15800 shows the pinout configuration for the top side of the paddle card, and a diagram 15802 shows the pinout configuration for the bottom side of the paddle card.

FIG. 159A is a perspective view of an example 1×1 cage 15900 mounted on a circuit board 15902. FIG. 159B is a perspective view of an example 1×4 cage 15904 mounted on a circuit board 15906. FIG. 159C is a perspective view of an example OSFP module 15908 inserted into the 1×1 cage 15900.

FIG. 160 is a top view cross-sectional diagram of an example pluggable optical module 16000 that includes a co-packaged optical module 16004 mounted on a side wall 16006. A tongue-to-board connector 16008 is provided to mechanically and electrically couple the substrate (or circuit board) of the co-packaged optical module 16004 to the paddle card (or tongue) 15404. There is sufficient space inside the cage 16002 for the optical fibers of the fiber harness 15706 to bend and be vertically coupled to the photonic integrated circuit 15312.

FIG. 161 is a side view cross-sectional diagram of an example pluggable optical module 16100 plugged into a cage 15402, in which an edge connector 15404 (e.g., a paddle card) is mated with a receptacle 15406. The pluggable optical module 16100 includes a housing 15306 and a co-packaged optical module 16102. The co-packaged optical module 16102 includes a photonic integrated circuit 15312 mounted on a substrate (or circuit board) 16104 that is oriented parallel to the bottom surface of the housing and is positioned lower than the edge connector (or paddle card or connector tongue) 15404. A tongue-to-board connector 16106 is provided to mechanically and electrically couple the substrate (or circuit board) 16104 to the edge connector (or paddle card or connector tongue) 15404. In some examples, the substrate 16104 and the edge connector 15404 can be mechanically coupled by solder joints. A fiber harness 16104 optically connects the optical connector 15204 to a fiber bend or turning mirror 16108 that interfaces with the photonic integrated circuit 15312.

The following describes examples of co-packaged optical modules that can be used in the pluggable optical modules, e.g., 15330 (FIG. 153E), 15340 (FIG. 153F), 15500 (FIG. 155A), 15600 (FIG. 156A), 15700 (FIG. 157A), 16000 (FIG. 160), 16100 (FIG. 161).

Referring to FIG. 162, a co-packaged optical module 16700 includes a substrate 16702 and a photonic integrated circuit 16704 mounted on the substrate 16702. A lens array 16706 and a micro optics connector 16708 optically couples the photonic integrated circuit 16704 to an optical fiber cable. The lens array 16706 and the micro optics connector 16708 will be referred to as the optical connector. A first set of one or more integrated circuits 16710 are mounted on the top side of the photonic integrated circuit 16704 using, e.g., copper pillars, or solder bumps. The first set of one or more integrated circuits 16710 is positioned adjacent to or near the optical connector. For example, two or more integrated circuits 16710 can be positioned on two or more sides of the optical connector, surrounding or partially surrounding the optical connector. A second set of integrated circuits 16712 is mounted on the substrate 16702 and electrically coupled to the photonic integrated circuit 16704.

For example, each integrated circuit 16710 (mounted on the photonic integrated circuit 16704) can include an electrical drive amplifier or a transimpedance amplifier. Each integrated circuits 16712 (mounted on the substrate) can include a SerDes or a DSP chip or a combination of SerDes/DSP chips.

Figure 163B:
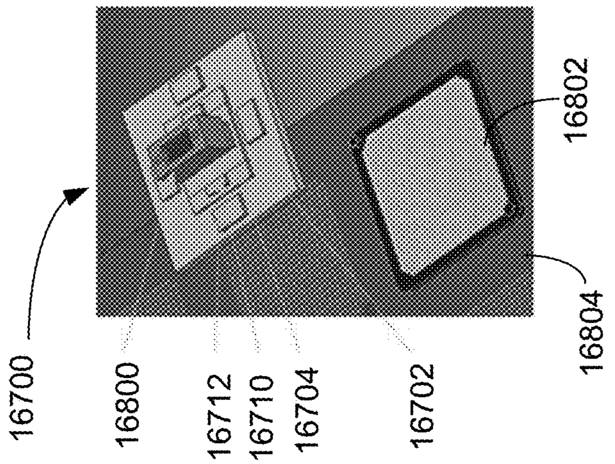
Figure 163A:
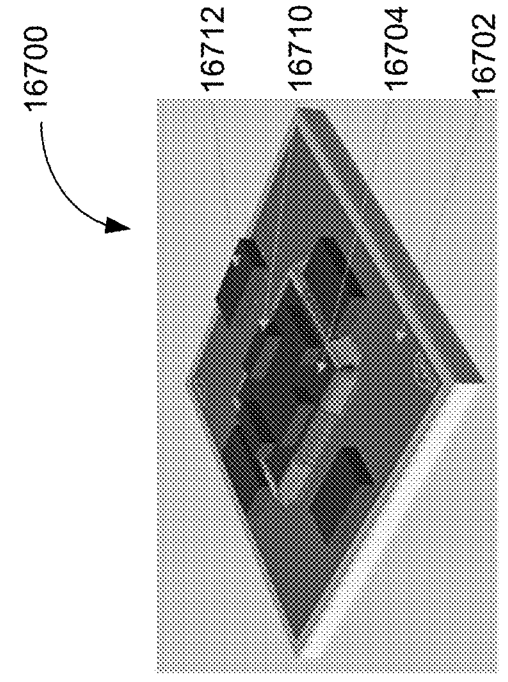

FIGS. 163A and 163B show perspective views of an example of the co-packaged optical module 16700. FIG. 163A shows the substrate 16702, the photonic integrated circuit 16704, the first set of electrical integrated circuits 16710 mounted on the photonic integrate circuit 16704, and a second set of electrical integrated circuits 16712 mounted on the substrate 16702. FIG. 163B shows the same components as those shown in the left diagram, with the addition of a smart connector 16800 that connects to an optical fiber cable, and a socket 16802 that electrically couples to the electrical contacts on the bottom side of the substrate 16702. The socket 16802 can be on another substrate or circuit board 16804.

Figure 164A:
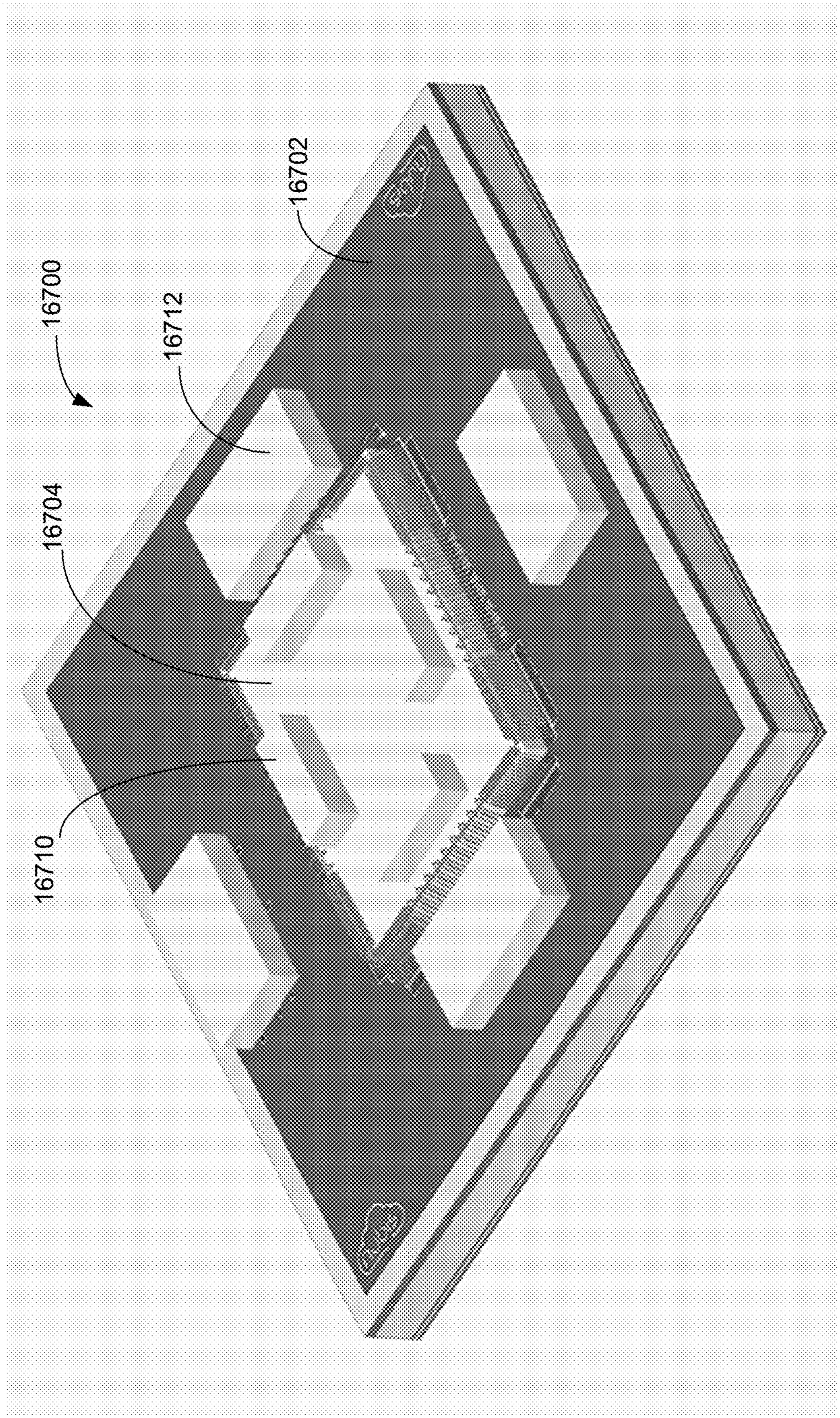
Figure 164B:
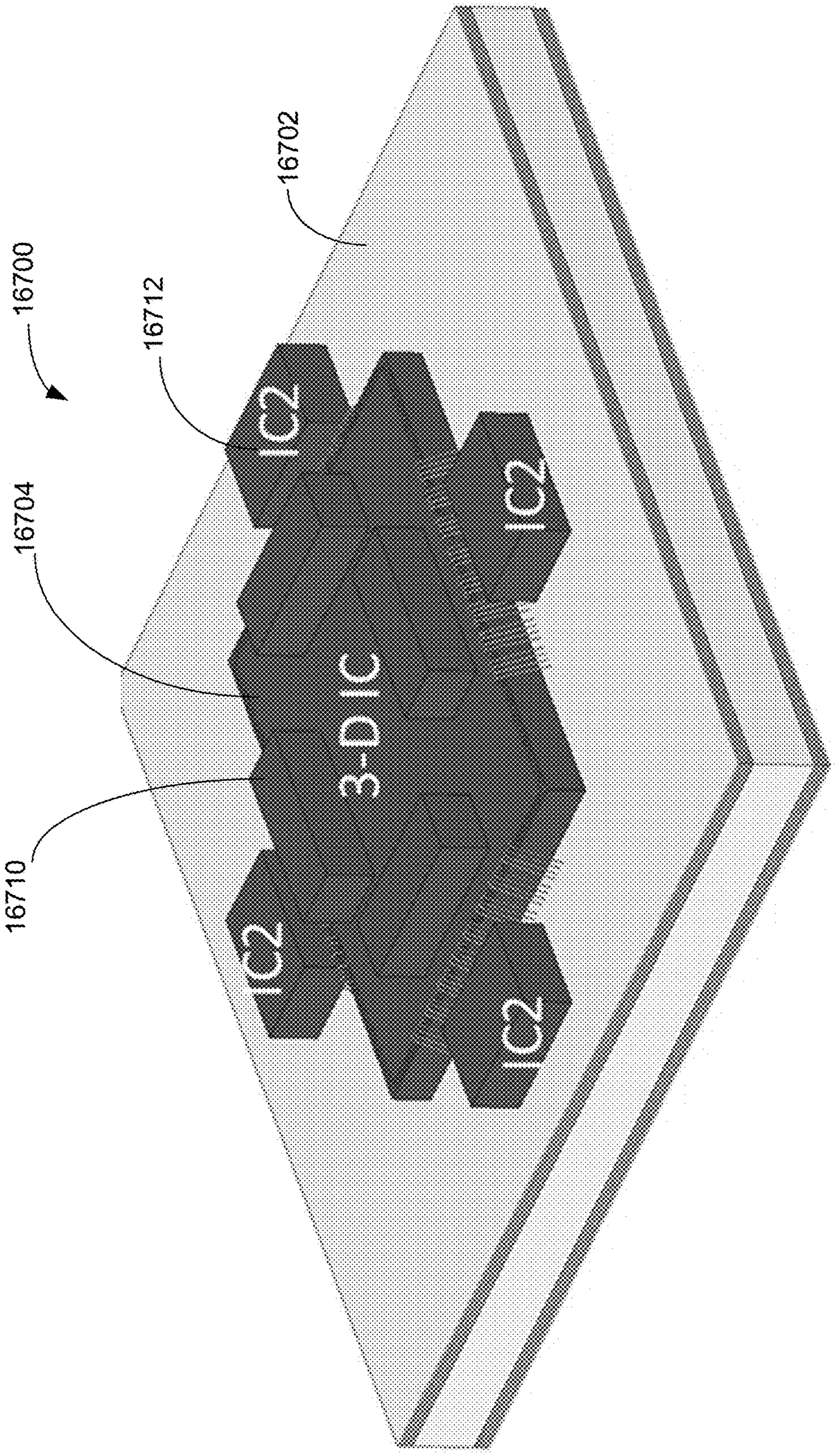

FIGS. 164A and 164B shows additional examples of perspective views of the co-packaged optical module 16700. FIG. 165 shows a top view of an example of the placement of the electrical integrated circuits 16710 on the photonic integrated circuit 16704. In this example, the lens array 16706 is positioned near the center of the photonic integrated circuit 16704, and the electrical integrated circuits 16710 are placed at the north, south, east, and west positions relative to the lens array 16706. By placing the electrical integrated circuits 16710 on top of the photonic integrated circuit 16704 and surrounding the lens array 16706 (or any other type of optical connector), the co-packaged optical module 16700 can be made more compact. Furthermore, the conductive traces between the electrical integrated circuits 16710 and active components in the photonic integrated circuit 16704 can be made shorter, resulting in better performance, e.g., higher data rate, higher signal-to-noise ratio, and lower power required to transmit the signals, as compared to a configuration in which the electrical signals have to travel longer distances.

Figure 166A:
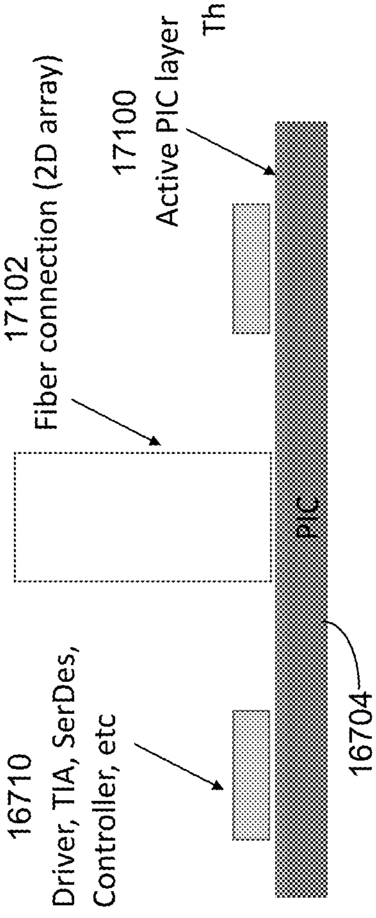

There are several ways to package the electrical integrated circuits and the photonic integrated circuit in order to achieve a compact, small-size, and energy efficient co-packaged optical module. FIG. 166A shows an example in which a photonic integrated circuit 16704 has an active layer 17100 that is positioned near the top surface of the photonic integrated circuit 16704. The fiber connection 17102 (which can include, e.g., a 2D array of focusing lenses) is coupled to the fiber connection 17102 from the top side. The top side in FIG. 166A corresponds to the front side of the photonic integrated circuit facing the optical connector 15204 in FIG. 155A. For example, grating couplers in the active PIC layer 17100 can be positioned under the fiber connection 17102 to couple the optical signals from the fiber connection 17102 into optical waveguides on the active PIC layer 17100, and from the optical waveguides out to the fiber connection 17102. The electrical integrated circuits 16710 are mounted on the top side of the photonic integrated circuit 16704 and are coupled to the active PIC layer 17100 through contact pads and optionally short conductive traces. For example, the active PIC layer 17100 can include photodetectors that convert the optical signals received from the fiber connection 17102 to electrical current signals that are transmitted to the drivers and transimpedance amplifiers in the electrical integrated circuits 16710. Similarly, the electrical integrated circuits 16710 can send electrical signals to the electro-optic modulators in the active PIC layer 17100 that convert the electrical signals to optical signals that are output through the fiber connection 17102.

Figure 166B:
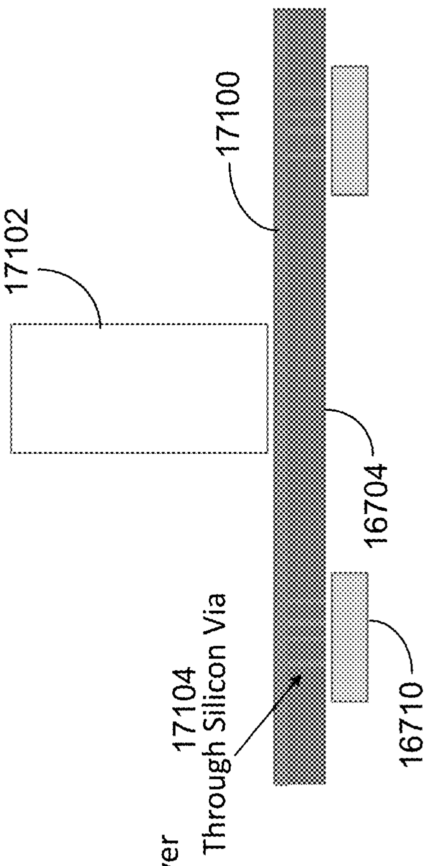

FIG. 166B shows an example in which the electrical integrated circuits 16710 are coupled to the bottom surface of the photonic integrated circuit 16704 and electrically coupled to the active PIC layer 17100 using through silicon vias 17104. The bottom surface of the photonic integrated circuit 16704 in FIG. 166B corresponds to the rear surface of photonic integrated circuit 15312 in FIG. 155A. The through silicon vias 17104 provide signal conduction paths in the thickness direction through the silicon die or substrate of the photonic integrated circuit 16704. The drivers and transimpedance amplifiers in the electrical integrated circuits 16710 can be positioned directly under the photonic integrated circuit active components, such as the photodiodes and the electro-optic modulators, so that the shortest electrical signal paths can be used between the photonic integrated circuit 16704 and the electrical integrated circuits 16710.

Figure 166C:
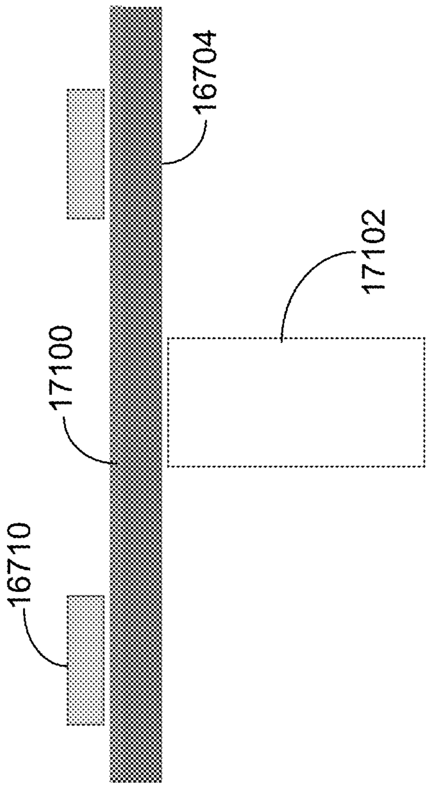

FIG. 166C shows an example in which the fiber connection 17102 is coupled to the photonic integrated circuit 16704 through the bottom side (in a configuration referred to as "backside illumination"), such that the optical signals from the fiber connection 17102 pass through the silicon die or substrate before being received by the photodetectors in the active PIC layer 17100. The bottom side of the photonic integrated circuit 16704 in FIG. 166C corresponds to the front side of the photonic integrated circuit facing the optical connector 15204 in FIG. 155A. The modulators in the active PIC layer 17100 transmit modulated optical signals through the silicon die or substrate to the fiber connection 17102. The portion of the active PIC layer 17100 directly above the fiber connection 17102 can include grating couplers. The photodetectors and modulators are positioned at a distance from the grating couplers. The electrical integrated circuits 16710 are positioned directly above or near the photodetectors and the modulators, so the locations of the electrical integrated circuits 16710 relative to the active PIC layer 17100 in the example of FIG. 166C will be similar to those in the example of FIG. 166A.

Figure 166D:
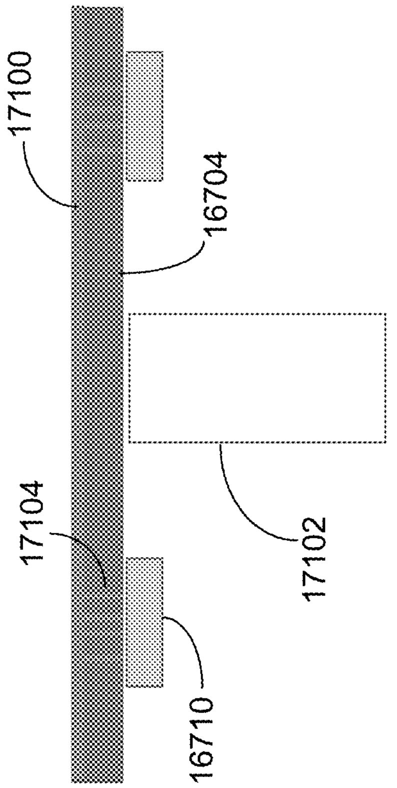

FIG. 166D shows an example in which backside illumination is used, and the electrical integrated circuits 16710 are coupled to the bottom side of the photonic integrated circuit 16704. The bottom side of the photonic integrated circuit 16704 of FIG. 166D corresponds to the front side of the photonic integrated circuit in FIG. 155A. The electrical integrated circuits 16710 are electrically coupled to the active components (e.g., photodetectors and electro-optic modulators) in the active PIC layer 17100 using through silicon vias 17104, similar to the example in FIG. 166B.

In some implementations, an integrated circuit is configured to surround or partially surround the vertical fiber connector. For example, the integrated circuit can have an L-shape that surrounds two sides of the vertical fiber connector (e.g., two of north, east, south, and west sides). For example, the integrated circuit can have a U-shape that surrounds three sides of the vertical fiber connector (e.g., three of north, east, south, and west sides). For example, the integrated circuit can have an opening in the center region to allow the vertical fiber connector to pass through, in which the integrated circuit completely surrounds the vertical fiber connector. The dimensions of the opening in the integrated circuit are selected to allow the optical fiber connector to pass through to enable an optical fiber to be optically coupled to the photonic integrated circuit. For example, the integrated circuit with an opening in the center region can have a circular or polygonal shape at the outer perimeter. A feature of the integrated circuit mounted on the same surface as the vertical fiber connector is that it takes advantage of the space available on the surface of the photonic integrated circuit that is not occupied by the vertical fiber connector so that the electrical integrated circuit can be placed near or adjacent to the active components (e.g., photodetectors and/or modulators) of the photonic integrated circuit.

In some implementations, an integrated circuit defining an opening can be manufactured by the following process:

Step 1: Use semiconductor lithography to form an integrated circuit on a semiconductor die (or wafer or substrate), in which a first interior region of the semiconductor die does not have integrated circuit component intended to be used for the final integrated circuit (but can have components intended to be used for other products).

Step 2: Use a laser (or any other suitable cutting tool) to cut an opening in the first interior region of the semiconductor die.

Step 3: Place the semiconductor die on a lower mold resin that defines an opening in an interior region. A lead frame or electrical connectors are attached to the lower mold resin.

Step 4: Wire bond electrical contacts on the semiconductor die to the lead frame or electrical connectors attached to the lower mold resin.

Step 5: Attach an upper mold resin to the lower mold resin, and enclose the semiconductor die between the lower and upper mold resins. The upper mold resin defines an opening in an interior region that corresponds to the opening in the lower mold resin. In some examples, the footprint of the semiconductor die is within the footprint of the lower/upper mold resins so that the semiconductor die is completely enclosed inside the lower and upper mold resins. In some examples, the lower and/or upper mold resin can have additional openings, and the opening(s) in the lower and/or upper mold resins can be configured to expose one or more portions of the semiconductor die.

An integrated circuit having an L-shape or a U-shape can be manufactured using a similar process. For example, in step 1, circuitry is formed in an L-shaped or U-shaped footprint. In step 2, the laser or cutting tool cuts the die according to the L-shape or U-shape footprint. In steps 3 and 5, a lower mold resin and an upper mold resin having the desired L-shape or U-shape are used.

As described above (e.g., FIGS. 68A and 68B), in some implementations, a rackmount switch includes a housing or case having a front panel (or face plate), a rear panel, a bottom panel, a top panel, and side panels. For example, the housing can have a form factor of 1RU, 2RU, 3RU, or 4RU, having a width of about 482.6 mm (19 inches) and a height of, for example, 1, 2, 3, 4, etc. rack units. The housing can include printed circuit boards, a microcontroller (connected to the printed circuit) and configured to control various modules, such as power supplies, exhaust fans, etc.

Referring to FIG. 167, as described above, fans, heat sinks, and other type of thermal control mechanisms can be positioned within a housing or casing of a switch 1800 to regulate internal air temperatures. In general, the switch 1800 can be utilized in datacenter and houses switch cards individually, in groups (e.g., a rack of switch cards), etc. for executing switching operations (e.g., Top of Rack (TOR) switching operations, Leaf switch operations, Spine Switch operations, etc.). Each switch card housed in the switch 1800 includes one or more switch application-specific integrated circuits-often referred to as switch ASICs or ASICs) that is connected to a considerable number of optical modules (e.g., 32 optical modules) that connect the switch card to other cards (e.g., other switch cards, server cards, etc.). The switch card also has a central processing unit (CPU) that controls operations of the switch ASIC. Generally, the CPU of a switch card processes control data (in comparison to a server card CPU which processes application data). To thermally regulate the interior of the switch 1800, one or more mechanisms may be incorporated into the switch 1800 that allows air to flow into one or more sides of the switch housing (e.g., enter the front of the switch housing). In some implementations one or more fans or other types of air movement generator devices can be positioned within the switch 1800 to assist with drawing air in from the front of serve, e.g., the fan or fans can create a low pressure to air draw external to the switch. For some designs, one or more exhausts may be included (e.g., incorporated into one or more sides of the switch housing) for expelling air and assist with cooling operations.

Referring to FIG. 168, as also mentioned above such switches can be stacked, e.g., rack mounted, and may utilize vertically oriented cards such as vertical front line cards (VFLC). As illustrated in the figure, a stack 1850 of eight VFLCs 1852-1866 are connected to individual horizontal back line cards (HBLC) 1868-1882 and to a backplane 1884. In this arrangement, eight VFLCs are employed within the stack but more or less VFLCs may be used (for example, less cards can be employed to reduce power needs, etc.). Each VFLC utilizes particular design features in this arrangement; for example, each has a dual ASIC design and has a 4RU dimensional aspect. However, variants of these designed features may be employed; for example a single ASIC design, different dimensional aspects (e.g., 3 RU etc.) may be used (some of which are described below). Additionally, in this design each VFLC is capable of receiving 64 small form factor pluggables (SFP) such as Octal SFP (OSFP), Quad SPF (QSFP), etc. (some of which are mentioned above and below). Along with these features, one or more (and in some cases all) of the VFLCs include features to assist with temperature regulation; for example, these features can assist with temperature regulation of housings, casings, etc. that one or more of the VFLCs is contained.

FIG. 169 illustrates a front view of a of dual ASIC vertical front line cards 1900 of a switch that includes mechanisms for assisting with regulating (e.g., cooling) the internal temperature of the housing. This design includes a dual ASIC layout in which two vertically mounted ASIC assemblies 1902, 1094 and associated components are position in a side-by-side layout; however, other types of layouts may be utilized in other designed (e.g., vertically stacking the ASIC layouts). This design has 64 plug ports that are capable of receiving 64 OSFPs; however ports for other types of pluggables may be employed. To assist with temperature regulation, each ASIC assembly includes an ASIC heatsink air intake 1906, 1908 located at the upper portion of the corresponding assembly. Each assembly also includes an air dam 1910, 1912 that assist regulatory operations by directing airflow entering the front line cards. Also located internal to the front lines cards are signal and power connectors the can extend within the housing; for example, these connectors can be utilized to establish connections between the signal, power, etc. components with other portions 1914, 1916 of the ASIC assemblies (e.g., a Vertical Front Line Card (VFLC), a Horizontal Back Line Card (HBLC), Power Supply Units (PSU), etc.). Each of the ASIC assemblies 1902, 1904 also include a vertically mounted ASIC 1918, 1920 and corresponding components (e.g., structures such as top plates, temperature control mechanisms such as heat pipes, heatsinks, etc.).

To assist with temperature control, each of the ASIC assemblies 1902, 1904 also utilize mechanisms that allow air to flow into the housing at locations approximate to connector plugs that exchange signals the ASIC assemblies 1902, 1904. Various types of connector plugs can be utilized by the switch; for example, OSFP pluggables or other types of connector plugs described above can be employed. One or more mechanisms can be located proximate to the ports that receive the plugs and incorporated into the front lines cards to allow air flow between areas internal to the line cards and the environment surrounding the housing that the lines cards reside. For example, openings near the plug ports of the line cards can provide access to the housing interior and can connect to channels that extend into the housing. Such channel openings or intakes can be located on one or more sides of a plug port (e.g., above, below, to the left, to the right, etc.). In some arrangements, the channel intake extends into the housing through an outer wall of the line cards and in some cases the channel intake or the channel itself may extend through other portions of the housing. For example, one or more of the channels may extend partially or fully through objects, components, etc. located within the housing. In one arrangement, one or more of the channels can extend through boards (e.g., printed circuit boards (PCB)) associated with the line cards and located within the housing (e.g., a PCB associated with the vertically mounting one of the ASICs). In some instances, portions of the PCBs are cut out to allow for the channels to extend through PCBs (and into the housing). Various types of geometries may be incorporated into these channel intakes and channels; for example, the walls can be used to define closed channels that extend through the line cards and into the housing (e.g., four walls are used to define a rectangular cross section closed channel, three wall are used to define a triangular cross section closed channel, a curved wall can define a circular cross section channel, etc.). In some instances, the same geometries are used to define each channel intake (and/or channel) proximate to the plug ports, however, in other instances different types of geometries may be employed so different types are channel intakes and/or channels are used for air flow.

One or more types of materials may also be employed by the wall structures that define the channel intakes and/or channels; for example, a material that assists with the efficient propagation of air flow through the channel may be used. Materials that assist with the transmission of heat can be employed; for example, material that efficiently collects heat from air may be incorporated into one or more of the channel walls. In some instances, different materials may be incorporated into a wall (or multiple walls) for different capabilities; for example, wall materials may be selected for structural characteristics while other wall materials may be selected for their thermal properties (e.g., ability to efficiently transfer heat). For some designs, heat transfer components may be inserted into one or more of the channels that are proximate to the plug ports; for example one or multiple structures can extend along a portion (or the entire) length of a channel. For example, a structure having the geometry of a fin can extend within a channel along the entire length of the channel. Groups of such structures may also be used (e.g., a group, stack, etc. of fins) can be used. Other types of geometries can be utilized for structures that extend along a channel (or channels), for example, rectangular cross sections (fins), triangular cross sections, elliptical cross sections, circular cross sections, etc. or combinations of cross sections (e.g., a rectangular cross section that transitions into a triangular cross section) may be utilized.

In the design presented in the figure, each ASIC assembly 1902, 1904 (of the dual ASIC vertical front line cards) includes two vertical columns of dual-plug ports; in particular ASIC assembly 1902 includes vertical columns 1922 and 1924 and ASIC assembly 1904 includes vertical columns 1926 and 1928 (and each columns includes two vertical stacks of plug ports). In the illustrated example, each vertical column includes locations (ports) for receiving an octal small form factor pluggable (OSFP) (e.g., OSFP 1930) with an adjacent location also for receiving an OSFP. Other types of plugs and corresponding ports may be acceptable for other designs, for example; other types of small form factor pluggables such as quad small form-factor pluggables (QSFP), etc. can be employed. Also illustrated in this example, a channel intake (e.g., channel intake 1932) is located above and/or below each of the plug locations and the channel associated with the intake may incorporate one or more of the design features described above (e.g., channel wall design, heatsink fins positions within the channels, etc.). While a dual-plug column architecture is utilized in the illustrated design, other type of architectures, layouts, etc.

may be used. For example, plug ports may be positioned in other locations of a front panel; for example, plug ports may be provided in horizontal row, groups of plugs, etc. Similarly, channel intakes can be positioned to follow or complement the plug port layouts to allow for efficient air flow into the housing and to collect and direct heat for regulating the internal conditions of the housing.

Referring to FIG. 169A, the figure illustrates a front view of dual ASIC vertical front line cards 1940 of a switch that includes mechanisms for assisting with regulating (e.g., cooling) the internal temperature of the housing. This design is similar to the design of FIG. 169 and includes a dual ASIC layout in which two vertically mounted ASIC assemblies and associated components are position in a side-by-side layout. In this design, each vertical column of the ASIC assemblies includes locations (ports) for receiving an octal small form factor pluggable (OSFP) (e.g., OSFP 1942) with an adjacent location also for receiving an OSFP. Other types of plugs and corresponding ports may be acceptable for other designs, for example; other types of small form factor pluggables such as quad small form-factor pluggables (QSFP), etc. can be employed. Also in this design, a channel intake (e.g., channel intake 1944) is located above and/or below each of the plug locations and the channel associated with the intake may incorporate one or more of the design features described above (e.g., channel wall design, heatsink fins positions within the channels, etc.). In this particular example, each channel intake (e.g., channel intake 1944) is segmented to include multiple channels. As illustrated in the figure, for this design each channel intake has two segments (e.g., channel intake 1944 includes channel segments 1946 and 1948). Various types of architectures may be utilized for the channel segments; for example, the segments may partially extend along the channel, fully along the channel, etc. While this example includes two channel segments, more segments may be implemented that have similar or different geometries. Further various patterns may be used in the geometry of one segment, multiple segments (e.g., groups of segments), etc.

Referring to FIG. 170, a left half view of the front of a vertical front line card is shown that include an ASIC assembly 1950 with plug ports and channel intakes is shown. In this view, one of the two ASIC assemblies is shown; in other designs more or less ASIC assemblies may be incorporated into designs (e.g., a three ASIC assembly design).

Figure 171:
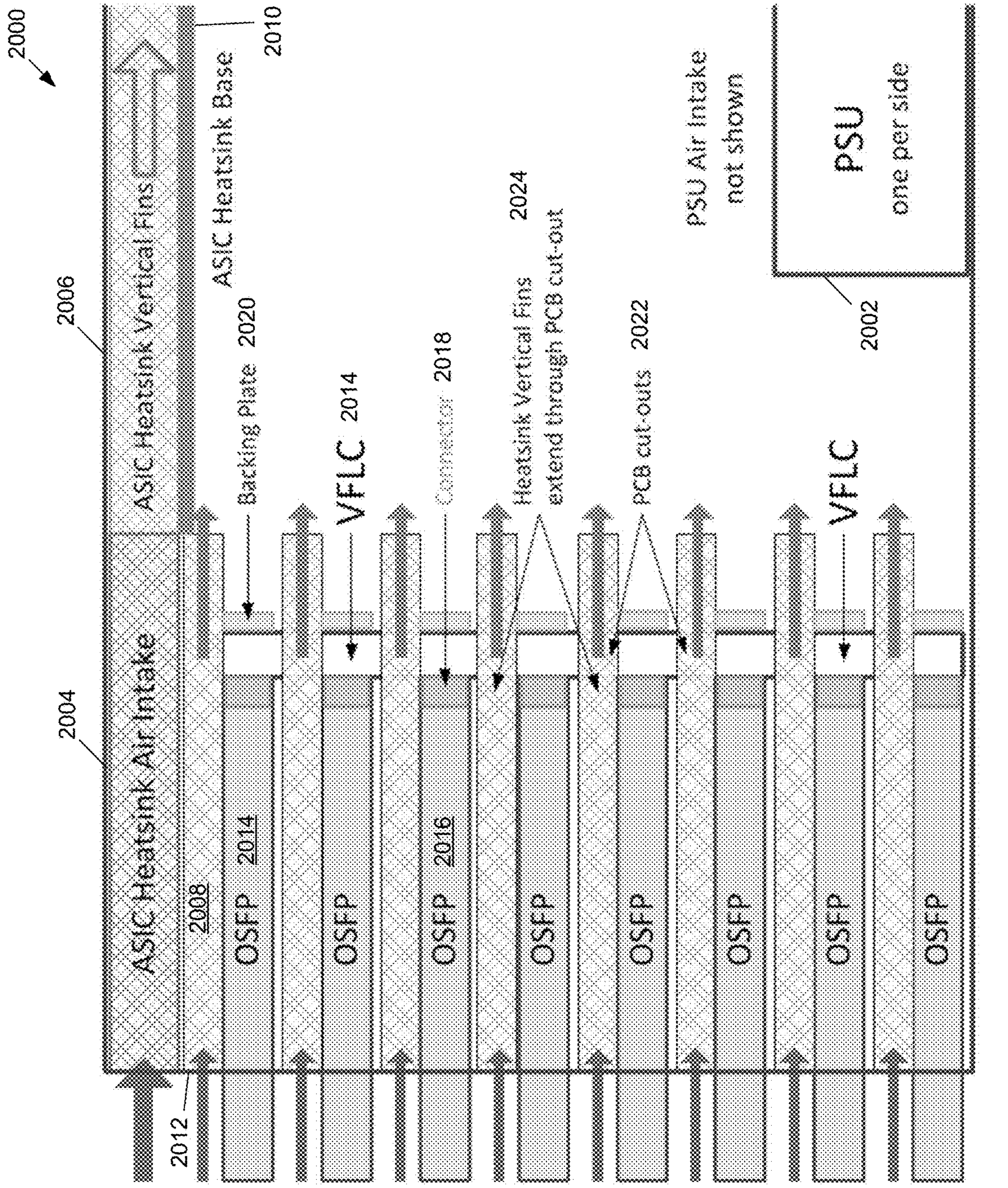

Referring to FIG. 171, a side view 2000 of an internal cut within a switch housing is shown (that includes dual ASIC vertical front line cards). The provided perspective illustrates a cut through a column of the pluggables (and ports) and through a power supply unit 2002 included in the housing. An ASIC heatsink air intake 2004 allows air to flow inward from the front of the housing and delivers the inflowing air to vertical fins 2006 that extend from the intake into the housing. In some examples, the vertical fins 2006 may terminate within the housing; however, in some designs the fins may extend to a back wall of the housing and in some instances the fins may extend through the back wall (e.g., through one or more apertures, exhausts, etc.) to the external environment. In this example, the ASIC air intake 2004 and fins 2006 are located in an upper area of the housing, but other locations of the housing may be utilized for positioning the intake and fins. In this example, each of the channels extend (from the channel intakes located on the front line cards) into the interior of the housing; for example, channel 2008 extend from a corresponding channel intake (or port) 2012 into the housing. The channel 2008 has a closed design and heatsink fins as positioned within the channel and extend along the interior of the design; however, other design variants as mentioned above may be employed. In this design one or more of the channels (e.g., channel 2008) may proximate to other components located within the housing for heat regulation. For example, the channel 2008 is located proximate to an ASIC heatsink base 2010 that is capable of transferring hear for temperature regulation.

To allow the channels to extend pass the vertical mounting structures used to support the ASIC, one or more techniques can be employed. For example, holes, apertures, etc. in the vertical mounting structure (of the ASIC) can be created to allow the channels to pass through and extend into the housing. As illustrated in the figure, a vertical front line card (VFLC) 2014 is vertically positioned within the housing and provides connections (e.g., for signals) between the pluggables (e.g., the OSFP plugs) to the ASIC. In this design, each OSFP (e.g., OSFP 2016) is received at the front of the housing (at a channel intake), extends into the housing, and connects to a connector (e.g., connector 2018) to exchange signals. Each connector (e.g., connector 2018) is connected the VFLC 2014 which provides communication to the ASIC (and other components associated with the VFLC). In this design, a backing plate 2020 is located adjacent to the VFLC 2014 and provide support (e.g., structural support) for vertical mounted ASIC design. To allow the channels (e.g., the channel 2008) to extend pass the VFLC 2014 and backing plate 2020 and into the interior of the housing, apertures are created by cut-outs 2022 in the VFLC 2014 and the backing plate 2020. For example, each of the cut-outs 2022 can have a geometry similar to the cross-sectional geometry of the channels that will extend through the corresponding cut-out (e.g., a rectangular cross section, a circular cross section, etc.). In general, the same cut-out geometry used in the VFLC 2014 is also used in the backing plate 2020; however different geometries may be incorporated in some designs (e.g., larger cross sectional dimensions are used in the backing plate compared to the cross sectional dimensions of the VFLC, or vice versa). By using such cut-outs, as illustrated in the figure, heatsink vertical fins 2024 included in the channels can extend into the interior of the housing to assist with thermal control. In this implementation, the backing plate 2020 provides structural support (e.g., to the VFLC, the pluggable connectors, etc.) as one function. In some designs, the support function of the backing plate 2020 may be enhanced by employing structural members (e.g., bolster plates) that can be attached to the front of the VFLC 2014, attached to one or more pluggable module housing, connectors, etc. individually or in combination.

Figure 172:
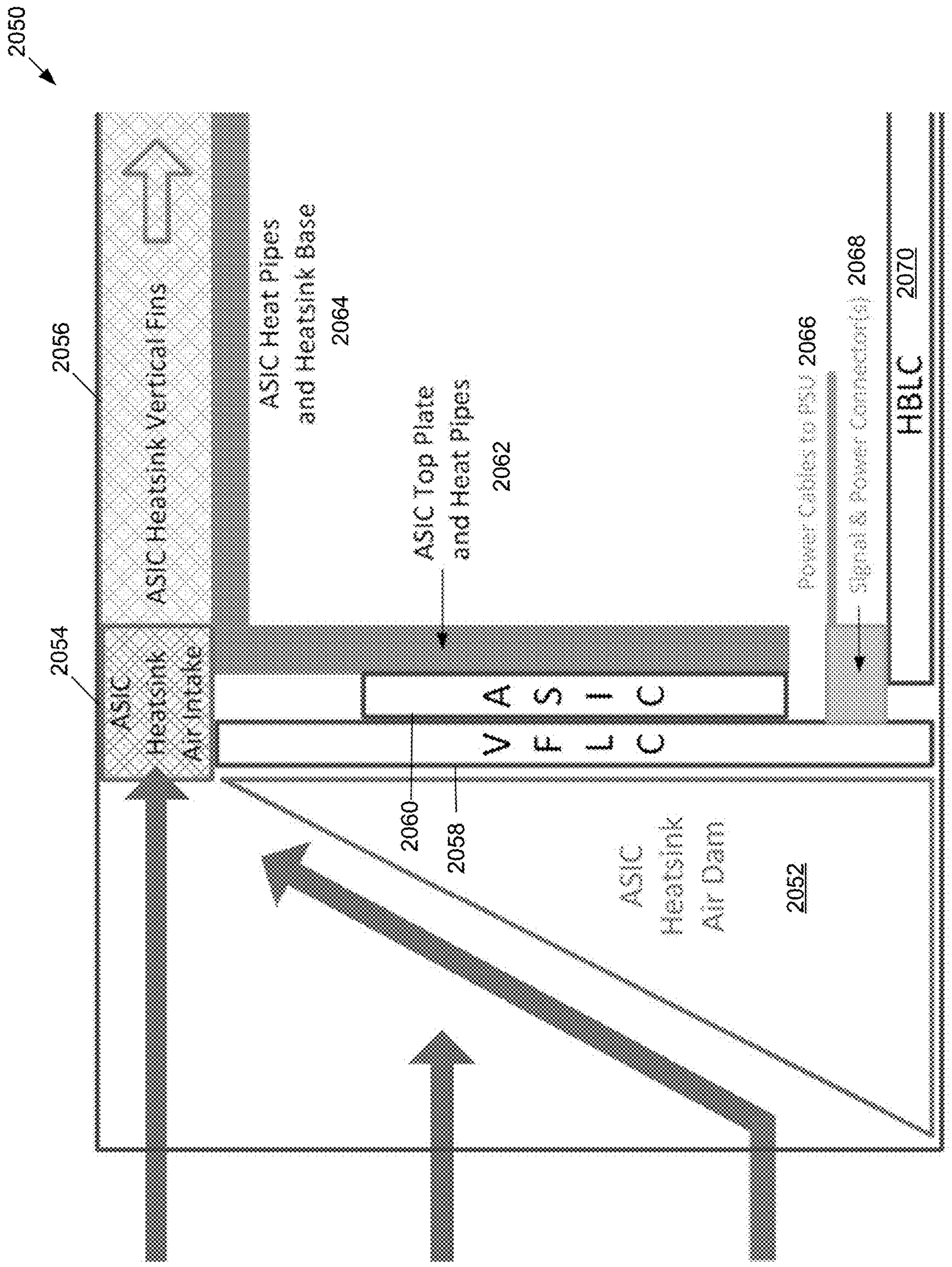

Referring to FIG. 172, a side view 2050 of the housing is presented that provides a view as sliced through the vertically mount ASIC. Briefly referring to FIG. 169, since the pluggables and adjacent channels are located on both sides of the ASIC (e.g., ASIC 1918), a view of a slice through the ASIC does not include portions of the pluggables and their respective channels. Returning to FIG. 172, an ASIC heatsink air dam 2052 assists with directing the flow of air from the front of the housing to an ASIC heatsink air intake 2054 (e.g., the air intake 1906) for directing along vertical fins 2056 that are position in the upper portion of the housing interior. In this example, the air dam has a generally wedge-shaped geometry that projects as a triangle shape in the figure. Moving inward, a VFLC 2058 (e.g., the VFLC 2014) is positioned adjacent to the air dam 2052, and an ASIC 2060 is positioned adjacent to the VFLC 2058. To assist with temperature regulation, an ASIC top plate and heat pipes 2062 are located next to the ASIC and the heat pipes extend to the upper portion of the housing. In this example, the heat pipes extend along the vertical fins of the ASIC heatsink 2056 into the interior (and potentially to a back panel of the housing); however other layouts may be implemented. In one or more designs, the heat pipes may extend in one or more other directions and extend to other locations within (or external to) the housing. In this example a heatsink base 2064 is also positioned proximate to the heat pipes; however, in other designs, the heatsink base may be positioned at another location. This design also includes power cables 2066 (that extend to a power supply unit, or multiple units) and signal and power connectors 2068 that are located towards the base of the housing; however, in other designs one or both of these items may be located in other portions of the housing. Also located along the base of the housing in this design is a horizontal back line card (HBLC) 2070 for data transmission and in this instance is proximate to the sign and power connectors 2068; however, in other designs the HBLC can be positioned in other locations within the switch housing.

Figure 173:
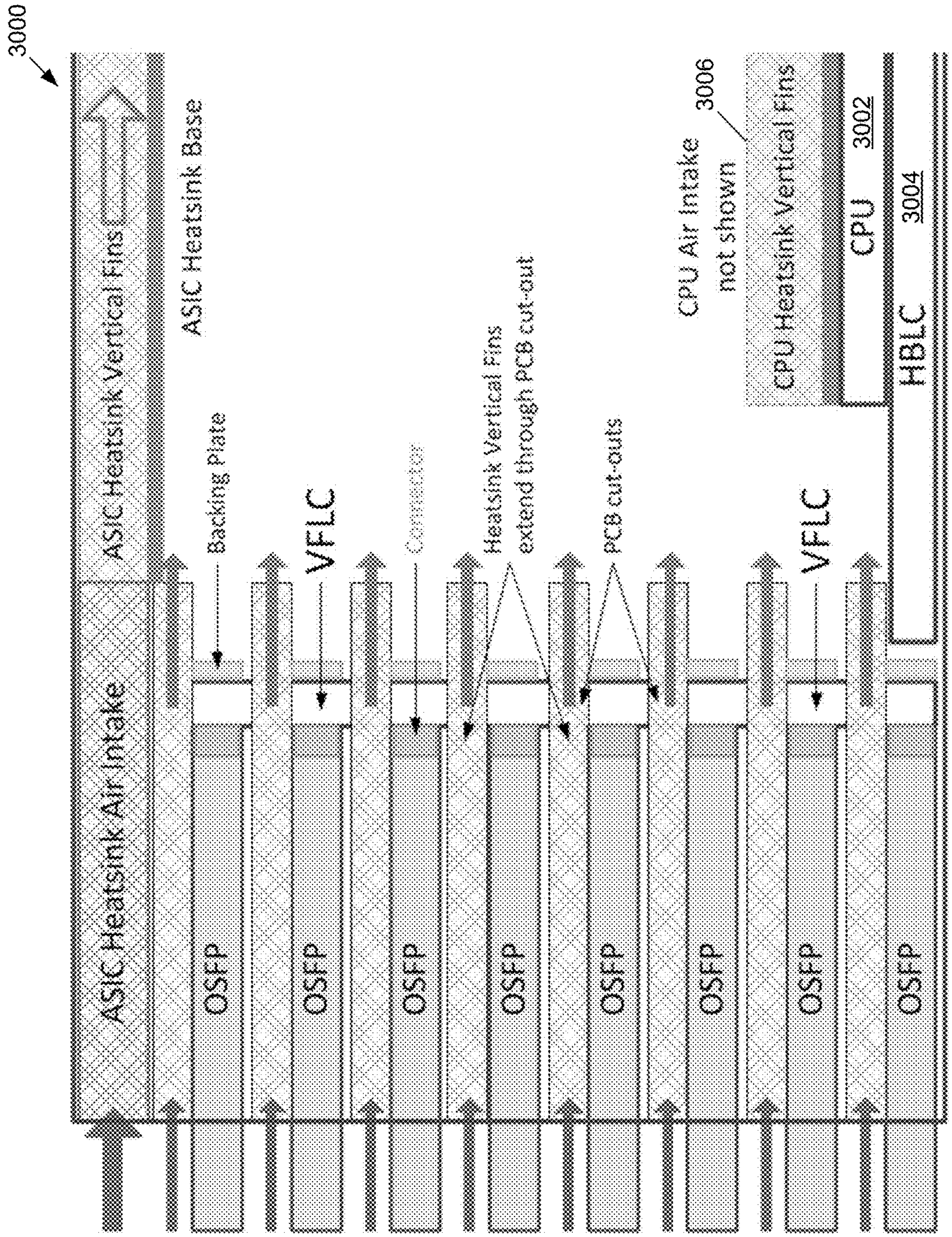

Referring to FIG. 173, a side view 3000 of the housing is presented that provides a view as sliced through a central processing unit (CPU) 3002 that is located near the base of a switch housing. While a single CPU is illustrated in this example, multiple CPU's may be present in other designs and one or more other types of processing units may be used in some designs individually or in concert with the CPU 3002. Similar to the view shown in FIG. 172, an HBLC 3004 is located near the base of the housing; however, in other designs the HBLC can be located in another position within the housing. Also adjacent to the CPU 3002 is one or more heatsinks (e.g., CPU heatsink vertical fins 3006) that can further assist with heat regulation within the housing. Various geometries, materials, shaping techniques, etc. may be employed for controlling heat generated by the CPU 3002 other sources internal to the housing. In this particulate design, an air intake (for the CPU) is included (e.g., incorporated in the housing) to allow cooling; however this intake is not shown in the figure. Similar to the view shown in FIG. 171, the view 3000 also includes the channels (and fins) located adjacent to the eight pluggable ports for heat regulation.

Figure 174:
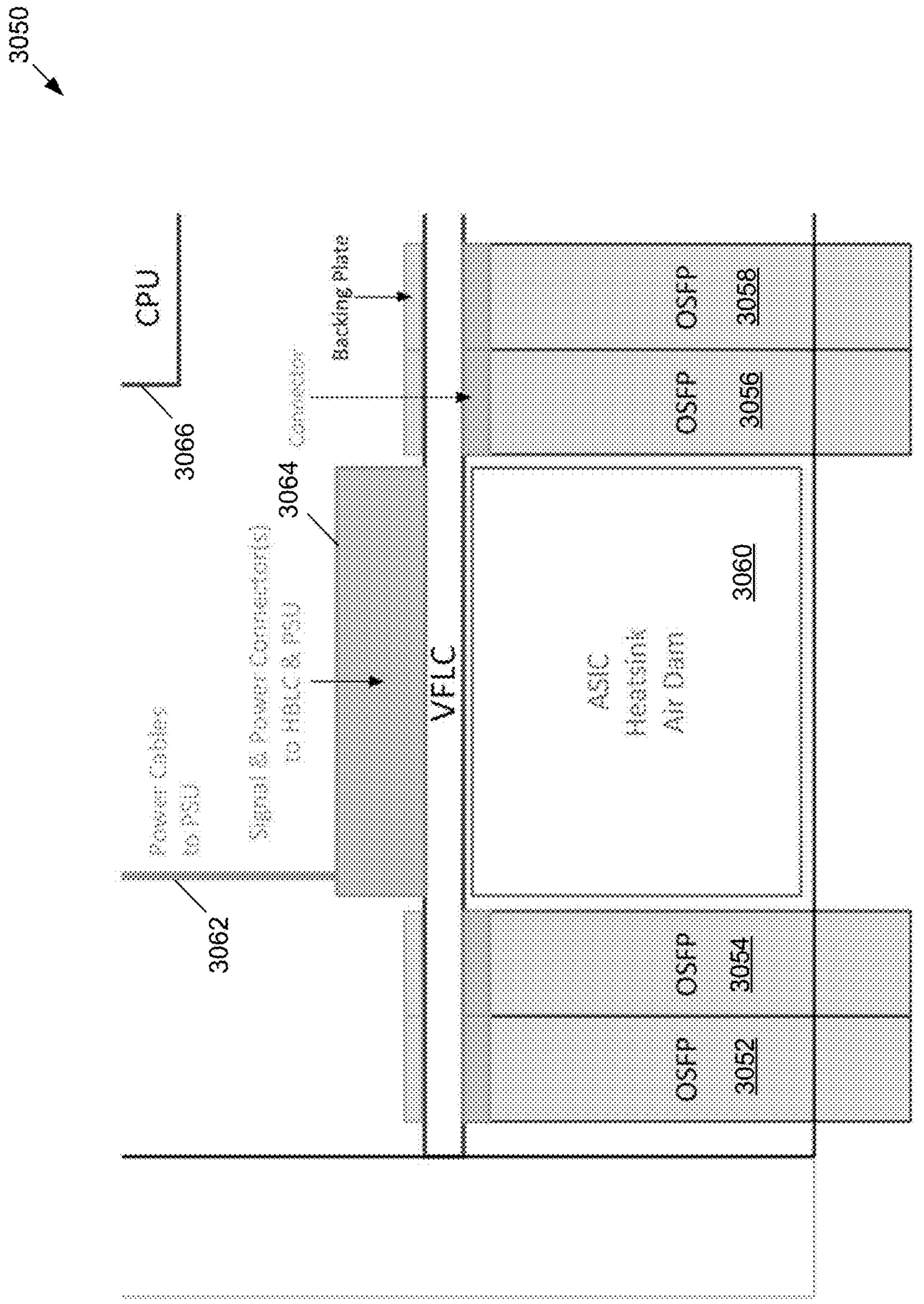

Referring to FIG. 174, a top view 3050 that horizontally slices through the pluggables (e.g., OSFPs) and the CPU is presented. From this perspective, the view 3050 slices through four of the OSFP's 3052, 3054, 3056, 3058 (and corresponding ports and connectors) that are located at the same vertical level and slices through a wedge-shaped ASIC heatsink air dam 3060 (e.g., air dam 2052) to present a rectangular shaped projection. The view also presents the location of power cables 3062 to a PSU (e.g., the power cables 2066 in FIG. 172) and signal and power connectors for an HBLC and the PSU (e.g., the connectors 2068 shown in FIG. 172). As shown by the figure, the connectors and power cables 3064 are located in a central location relative to the front of the housing; however, in other designs the connectors and/or power cables can be positioned within other locations of the housing (e.g., a grouped in the same locations, distributed among different locations, etc.). In this design, a CPU 3066 (e.g., the CPU 3002) is centrally located in the VFLC housing (and shown in the back right of the figure along with the CPU heatsink not shown); however, the location of the CPU and/or heatsink may be adjusted to other locations within the housing for other designs.

Figure 175:
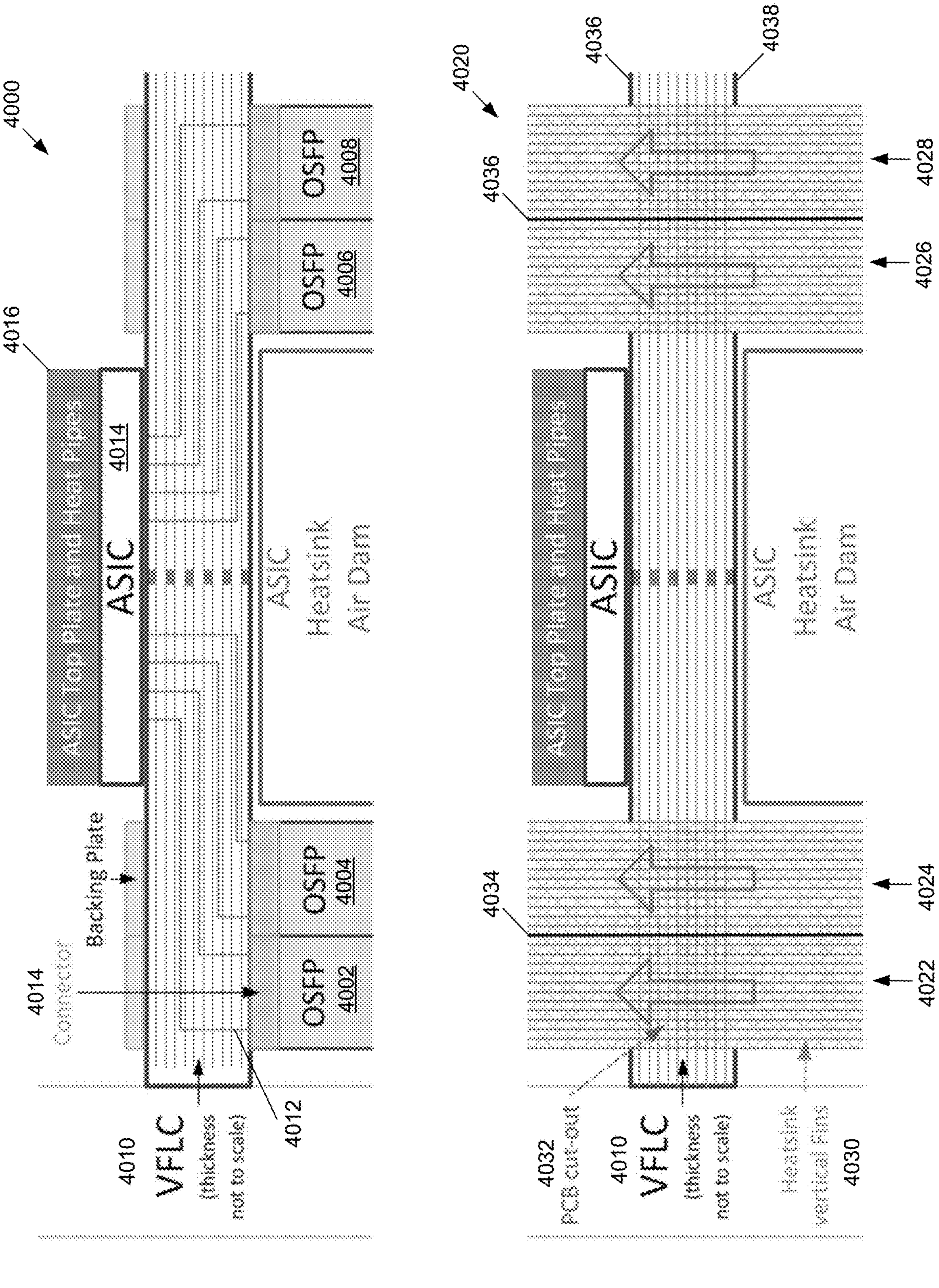

Referring to FIG. 175, two additional top views 4000 and 4020 of the server housing are presented for two different vertical levels. Top view 4000 presents a vertical level that horizontally cuts through the pluggables (and associated ports and connectors) and through the VFLC and ASIC. As shown in the figures four OSFP's 4002, 4004, 4006, 4008 (e.g., similar to OSFP's 3052-3058 of FIG. 174) and corresponding connectors establish connections with a VFLC 4010. As indicated in the figure, the VFLC 4010 is not presented to scale (and is enlarged) in order to present connection traces (e.g., connection trace 4012 that connects to a connector 4014 of OSFP 4002) and their short paths for connecting an ASIC 4014 (e.g., the ASIC 2060 of FIG. 172). As presented in earlier figures, the ASIC 4014 includes a top plate and heat pipes 4016 for heat regulation. The view 4020 represents a vertical cut through the housing that is above or below the vertical location of the view 4000. At this vertical level, cross sections of four channels 4022, 4024, 4026, 4028 are presented and each channel includes vertically oriented heatsink fins (e.g., fins 4030). Each of the channel 4022-4028 extend through cut outs (e.g., apertures, holes, etc.) of the VFLC 4010, thereby allowing air to be provided through the channels into the interior of the housing and allow the vertical fins to extend through the channels and into the interior of the housing for assisting with temperature regulation. For example, cut out 4032 allows the heat shrink fins of channel 4022 to extend through the VFLC 4010. Similar to the view 4000, the VFLC 4010 in the view 4020 is not shown to scale to allow viewing details of the cut outs. Based upon the introduction of such cutouts, additional structural support may be included to account for potential loss in support due to the cut outs. For example, one or more structural members may be introduced into the housing. In one implementation, extra support may be provided by structures (e.g., structures 4034, 4036) that extend along between two channels and attach to one or more walls of the VFLC 4010 formed from the cut outs. Structures may also be provided in other positions, orientations, etc.; for example, one or more structures may be attached to an inner wall 4036 of the VFLC 4010 and/or an outer wall 4038 of the VFLC 4010 to increase structural integrity. One or more plates, rods, bars, etc. and other types of structures can be employed individually or in combination, for example. Structural support can also be provided by other components associated with the VFLC, switch housing, etc. For example, structures can be attached to walls of the housing, components within the housing (e.g., an ASIC, air dam, etc.) to assist with structural integrity.

Referring to FIG. 176, front line card designs can include dimensional changes for one or more components. For example, the size of the pluggables, channel intakes, channels, etc. may be adjusted. For one design, a front line card 4050 (a left half front view of dual ASIC vertical front line cards) may have a 4RU vertical height measurement (e.g., the same vertical height of the font panel 1900 of FIG. 169) but reduced dimensions of each pluggable, channel intake for air flow, etc. may be incorporated. Dimensions of components within the housing may also be adjusted (e.g., printed circuit board dimensions). The dimensions of the OSFPs can be reduced, for example, from one vertical pitch (e.g., 20 mm) and horizontal pitch (e.g., 24 mm) as represented in FIGS. 169 and 170 to a reduced vertical pitch (e.g., 15 mm) but the same horizontal pitch (e.g., 24 mm). Similarly one or more internal circuit board high speed traces may be reduced in length (e.g., from 102 mm to 76 mm). For the front line card 4050 shown in the figure, the vertical pitch of each OSFP has been reduced by 5 mm to 15 mm (compared to each OSFP in FIGS. 169 and 170). In this example, the vertical pitch of the channel intakes (and the channels) for allowing air to access the house have similarly been reduced.

In comparison to the front views shown in FIGS. 169 and 170, the left half of dual ASIC vertical front line cards 4050 includes additional features. In particular, the left half front line card 4050 presents a different location for a power supply unit (PSU) air intake 4052, a PSU air dam 4054, a CPU heatsink air dam 4056, and a CPU heatsink air intake 4058. Referring to FIG. 177, a side view 4100 is presented that is comparable to the side view 2000 shown in FIG. 171. The side view 4100 presents a CPU heatsink air dam 4102 and a PSU air intake 4104 that provides air to the PSU. As mentioned above, each channel and associated vertical fins (e.g., a channels and fins 4106) extend into the housing. However, the vertical fins in each channel do not extend as far into the housing as the fins shown in FIG. 171. In this example, the fins extend to a printed circuit board (PCB). The channels extend into the housing beyond the PCB but those portions of the channels are absent heatsink fins. However, in other arrangements, the heatsink fins may extend past the PCB and along the complete length of the channels. Additionally, a backing plate 4108 in this side view 4100 is relatively thicker than the backing plate 2020 of view 2000 (shown in FIG. 171).

Referring to FIG. 177A a side view 4150 is presented that is comparable to side view 4100 shown in FIG. 177. The side view 4150 presents a CPU heatsink air dam 4152 and a PSU air intake 4154 that provides air to the PSU. As mentioned above, each channel and associated vertical fins (e.g., channels and fins 4156) extend into the housing. However, the vertical fins in each channel do not extend as far into the housing as the fins shown in FIG. 171. In this example, the fins extend to a printed circuit board (PCB). The channels extend into the housing beyond the PCB but those portions of the channels are absent heatsink fins. Each OSFP (e.g., OSFP 4159) is connected to a VFLC (e.g., VFLC 4162) by a connector (e.g., connector 4160) and a structural support (e.g., structural support 4166). A force (e.g., compression, tension) is realized by inserting the connector and removing the connector. The structural support 4166 is positioned between the connector and a backing plate (e.g., backing plate 4164) to provide support. For example, the structural support 4166 carries extraction and insertion forces and provides retention to firmly secure an OSFP to a VFLC by a connector. The structural support 4166 may absorb compression and tension forces realized by inserting or removing the connector, thereby providing a secure connection. The structural supports (e.g., structural support 4166) can form a connection from the backing plates to the connectors through the openings in the PCB. By employing these structural supports, mechanical rigidity is provided during insertion (push) and extraction (pull). The opening in the PCB assists with enabling the extraction support as provided by these structural supports.

Example designs for structured support 4166 are shown by open box 4168*a*, circular rods 4168*b*, square rods 4168*c*, and corner bracket rods 4168*d*. The structural support 4166 may be an open box design, e.g., open box 4168, to allow airflow for cooling. In some implementations, the structural support 4166 may be a rod-shaped design (e.g., circular rods 4168*b*, square rods 4168*c*, corner bracket rods 4168*d*) and placed in the corners between a connector and a backing plate to provide support of the connector. The inclusion of a structural support 4166 using a rod-shaped design may improve airflow compared to other designs (e.g., an open box design 4168*a*.) In some examples, a honeycomb design may be utilized for structural support 4166 to provide mechanical support between a connector and a backing plate while allowing airflow.

Referring to FIG. 178, a side view 4105 of the housing (having the left half front line card 4050 of FIG. 176) is presented that provides a view as vertically sliced through the vertically mounted ASIC. With reference to FIG. 172, the vertical dimension of an ASIC heatsink air intake 4152 and a corresponding ASIC heatsink vertical fins 4154 is increased (compared to the housing view shown in FIG. 172). Additional air dams 4156 are viewable below an ASIC heatsink air dam 4158 (that is also present in the housing view in FIG. 172). Further comparing to the housing view shown in FIG. 172, both power cables and the signal and power connectors for the HBLC have changed position with respect to a HBLC 4160 (compared to the positons of these components in FIG. 172.).

Referring to FIG. 179, a side view 4200 of the housing is presented that provides a view as vertically sliced through a central processing unit (CPU) 4202 that is located near the base of a switch housing. Similar to FIG. 172, the vertical pitch of the channels and corresponding vertical fins has been reduced (e.g., by 5 mm). In this view, the vertical dimension of the ASIC heatsink air intake and the ASIC heatsink vertical fins have increased (just as viewable in FIG. 178). Additionally, this view shows a CPU heatsink air dam 4204, a CPU heatsink air intake 4206, and CPU heatsink vertical fins 4208 for heat regulation. Similar to FIG. 177, a backing plate 4210 is thicker than the backing plate shown in FIG. 173.

Referring to FIG. 179A, a side view 4250 of the housing is presented that provides a view as vertically sliced through a central processing unit (CPU) 4252 that is located near the base of a switch housing. Similar to FIGS. 172 and 179, the vertical pitch of the channels and corresponding vertical fins has been reduced (e.g., by 5 mm). In this view, the vertical dimension of the ASIC heatsink air intake and the ASIC heatsink vertical fins have increased (just as viewable in FIG. 178). Additionally, this view shows a CPU heatsink air intake 4254, a second CPU heatsink air intake 4256, and CPU heatsink vertical fins 4258 for heat regulation. Similar to FIG. 177, a backing plate 4264 is thicker than the backing plate shown in FIG. 173.

Each OSFP (e.g., OSFP 4259) is connected to a VFLC (e.g., VFLC 4262) by a connector (e.g., connector 4260) and a structural support (e.g., structural support 4266). A force (e.g., compression, tension) is realized by inserting the connector and removing the connector. The structural support 4266 is positioned between the connector and a backing plate (e.g., backing plate 4264) to provide support. For example, the structural support 4266 carries extraction and insertion forces and provides retention to firmly secure an OSFP to a VFLC by a connector. The structural support 4266 may absorb compression and tension forces realized by inserting or removing the connector, thereby providing a secure connection.

Similar to the designs described with respect to FIG. 177A, example designs for structural support 4266 are shown as an open box 4268*a*, an arrangement of circular rods 4268*b*, an arrangement of square rods 4268*c*, and an arrangement of corner bracket rods 4268*d*. As also mentioned above, the structural support 4266 may be an open box design, e.g., open box 4268, to allow airflow for cooling. In some implementations, the structural support 4266 may be a rod-shaped design (e.g., circular rods 4268*b*, square rods 4268*c*, corner bracket rods 4268*d*) and placed in the corners between a connector and a backing plate to provide support of the connector. The inclusion of a structural support 4266 using a rod-shaped design may improve airflow compared to other designs (e.g., an open box design 4268*a*.) In some examples, a honeycomb design may be utilized for structural support 4266 to provide mechanical support between a connector and a backing plate while allowing airflow.

Referring to FIG. 180, a top view 4250 is presented that illustrates a horizontal slice at a vertical level that is below the OSFPs shown in FIG. 176 (but cuts through the PSU 4052, PSU air dam 4054, and the CPU heatsink air intake 4058 shown in FIG. 176). As shown in FIG. 180, a PSU air dam 4252 directs air from the left side of the front 4254 of the housing to a PSU air intake 4256 to allow the air to propagate to a PSU. Similarly, a CPU heatsink air dam 4258 directs air from the right side of the housing front 4254 to a CPU heatsink air intake 4260 that then propagates to CPU heat sink fins 4262 (e.g., vertically oriented fins) for heat transfer and thereby assist with heat regulation.

Referring to FIG. 181, two additional top views 4300 and 4400 of the switch housing (having the front 4050 shown in FIG. 176) are presented for two different vertical levels. Top view 4300 presents a view that horizontally cuts through the pluggables (and associated connectors) and through the VFLC and ASIC. This view is similar to the view 4000 shown in FIG. 175, but a thicker backing plate is present. The view 4400 represents a horizontal cut through the housing that is above or below the vertical location of the view 4300, and is equivalent to the view 4020 shown in FIG. 175.

In addition to the designs presented in the previous figures, other design configuration may be implemented. Some adjustable design features include the number of line cards implemented; for example the number of line cards can be increased or decreased. Referring to FIG. 182, ten vertical front line cards are included in a stack 4500 (compared to the eight vertical line cards implemented in FIG. 168). Further the illustrated design is absent horizontal back line cards and employs a left side plane 4502. In some implementations, a right side plane can be implemented to individually interface with the ten VFLCs of the stack 4500 or interface with the VFLCs in combination with the left side plane 4502. For the illustrated implementation, a dual ASIC design includes 64 small form factor pluggables (e.g., octal small form factor pluggables, etc.) are employed along with a reduced dimension size of 3RU (compared to 4RU shown in previous designs); however one or more of these design features may be adjusted. Referring to FIG. 183, a view of a front panel 4550 is shown for a dual ASIC design that has a 3RU size factor. Each pluggable (e.g., OSFP) has a 15 mm vertical pitch and a 24 mm horizontal pitch. In some designs less pluggables may be implemented; for example, 32 small form factor pluggables can be used for reducing power requirements.

Referring to FIG. 184, a front view 4600 shows a single ASIC design that includes 32 OSFP pluggables. In this design the 32 OSFP pluggables can be inserted into an arrangement of four columns 4602, 4604, 4606, 4608 OSFP pluggable ports (with each column having eight ports). A channel intake (for a corresponding channel having vertical heatsink fins) is located between each pair of pluggable ports to assist with heat regulation in a manner as described with respect to the previous figures. Since this design utilizes a single ASIC, approximately half of the font panel real estate is used for accessing the pluggable ports and locating the channel intakes. From an internal perspective of the housing, a single ASIC design allows for the movement and distribution of internal components. Compared to previously described designs, similar components are included (e.g., positioned within the housing) but the size, location, etc. of one or more of the components can change. For example, the size and location of an ASIC heat sink air intake 4610 has changed compared to earlier designs. Similarly, the location of a CPU 4612 has shifted to the left (as shown by this view) in comparison to earlier designs along with one or more PSUs. In this design a left side plane is employed in the design (e.g., similar to the left side plane in FIG. 182). As such a signal connector 4622 is located to the left side of the housing as presented in the view 4600. In some arrangements these components may be positioned (and potentially resized); for example, by utilizing a right side plane, a connector (similar to connector 4622) would be positioned on the right side of the housing (on the opposite side as shown be the view 4600 of the front panel). For such a design the positions of other components may be mirrored (e.g., a PSUs heatsinks air intake 4616, a PSUs heatsinks air dam 4614, a CPU 4612, a CPU heatsink air dam 4618, and the CPU heatsink air intake 4620, etc.) may shift in position to the right (as presented by this front panel view). The ASIC and corresponding components (e.g., an ASIC heatsink air dam 4611 and the ASIC heat sink air intake 4610) may be shifted to the left along with the columns of OSFP pluggable ports 4602, 4604, 4606, 4608 (since the pluggables need to remain proximate to the ASIC for signal integrity.

Figure 184A:
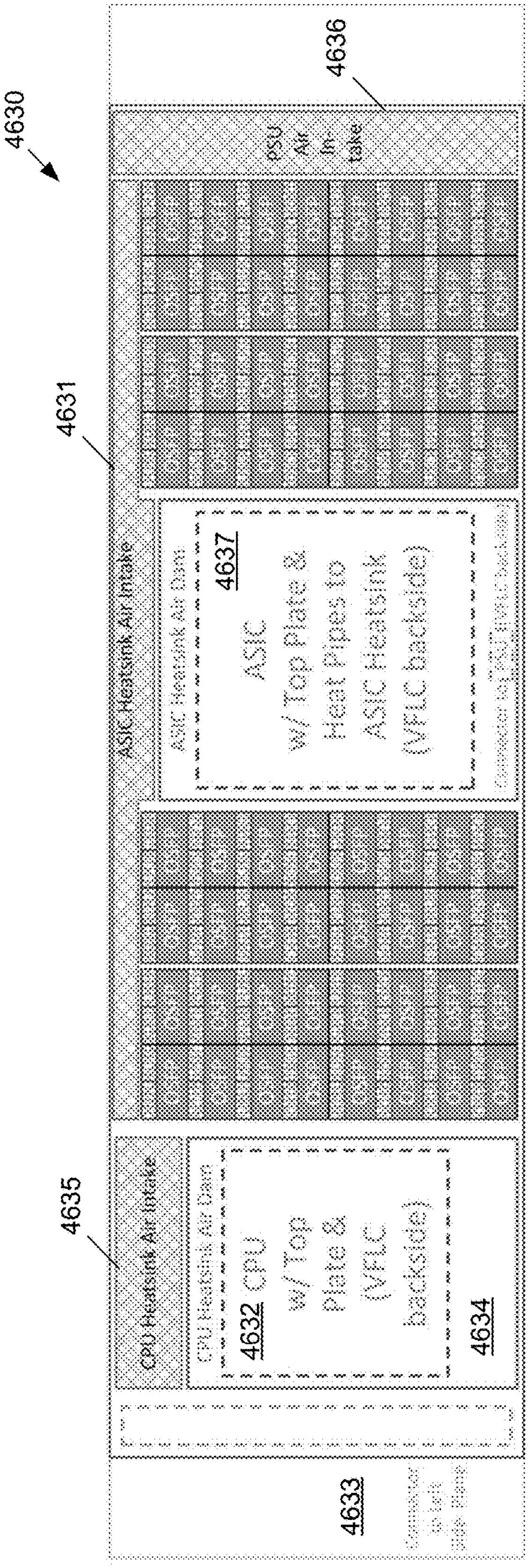

Referring to FIG. 184A, a front view 4630 shows another single ASIC design that has been expanded to include 64 OSFP pluggables. In this design, the 64 OSFP pluggables can be inserted into an arrangement of eight columns of OSFP pluggable ports (with each column having eight ports). A channel intake (for a corresponding channel having vertical heatsink fins) is located between each pair of pluggable ports to assist with heat regulation in a manner as described with respect to the previous figures. In this single ASIC design, approximately ⅔ of the font panel real estate is used for accessing the pluggable ports and locating the channel intakes. Similar the design of FIG. 184, from an internal perspective of the housing, this single ASIC design allows for the movement and distribution of internal components. Also, compared to previously described designs, similar components are included (e.g., positioned within the housing) but the size, location, etc. of one or more of the components can change. For example, the size and location of an ASIC heat sink air intake 4631 has changed compared to earlier designs (e.g., now located in an upper region). The location of a CPU 4632 has further shifted to the left (as shown by this view) in comparison to earlier designs (e.g., the design of FIG. 184). In this design a left side plane is employed (e.g., similar to the left side plane in FIG. 182). As such a signal connector 4633 is located to the left side of the housing. In some arrangements these components may be positioned (and potentially resized); for example, by utilizing a right side plane, a connector (similar to connector 4633) would be positioned on the right side of the housing (on the opposite side as shown be the view 4630 of the front panel). For this design, in comparison to FIG. 184, the positions of other components may be located in similar positions (e.g., a CPU heatsink air dam 4634, CPU heatsink air intake 4635, etc.) or may shift in position to the right (e.g., PSU heatsink air intake 4636). The ASIC 4637 and corresponding components (e.g., an ASIC heatsink air dam) may be shifted to the left along with the columns of OSFP pluggable ports (since the pluggables need to remain proximate to the ASIC for signal integrity.)

Figure 184B:
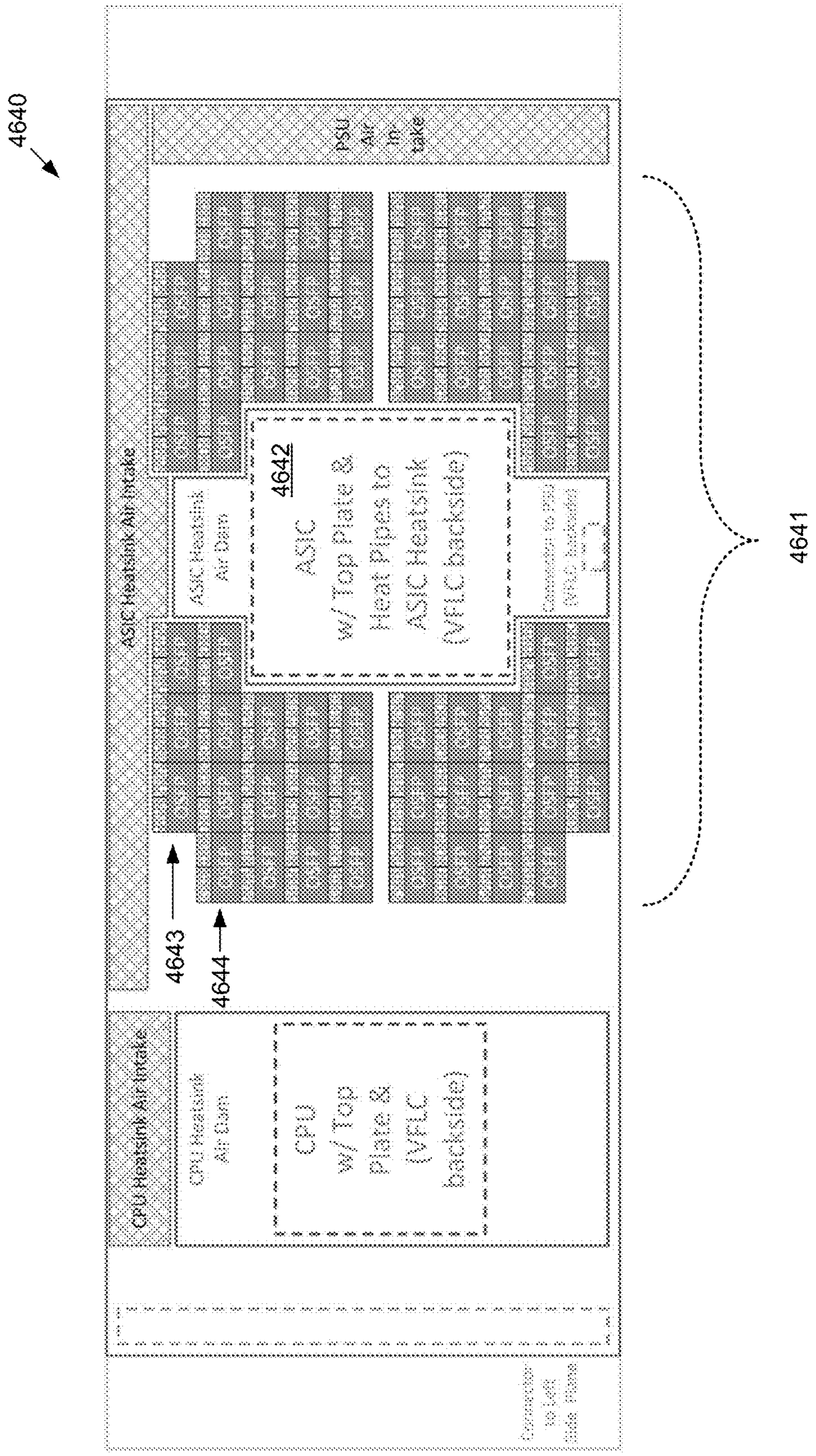

Referring to FIG. 184B, a front view 4640 shows another single ASIC design that includes ports for 64 OSFP pluggables. As illustrated in this example design, one or more patterns can be incorporated into the layout of the OSFP pluggables. Such layout patterns can assist in channeling and disturbing generated heat and thereby reduce the probability of heat-related issues occurring to the overall unit. Based on the pattern or patterns incorporated, the space requirements needed for the OSFP pluggable may be controlled, such as reducing the real estate needed for the OSFP pluggables. In the illustrated example, the OSFP pluggables are positioned in a distribution 4641 that includes a series of horizontal rows that neighbor an ASIC 4642 (and associated components). Referring to pluggables located to the left of the ASIC 4642, an upper-most row 4643 includes three pluggable (for a total of six accounting for the pluggables located on the right side of the ASIC 4642). Located directly below the row 4643, another row 4644 of pluggables horizontally extends and neighbors the ASIC 4642. This row includes four OSFP pluggables (for a total of eight pluggables accounting for the pluggables located on the right side of the ASIC 4642). While this distribution 4641 includes rows of three or four OSFP pluggables, more or less pluggables can be included in the rows of OSFP pluggables. Also more or less rows may be included. By extending the pluggables horizontally in the distribution 4641, the need for space in the vertical direct is reduced thereby allowing the front panel to be shorter in the vertical direction. Additionally, the horizontal spreading of the OSFP pluggables in the distribution 4641 assist with heat management by spreading the pluggables. Distribution variations can provide different types of physical layouts; for example, rather than extending pluggables in the horizontal direction to shorten the vertical dimension of the front panel, the distribution can capitalize (e.g., extend along) other dimensions. Distribution variants may also be designed to further address thermal concerns; for example sources of heat can be separated to improve heat dissipation. Additionally, the distribution of pluggables can account for other components; for example the distribution layout can account for the location of heatsinks (e.g., an ASCI heatsink), air intakes (e.g., ASIC heatsink air intake, PSU air intake, CPU heatsink air intake, etc.), and other components (e.g., heat pipes, connectors, connector location, etc.).

Figure 184C:
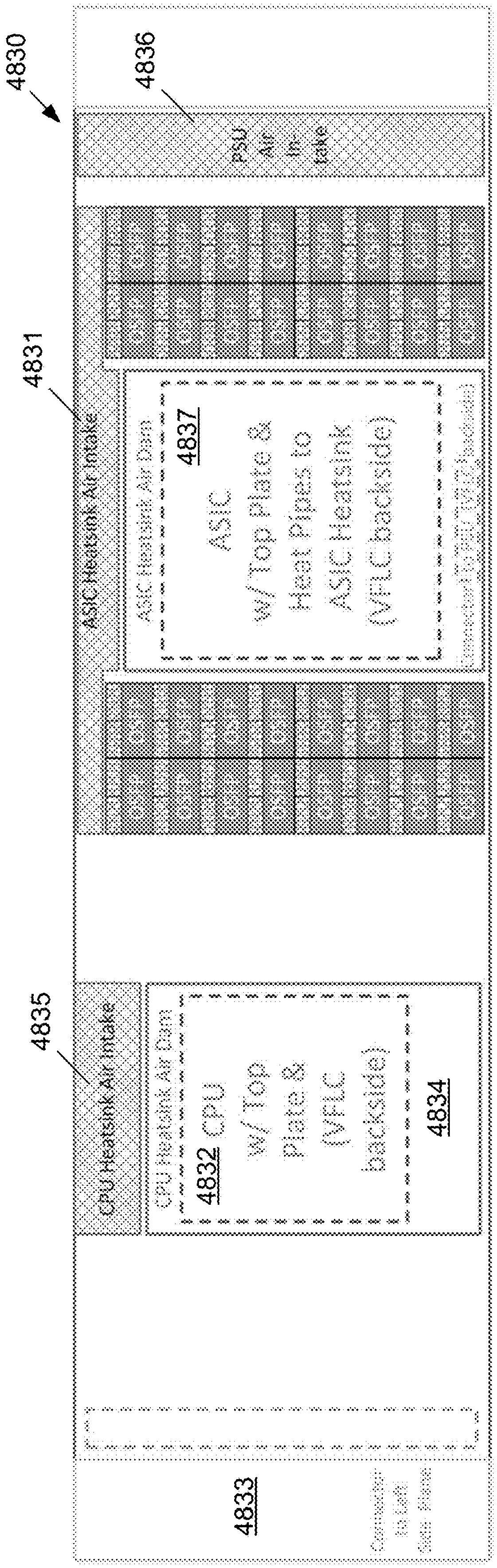

Referring to FIG. 184C, a front view 4830 shows another single ASIC design that includes 32 OSFP pluggables. In this design, the 32 OSFP pluggables can be inserted into an arrangement of four columns of OSFP pluggable ports (with each column having eight ports). A channel intake (for a corresponding channel having vertical heatsink fins) is located between each pair of pluggable ports to assist with heat regulation in a manner as described with respect to the previous figures. In this single ASIC design, less than half of the font panel real estate is used for accessing the pluggable ports and locating the channel intakes. Similar the design of FIG. 184, from an internal perspective of the housing, this single ASIC design allows for the movement and distribution of internal components. Also, compared to previously described designs, similar components are included (e.g., positioned within the housing) but the size, location, etc. of one or more of the components can change. For example, the size and location of an ASIC heat sink air intake 4831 has changed compared to earlier designs (e.g., a shorter version, compared to FIG. 184, is located in an upper region). The location of a CPU 4832 has further shifted to the left (as shown by this view) in comparison to earlier designs (e.g., the design of FIG. 184). In this design a left side plane is employed (e.g., similar to the left side plane in FIG. 182). As such a signal connector 4833 is located to the left side of the housing. In some arrangements these components may be positioned (and potentially resized); for example, by utilizing a right side plane, a connector (similar to connector 4833) would be positioned on the right side of the housing (on the opposite side as shown be the view 4830 of the front panel). For this design, in comparison to FIG. 184, the positions of other components may be located in similar positions (e.g., a CPU heatsink air dam 4834, CPU heatsink air intake 4835, etc.) or may shift in position to the right (e.g., PSU heatsink air intake 4836). The ASIC 4837 and corresponding components (e.g., an ASIC heatsink air dam) may be shifted to the left along with the columns of OSFP pluggable ports (since the pluggables need to remain proximate to the ASIC for signal integrity.)

Figure 184D:
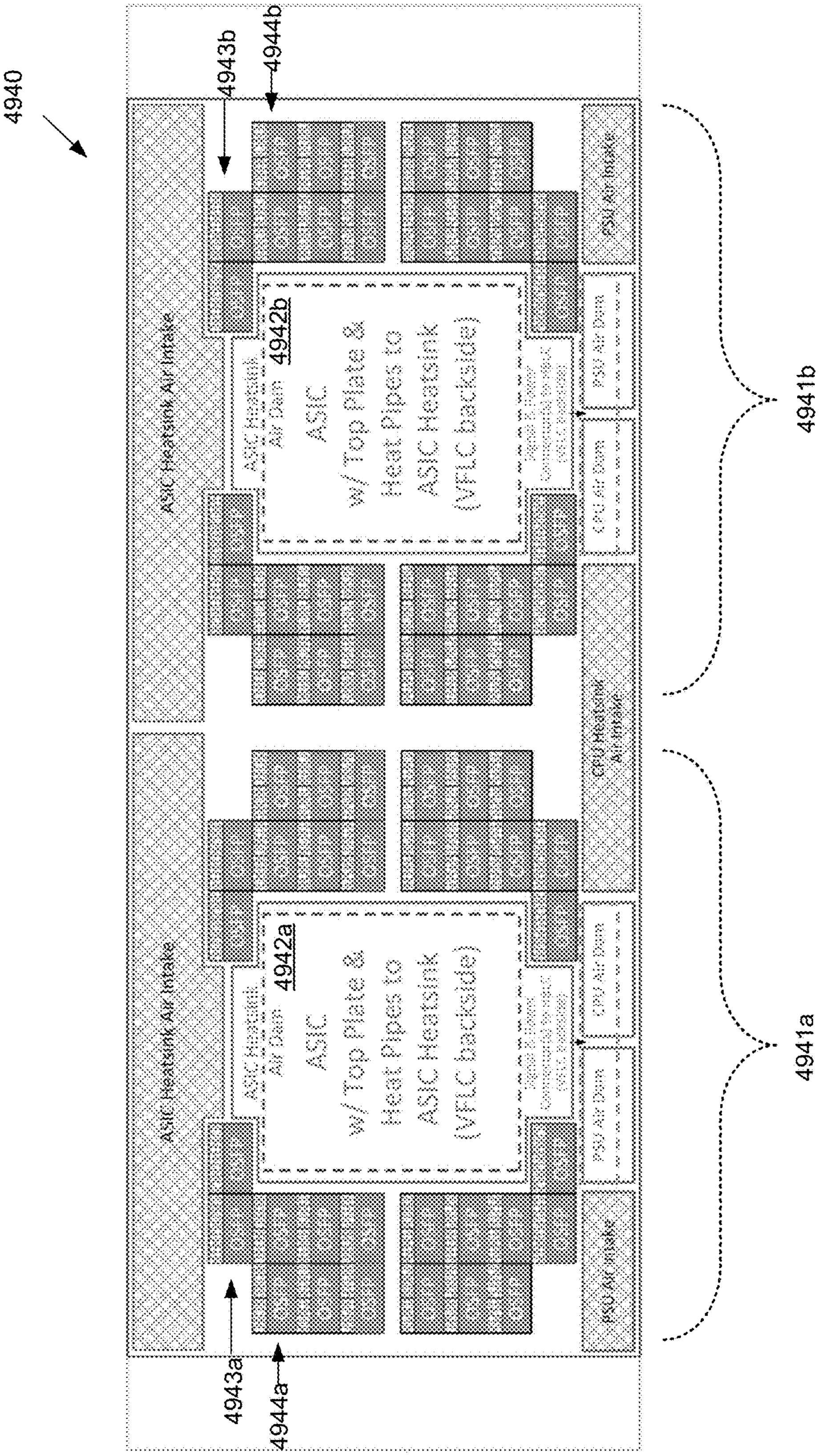

Referring to FIG. 184D, a front view 4940 shows a dual ASIC design that includes 64 OSFP pluggables ports. As illustrated in this example design, one or more patterns can be incorporated into the layout of the OSFP pluggables. Such layout patterns can assist in channeling and disturbing generated heat and thereby reduce the probability of heat-related issues that could occur to the overall unit. Based on the pattern or patterns incorporated, the space requirements needed for the OSFP pluggable may be controlled, such as reducing the real estate needed for the OSFP pluggables. In the illustrated example, a first set of the OSFP pluggables are positioned in a distribution 4941*a* that includes a series of horizontal rows that neighbor an ASIC 4942*a* (and associated components). Referring to pluggables located to the left of the ASIC 4942*a*, an upper-most row 4943*a* includes two pluggables (for a total of four accounting for the pluggables located on the right side of the ASIC 4942*a*). Located directly below the row 4943*a*, another row 4944*a* of pluggables horizontally extends and neighbors the ASIC 4942*a*. This row also includes two OSFP pluggables (for a total of four pluggables when accounting for the pluggables that are located on the right side of the ASIC 4942*a*). While this distribution 4941*a* includes rows of four OSFP pluggables, more or less pluggables can be included in the rows of OSFP pluggables. By extending the pluggables horizontally in the distribution 4941*a*, the need for space in the vertical direct is reduced thereby allowing the front panel to be shorted in the vertical direction. Additionally, the horizontal spreading of the OSFP pluggables in the distribution 4941*a* assist with heat management by spreading the pluggables. A distribution 4941*b* is shown with a similar pattern in the layout of OSFP pluggables, neighboring the ASIC 4942*b* e.g., demonstrating a dual ASIC design with 64 OSFP pluggables. For example, the distribution 4942*b* also illustrates a series of horizontal rows that neighbor ASIC 4942*b* and its associated components, with an uppermost row 4943*b* and a row 4944*b* located directly below the uppermost row 4943*b*. Both the uppermost row 4943*b* and row 4944*b* each include two pluggables on the right side of the ASIC 4942*b* (each row having a total of four pluggables accounting for the pluggables on the left side of the ASIC 4942*b*). Distribution variations can provide different types of physical layouts; for example, rather than extending pluggables in the horizontal direction to shorten the vertical dimension of the front panel, the distribution can capitalize (e.g., extend along) other dimensions. Distribution variants may also be designed to further address thermal concerns; for example sources of heat can be separated to improve heat dissipation. Additionally, the distribution of pluggables can account for other components; for example the distribution layout can account for the location of heatsinks (e.g., an ASCI heatsink), air intakes (e.g., ASIC heatsink air intake, PSU air intake, CPU heatsink air intake, etc.), and other components (e.g., heat pipes, connectors, connector location, etc.).

Referring to FIG. 185, another illustration of a full rack configuration 4650 is presented in which a dual ASIC design is implemented in each of eight vertically stacked VFLCs that include 64 small form factor pluggable (e.g., OSFP) ports. As also shown in FIG. 168, the configuration includes a backplane and a series of HBLCs connected to the VFLCs. Referring to FIG. 186, a front view 4660 is presented of a housing for a design that can be incorporated into the configuration 4650 of FIG. 185. In this implementation, a vertical orientation is used for the layout of OSFP pluggable ports. In this particular arrangement, sixteen columns that each include four OSFP pluggable port extend across the front. Within each column, the four ports are arranged in pairs two and the ports within a pair are adjacent. For example, in column 4662 a first pair of OSFPs (i.e., OSFP 4664 and OSFP 4666) are located vertically adjacent and a second pair of OSFPs (i.e., OSFP 4668 and OSFP 4670) are also vertically adjacent. A channel intake is located on one side of each OSFP; for example channel intake 4672 is located above one side of OSFP 4664, channel intake 4674 is located below one side of OSFP 4666, channel intake 4676 is located above OSFP 4668, and channel intake 4678 is located below OSFP 4670. A similar layout is used for the other fifteen columns shown in the front view. Similar to earlier presented designs, the front view 4660 also shows the positioning of the two ASIC 4680, 4682 within the housing and the corresponding ASIC heatsink air dams 4684, 4686, ASIC heatsink air intakes 4688, 4690 and the position of signal and power connectors 4692, 4894. In this arrangement, the ports and channel intakes are positioned in the same location for each columns; however, in some implementations the port and channels may be located in different positions. For example, intake channel (and corresponding channels) for air flow entry may be positioned between each of the plug port pairs for heat regulation within the housing.

Referring to FIG. 187, a view of a front panel 4551 (similar to front panel 4550 of FIG. 183) is shown for a dual ASIC design that has a 3RU size factor. The front panel 4451 is shown with a different pattern of pluggables (e.g., OSFPs) and ASIC heatsink air dams located in different positions compared to front panel 4450 (referring to FIG. 183). Each pluggable (e.g., OSFP) can have a 15 mm vertical pitch and a 24 mm horizontal pitch. In some designs, fewer pluggables may be implemented. For example rather than 64 pluggables, 32 small form factor pluggables can be employed, which would reduce power requirements. Similar to FIG. 169A, Also in this design, a channel intake (e.g., channel intake 4552) is located above and/or below each of the plug locations and the channel associated with the intake may incorporate one or more of the design features (e.g., channel wall design, heatsink fins positions within the channels, etc.). In this particular example, each channel intake (e.g., channel intake 4552) is segmented to include multiple channels. As illustrated in the figure, for this design each channel intake has two segments and each segment is approximately half the horizontal pitch of the OSFP. As mentioned above, various types of architectures may be utilized. Additionally, similar or different geometries may be used for each channel intake segment, multiple segments (e.g., groups of segments), etc.

Referring to FIG. 188, as described above, fans, heat sinks, and other type of thermal control mechanisms can be positioned within a housing or casing of a switch (e.g., the switch 1800 shown in FIG. 167) to regulate internal air temperatures. Other components may also be positioned at one or more locations of the switch, for example, to increase thermal efficiency. For example, components of one or more of the switch cards housed in the switch can be positioned for better thermal efficiency. In one design arrangement, one or more of the switch application-specific integrated circuits (referred to as switch ASICs or ASICs) can be positioned for thermal efficiency. For example, each ASIC can be vertically mounted on a forward surface of printed circuit board (PCB) such that the ASIC is closer to the front of the switch (compared to mounting the ASIC on a back surface of the PCB-thereby, positioning the ASIC further aft). By positioning the ASIC on the forward side of the PCB, thermal dissipation components can be in closer proximity to the ASIC. For example, heat sinks, plates, heat pipes, etc. can be closer in proximity to the ASICs by mounting the ASICs on the forward side of the PCB.

Other types of components can also be positioned in various locations to assist with thermal efficiency. For example, one or more central processing units (CPUs) can be positioned to aid (e.g., improve) thermal dissipation. Directing the flow of air through the switch can also improve thermal efficiency. For example, positioning air intake, heatsinks, etc. can assist with controlling thermal aspects of components (e.g., CPUs, PSUs, etc.) and interior regions of the switch. As illustrated in the figure, a front view of dual ASIC vertical front line cards 4800 of a switch is shown that includes a dual ASIC layout in which two vertically mounted ASIC assemblies 4802, 4804 and associated components are position in a side-by-side layout; however, other types of layouts may be utilized in other designs. Similar to designs described above, the illustrated design includes 64 plug ports that are capable of receiving 64 OSFPs; however ports for other types of pluggables may be employed. To assist with temperature regulation, each ASIC assembly includes an ASIC heatsink air intake located at the upper portion of the corresponding assembly. Each assembly also includes air intakes to assist with directing airflow.

Each of the ASIC assemblies 4802, 4804 also include a vertically mounted ASIC 4806, 4808 and corresponding components (e.g., structures such as top plates, temperature control mechanisms such as heat pipes, heatsinks, etc.) that are not shown in this figure. Each of the ASICs 4806, and 4808 are positioned for close proximity to the components that assist with thermal management. In particular, each ASIC is mounted to the forward side of a PCB to appropriately position the ASIC for thermal management.

Referring to FIG. 189, a front view 4900 of a single ASIC assembly 4902 (e.g., the left side of a dual ASIC assemblies layout) is shown along with the ASIC 4904 of the single assembly. Along with having air intakes, air dams, etc. positioned about the ASIC 4904, the ASIC is also vertically mounted to a forward side of a PCB to position the ASIC near to heat management components (e.g., a top plate, heat pipes, etc.) to improve the efficiency of heat management, for example, to move heat from the ASIC to other areas of the assembly, switch, etc. Referring to FIG. 190, a side view 5000 of a slice (forward to aft) taken through an ASIC assembly (e.g., the ASIC assembly 4902 shown in FIG. 189) is presented. The components of this view 5000 reflect the view and component layout described with respect to FIG. 171 (above) and can operate in a similar manner; however, design variants may be incorporated.

Referring to FIG. 191, a side view 5100 of a slice (forward to aft) taken through a central portion of an ASIC assembly (e.g., the ASCI assembly 4902 shown in FIG. 189) is presented. As shown by a diagram 5102, the forward to aft slice is take through an ASIC 5104 and slightly to the right of the ASIC's center. As illustrated in the figure, the ASIC 5104 is vertically mounted to a forward surface of a vertically mount VLC PCB 5106. By being mounted to this forward surface of the VLC PCB 5106, the ASIC 5104 is located more forward (towards the front of the switch) and away from the central area of the switch. Additionally, the ASIC 5104 is located proximate to heat management components (e.g., a AISC Top Plate and Heat Pipes 5108). Placed in this location, heat from the ASIC can be received by the heat management components and the heat can be transferred (e.g., for dissipation). In the illustrated example, the heat propagates upward through the heat pipes and then towards the rear of the switch (as shown by the graphical representation of the of the heat pipes that run along ASIC heatsink Fins 5114). Additional heat management components may further improve the efficiency of heat being dissipated from the ASIC 5104. For example, an ASIC heatsink air dam 5110, an ASIC Heatsink Air Intake 5112, and the ASIC heatsink fins 5114, etc. can assist the management of heat from the ASIC 5104.

Referring to FIG. 192, a side view 5200 of another slice (forward to aft) taken through a portion of an ASIC assembly (e.g., the ASCI assembly 4902 shown in FIG. 189) is presented. As shown by a diagram 5202, the forward to aft slice is taken through the ASIC assembly that is to the right of the ASIC. The components of this view 5200 reflect the view and components described with respect to FIG. 173 (above) and can operate in a similar manner; however, design variants can be incorporated. For example, a CPU 5204 is positioned adjacent to CPU heatsink vertical fins 5206 for heat management. In this arrangement, to position the CPU 5204 proximate to the fins 5206, the CPU is mounted to the lower side of a horizontal back line card (HBLC) PCB 5208. As such the CPU 5204 is mounted for positioning in a location for improved thermal management efficiency. While particular sides of PCB's have been identified to adjust the positioning of ASICs and CPUs for improved thermal management, one or more other types of components may be positioned by using PCB's for thermal management. Further, while PCB's have been utilized for the positioning of ASICs, CPUs, etc., other types of components, implementations can be employed. For example, components should as heatsinks, heatsink bases, etc. may be used to position ASICs, CPUs, etc. Various type of structures individually, using in concert with PCBs, etc. may be used for positioning components for thermal management; for example, sidewalls, front panels, back panels, etc. can be used to position components.

Referring to FIG. 193, a top view 5300 of a slice taken through a portion of an ASIC assembly (e.g., the ASCI assembly 4902 shown in FIG. 189) at a particular vertical height is presented. As shown by a diagram 5302, the slice is take at a vertical location that is slightly more than half way up the assembly. From this top view, the position of an ASIC 5304 (of the ASCI assembly) is shown relative to the front 5306 of the switch (e.g., the switch 1800). Additionally, the top view 5300 presents that the ASIC 5304 is mounted to the forward surface of a VLC PCB 5308, thereby allowing the ASIC to be in close proximity to an ASIC Top Plate and Heat Pipes 5310. As mentioned above, being positioned in such a manner allows for more efficient thermal management of the dissipation of heat produced by the ASIC 5304, for example. As also mentioned, other components (e.g., CPUs, etc.) can be mounted (e.g., vertically or horizontally) to such structures (e.g., PCBs) to position these components for better thermal management. In this particular example, the ASIC 5306 was positioned move forward by mounting the ASIC to a forward surface of the PCB 5308; however other positions, orientations, etc. can be employed. For example, components can be mounted to surfaces of PCBs, etc. to locate the components closer to any side (e.g., top, bottom, front, back, left, right, etc.) of the switch, for example. In additional to assisting with producing more efficient thermal management, positioning the ASIC 5304 may provide other types of advantages, for example, component spacing may be improved (e.g., internal real estate of the switch may be conserved).

Referring to FIG. 194, another top view 5400 is presented of a slice taken through a portion of an ASIC assembly (e.g., the ASCI assembly 4902 shown in FIG. 189) but at a lower vertical height (as provided by a diagram 5402). From this view, the design shows that an ASIC 5404 is vertically mounted to one PCB (i.e., a VLC PCB 5406) and a CPU 5408 is horizontally mounted to the PCB of an HBLC 5410. Along with using two different PCB's to separately provide structural support to the ASIC 5404 and the CPU 5408, this design decouples the designs of the ASIC and the CPU along with the designs of the individual PCB's. Further, individual designs or both the designs in concert can be used to determine the overall layout of assemblies, the switch, etc.

Referring to FIG. 195, a top view 5500 is presented of a slice taken at a vertical level near the bottom of an ASIC assembly (e.g., the ASCI assembly 4902 shown in FIG. 189). As shown by this view, and described above, CPU and PSU air intakes are located forward and allow air to be directed by respective CPU and PSU air dams into the switch (e.g., air from the CPU air intake is directed to a CPU heatsink and fins). In this design, signal and power connector(s) 5502 (for an HBLC) are located aft of an VLC PCB 5504. As shown in the figures described above, the VLC PCB 5504 has the ASIC of the assembly mounted to its forward surface to allow the ASIC to have close proximity to thermal management components (e.g., an ASIC top place and heat pipes).

Referring to FIG. 196 (and similar to FIG. 191), a side view 5600 of a slice taken (forward to aft) through a central portion of an ASIC assembly (e.g., the ASCI assembly 4902 shown in FIG. 189) is presented. Also similar to FIG. 191, as shown by a diagram 5602, the forward to aft slice is take through an ASIC 5604 and slightly to the right of the ASIC's center. As illustrated in the figure, the ASIC 5604 is vertically mounted to a forward surface of a vertically mounted VLC PCB 5606. By being mounted to this forward surface of the VLC PCB 5606, the ASIC 5604 is located more forward (towards the front of the switch) and away from the central area of the switch. Additionally, the ASIC 5604 is located proximate to heat management components (e.g., a AISC Top Plate and Heat Pipes 5608). Placed in this location, heat from the ASIC can be received by the heat management components and the heat can be transferred (e.g., for dissipation). In comparison to FIG. 191, the design shown in FIG. 196 includes a different heat management layout. An ASIC heatsink air intake 5610 directs air to ASIC heatsink fins 5612. As represented by graphical arrows 5614 and 5616, air flow is directed upward to a top portion of the assembly and then travels to the aft portion of the assembly. In some arrangements, one or more additional components may be included to assist with the air flow from the intake and through the ASIC heatsink fins 5612 to the aft portion of the assembly. For example, one or more baffling structures can be incorporated between fins to improve the air flow. Additionally, other type of components, subsystems, etc. may be implemented to assist with thermal management and improve efficiency.

Referring to FIG. 197, a front view 5700 of a single ASIC assembly 5702 (e.g., the left side of a dual ASIC assemblies layout) is shown along with the ASIC 5704 of the single assembly. Along with having heatsink air intakes, air dams, etc. positioned about the ASIC 5704, the ASIC is also vertically mounted to a forward side of a PCB to position the ASIC near to heat management components (e.g., a top plate, heat pipes, etc.) to improve the efficiency of heat management, for example, to move heat from the ASIC to other areas of the assembly, switch, etc. In comparison to FIG. 189, the design shown in FIG. 197 includes a different heat management layout. The design shown in FIG. 197 includes a pair of ASIC heatsink air intakes 5706*a* and 5706*b*, positioned adjacent to ASIC heatsink air dams 5707*a* and 5707*b*, respectively. The ASIC heatsink air dams 5707*a* and 5707*b* assist regulatory operations by directing airflow entering the front line cards. Additionally, the design shown in FIG. 197 includes a set of OSFP-XD columns 5708*a* and 5708*b* positioned on each side of the ASIC 5704, separated by the ASIC heatsink air dams 5707*a* and 5707*b*. The set of OSFP-XD columns 5708*a* is positioned on the left of ASIC 5704, ASIC heatsink air dam 5707*a*, and ASIC heatsink air dam 5707*b*. The set of OSFP-XD columns 5708*b* is positioned to the right of ASIC 5704, ASIC heatsink air dam 5707*a*, and ASIC heatsink air dam 5707*b*. Each set of OSFP-XD columns 5708*a* and 5708*b* include OSFP-XD (OSFP extra dense) pluggables. A HBLC connector 5710*a* and HBLC connector 5710*b* are positioned below each set of the OSFP-XD columns 5708*a* and 5708*b*, respectively. As previously discussed, connectors such as the HBLC connectors 5710*a* and 5710*b* connect the VLC to horizontal back line cards (not illustrated).

Referring to FIG. 198, a side view 5800 of a slice (forward to aft) taken through an ASIC assembly (e.g., the ASIC assembly 5702 shown in FIG. 197) is presented. As shown by a diagram 5802, the forward to aft slice is taken through the ASIC assembly that is to the right of the ASIC. The components of this view 5800 reflect the view and components described with respect to FIG. 197 (above) and can operate in a similar manner; however, design variants can be incorporated. As an example, a set of OSFP-XD pluggables 5804 may be used instead of OSFP pluggables (as illustrated in FIG. 192). An optional low-speed input/output module 5820 may be positioned between the set of OSFP-XD pluggables 5804 and the PSU intake 5814. For example, the optional low-speed input/output 5820 may provide input and output signals from an example connector 5710*a* or 5710*b* for an HBLC (referring to FIG. 197). The optional low-speed input/output 5820 may be used to connect to HBLC PCB 5818 by a connector 5816. An example heatsink vertical fin 5822 can extend through the VLC cut-out to create PCB cut outs 5824 to exhaust air and improve heat management. The connector 5816 may be positioned above the PSU air intake 5814 to connect to the HBLC PCB 5818, thereby providing signal and power to the HBLC PCB 5818. A set of graphical arrows 5806 and 5812 indicate air flow intake into the ASIC heatsink air intake 5808 and PSU air intake 5814, respectively. The ASIC heatsink air intake 5808 leads to ASIC heatsink vertical fins 5810 that have an extended length (e.g., compared to the ASIC heatsink vertical fins 4154 in FIG. 178), to provide improved heat dissipation and management.

Referring to FIG. 199, a side view 5900 of a slice (forward to aft) taken through a central portion of an ASIC assembly (e.g., the ASCI assembly 5902 shown in FIG. 197) is presented. As shown by a diagram 5902, the forward to aft slice is take through an ASIC 5904 and slightly to the right of the ASIC's center. As illustrated in the figure, the ASIC 5904 is vertically mounted to a forward surface of a vertically mounted VLC PCB 5910. By being mounted to this forward surface of the VLC PCB 5910, the ASIC 5904 is located more forward (towards the front of the switch) and away from the central area of the switch. Additionally, the ASIC 5904 is located proximate to heat management components (e.g., a AISC Top Plate and Heat Pipes 5912). Placed in this location, heat from the ASIC can be received by the heat management components and the heat can be transferred (e.g., for dissipation). In the illustrated example, the heat propagates upward towards ASIC heatsink air intake 5906*a* and downward towards ASIC heatsink air intake 5906*b*, through the heat pipes and then towards the rear of the switch (as shown by the graphical representation of the of the heat pipes that run along ASIC heatsink fins 5914*a* and ASIC heatsink fins 5914*b*). ASIC heatsink air dam 5908*a* and ASIC heatsink air dam 5908*b* help to direct the heat upward to ASIC heatsink 5906*a* and ASIC heatsink 5906*b*, respectively. Additional heat management components may further improve the efficiency of heat being dissipated from the ASIC 5904. For example, the ASIC heatsink air intake 5906*a* and ASIC heatsink air intake 5906*b*, along with respective ASIC heatsink fins 5914*a* and ASIC heatsink fins 5914*b*, can assist the management of heat from the ASIC 5904.

Referring to FIG. 200, another illustration of a full rack configuration 6000 is presented in which a dual ASIC design is implemented in each of eight vertically stacked VFLCs that include 32 small form factor pluggable (e.g., OSFP) ports. The illustrated configuration 6000 includes a backplane and a series of horizontal back line cards (HBLCs) connected to the vertical front line cards (VFLCs). While this configuration is 4RU-VLC, various architectures are employable, for example, 4RU-VLC, a 3RU-VLC, etc. may use the techniques presented below. As discussed with reference to FIG. 168 above, the switches illustrated in the full rack configuration 6000 can be stacked using VFLCs, e.g., VFLCs 1852-1866, that can be connected to HBLCs, e.g., HBLCs 1868-1882, and to the backplane, e.g., backplane 1884. The number of cards employed within the stack can vary based on the power needs and include varying types of designs, e.g., single ASIC, dual ASIC, with different dimensional aspects, e.g., 3RU, 4RU, with each VFLC capable of receiving small form factor pluggables such as SFPs, OSFPs, QSFPs, etc. Each of VLFCs can include one or more features to assist with temperature regulation such as channels, air dams, and housing/casing configurations to assist in improving cooling efficiency. Other design configurations that can be achieved by adjusting design features include the number of line cards and orientation of line cards.

Referring to FIG. 201, a front view 6100 is presented of a housing for a design that can be incorporated into the configuration 6000 of FIG. 200. In this implementation, a vertical orientation presents the layout of OSFP pluggable ports. In this particular arrangement, a dual ASIC design (e.g., ASIC 6102, ASIC 6104) includes two vertical columns of OSFP pluggable ports to the left of the each ASCI and two vertical columns of OSFP pluggable ports to the right of the each ASIC. To direct air flow from the front and into the interior, the front includes heatsink air intakes located above the dual ASICs and the columns of OSFP pluggable ports. In this arrangement, ASIC heatsink air intake 6106 and ASIC heatsink air intake 6108 are located above ASIC 6102 and ASIC 6104, respectively. Additionally, power supply units (PSUs) air intake 6110 is centrally located above four columns of OSFP pluggable ports. Air can be generally directed towards the central upper portion of the switch. In this arrangement, multiple air dams can be used to direct air flow; for example, an air dam 6112, which located towards the far left of this front view directs air flow (to the right) towards the ASIC heatsink air intake 6106 and another air dam 6114 located to the far right of the front view directs air flow (to the left) towards the ASIC heatsink intake 6108.

The air dams also direct air flow from the bottom to the air intakes located above the dual ASICS. In this implementation, an ASIC heatsink front air dam 6116 directs air upwards towards the ASIC heatsink air intake 6106 (and the PSUs air intake 6110), and ASIC air dam 6118 directs air upward towards the ASIC heatsink air intake 6108 (and the PSUs air intake 6110). While this example generally directs airflow to air intakes located at one particular area (e.g., above the ASICs), airflow can be directed to one or more other locations. For example, air intakes may be located at the bottom, one or more sides, etc. and receive air flow, e.g., from air dams positioned at one more front locations. Similar to other implementations shown above, the ports and channel intakes (associated with the ports are positioned in the same location for each columns in this arrangement; however, in the port and channels may be located in different positions for other implementations.

A cut line 6120 is shown on the left side of front view 6100, through the ASIC heatsink front dam 6112, described in further detail with reference to FIG. 202 below. A cut line 6122 is shown on the left side of front view 6100, e.g., as a vertical line through the ASIC heatsink air intake 6106, ASIC 6102, and ASIC heatsink front air dam 6116, described in further detail with reference to FIG. 203 below. A cut line 6124 is shown through a center portion of the front view 6100, described in further detail with reference to FIG. 205 below. A cut line 6126 is illustrated as a horizontal line through a center portion the ASIC assembly, e.g., through ASIC 6102 and ASIC 6104, described in further detail with reference to FIG. 204 below.

Referring to FIG. 202, a side view 6200 of a slice is illustrated as forward to aft, taken through a left portion of the ASIC assembly (as defined by cut line 6120 shown in FIG. 201). In other words, the side view 6200 of a slice is taken through the air dam 6112 to the left of the ASIC 6102, e.g., along the cut line 6120. As illustrated, the side view 6200 of the air dam 6112 shows that air flow entering from the front is pushed towards the central volume below a top wall, represented by graphical arrow 6202 and graphical arrow 6204 pointing out of the illustration. Illustrated as directed towards the aft, the air flow passes the air dam 6112 and enters a volume 6206 prior to be directed by an ASIC heatsink rear air dam 6208 to a volume 6210 that contains one or more mechanisms (e.g., fans) that cause the air to flow from the front to the rear of the ASIC assembly. In this implementation, the rear air dam 6208 includes one or more surfaces that extend outward towards the left side of the switch. Extending outward, air flow expands towards the left side (as represented by graphical arrow 6212). By expanding outward, the air flows through a larger volume, which reduces the velocity of the air and also reduces the noise level caused by the air flow.

As shown by side view 6200, the forward to aft slice is taken through the ASIC assembly that is to the left of the ASIC. The components of this view 6200 reflect the view and components described with respect to FIG. 201 (above) and can operate in a similar manner; however, design variants can be incorporated. As an example, riding heatsink fins 6222 can extend through cutouts in a VLC PCB 6226 to create PCB cut outs 6224 to exhaust air and improve heat management, e.g., by allowing airflow. An additional set of graphical arrows 6218 and 6220 indicate air flow intake past the ASIC heatsink front air dam 6112 through volume 6206, and from the ASIC heatsink rear air dam 6208 to volume 6210, respectively. The ASIC heatsink air intake 6106 and 6108 leads to ASIC heatsink vertical fins, described in reference to FIG. 203 below, to provide improved heat dissipation and management.

The side view 6200 also presents other features that direct air flow from forward to aft, with channel intakes are located above each OSFP pluggable port to direct air flow from forward to aft. The side view 6200 can include any number of channel intakes, e.g., based on the number of pluggable ports. A channel intake 6214 located above OSFP pluggable port 6216 can direct air flow from forward aft. The channel can extend from the intake and inward through a printed circuit board (PCB) cut-out, thereby allowing airflow to propagate pass through the PCB and into the volume of the ASIC assembly along a direction represented by graphical arrow 6220. The airflow can pass from the volume of the ASIC assembly to the volume 6210 that can include air flow mechanisms, e.g., fans, to draw the airflow through the channel and into the volume 6210. By propagating airflow through the channels, the channels provide additional heatsink capacity for the ASIC assembly to improve thermal efficiency, e.g., reducing excess heat generated by moving airflow efficiently. The ASIC 6102 and ASIC 6104 can be vertically mounted to a forward surface a vertically mounted VLC PCB, e.g., an ASIC assembly.

The side view 6200 illustrates channel intakes, e.g., channel intake 6214 located above OSFP pluggable port 6216, with a thickness that gradually increases in width throughout the length of the channel intake, e.g., from forward to aft. For example, the channel intake 6214 can be relatively narrow at the opening of the pluggable port 6216, e.g., the left-hand side of the OSFP pluggable port 6216, and widens in thickness throughout the length of the channel intake towards the end of the pluggable port 6216, e.g., the right-hand side of the OSFP pluggable port 6216. The side view 6200 also illustrates riding heatsink base 6228, which can be included for each OSFP pluggable port 6216. The riding heatsink base 6228 can be any desirable shape to adjust the width of channel intakes located in proximity, e.g., above, below, to the OSFP pluggable port 6216. For example, the riding heatsink base 6228 can include a tapered shape that is relatively wide at one end, e.g., the end of the riding heatsink base 6228 that is closest to the OSFP pluggable 6216. The riding heatsink base 6228 can be narrow at a second end, e.g., furthest away from the OSFP pluggable 6216, thereby increasing the width of the channel intake 6214 at the second end. Any shape can be users for the riding heatsink base 6228, such as a sharp taper with a narrow shape that quickly widens the channel intake 6214 to increase volume and thereby decrease airflow velocity. In some implementations, a gradual taper of the riding heatsink 6228 can be leveraged to gradually widen the channel intake 6214 and decrease airflow velocity.

The tapered portion of the channel intake 6214 provides that the velocity of airflow through the intakes can be affected, e.g., reducing the velocity of the airflow, as the airflow passes through riding heatsink fins 6222. For example, a channel intake 6214 that widens at the end of the OSFP pluggable port 6216 provides more volume, e.g., space, for the airflow to pass through, thereby reducing the velocity of the airflow as the air has more volume to occupy in the switch. By increasing the volume of space provided by the channel intake and decreasing the velocity of the airflow, noise accompanied by the airflow as it passes through components of the switch can be reduced. Reducing noise associated with turbulent air flow can be desirable with rack mount configurations having multiple cards, e.g., in server rooms.

Referring to FIG. 203, a side view 6300 of a slice is illustrated as forward to aft, taken through a left-hand side portion of the ASIC assembly, through the cut line 6122 shown in FIG. 201. In other words, the side view 6300 is taken through the ASIC heatsink air intake 6106, ASIC 6102, and ASIC heatsink front air dam 6116. The ASIC 6102 connects to VLC PCB 6310, e.g., mounted in a manner similar to the VLC PCB 5106, as illustrated in reference to FIG. 191 above. The ASIC 6102 can also connect to heatsink structures 6304, which can include plates, pipes, bases, etc. that enclose a volume 6312 that can be configured, e.g., by arranging components of the heatsink structures 6304 into a particular shape, to provide different degrees of conduction the heatsink structures 6304 and pathways to direct airflow. The heatsink structures 6304 can further aid in reducing heat from the airflow, e.g., by gradually conducting heat and cooling the flow of air as it passes over the heatsink structure.

As illustrated, graphical arrows 6302 show airflow passing to ASIC heatsink air intake 6106, in which the ASIC heatsink front air dam 6116 directs the airflow accordingly. The airflow continues to flow through the ASIC heatsink vertical fins 6306, as illustrated by graphical arrows 6308, to volume 6314. The ASIC heatsink rear air dam 6208 directs the airflow from ASIC heatsink vertical fins 6306 to volume 6314 to volume 6210; the volume 6210 can include mechanisms, e.g., fans, to draw airflow from the forward to aft positions shown in the side view 6300. As the airflow enters at forward of the side view 6300, e.g., illustrated by graphical arrow 6302, to the aft of the side view 6300, the volume 6312, the heatsink structures 6304, and the ASIC heatsink rear air dam 6208 can direct airflow accordingly. An opening at the ASIC heatsink air intake 6106 can be relatively narrow, e.g., compared to opening or shape created by arranging heatsink structures 6304 to direct airflow to a larger volume, e.g., volume 6314 being wider than the volume occupied by the ASIC heatsink vertical fins 6306. The heatsink structures 6304 can further improve thermal efficiency and air cooling by absorbing some or all heat carried by the airflow indicated by graphical arrow 6302 and graphical arrow 6308.

Referring to FIG. 204, a top view 6400 of a slice through a central portion of ASIC assembly, as defined through the cut line 6126 shown in FIG. 201. In other words, the top view 6400 of a slice is taken through ASIC 6102 and ASIC 6104. As illustrated, the top view 6400 illustrates ASIC heatsink front air dam 6112 and ASIC heatsink front air dam 6412 for ASIC 6102 and ASIC 6104, respectively. Each ASIC heatsink front air dam 6112 and 6412 includes a graphical arrow 6202 and 6402 for ASIC 6102 and ASIC 6104, respectively. The graphical arrows 6202 and 6402 of the ASICs 6102 and 6104 show that air flow entering from the front of the ASIC assembly is pushed towards the central volume below a top wall, e.g., represented by graphical arrow 6202 and graphical arrow 6412 pointing out of the illustration. Further description of the airflow being pushed towards the central volume below a top wall is described in referenced to FIG. 202 above.

The top view 6400 also illustrates riding heatsink fins 6222 and 6422, heatsink structures 6304 and 6404, ASIC heatsink vertical fins 6306 and 6406, for ASIC 6102 and 6104, respectively. As discussed in reference to FIG. 203 above, the heatsink structures 6304 and 6404 can conduct heat carries by flows of air to provide further cooling and thermal efficiency for the ASIC assembly. In some implementations, the heatsink structures 6304 and 6404 can be configured to provide different gradients of cooling for airflows passing through the ASIC assembly. The top view 6400 also illustrates the tapering of channel intakes results into a wider volume indicated by the riding heatsink fins 6222 and 6422, as described in reference to FIG. 202 above. Increasing the width of the channel intakes provide a wider opening to a larger volume of space in the ASIC assembly, thereby reducing airflow velocity. The corresponding reduction in airflow velocity results in less noise, which can be desirable in a rackmount configuration for servers, data centers, etc.

Referring to FIG. 205, a side view 6500 of a slice is illustrated as forward to aft, taken through a center portion of the ASIC assembly (as defined by the cut line 6124 shown in FIG. 201). In other words, the side view 6500 of a slice is taken through PSU air intake 6100 near an approximate center of the ASIC assembly, e.g., between ASIC 6102 and ASIC 6104 along the cut line 6124. As illustrated, the side view 6500 shows an air flow entering from the front propagates towards the central volume below a top wall, represented by graphical arrow 6502 to PSUs air intake 6110. The graphical arrow 6504 indicates that the air flow continues moving to the PSUs 6506, thereby providing air cooling to the PSUs 6506 and transferring heat away from the PSUs 6506, and to a volume 6510 by graphical arrows 6514.

The volume 6510 can include mechanisms such as fans to draw airflow from a portion, e.g., the front, of the ASIC assembly illustrated at the left-hand side of the side view 6500 to another portion, e.g., the rear, of the ASIC assembly illustrated at the right-hand side of the side view 6500.

In addition to air flowing through the PSUs air intake 6110 through the top of the ASIC assembly, the ASIC assembly includes multiple channel intakes 6518, each channel intake being disposed between OSFPs 6516. In some implementations, a number of OSFPs can be grouped and have any number of channel intakes 6518 disposed between two adjacent OSPs 6516. The channel intakes 6518 widen to a volume 6528, thereby increasing the volume available to the airflow passing through the channel intakes 6518 and reducing the velocity of the airflows. As discussed above in reference to FIG. 202 above, a reduction in airflow velocity, particularly turbulent airflow velocity, results in less noise generated as the airflow passes through the ASIC assembly. Each of the channel intake 6518 widens into the riding heatsink fins 6222 to the volume 6528, and can be further propagated into volume 6510 to additional reduction in airflow velocity.

In some implementations, a central processing unit (CPU) 6520 is located at the bottom of the ASIC assembly, and can be located adjacent to (e.g., below) a set of CPU heatsink vertical fins 6524. The CPU heatsink vertical fines 6524 can be adjacent (e.g., below) a CPU heatsink air dam 6526, to further direct airflow towards volume 6510, e.g., as illustrated by graphical arrows 6514. The CPU heatsink air dam 6526 channels air around the CPU to flow towards the volume 6510, and in some implementations, the volume 6510 can further include mechanisms, e.g., fans, to further draw flows of air. By channeling air from the CPU 6520, the CPU heatsink vertical fins 6524 and the CPU heatsink air dam 6526 to improve the thermal efficiency and heat flow. In some implementations, some or all of the airflow from riding heatsink fins 6222 can pass through the CPU heatsink vertical fins 6524.

In some implementations, additional heatsink structures such as side plates can be disposed on either side, including both sides, of a respective ASIC for an ASIC assembly. The heatsink structures can conduct heat generated by components of the ASIC to further improve thermal dispersion and avoid any particular component overheating. Effective cooling techniques can be achieved by including different configurations of heatsink structures in the ASIC assembly. In some implementations, an ASIC assembly can include ASIC heatsink horizontal front-to-back fanout fins to promote airflow to volumes, e.g., including volumes with mechanisms to draw air flows from narrow channels into large volumes, thereby improving cooling within the ASIC assembly. In some implementations, an ASIC heatsink with horizontal fins can be coupled to CPU heatsink vertical fins, e.g., CPU heatsink vertical fins 6524, to be provided to volume 6510, e.g., a combined heatsink can provide further cooling of airflows compared two separate heatsinks.

In some implementations, top and bottom plates can be disposed in front of the ASIC and between horizontal box fins of the ASIC, e.g., as described in reference to FIG. 204 above. The riding heatsink fins 6222 can be ASIC heatsink horizontal fins, ASIC heatsink horizontal box, etc. to widen channel intakes and further improve cooling in the ASIC assembly. In some implementations, a heatsink structure for an ASIC can include a single top plate, oriented in a way such that the top plate is parallel to the ASIC, e.g., both oriented vertically. In some implementations, the top plate can be connected to the ASIC to conduct any generated heat by the ASIC and reduce likelihood of the ASIC overheating.

Additional details of the components used in the data processing systems described in this document, e.g., the co-packaged optical modules, the optical modules, the optical communication interfaces, the photonic integrated circuits, the electronic integrated circuits, etc., can be found in U.S. patent application Ser. No. 17/478,483, filed on Sep. 17, 2021; U.S. patent application Ser. No. 17/495,338, filed on Oct. 6, 2021; U.S. patent application Ser. No. 17/531,470, filed on Nov. 19, 2021; U.S. patent application Ser. No. 17/592,232, filed on Feb. 3, 2022; PCT application PCT/US2021/021953, filed on Mar. 11, 2021, published as WO 2021/183792; PCT application PCT/US2021/022730, filed on Mar. 17, 2021, published as WO 2021/188648; PCT application PCT/US2021/027306, filed on Apr. 14, 2021, published as WO 2021/211725; and PCT application PCT/US2021/035179, filed on Jun. 1, 2021, published as WO 2021/247521. The entire contents of the above applications are incorporated by reference.

Some embodiments can be implemented as circuit-based processes, including possible implementation on a single integrated circuit.

Unless explicitly stated otherwise, each numerical value and range should be interpreted as being approximate as if the word “about” or “approximately” preceded the value or range.

It will be further understood that various changes in the details, materials, and arrangements of the parts which have been described and illustrated in order to explain the nature of this disclosure can be made by those skilled in the art without departing from the scope of the disclosure, e.g., as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to “one embodiment” or “an embodiment” means that a particular feature, structure, or characteristic described in connection with the embodiment can be included in at least one embodiment of the disclosure. The appearances of the phrase “in one embodiment” in various places in the specification are not necessarily all referring to the same embodiment, nor are separate or alternative embodiments necessarily mutually exclusive of other embodiments. The same applies to the term “implementation.”

Unless otherwise specified herein, the use of the ordinal adjectives “first,” “second,” “third,” etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Also for purposes of this description, the terms “couple,” “coupling,” “coupled,” “connect,” “connecting,” or “connected” refer to any manner known in the art or later developed in which energy is allowed to be transferred between two or more elements, and the interposition of one or more additional elements is contemplated, although not required. Conversely, the terms “directly coupled,” “directly connected,” etc., imply the absence of such additional elements.

As used herein in reference to an element and a standard, the term compatible means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

The functions of the various elements shown in the figures, including any functional blocks labeled or referred to as "processors" and/or "controllers," can be provided through the use of dedicated hardware as well as hardware capable of executing software in association with appropriate software. When provided by a processor, the functions can be provided by a single dedicated processor, by a single shared processor, or by a plurality of individual processors, some of which can be shared. Moreover, explicit use of the term "processor" or "controller" should not be construed to refer exclusively to hardware capable of executing software, and can implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, can also be included. Similarly, any switches shown in the figures are conceptual only. Their function can be carried out through the operation of program logic, through dedicated logic, through the interaction of program control and dedicated logic, or even manually, the particular technique being selectable by the implementer as more specifically understood from the context.

As used in this application, the term "circuitry" can refer to one or more or all of the following: (a) hardware-only circuit implementations (such as implementations in only analog and/or digital circuitry); (b) combinations of hardware circuits and software, such as (as applicable): (i) a combination of analog and/or digital hardware circuit(s) with software/firmware and (ii) any portions of hardware processor(s) with software (including digital signal processor(s)), software, and memory (ies) that work together to cause an apparatus, such as a mobile phone or switch, to perform various functions); and (c) hardware circuit(s) and or processor(s), such as a microprocessor(s) or a portion of a microprocessor(s), that requires software (e.g., firmware) for operation, but the software does not need to be present when it is not needed for operation." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in switch, a cellular network device, or other computing or network device.

It should be appreciated by those of ordinary skill in the art that any block diagrams herein represent conceptual views of illustrative circuitry embodying the principles of the disclosure.

The invention claimed is:

1. An apparatus comprising:

a housing capable of being mounted in a rack, wherein the housing comprises a front panel;

a vertically oriented switch card, comprising one or more vertically oriented application-specific integrated circuits (ASICs) mounted on the vertically oriented switch card;

a two-dimensional arrangement of plug ports, wherein each plug port is configured to receive a pluggable optical module perpendicular to the two-dimensional arrangement of plug ports and each plug port having a horizontal dimension and a vertical dimension, the horizontal dimension being greater than the vertical dimension; and a two-dimensional arrangement of channel intakes, wherein each channel intake is positioned adjacent to at least one of the plug ports of the two-dimensional arrangements of plug ports, each channel intake receives air and directs the received air through a respective channel that extends through the vertically oriented switch card towards an interior of the housing capable of being mounted in the rack, wherein the vertically oriented switch card is spaced at a first distance less than 12 inches from the front panel and the vertically oriented switch card is at a first angle relative to the front panel, the first angle is in a range from −60° to 60°.

2. The apparatus of claim 1, wherein a length of the pluggable optical module is greater than one or both of (i) a height, and (ii) a width, of the pluggable optical module.

3. The apparatus of claim 1, further comprising:

a cage configured to receive the pluggable optical module, wherein the cage provides an alignment for the pluggable optical module to connect to electrical contacts of the vertically oriented switch card.

4. The apparatus of claim 1, further comprising a bolster plate attached to a rear surface of the vertically oriented switch card, wherein the bolster plate provides a counteracting force when the pluggable optical module is inserted in a plug port from the two-dimensional array of plug ports, and wherein the rear surface is opposite a first surface of the vertically oriented switch card.

5. The apparatus of claim 1, wherein the vertically oriented switch card comprises one or more cutouts, each of the one or more cutouts are utilized to extend the respective channel through the vertically oriented switch card.

6. The apparatus of claim 1, wherein each channel intake connects to the respective channel that extends along the directions parallel to the front panel.

7. The apparatus of claim 1, wherein the apparatus comprises:

a first heatsink air intake positioned above the one or more vertically oriented application-specific integrated circuits, the first heatsink air intake directs air towards the interior of the housing.

8. The apparatus of claim 1, wherein the apparatus comprises:

a second heatsink air intake positioned below the one or more vertically oriented application-specific integrated circuits, the second heatsink air intake directs air towards the interior of the housing.

9. The apparatus of claim 1, wherein the vertically oriented switch card comprises a first set of electrical contacts configured to electrically connect to the pluggable optical module.

10. The apparatus of claim 9, wherein the first set of electrical contacts comprise one or more of (i) spring-loaded elements, (ii) compression interposers, or (iii) land-grid arrays.

11. The apparatus of claim 9, further comprising:

one or more guide rails configured to align a second set of electrical contacts of the pluggable optical module to the first set of electrical contacts of the vertically oriented switch card.

12. The apparatus of claim 11, wherein each of the one or more guide rails extends from the front panel to the vertically oriented switch card.

13. The apparatus of claim 11, wherein one or more clamping mechanisms are used to fasten the one or more guide rails to one or both of (i) the front panel, or (ii) a front portion of the pluggable optical module.

14. The apparatus of claim 1, wherein the vertically oriented switch card comprises electrical connectors extending through a thickness of the vertically oriented switch card.

15. The apparatus of claim 14, wherein the thickness of the vertically oriented switch card extends from a first surface of the vertically oriented switch card to a rear surface of the vertically oriented switch card, wherein the rear surface is opposite the first surface.

16. The apparatus of claim 14, wherein the electrical connectors comprise vias of the vertically oriented switch card.

17. The apparatus of claim 14, wherein the electrical connectors comprise an interface for carrying electrical signals between the pluggable optical module and the vertically oriented switch card.

18. The apparatus of claim 14, wherein at least one of the electrical connectors is formed by a portion of the vertically oriented switch card by contact pads.

19. The apparatus of claim 14, wherein at least one of the electrical connectors is an (i) edge connector, (ii) connector tongue, or (iii) a connector card.

20. The apparatus of claim 1, wherein the respective channel of one or more of the channel intakes extends through a portion of the vertically oriented switch card.

21. The apparatus of claim 5, wherein one of the one or more cutouts that a respective channel extends through a portion of the vertically oriented switch card.

* * * * *